US010529929B2

(12) United States Patent
Cho et al.

(10) Patent No.: US 10,529,929 B2
(45) Date of Patent: Jan. 7, 2020

(54) ORGANIC LIGHT-EMITTING DEVICE

(71) Applicant: Samsung Display Co., Ltd., Yongin-si, Gyeonggi-do (KR)

(72) Inventors: Hwan-Hee Cho, Yongin-si (KR); Myeong-Suk Kim, Yongin-si (KR); Hee-Yeon Kim, Yongin-si (KR); Chang-Woong Chu, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 125 days.

(21) Appl. No.: 15/263,140

(22) Filed: Sep. 12, 2016

(65) Prior Publication Data

US 2017/0186964 A1 Jun. 29, 2017

(30) Foreign Application Priority Data

Dec. 29, 2015 (KR) ........................ 10-2015-0188909

(51) Int. Cl.

| | |
|---|---|
| ***H01L 51/54*** | (2006.01) |
| ***C09K 11/06*** | (2006.01) |
| ***H01L 51/00*** | (2006.01) |
| ***C09K 11/02*** | (2006.01) |
| ***H01L 51/50*** | (2006.01) |
| *H01L 51/52* | (2006.01) |

(52) U.S. Cl.

CPC ........ *H01L 51/0067* (2013.01); *C09K 11/025* (2013.01); *C09K 11/06* (2013.01); *H01L 51/0052* (2013.01); *H01L 51/0058* (2013.01); *H01L 51/0071* (2013.01); *H01L 51/0072* (2013.01); *H01L 51/0085* (2013.01); *H01L 51/5016* (2013.01); *C09K 2211/1007* (2013.01); *C09K 2211/1011* (2013.01); *C09K 2211/185* (2013.01); *H01L 51/5056* (2013.01); *H01L 51/5072* (2013.01); *H01L 51/5206* (2013.01); *H01L 51/5221* (2013.01)

(58) Field of Classification Search

CPC ... C09K 11/025; C09K 11/06; C09K 2211/10; C09K 2211/1007; C09K 2211/1011; C09K 2211/1029; C09K 2211/185; H01L 51/0032; H01L 51/005; H01L 51/0052; H01L 51/0058; H01L 51/0059; H01L 51/006; H01L 51/0061; H01L 51/0067; H01L 51/0071; H01L 51/0072; H01L 51/0073; H01L 51/0074; H01L 51/0085; H01L 51/50; H01L 51/5012; H01L 51/5016; H01L 51/5056; H01L 51/5072; H01L 51/5206; H01L 51/5221

USPC ....... 428/690, 691, 917, 411.4, 336; 427/58, 427/66; 313/500–512; 257/40, 88–104, 257/E51.001–E51.052; 252/301.16–301.35

See application file for complete search history.

(56) References Cited

U.S. PATENT DOCUMENTS

| | | | | |
|---|---|---|---|---|
| 9,601,700 | B2 | 3/2017 | Kim et al. | |
| 9,972,789 | B2 | 5/2018 | Cho et al. | |
| 2012/0153272 | A1* | 6/2012 | Fukuzaki ............ | C07D 487/04 257/40 |
| 2012/0214993 | A1 | 8/2012 | Aihara et al. | |
| 2013/0234119 | A1 | 9/2013 | Mizuki et al. | |

(Continued)

FOREIGN PATENT DOCUMENTS

| | | |
|---|---|---|
| CN | 104418831 A | 3/2015 |
| CN | 104795503 A | 7/2015 |

(Continued)

OTHER PUBLICATIONS

Machine translation of KR2014-0094408. (Year: 2014).*

(Continued)

*Primary Examiner* — Andrew K Bohaty
(74) *Attorney, Agent, or Firm* — Lewis Roca Rothgerber Christie LLP

(57) ABSTRACT

According to one or more embodiments, an organic light-emitting device includes: a first electrode; a second electrode facing the first electrode; and an organic layer between the first electrode and the second electrode, the organic layer including an emission layer, wherein the organic layer may include a first compound represented by one selected from Formulae 1-1 and 1-2, and a second compound represented by Formula 2:

Formula 1-1

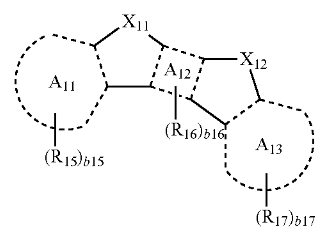

Formula 1-2

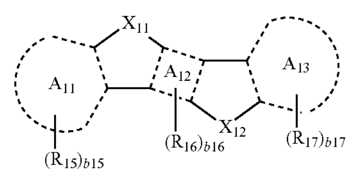

Formula 2

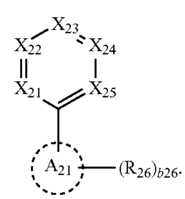

15 Claims, 2 Drawing Sheets

(56) References Cited

U.S. PATENT DOCUMENTS

| | | | | |
|---|---|---|---|---|
| 2014/0054564 | A1* | 2/2014 | Kim | C07B 59/00 257/40 |
| 2014/0332793 | A1 | 11/2014 | Park et al. | |
| 2014/0367654 | A1 | 12/2014 | Kim et al. | |
| 2014/0374711 | A1 | 12/2014 | Cho et al. | |
| 2015/0001511 | A1 | 1/2015 | Kim et al. | |
| 2015/0236264 | A1 | 8/2015 | Kim et al. | |
| 2015/0318488 | A1 | 11/2015 | Ito et al. | |
| 2015/0318508 | A1 | 11/2015 | Kim et al. | |
| 2015/0325798 | A1 | 11/2015 | Cho et al. | |
| 2016/0013430 | A1 | 1/2016 | Kim et al. | |

FOREIGN PATENT DOCUMENTS

| | | | | |
|---|---|---|---|---|
| KR | 10-2010-0105099 | A | | 9/2010 |
| KR | 10-2011-0066766 | A | | 6/2011 |
| KR | 10-2012-0042633 | A | | 5/2012 |
| KR | 10-2012-0046778 | A | | 5/2012 |
| KR | 10-2013-0084995 | A | | 7/2013 |
| KR | 10-2013-0114785 | A | | 10/2013 |
| KR | 10-2014-0087804 | A | | 7/2014 |
| KR | 20140094408 | A | * | 7/2014 |
| KR | 10-2014-0145888 | A | | 12/2014 |
| KR | 10-2014-0146951 | A | | 12/2014 |
| KR | 10-2015-0003566 | A | | 1/2015 |
| KR | 10-2015-0032447 | A | | 3/2015 |
| KR | 10-2015-0126755 | A | | 11/2015 |
| KR | 10-2015-0129928 | A | | 11/2015 |
| KR | 10-2016-0007966 | | | 1/2016 |
| WO | WO 2010/107244 | A2 | | 9/2010 |
| WO | WO 2013/154325 | A1 | | 10/2013 |

OTHER PUBLICATIONS

EPO Extended Search Report dated May 9, 2017, for corresponding European Patent Application No. 16186703.1 (7 pages).

EPO Office Action dated Jan. 29, 2018, for Corresponding European Patent Application No. 16186703.1 (5 pages).

European Patent Office Communication pursuant to Rule 114(2) EPC, for Patent Application No. 16186703.1, dated Aug. 6, 2019, 21 pages.

* cited by examiner

ORGANIC LIGHT-EMITTING DEVICE

CROSS-REFERENCE TO RELATED APPLICATION

This application claims priority to and the benefit of Korean Patent Application No. 10-2015-0188909, filed on Dec. 29, 2015, in the Korean Intellectual Property Office, the disclosure of which is incorporated herein in its entirety by reference.

BACKGROUND

1. Field

One or more embodiments of the present disclosure relate to an organic light-emitting device.

2. Description of the Related Art

Organic light-emitting devices are self-emission devices that have wide viewing angles, high contrast ratios, short response times, and/or excellent luminance, driving voltage, and/or response speed characteristics, and may produce full color images.

For example, an organic light-emitting device may include a first electrode on a substrate, and a hole transport region, an emission layer, an electron transport region, and a second electrode that are sequentially formed on the first electrode. Holes injected from the first electrode are transported to the emission layer through the hole transport region, and electrons injected from the second electrode are transported to the emission layer through the electron transport region. Carriers, such as the holes and the electrons, may then recombine in the emission layer to generate excitons. When the excitons drop from an excited state to a ground state, light is emitted.

SUMMARY

An aspect according to one or more embodiments of the present disclosure is directed toward an organic light-emitting device.

Additional aspects will be set forth in part in the description which follows and, in part, will be apparent from the description, or may be learned by practice of the presented embodiments.

According to one or more embodiments, an organic light-emitting device includes: a first electrode; a second electrode facing the first electrode; and an organic layer between the first electrode and the second electrode, the organic layer including an emission layer, wherein the organic layer may include a first compound represented by one selected from Formulae 1-1 and 1-2, and a second compound represented by Formula 2:

Formula 1-1

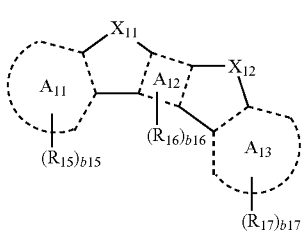

-continued

Formula 1-2

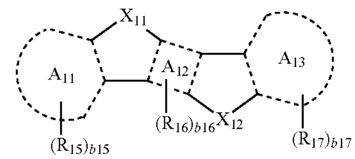

Formula 2

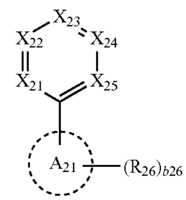

Formula 8

$$*-(L_{81})_{a81}-R_{81}$$

Formula 9

$$*-(L_{91})_{a91}-R_{91},$$

wherein, in Formulae 1-1, 1-2, 2, 8, and 9, $A_{11}$ to $A_{13}$ may each independently be selected from a $C_5$-$C_{20}$ carbocyclic group and a $C_1$-$C_{20}$ heterocyclic group, $X_{11}$ may be selected from $N(R_{11})$, $C(R_{11})(R_{12})$, O, and S, $X_{12}$ may be selected from $N(R_{13})$, $C(R_{13})(R_{14})$, O, and S, $R_{11}$ to $R_{17}$ may each independently be selected from a group represented by Formula 8, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, wherein at least one selected from $R_{11}$ to $R_{17}$ is the group represented by Formula 8, b15 to b17 may each independently be selected from 1, 2, 3, 4, 5, 6, 7, and 8, $L_{81}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a81 may be selected from 0, 1, and 2, $R_{81}$ may be selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $A_{21}$ may be selected from a $C_6$-$C_{20}$ arene group and a $C_1$-$C_{20}$ heteroarene group, $X_{21}$ may be selected from N and C($R_{21}$), $X_{22}$ may be selected from N and C($R_{22}$), $X_{23}$ may be selected from N and C($R_{23}$), $X_{24}$ may be selected from N and C($R_{24}$), and $X_{25}$ may be selected from N and C($R_{25}$), wherein at least one selected from $X_{21}$ to $X_{25}$ may be N, $R_{21}$ to $R_{26}$ may each independently be selected from a group represented by Formula 9, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), wherein at least one selected from $R_{21}$ to $R_{26}$ is the group represented by Formula 9, b26 may be selected from 1, 2, 3, 4, 5, and 6, $L_{91}$ may be selected from a substituted or unsubstituted $C_6$-$C_{60}$ arylene group and a substituted or unsubstituted $C_1$-$C_{60}$ heteroarylene group, a91 may be selected from 0, 1, and 2, $R_{91}$ may be selected from a substituted or unsubstituted $C_6$-$C_{60}$ aryl group and a substituted or unsubstituted $C_1$-$C_{60}$ heteroaryl group, $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* indicates a binding site to a neighboring atom.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
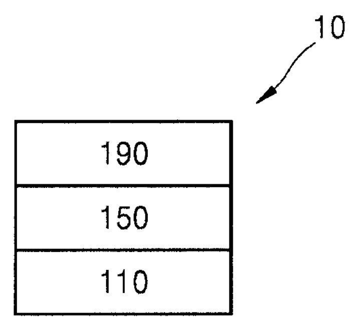
FIG. 1 is a schematic cross-sectional view of an organic light-emitting device according to an embodiment.

The present disclosure will now be described more fully with reference to example embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features, and how to achieve them of the present disclosure will become apparent by reference to the described embodiments, together with the accompanying drawings. This present disclosure may, however, be embodied in many different forms and should not be limited to the example embodiments.

Hereinafter, embodiments are described in more detail by referring to the accompanying drawings, and in the drawings, like reference numerals denote like elements, and a redundant explanation thereof will not be provided herein.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layer(s), region(s), or component(s) may be present.

Sizes of components in the drawings may be exaggerated for convenience of explanation. In other words, since sizes and thicknesses of components in the drawings are arbitrarily illustrated for convenience of explanation, the following embodiments are not limited thereto.

As used herein, the expression "(an organic layer) includes at least one first compound" may refer to a case where "(an organic layer) may include one first compound represented by Formula 1, or two or more different first compounds represented by Formula 1".

As used herein, the term "an organic layer" refers to a single and/or a plurality of layers between a first electrode and a second electrode in an organic light-emitting device. A material included in an "organic layer" may include other materials (e.g., inorganic materials) in addition to an organic material.

An organic light-emitting device according to an embodiment of the present inventive concept may include: a first electrode; a second electrode; and an organic layer between the first electrode and the second electrode, the organic layer including an emission layer, wherein the organic layer may include a first compound represented by one selected from Formulae 1-1 and 1-2, and a second compound represented by Formula 2:

Formula 1-1

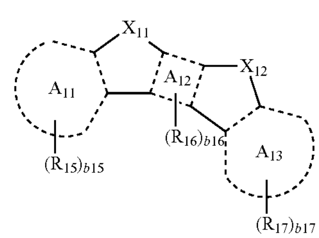

-continued

Formula 1-2

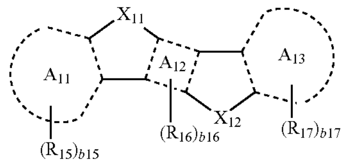

Formula 2

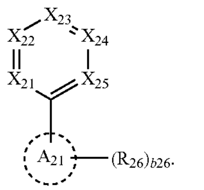

In Formulae 1-1 and 1-2, $A_{11}$ to $A_{13}$ may each independently be selected from a $C_5$-$C_{20}$ carbocyclic group and a $C_1$-$C_{20}$ heterocyclic group.

For example, in Formulae 1-1 and 1-2, $A_{11}$ to $A_{13}$ may each independently be selected from a benzene group, a naphthalene group, a fluorene group, a phenanthrene group, an anthracene group, a triphenylene group, a pyrene group, a chrysene group, a furan group, a thiophene group, a pyrrole group, a pyridine group, a pyrazine group, a pyrimidine group, a pyridazine group, a triazine group, a quinoline group, an isoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a benzofuran group, a benzothiophene group, a dibenzofuran group, a dibenzothiophene group, and a carbazole group, but embodiments are not limited thereto.

In various embodiments, in Formulae 1-1 and 1-2, $A_{11}$ to $A_{13}$ may each independently be selected from a benzene group, a naphthalene group, a fluorene group, a phenanthrene group, an anthracene group, a triphenylene group, a pyrene group, a chrysene group, a furan group, a thiophene group, a pyrrole group, a pyridine group, a pyrazine group, a pyrimidine group, a pyridazine group, a triazine group, a quinoline group, an isoquinoline group, a quinoxaline group, a quinazoline group, a benzofuran group, a benzothiophene group, a dibenzofuran group, a dibenzothiophene group, and a carbazole group, but embodiments are not limited thereto.

In various embodiments, in Formulae 1-1 and 1-2, $A_{11}$ to $A_{13}$ may each independently be selected from a benzene group, a naphthalene group, a phenanthrene group, an anthracene group, a pyridine group, a pyrazine group, a pyrimidine group, a pyridazine group, a quinoline group, an isoquinoline group, a quinoxaline group, and a quinazoline group, but embodiments are not limited thereto.

In various embodiments, in Formulae 1-1 and 1-2, $A_{12}$ may be selected from a benzene group and a naphthalene group, but embodiments are not limited thereto.

In Formulae 1-1 and 1-2, $X_{11}$ may be selected from $N(R_{11})$, $C(R_{11})(R_{12})$, O, and S, $X_{12}$ may be selected from $N(R_{13})$, $C(R_{13})(R_{14})$, O, and S, and $R_{11}$ to $R_{14}$ may each independently be understood by referring to descriptions thereof provided below.

For example, in Formulae 1-1 and 1-2, $X_{11}$ may be $N(R_{11})$, and $X_{12}$ may be selected from $N(R_{13})$, $C(R_{13})(R_{14})$, O, and S, but embodiments are not limited thereto.

In various embodiments, in Formulae 1-1 and 1-2, $X_{11}$ may be $N(R_{11})$, and $X_{12}$ may be $C(R_{13})(R_{14})$;

$X_{11}$ may be $N(R_{11})$, and $X_{12}$ may be O; or $X_{11}$ may be $N(R_{11})$, and $X_{12}$ may be S, but embodiments are not limited thereto.

In Formulae 1-1 and 1-2, $R_{11}$ to $R_{17}$ may each independently be selected from a group represented by Formula 8, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, wherein at least one selected from $R_{11}$ to $R_{17}$ may be the group represented by Formula 8, $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and $$*\text{-}(L_{81})_{a81}\text{-}R_{81}, \quad \text{Formula 8}$$

in Formula 8, $L_{81}$, a81, and $R_{81}$ may each independently be understood by referring to the descriptions thereof provided below, and

* indicates a binding site to a neighboring atom.

For example, in Formulae 1-1 and 1-2, $R_{11}$ to $R_{17}$ may each independently be selected from the group consisting of:

the group represented by Formula 8, hydrogen, deuterium, —F, —Cl, —Br, —I, a $C_1$-$C_{20}$ alkyl group, a $C_1$-$C_{20}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_1)(Q_2)$, and $—Si(Q_1)(Q_2)(Q_3)$;

a $C_1$-$C_{20}$ alkyl group and a $C_1$-$C_{20}$ alkoxy group, each substituted with at least one selected from deuterium, —F, —Cl, —Br, —I, a cyano group, and a nitro group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a cyano group, a nitro group, a methyl group, a methoxy group, a phenyl group, a naphthyl group, $—N(Q_{31})(Q_{32})$, and $—Si(Q_{31})(Q_{32})(Q_{33})$, and $Q_1$ to $Q_3$ and $Q_{31}$ to $Q_{33}$ may each independently be selected from a $C_1$-$C_{20}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments are not limited thereto.

In various embodiments, in Formulae 1-1 and 1-2, $R_{11}$ to $R_{17}$ may each independently be selected from the group consisting of:

the group represented by Formula 8, hydrogen, deuterium, —F, a methyl group, an ethyl group, an n-propyl group, an iso-propyl group, an n-butyl group, an iso-butyl group, a sec-butyl group, a tert-butyl group, a methoxy group, an ethoxy group, $—CF_3$, $—OCF_3$, a phenyl group, a biphenyl group, a terphenyl group, a naphthyl group, a phenoxy group, a pyridinyl group, a pyrimidinyl group, a pyridazinyl group, a triazinyl group, a carbazolyl group, a fluorenyl group, a dibenzofuranyl group, a dibenzothiophenyl group, $—N(Q_1)(Q_2)$, and $—Si(Q_1)(Q_2)(Q_3)$; and a phenyl group, a biphenyl group, a terphenyl group, and a naphthyl group, each substituted with at least one selected from deuterium, —F, —Cl, —Br, —I, a cyano group, a nitro group, a methyl group, a methoxy group, a phenyl group, a naphthyl group, $—N(Q_{31})(Q_{32})$, and $—Si(Q_{31})(Q_{32})(Q_{33})$, and $Q_1$ to $Q_3$ and $Q_{31}$ to $Q_{33}$ may each independently be selected from a methyl group, an ethyl group, a phenyl group, a biphenyl group, a terphenyl group, and a naphthyl group, but embodiments are not limited thereto.

In Formulae 1-1 and 1-2, b15 to b17 may each independently be selected from 1, 2, 3, 4, 5, 6, 7, and 8.

In Formula 8, $L_{81}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, in Formula 8, $L_{81}$ may be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosiloleylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosiloleylene group, a benzocarbazolylene group, and a dibenzocarbazolylene group, each substituted with at least one selected from deuterium, —F, —Cl, —Br, —I, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, but embodiments are not limited thereto.

In various embodiments, in Formula 8, $L_{81}$ may be selected from the group consisting of:

a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, a dibenzothiophenylene group, and a dibenzosiloleylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, a dibenzothiophenylene group, and a dibenzosiloleylene group, each substituted with at least one selected from deuterium, —F, —Cl, —Br, —I, a cyano group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, but embodiments are not limited thereto.

In various embodiments, in Formula 8, $L_{81}$ may be selected from groups represented by Formulae 4-1 to 4-31, but embodiments are not limited thereto:

4-1

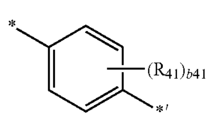

4-2

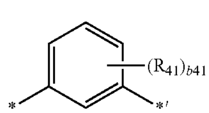

-continued 4-3

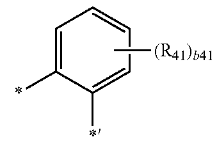

4-4

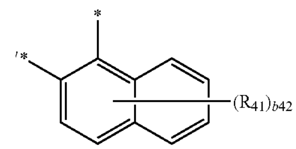

4-5

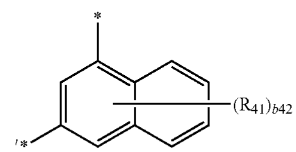

4-6

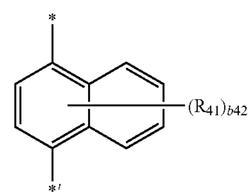

4-7

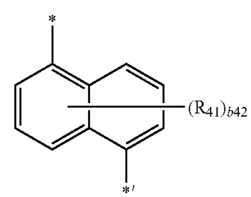

4-8

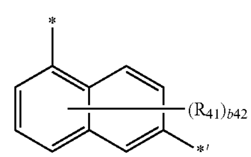

4-9

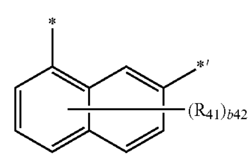

4-10

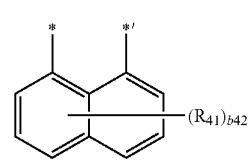

4-11

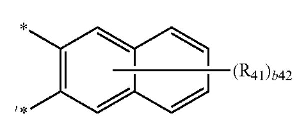

4-12

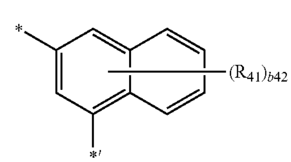

-continued
4-13
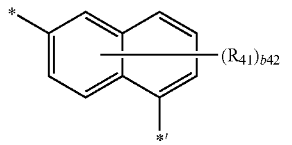
4-14
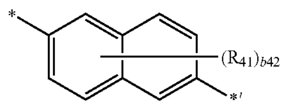
4-15
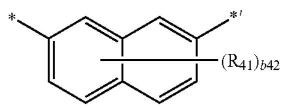
4-16
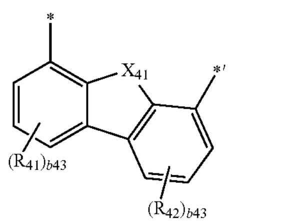
4-17
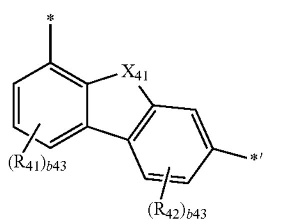
4-18
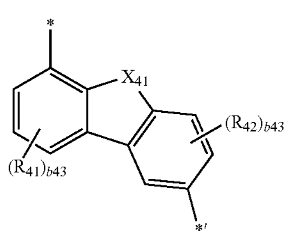
4-19
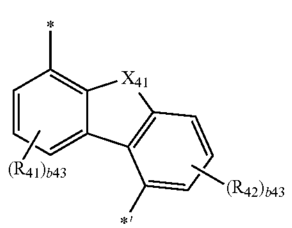
4-20
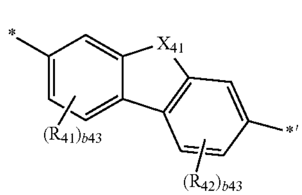
-continued
4-21
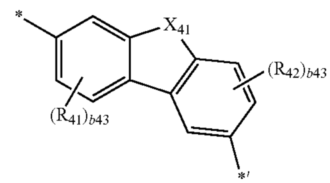
4-22
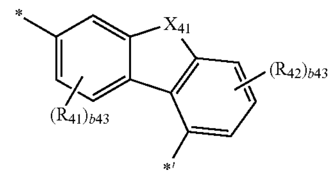
4-23
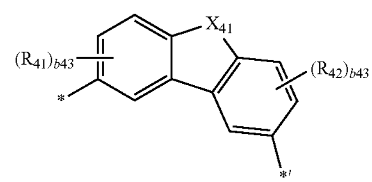
4-24
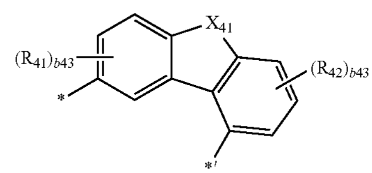
4-25
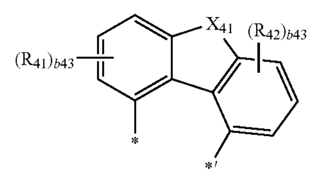
4-26
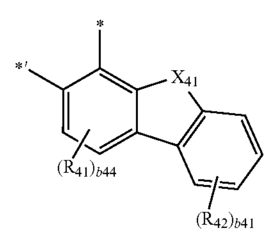
4-27
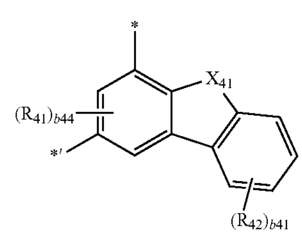
4-28
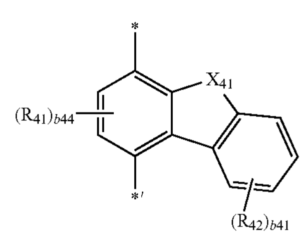

-continued 4-29

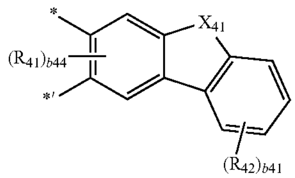

4-30

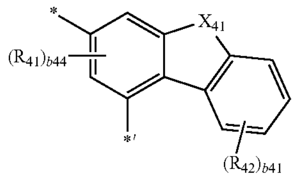

4-31

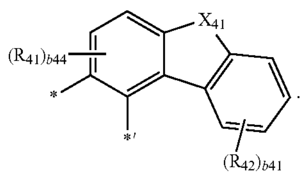

In Formulae 4-1 to 4-31, $X_{41}$ may be selected from O, S, $N(R_{43})$, $C(R_{43})(R_{44})$, and $Si(R_{43})(R_{44})$, $R_{41}$ and $R_{42}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, b41 may be selected from 1, 2, 3, and 4, b42 may be selected from 1, 2, 3, 4, 5, and 6, b43 may be selected from 1, 2, and 3, b44 may be selected from 1 and 2, and

* and *' each indicate a binding site to a neighboring atom.

In Formula 8, a81 indicates the number of $L_{81}$(s), wherein when a81 is 0, $(L_{81})_{a81}$ may be a single bond, and when a81 is 2, a plurality of $L_{81}$(s) may be identical to or different from each other. In Formula 8, a81 may be selected from 0, 1, and 2.

For example, in Formula 8, a81 may be selected from 0 and 1, but embodiments are not limited thereto.

In Formula 8, $R_{81}$ may be selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 8, $R_{81}$ may be selected from the group consisting of:

a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $—N(Q_{31})(Q_{32})$, and $—Si(Q_{31})(Q_{32})(Q_{33})$; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one substituent selected from a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each of the at least one substituent is substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $—N(Q_{21})(Q_{22})$, and $—Si(Q_{21})(Q_{22})(Q_{23})$, and $Q_{21}$ to $Q_{23}$ and $Q_{31}$ to $Q_{33}$ may each independently be selected from a $C_1$-$C_{60}$ alkyl group and a $C_6$-$C_{60}$ aryl group, but embodiments are not limited thereto.

In various embodiments, in Formula 8, $R_{81}$ may be selected from the group consisting of:

a phenyl group, a biphenyl group, a terphenyl group, a naphthyl group, an anthracenyl group, a triphenylenyl group, a phenanthrenyl group, a pyrenyl group, a chrysenyl group, a fluorenyl group, a benzofluorenyl group, a carbazolyl group, a dibenzofuranyl group, a dibenzothiophenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyridopyrimidinyl group, a pyrazinopyrazinyl group, a pyrrolyl group, a thiophenyl group, a thiazolyl group, an oxazolyl group, a thiadiazolyl group, an oxadiazolyl group, an imidazolyl group, a triazolyl group, an indolyl group, an indolozinyl group, a benzthiazolyl group, a benzoxazolyl group, a benzimidazolyl group, a naphthoimidazolyl group, an imidazopyridinyl group, an imidazopyrimidinyl group, an imidazoquinolinyl group, an imidazoisoquinolinyl group, a pyrrolopyrimidinyl group, a benzofuranyl group, a benzothiophenyl group, a thianthrenyl group, a phenoxathinyl group, a dibenzodioxinyl group, a phenoxathinyl group, and a phenotiazonyl group;

a phenyl group, a biphenyl group, a terphenyl group, a naphthyl group, an anthracenyl group, a triphenylenyl group, a phenanthrenyl group, a pyrenyl group, a chrysenyl group, a fluorenyl group, a benzofluorenyl group, a carbazolyl group, a dibenzofuranyl group, a dibenzothiophenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyridopyrimidinyl group, a pyrazinopyrazinyl group, a pyrrolyl group, a thiophenyl group, a thiazolyl group, an oxazolyl group, a thiadiazolyl group, an oxadiazolyl group, an imidazolyl group, a triazolyl group, an indolyl group, an indolozinyl group, a benzthiazolyl group, a benzoxazolyl group, a benzimidazolyl group, a naphthoimidazolyl group, an imidazopyridinyl group, an imidazopyrimidinyl group, an imidazoquinolinyl group, an imidazoisoquinolinyl group, a pyrrolopyrimidinyl group, a benzofuranyl group, a benzothiophenyl group, a thianthrenyl group, a phenoxathinyl group, a dibenzodioxinyl group, a phenoxathinyl group, and a phenotiazonyl group, each substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{31}$)($Q_{32}$), and —Si($Q_{31}$)($Q_{32}$)($Q_{33}$); and a phenyl group, a biphenyl group, a terphenyl group, a naphthyl group, an anthracenyl group, a triphenylenyl group, a phenanthrenyl group, a pyrenyl group, a chrysenyl group, a fluorenyl group, a benzofluorenyl group, a carbazolyl group, a dibenzofuranyl group, a dibenzothiophenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyridopyrimidinyl group, a pyrazinopyrazinyl group, a pyrrolyl group, a thiophenyl group, a thiazolyl group, an oxazolyl group, a thiadiazolyl group, an oxadiazolyl group, an imidazolyl group, a triazolyl group, an indolyl group, an indolozinyl group, a benzthiazolyl group, a benzoxazolyl group, a benzimidazolyl group, a naphthoimidazolyl group, an imidazopyridinyl group, an imidazopyrimidinyl group, an imidazoquinolinyl group, an imidazoisoquinolinyl group, a pyrrolopyrimidinyl group, a benzofuranyl group, a benzothiophenyl group, a thianthrenyl group, a phenoxathinyl group, a dibenzodioxinyl group, a phenoxathinyl group, and a phenotiazonyl group, each substituted with at least one substituent selected from a phenyl group, a biphenyl group, a terphenyl group, a naphthyl group, a pyridinyl group, a pyrimidinyl group, a pyridazinyl group, and a triazinyl group, each of the at least one substituent is substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), and —Si($Q_{21}$)($Q_{22}$)($Q_{23}$), and $Q_{21}$ to $Q_{23}$ and $Q_{31}$ to $Q_{33}$ may each independently be selected from a methyl group, an ethyl group, a phenyl group, a biphenyl group, a terphenyl group, and a naphthyl group, but embodiments are not limited thereto.

In various embodiments, in Formula 8, $R_{81}$ may be selected from groups represented by Formulae 5-1 to 5-86, but embodiments are not limited thereto:

5-1

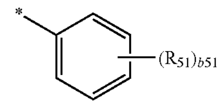

5-2

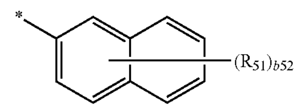

5-3

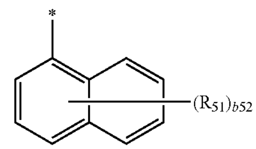

5-4

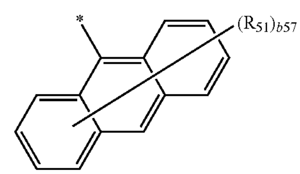

5-5

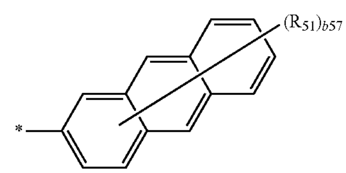

5-6

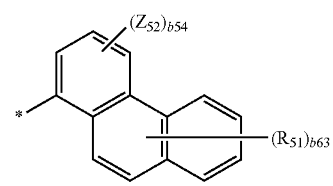

5-7

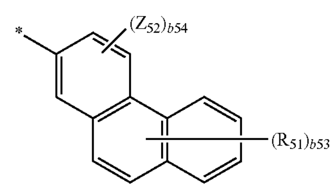

5-8

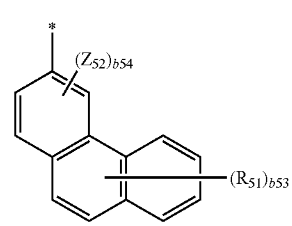

5-9

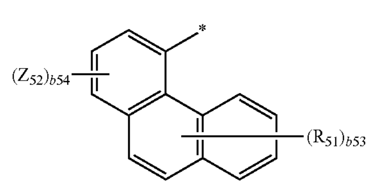

-continued
5-10
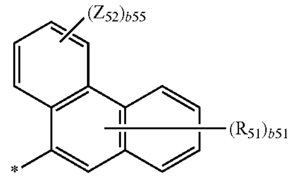
5-11
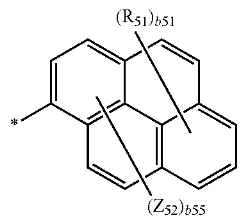
5-12
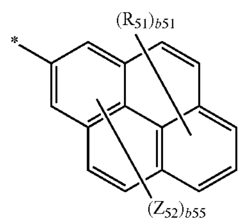
5-13
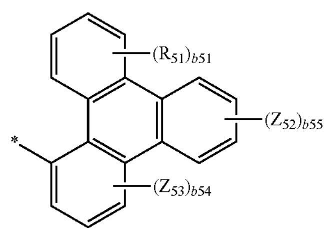
5-14
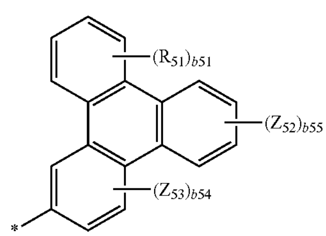
5-15
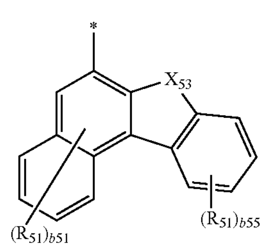
5-16
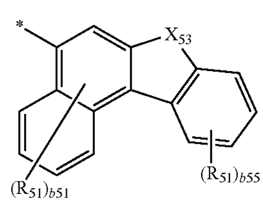
-continued
5-17
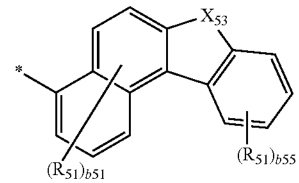
5-18
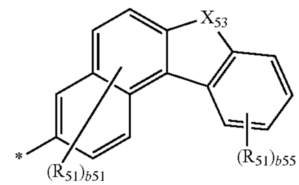
5-19
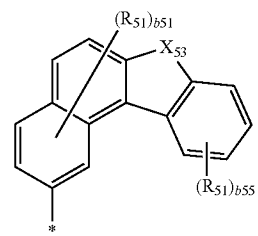
5-20
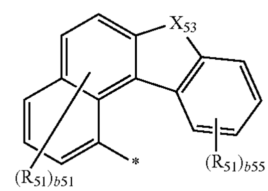
5-21
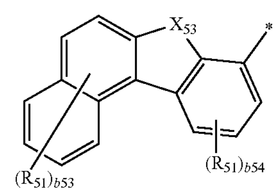
5-22
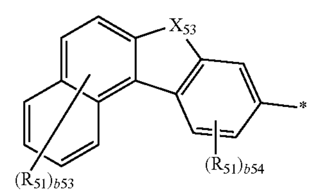
5-23
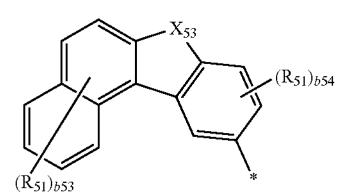
5-24
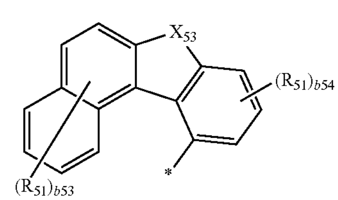

-continued
5-25
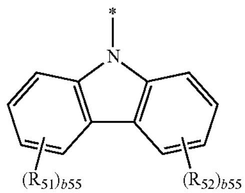
5-26
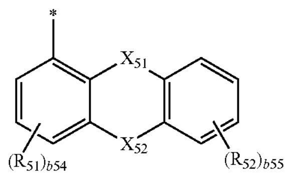
5-27
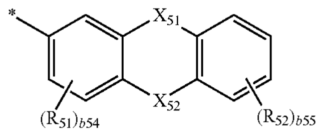
5-28
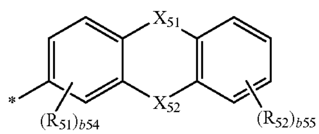
5-29
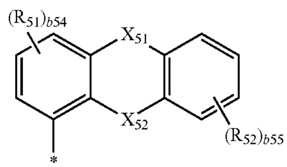
5-30
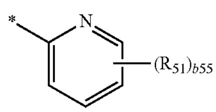
5-31
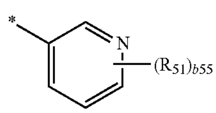
5-32
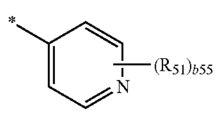
5-33
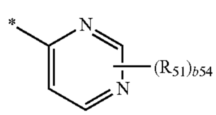
5-34
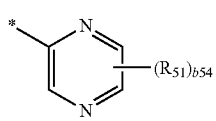
5-35
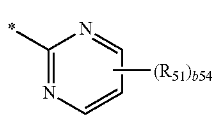
-continued
5-36
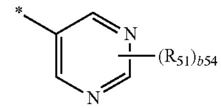
5-37
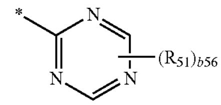
5-38
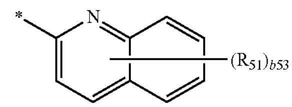
5-39
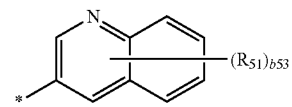
5-40
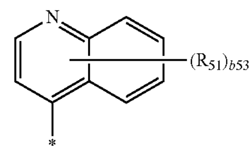
5-41
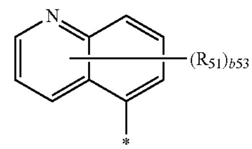
5-42
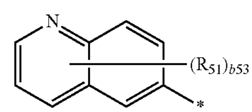
5-43
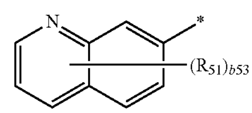
5-44
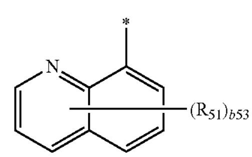
5-45
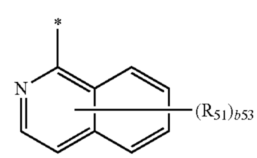
5-46
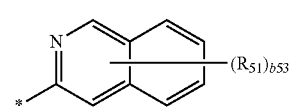
5-47
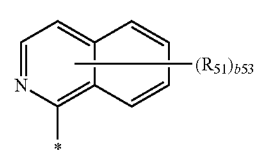

-continued
5-48
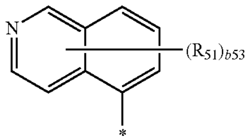
5-49
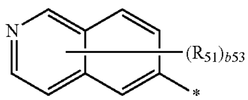
5-50
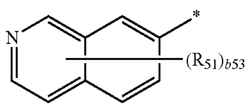
5-51
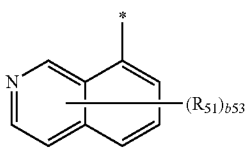
5-52
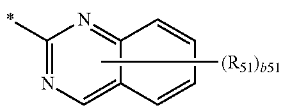
5-53
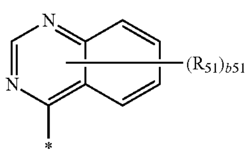
5-54
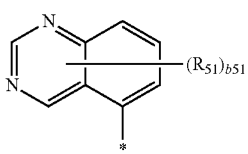
5-55
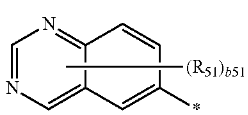
5-56
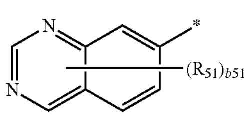
5-57
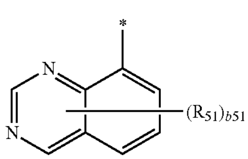
5-58
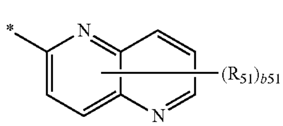
5-59
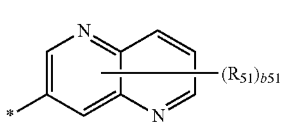
-continued
5-60
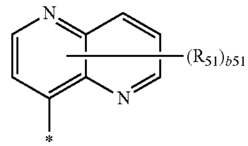
5-61
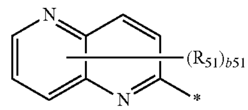
5-62
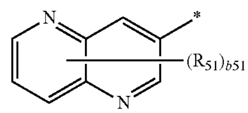
5-63
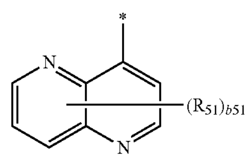
5-64
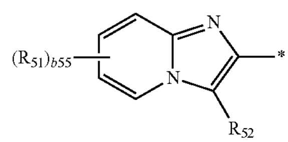
5-65
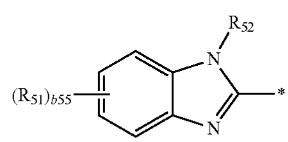
5-66
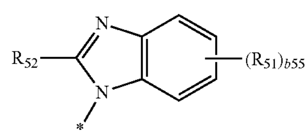
5-67
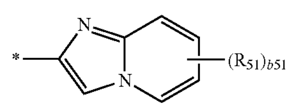
5-68
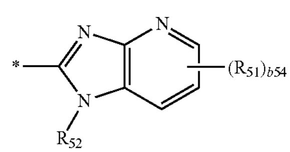
5-69
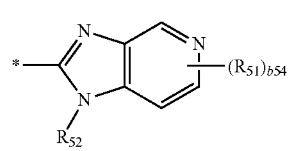
5-70
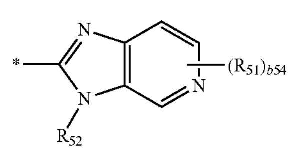

-continued 5-71

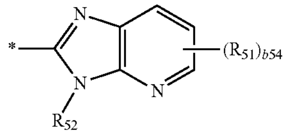

5-72

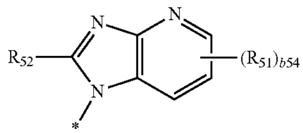

5-73

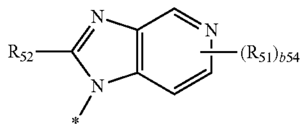

5-74

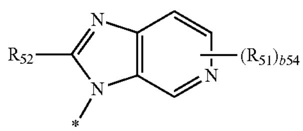

5-75

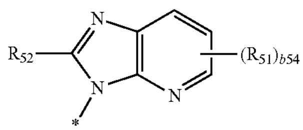

7-76

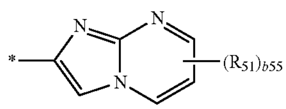

7-77

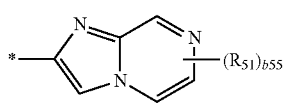

7-78

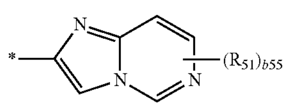

5-79

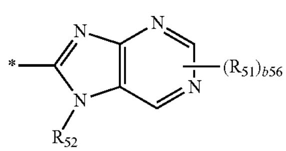

5-80

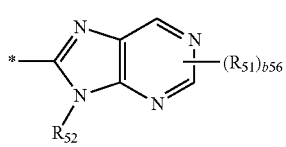

5-81

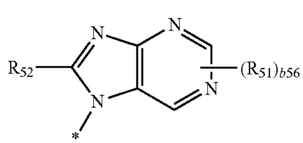

5-82

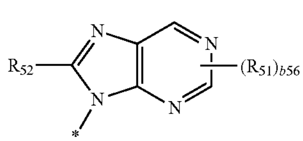

-continued 5-83

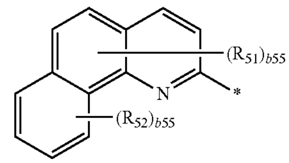

5-84

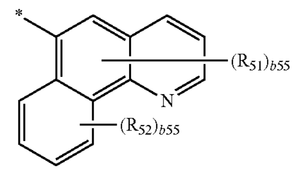

5-85

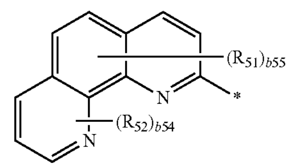

5-86

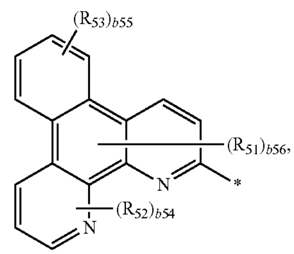

In Formulae 5-1 to 5-86, $X_{51}$ may be selected from a single bond, $N(R_{54})$, $C(R_{54})(R_{55})$, O, and S, $X_{52}$ may be selected from $N(R_{56})$, $C(R_{56})(R_{57})$, O, and S, $X_{53}$ may be $C(R_{58})(R_{59})$, $R_{51}$ to $R_{59}$ may each independently be selected from the group consisting of:

hydrogen, deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —$N(Q_{31})(Q_{32})$, and —$Si(Q_{31})(Q_{32})(Q_{33})$; and a phenyl group, a biphenyl group, a terphenyl group, a naphthyl group, a pyridinyl group, a pyrimidinyl group, a pyridazinyl group, and a triazinyl group, each substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —$N(Q_{21})(Q_{22})$, and —$Si(Q_{21})(Q_{22})(Q_{23})$, $Q_{21}$ to $Q_{23}$ and $Q_{31}$ to $Q_{33}$ may each independently be selected from a methyl group, an ethyl group, a phenyl group, a biphenyl group, a terphenyl group, and a naphthyl group, b51 may be selected from 1, 2, 3, 4, and 5, b52 may be selected from 1, 2, 3, 4, 5, 6, and 7, b53 may be selected from 1, 2, 3, 4, 5, and 6, b54 may be selected from 1, 2, and 3, b55 may be selected from 1, 2, 3, and 4, b56 may be selected from 1 and 2, b57 may be selected from 1, 2, 3, 4, 5, 6, 7, 8, and 9, and

* indicates a binding site to a neighboring atom.

In Formula 2, $A_{21}$ may be selected from a $C_6$-$C_{20}$ arene group and a $C_1$-$C_{20}$ heteroarene group.

For example, in Formula 2, $A_{21}$ may be selected from a benzene group, a naphthalene group, a phenanthrene group, an anthracene group, a pyridine group, a pyrazine group, a pyrimidine group, a triazine group, a quinoline group, an isoquinoline group, a quinoxaline group, and a quinazoline group, but embodiments are not limited thereto.

In various embodiments, in Formula 2, $A_{21}$ may be selected from a benzene group, a pyridine group, a pyrazine group, a pyrimidine group, and a triazine group, but embodiments are not limited thereto.

In Formula 2, $X_{21}$ may be selected from N and $C(R_{21})$, $X_{22}$ may be selected from N and $C(R_{22})$, $X_{23}$ may be selected from N and $C(R_{23})$, $X_{24}$ may be selected from N and $C(R_{24})$, and $X_{25}$ may be selected from N and $C(R_{25})$, wherein at least one selected from $X_{21}$ to $X_{25}$ may be N, and $R_{21}$ to $R_{25}$ may each independently be understood by referring to descriptions thereof provided below.

For example, in Formula 2, $X_{21}$ may be N, $X_{22}$ may be $C(R_{22})$, $X_{23}$ may be $C(R_{23})$, $X_{24}$ may be $C(R_{24})$, and $X_{25}$ may be $C(R_{25})$;

$X_{21}$ may be $C(R_{21})$, $X_{22}$ may be N, $X_{23}$ may be $C(R_{23})$, $X_{24}$ may be $C(R_{24})$, and $X_{25}$ may be $C(R_{25})$;

$X_{21}$ may be $C(R_{21})$, $X_{22}$ may be $C(R_{22})$, $X_{23}$ may be N, $X_{24}$ may be $C(R_{24})$, and $X_{25}$ may be $C(R_{25})$;

$X_{21}$ may be $C(R_{21})$, $X_{22}$ may be $C(R_{22})$, $X_{23}$ may be $C(R_{23})$, $X_{24}$ may be N, and $X_{25}$ may be $C(R_{25})$;

$X_{21}$ may be $C(R_{21})$, $X_{22}$ may be $C(R_{22})$, $X_{23}$ may be $C(R_{23})$, $X_{24}$ may be $C(R_{24})$, and $X_{25}$ may be N;

$X_{21}$ may be N, $X_{22}$ may be $C(R_{22})$, $X_{23}$ may be $C(R_{23})$, $X_{24}$ may be $C(R_{24})$, and $X_{25}$ may be N;

$X_{21}$ may be N, $X_{22}$ may be $C(R_{22})$, $X_{23}$ may be N, $X_{24}$ may be $C(R_{24})$, and $X_{25}$ may be $C(R_{25})$;

$X_{21}$ may be $C(R_{21})$, $X_{22}$ may be $C(R_{22})$, $X_{23}$ may be N, $X_{24}$ may be $C(R_{24})$, and $X_{25}$ may be N; or $X_{21}$ may be N, $X_{22}$ may be $C(R_{22})$, $X_{23}$ may be N, $X_{24}$ may be $C(R_{24})$, and $X_{25}$ may be N, but embodiments are not limited thereto.

In Formula 2, $R_{21}$ to $R_{26}$ may each independently be selected from a group represented by Formula 9, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, wherein at least one selected from $R_{21}$ to $R_{26}$ may be the group represented by Formula 9, and $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group:

$$*\text{-}(L_{91})_{a91}\text{-}R_{91}, \qquad \text{Formula 9}$$

wherein, in Formula 9, $L_{91}$, a91, and $R_{91}$ may each independently be understood by referring to descriptions thereof provided below, and

* indicates a binding site to a neighboring atom.

For example, in Formula 2, $R_{21}$ to $R_{26}$ may each independently be selected from the group consisting of:

the group represented by Formula 9, hydrogen, a $C_1$-$C_{20}$ alkyl group, and a $C_3$-$C_{10}$ cycloalkyl group;

a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a $C_1$-$C_{20}$ alkyl group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $—N(Q_{31})(Q_{32})$, and $—Si(Q_{31})(Q_{32})(Q_{33})$; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a $C_1$-$C_{20}$ alkyl group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $—N(Q_{21})(Q_{22})$, and $—Si(Q_{21})(Q_{22})(Q_{23})$, and $Q_{21}$ to $Q_{23}$ and $Q_{31}$ to $Q_{33}$ may each independently be selected from a $C_1$-$C_{60}$ alkyl group and a $C_6$-$C_{60}$ aryl group, but embodiments are not limited thereto.

In various embodiments, in Formula 2, $R_{21}$ to $R_{26}$ may each independently be selected from the group consisting of:

the group represented by Formula 9, hydrogen, a methyl group, an ethyl group, an n-propyl group, an iso-propyl group, an n-butyl group, an iso-butyl group, a sec-butyl group, a tert-butyl group, a cyclopentyl group, and a cyclohexyl group;

a phenyl group, a biphenyl group, a terphenyl group, a naphthyl group, an anthracenyl group, a triphenylenyl group, a phenanthrenyl group, a pyrenyl group, a chrysenyl group, a fluorenyl group, a benzofluorenyl group, a carbazolyl group, a dibenzofuranyl group, a dibenzothiophenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyridopyrimidinyl group, a pyrazinopyrazinyl group, a pyrrolyl group, a thiophenyl group, a thiazolyl group, an oxazolyl group, a thiadiazolyl group, an oxadiazolyl group, an imidazolyl group, a triazolyl group, an indolyl group, an indolozinyl group, a benzthiazolyl group, a benzoxazolyl group, a benzimidazolyl group, a naphthoimidazolyl group, an imidazopyridinyl group, an imidazopyrimidinyl group, an imidazoquinolinyl group, an imidazoisoquinolinyl group, a pyrrolopyrimidinyl group, a benzofuranyl group, a benzothiophenyl group, a thianthrenyl group, a phenoxathinyl group, a dibenzodioxinyl group, a phenoxathinyl group, and a phenotiazonyl group;

a phenyl group, a biphenyl group, a terphenyl group, a naphthyl group, an anthracenyl group, a triphenylenyl group, a phenanthrenyl group, a pyrenyl group, a chrysenyl group, a fluorenyl group, a benzofluorenyl group, a carbazolyl group, a dibenzofuranyl group, a dibenzothiophenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyridopyrimidinyl group, a pyrazinopyrazinyl group, a pyrrolyl group, a thiophenyl group, a thiazolyl group, an oxazolyl group, a thiadiazolyl group, an oxadiazolyl group, an imidazolyl group, a triazolyl group, an indolyl group, an indolozinyl group, a benzthiazolyl group, a benzoxazolyl group, a benzimidazolyl group, a naphthoimidazolyl group, an imidazopyridinyl group, an imidazopyrimidinyl group, an imidazoquinolinyl group, an imidazoisoquinolinyl group, a pyrrolopyrimidinyl group, a benzofuranyl group, a benzothiophenyl group, a thianthrenyl group, a phenoxathinyl group, a dibenzodioxinyl group, a phenoxathinyl group, and a phenotiazonyl group, each substituted with at least one selected from deuterium, —F, —Cl, —Br, —I, a $C_1$-$C_{20}$ alkyl group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{31}$)($Q_{32}$), and —Si($Q_{31}$)($Q_{32}$)($Q_{33}$); and a phenyl group, a biphenyl group, a terphenyl group, a naphthyl group, an anthracenyl group, a triphenylenyl group, a phenanthrenyl group, a pyrenyl group, a chrysenyl group, a fluorenyl group, a benzofluorenyl group, a carbazolyl group, a dibenzofuranyl group, a dibenzothiophenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyridopyrimidinyl group, a pyrazinopyrazinyl group, a pyrrolyl group, a thiophenyl group, a thiazolyl group, an oxazolyl group, a thiadiazolyl group, an oxadiazolyl group, an imidazolyl group, a triazolyl group, an indolyl group, an indolozinyl group, a benzthiazolyl group, a benzoxazolyl group, a benzimidazolyl group, a naphthoimidazolyl group, an imidazopyridinyl group, an imidazopyrimidinyl group, an imidazoquinolinyl group, an imidazoisoquinolinyl group, a pyrrolopyrimidinyl group, a benzofuranyl group, a benzothiophenyl group, a thianthrenyl group, a phenoxathinyl group, a dibenzodioxinyl group, a phenoxathinyl group, and a phenotiazonyl group, each substituted with at least one substituent selected from a phenyl group, a biphenyl group, a terphenyl group, a naphthyl group, a pyridinyl group, a pyrimidinyl group, a pyridazinyl group, and a triazinyl group, each of the at least one substituent is substituted with at least one selected from deuterium, —F, —Cl, —Br, —I, a $C_1$-$C_{20}$ alkyl group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), and —Si($Q_{21}$)($Q_{22}$)($Q_{23}$), and $Q_{21}$ to $Q_{23}$ and $Q_{31}$ to $Q_{33}$ may each independently be selected from a methyl group, an ethyl group, a phenyl group, a biphenyl group, a terphenyl group, and a naphthyl group, but embodiments are not limited thereto.

In various embodiments, in Formula 2, $R_{21}$ to $R_{26}$ may each independently be selected from the group represented by Formula 9, hydrogen, a methyl group, an ethyl group, an n-propyl group, an iso-propyl group, an n-butyl group, an iso-butyl group, a sec-butyl group, a tert-butyl group, a cyclopentyl group, a cyclohexyl group, and groups represented by Formulae 5-1 to 5-86, but embodiments are not limited thereto:

5-1

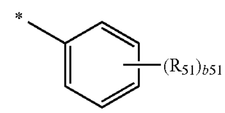

5-2

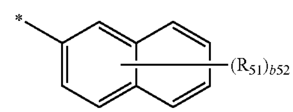

5-3

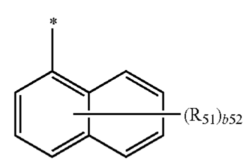

5-4

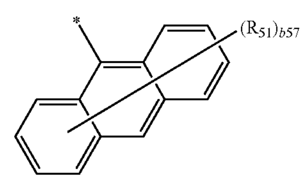

5-5

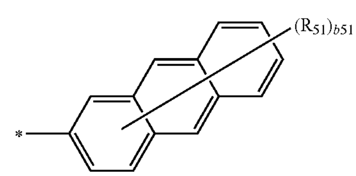

5-6

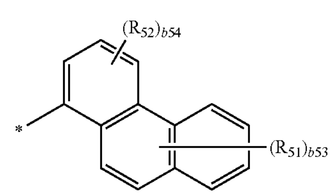

-continued
5-7
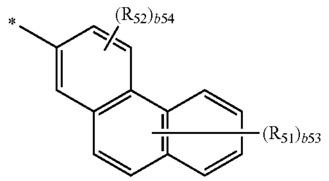
5-8
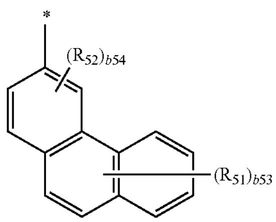
5-9
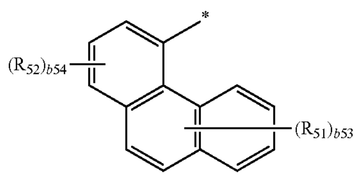
5-10
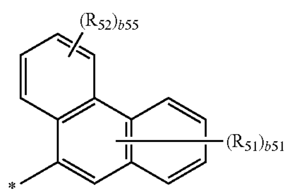
5-11
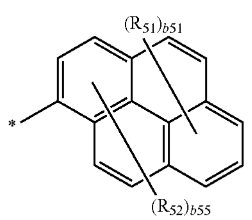
5-12
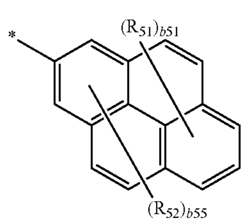
5-13
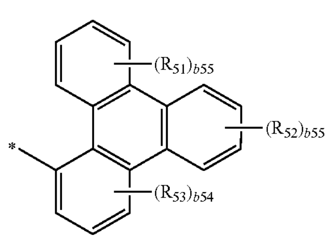
-continued
5-14
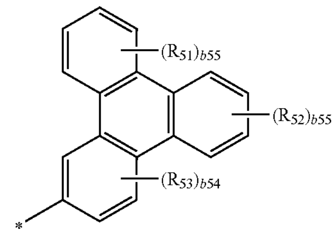
5-15
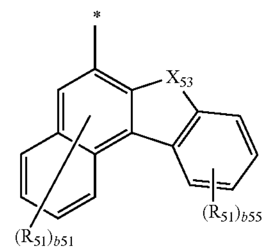
5-16
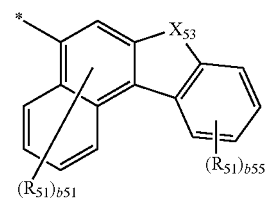
5-17
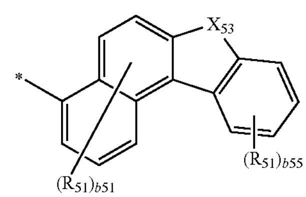
5-18
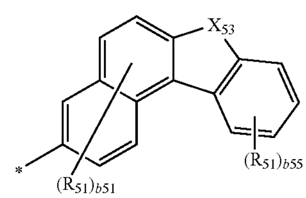
5-19
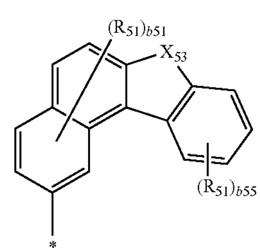
5-20
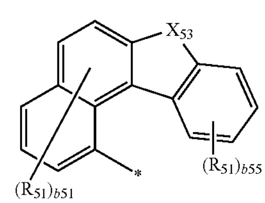

-continued
5-21
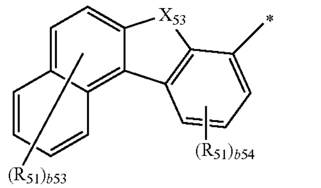
5-22
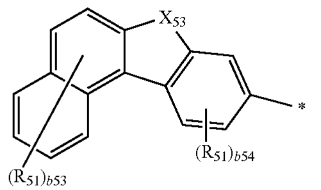
5-23
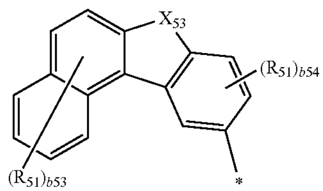
5-24
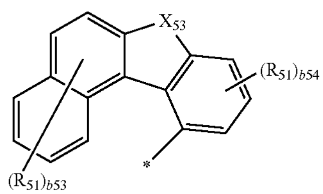
5-25
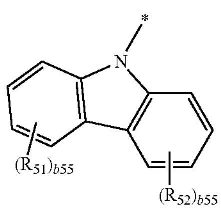
5-26
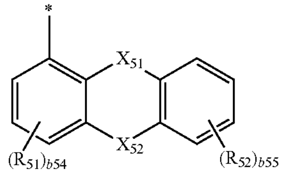
5-27
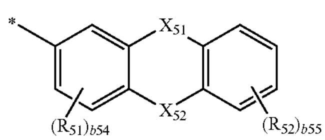
5-28
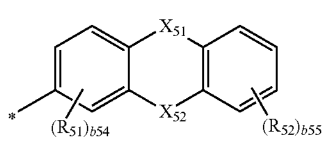
-continued
5-29
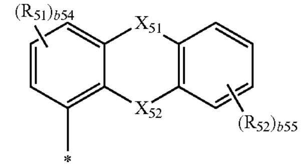
5-30
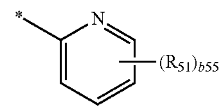
5-31
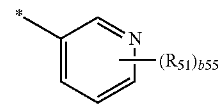
5-32
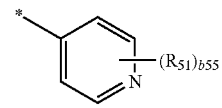
5-33
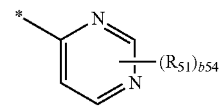
5-34
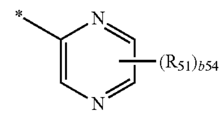
5-35
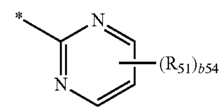
5-36
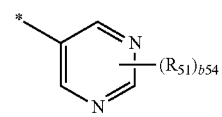
5-37
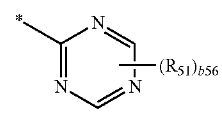
5-38
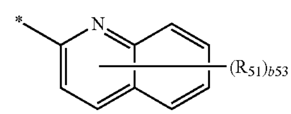
5-39
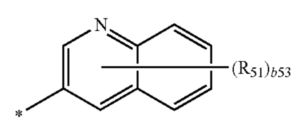
5-40
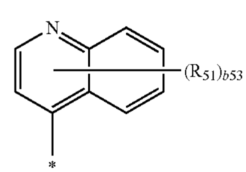

-continued
5-41
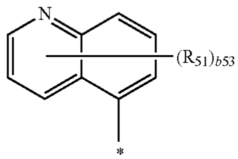
5-42
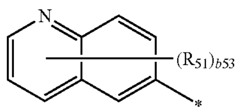
5-43
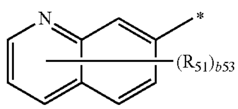
5-44
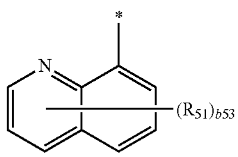
5-45
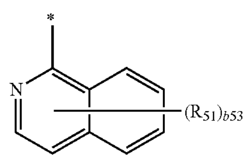
5-46
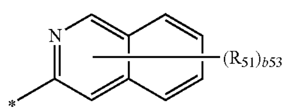
5-47
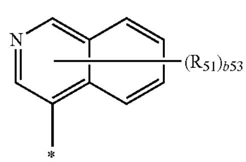
5-48
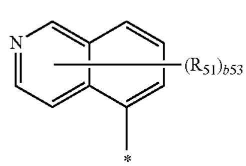
5-49
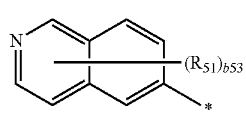
5-50
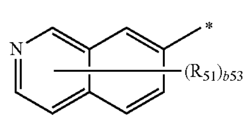
-continued
5-51
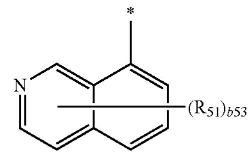
5-52
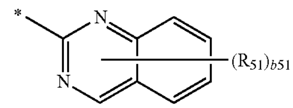
5-53
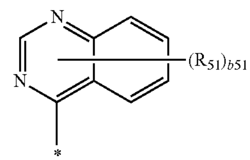
5-54
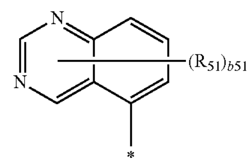
5-55
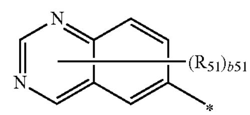
5-56
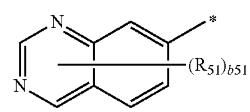
5-57
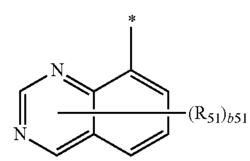
5-58
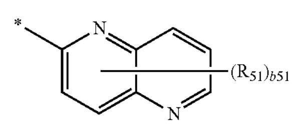
5-59
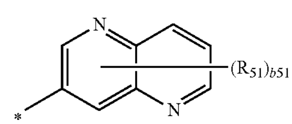
5-60
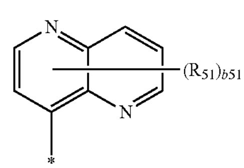
5-61
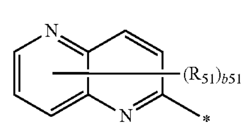

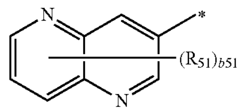
5-62
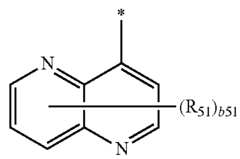
5-63
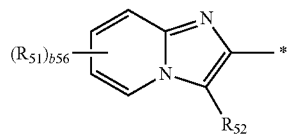
5-64
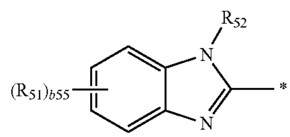
5-65
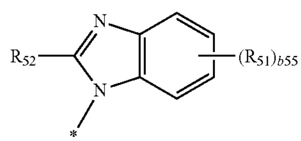
5-66
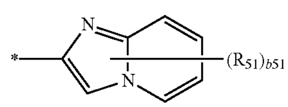
5-67
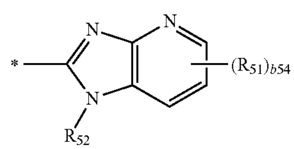
5-68
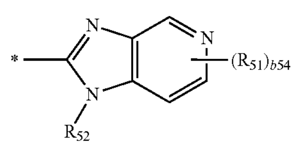
5-69
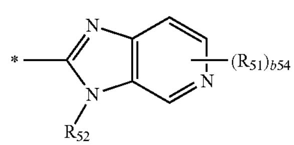
5-70
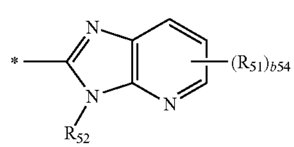
5-71
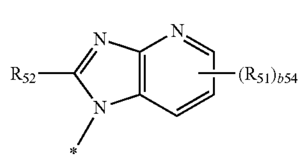
5-72
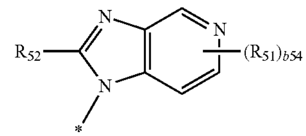
5-73
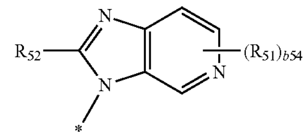
5-74
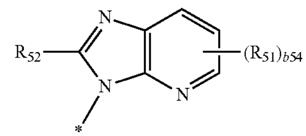
5-75
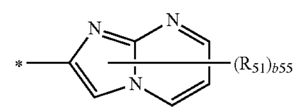
5-76
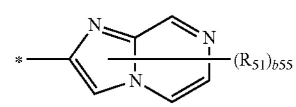
5-77
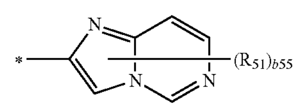
5-78
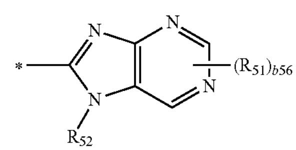
5-79
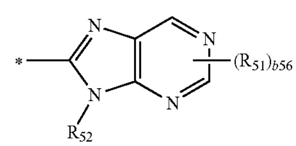
5-80
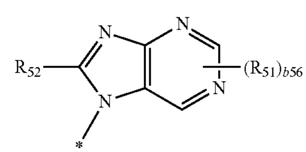
5-81
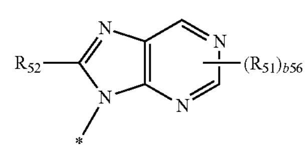
5-82
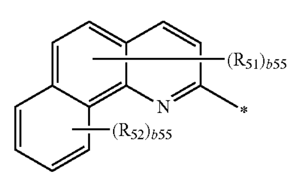
5-83

-continued 5-84

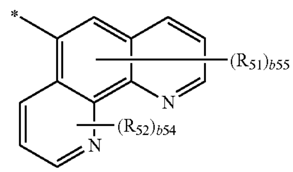

5-85

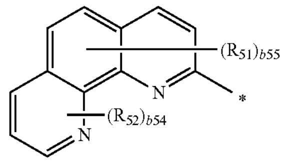

5-86

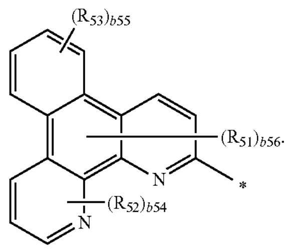

In Formulae 5-1 to 5-86, $X_{51}$ may be selected from a single bond, $N(R_{54})$, $C(R_{54})(R_{55})$, O, and S, $X_{52}$ may be selected from $N(R_{56})$, $C(R_{56})(R_{57})$, O, and S, $X_{53}$ may be $C(R_{58})(R_{59})$, $R_{51}$ to $R_{59}$ may each independently be selected from the group consisting of:

hydrogen, deuterium, —F, —Cl, —Br, —I, a $C_1$-$C_{20}$ alkyl group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —$N(Q_{31})(Q_{32})$, and —$Si(Q_{31})(Q_{32})(Q_{33})$; and a phenyl group, a biphenyl group, a terphenyl group, a naphthyl group, a pyridinyl group, a pyrimidinyl group, a pyridazinyl group, and a triazinyl group, each substituted with at least one selected from deuterium, —F, —Cl, —Br, —I, a $C_1$-$C_{20}$ alkyl group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —$N(Q_{21})(Q_{22})$, and —$Si(Q_{21})(Q_{22})(Q_{23})$, $Q_{21}$ to $Q_{23}$ and $Q_{31}$ to $Q_{33}$ may each independently be selected from a methyl group, an ethyl group, a phenyl group, a biphenyl group, a terphenyl group, and a naphthyl group, b51 may be selected from 1, 2, 3, 4, and 5, b52 may be selected from 1, 2, 3, 4, 5, 6, and 7, b53 may be selected from 1, 2, 3, 4, 5, and 6, b54 may be selected from 1, 2, and 3, b55 may be selected from 1, 2, 3, and 4, b56 may be selected from 1 and 2, b57 may be selected from 1, 2, 3, 4, 5, 6, 7, 8, and 9, and

* indicates a binding site to a neighboring atom.

In Formula 2, b26 may be selected from 1, 2, 3, 4, 5, and 6.

In Formula 9, $L_{91}$ may be selected from a substituted or unsubstituted $C_6$-$C_{60}$ arylene group and a substituted or unsubstituted $C_1$-$C_{60}$ heteroarylene group.

For example, in Formula 9, $L_{91}$ may be selected from the group consisting of:

a phenylene group, a naphthylene group, a phenanthrenylene group, an anthracenylene group, a triphenylenylene group, a pyrenylene group, a chrysenylene group, a pyridinylene group, a pyrazinylene group, a pyrimidinylene group, a quinolinylene group, an isoquinolinylene group, a benzoquinolinylene group, a phthalazinylene group, a naphthyridinylene group, a quinoxalinylene group, a quinazolinylene group, a phenanthridinylene group, an acridinylene group, a phenanthrolinylene group, and a triazinylene group; and a phenylene group, a naphthylene group, a phenanthrenylene group, an anthracenylene group, a triphenylenylene group, a pyrenylene group, a chrysenylene group, a pyridinylene group, a pyrazinylene group, a pyrimidinylene group, a quinolinylene group, an isoquinolinylene group, a benzoquinolinylene group, a phthalazinylene group, a naphthyridinylene group, a quinoxalinylene group, a quinazolinylene group, a phenanthridinylene group, an acridinylene group, a phenanthrolinylene group, and a triazinylene group, each substituted with at least one selected from deuterium, —F, —Cl, —Br, —I, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, but embodiments are not limited thereto.

In various embodiments, in Formula 9, $L_{91}$ may be selected from the group consisting of:

a phenylene group, a naphthylene group, a pyridinylene group, a pyrazinylene group, a pyrimidinylene group, a quinolinylene group, an isoquinolinylene group, a naphthyridinylene group, a quinoxalinylene group, and a triazinylene group; and a phenylene group, a naphthylene group, a pyridinylene group, a pyrazinylene group, a pyrimidinylene group, a quinolinylene group, an isoquinolinylene group, a naphthyridinylene group, a quinoxalinylene group, and a triazinylene group, each substituted with at least one selected from deuterium, —F, —Cl, —Br, —I, a cyano group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, but embodiments are not limited thereto.

In various embodiments, in Formula 9, $L_{91}$ may be selected from groups represented by Formulae 4-1 to 4-15, but embodiments are not limited thereto:

4-1

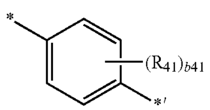

4-2

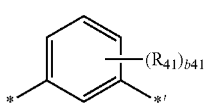

4-3

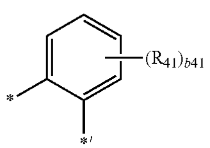

4-4

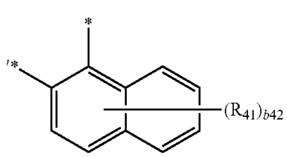

4-5

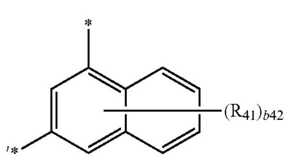

4-6

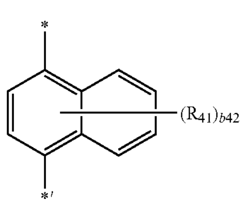

-continued 4-7

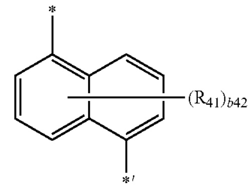

4-8

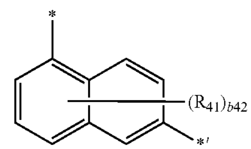

4-9

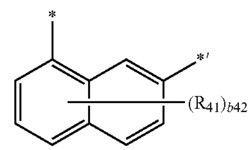

4-10

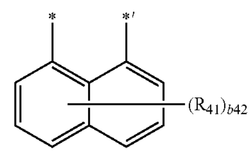

4-11

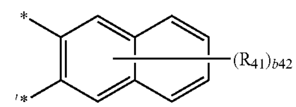

4-12

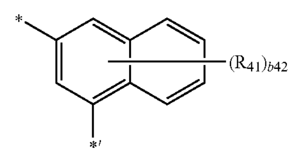

4-13

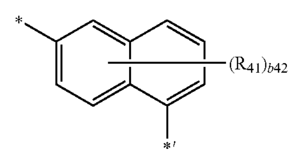

4-14

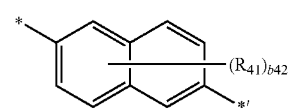

4-15

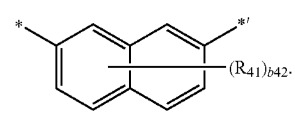

In Formulae 4-1 to 4-15, $R_{41}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, and $-P(=O)(Q_{31})(Q_{32})$, $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, b41 may be selected from 1, 2, 3, and 4, b42 may be selected from 1, 2, 3, 4, 5, and 6, and

* and *' each independently indicate a binding site to a neighboring atom.

In Formula 9, a91 indicates the number of $L_{91}$(s), wherein when a91 is 0, $(L_{91})_{a91}$ may be a single bond, and when a91 is 2, a plurality of $L_{91}$(s) may be identical to or different from each other. In Formula 9, a91 may be selected from 0, 1, and 2.

For example, in Formula 9, a91 may be selected from 1 and 2, but embodiments are not limited thereto.

In Formula 9, $R_{91}$ may be selected from a substituted or unsubstituted $C_6$-$C_{60}$ aryl group and a substituted or unsubstituted $C_1$-$C_{60}$ heteroaryl group.

For example, in Formula 9, $R_{91}$ may be selected from the group consisting of:

a $C_6$-$C_{60}$ aryl group and a $C_1$-$C_{60}$ heteroaryl group;

a $C_6$-$C_{60}$ aryl group and a $C_1$-$C_{60}$ heteroaryl group, each substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $-N(Q_{31})(Q_{32})$, and $-Si(Q_{31})(Q_{32})(Q_{33})$; and a $C_6$-$C_{60}$ aryl group and a $C_1$-$C_{60}$ heteroaryl group, each substituted with at least one substituent selected from a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each of the at least one substituent is substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $-N(Q_{21})(Q_{22})$, and $-Si(Q_{21})(Q_{22})(Q_{23})$, and $Q_{21}$ to $Q_{23}$ and $Q_{31}$ to $Q_{33}$ may each independently be selected from a $C_1$-$C_{60}$ alkyl group and a $C_6$-$C_{60}$ aryl group, but embodiments are not limited thereto.

In various embodiments, in Formula 9, $R_{91}$ may be selected from the group consisting of:

a phenyl group, a biphenyl group, a terphenyl group, a naphthyl group, an anthracenyl group, a triphenylenyl group, a phenanthrenyl group, a pyrenyl group, a chrysenyl group, a pyridinyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a phenanthridinyl group, a phenanthrolinyl group, and a benzophenanthrolinyl group;

a phenyl group, a biphenyl group, a terphenyl group, a naphthyl group, an anthracenyl group, a triphenylenyl group, a phenanthrenyl group, a pyrenyl group, a chrysenyl group, a pyridinyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a phenanthridinyl group, a phenanthrolinyl group, and a benzophenanthrolinyl group, each substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $-N(Q_{31})(Q_{32})$, and $-Si(Q_{31})(Q_{32})(Q_{33})$; and a phenyl group, a biphenyl group, a terphenyl group, a naphthyl group, an anthracenyl group, a triphenylenyl group, a phenanthrenyl group, a pyrenyl group, a chrysenyl group, a pyridinyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a phenanthridinyl group, a phenanthrolinyl group, and a benzophenanthrolinyl group, each substituted with at least one substituent selected from a phenyl group, a biphenyl group, a terphenyl group, a naphthyl group, a pyridinyl group, a pyrimidinyl group, a pyridazinyl group, and a triazinyl group, each of the at least one substituent is substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $-N(Q_{21})(Q_{22})$, and $-Si(Q_{21})(Q_{22})(Q_{23})$, and $Q_{21}$ to $Q_{23}$ and $Q_{31}$ to $Q_{33}$ may each independently be selected from a methyl group, an ethyl group, a phenyl group, a biphenyl group, a terphenyl group, and a naphthyl group, but embodiments are not limited thereto.

In various embodiments, in Formula 9, $R_{91}$ may be selected from groups represented by Formulae 5-1 to 5-14, 5-30 to 5-63, and 5-83 to 5-86, but embodiments are not limited thereto:

5-1

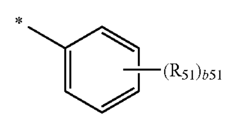

5-2

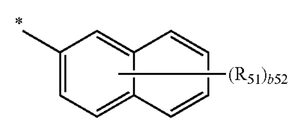

5-3

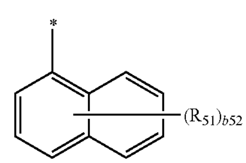

5-4

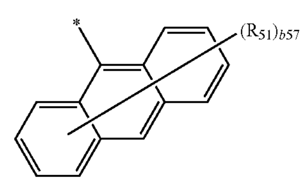

5-5

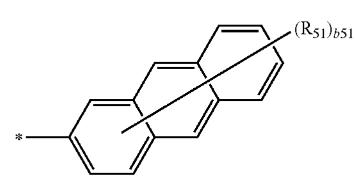

-continued
5-6
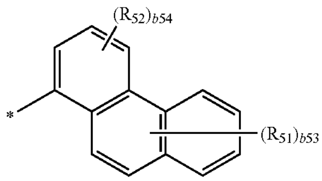
5-7
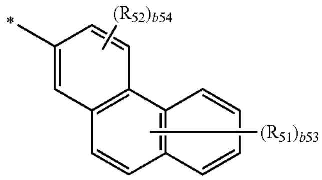
5-8
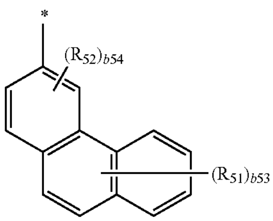
5-9
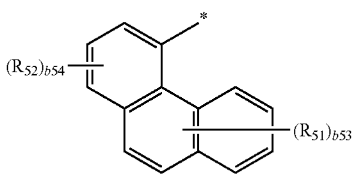
5-10
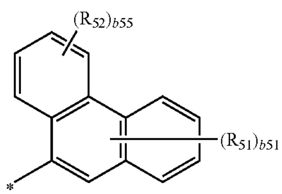
5-11
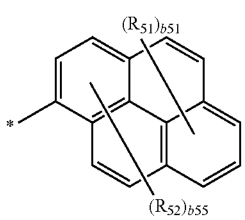
5-12
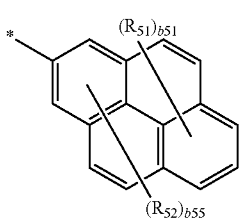
-continued
5-13
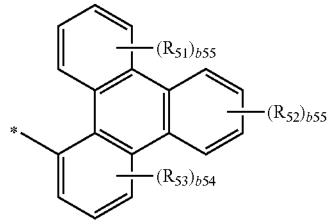
5-14
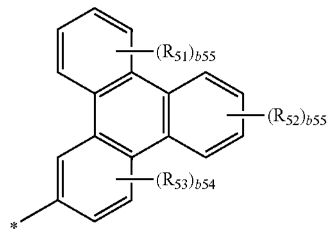
5-30
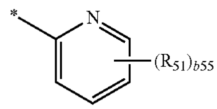
5-31
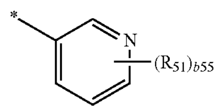
5-32
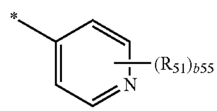
5-33
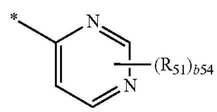
5-34
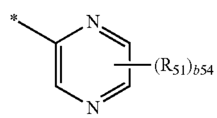
5-35
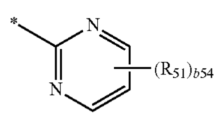
5-36
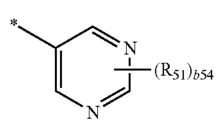
5-37
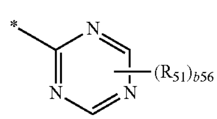
5-38
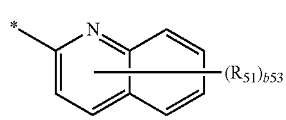

-continued
5-39
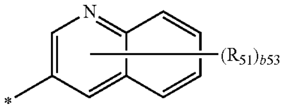
5-40
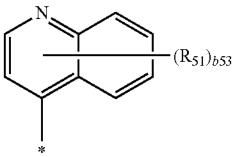
5-41
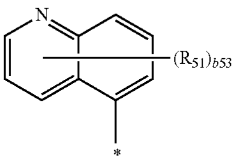
5-42
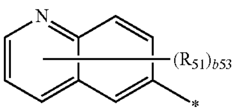
5-43
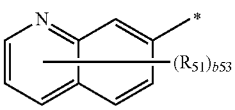
5-44
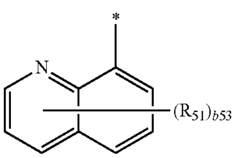
5-45
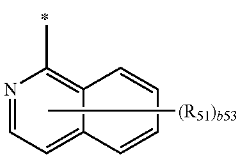
5-46
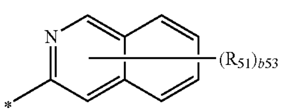
5-47
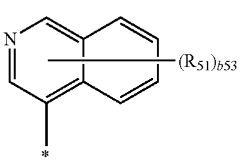
5-48
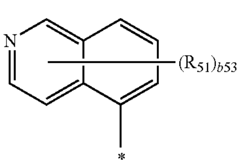
-continued
5-49
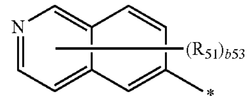
5-50
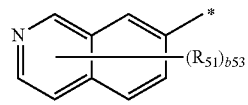
5-51
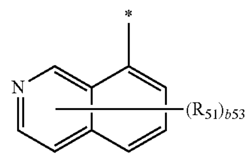
5-52
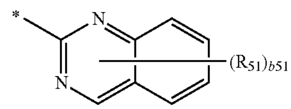
5-53
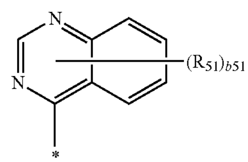
5-54
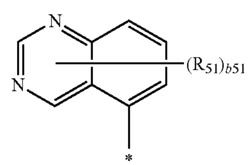
5-55
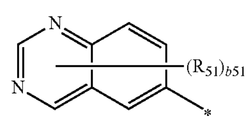
5-56
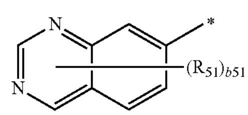
5-57
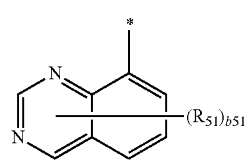
5-58
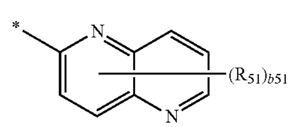
5-59
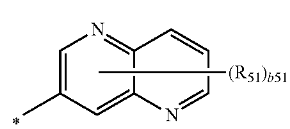

-continued 5-60

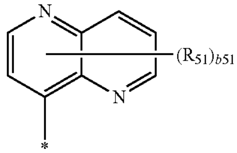

5-61

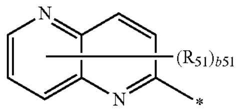

5-62

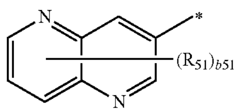

5-63

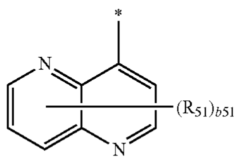

5-83

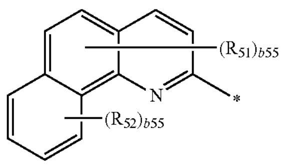

5-84

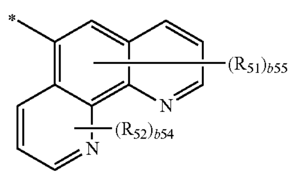

5-85

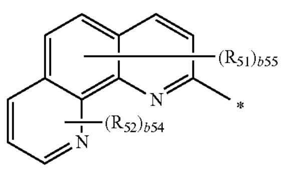

5-86

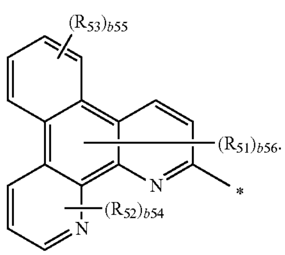

In Formulae 5-1 to 5-14, 5-30 to 5-63, and 5-83 to 5-86, $R_{51}$ to $R_{53}$ may each independently be selected from the group consisting of:

hydrogen, deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{31}$)($Q_{32}$), and —Si($Q_{31}$)($Q_{32}$)($Q_{33}$); and a phenyl group, a biphenyl group, a terphenyl group, a naphthyl group, a pyridinyl group, a pyrimidinyl group, a pyridazinyl group, and a triazinyl group, each substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), and —Si($Q_{21}$)($Q_{22}$)($Q_{23}$), $Q_{21}$ to $Q_{23}$ and $Q_{31}$ to $Q_{33}$ may each independently be selected from a methyl group, an ethyl group, a phenyl group, a biphenyl group, a terphenyl group, and a naphthyl group, b51 may be selected from 1, 2, 3, 4, and 5, b52 may be selected from 1, 2, 3, 4, 5, 6, and 7, b53 may be selected from 1, 2, 3, 4, 5, and 6, b54 may be selected from 1, 2, and 3, b55 may be selected from 1, 2, 3, and 4, b56 may be selected from 1 and 2, b57 may be selected from 1, 2, 3, 4, 5, 6, 7, 8, and 9, and

* indicates a binding site to a neighboring atom.

In an embodiment, the first compound represented by one selected from Formulae 1-1 and 1-2 may be represented by one selected from Formulae 1-11 to 1-15 and 1-21 to 1-23, but embodiments are not limited thereto:

1-11

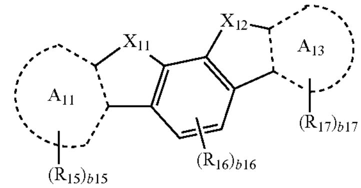

1-12

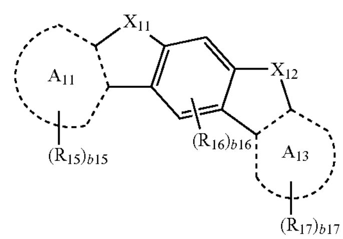

1-13

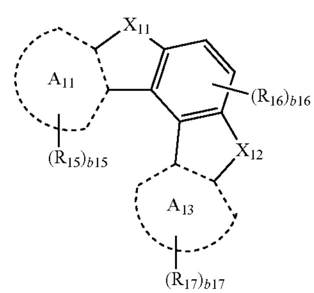

1-14

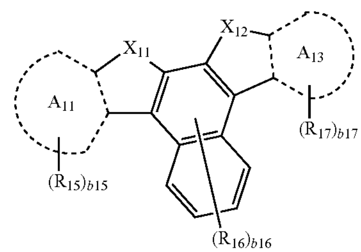

-continued 1-15

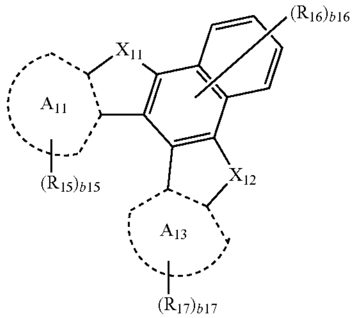

1-21

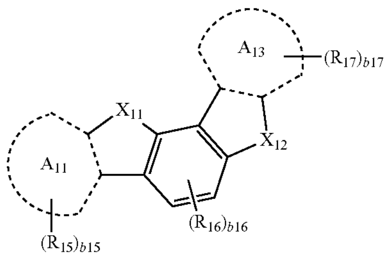

1-22

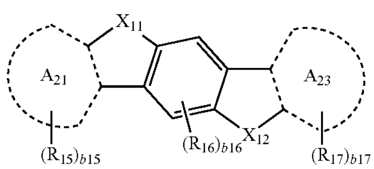

1-23

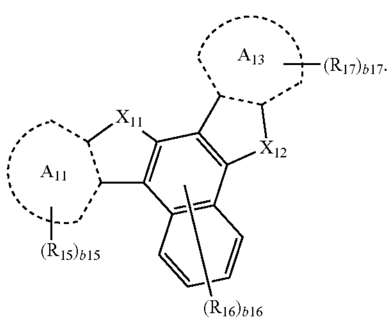

In Formulae 1-11 to 1-15 and 1-21 to 1-23, $A_{11}$, $A_{13}$, $X_{11}$, $X_{12}$, $R_{11}$ to $R_{17}$, and b15 to b17 may each independently be understood by referring to the descriptions thereof provided in connection with Formulae 1-1 and 1-2 above.

For example, in Formulae 1-1 to 1-23, $A_1$ and $A_{13}$ may each independently be selected from a benzene group, a naphthalene group, a phenanthrene group, an anthracene group, a pyridine group, a pyrazine group, a pyrimidine group, a pyridazine group, a quinoline group, an isoquinoline group, a quinoxaline group, and a quinazoline, but embodiments are not limited thereto.

In various embodiments, the first compound represented by one selected from Formulae 1-1 and 1-2 may be represented by one selected from Formulae 1-14a to 1-14g, but embodiments are not limited thereto:

1-14a

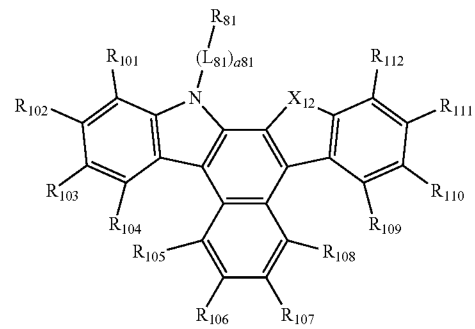

1-14b

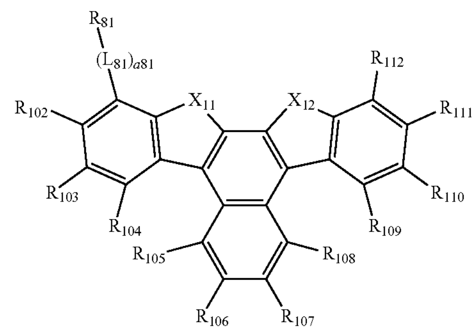

1-14c

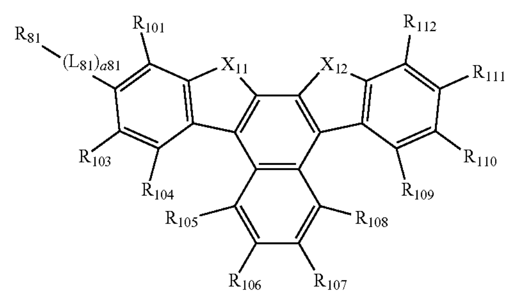

1-14d

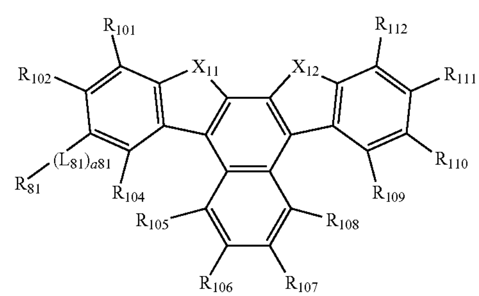

1-14e

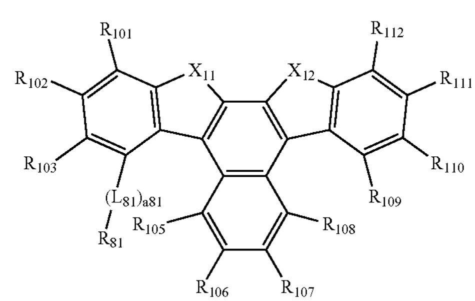

-continued 1-14f

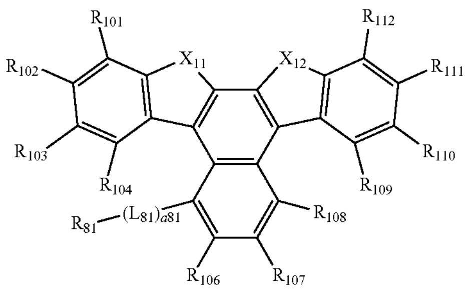

1-14g

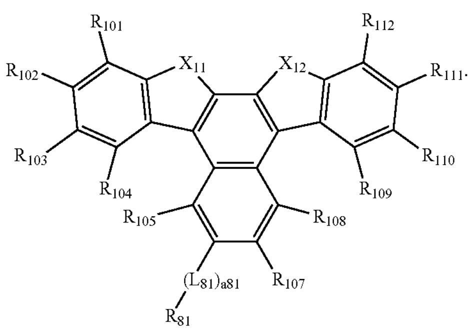

In Formula 1-14a to 1-14g, $X_{11}$ and $X_{12}$ may each independently be understood by referring to the descriptions thereof provided in connection with Formulae 1-1 and 1-2, $R_{101}$ to $R_{112}$ may each independently be understood by referring to the description of $R_{11}$ in Formulae 1-1 and 1-2 provided herein, and $L_{81}$, a81, and $R_{81}$ may each independently be understood by referring to the descriptions thereof provided in connection with Formula 8.

In an embodiment, the second compound represented by Formula 2 may be represented by Formula 2-1, but embodiments of the present disclosure are not limited thereto:

Formula 2-1

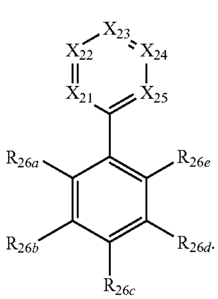

In Formula 2-1, $X_{21}$ may be selected from N and $C(R_{21})$, $X_{22}$ may be selected from N and $C(R_{22})$, $X_{23}$ may be selected from N and $C(R_{23})$, $X_{24}$ may be selected from N and $C(R_{24})$, and $X_{25}$ may be selected from N and $C(R_{25})$, wherein at least one selected from $X_{21}$ to $X_{25}$ may be N, $R_{21}$ to $R_{25}$ and $R_{26a}$ to $R_{26e}$ may each independently be selected from the group represented by Formula 9, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, wherein at least one selected from $R_{21}$ to $R_{25}$ and $R_{26a}$ to $R_{26e}$ may be the group represented by Formula 9, and $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The first compound represented by one selected from Formulae 1-1 and 1-2 may be selected from Compounds B-101 to B-205, C-101 to C-270, and D-101 to D-173, but embodiments are not limited thereto:

B-101

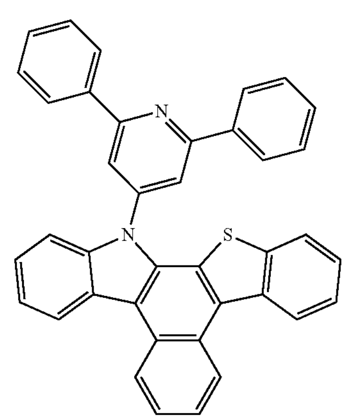

B-102
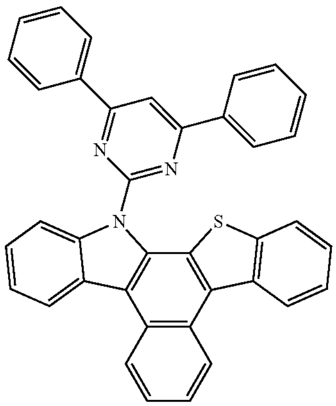
B-103
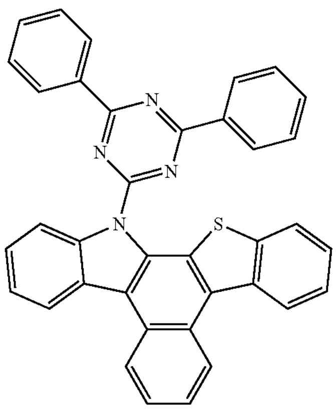
B-104
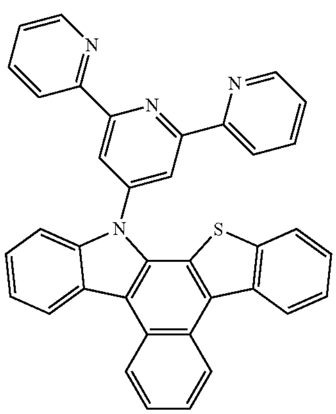
B-105
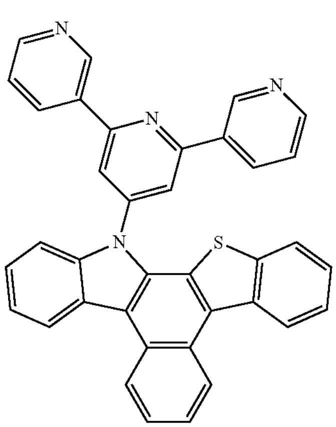
B-106
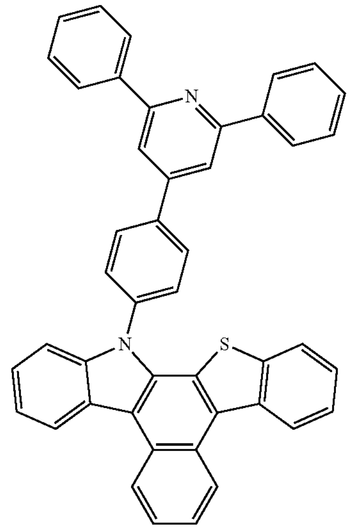
B-107
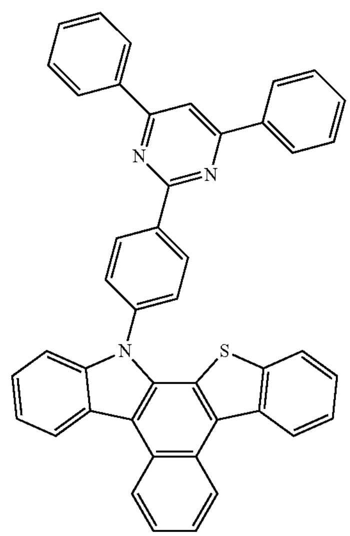
B-108
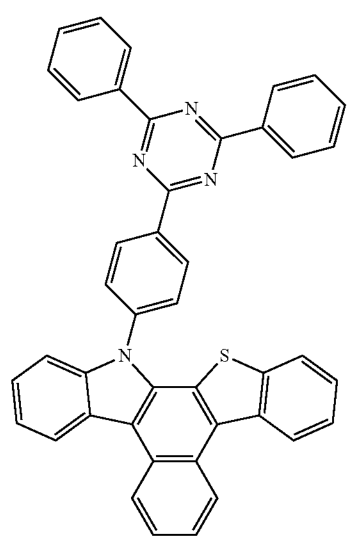

-continued
B-109
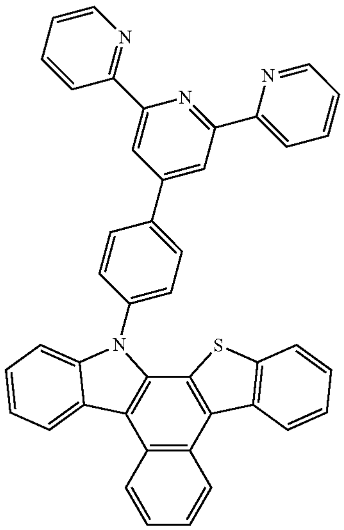
B-110
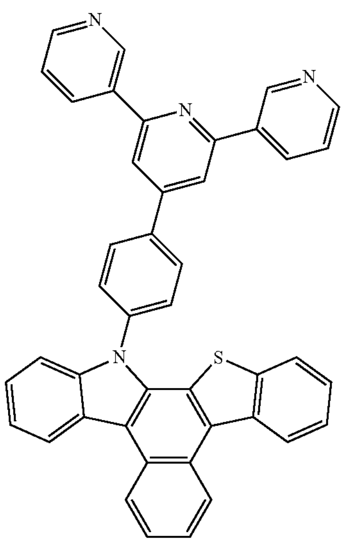
B-111
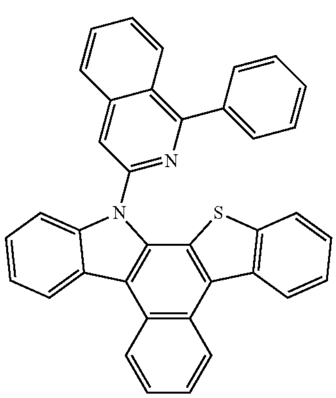
-continued
B-112
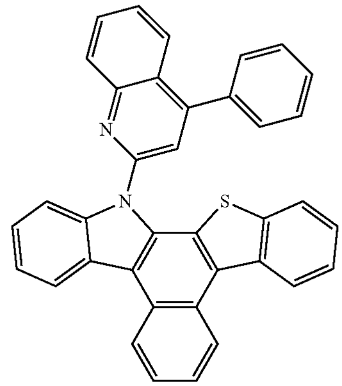
B-113
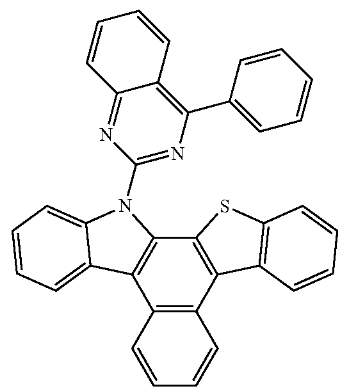
B-114
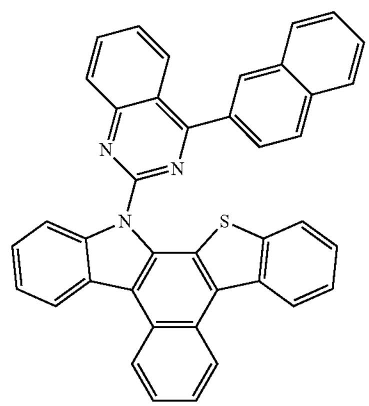
B-115
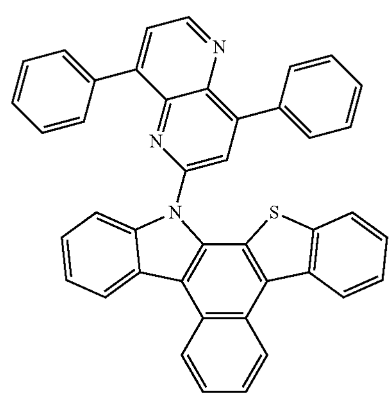

-continued
B-116
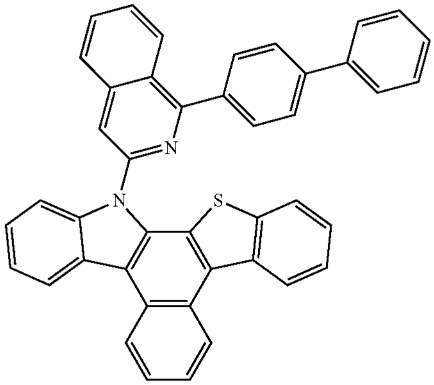
B-117
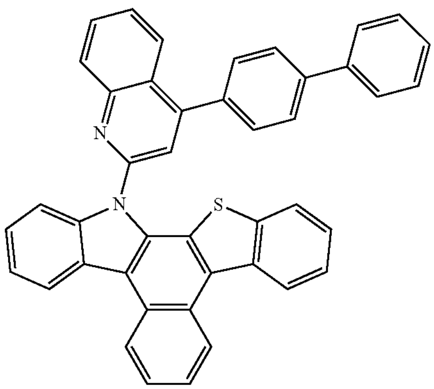
B-118
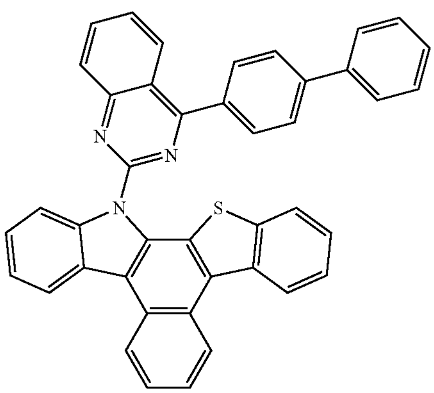
B-119
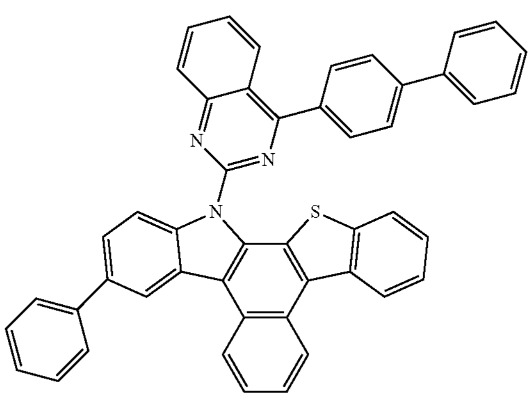
-continued
B-120
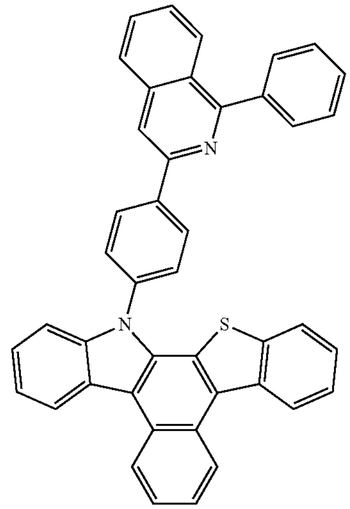
B-121
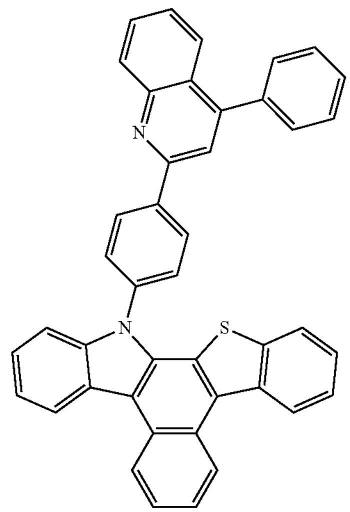
B-122
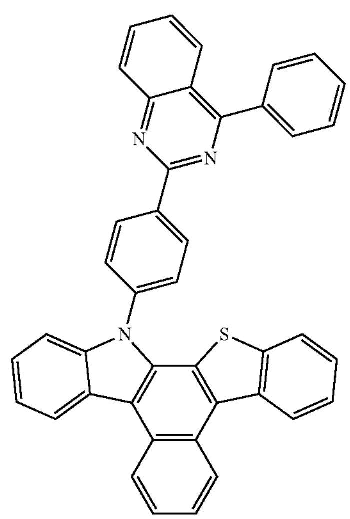

-continued
B-123
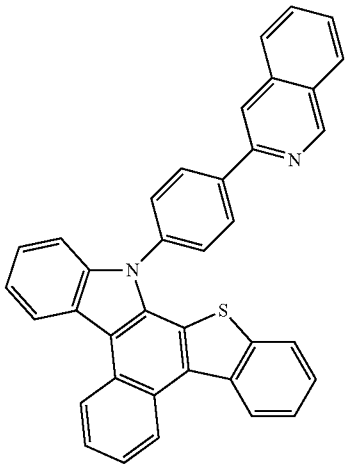
B-124
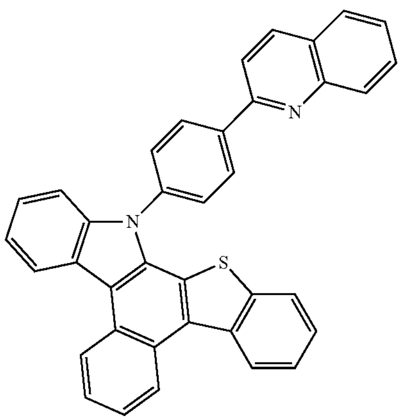
B-125
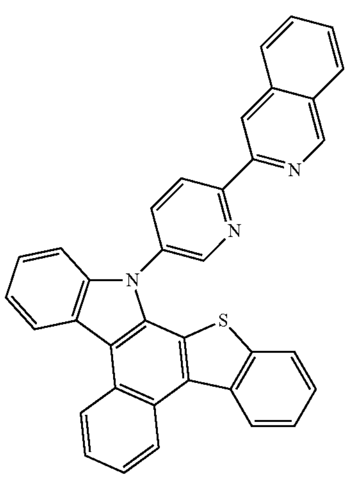
-continued
B-126
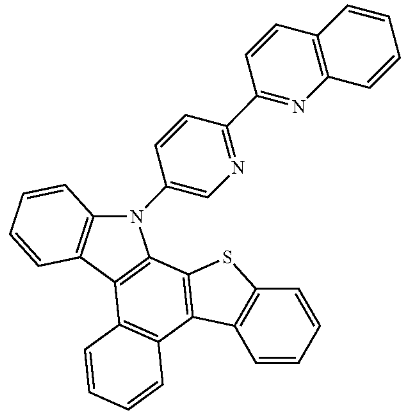
B-127
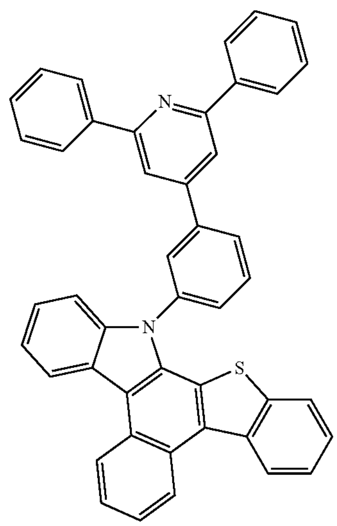
B-128
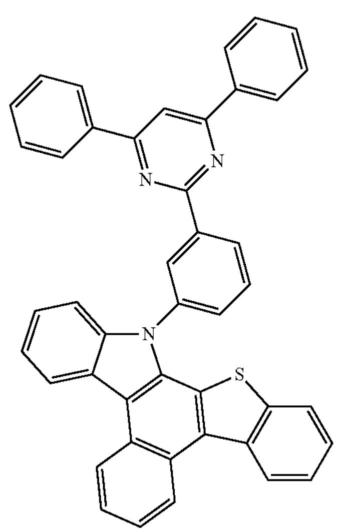

-continued
B-129
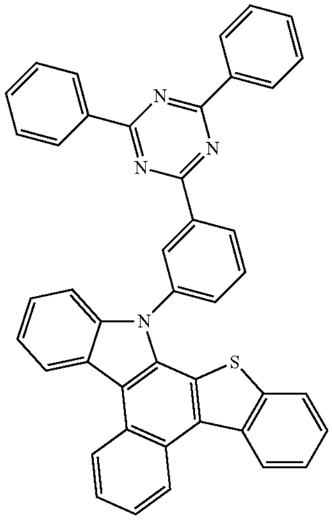
B-130
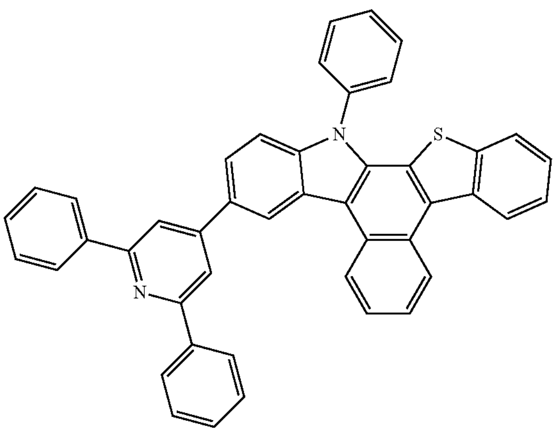
B-131
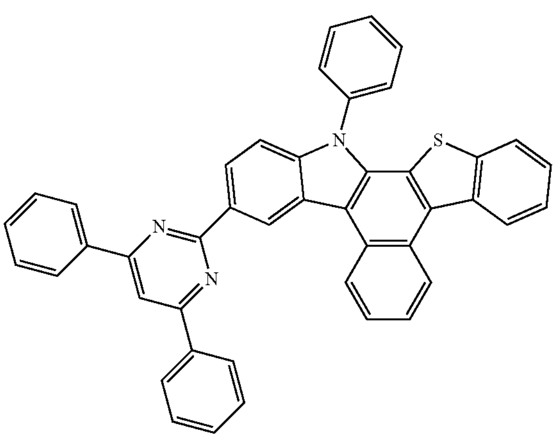
-continued
B-132
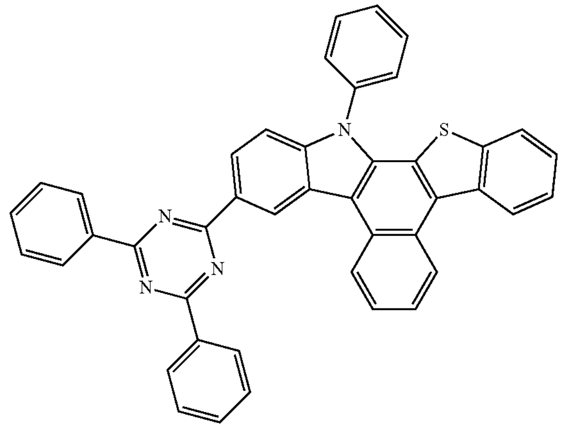
B-133
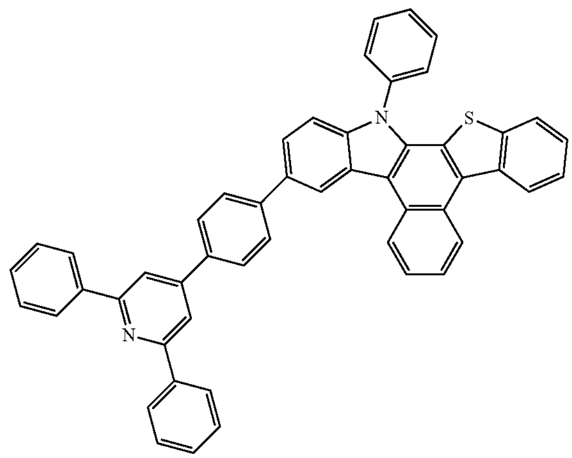
B-134
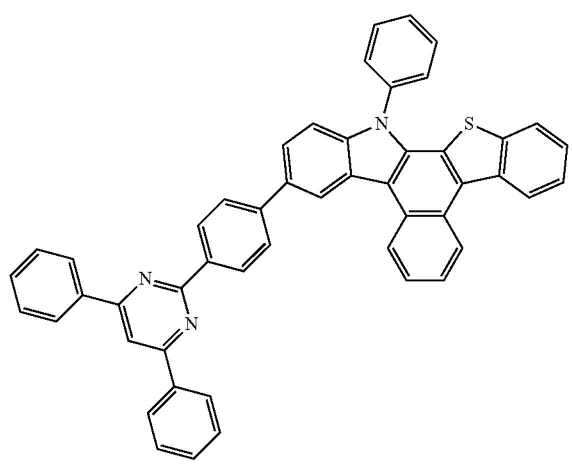

-continued
B-135
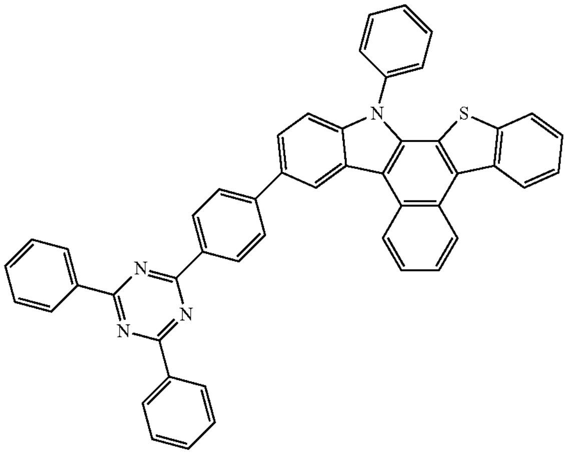
B-136
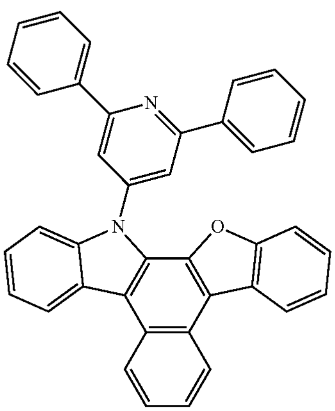
B-137
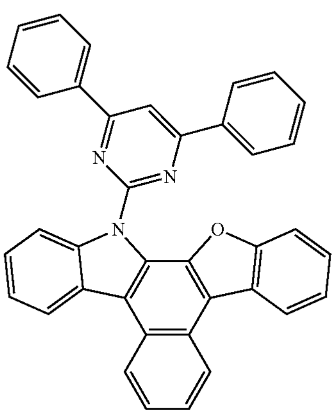
-continued
B-138
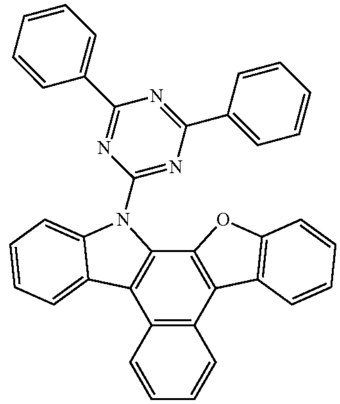
B-139
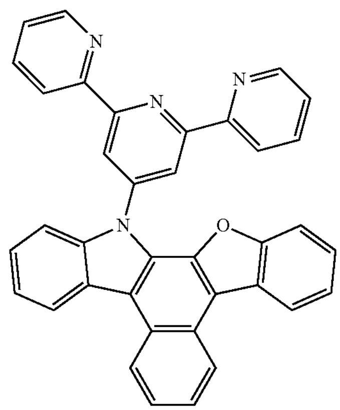
B-140
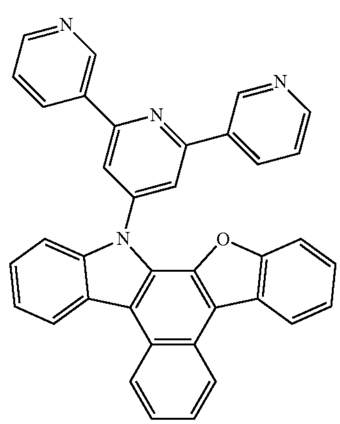

-continued
B-141
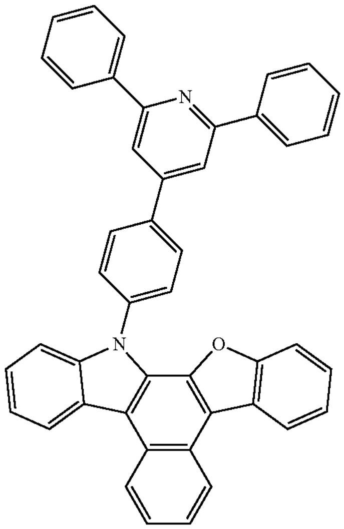
B-142
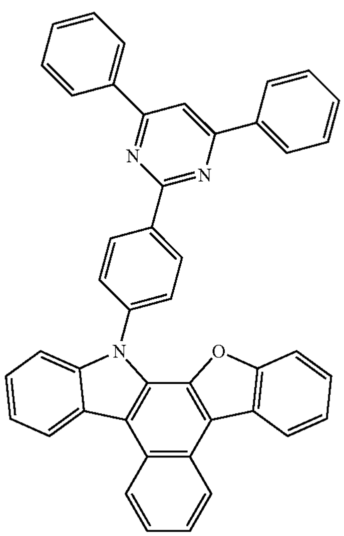
B-143
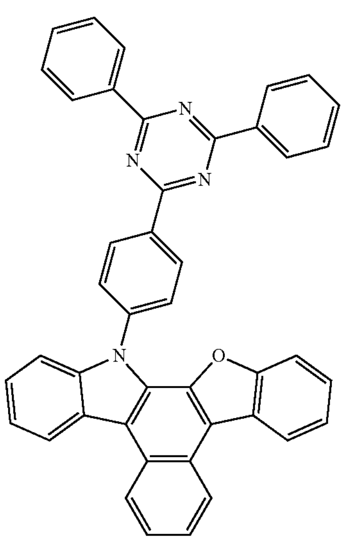
-continued
B-144
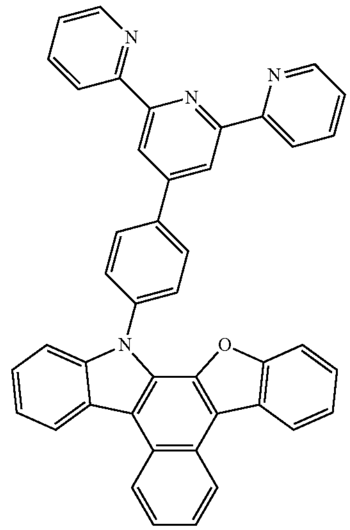
B-145
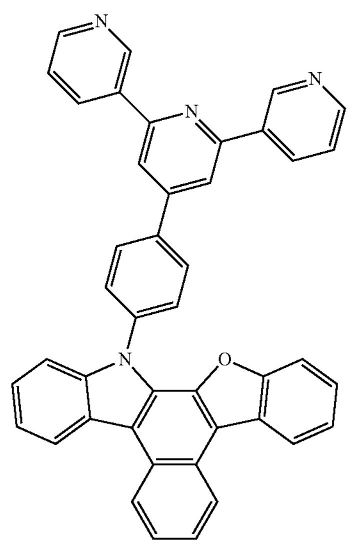
B-146
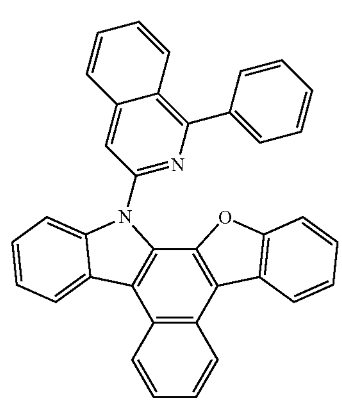

-continued
B-147
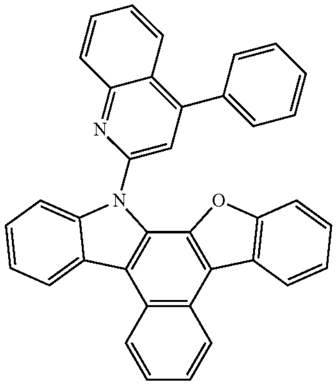
B-148
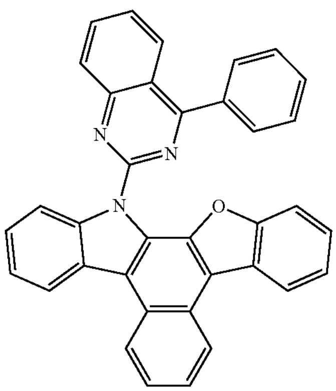
B-149
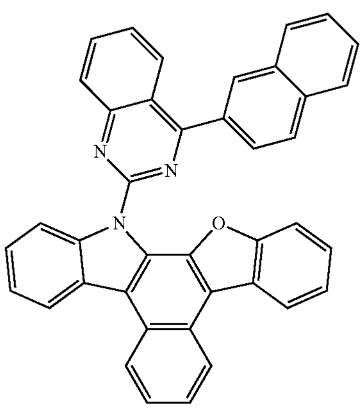
B-150
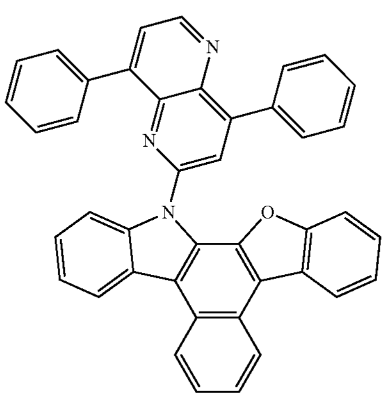
-continued
B-151
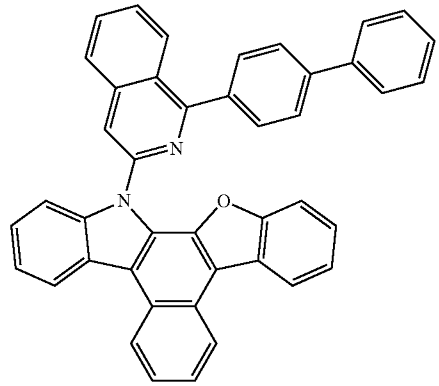
B-152
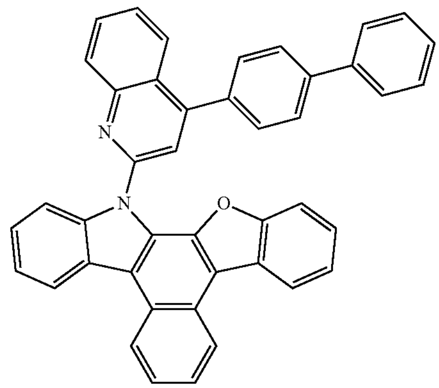
B-153
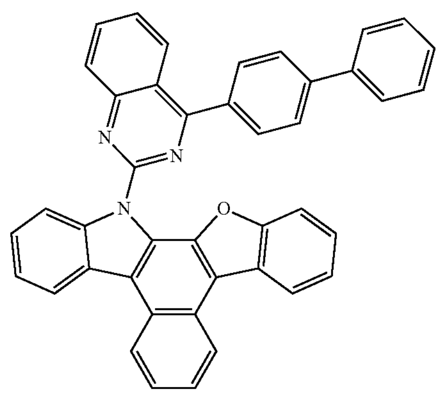
B-154
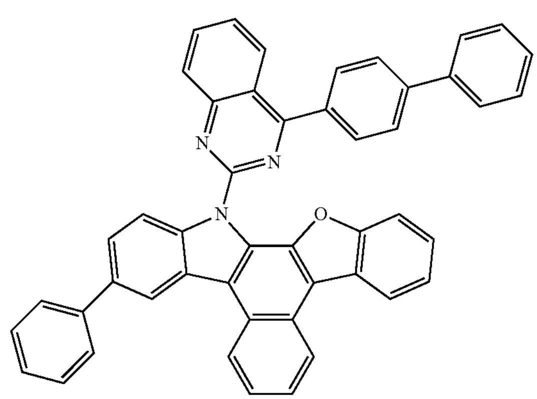

-continued
B-155
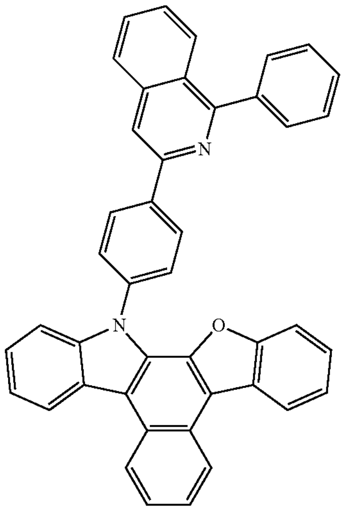
B-156
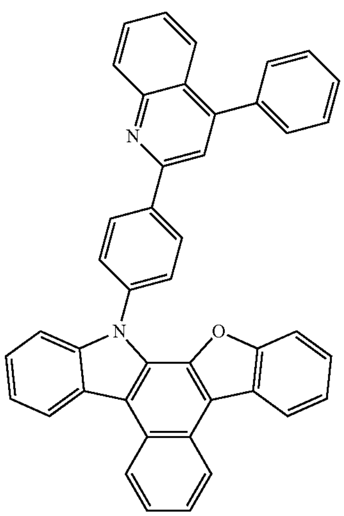
B-157
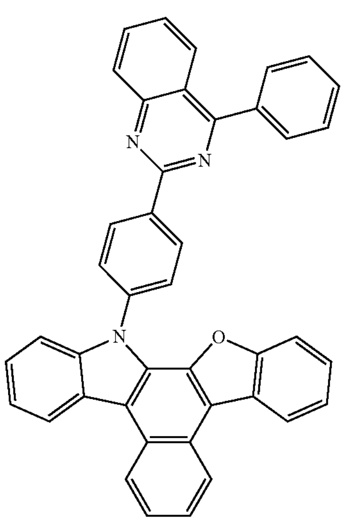
-continued
B-158
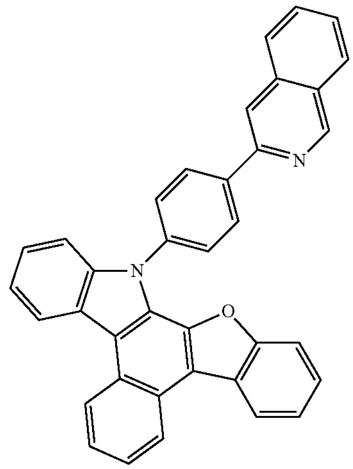
B-159
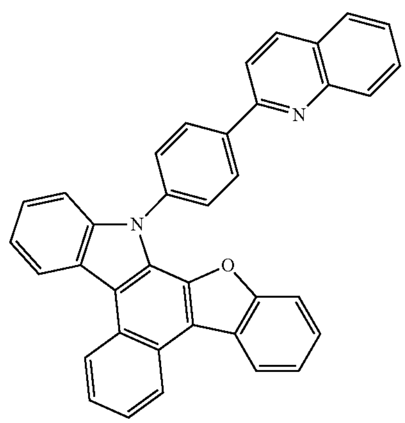
B-160
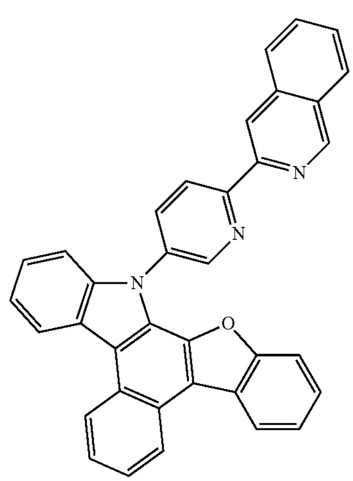

-continued
B-161
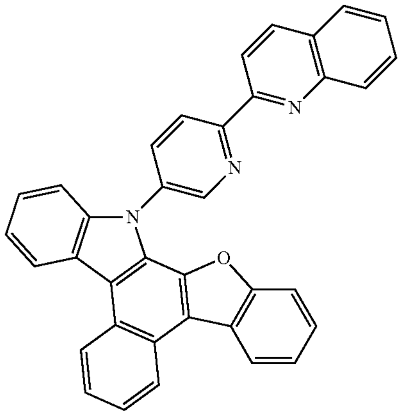
B-162
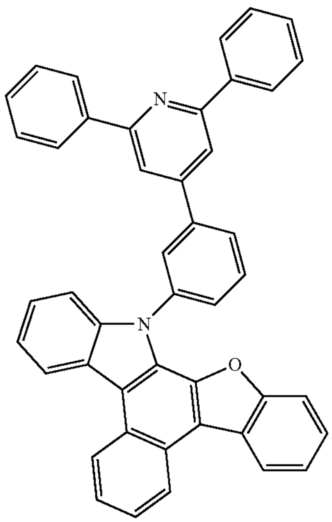
B-163
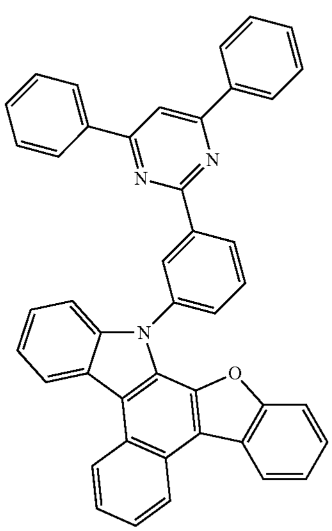
-continued
B-164
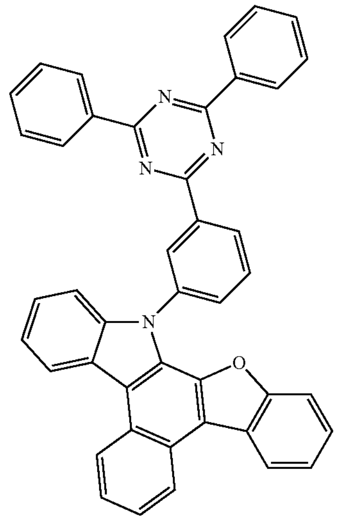
B-165
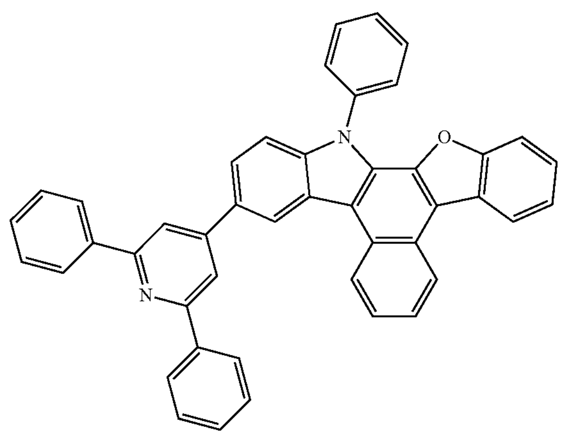
B-166
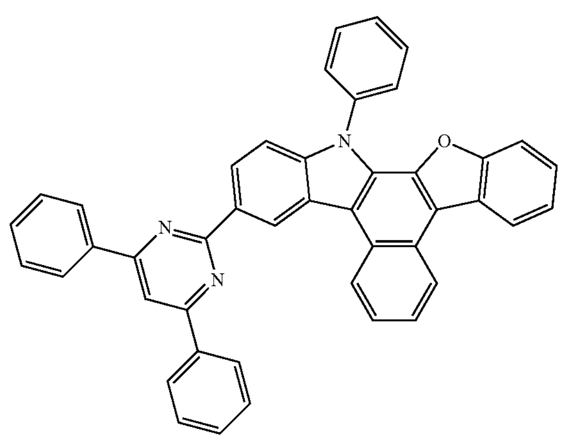

-continued
B-167
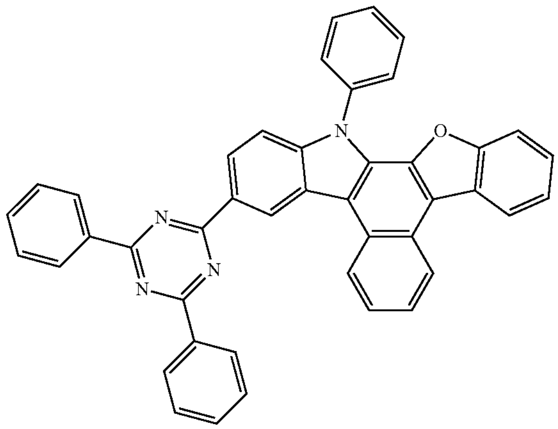
B-168
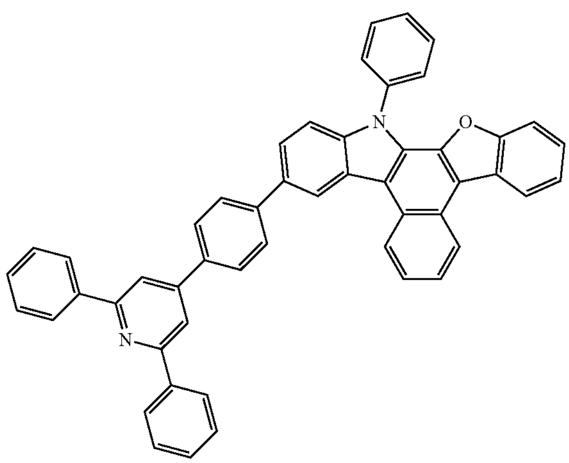
B-169
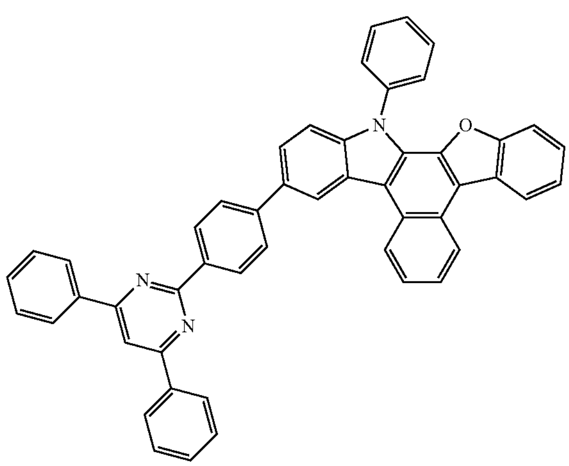
-continued
B-170
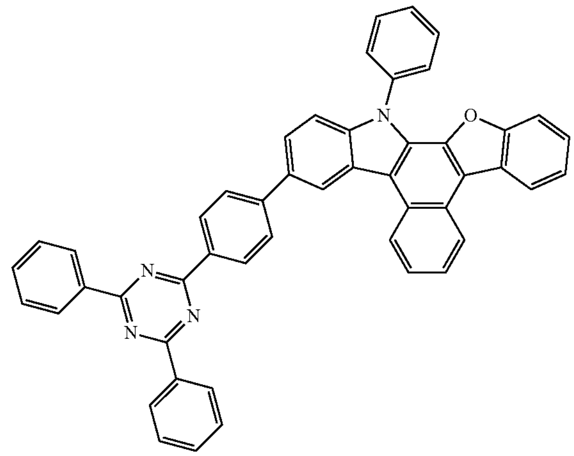
B-171
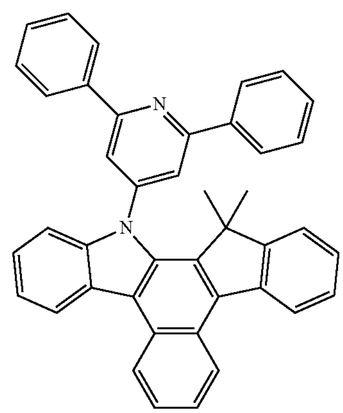
B-172
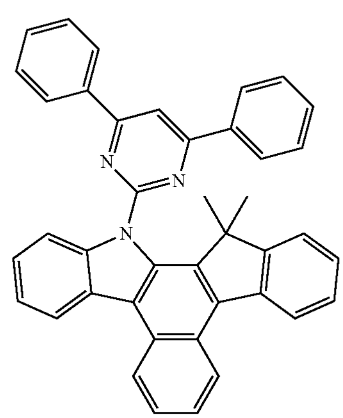

-continued
B-173
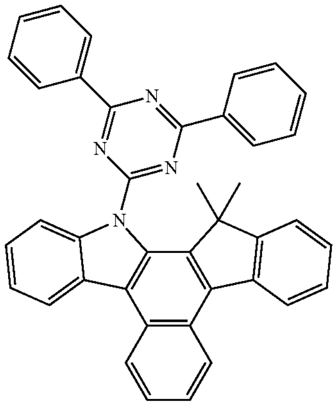
B-174
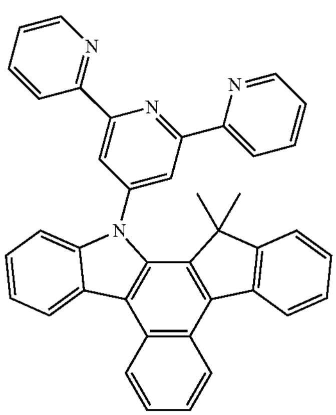
B-175
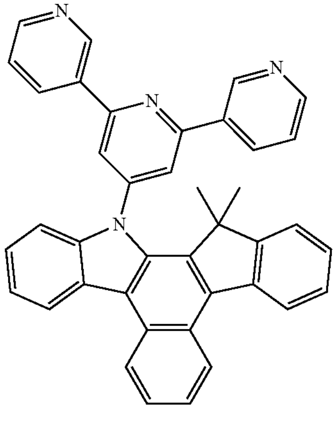
-continued
B-176
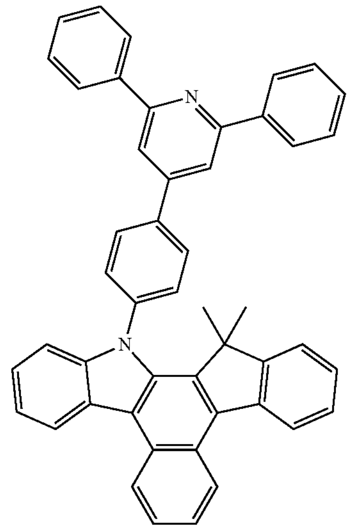
B-177
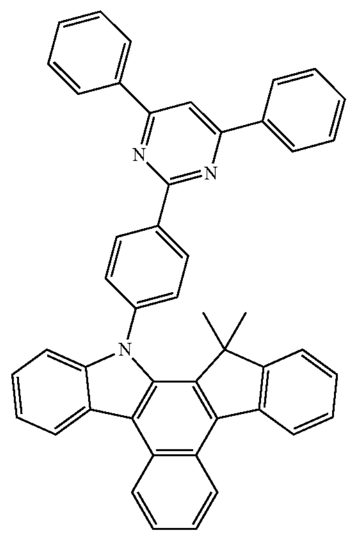
B-178
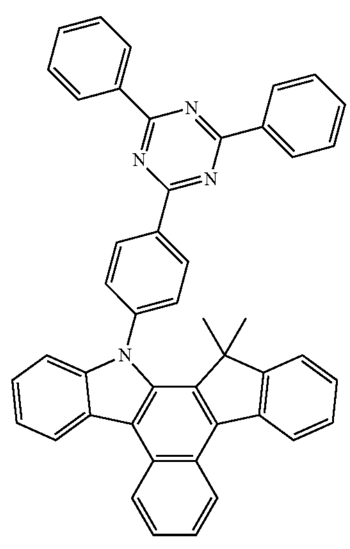

B-179
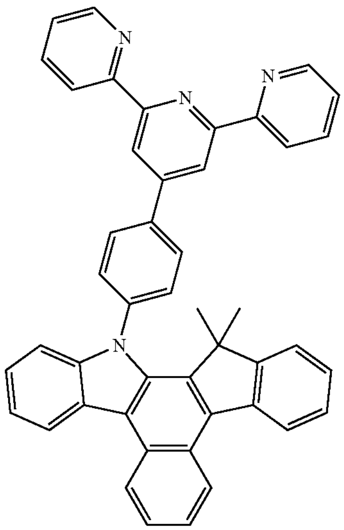
B-180
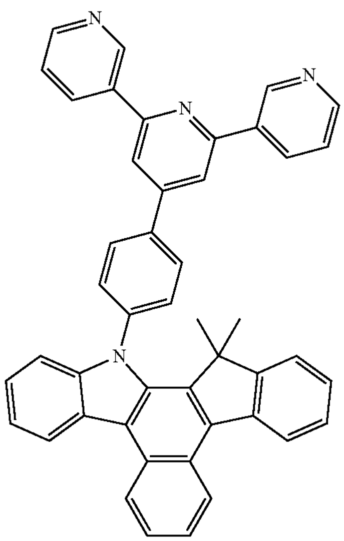
B-181
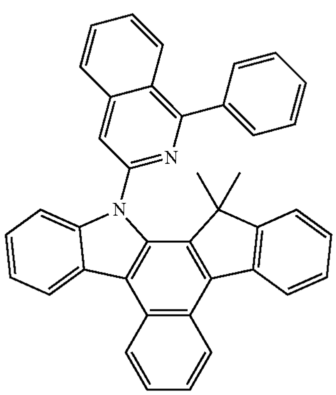
B-182
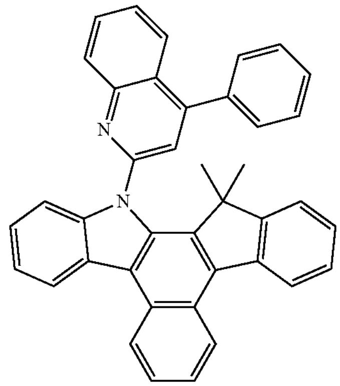
B-183
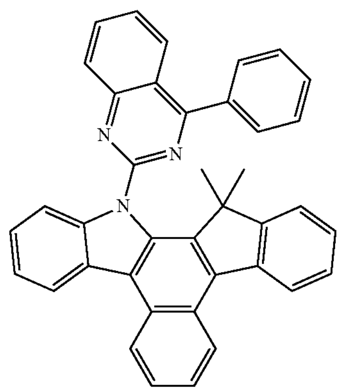
B-184
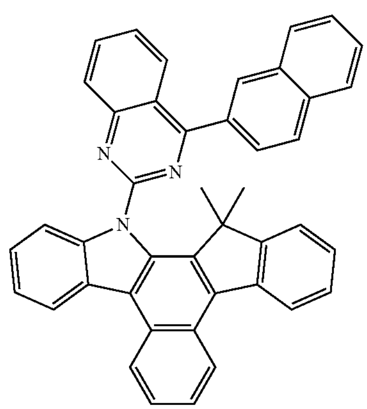
B-185
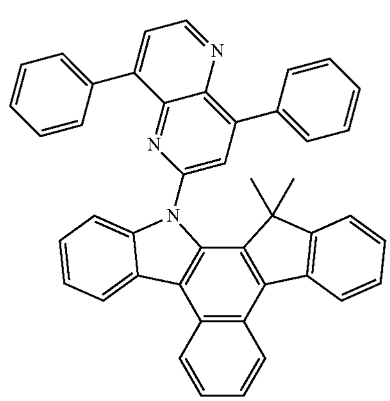

-continued
B-186
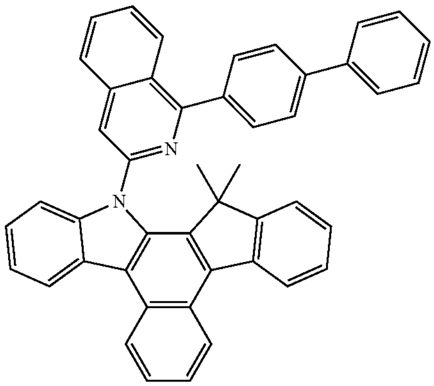
B-187
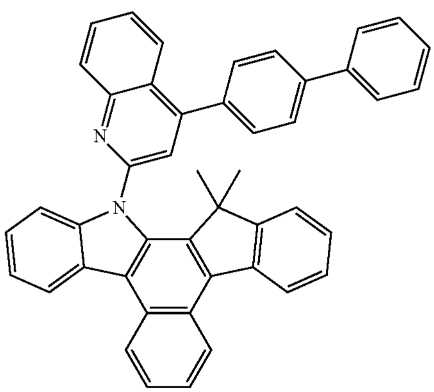
B-188
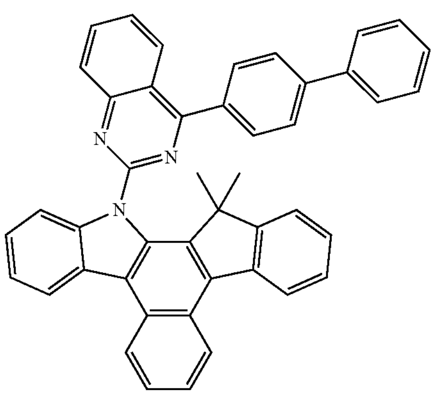
B-189
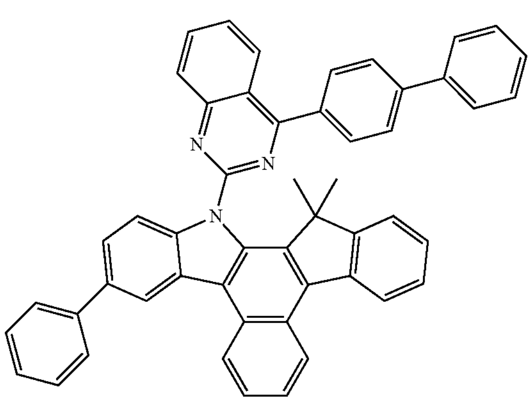
-continued
B-190
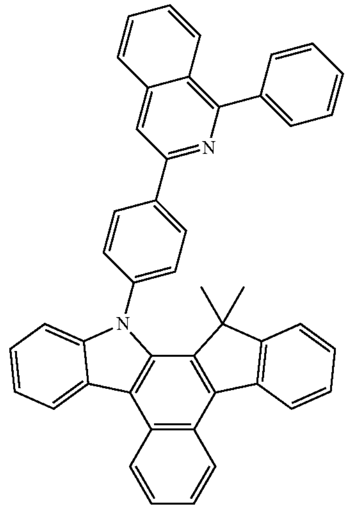
B-191
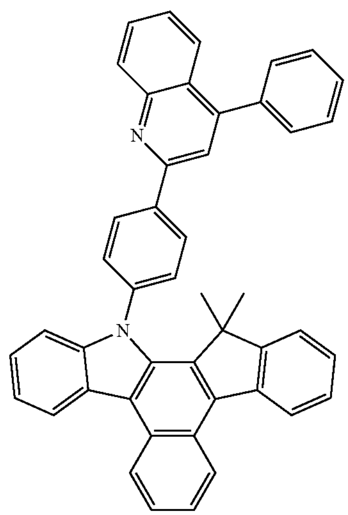
B-192
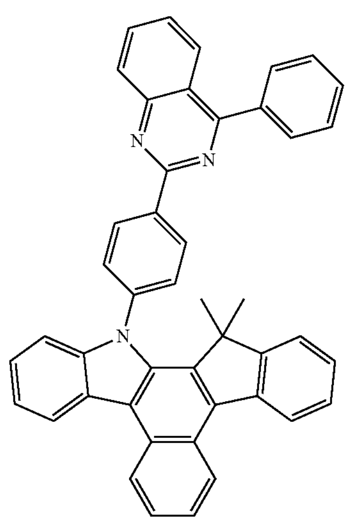

-continued
B-193
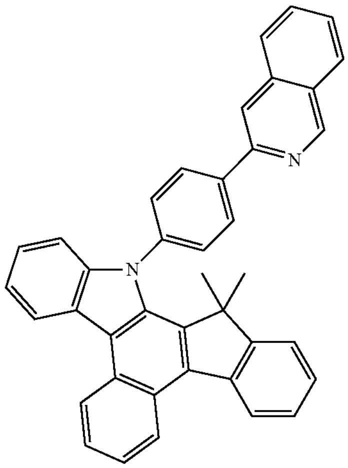
B-194
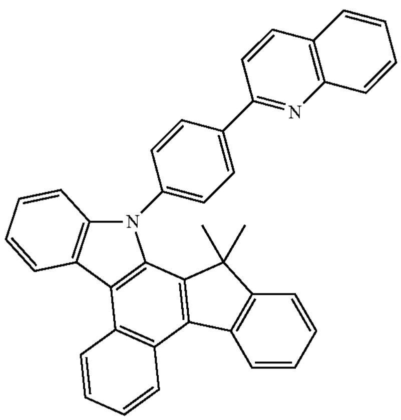
B-195
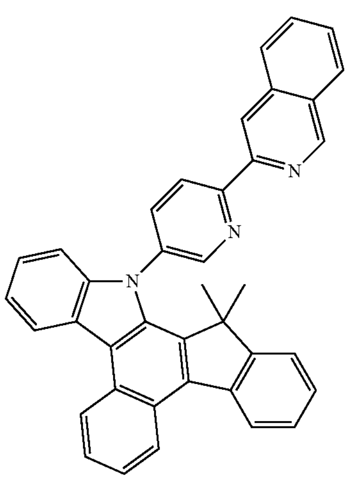
-continued
B-196
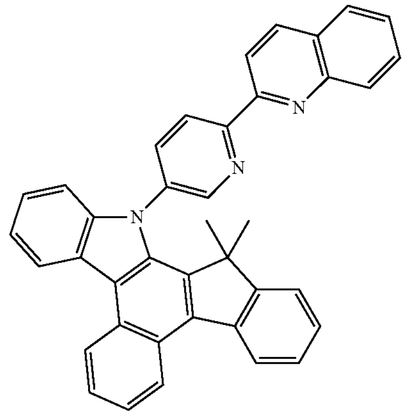
B-197
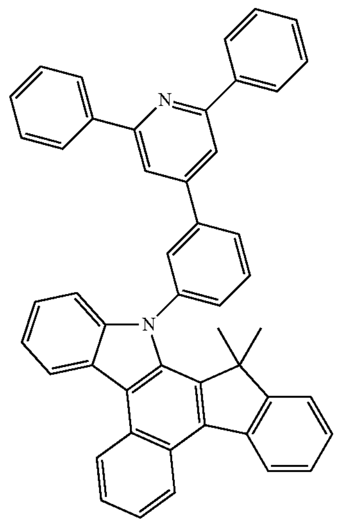
B-198
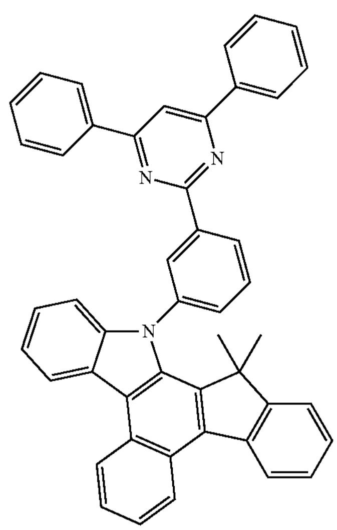

-continued
B-199
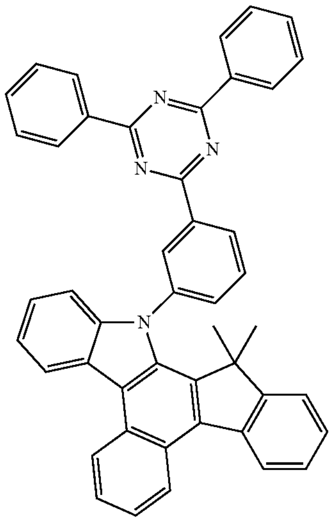
B-200
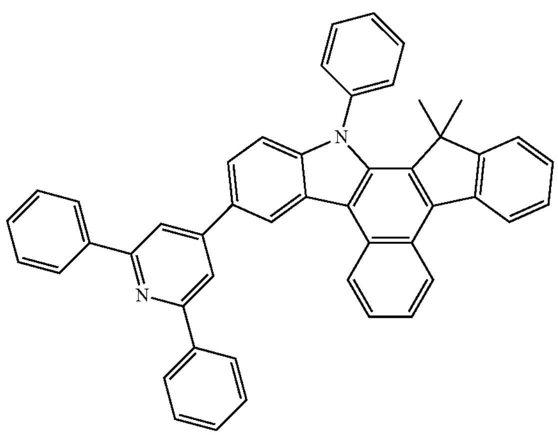
B-201
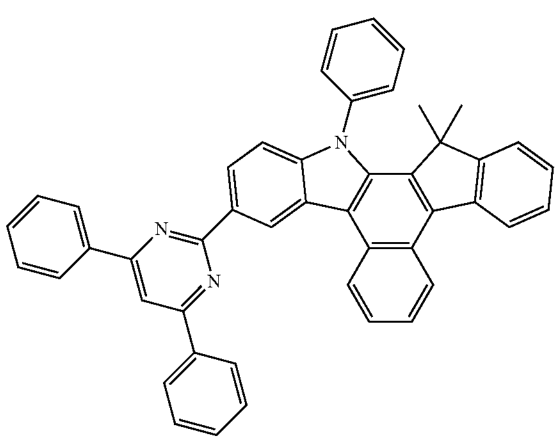
-continued
B-202
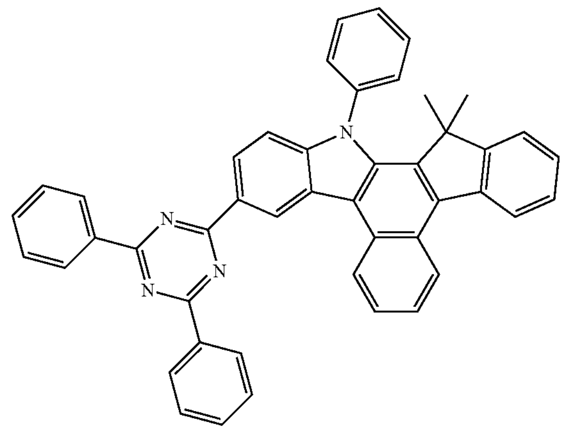
B-203
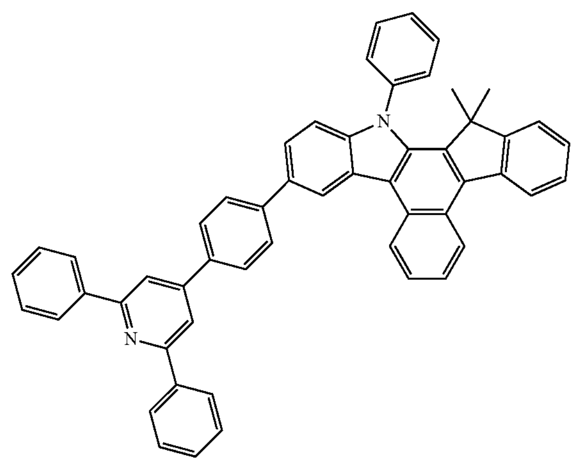
B-204
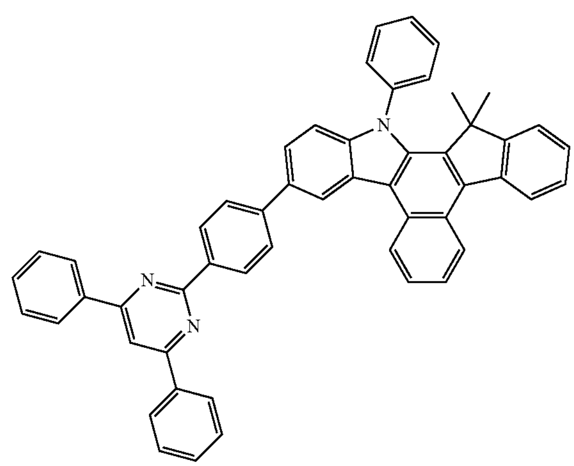

-continued
B-205
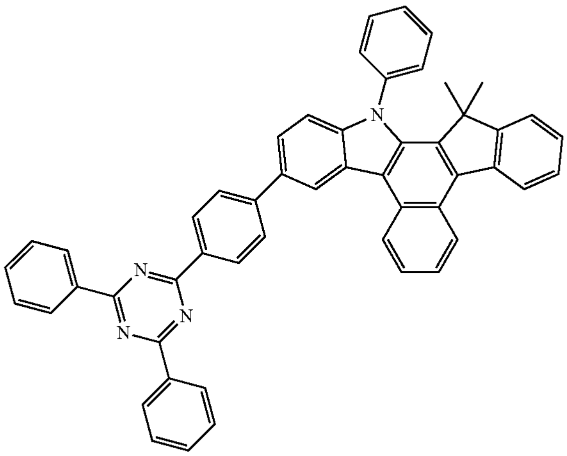
C-101
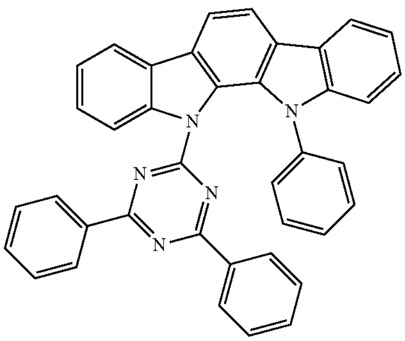
C-102
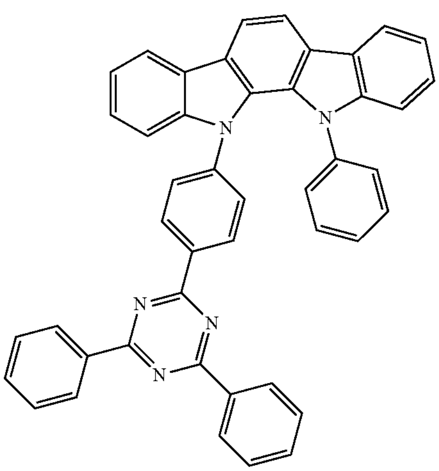
-continued
C-103
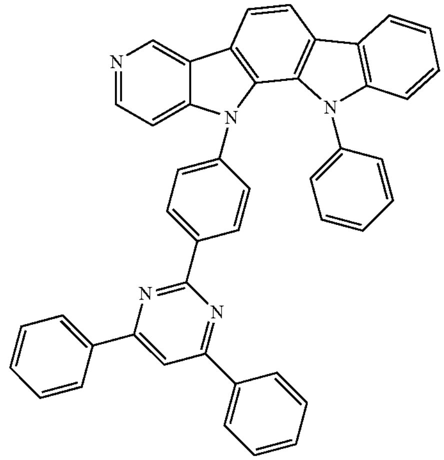
C-104
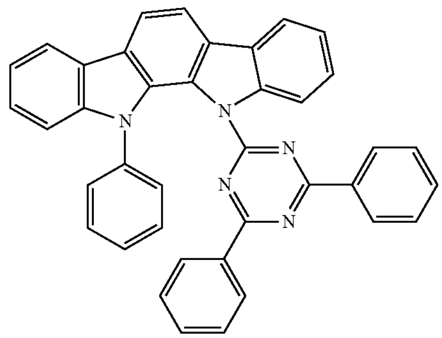
C-105
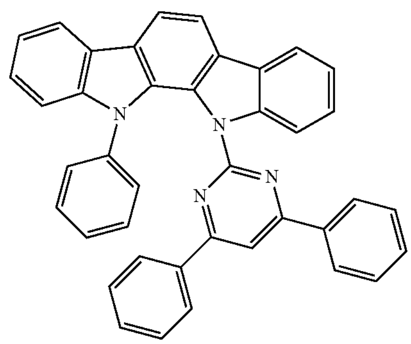
C-106
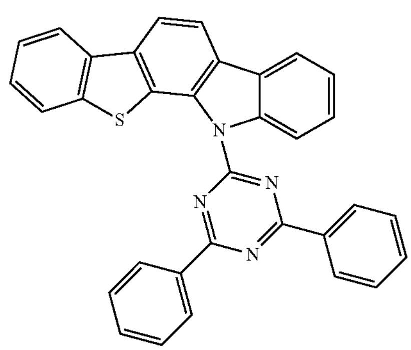

-continued
C-107
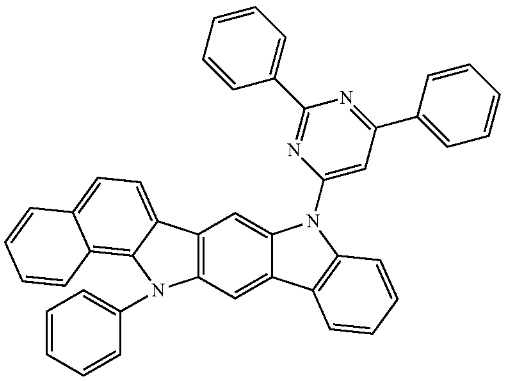
C-108
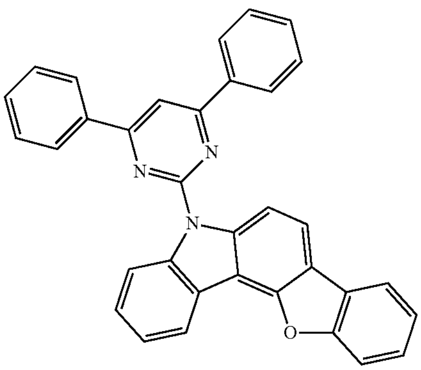
C-109
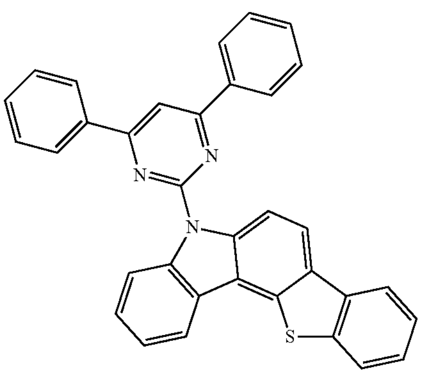
C-110
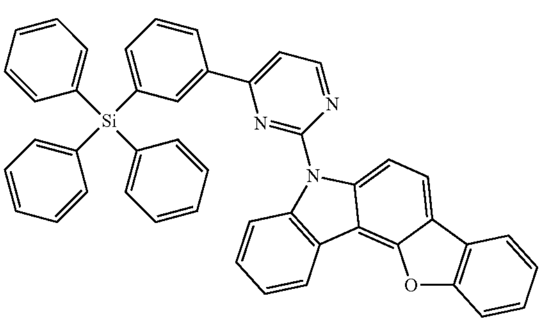
-continued
C-110
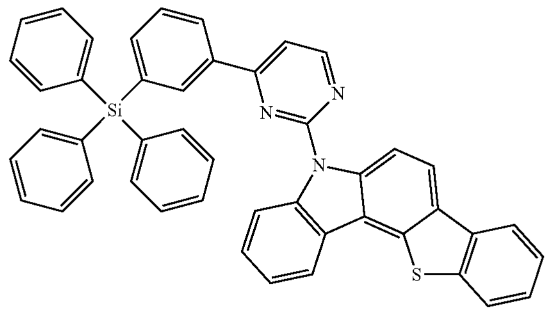
C-112
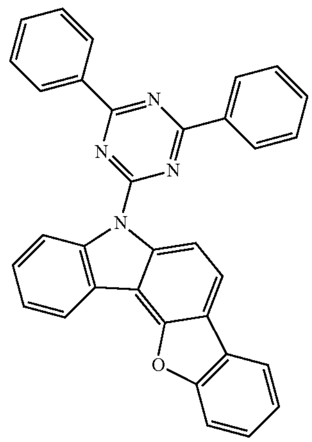
C-113
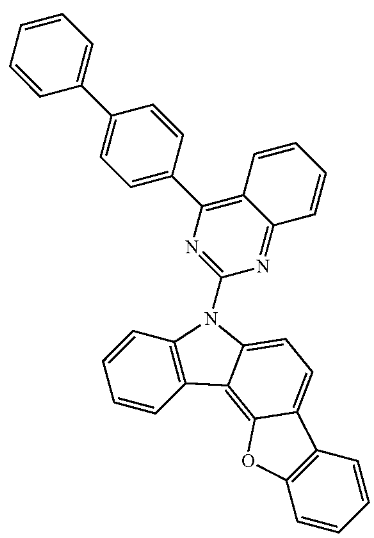

C-114
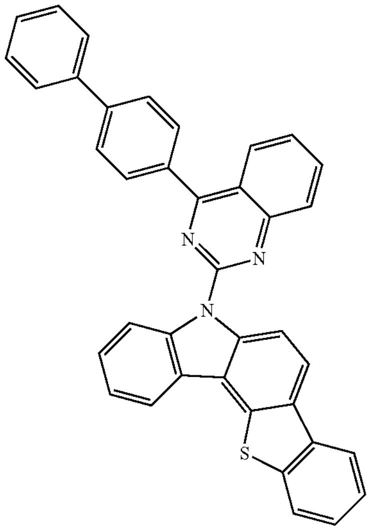
C-115
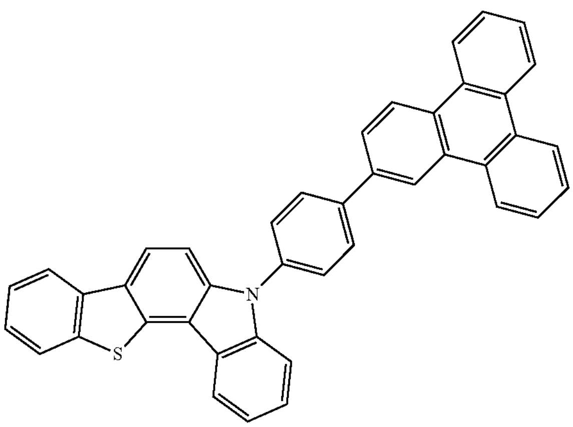
C-116
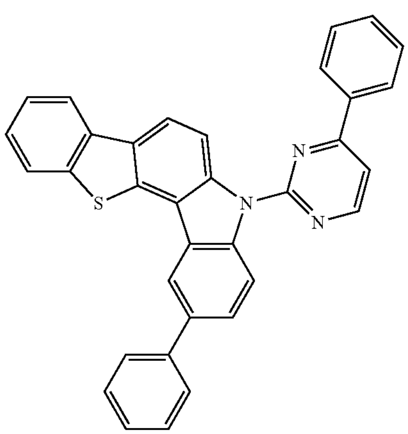
C-117
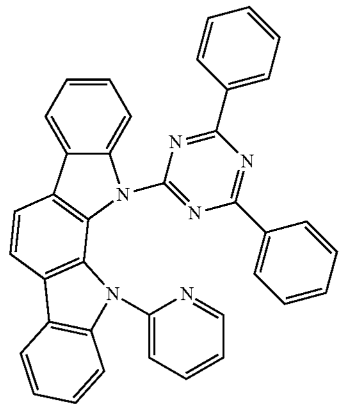
C-118
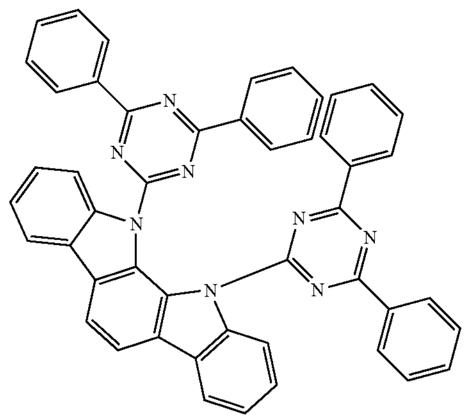
C-119
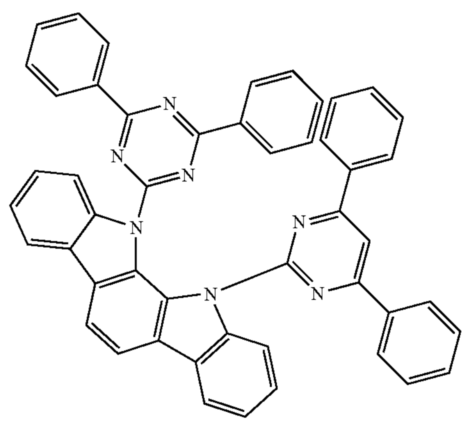
C-120
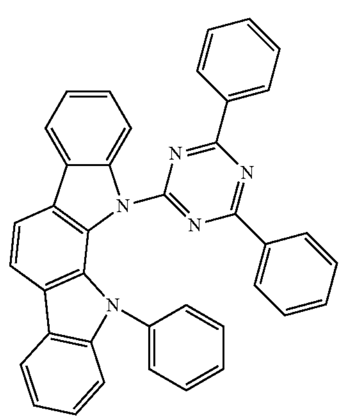

-continued
C-121
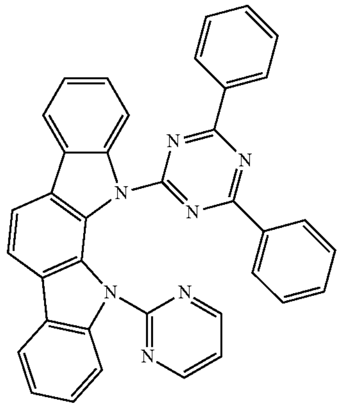
C-122
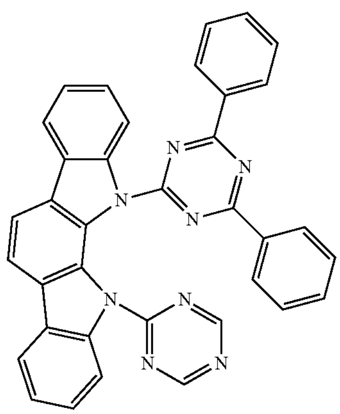
C-123
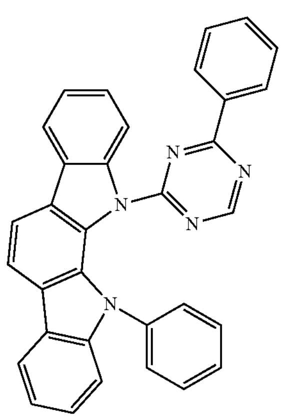
-continued
C-124
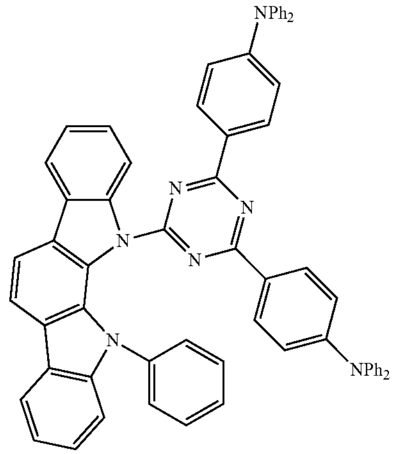
C-125
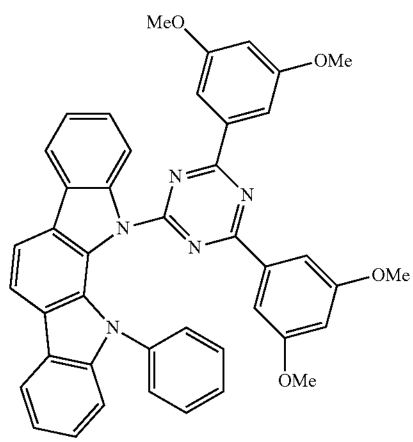
C-126
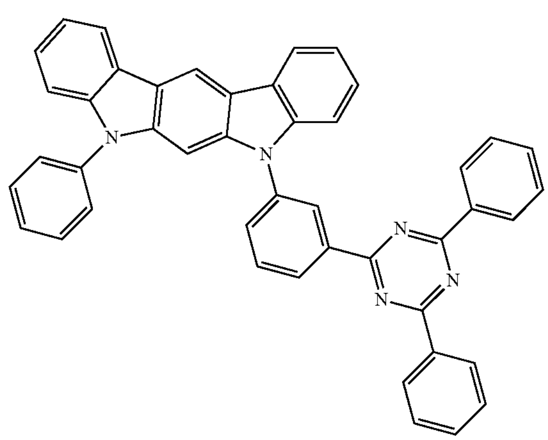

-continued
C-127
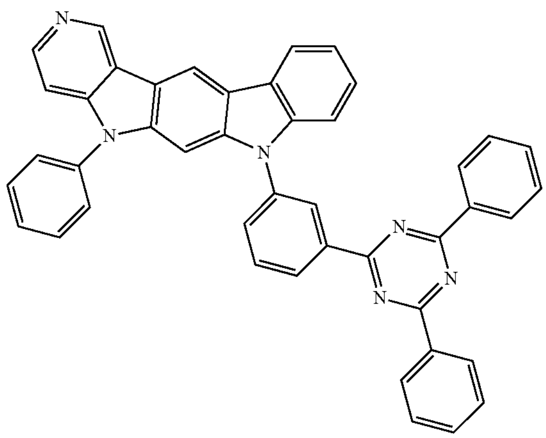
C-128
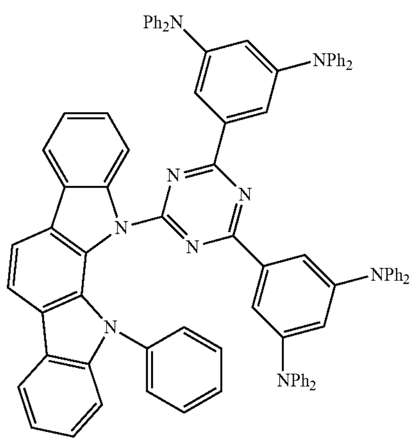
C-129
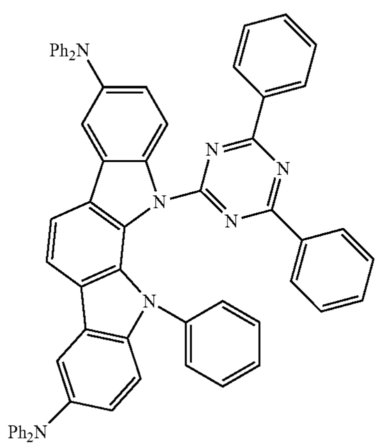
-continued
C-130
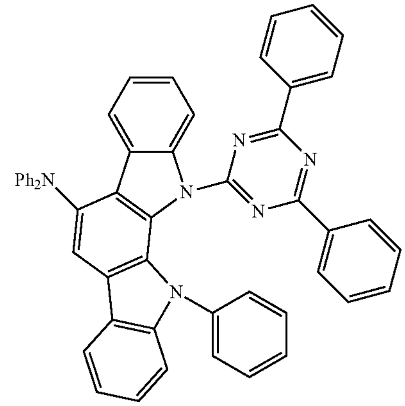
C-131
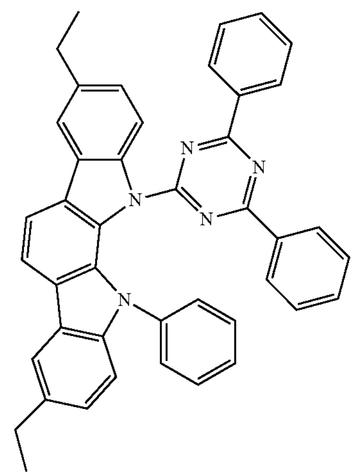
C-132
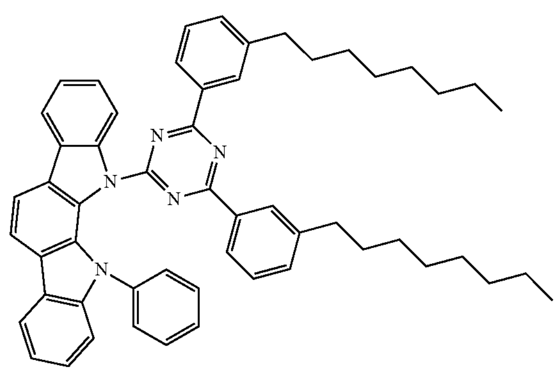

-continued
C-133
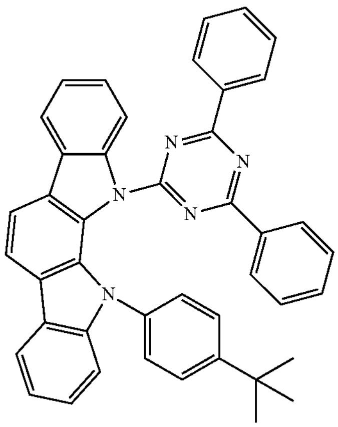
C-134
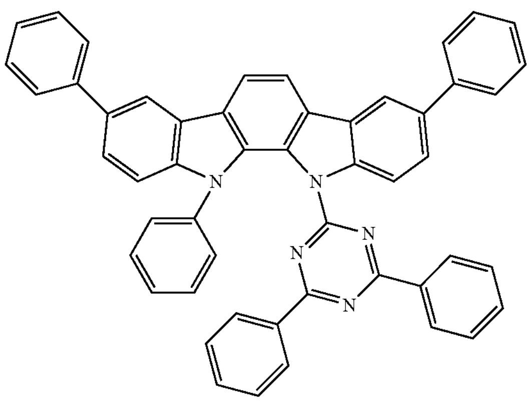
C-135
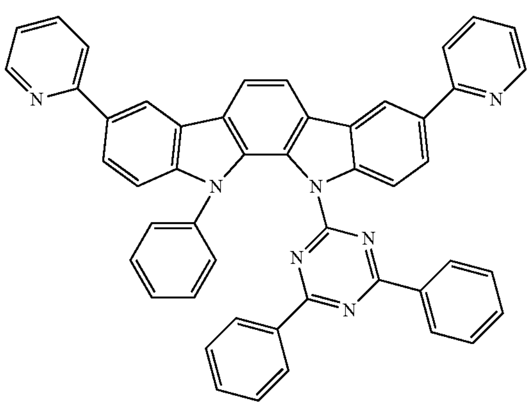
-continued
C-136
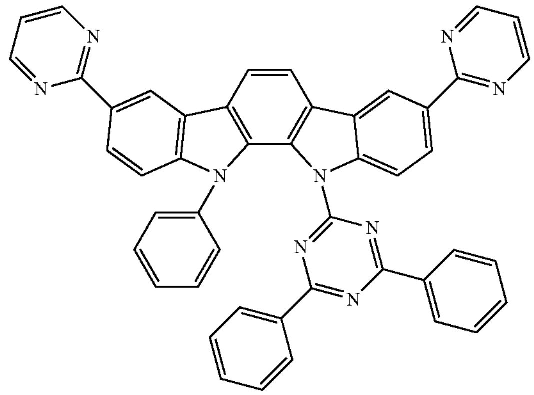
C-137
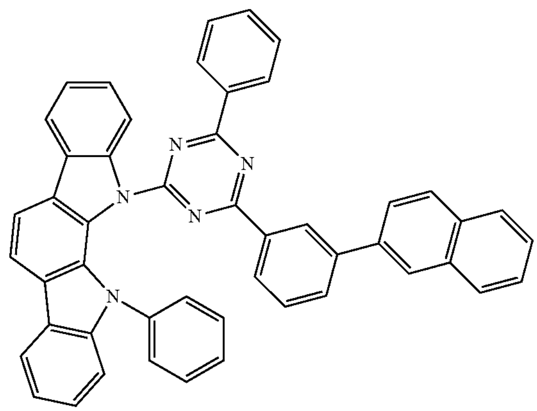
C-138
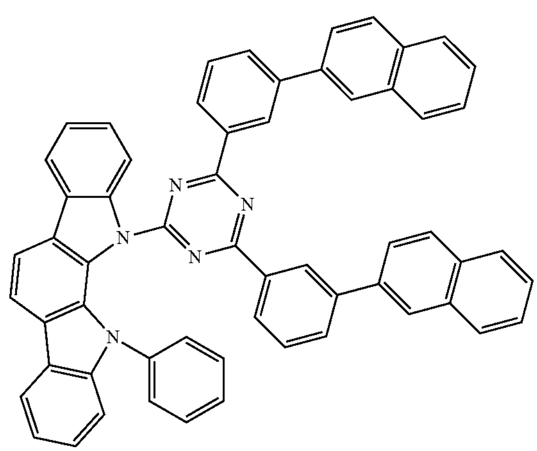

-continued
C-139
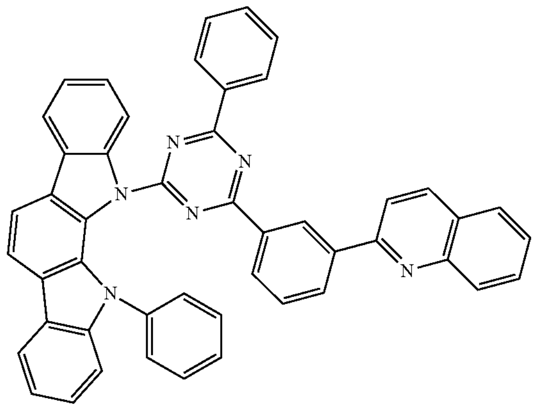
C-140
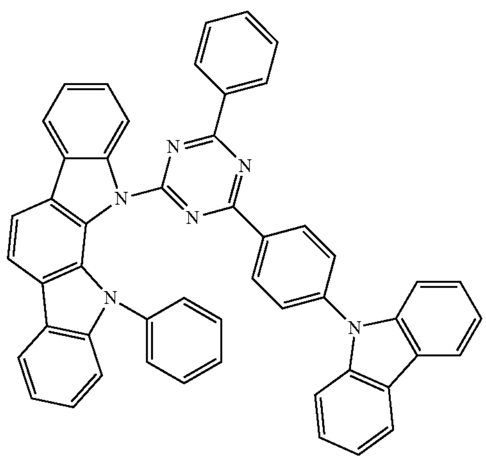
C-141
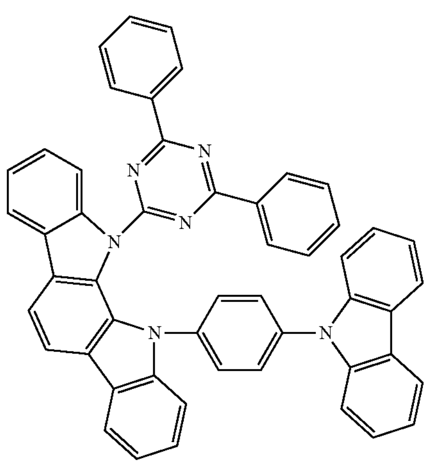
-continued
C-142
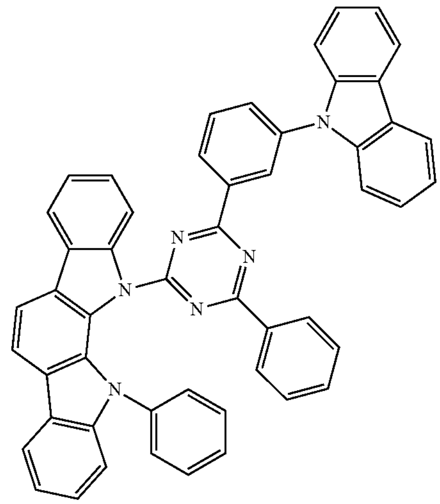
C-143
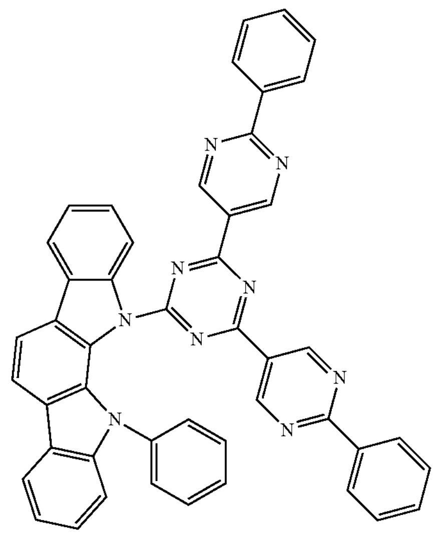
C-144
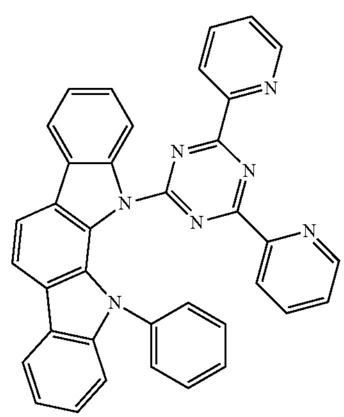

-continued
C-145
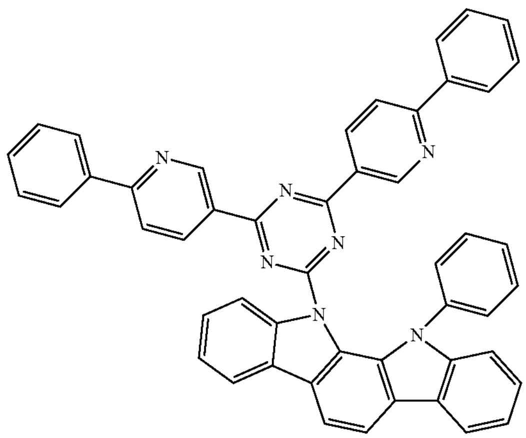
C-146
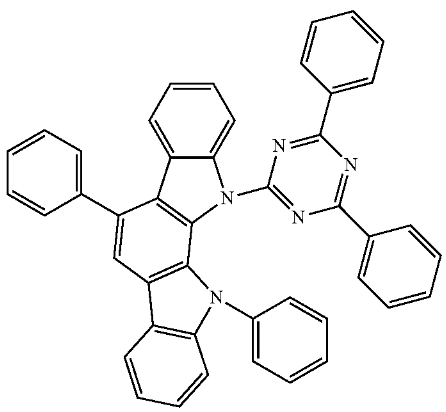
C-147
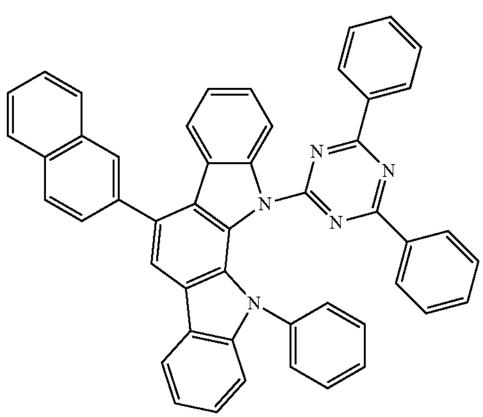
-continued
C-148
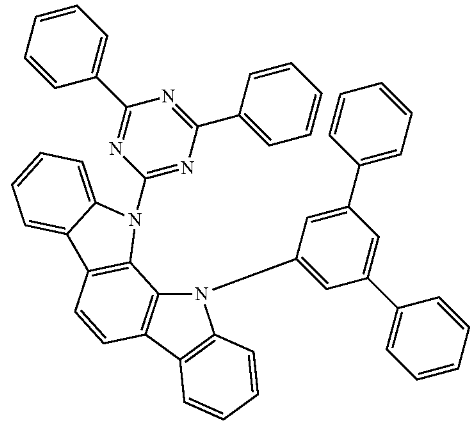
C-149
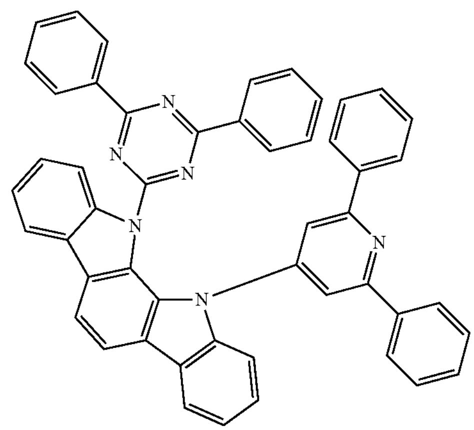
C-150
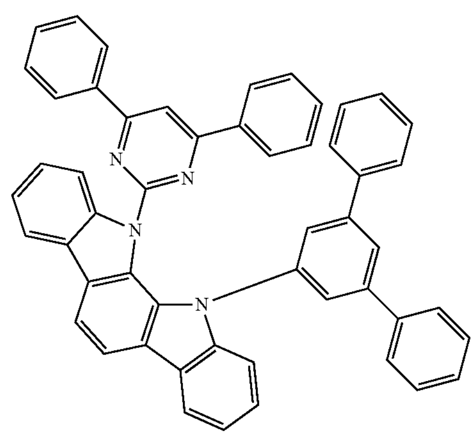

C-151
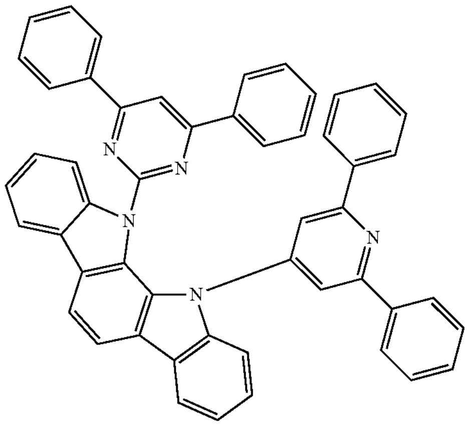
C-152
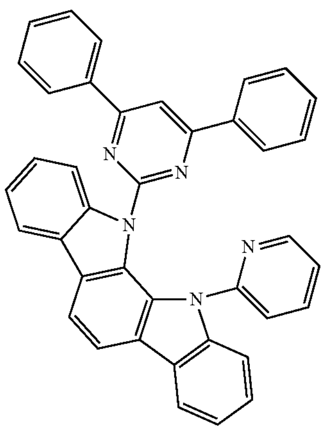
C-153
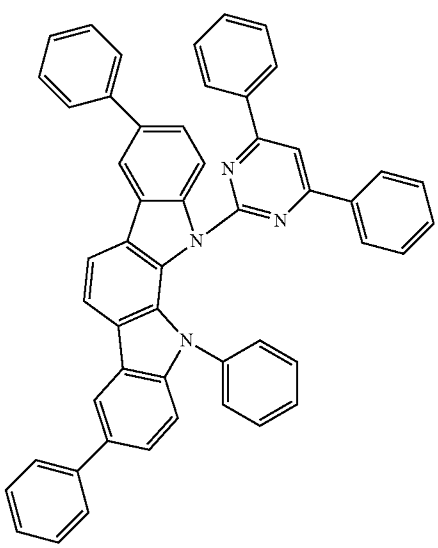
C-154
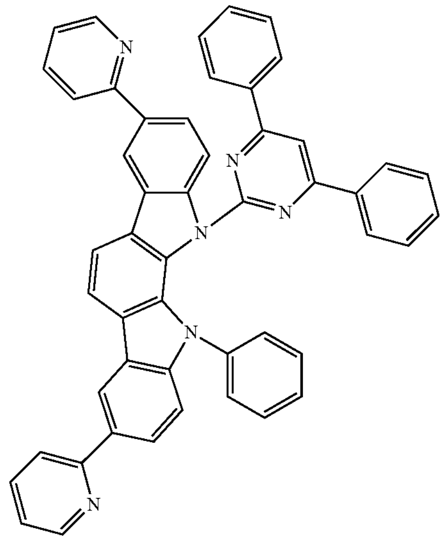
C-155
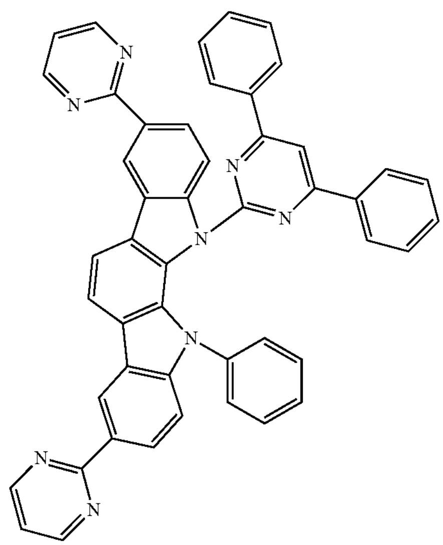
C-156
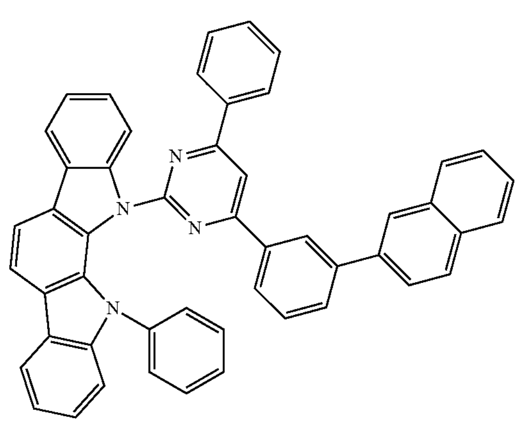

-continued
C-157
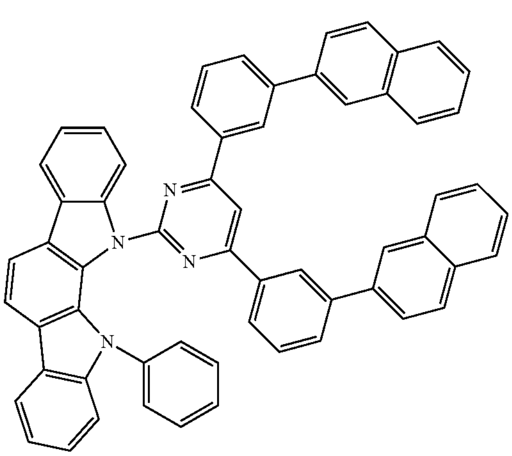
C-158
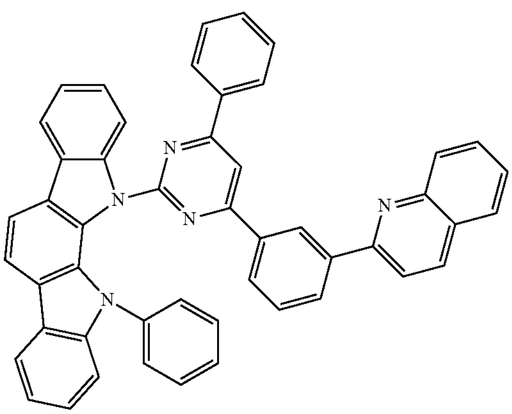
C-159
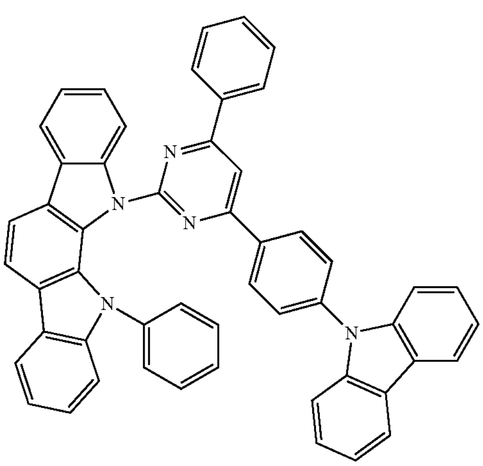
-continued
C-160
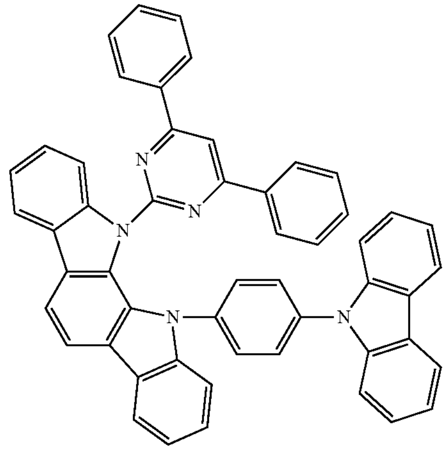
C-161
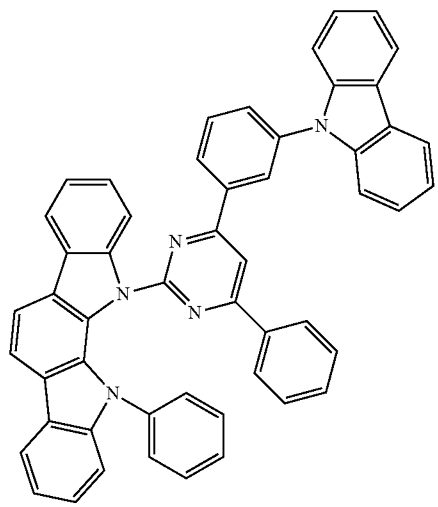
C-162
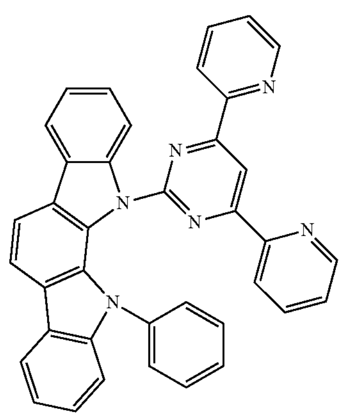

-continued
C-163
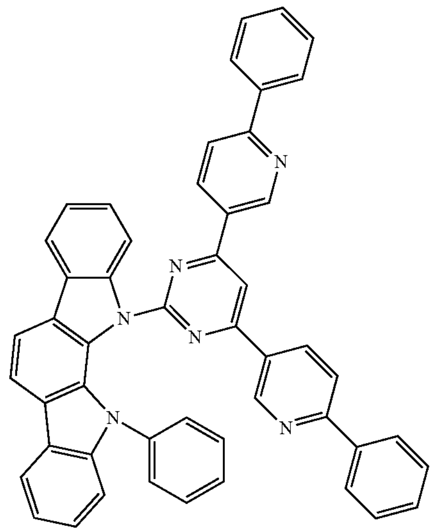
C-164
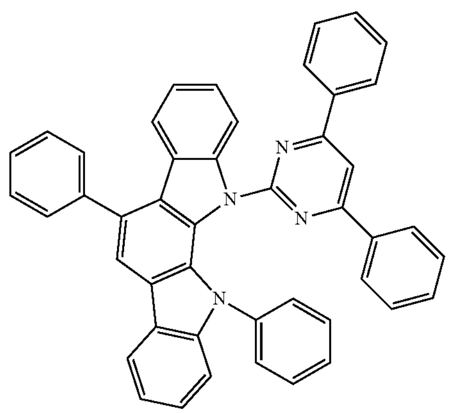
C-165
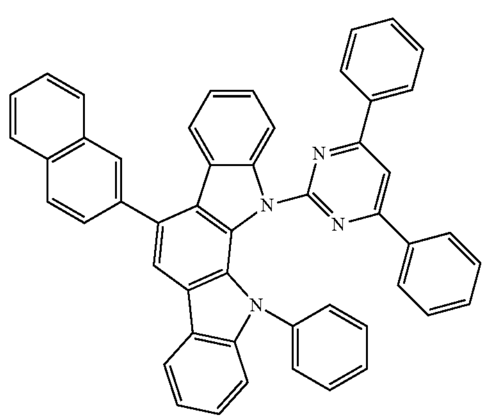
-continued
C-166
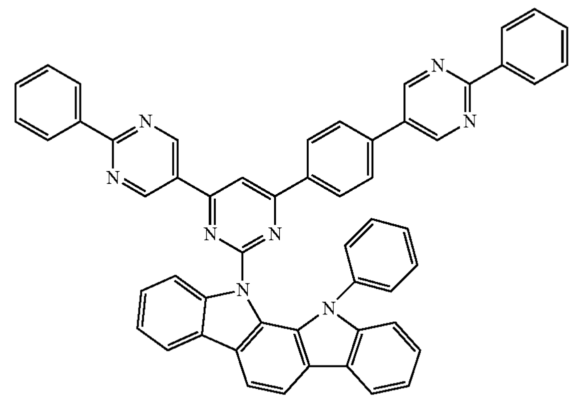
C-167
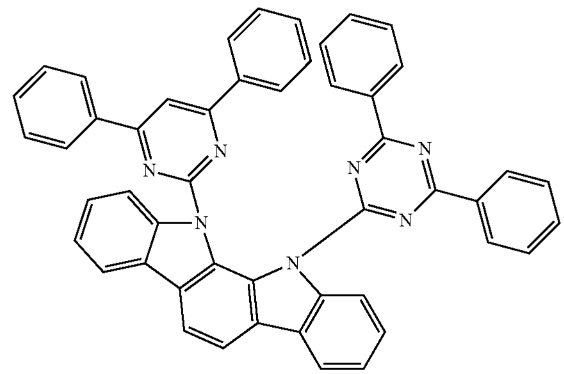
C-168
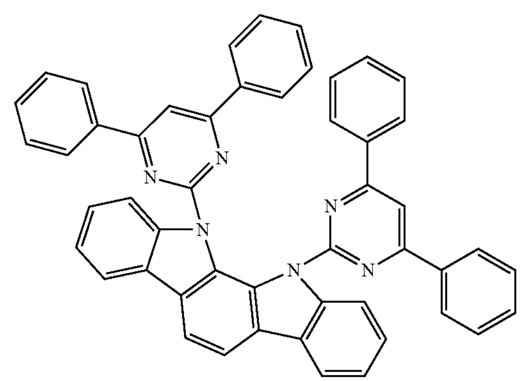
C-169
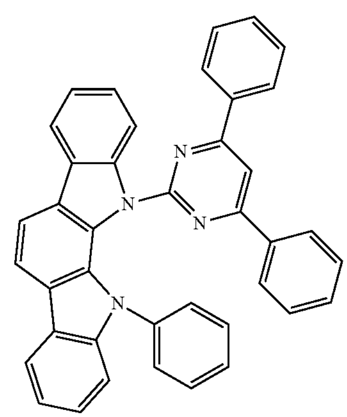

-continued
C-170
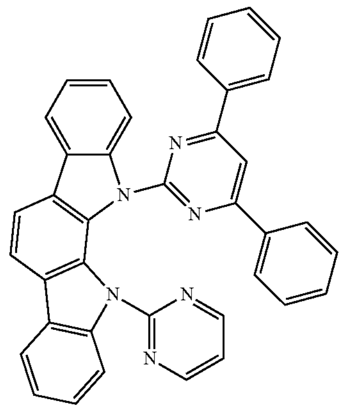
C-171
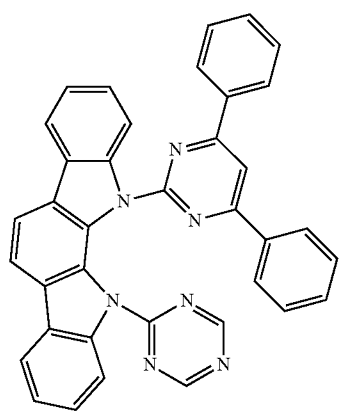
C-172
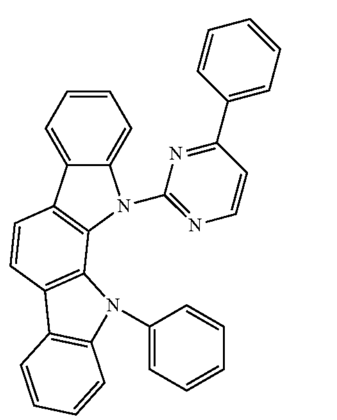
-continued
C-173
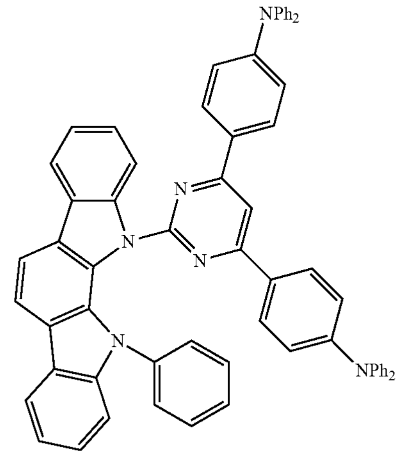
C-174
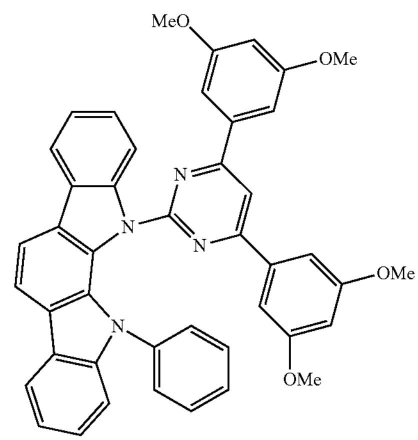
C-175
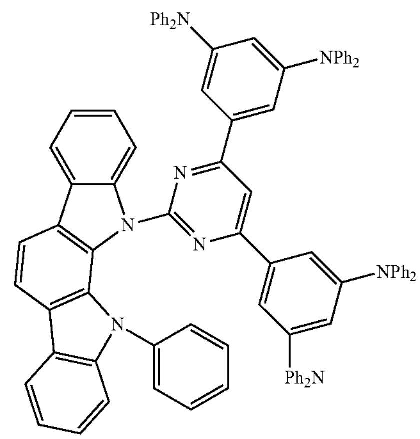

-continued
C-176
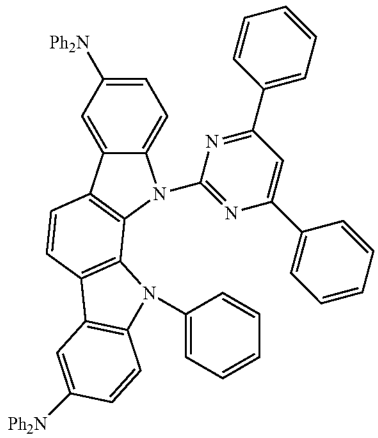
C-177
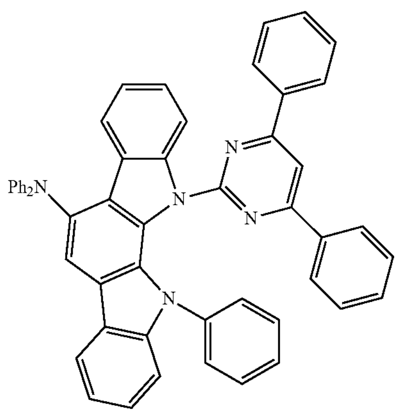
C-178
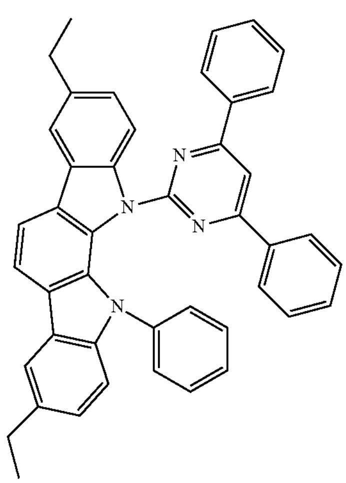
-continued
C-179
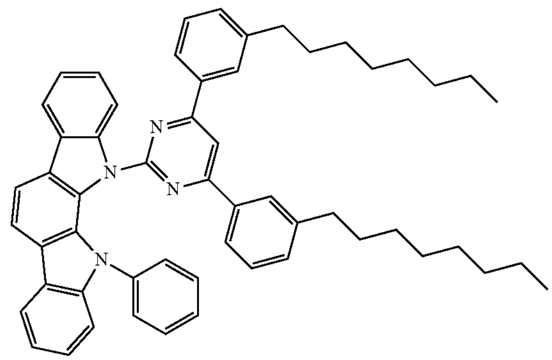
C-180
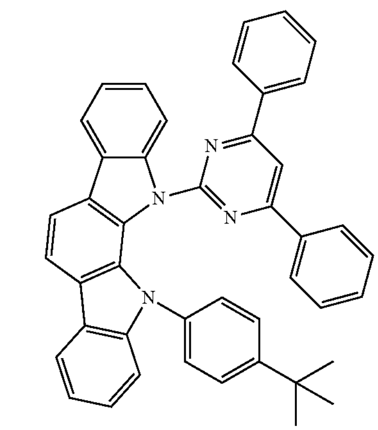
C-181
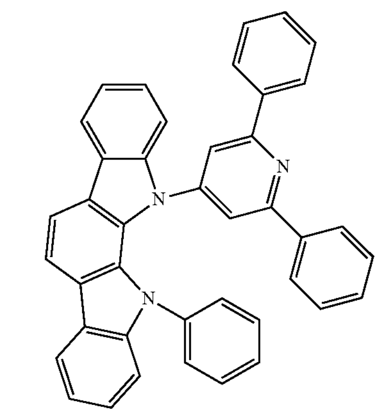
C-182
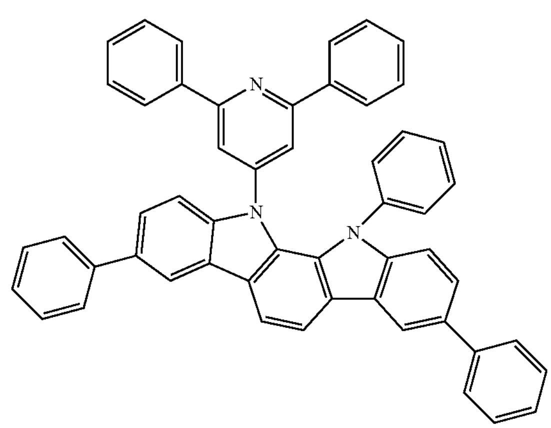

-continued
C-183
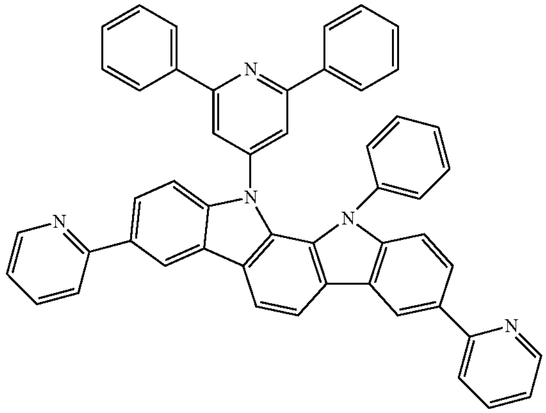
C-184
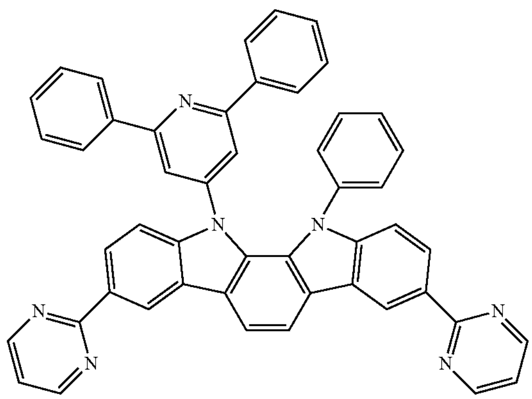
C-185
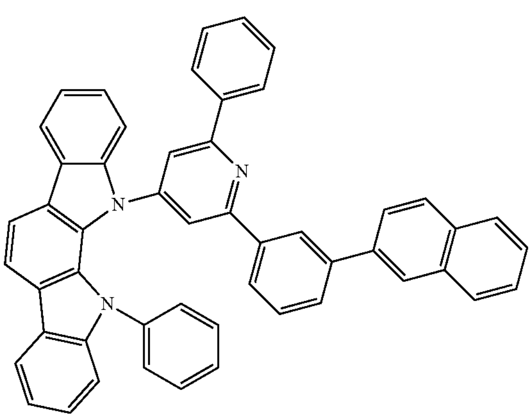
-continued
C-186
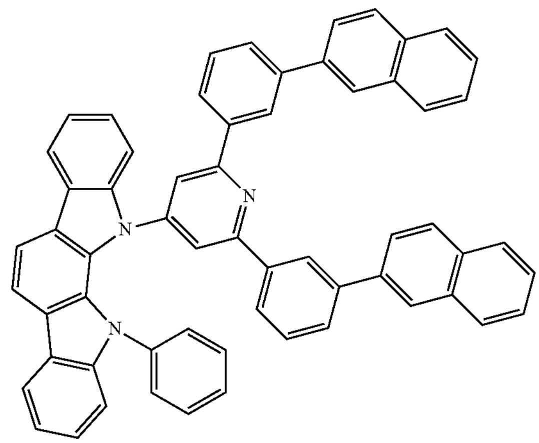
C-187
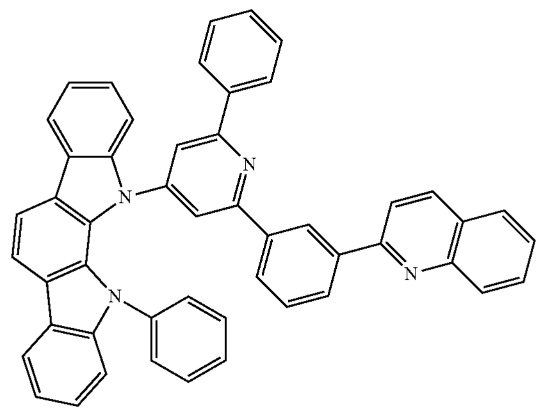
C-188
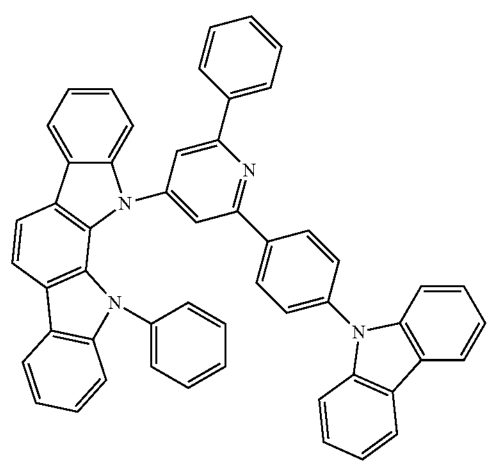

-continued
C-189
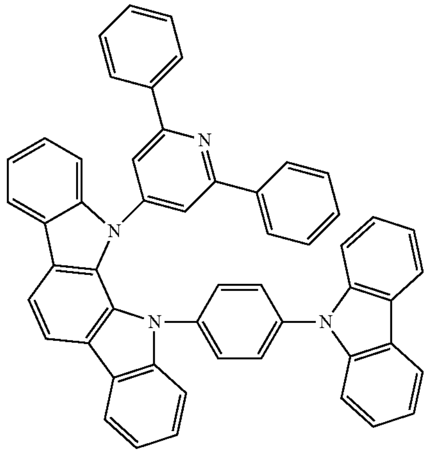
C-190
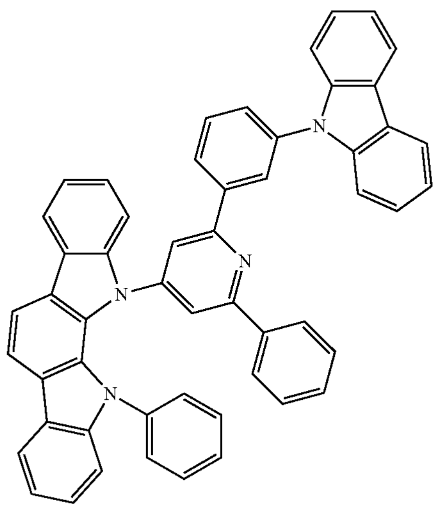
C-191
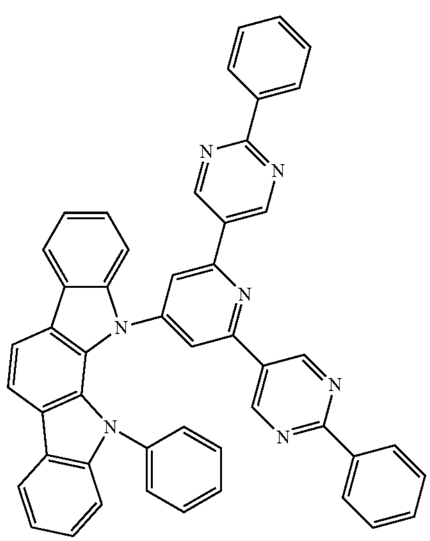
-continued
C-192
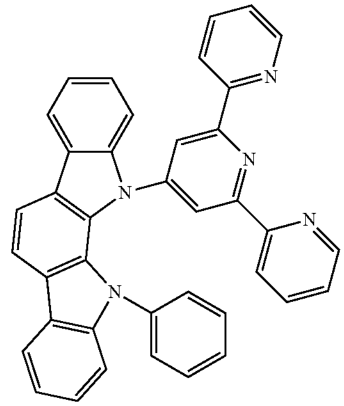
C-193
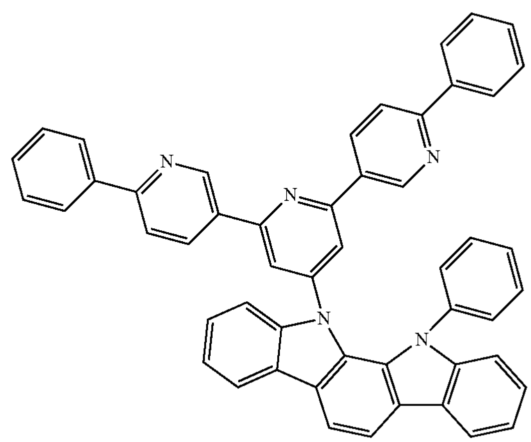
C-194
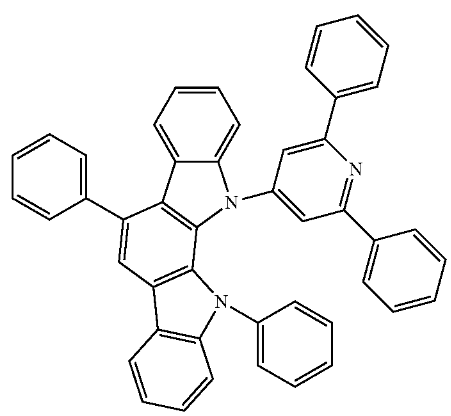

-continued
C-195
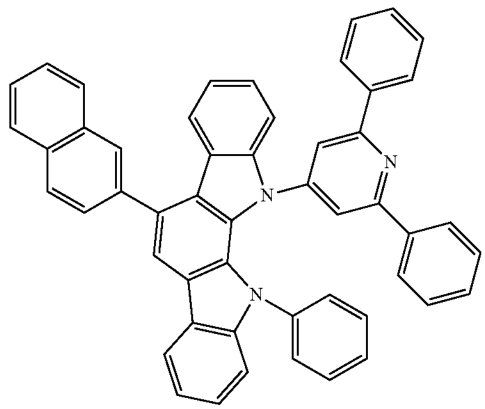
C-196
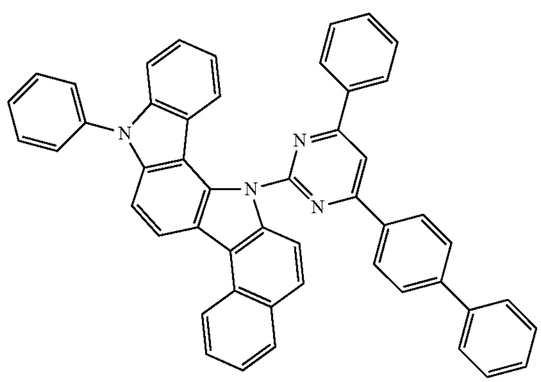
C-197
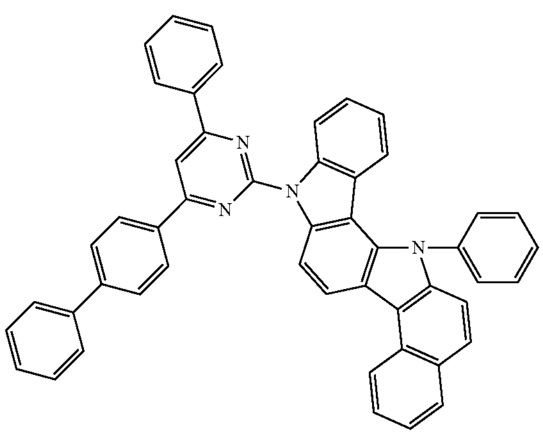
-continued
C-198
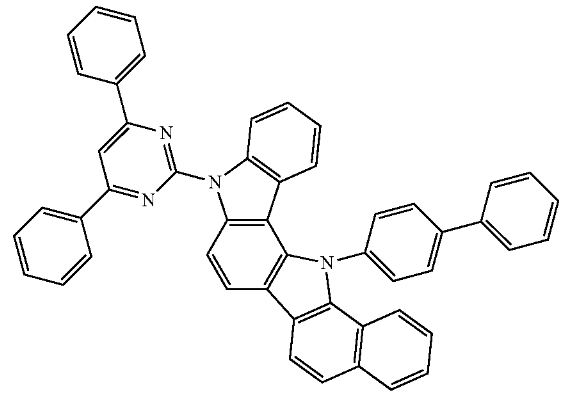
C-199
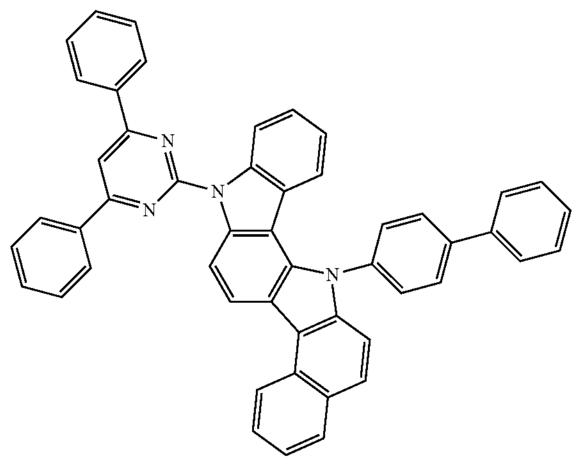
C-200
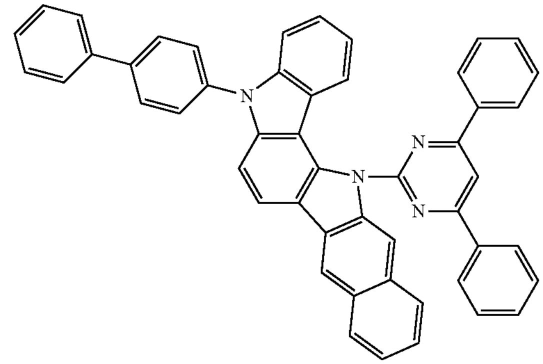

-continued
C-201
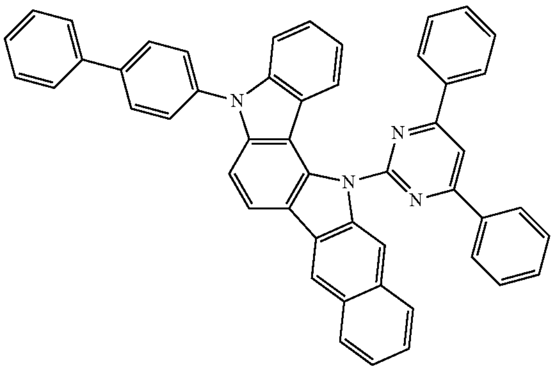
C-202
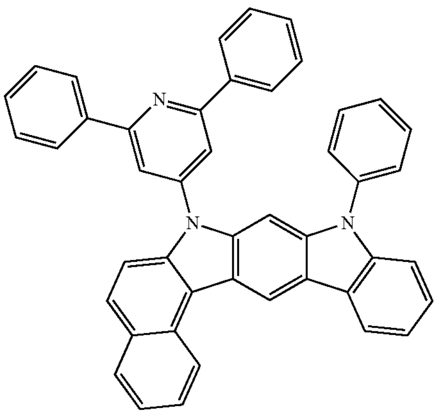
C-203
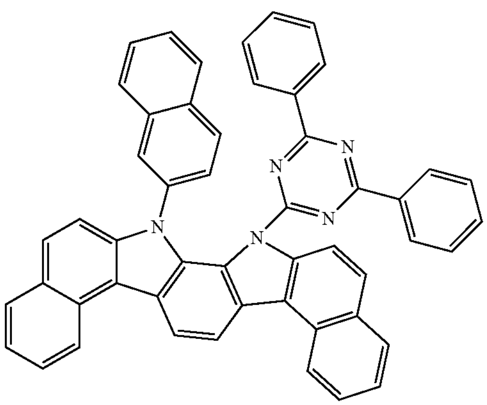
C-204
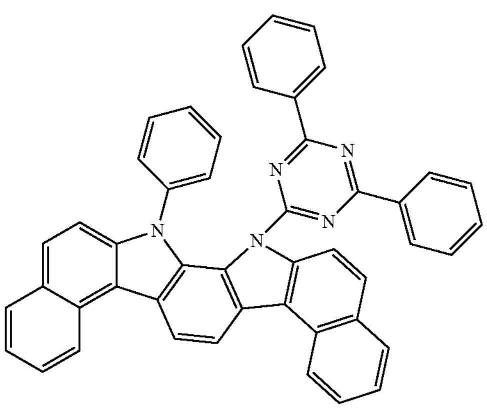
-continued
C-205
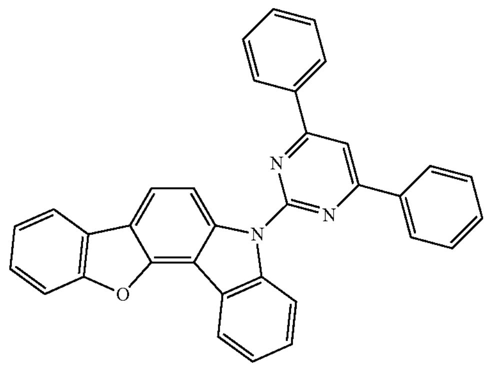
C-206
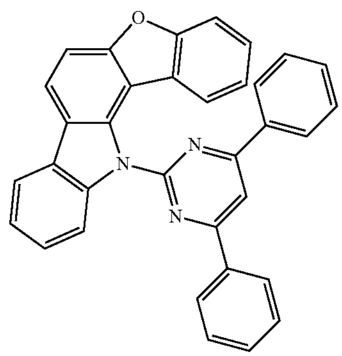
C-207
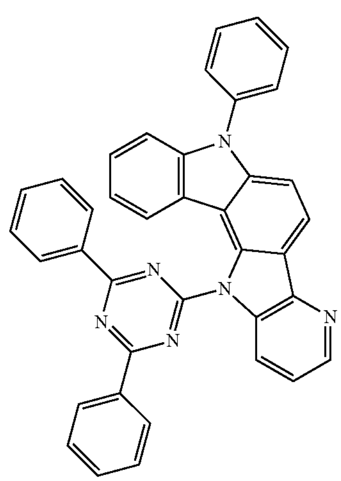

-continued
C-208
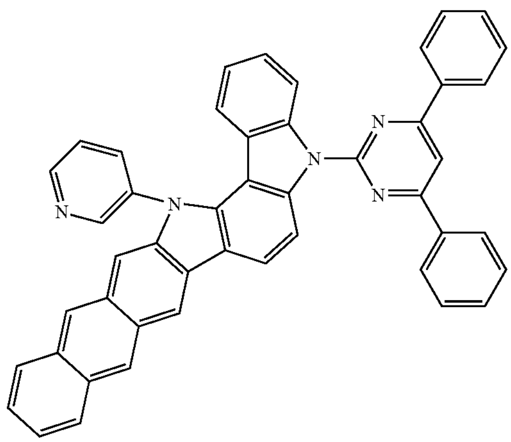
C-209
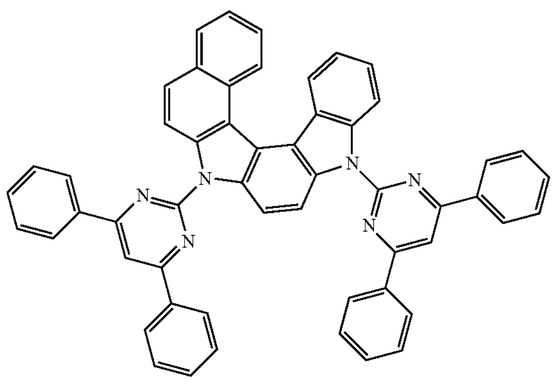
C-210
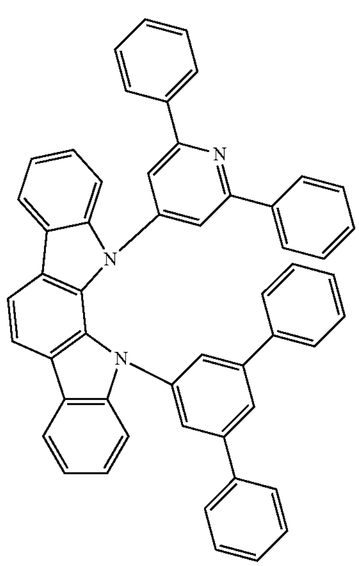
-continued
C-211
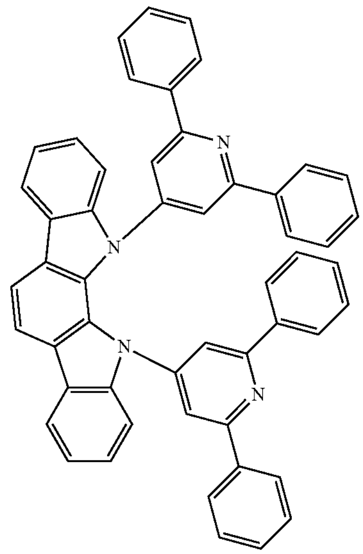
C-212
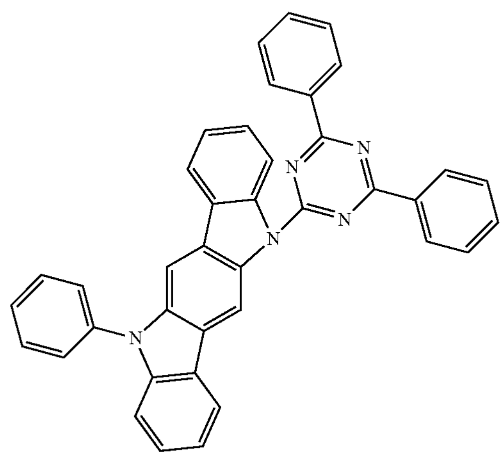
C-213
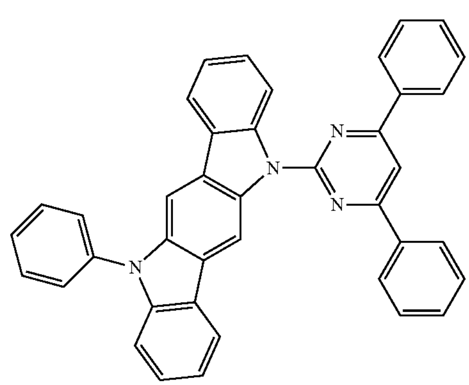

-continued
C-214
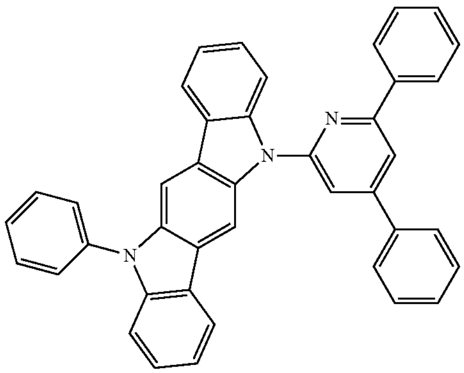
C-215
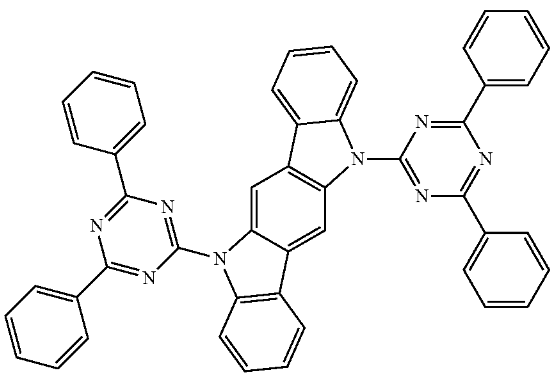
C-216
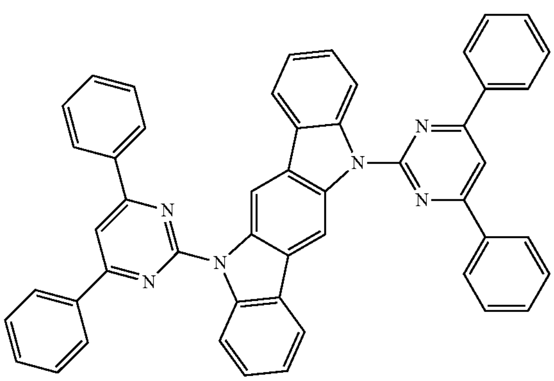
C-217
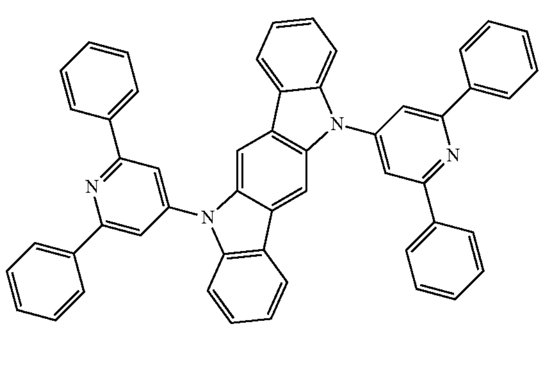
-continued
C-218
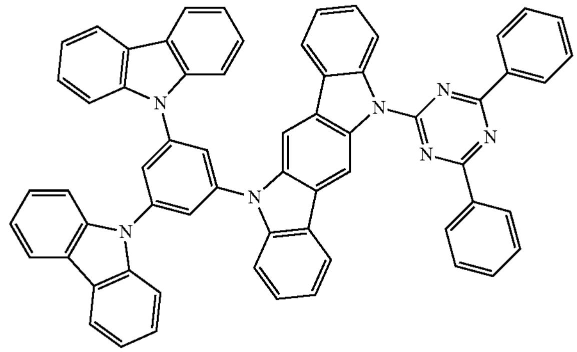
C-219
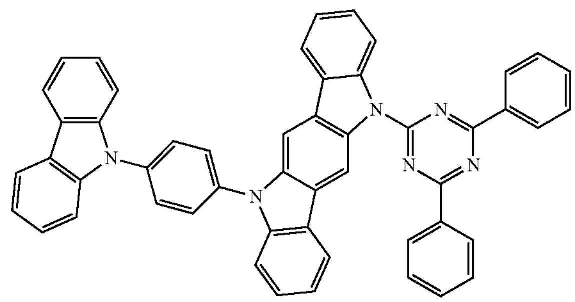
C-220
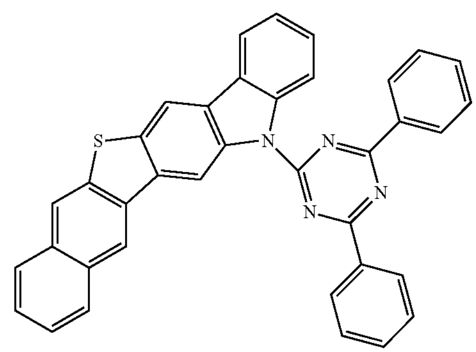
C-221
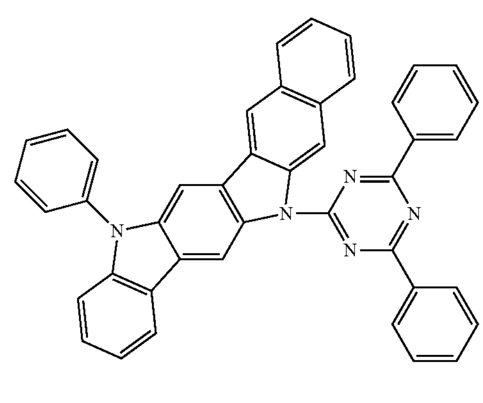

C-222
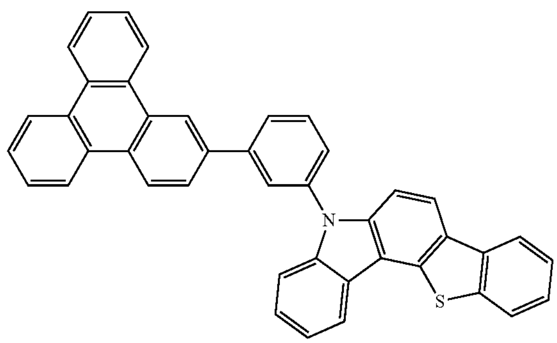
C-223
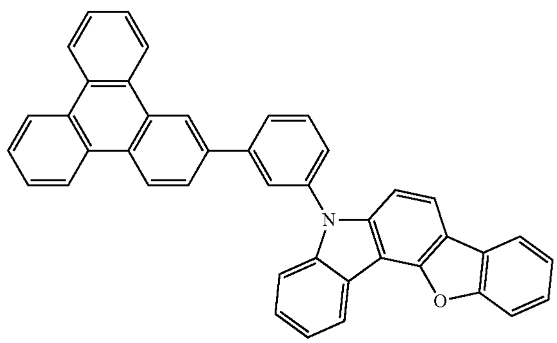
C-224
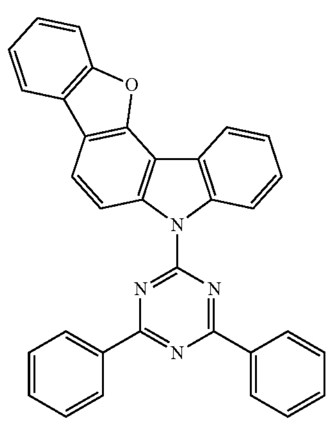
C-225
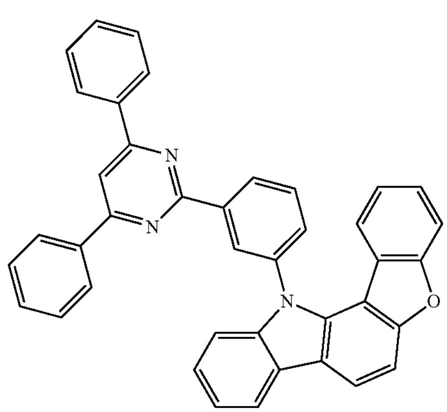
C-226
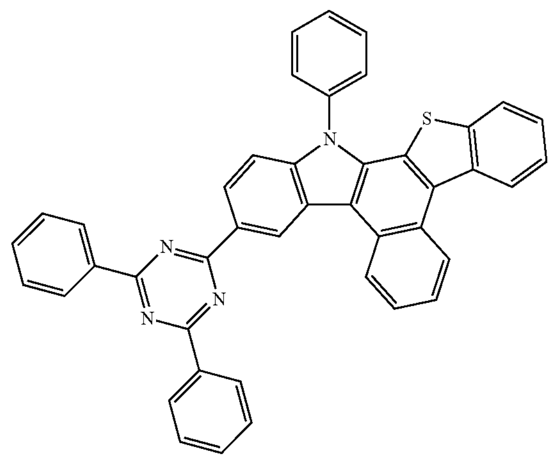
C-227
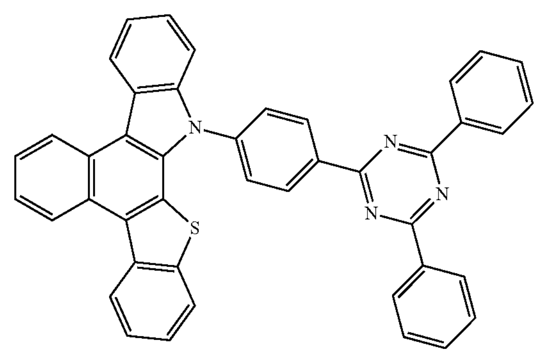
C-228
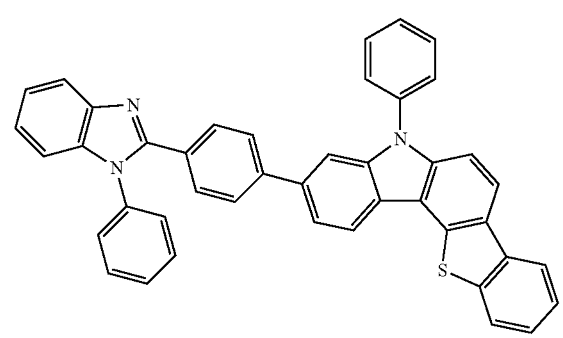
C-229
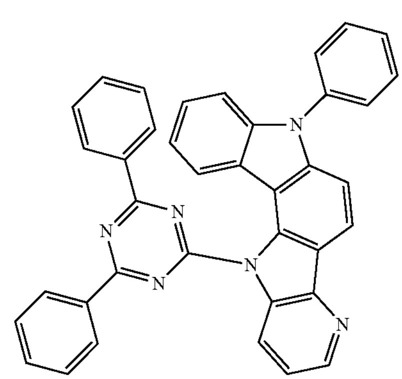

-continued
C-230
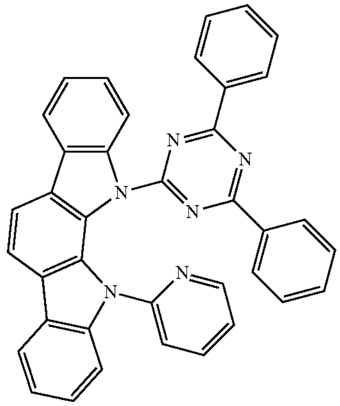
C-231
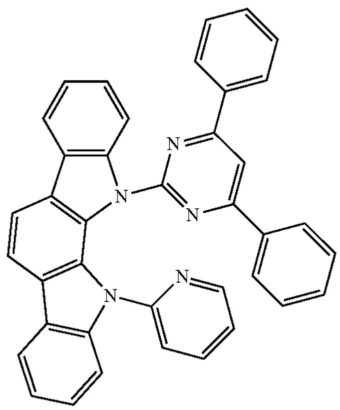
C-232
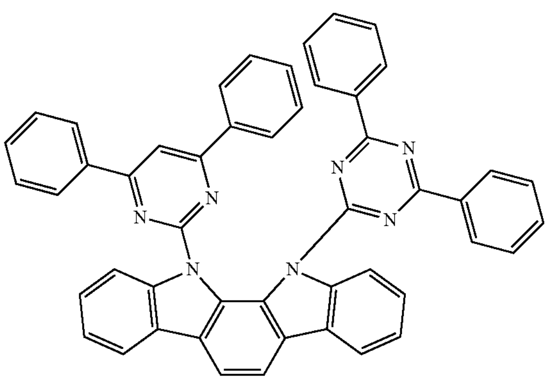
C-233
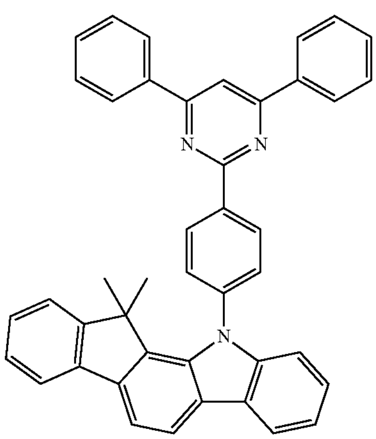
-continued
C-234
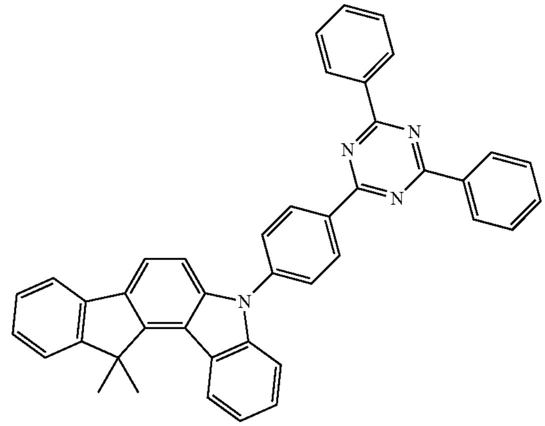
C-235
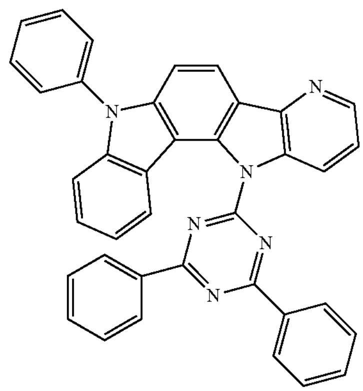
C-236
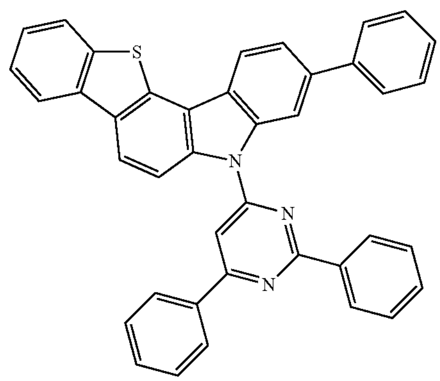
C-237
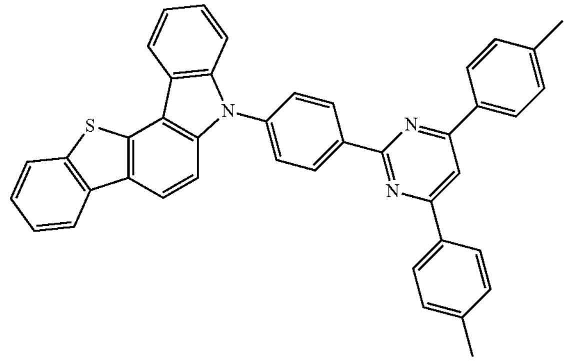

-continued
C-238
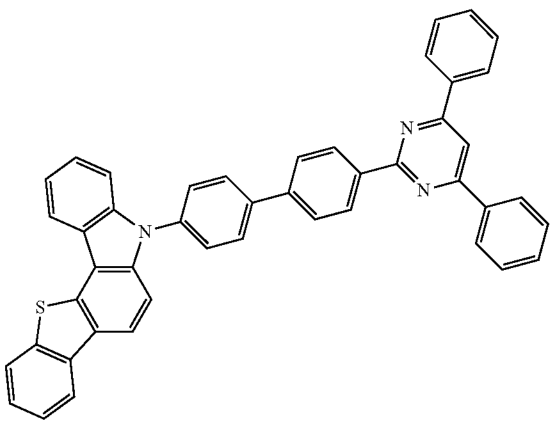
C-239
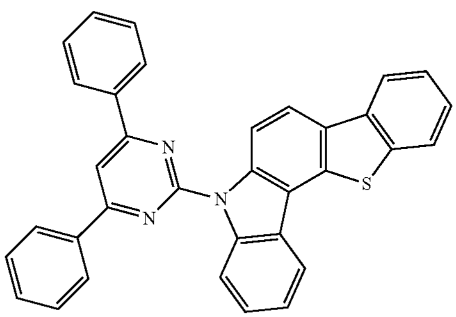
C-240
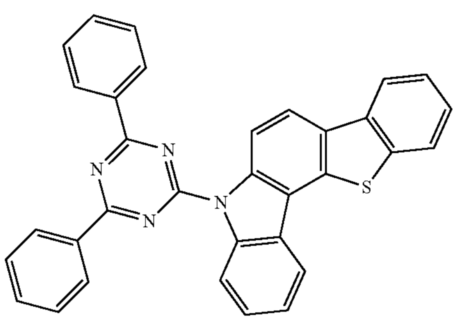
C-241
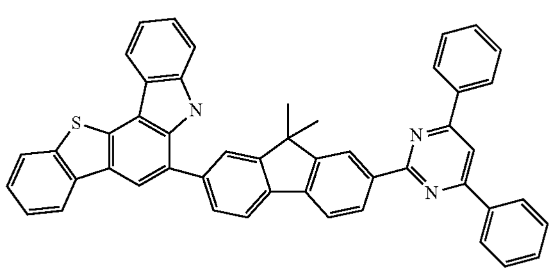
-continued
C-242
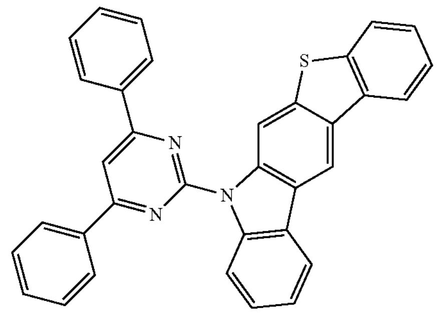
C-243
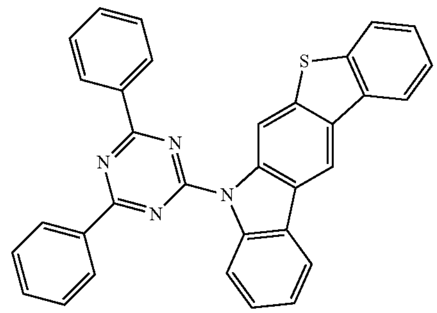
C-244
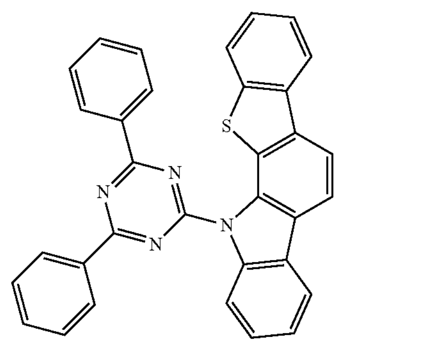
C-245
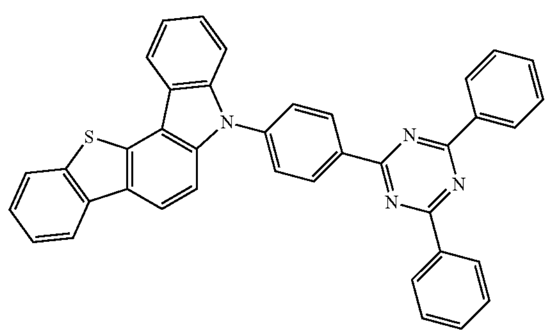

C-246
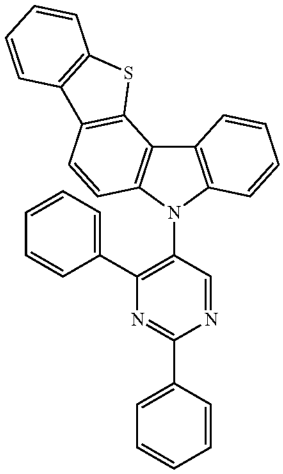
C-247
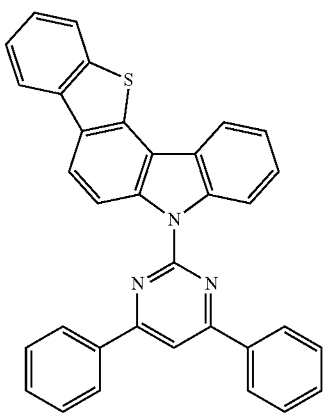
C-248
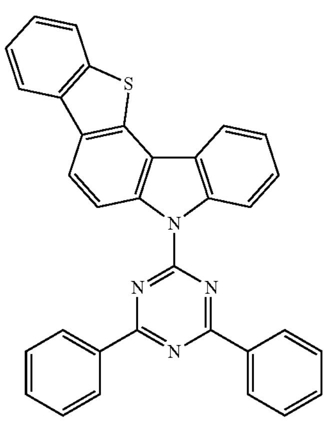
C-249
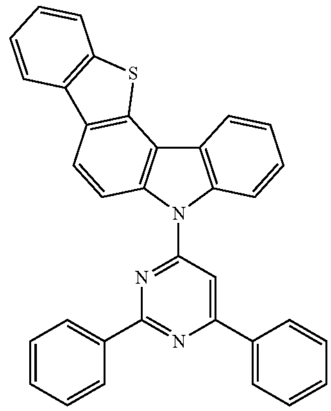
C-250
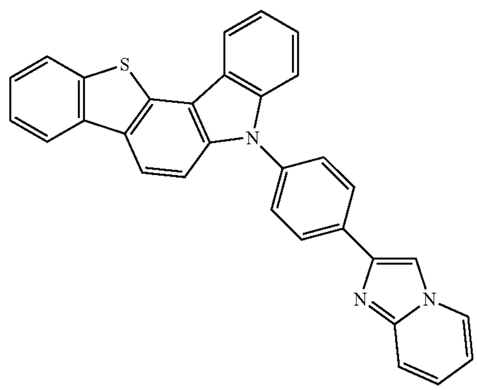
C-251
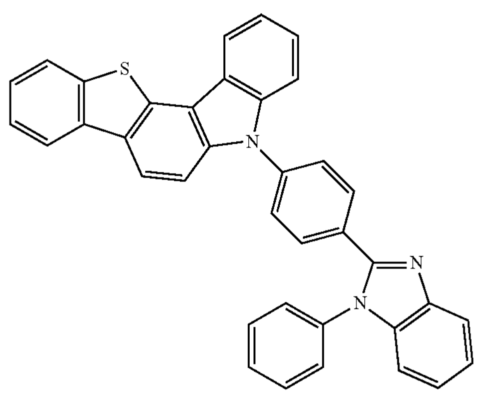

-continued
C-252
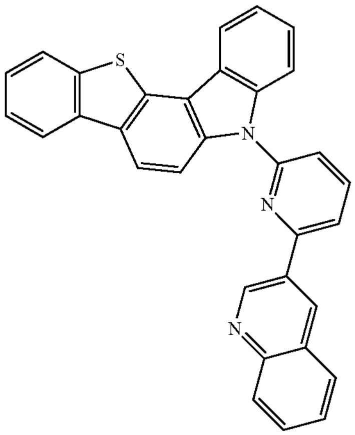
C-253
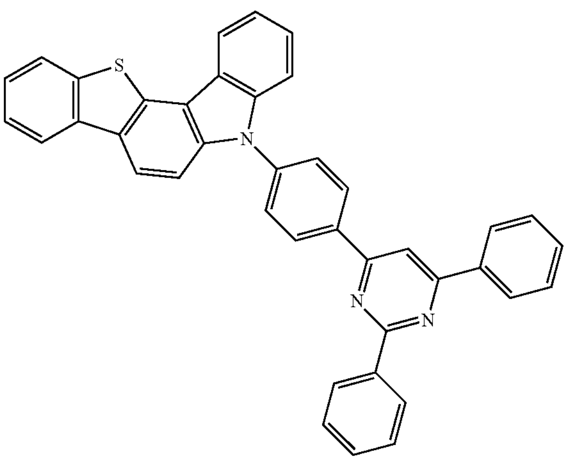
C-254
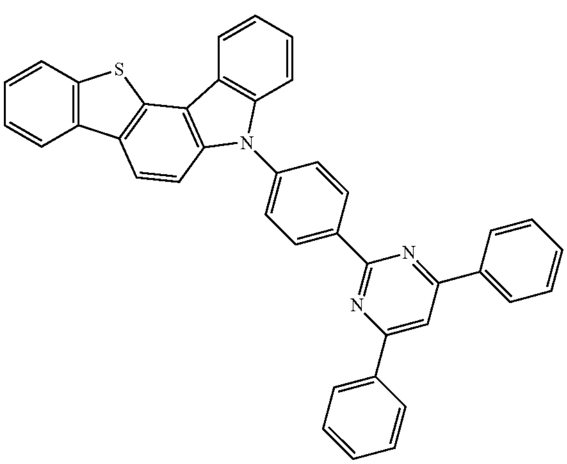
-continued
C-255
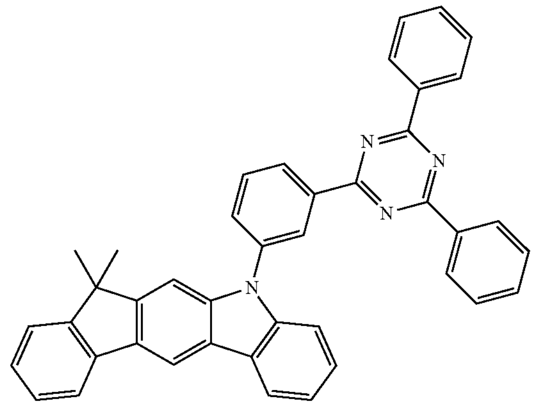
C-256
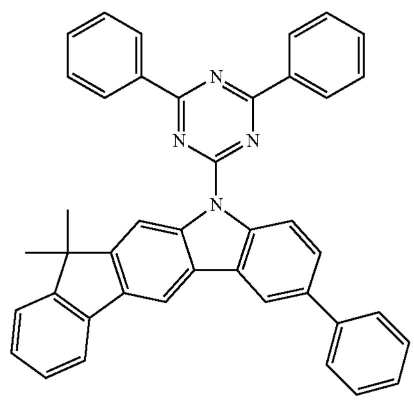
C-257
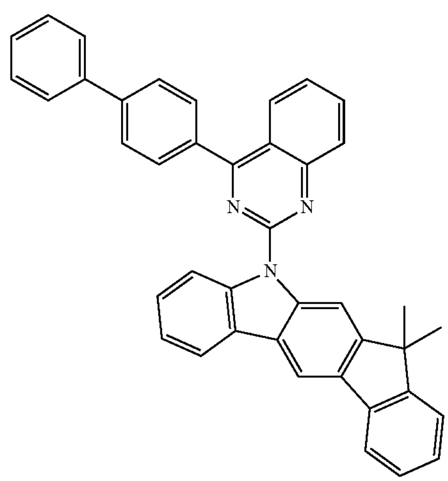

-continued
C-258
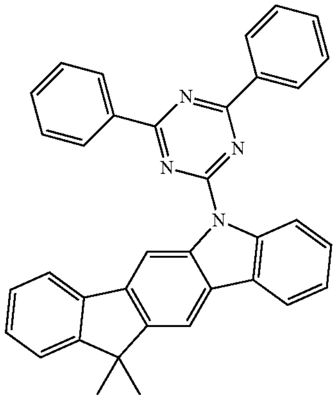
C-259
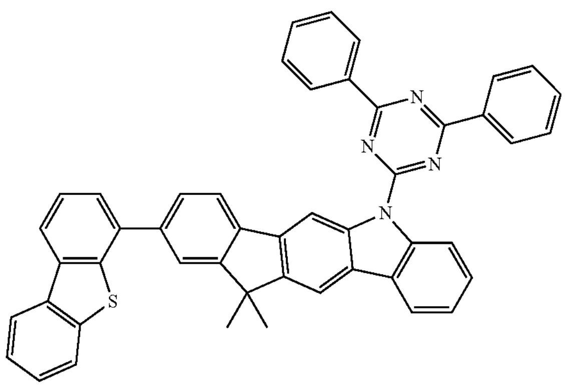
C-260
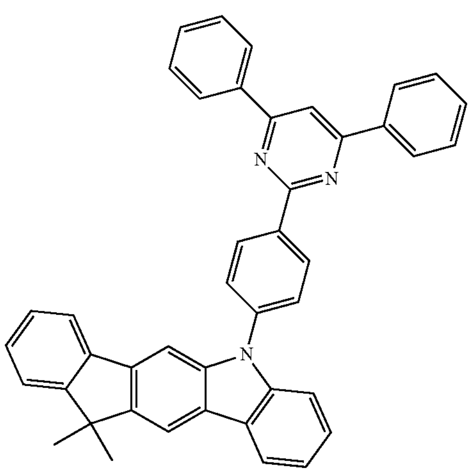
-continued
C-261
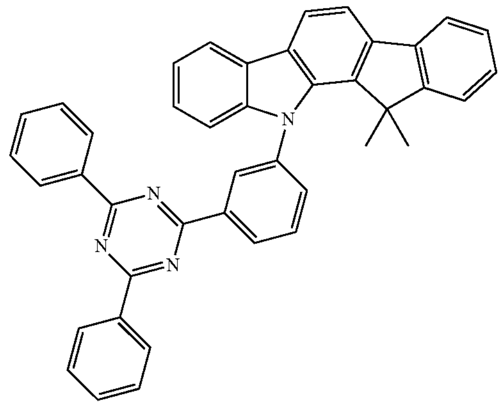
C-262
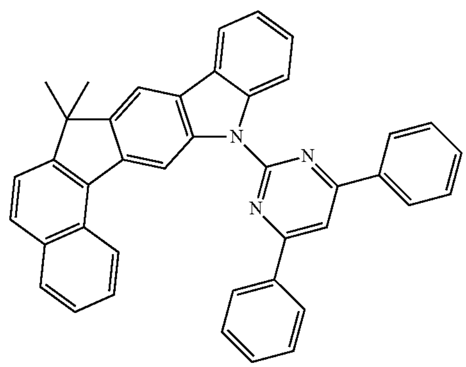
C-263
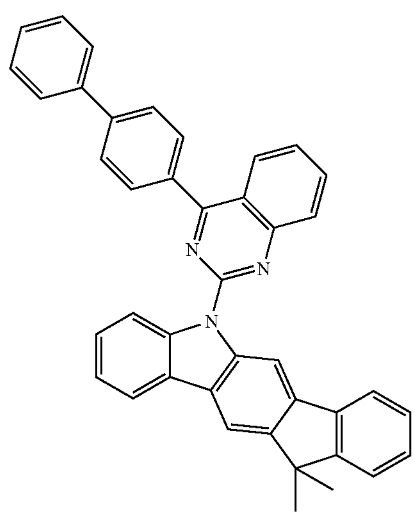

C-264
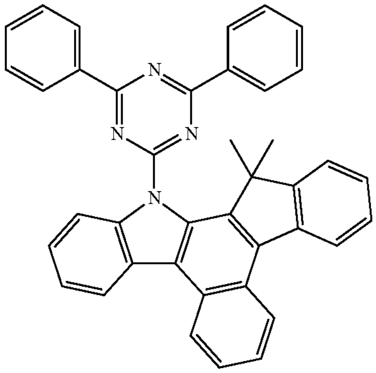
C-265
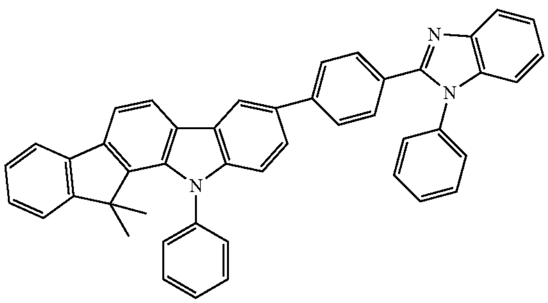
C-266
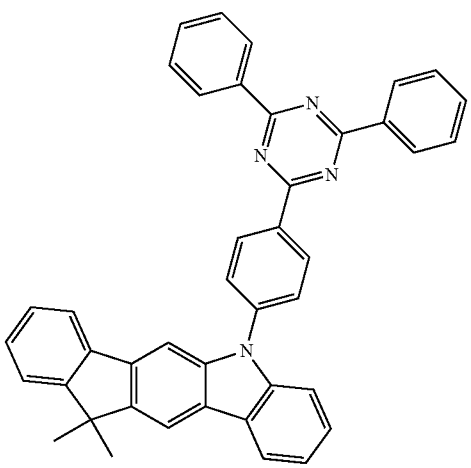
C-267
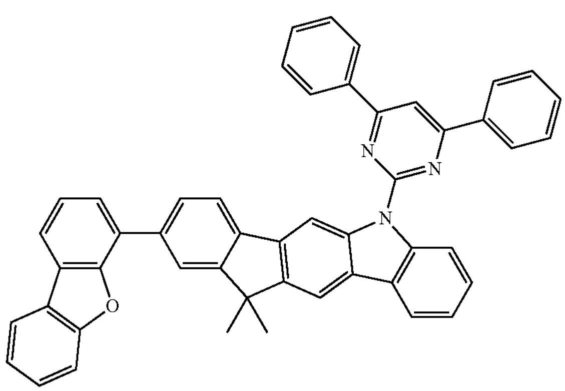
C-268
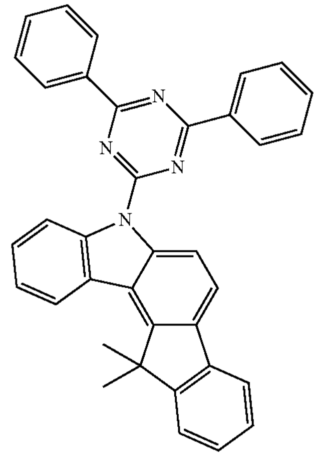
C-269
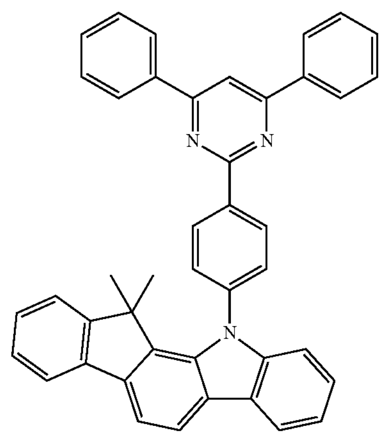
C-270
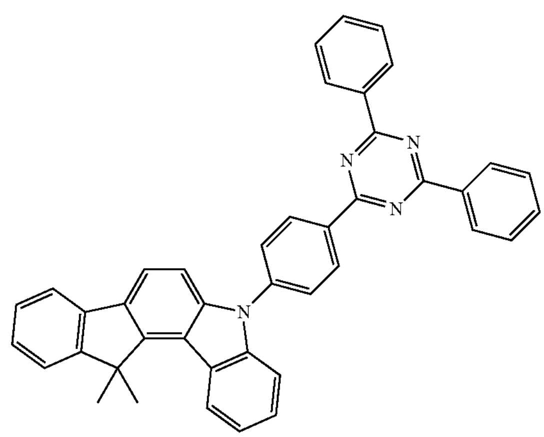

-continued
D-101
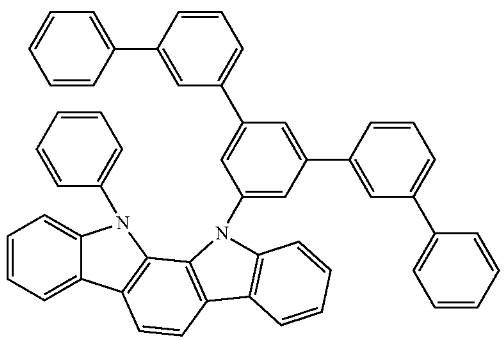
D-102
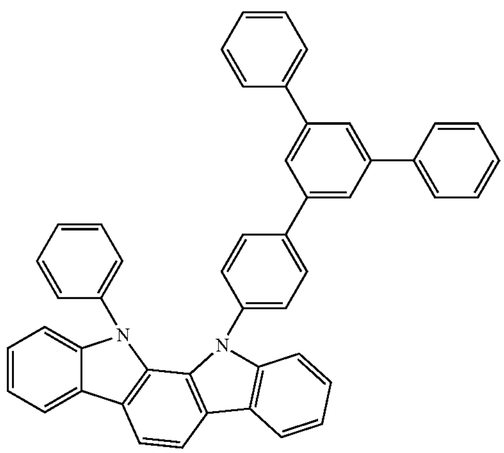
D-103
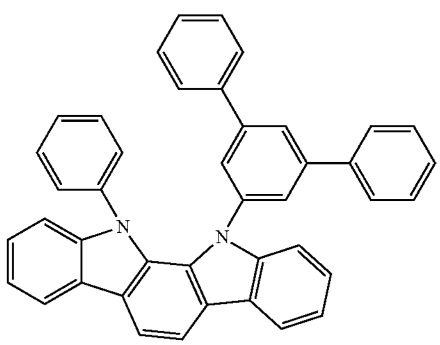
D-104
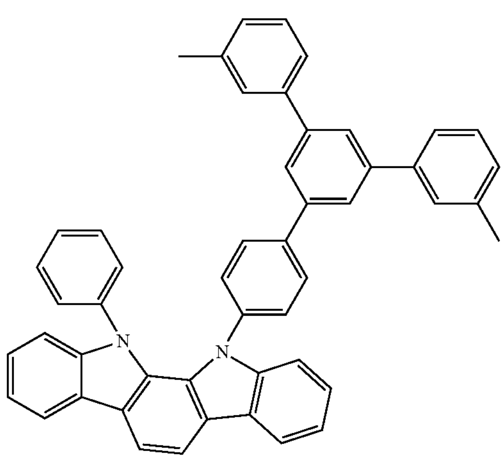
-continued
D-105
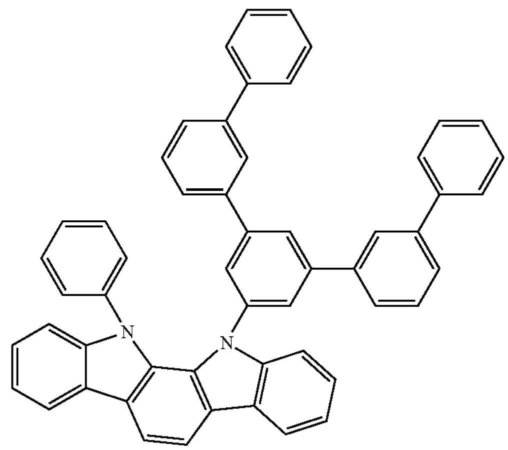
D-106
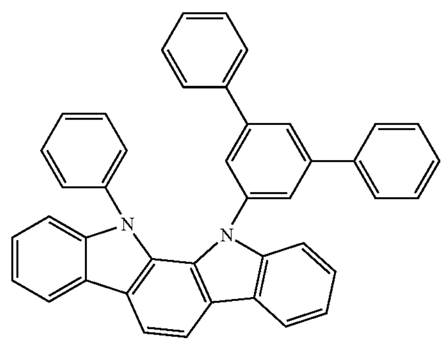
D-107
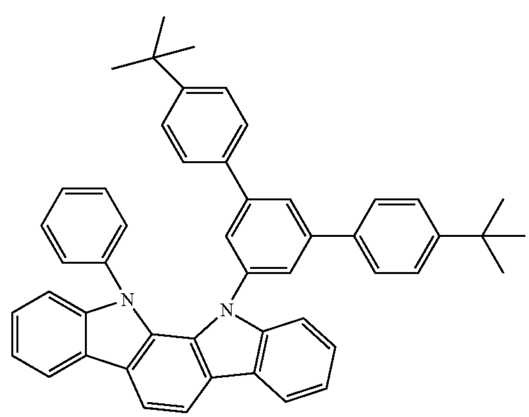
D-108
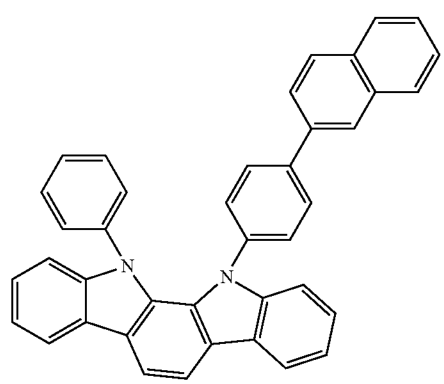

-continued
D-109
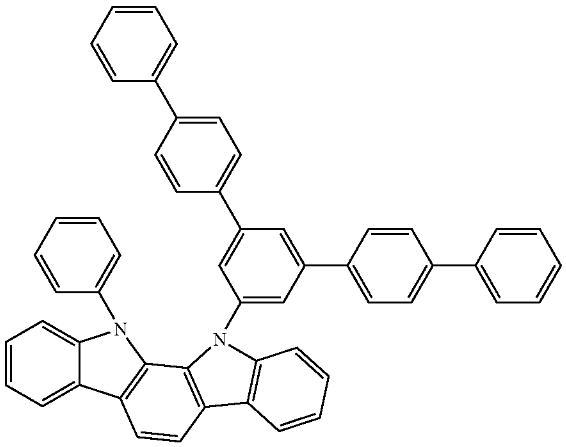
D-110
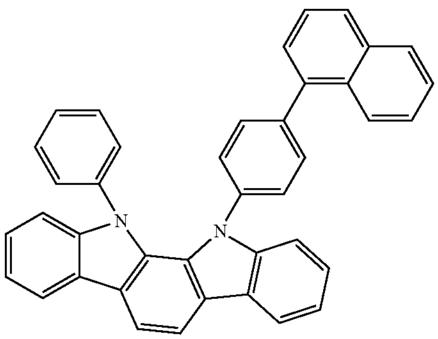
D-111
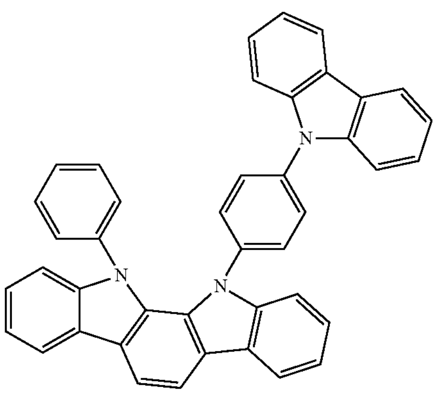
D-112
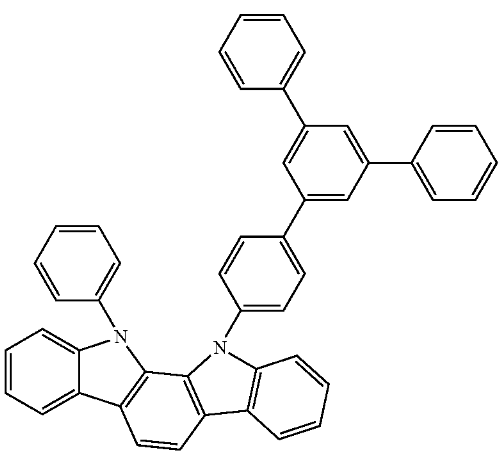
-continued
D-113
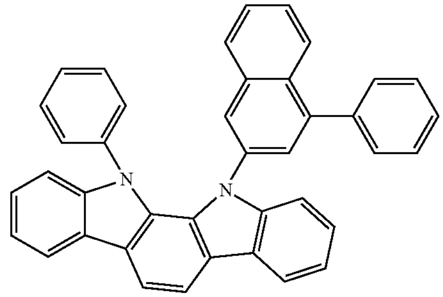
D-114
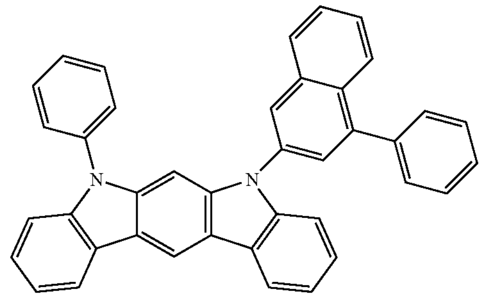
D-115
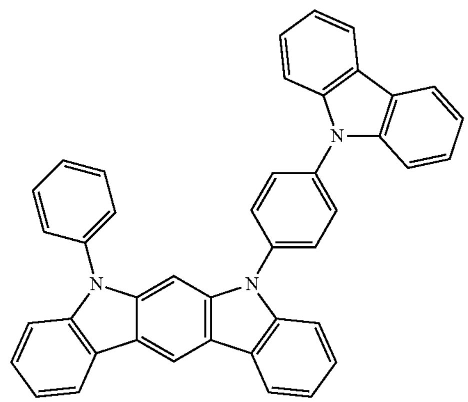
D-116
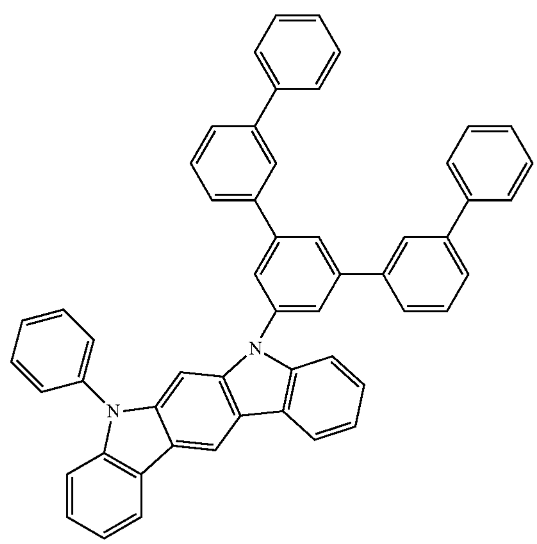

-continued
D-117
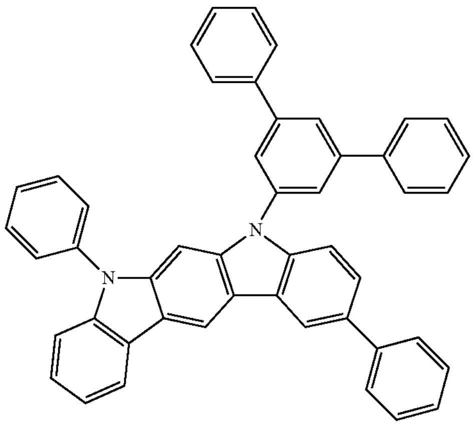
D-118
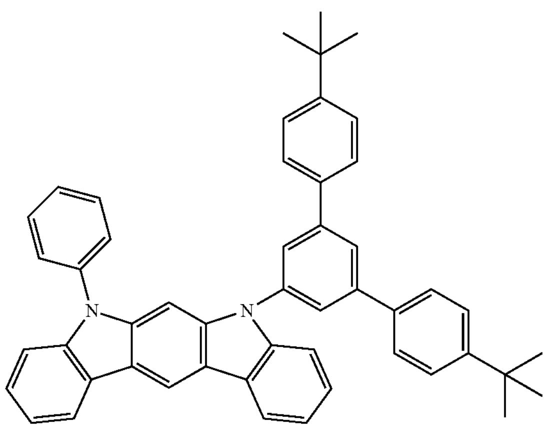
D-119
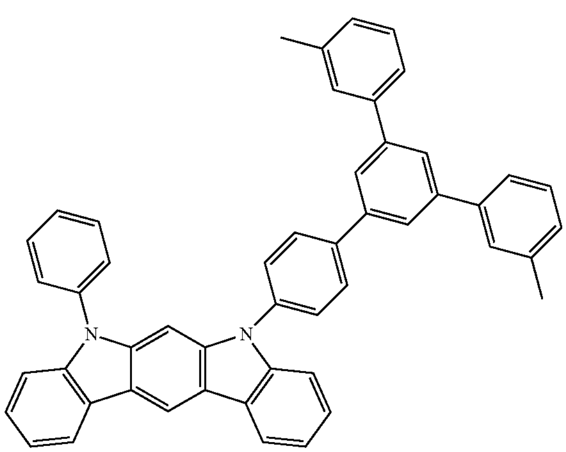
-continued
D-120
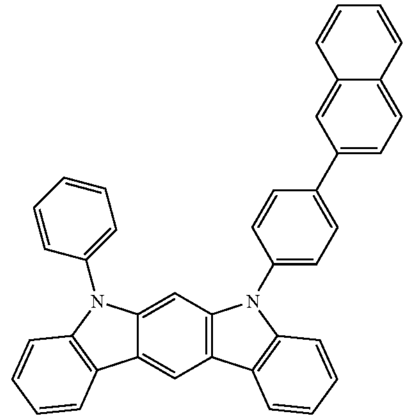
D-121
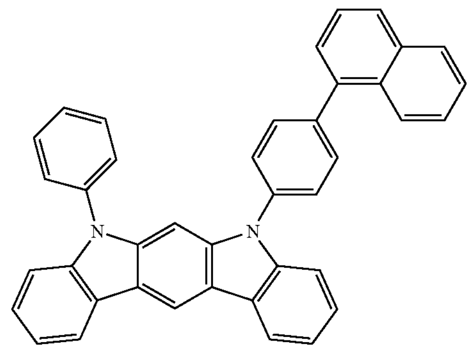
D-122
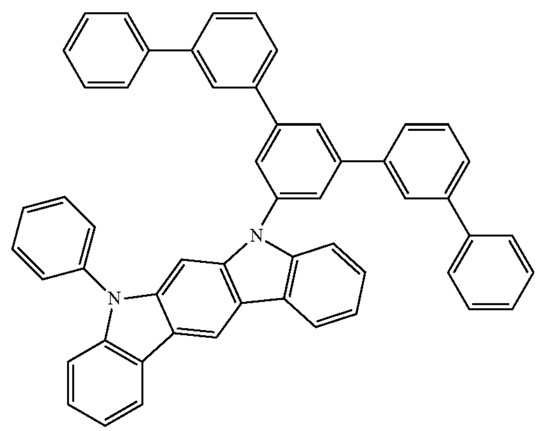
D-123
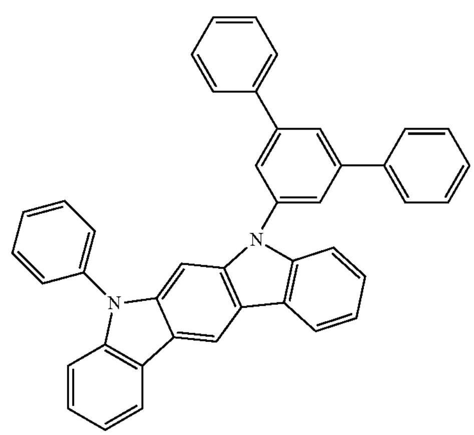

D-124
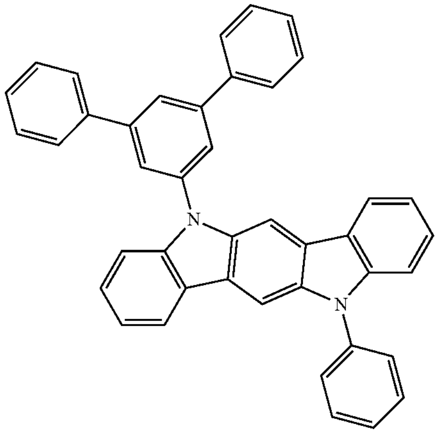
D-125
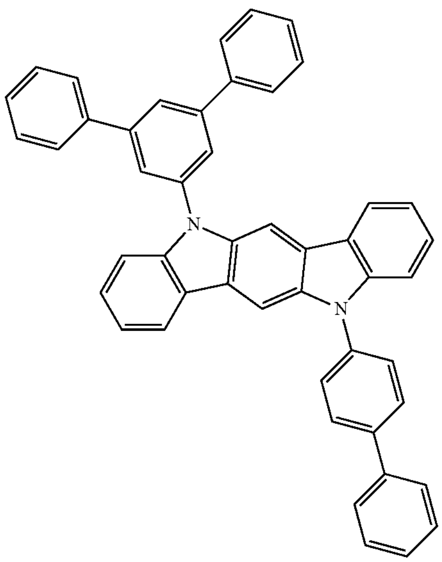
D-126
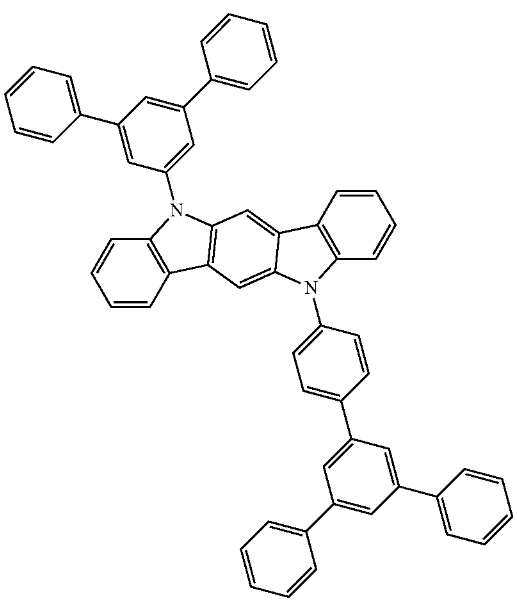
D-127
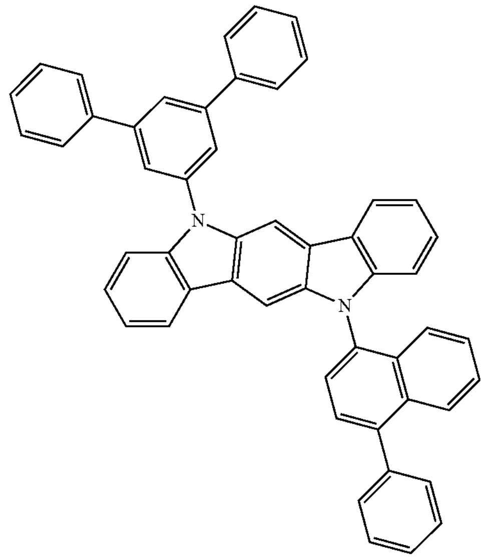
D-128
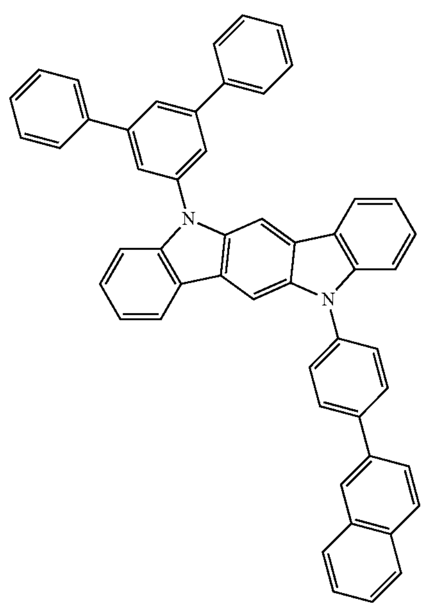

-continued
D-129
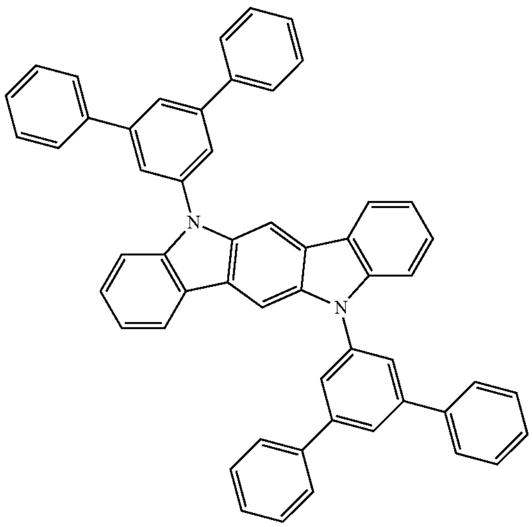
D-130
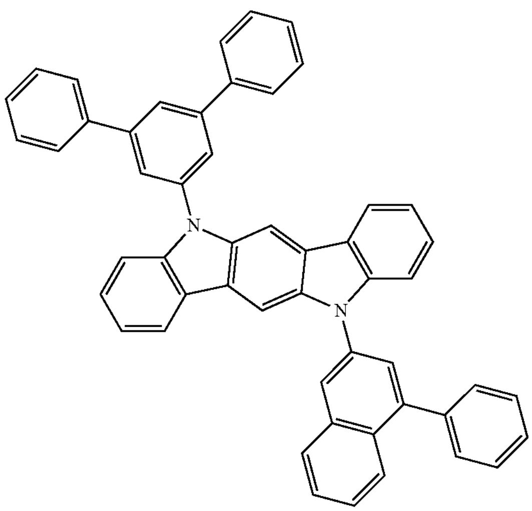
D-131
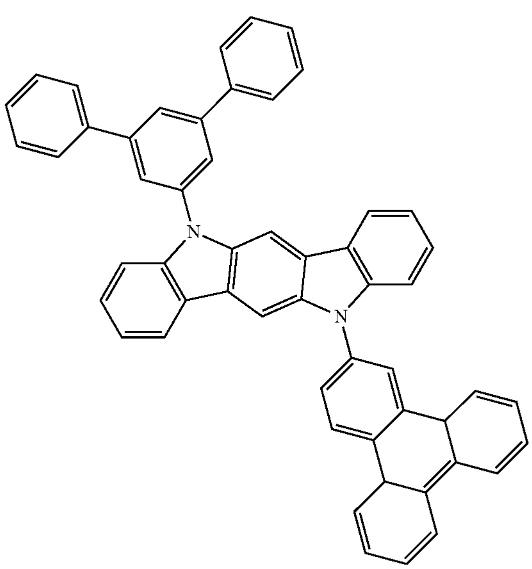
-continued
D-132
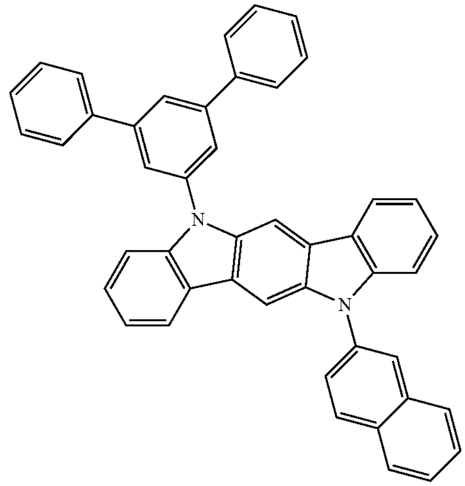
D-133
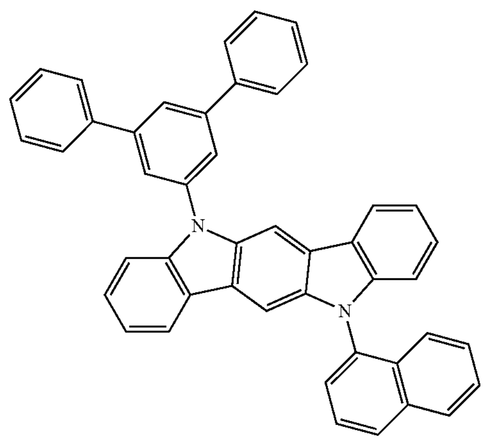
D-134
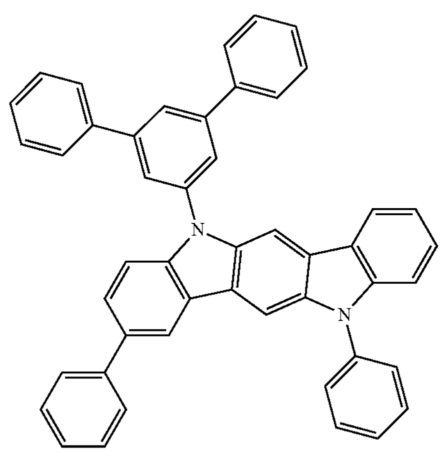

-continued
D-135
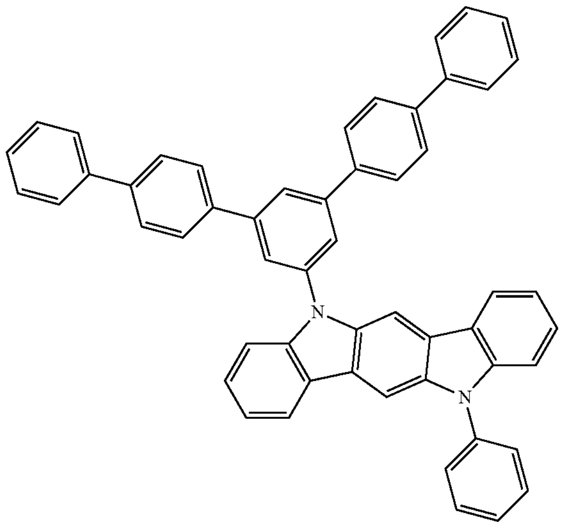
D-136
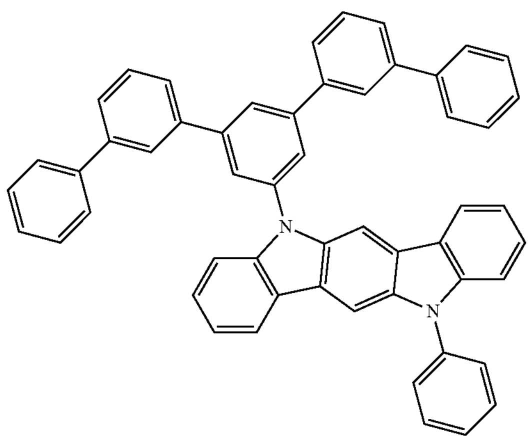
D-137
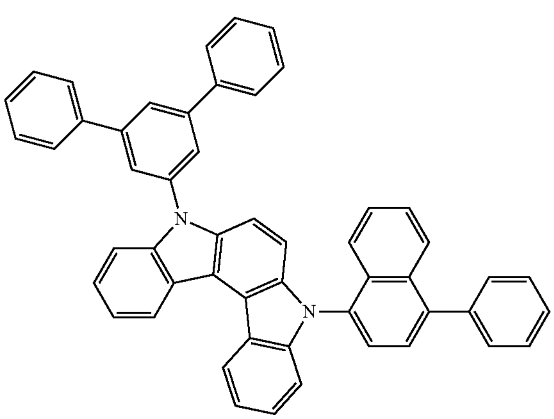
-continued
D-138
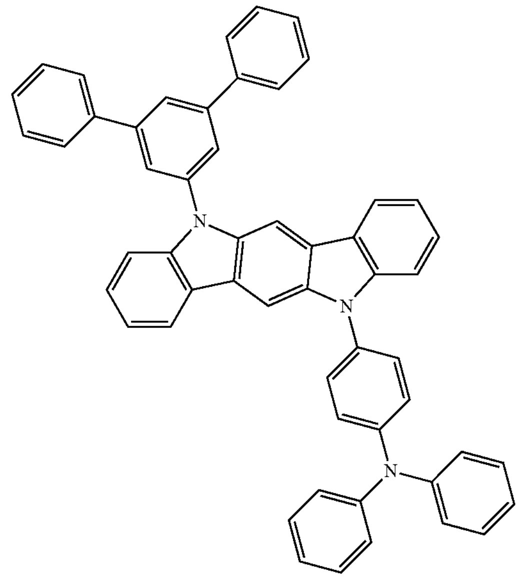
D-139
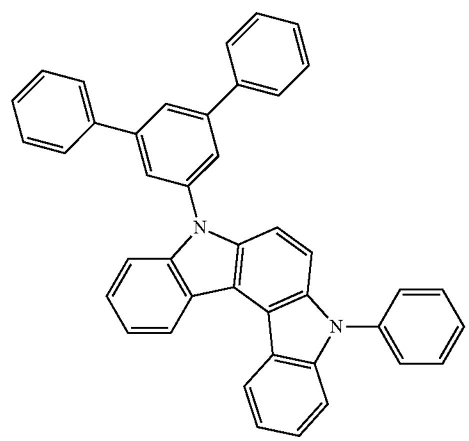
D-140
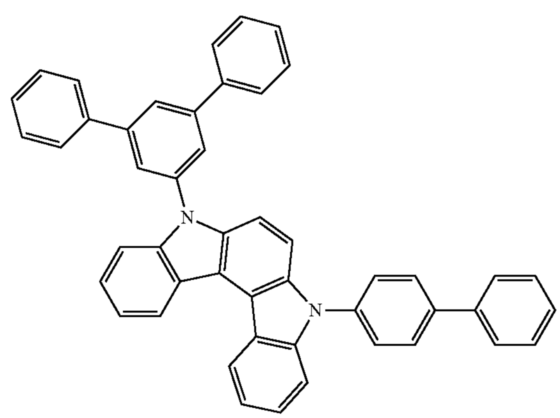

D-141
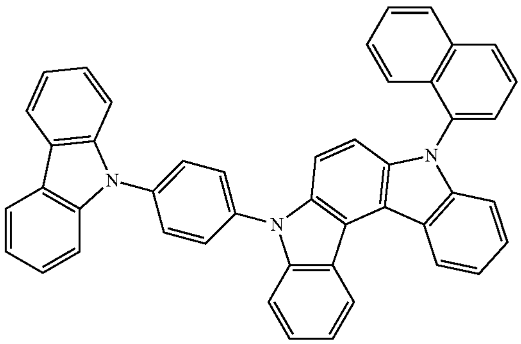
D-142
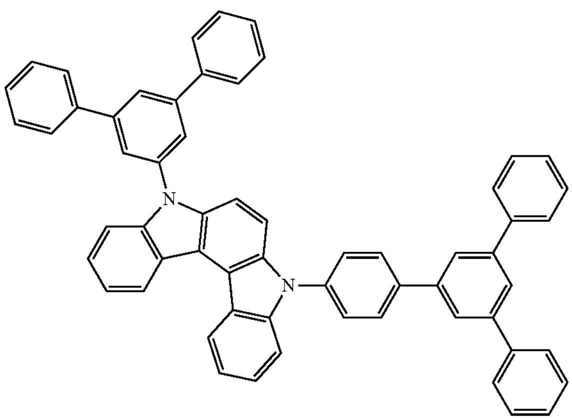
D-143
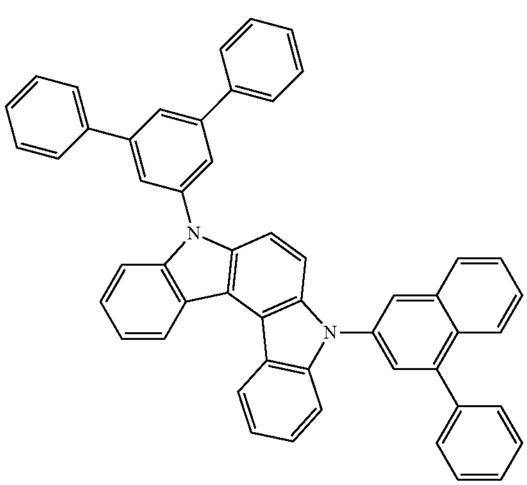
D-144
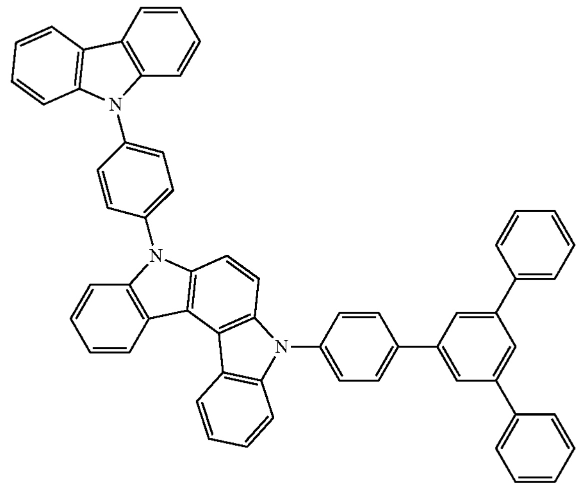
D-145
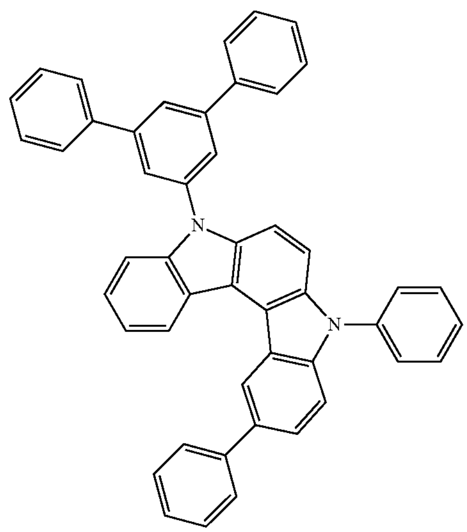
D-146
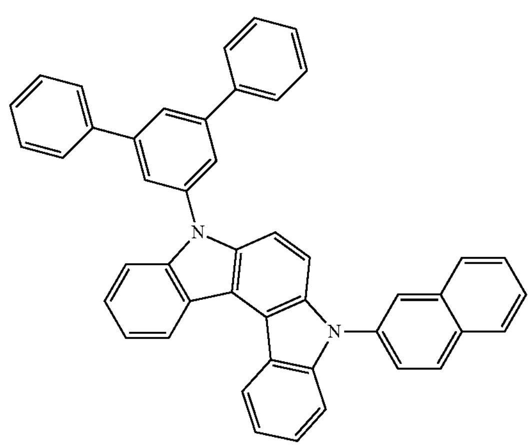

-continued
D-147
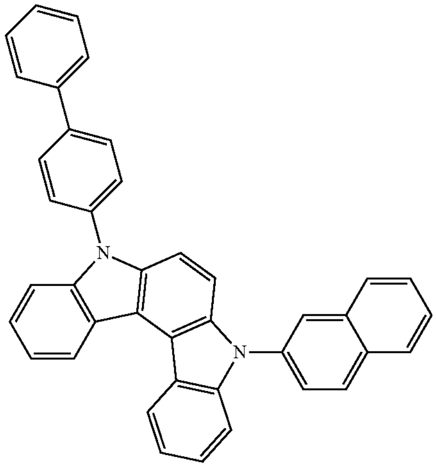
D-148
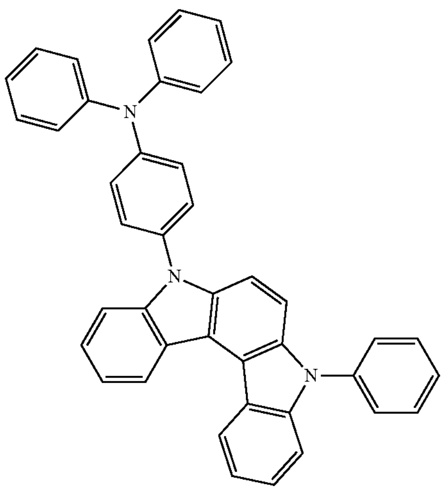
D-149
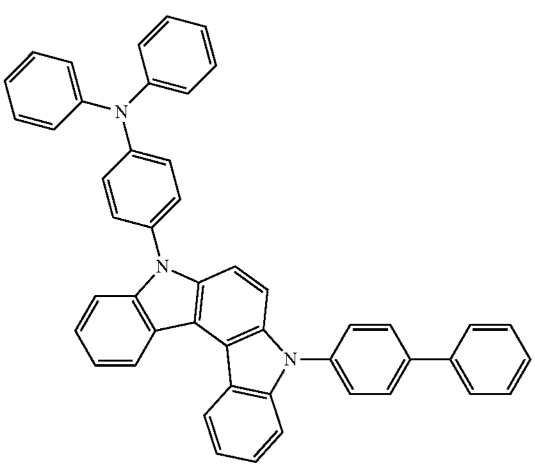
-continued
D-150
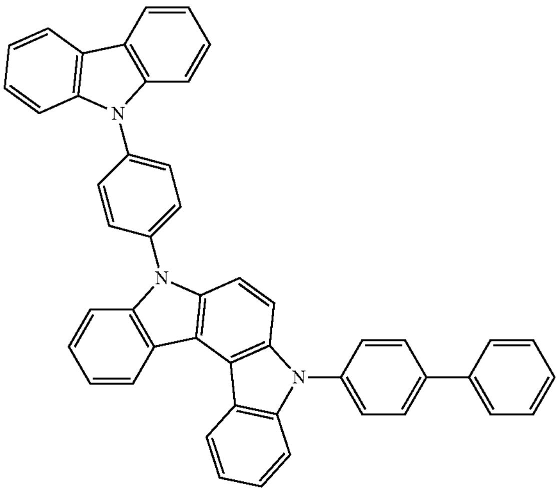
D-151
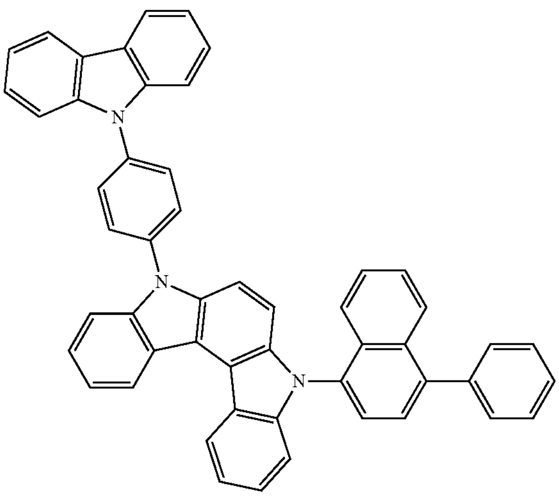
D-152
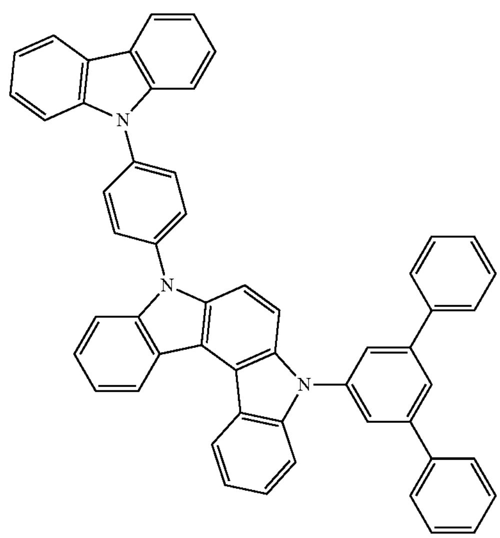

-continued
D-153
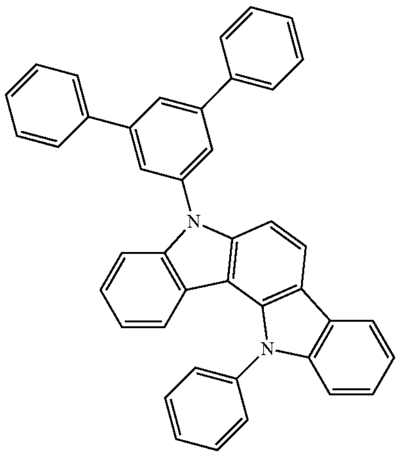
D-154
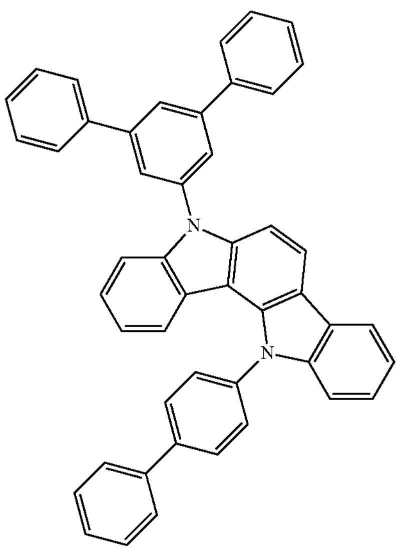
D-155
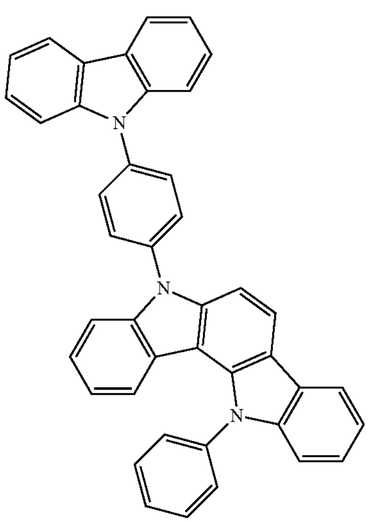
-continued
D-156
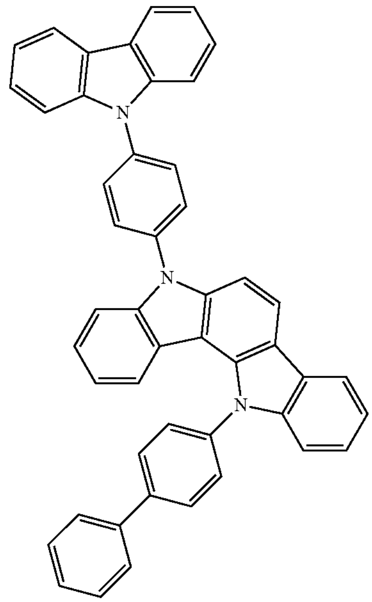
D-157
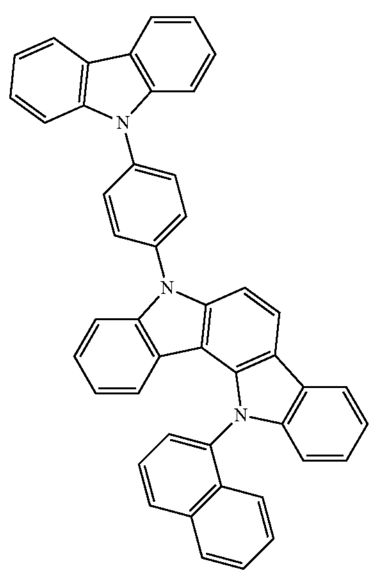

-continued
D-158
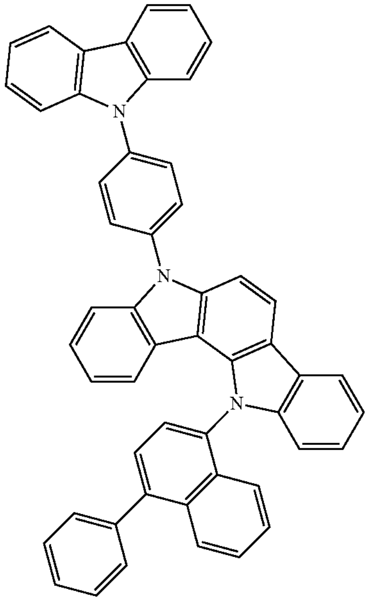
D-159
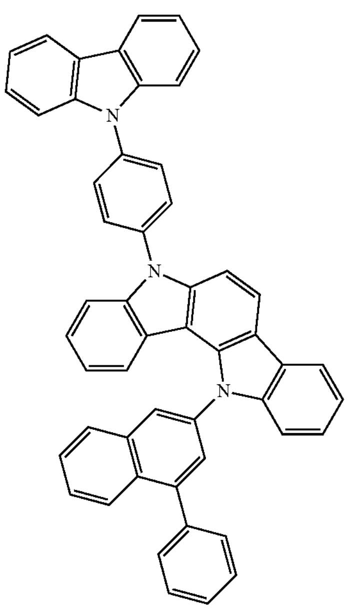
-continued
D-160
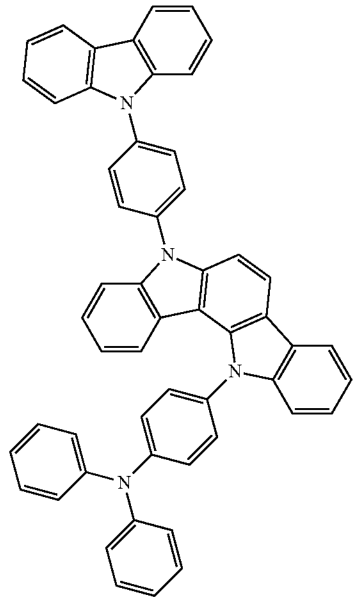
D-161
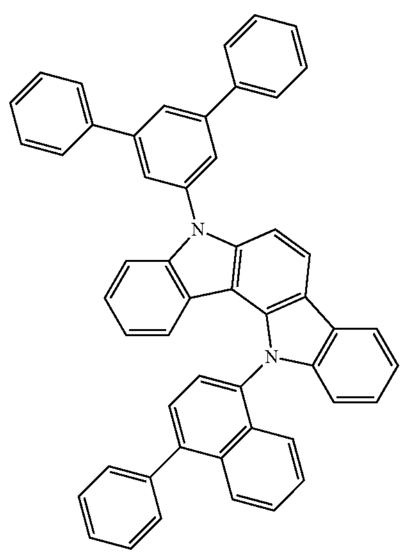

D-162
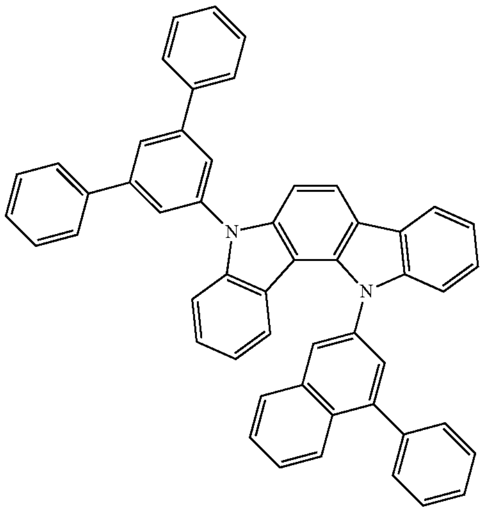
D-163
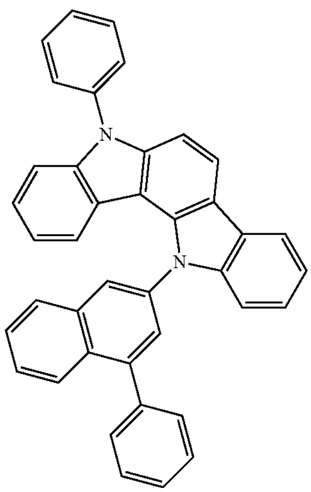
D-164
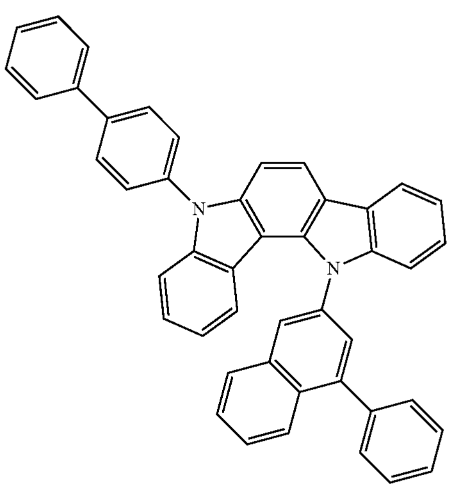
D-165
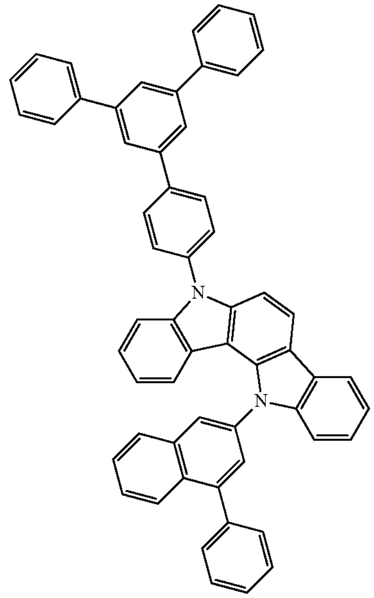
D-166
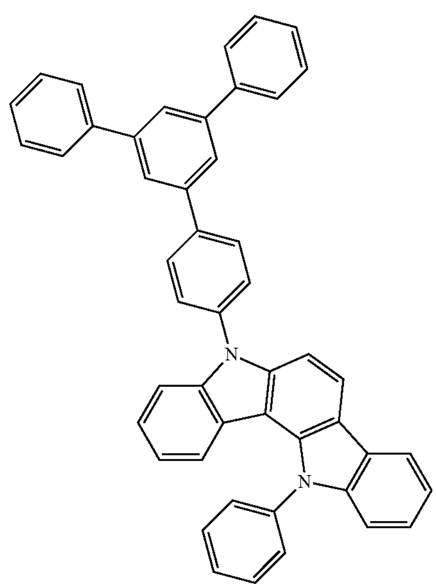

D-167
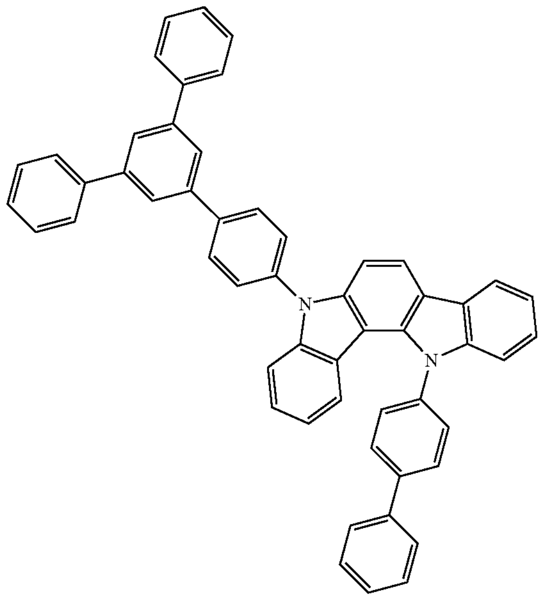
D-168
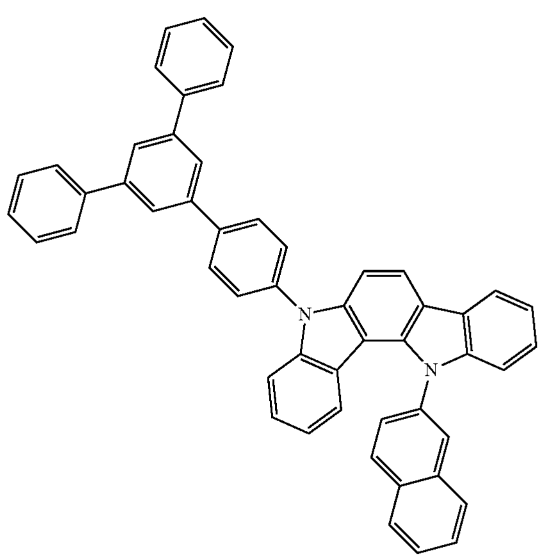
D-169
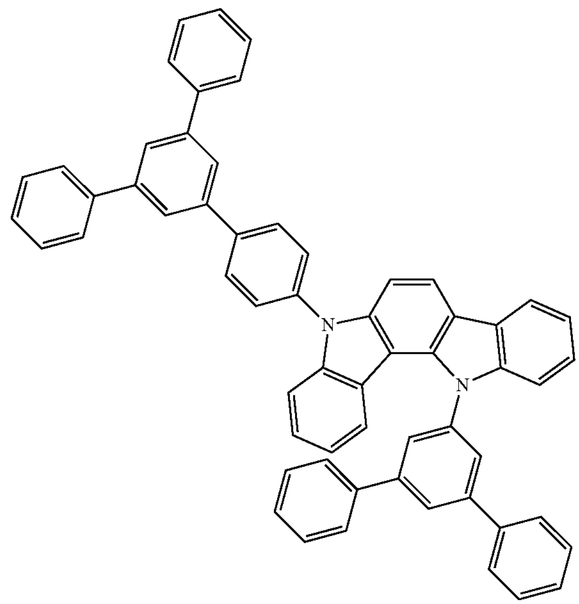
D-170
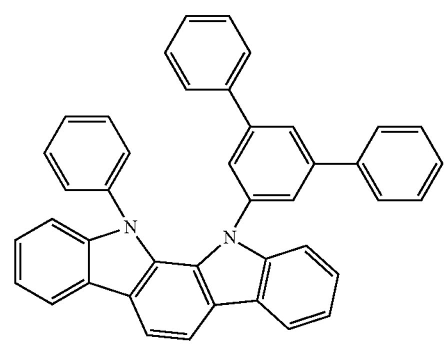
D-171
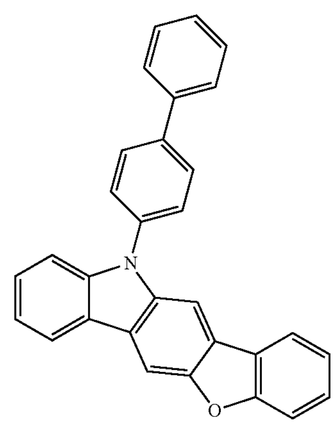

-continued
D-172
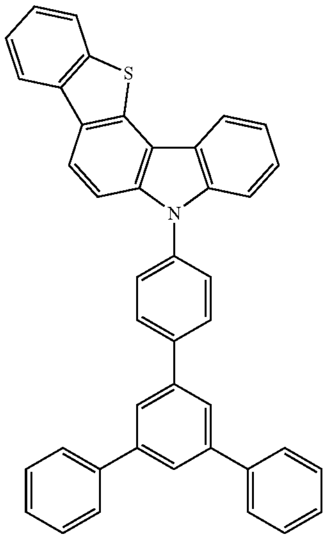
D-173
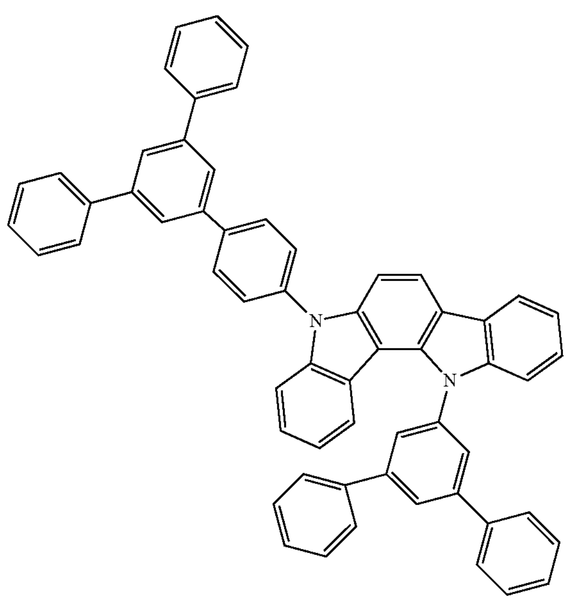
The second compound represented by Formula 2 may be selected from Compounds E-1 to E-274, but embodiments are not limited thereto:
E-1
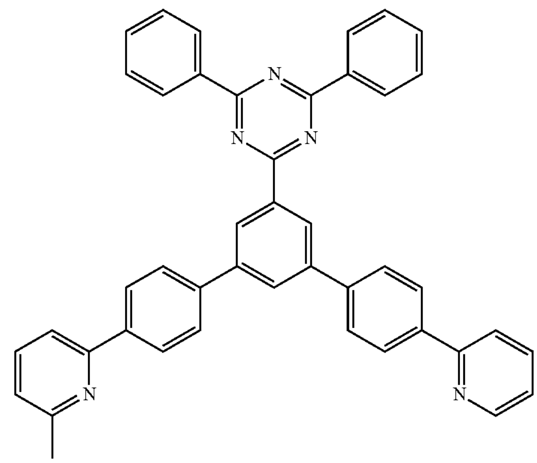
E-2
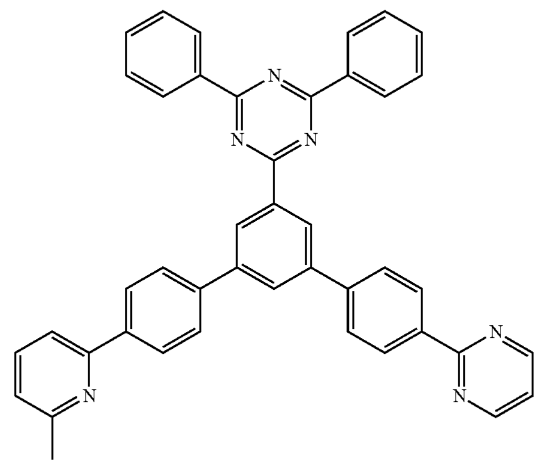
E-3
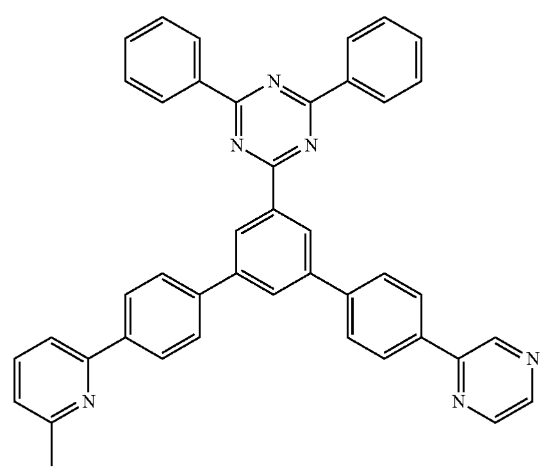

-continued
E-4
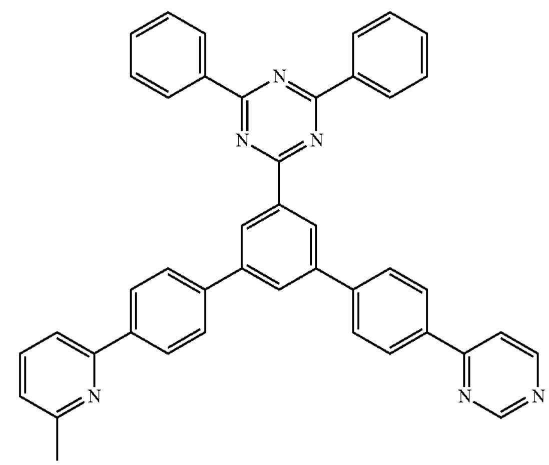
E-5
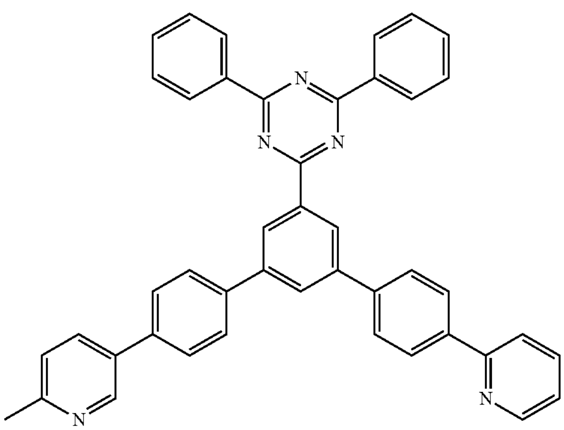
E-6
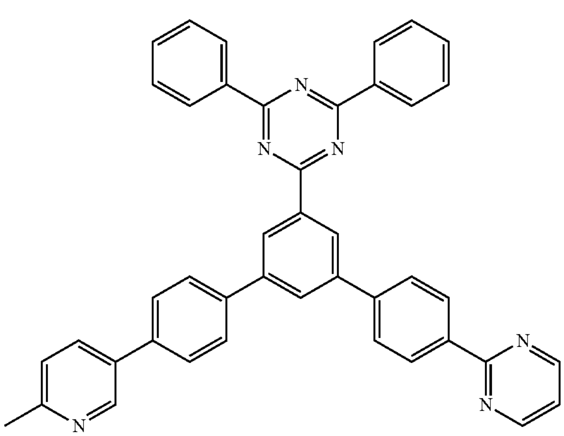
-continued
E-7
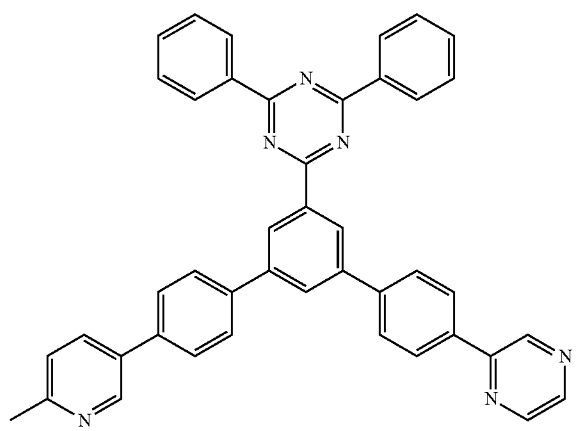
E-8
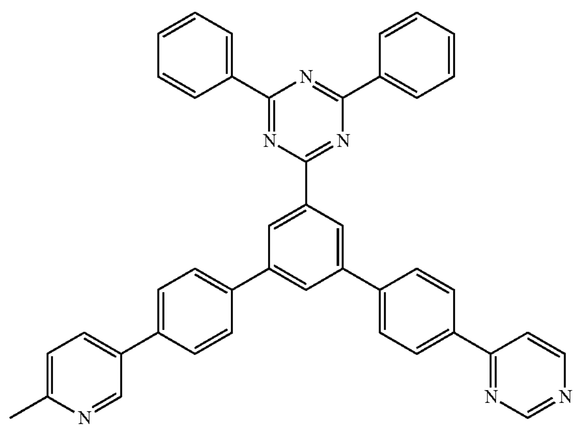
E-9
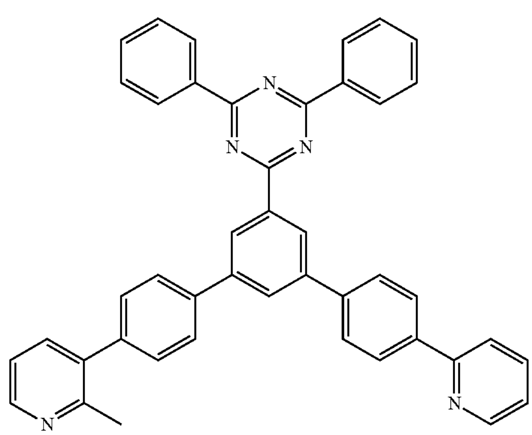

-continued
E-10
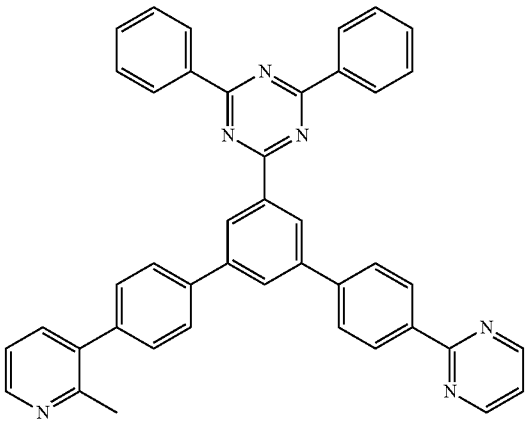
E-11
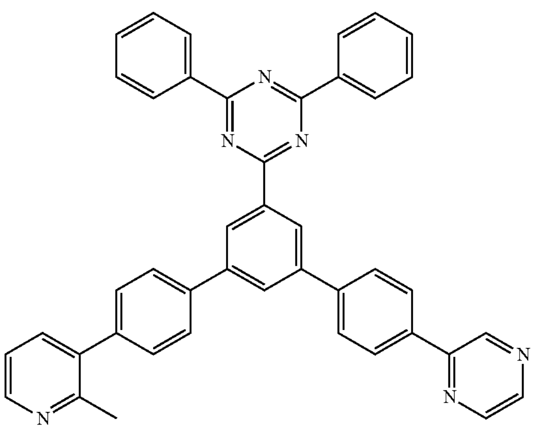
E-12
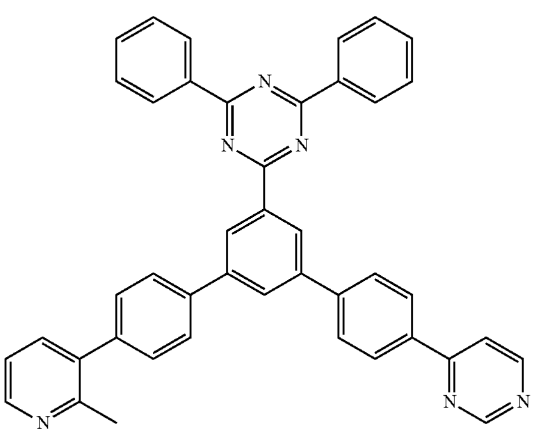
-continued
E-13
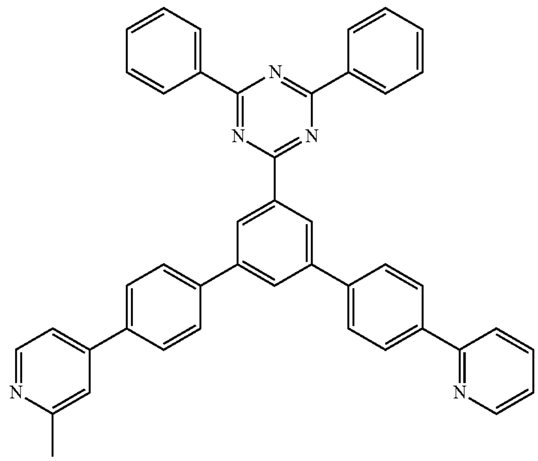
E-14
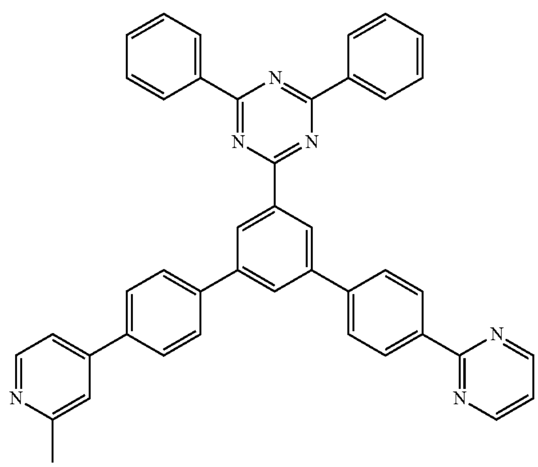
E-15
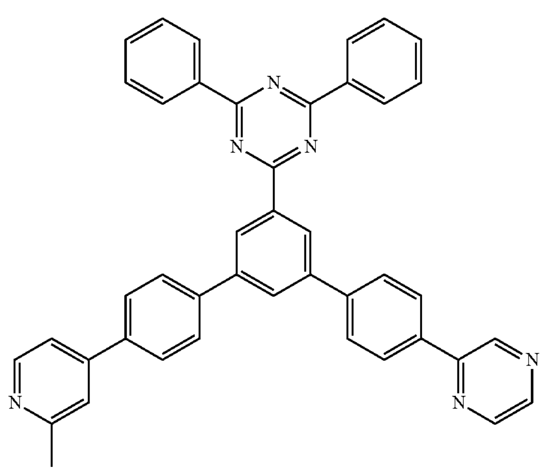

-continued
E-16
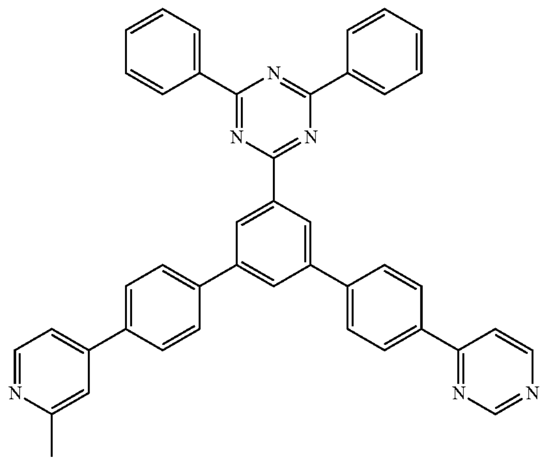
E-17
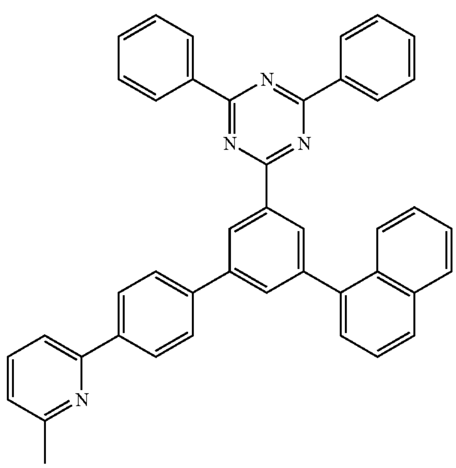
E-18
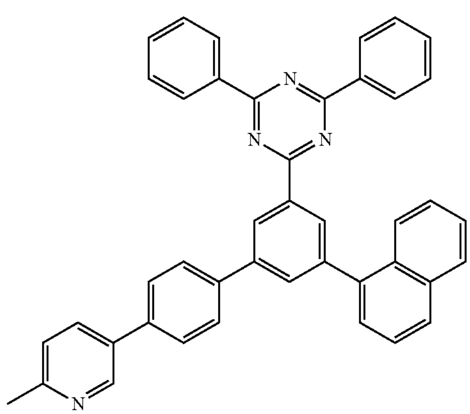
-continued
E-19
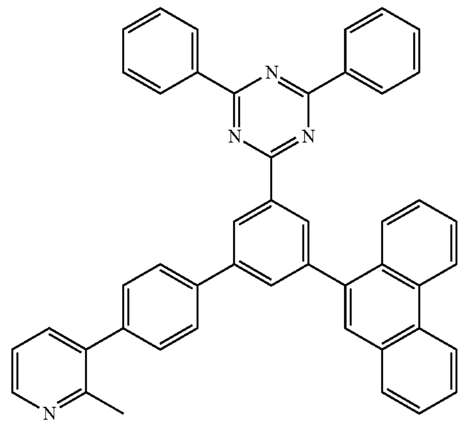
E-20
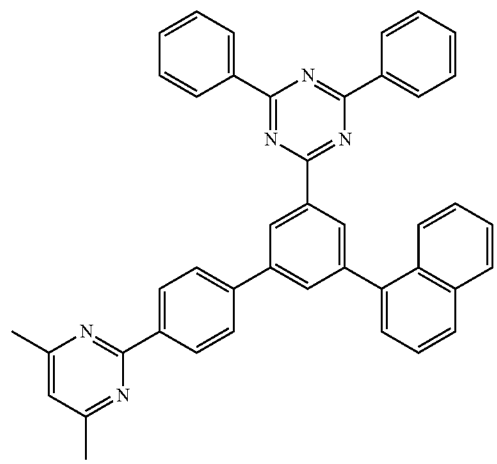
E-21
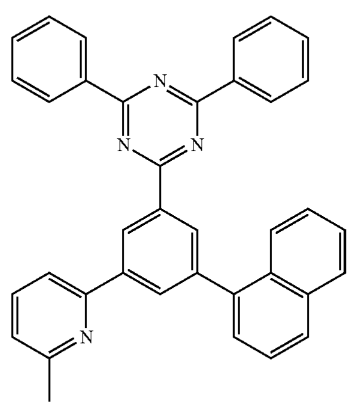

-continued
E-22
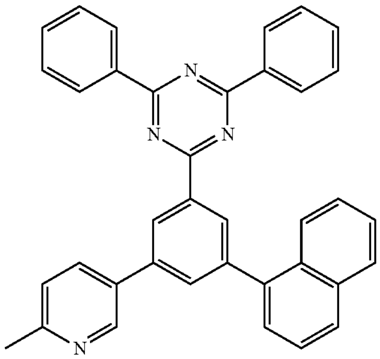
E-23
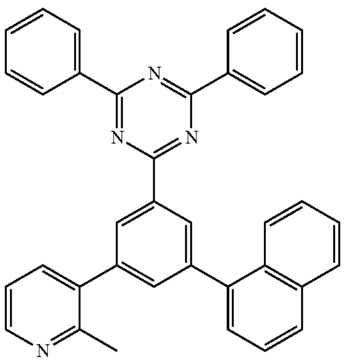
E-24
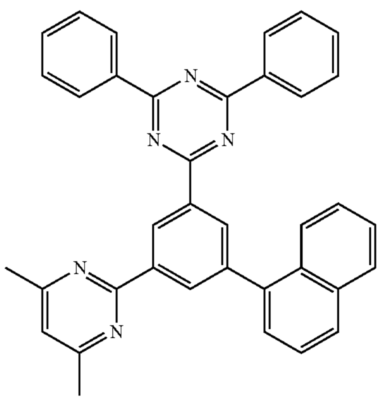
E-25
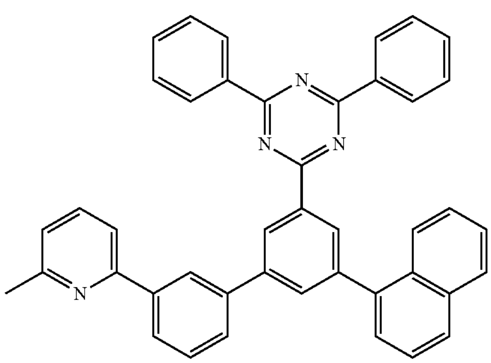
-continued
E-26
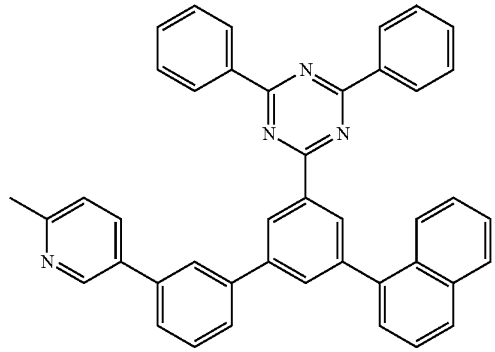
E-27
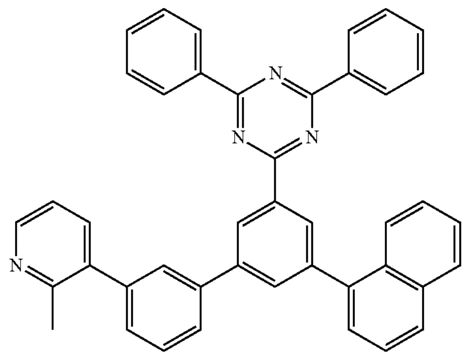
E-28
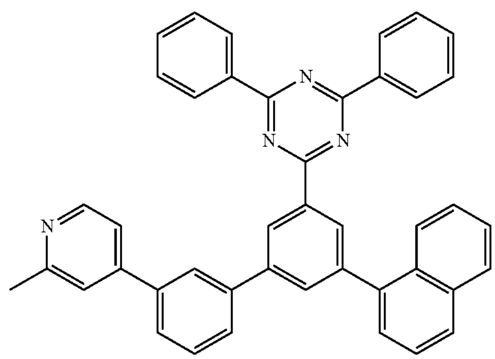
E-29
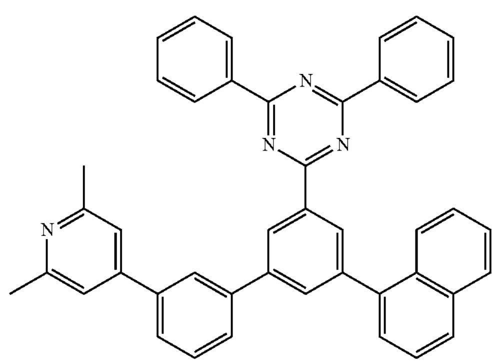

-continued
E-30
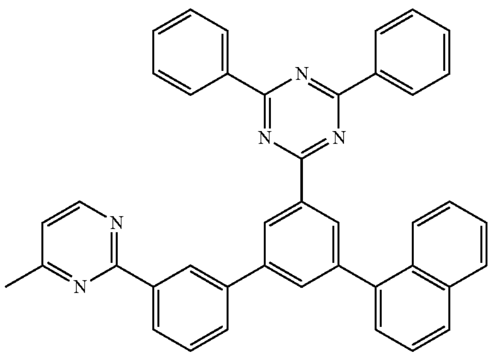
E-31
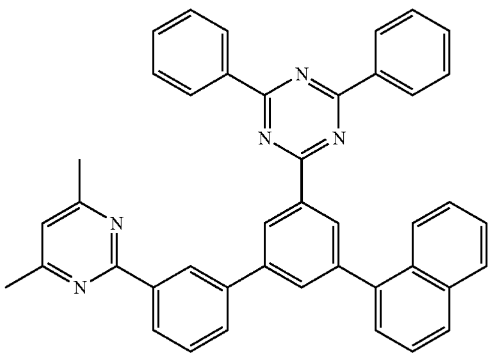
E-32
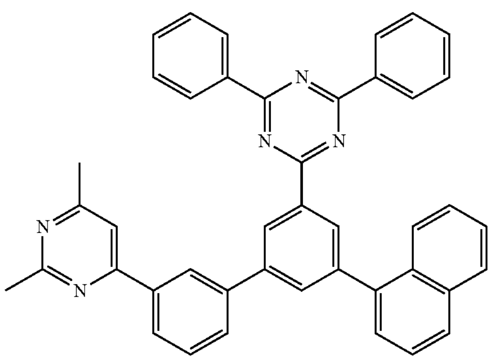
E-33
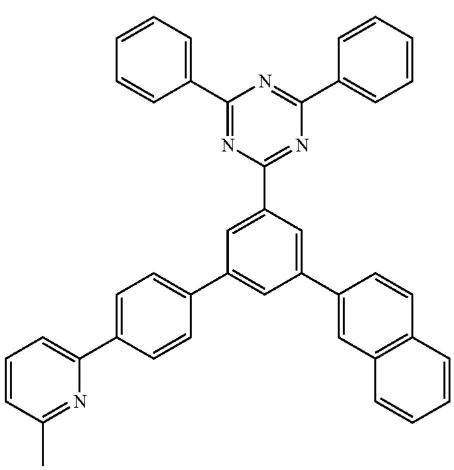
-continued
E-34
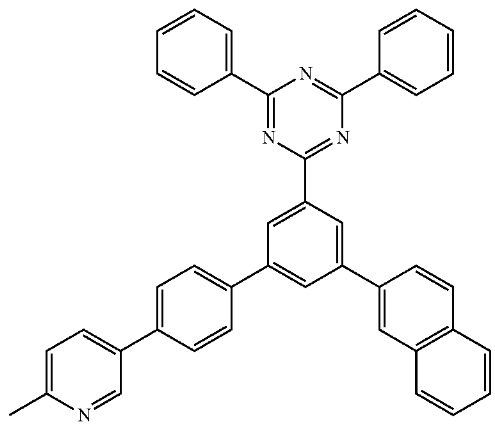
E-35
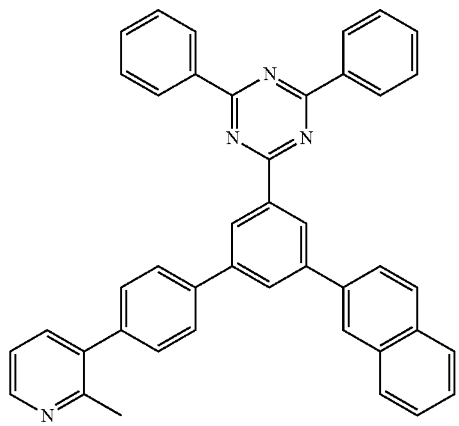
E-36
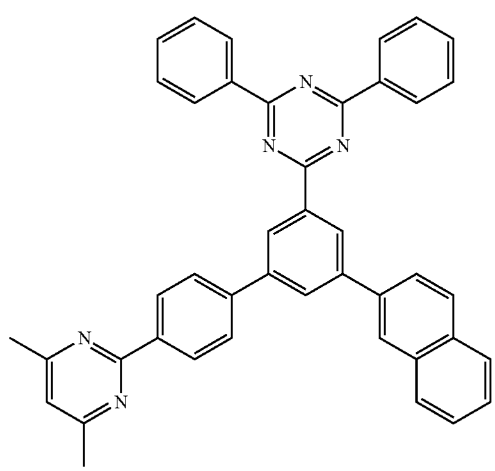

-continued
E-37
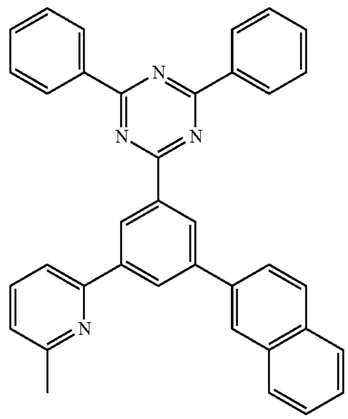
E-38
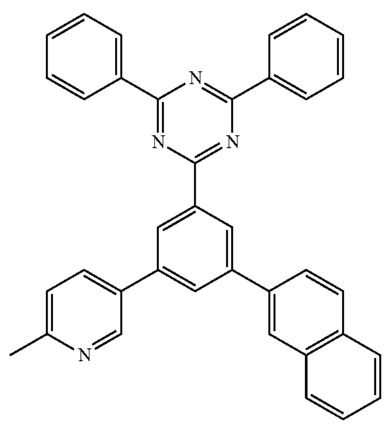
E-39
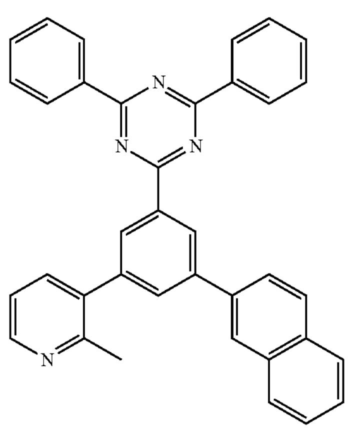
-continued
E-40
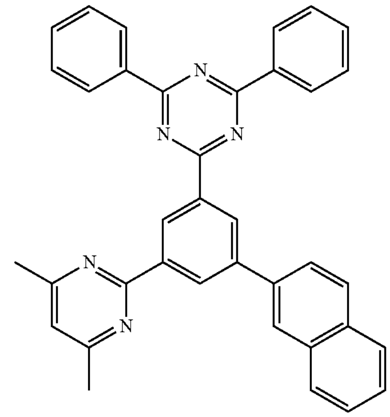
E-41
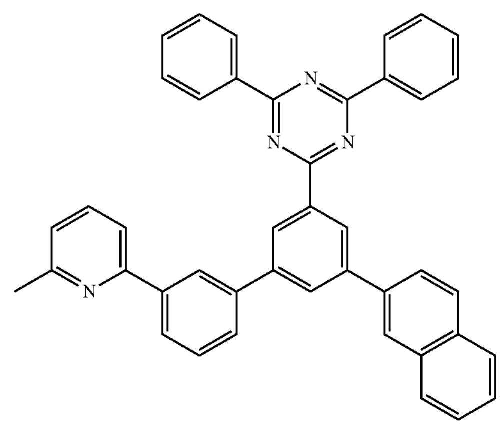
E-42
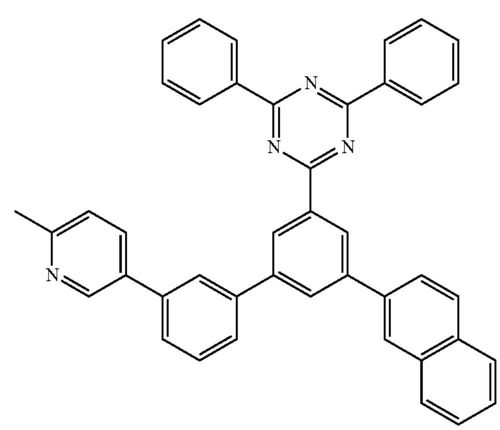

-continued
E-43
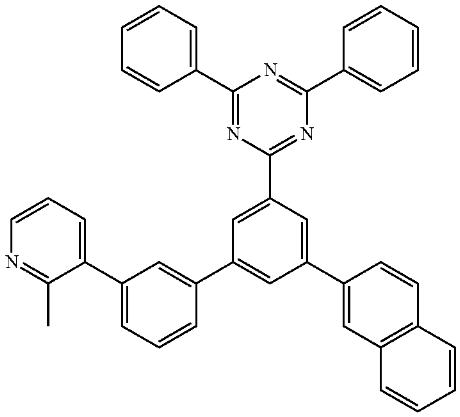
E-44
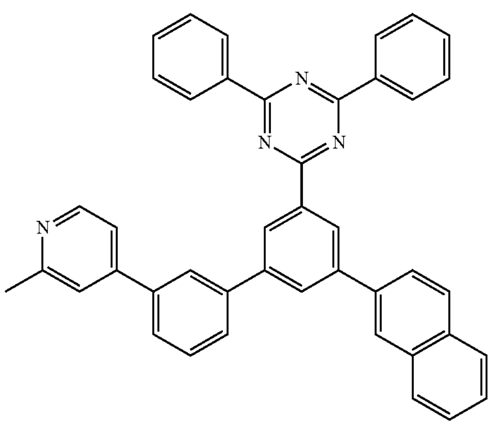
E-45
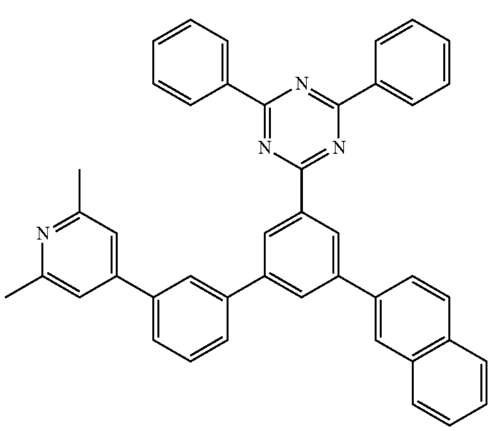
-continued
E-46
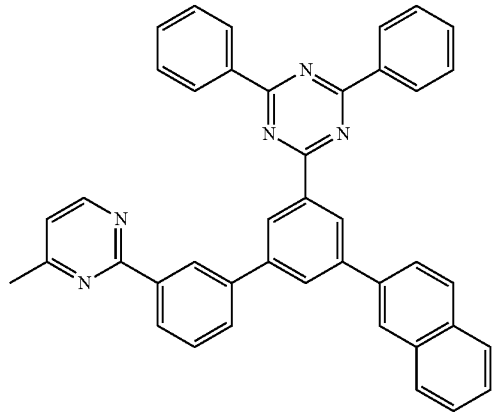
E-47
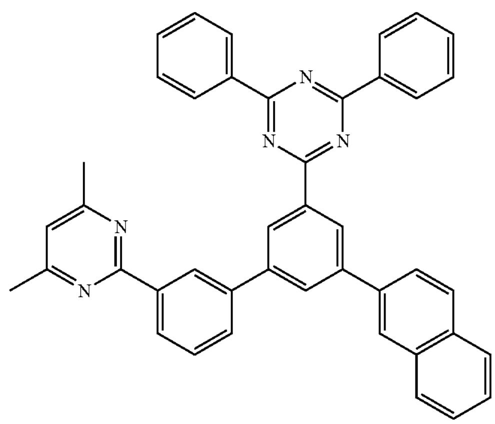
E-48
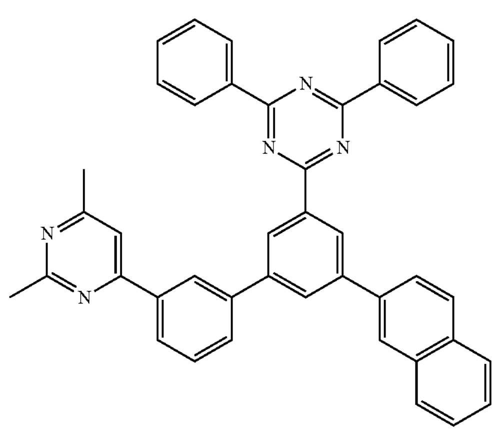

-continued
E-49
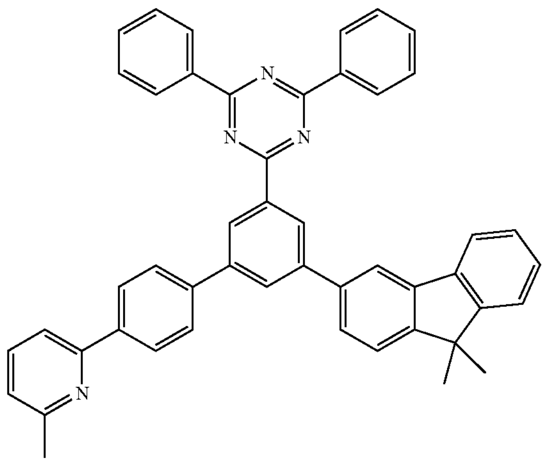
E-50
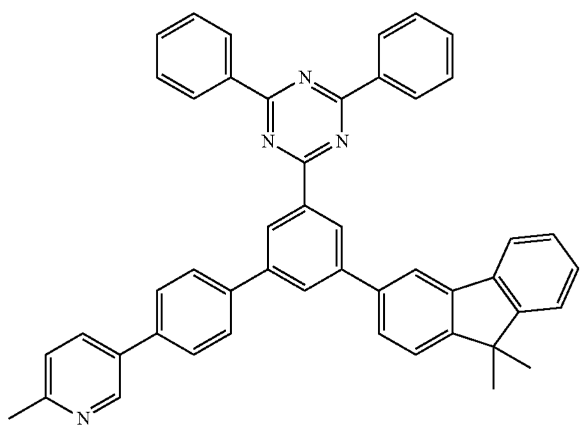
E-51
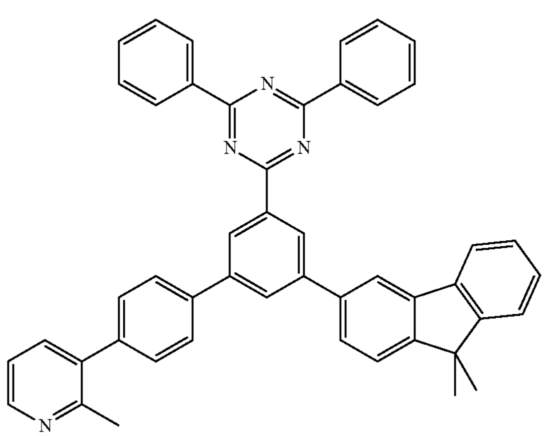
-continued
E-52
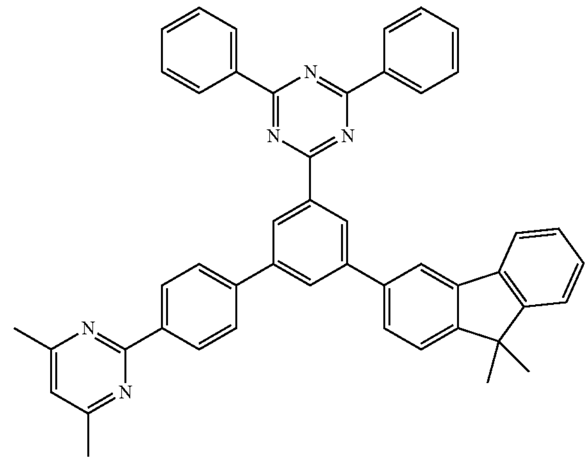
E-53
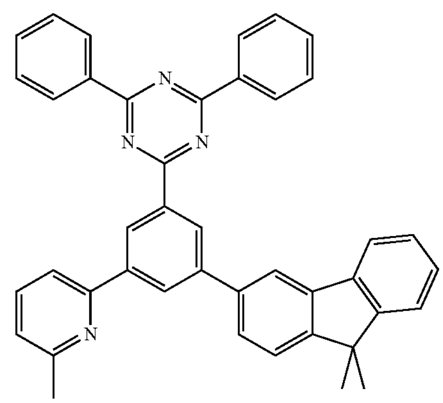
E-54
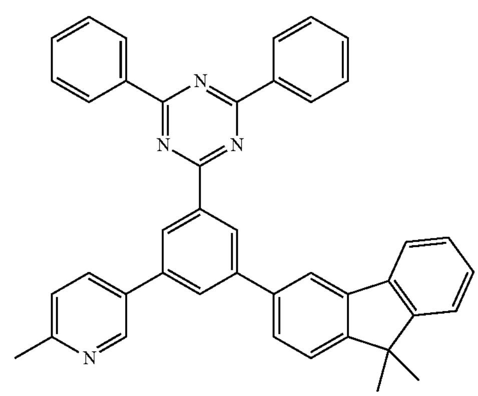

-continued
E-55
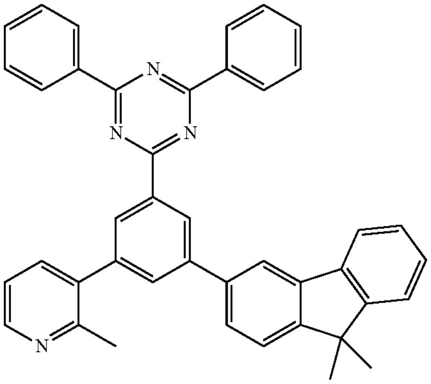
E-56
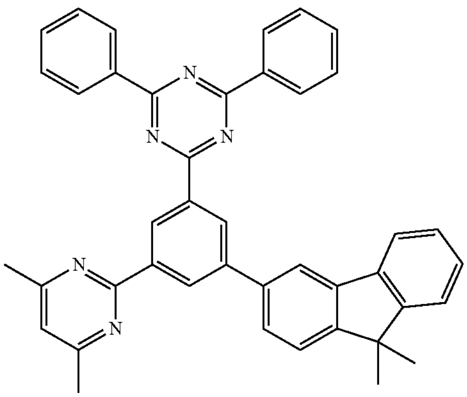
E-57
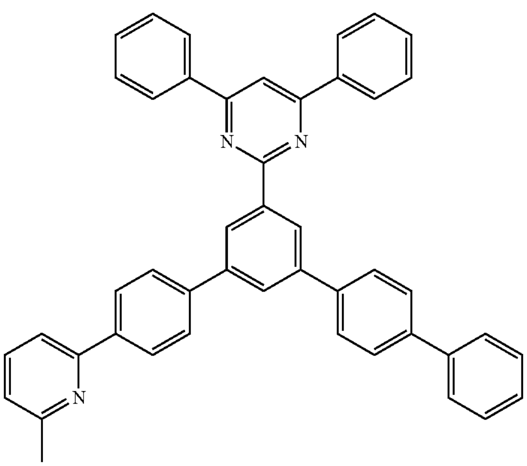
-continued
E-58
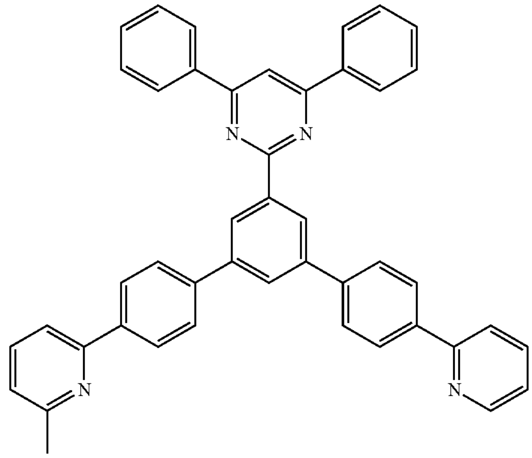
E-59
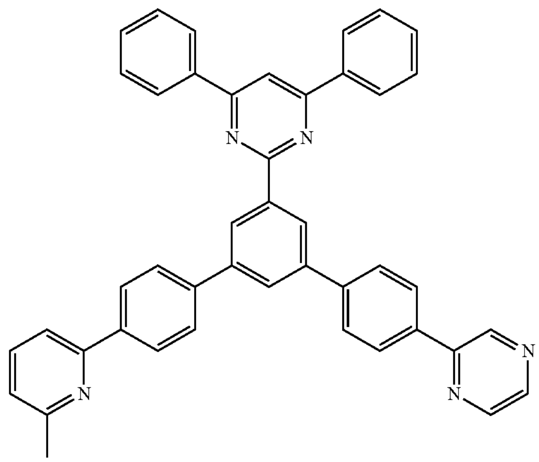
E-60
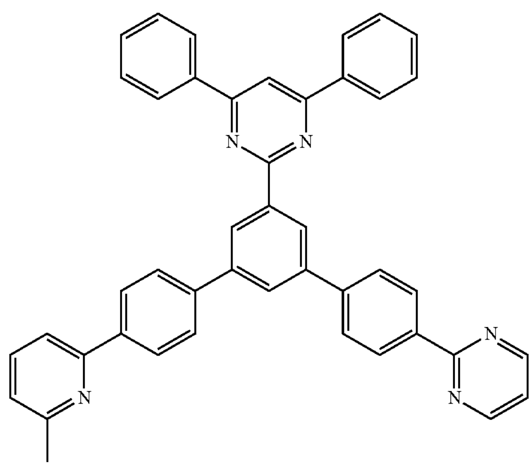

-continued
E-61
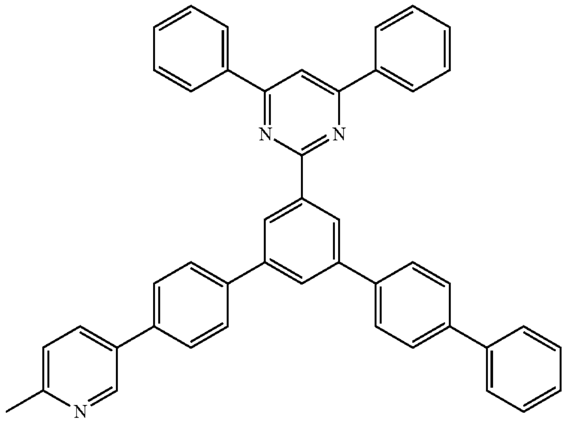
E-62
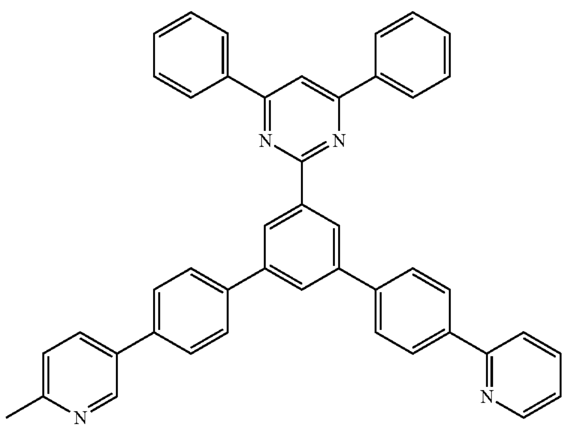
E-63
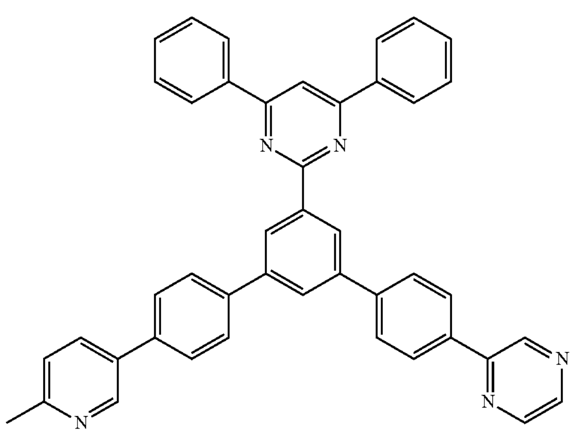
-continued
E-64
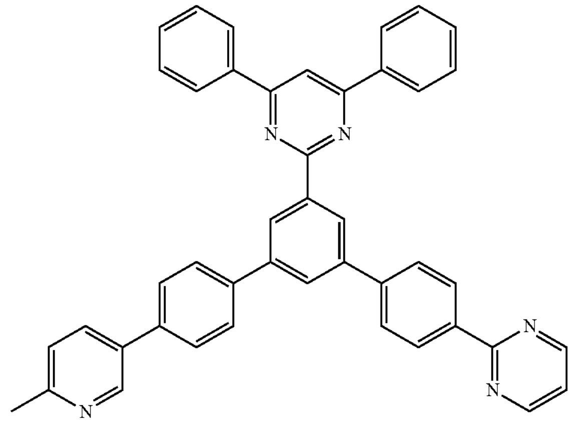
E-65
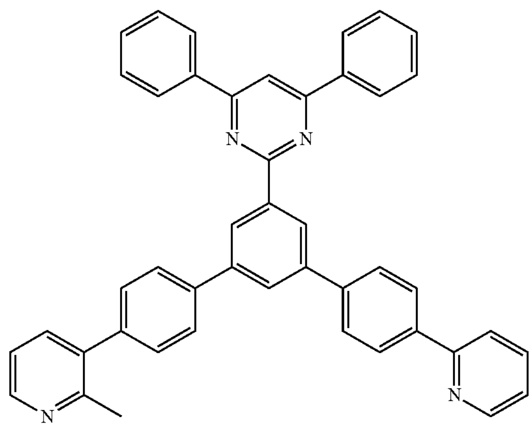
E-66
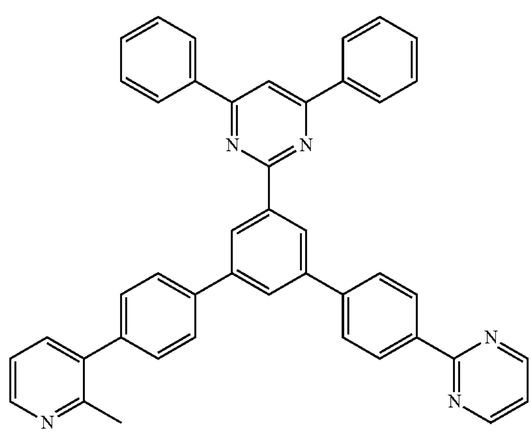

-continued
E-67
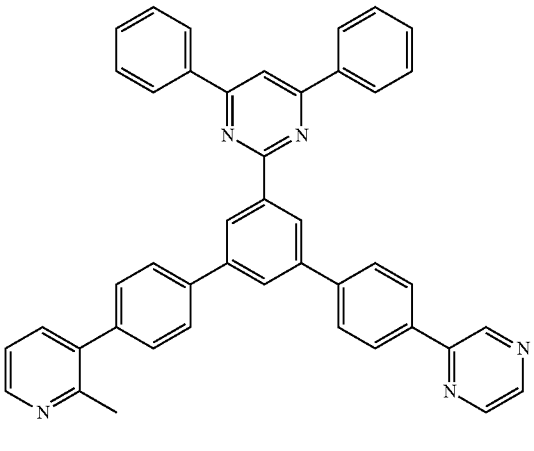
E-68
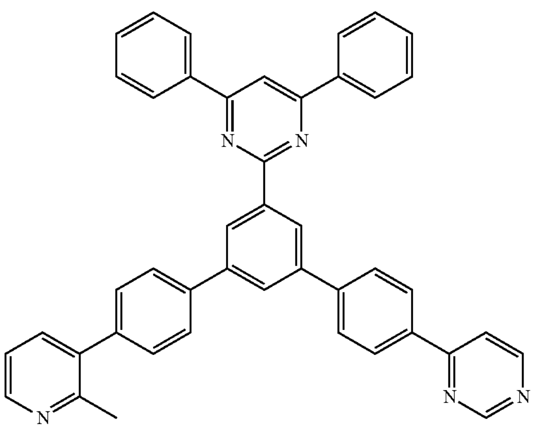
E-69
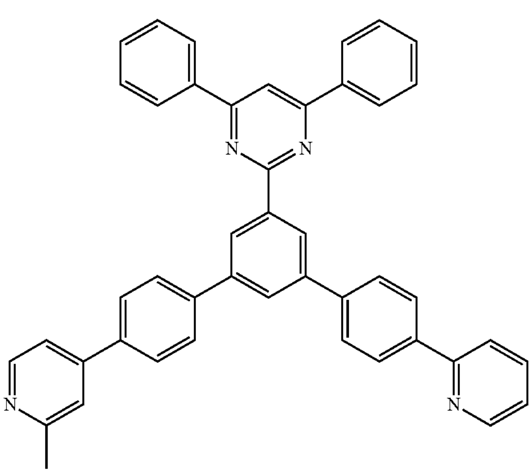
-continued
E-70
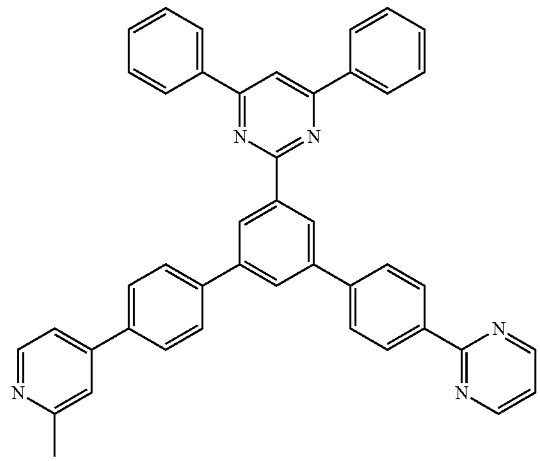
E-71
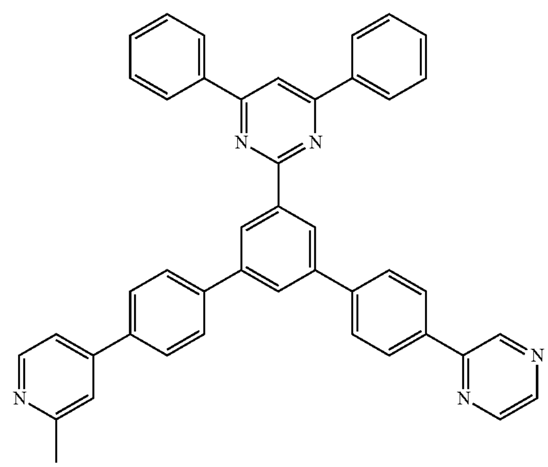
E-72
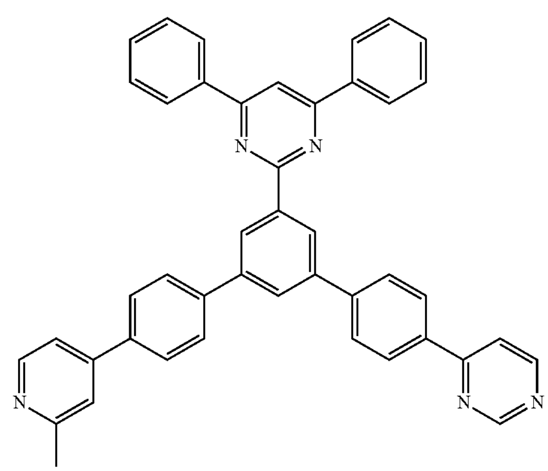

-continued
E-73
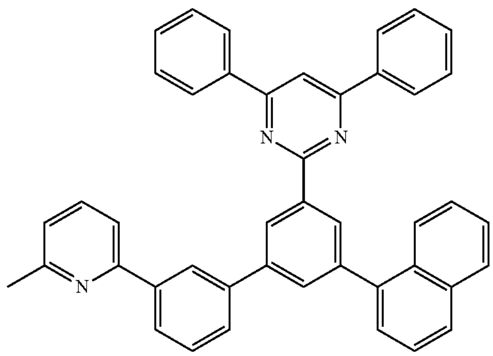
E-74
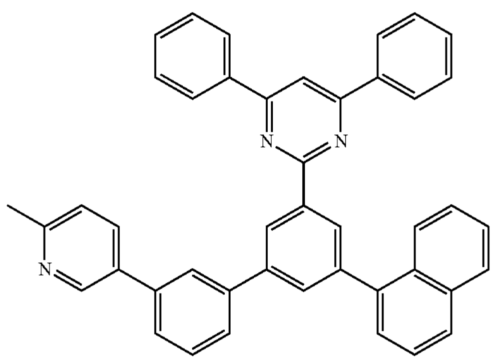
E-75
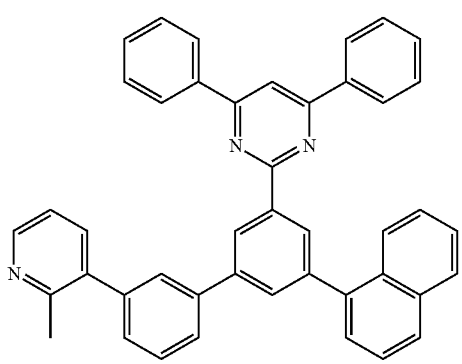
E-76
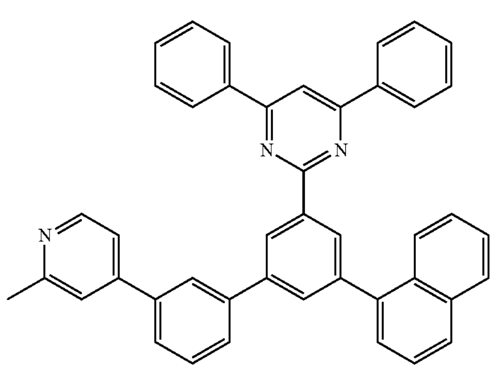
-continued
E-77
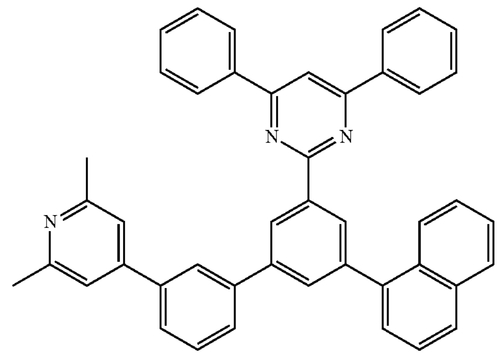
E-78
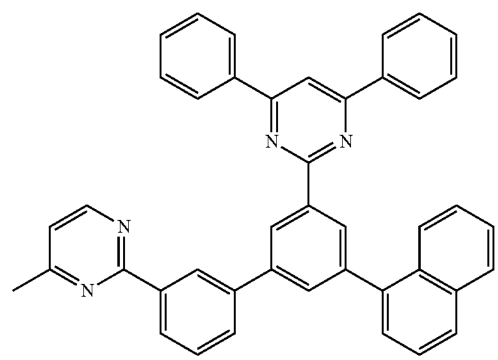
E-79
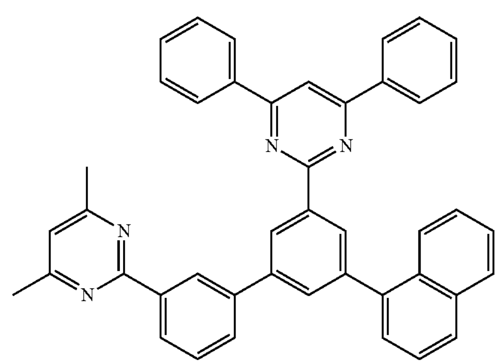
E-80
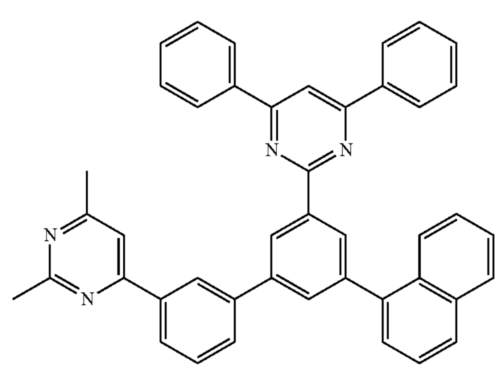

E-81
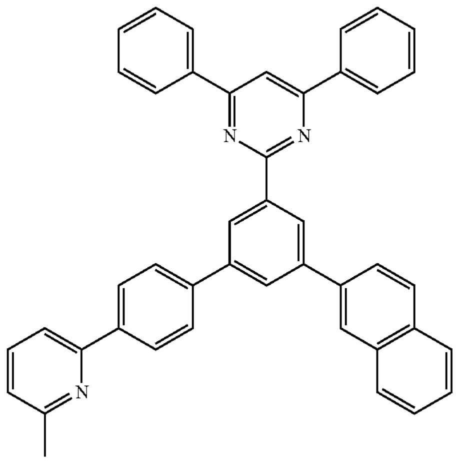
E-82
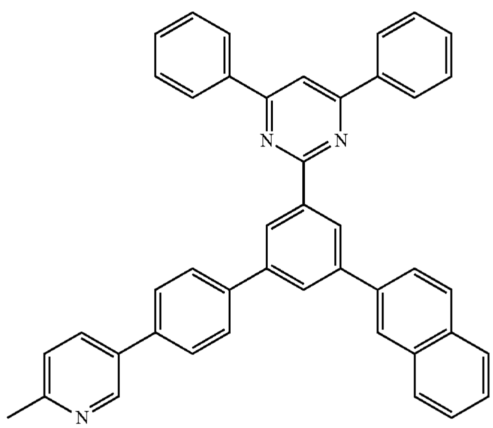
E-83
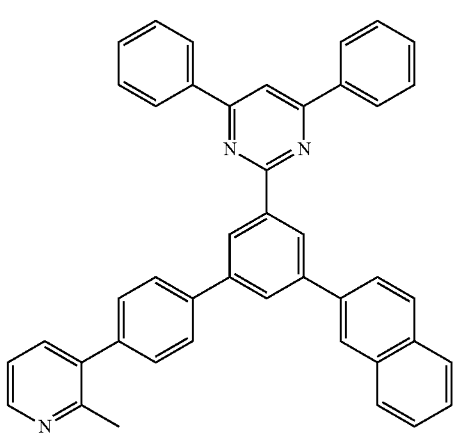
E-84
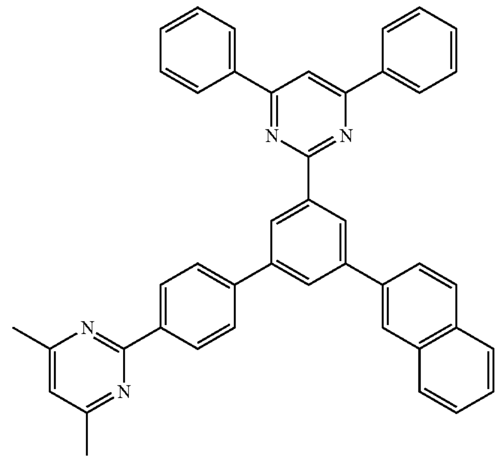
E-85
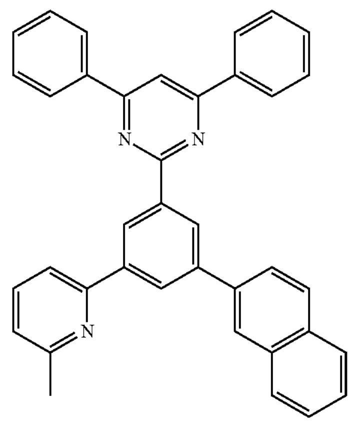
E-86
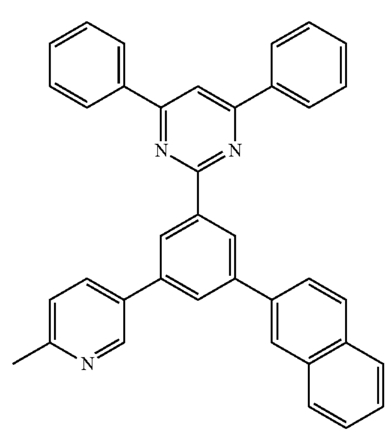

-continued
E-87
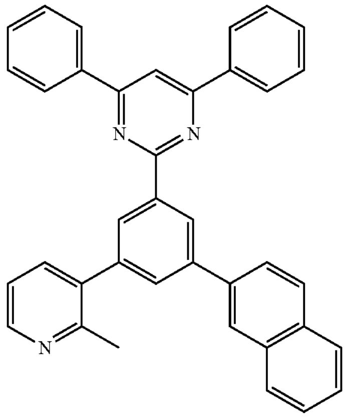
E-88
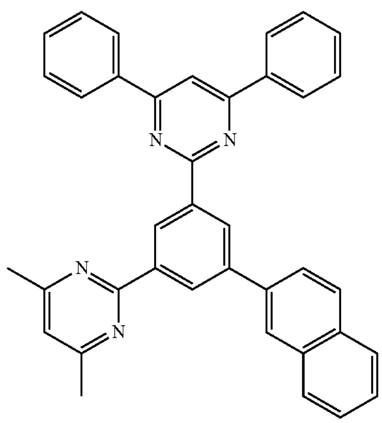
E-89
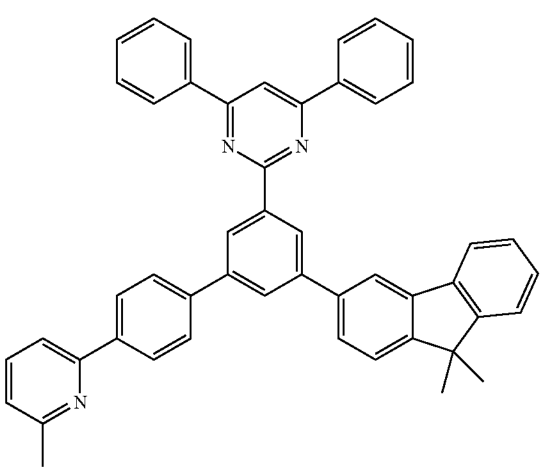
-continued
E-90
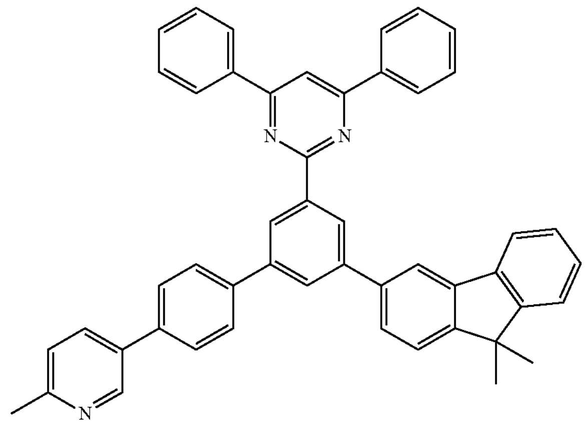
E-91
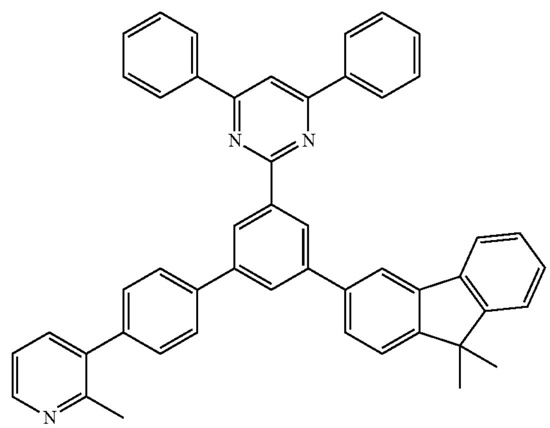
E-92
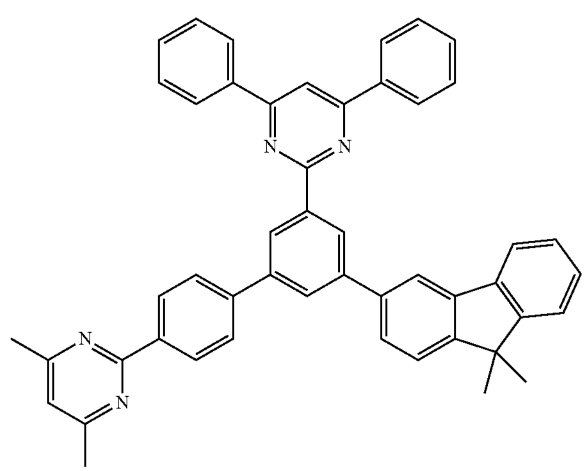

-continued
E-93
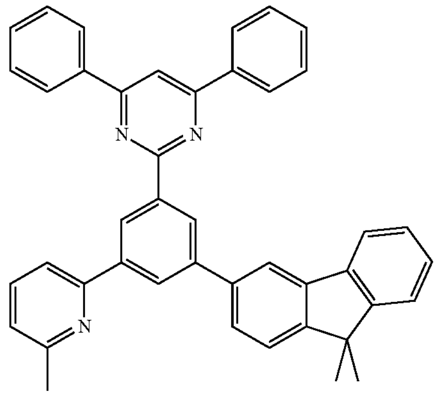
E-94
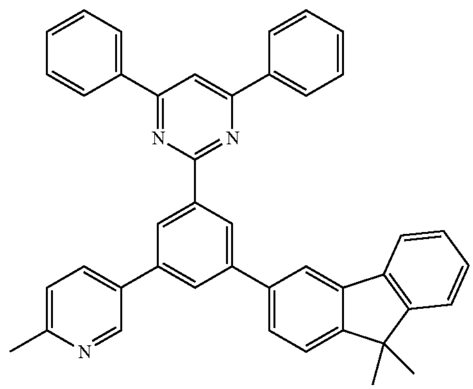
E-95
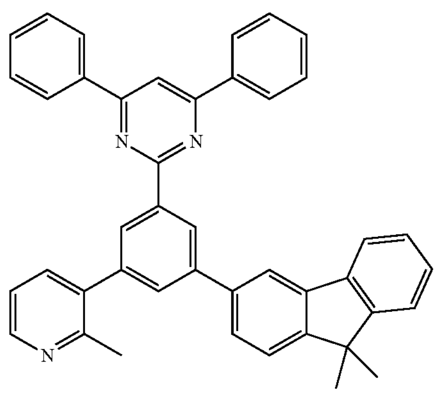
E-96
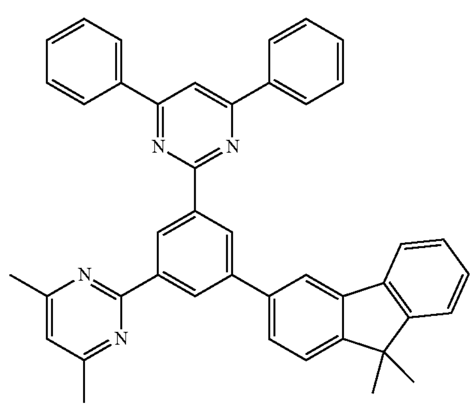
-continued
E-97
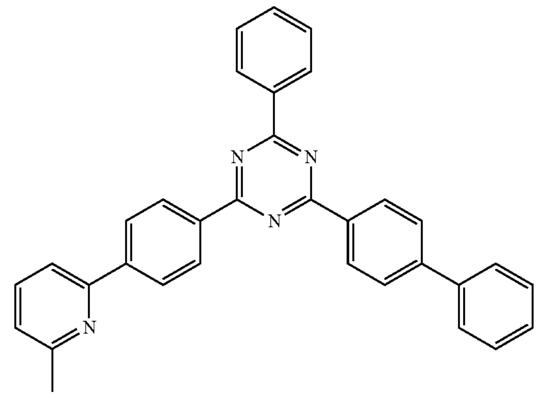
E-98
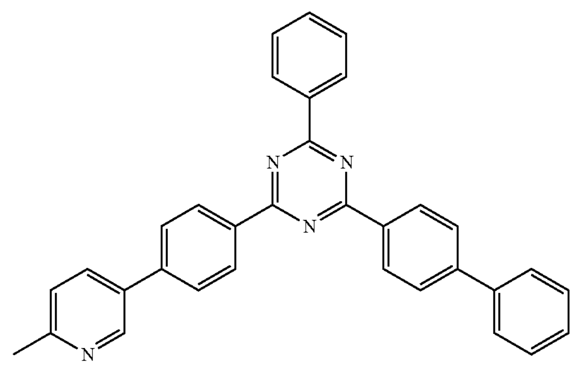
E-99
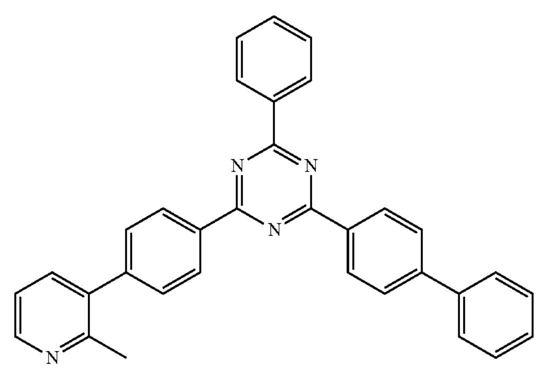
E-100
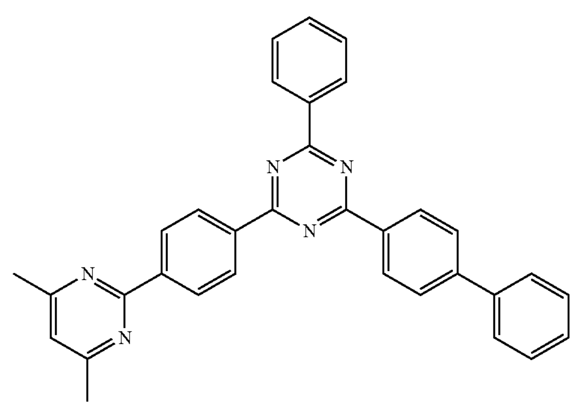

-continued
E-101
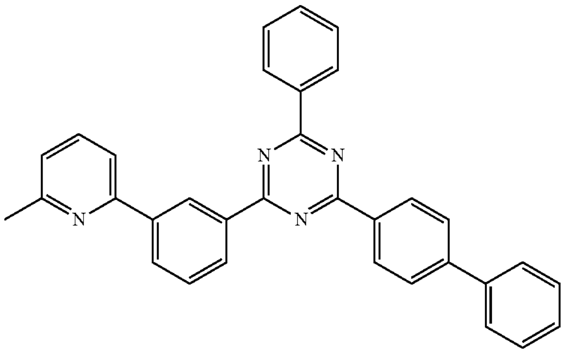
E-102
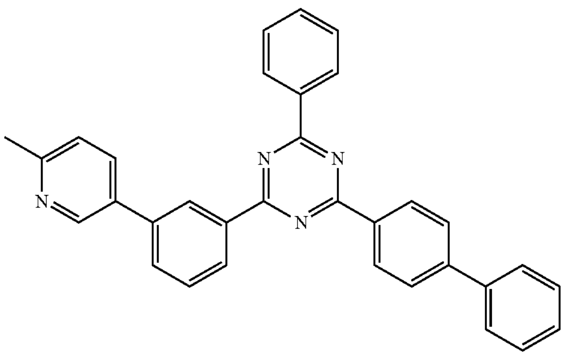
E-103
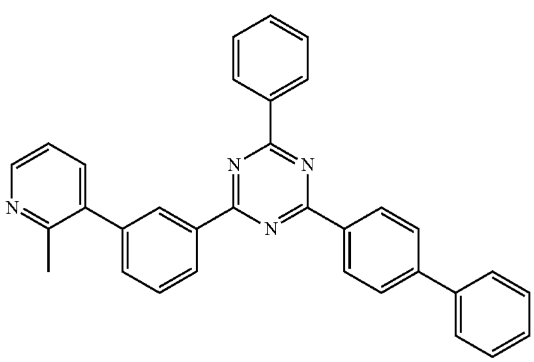
E-104
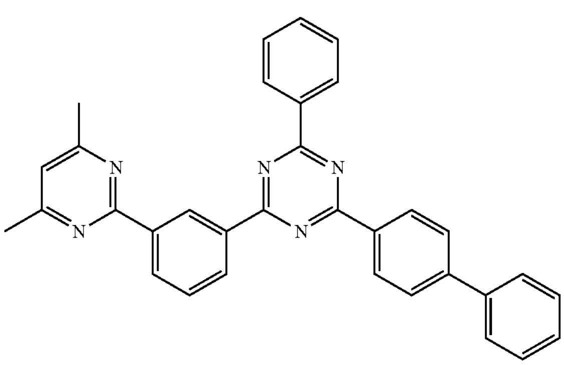
-continued
E-105
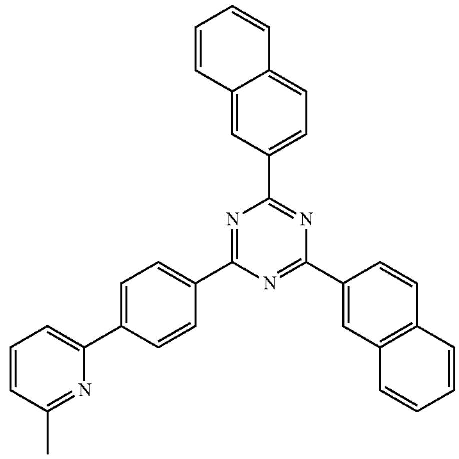
E-106
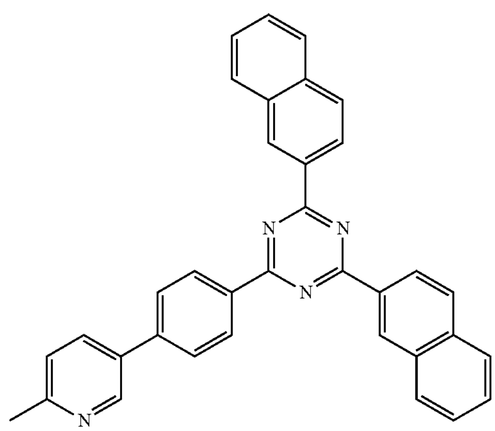
E-107
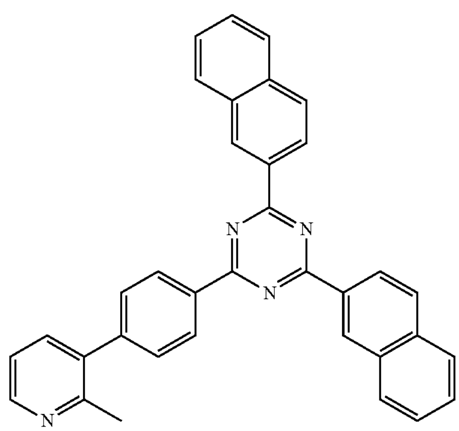

-continued
E-108
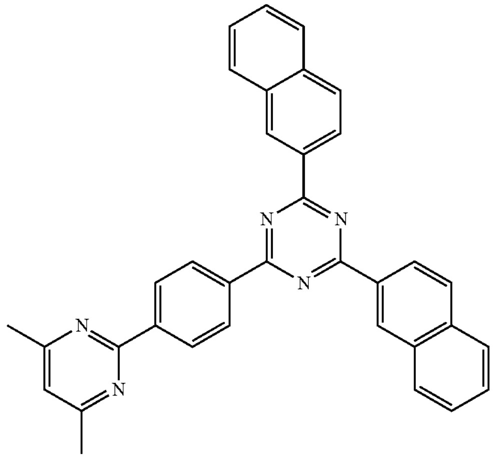
E-109
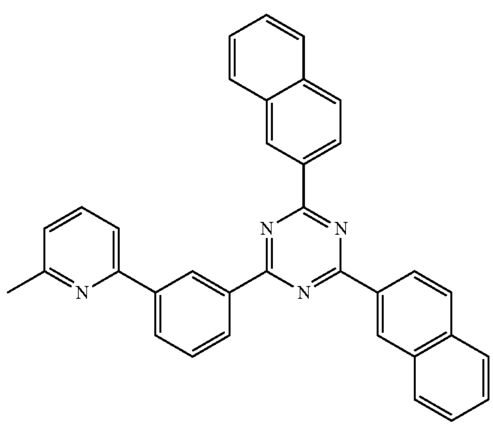
E-110
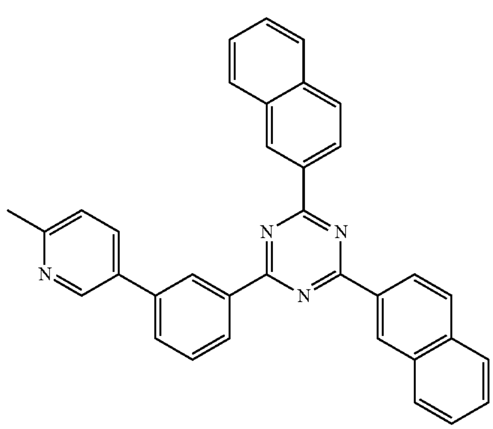
-continued
E-111
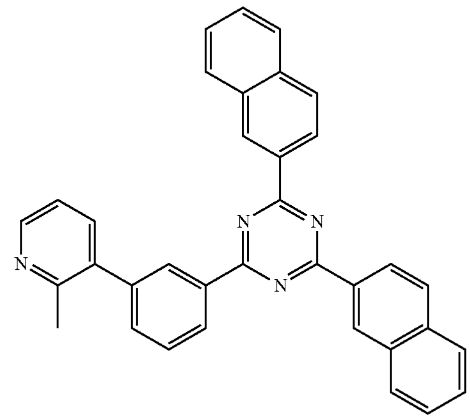
E-112
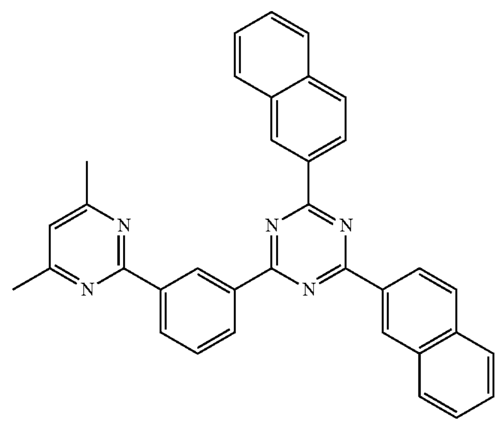
E-113
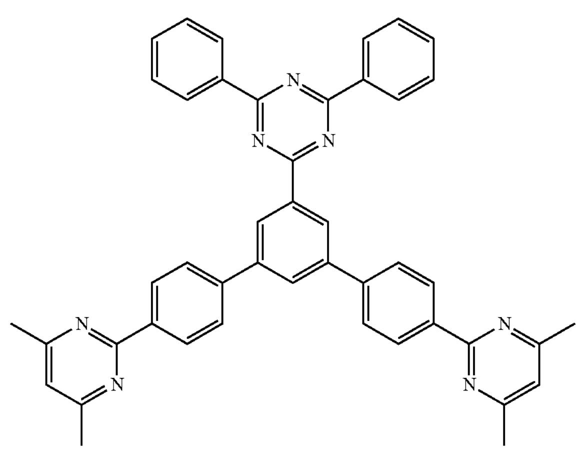

-continued
E-114
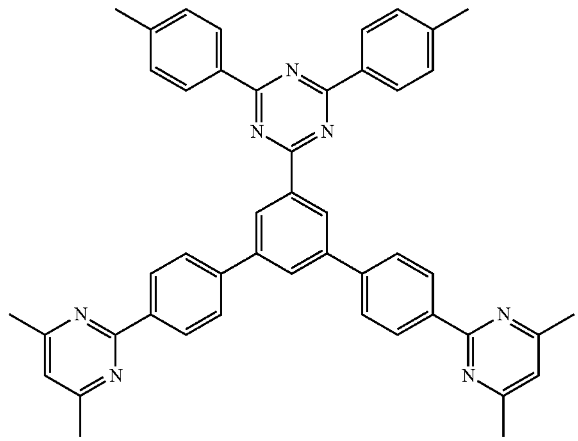
E-115
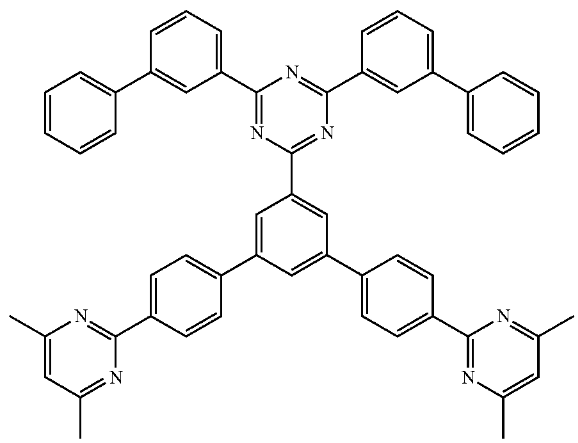
E-116
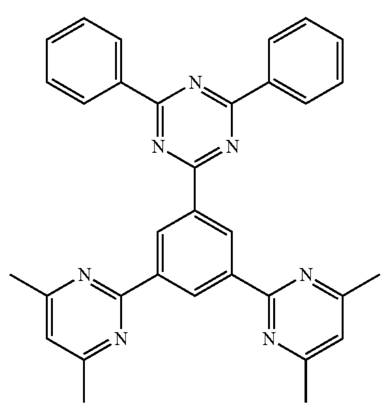
-continued
E-117
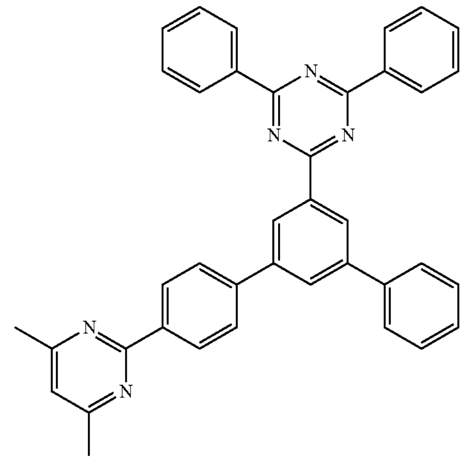
E-118
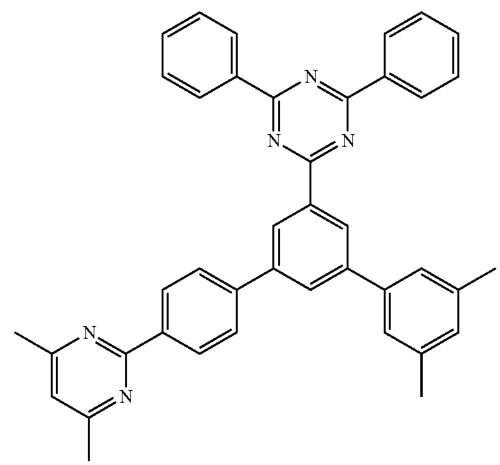
E-119
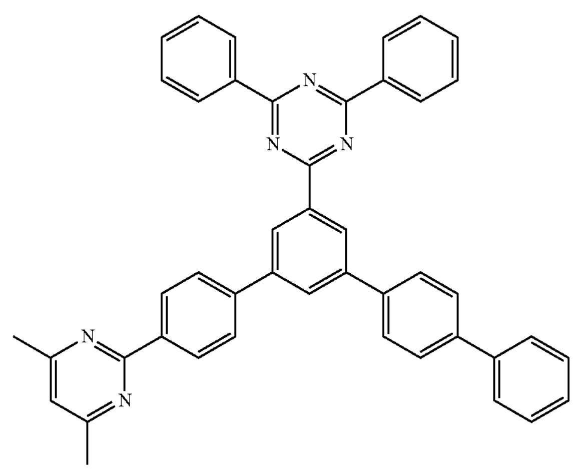

-continued
E-120
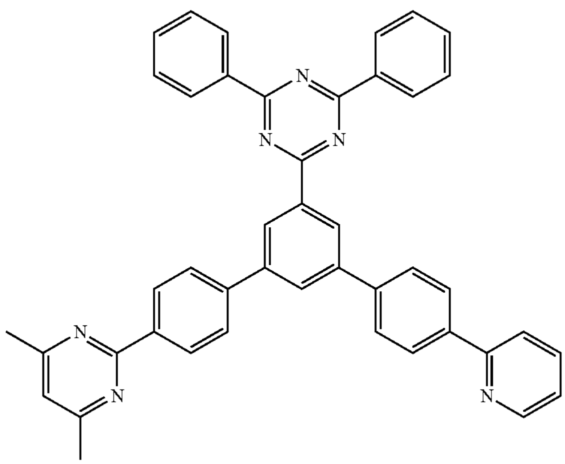
E-121
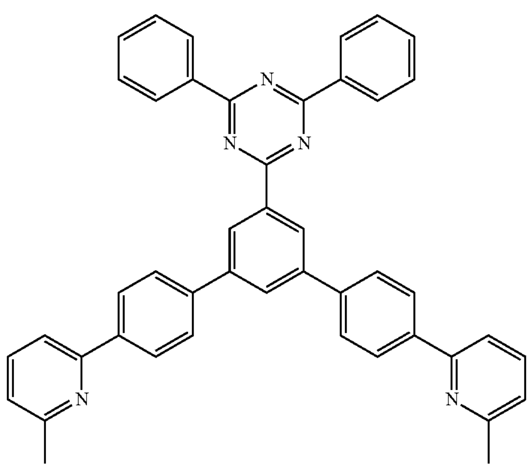
E-122
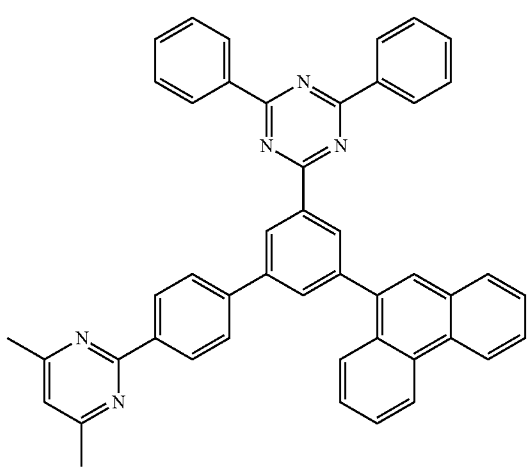
-continued
E-123
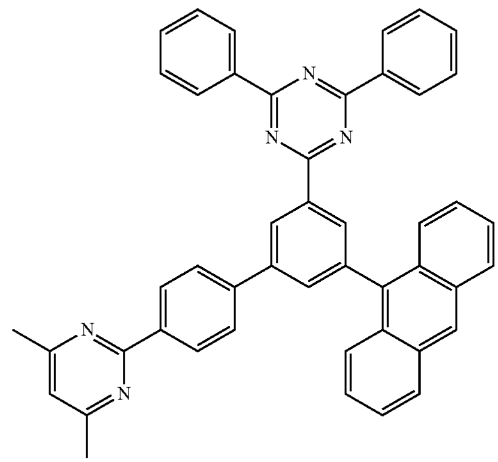
E-124
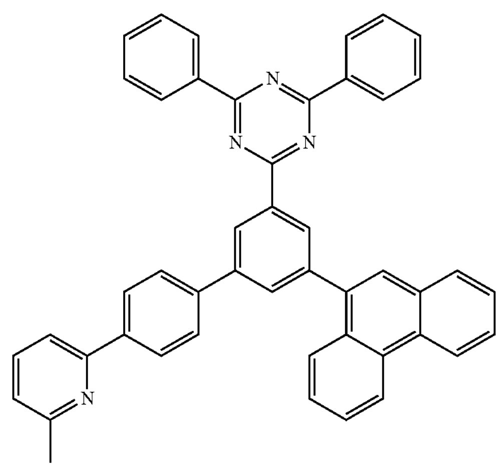
E-125
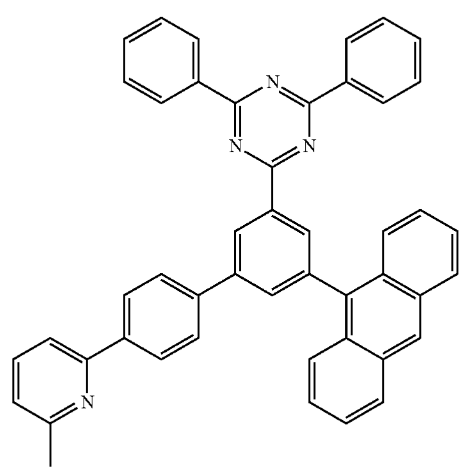

-continued
E-126
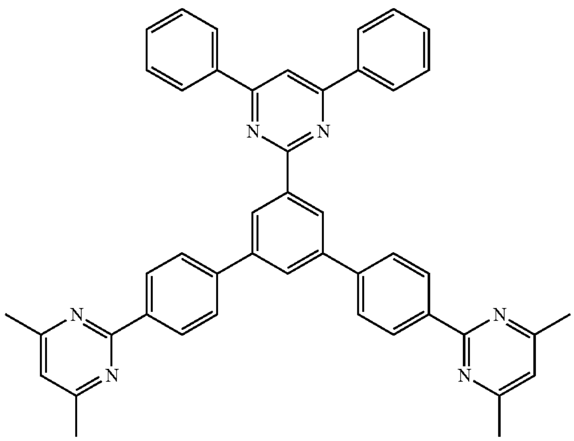
E-127
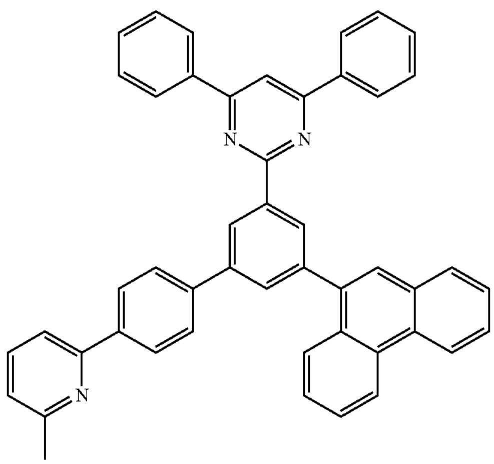
E-128
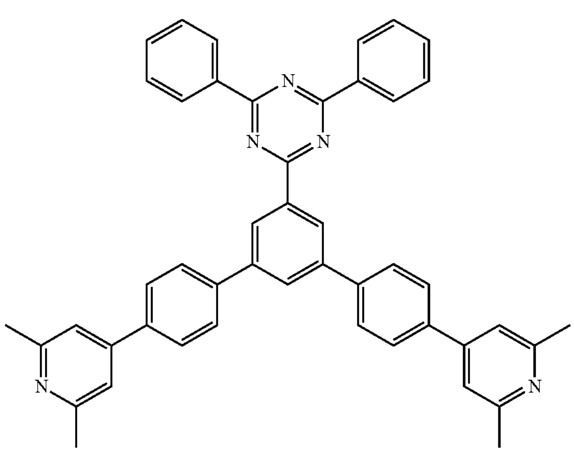
-continued
E-129
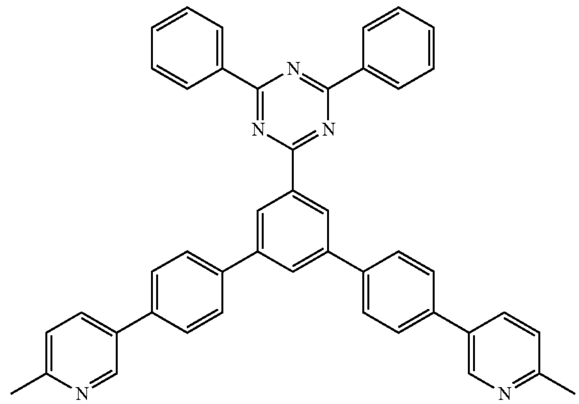
E-130
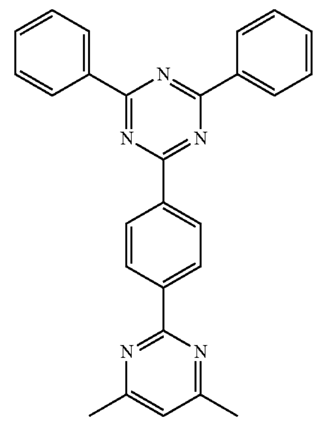
E-131
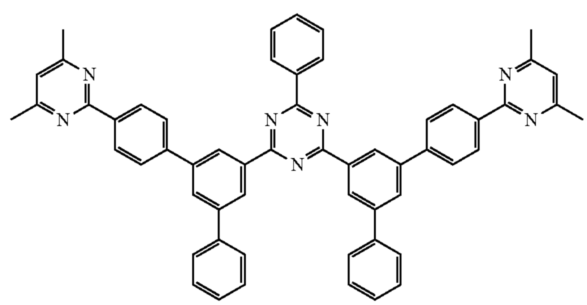
E-132
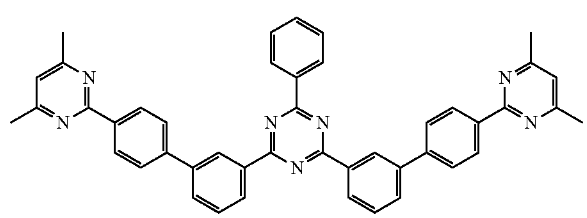

-continued
E-133
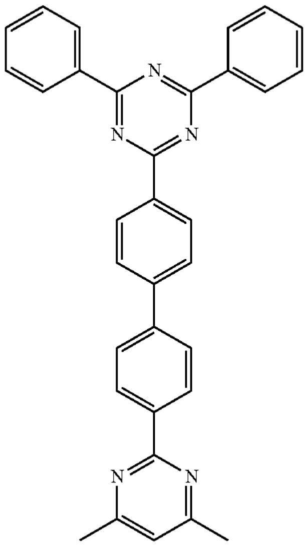
E-134
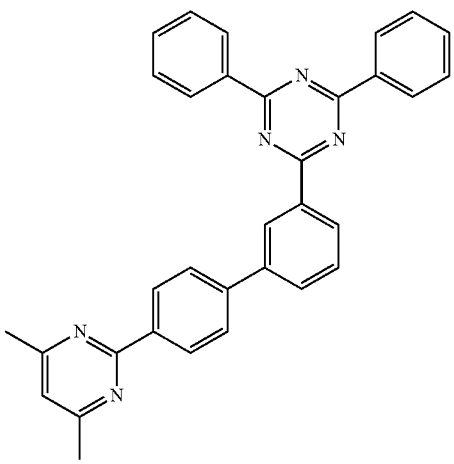
E-135
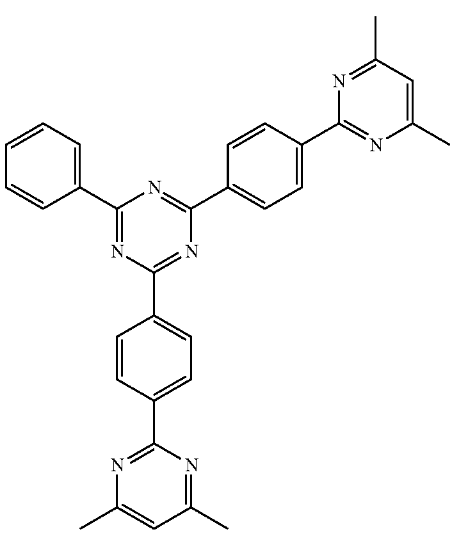
-continued
E-136
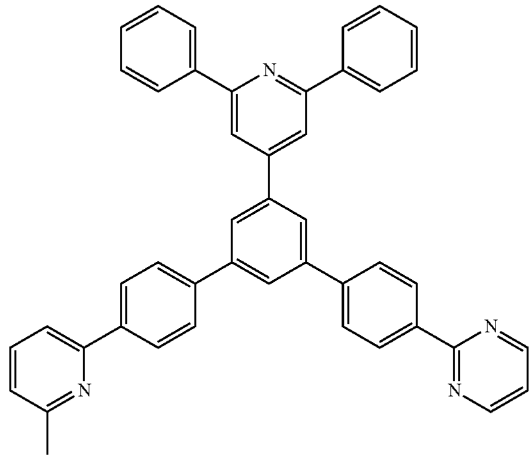
E-137
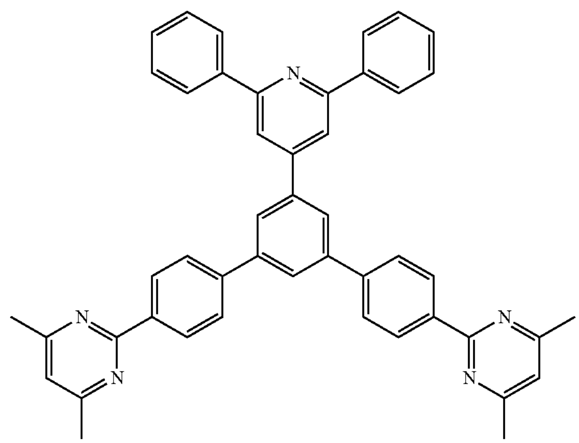
E-138
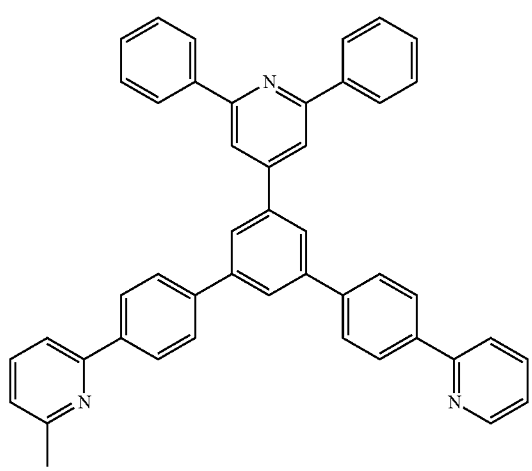

-continued
E-139
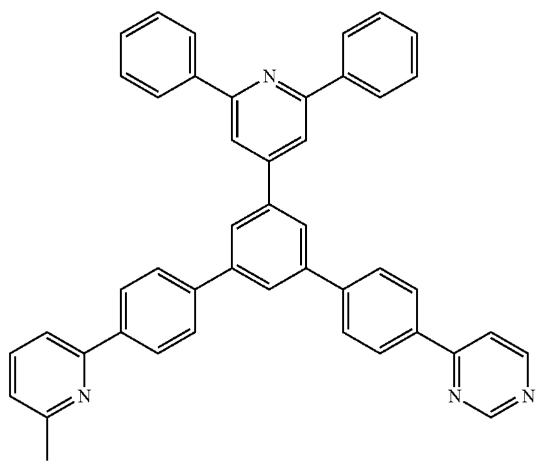
E-140
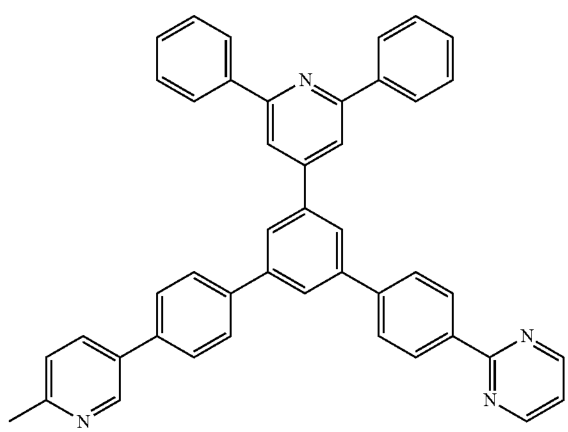
E-141
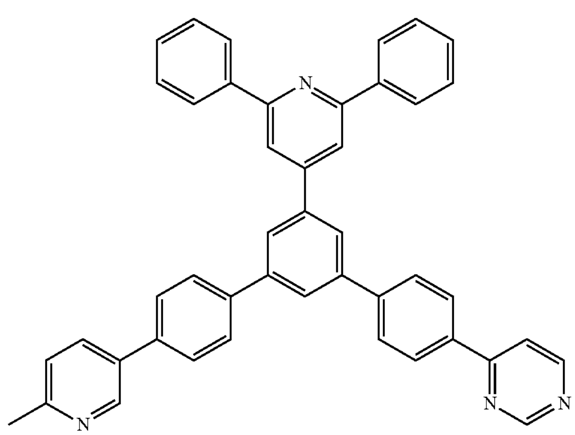
-continued
E-142
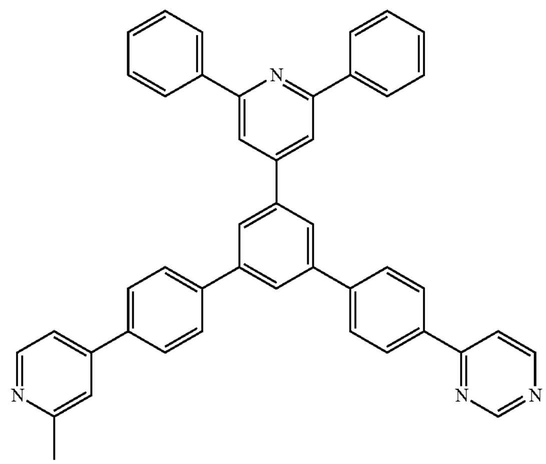
E-143
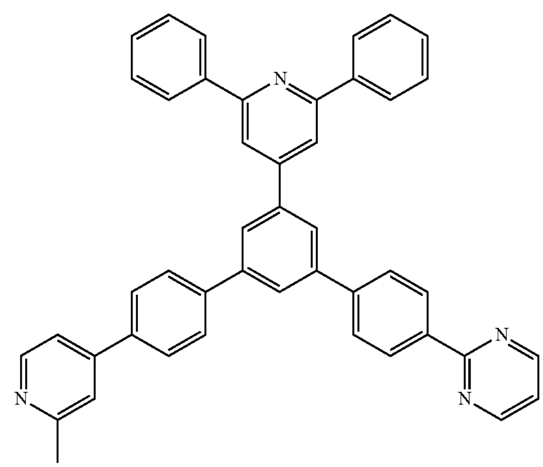
E-144
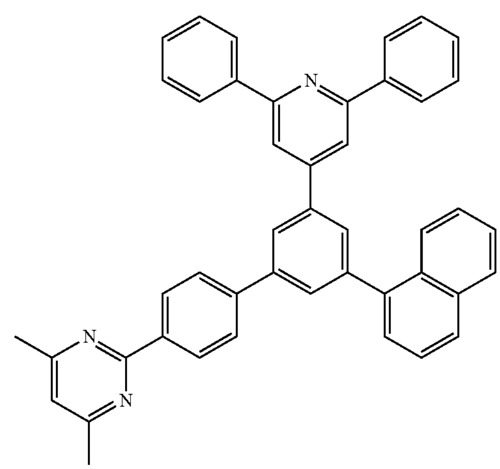

-continued
E-145
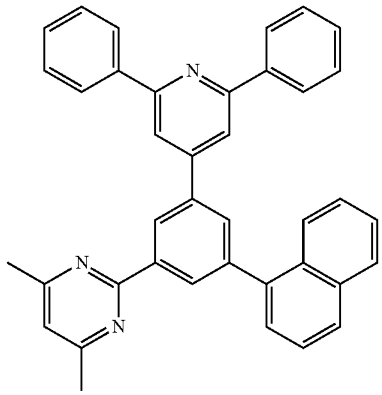
E-146
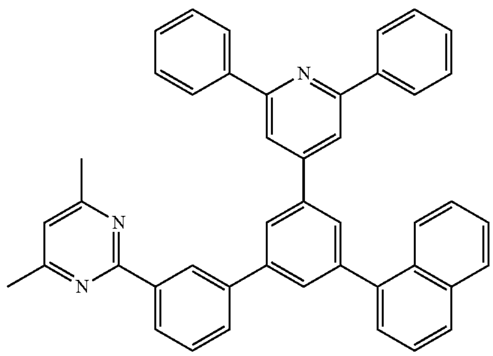
E-147
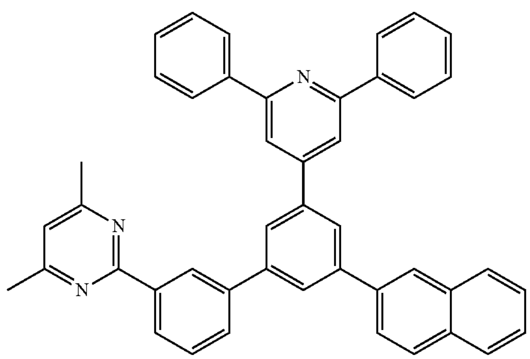
E-148
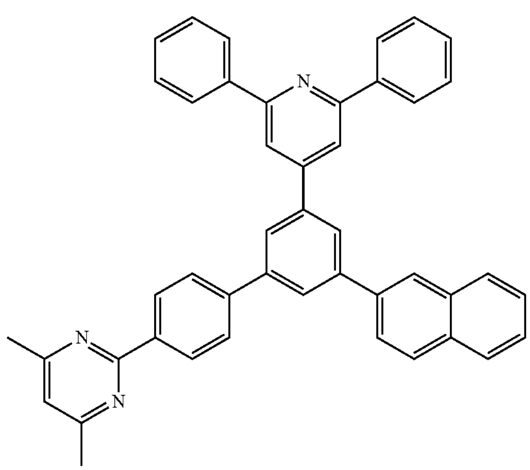
-continued
E-149
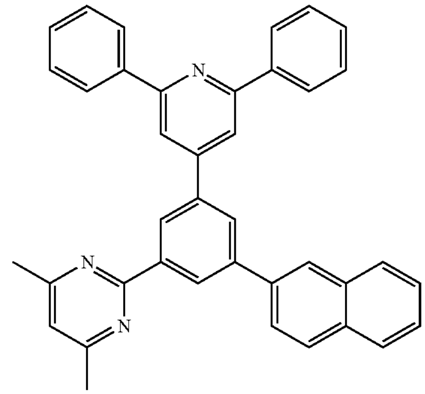
E-150
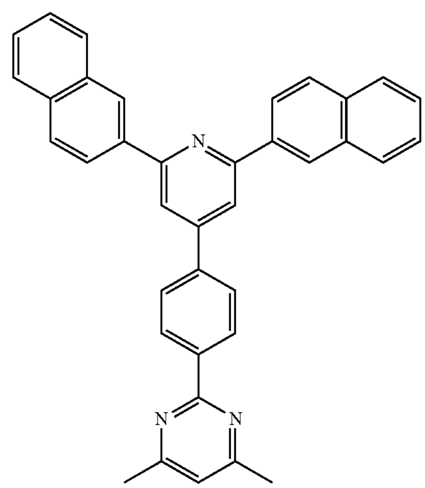
E-151
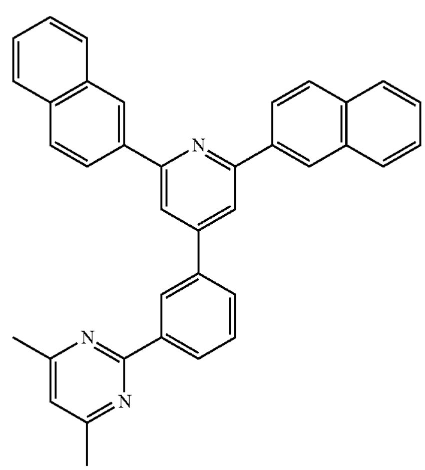

-continued
E-152
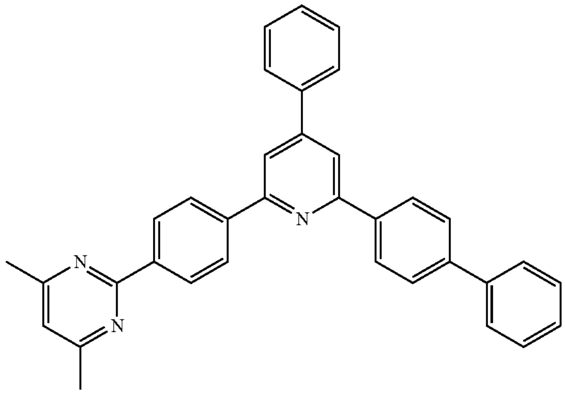
E-153
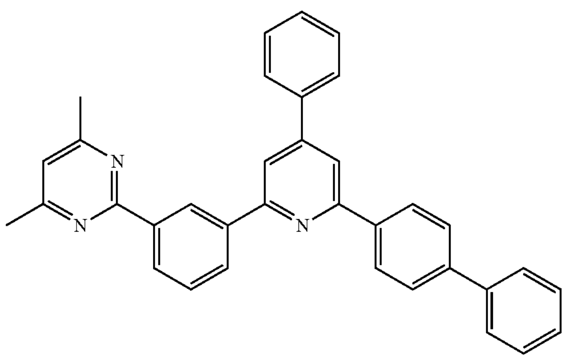
E-154
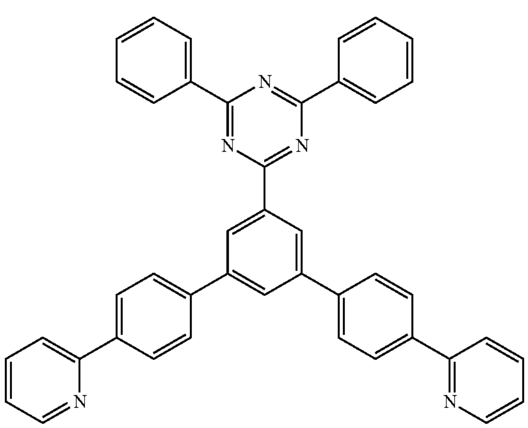
-continued
E-155
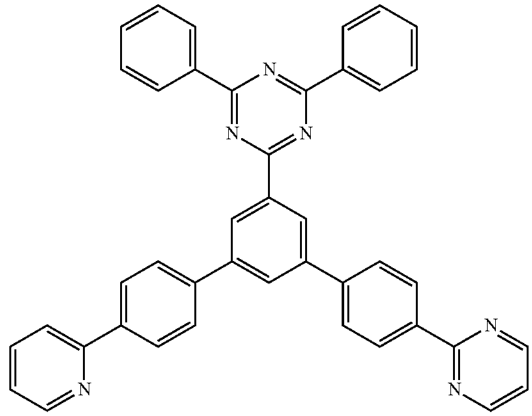
E-156
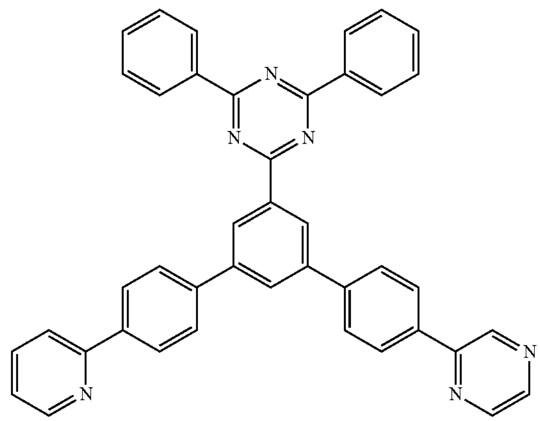
E-157
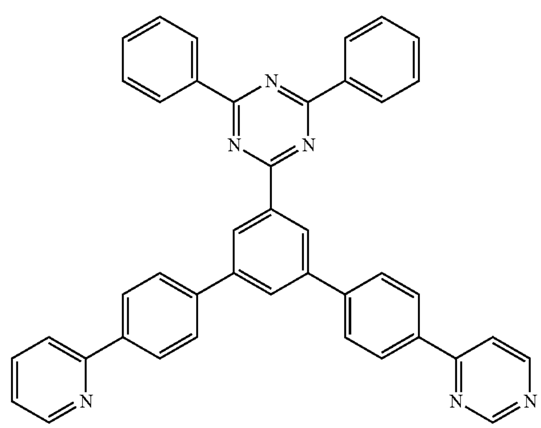

-continued
E-158
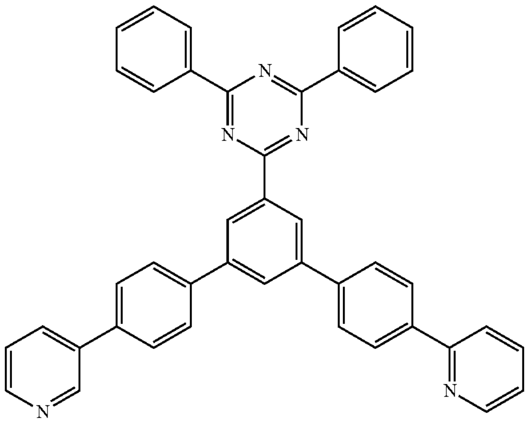
E-159
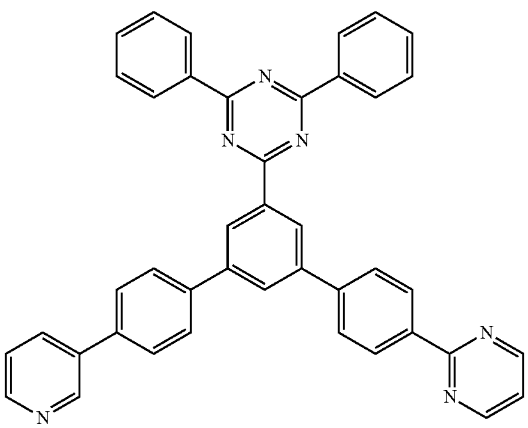
E-160
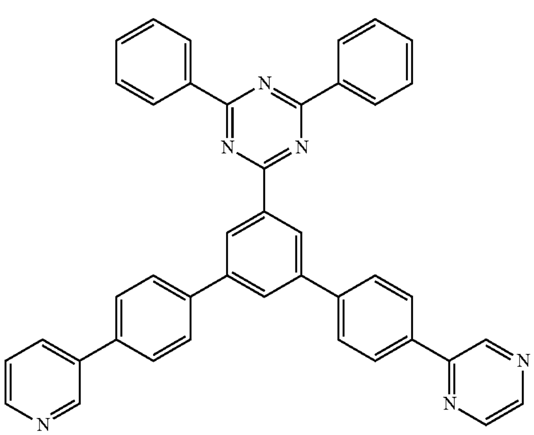
-continued
E-161
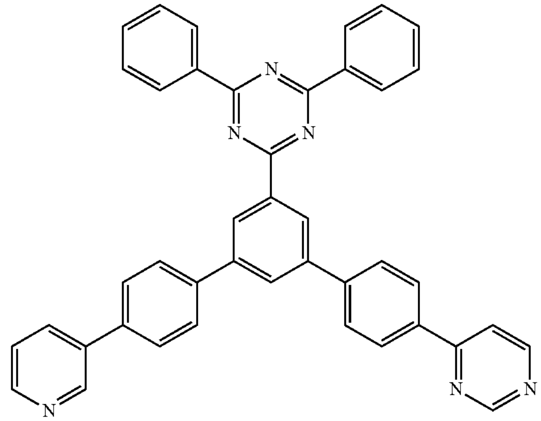
E-162
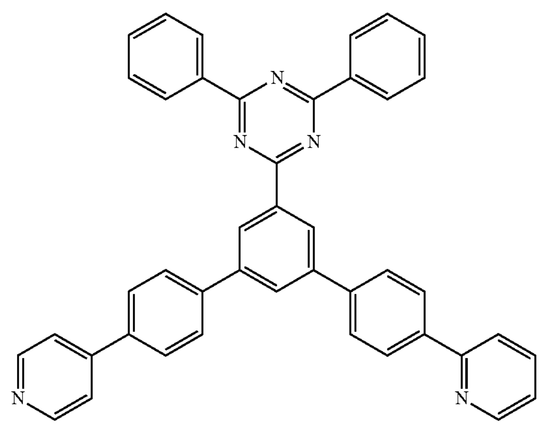
E-163
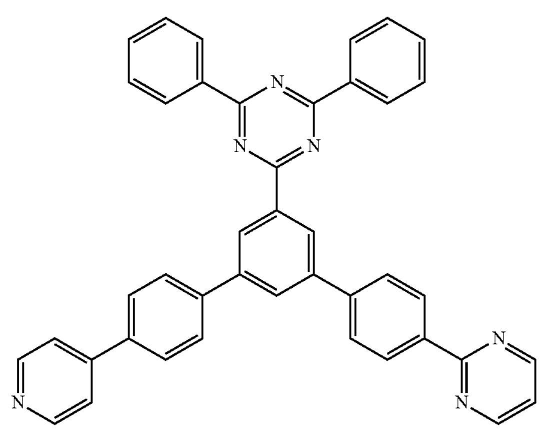

-continued
E-164
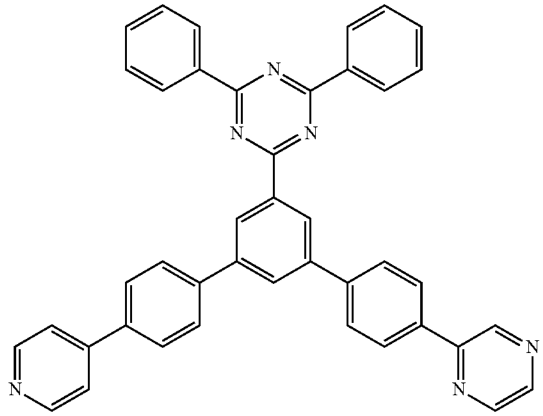
E-165
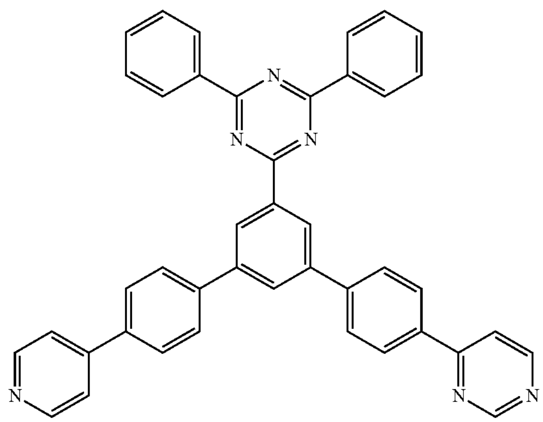
E-166
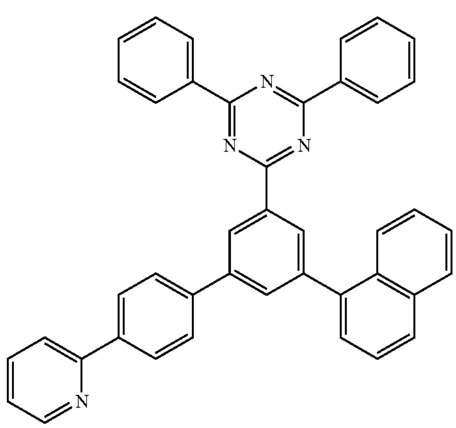
-continued
E-167
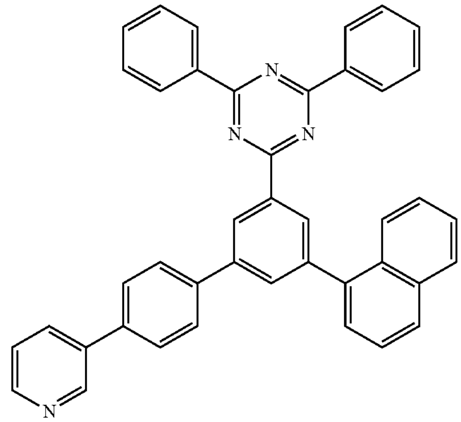
E-168
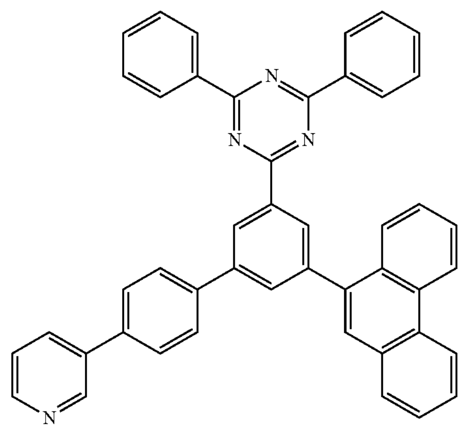
E-169
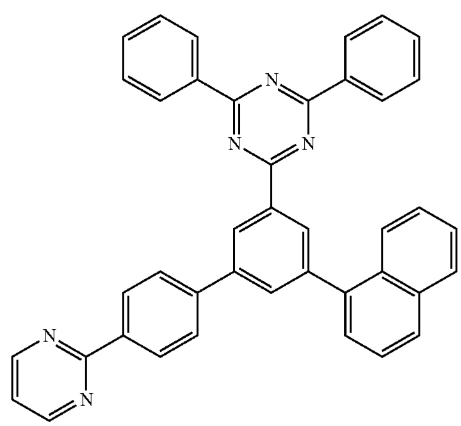

-continued
E-170
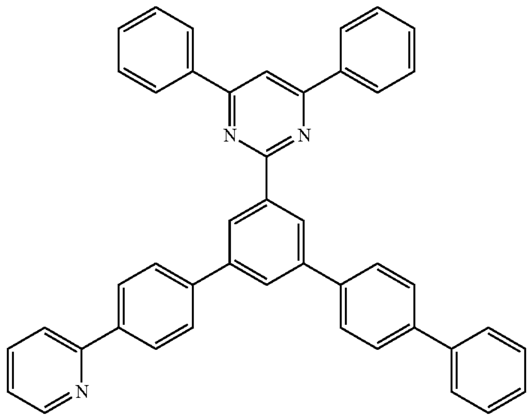
E-171
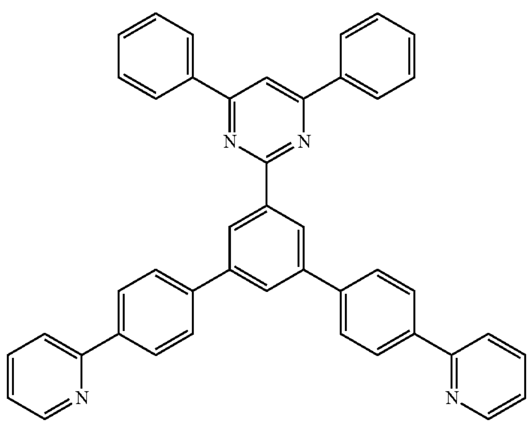
E-172
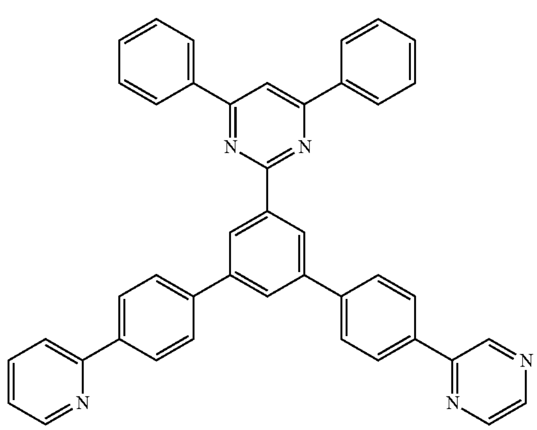
-continued
E-173
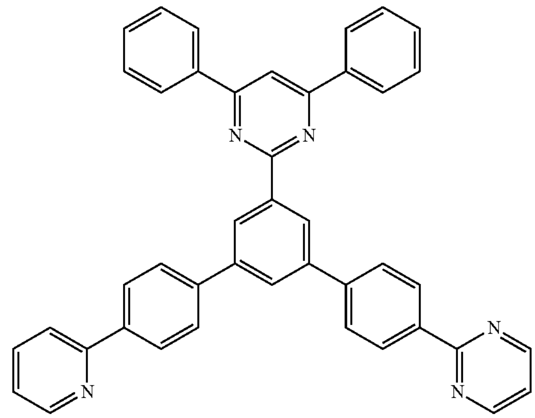
E-174
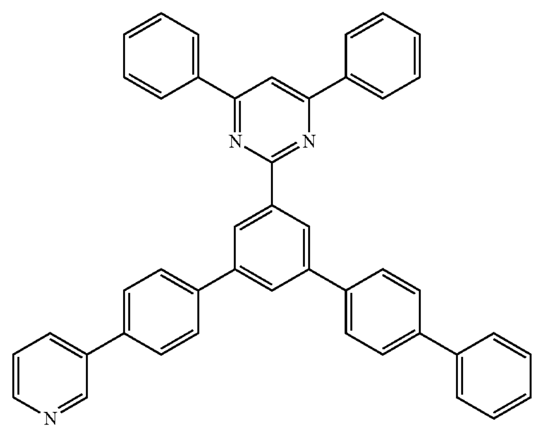
E-175
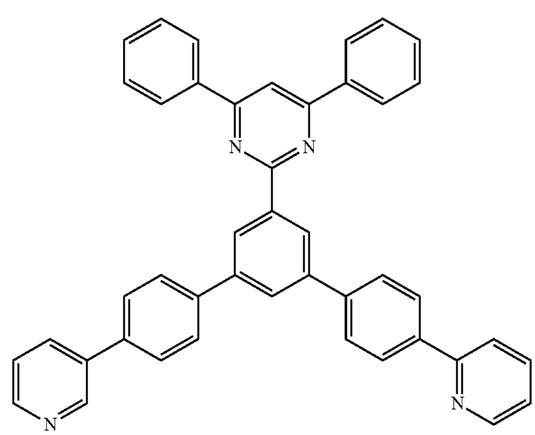

-continued
E-176
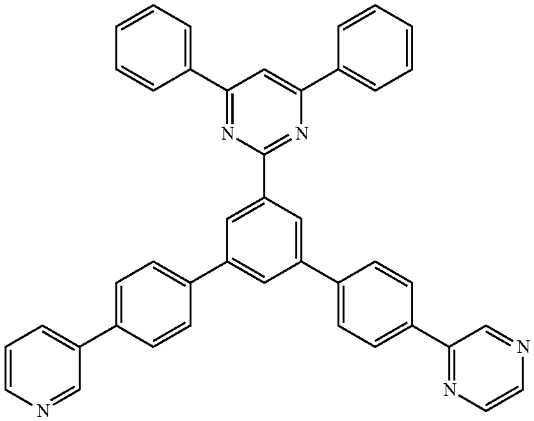
E-177
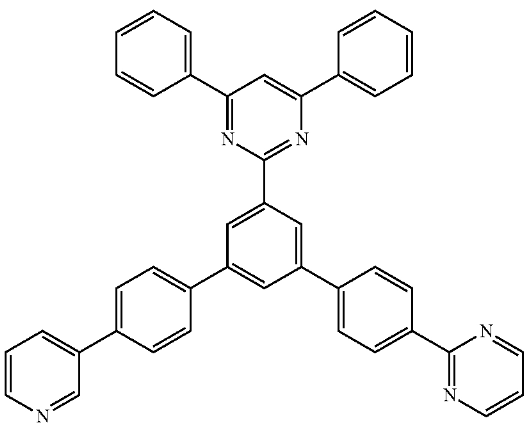
E-178
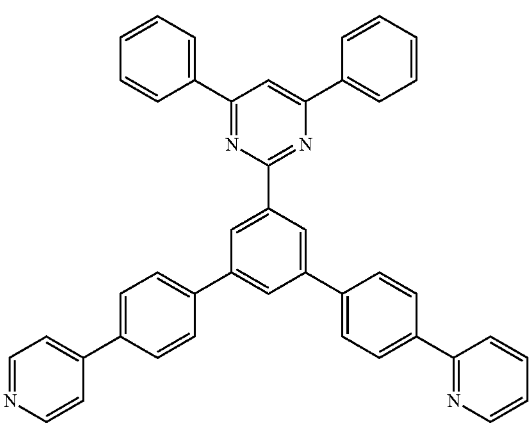
-continued
E-179
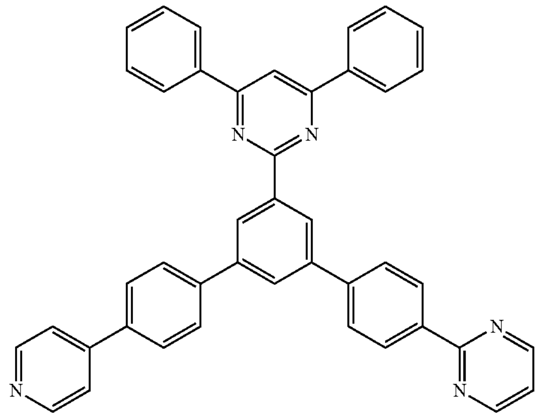
E-180
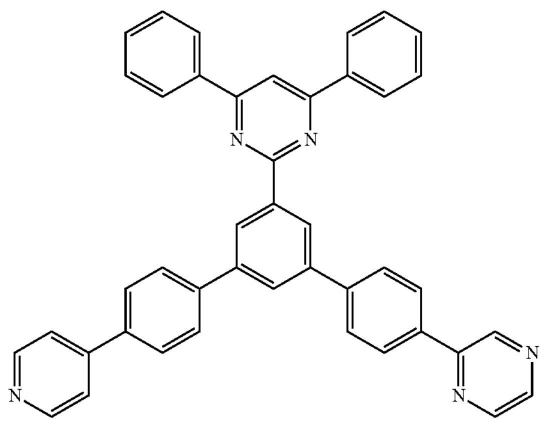
E-181
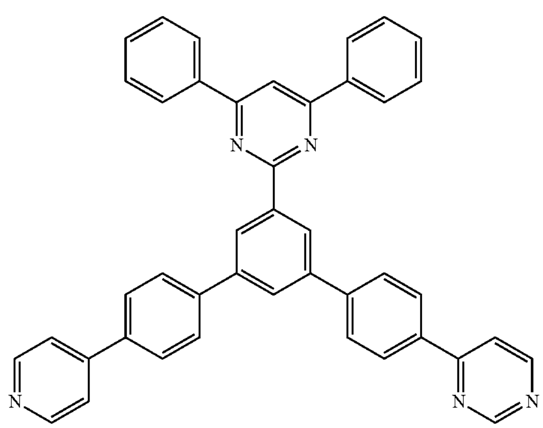

-continued
E-182
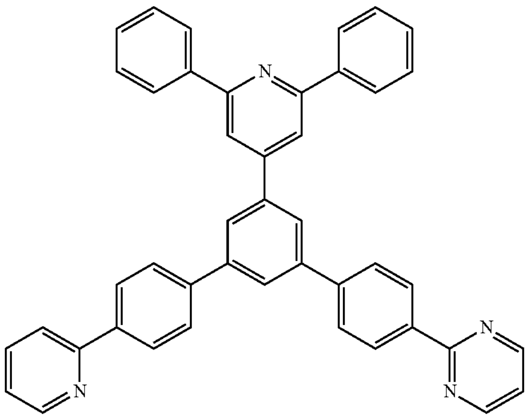
E-183
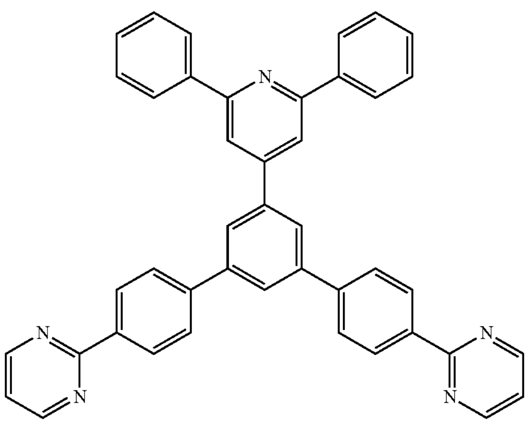
E-184
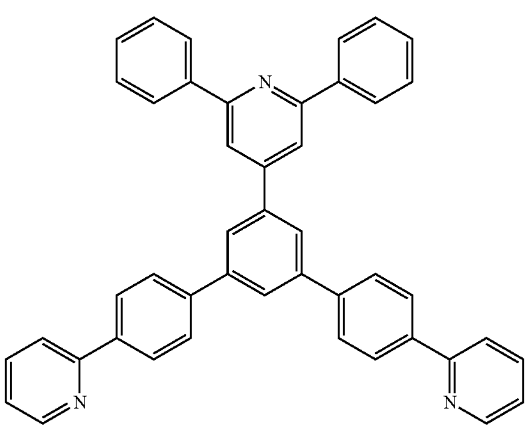
-continued
E-185
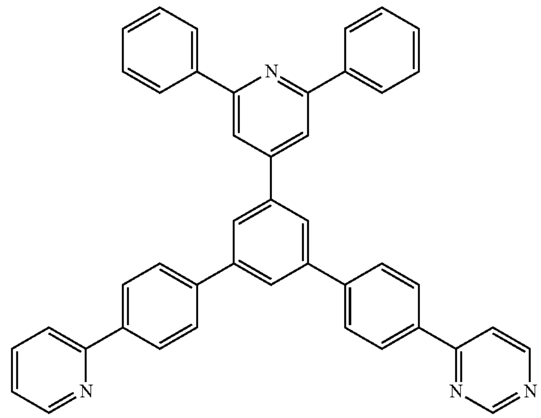
E-186
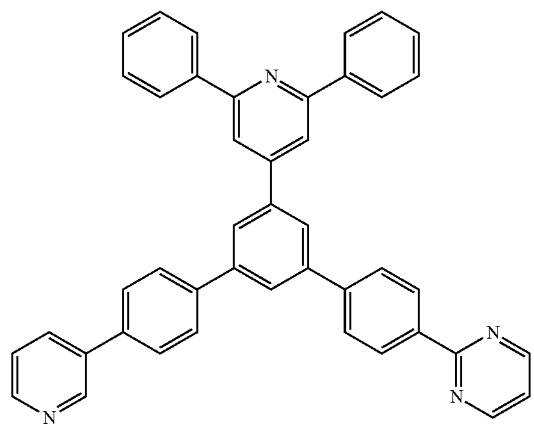
E-187
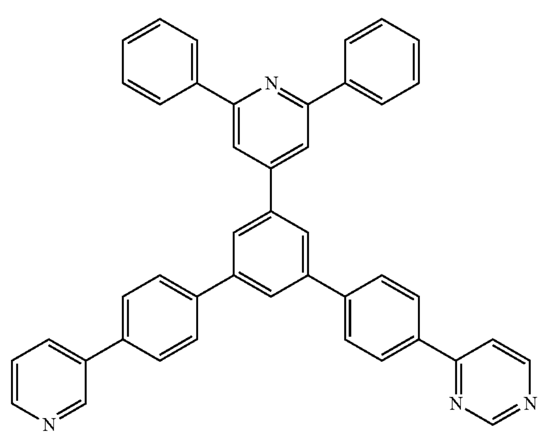

-continued
E-188
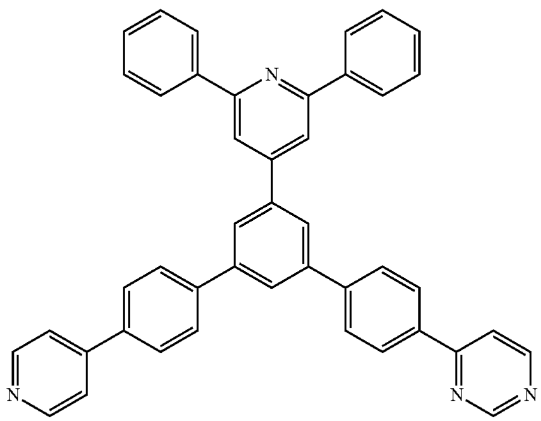
E-189
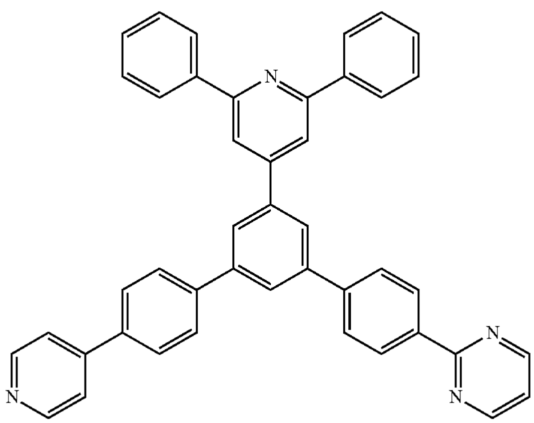
E-191
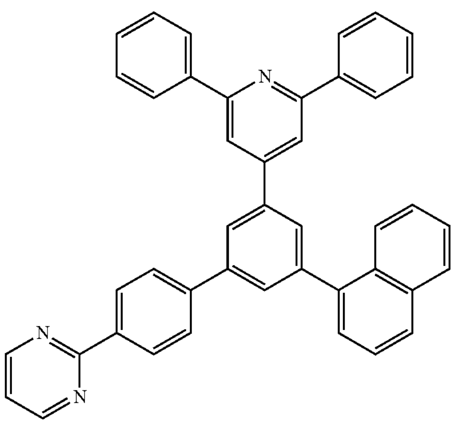
E-192
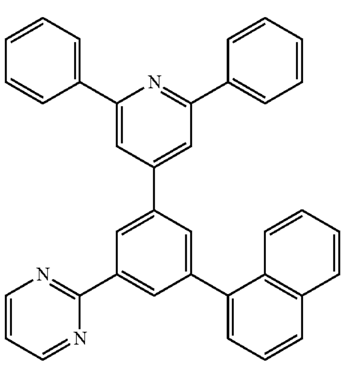
-continued
E-193
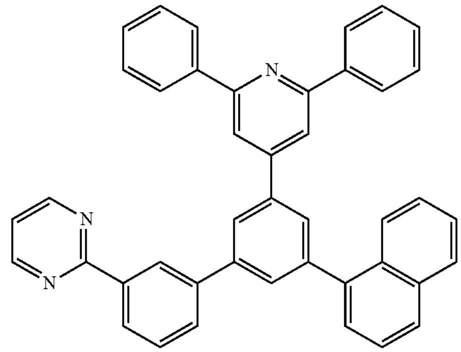
E-194
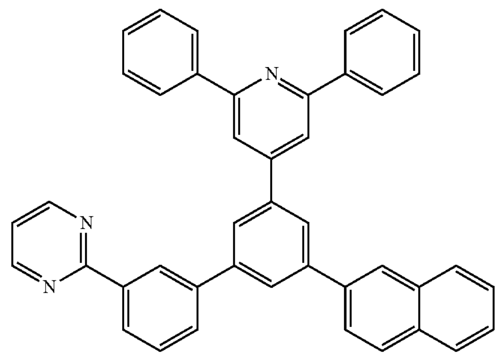
E-195
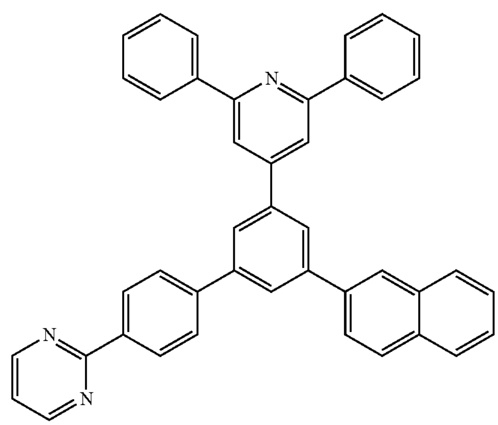
E-196
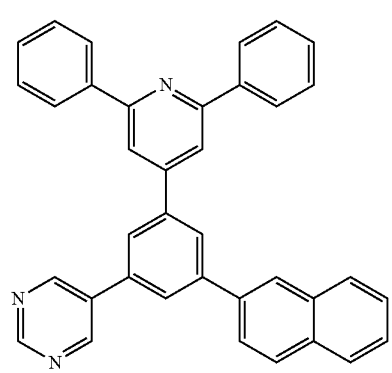

-continued
E-197
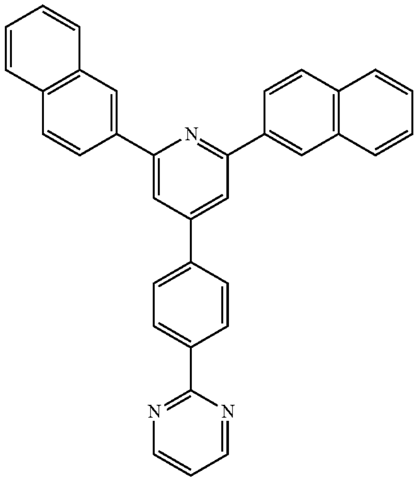
E-198
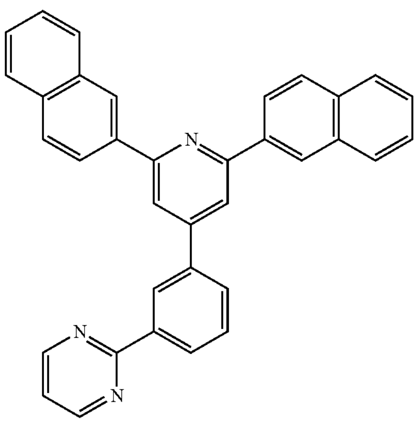
E-199
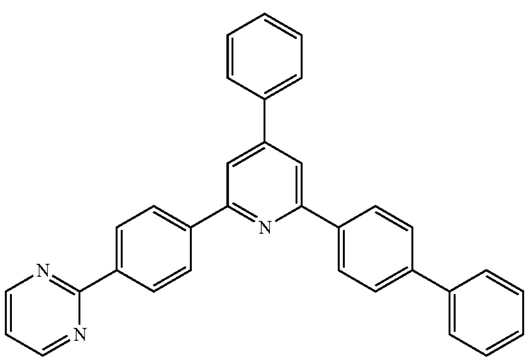
E-200
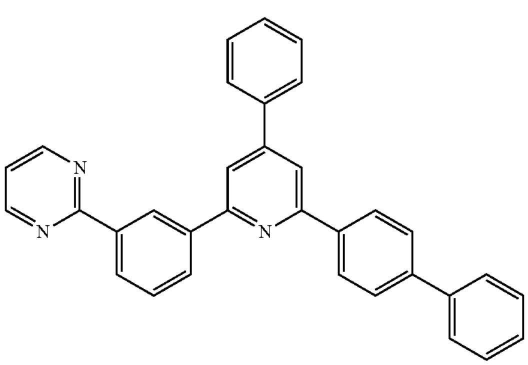
-continued
E-201
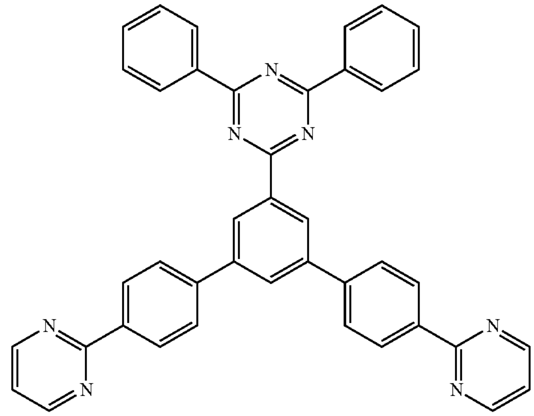
E-202
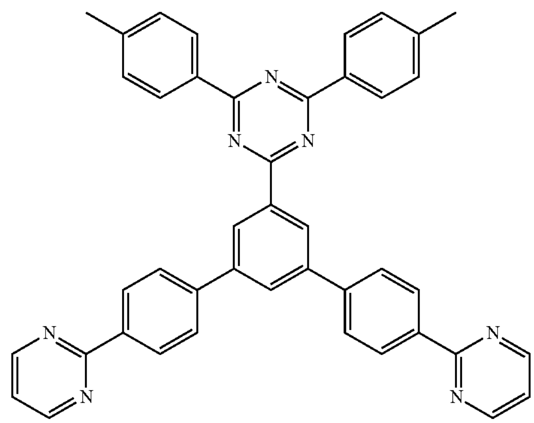
E-203
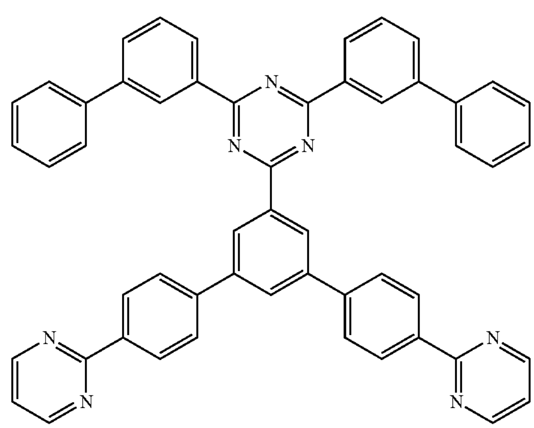

-continued
E-204
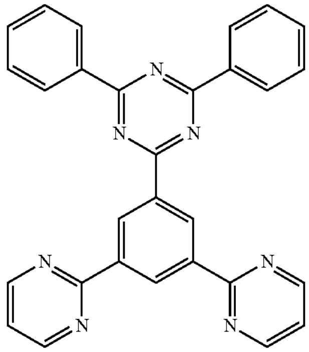
E-205
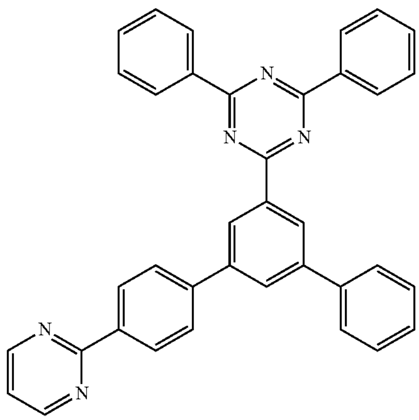
E-206
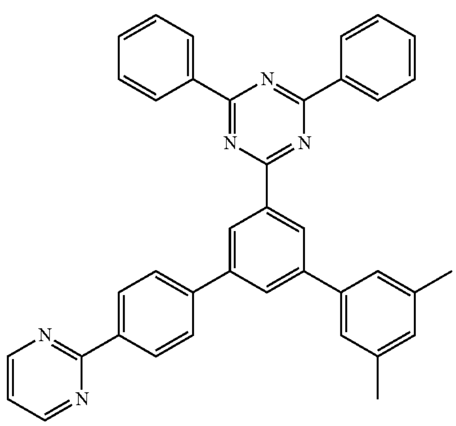
E-207
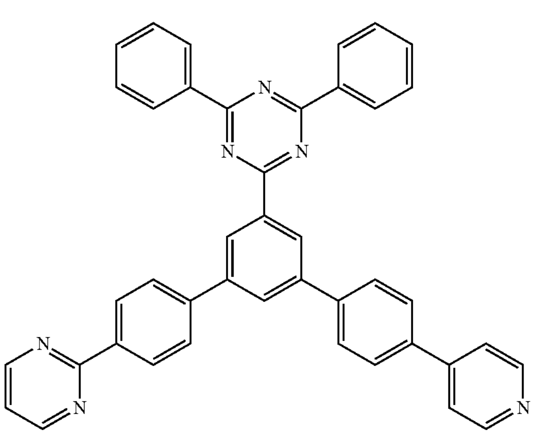
-continued
E-208
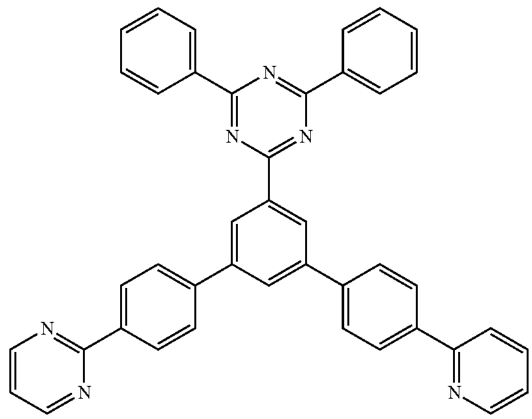
E-209
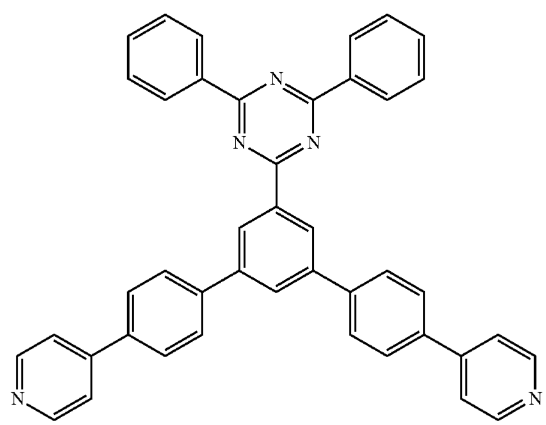
E-210
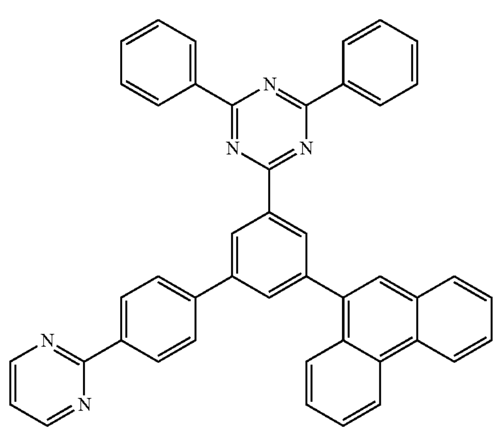

-continued
E-211
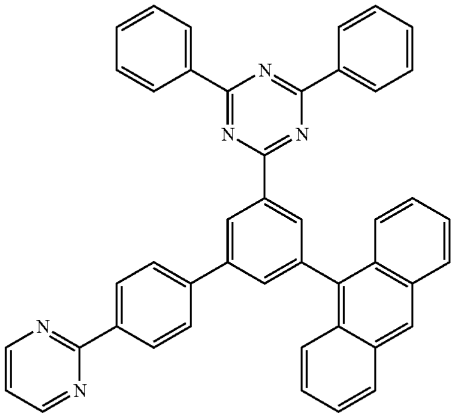
E-212
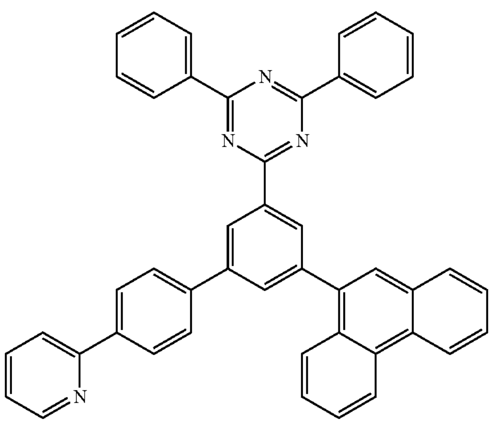
E-213
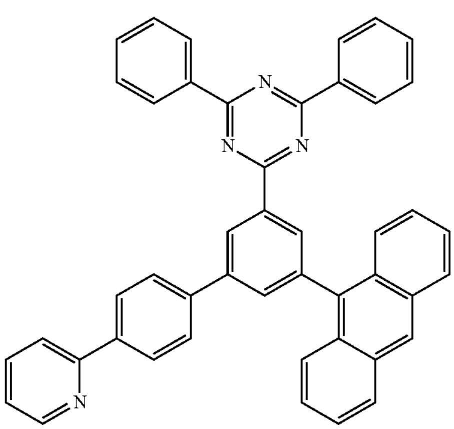
-continued
E-214
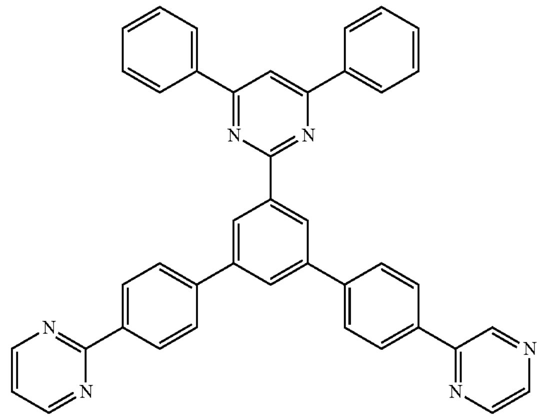
E-215
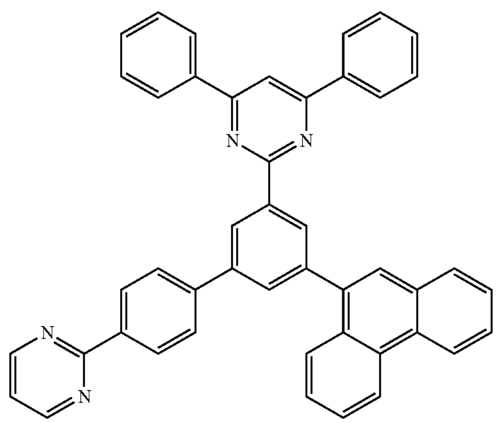
E-216
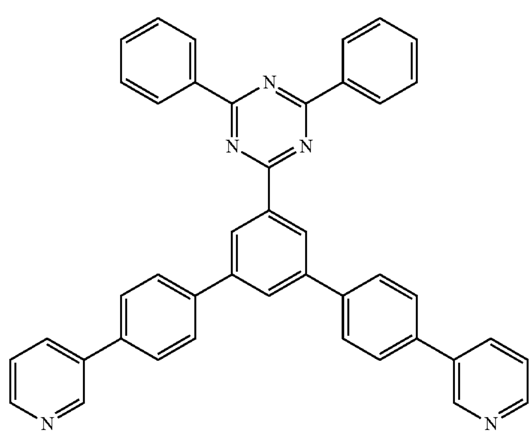

-continued
E-217
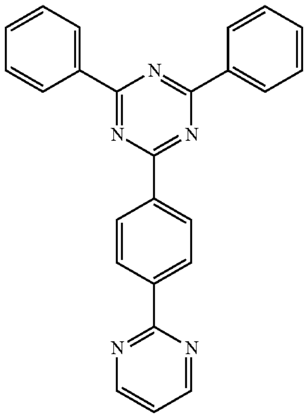
E-218
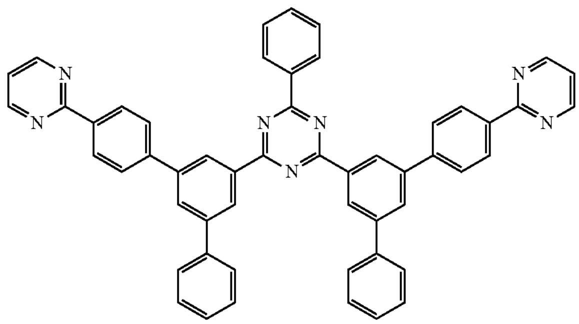
E-219
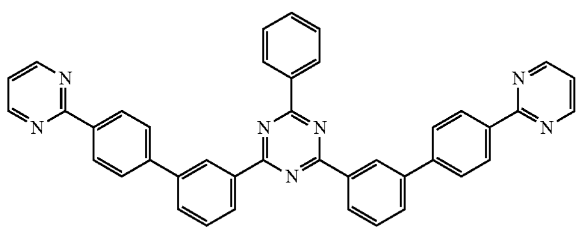
E-220
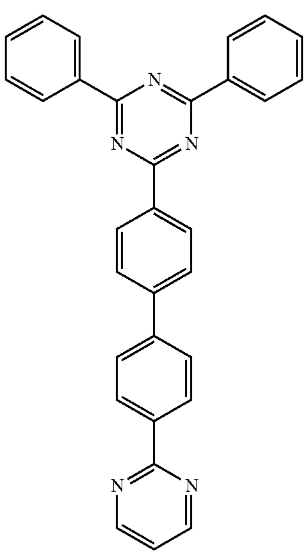
-continued
E-221
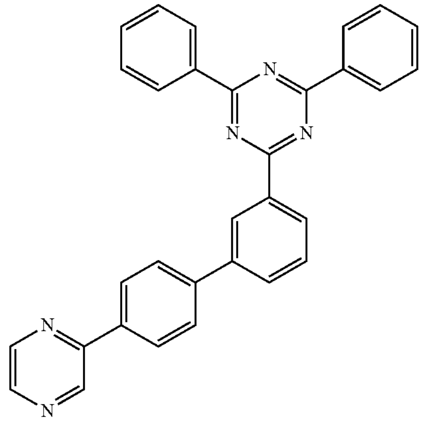
E-222
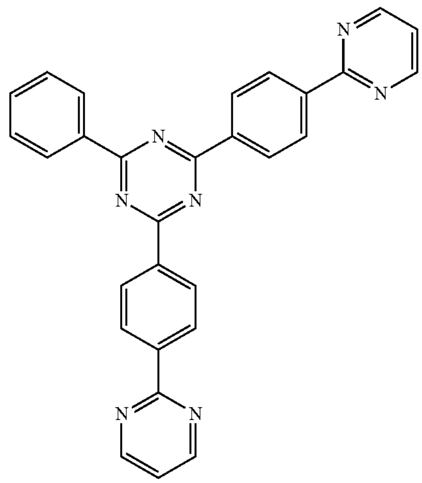
E-223
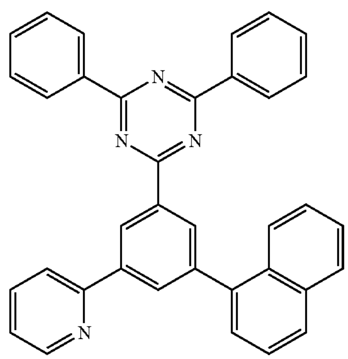
E-224
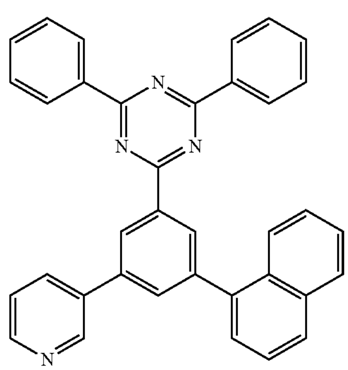

-continued
E-225
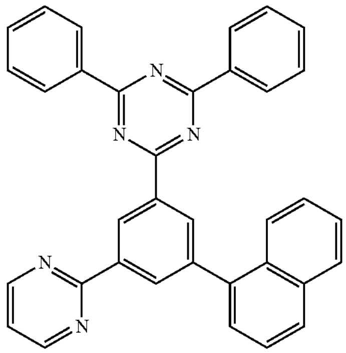
E-226
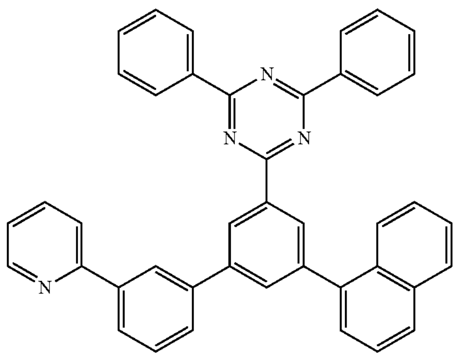
E-227
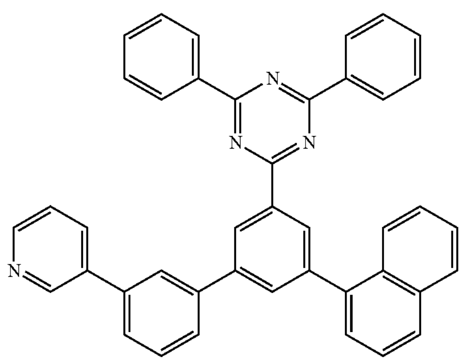
E-228
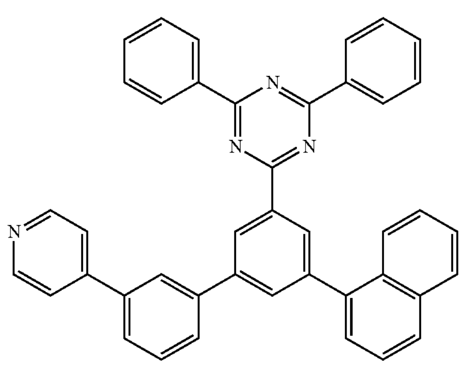
-continued
E-229
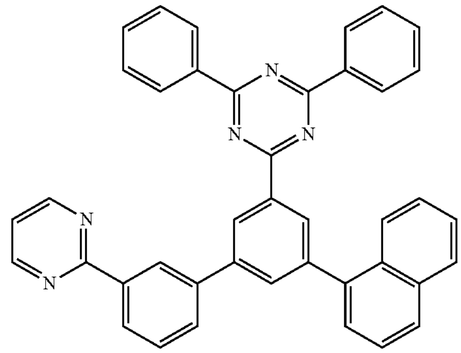
E-230
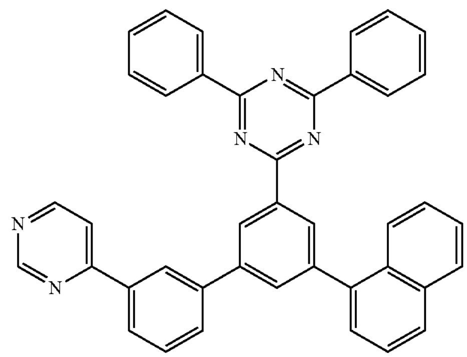
E-231
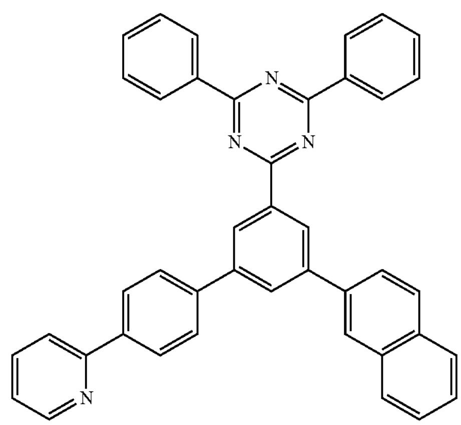
E-232
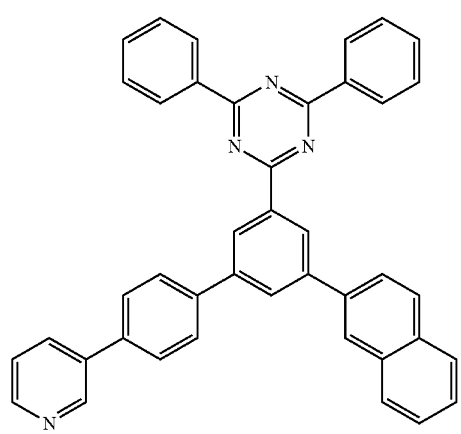

-continued
E-233
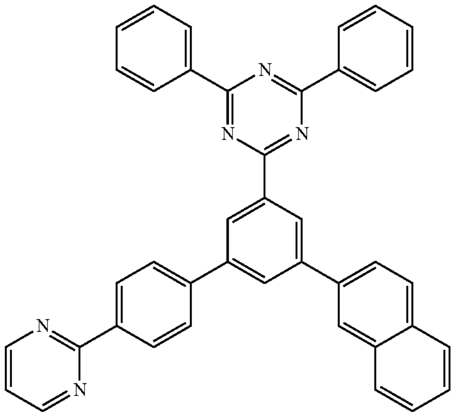
E-234
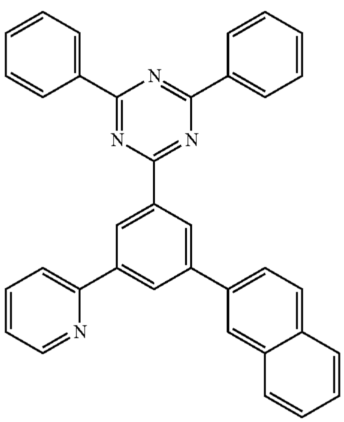
E-235
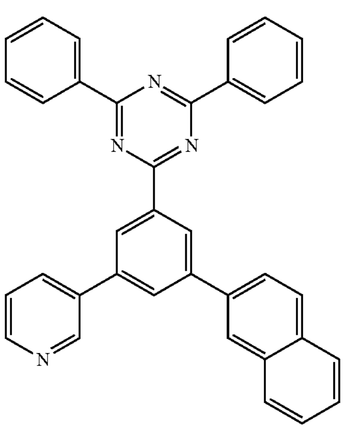
-continued
E-236
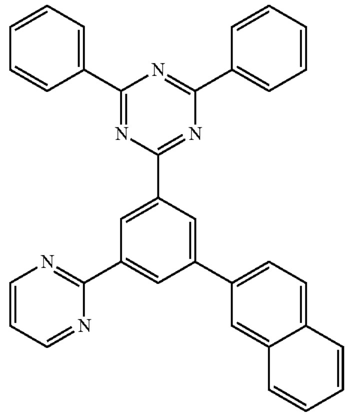
E-237
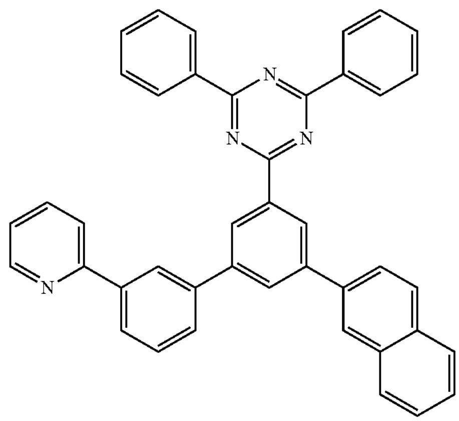
E-238
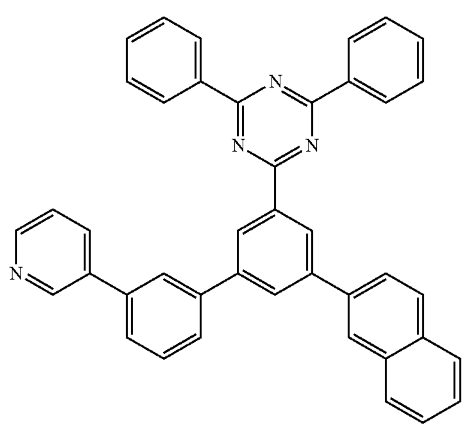

-continued
E-239
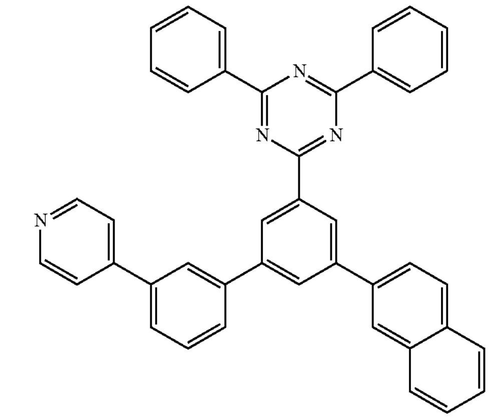
E-240
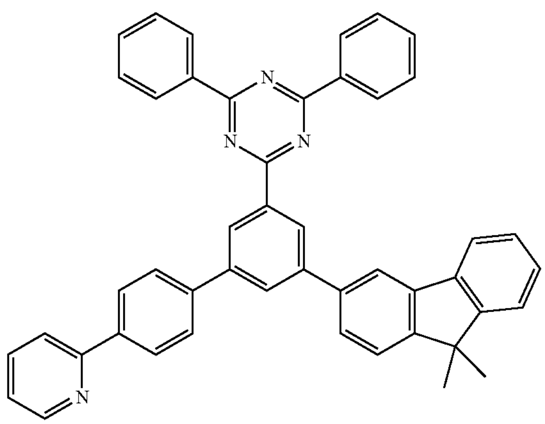
E-241
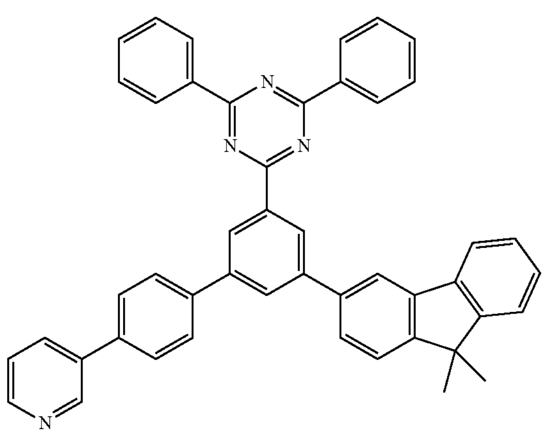
-continued
E-242
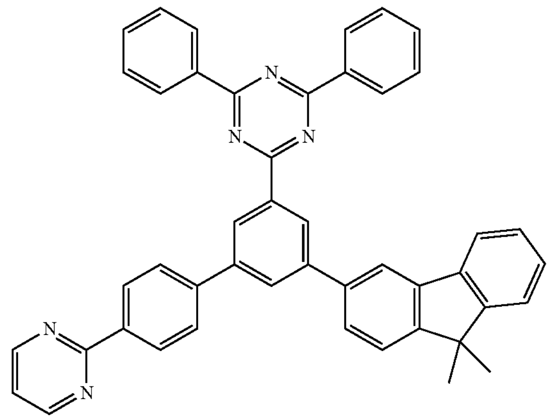
E-243
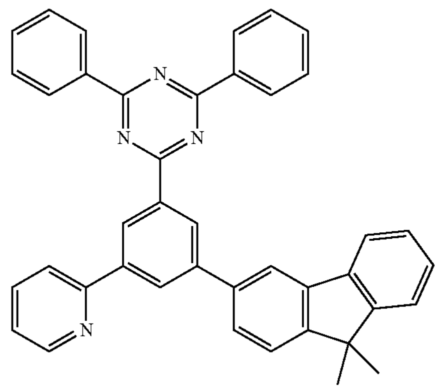
E-244
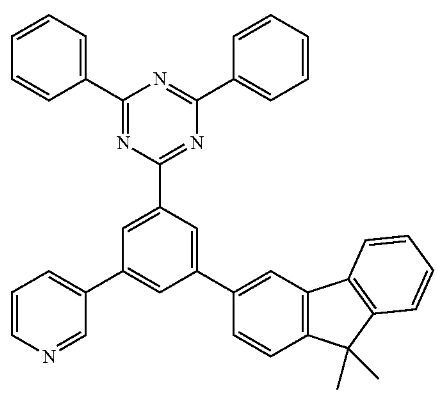
E-245
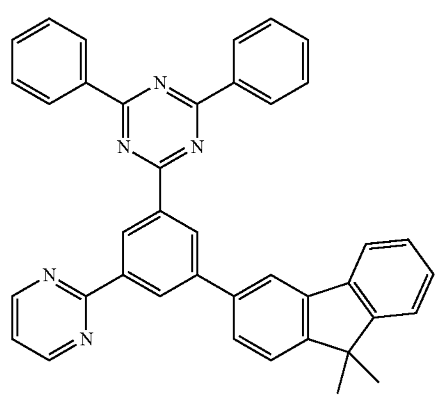

-continued
E-246
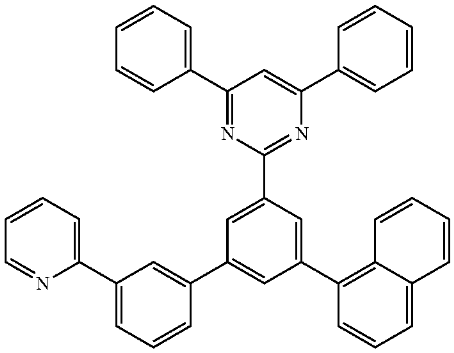
E-247
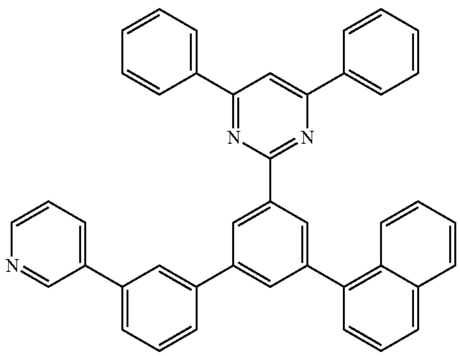
E-248
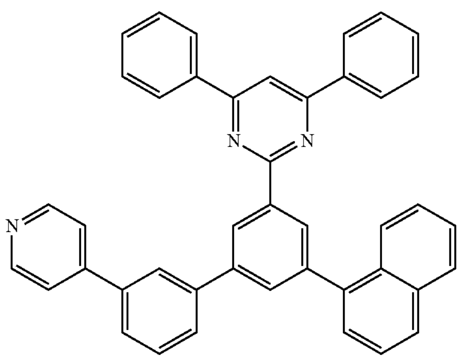
E-249
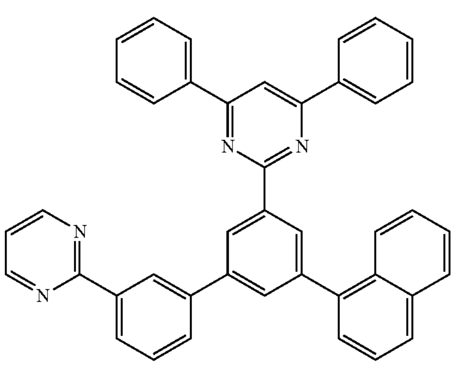
-continued
E-250
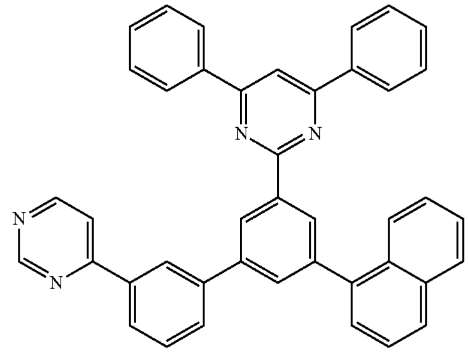
E-251
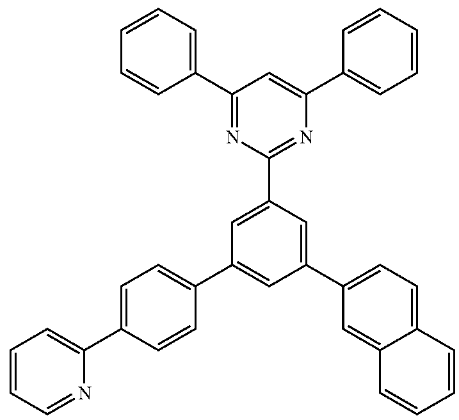
E-252
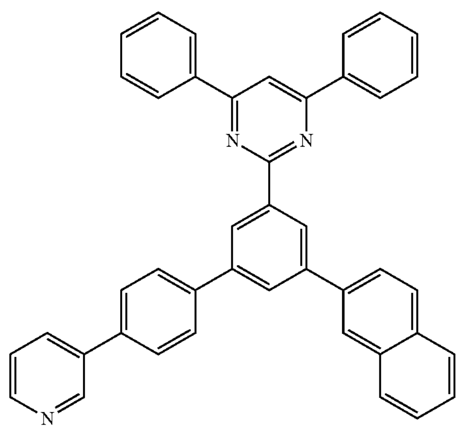
E-253
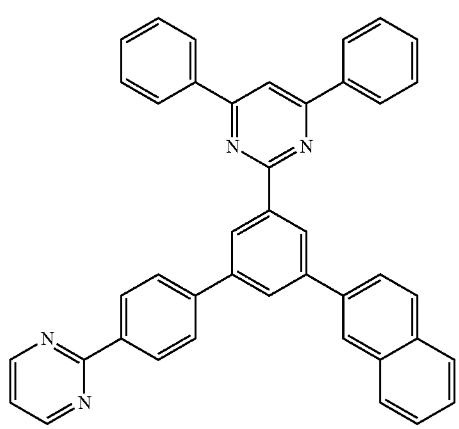

-continued
E-254
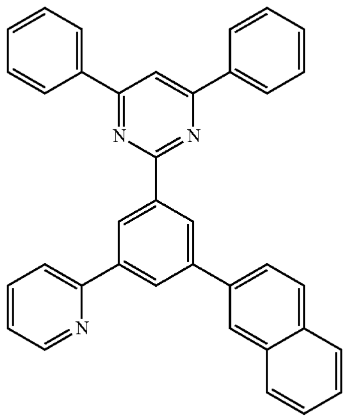
E-255
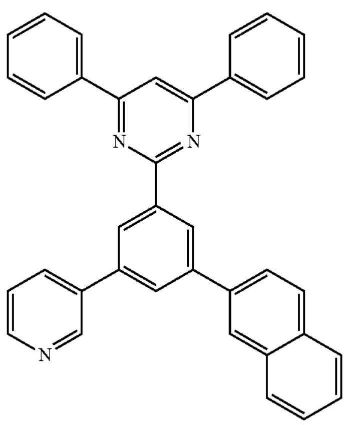
E-256
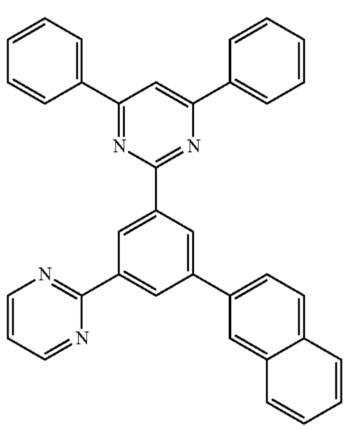
-continued
E-257
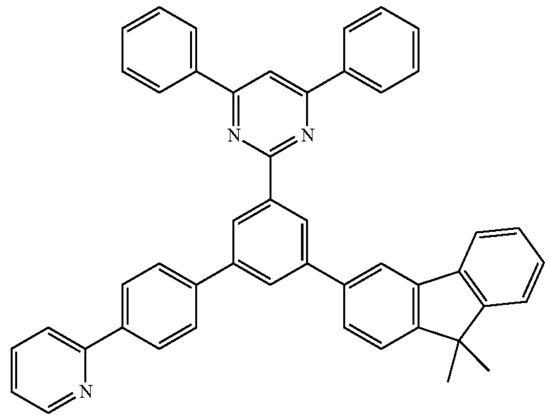
E-258
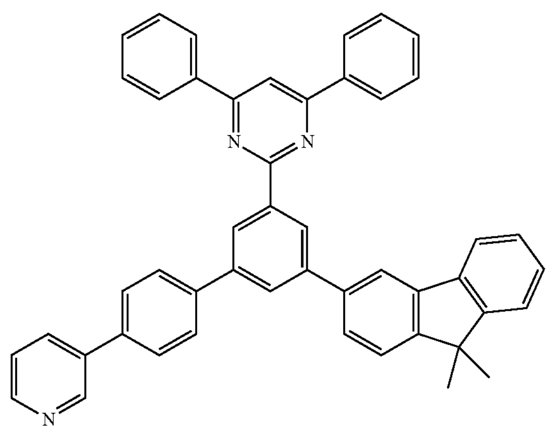
E-259
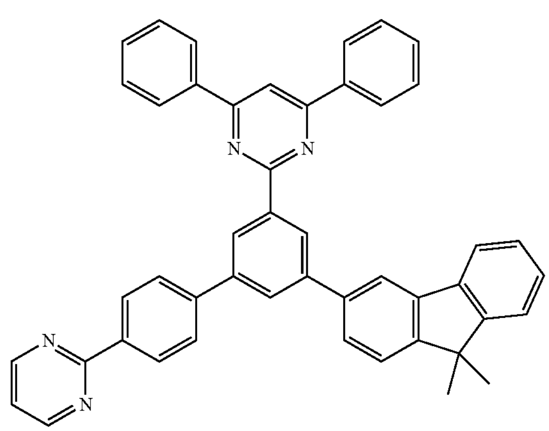

-continued
E-260
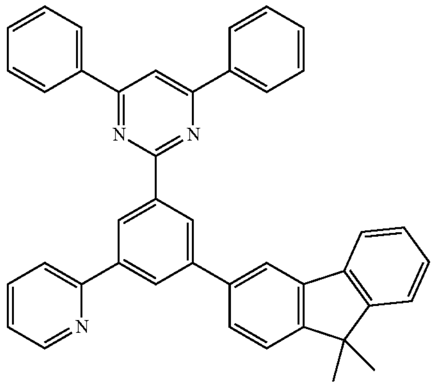
E-261
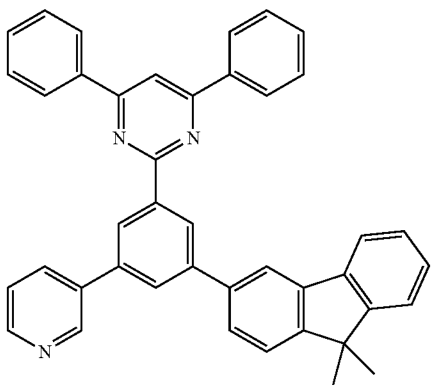
E-262
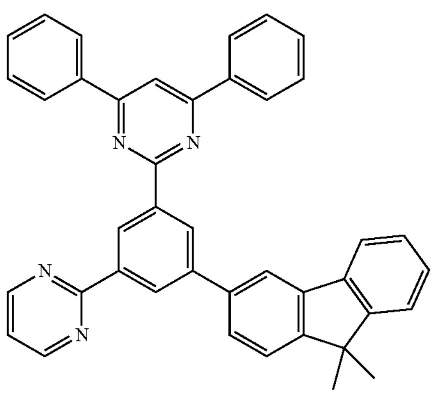
E-263
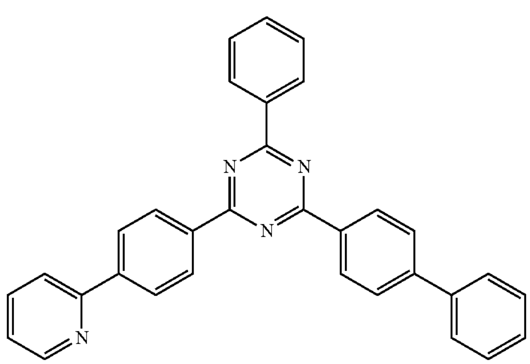
-continued
E-264
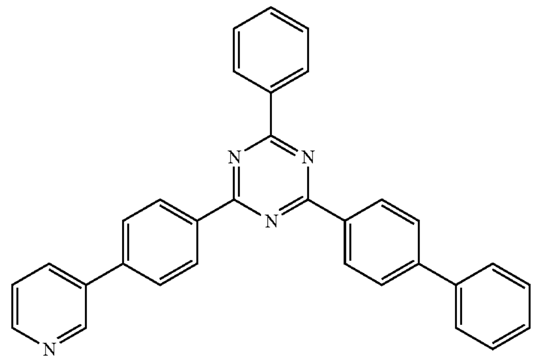
E-265
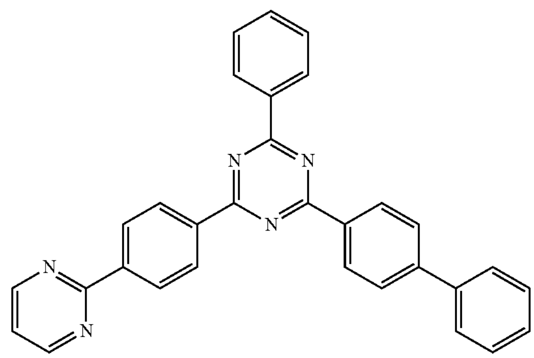
E-266
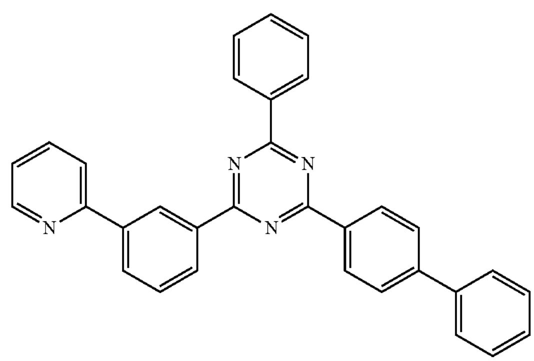
E-267
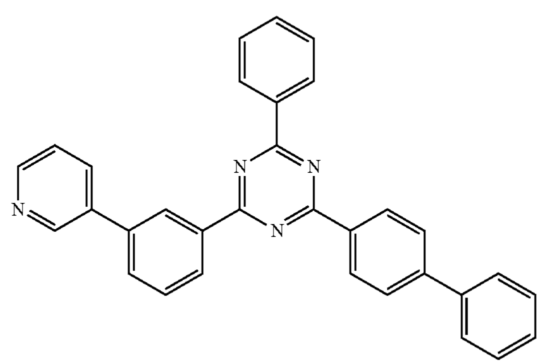

-continued

E-268

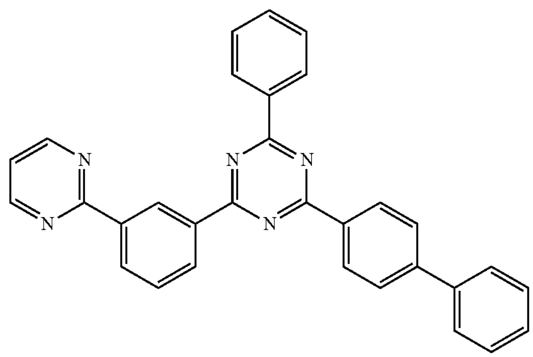

E-269

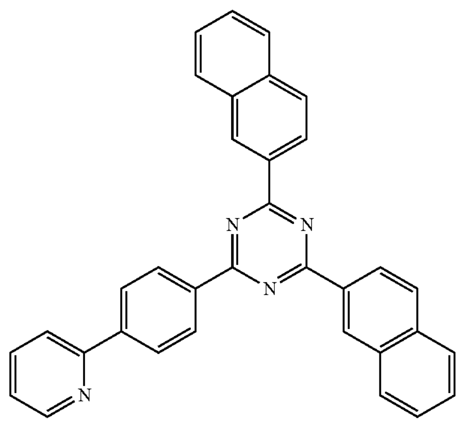

E-270

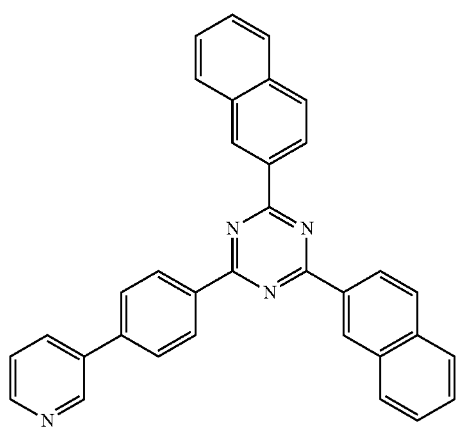

E-271

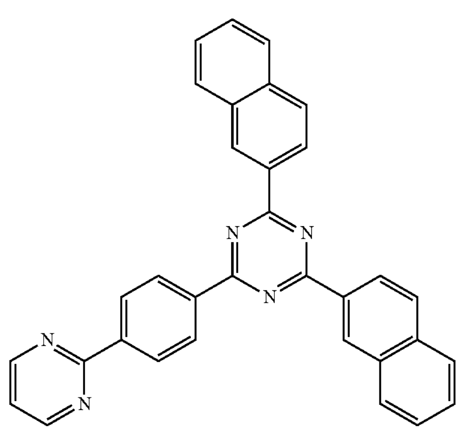

-continued

E-272

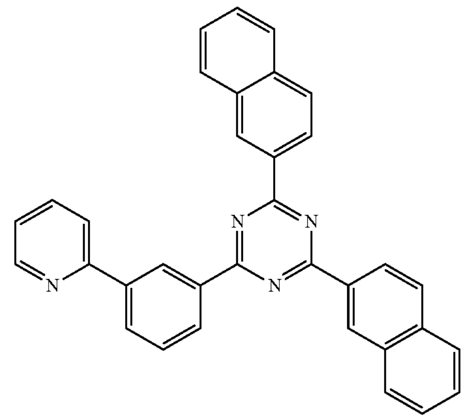

E-273

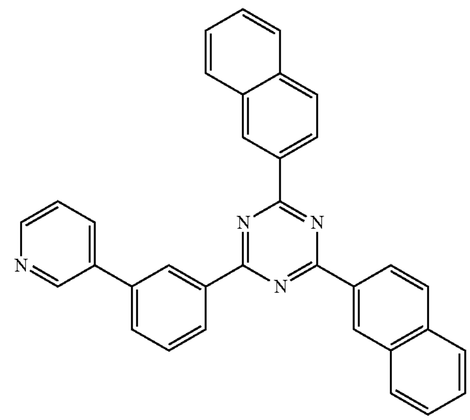

E-274

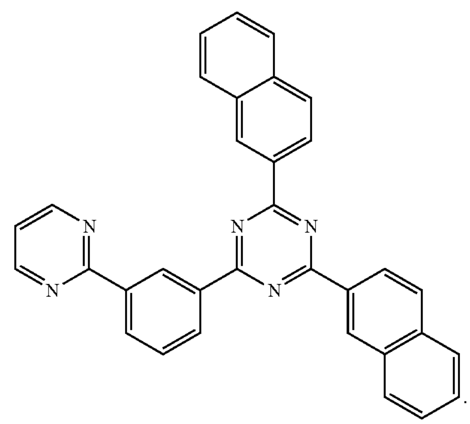

The first compound represented by one selected from Formulae 1-1 and 1-2 may have relatively high triplet energy levels (compared to those of a phosphorescent dopant generally utilized in the art), and thus may be suitable as a host in a phosphorescence organic light-emitting device. Therefore, in an organic light-emitting device including the first compound represented by one selected from Formulae 1-1 and 1-2, excitons are effectively generated in an emission layer, thereby exhibiting high efficiency.

However, when electrons are not effectively injected to an emission layer from an electron transport region in an organic light-emitting device, the driving voltage of an organic light-emitting device increases while the efficiency thereof decreases, and the lifespan thereof is reduced.

The second compound represented by Formula 2 has high electron mobility and low electron injection barrier. Thus, when the second compound represented by Formula 2 is utilized in an organic light-emitting device, electrons may be smoothly injected to an emission layer from an electron transport region.

Therefore, an organic light-emitting device including the first compound represented by one selected from Formulae 1-1 and 1-2 and the second compound represented by Formula 2 may have improved driving voltage, improved efficiency, and long lifespan.

Description of FIG. 1

FIG. 1 is a diagram schematically illustrating a cross-section of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 according to an embodiment will be described in connection with FIG. 1.

First Electrode 110

In FIG. 1, a substrate may be additionally disposed under the first electrode 110 or above the second electrode 190. The substrate may be a glass substrate or a plastic substrate, each having excellent mechanical strength, thermal stability, transparency, surface smoothness, ease of handling, and/or water-resistance.

The first electrode 110 may be formed by, for example, depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, the material for forming the first electrode 110 may be selected from indium tin oxide (ITO), indium zinc oxide (IZO), tin oxide ($SnO_2$), zinc oxide (ZnO), and combinations thereof, but embodiments of the present disclosure are not limited thereto. In various embodiments, when the first electrode 110 is a semi-transmissive electrode or a reflective electrode, the material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 may be disposed on the first electrode 110. The organic layer 150 may include an emission layer.

The organic layer 150 may further include a hole transport region between the first electrode 110 and the emission layer, and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a structure of hole injection layer/hole transport layer, a structure of hole injection layer/hole transport layer/emission auxiliary layer, a structure of hole injection layer/emission auxiliary layer, a structure of hole transport layer/emission auxiliary layer, or a structure of hole injection layer/hole transport layer/electron blocking layer, but the structure of the hole transport region is not limited thereto.

The hole transport region may include at least one selected from m-MTDATA, TDATA, 2-TNATA, NPB (NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (Pani/PSS), a compound represented by Formula 201, and a compound represented by Formula 202:

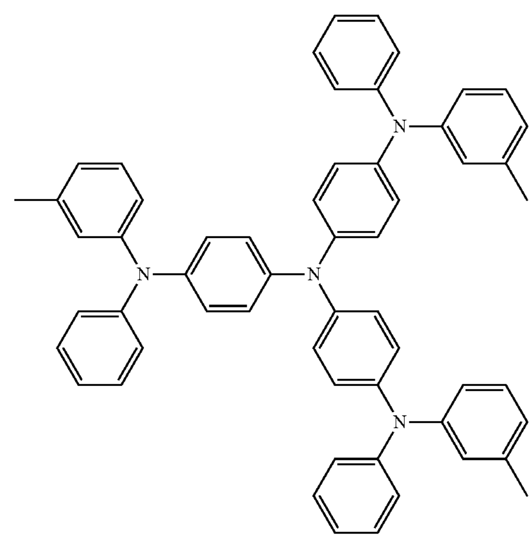

m-MTDATA

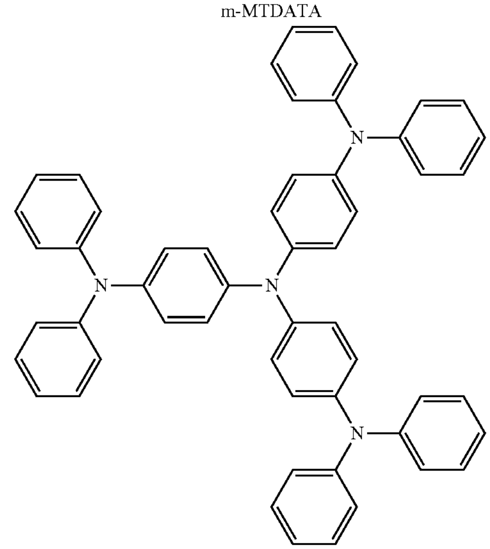

TDATA

-continued
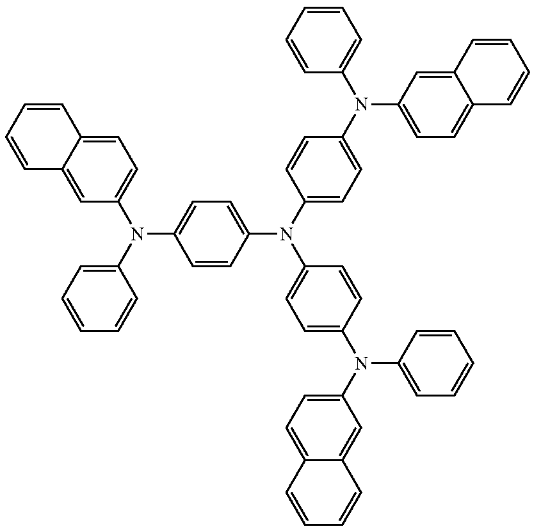
2-TNATA
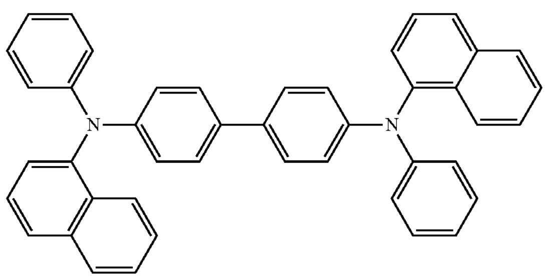
NPB
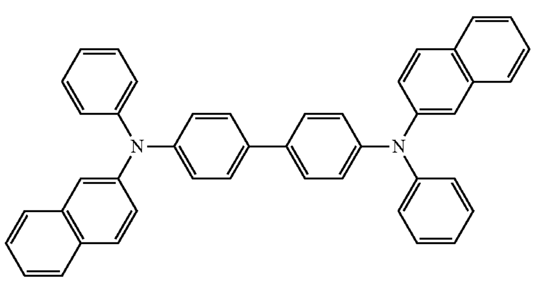
β-NPB
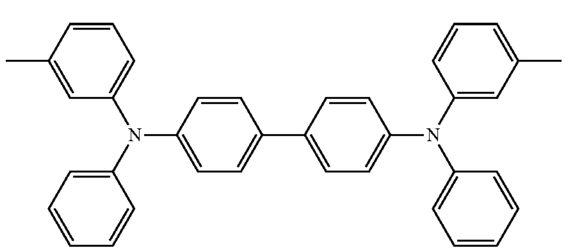
TPD
-continued
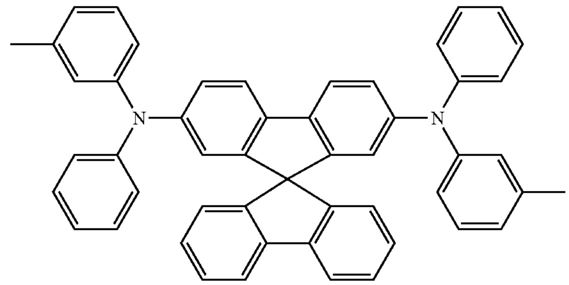
Spiro-TPD
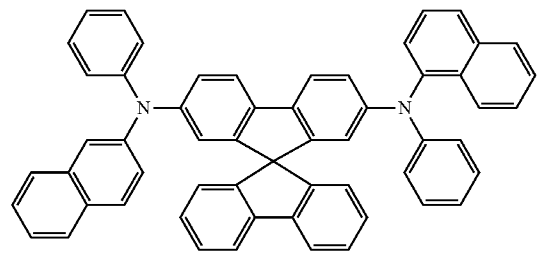
Spiro-NPB
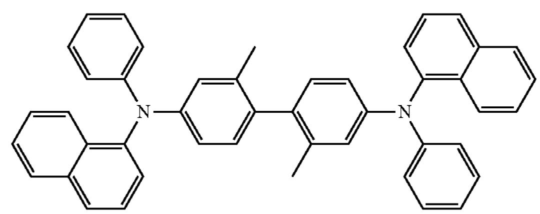
methylated NPB
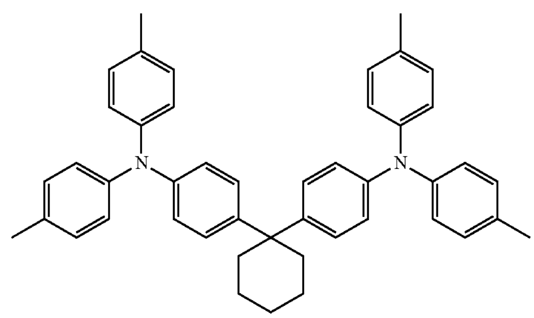
TAPC
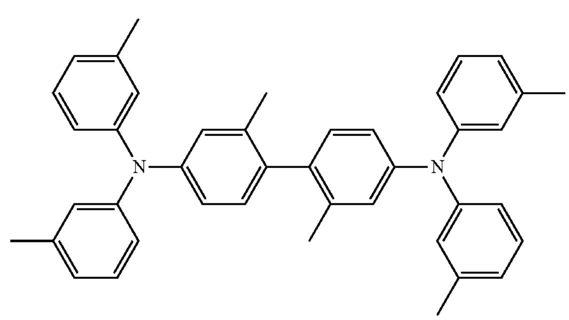
HMTPD
Formula 201
$$R_{201}-(L_{201})_{xa1}-N\begin{cases}(L_{202})_{xa2}-R_{202}\\(L_{203})_{xa3}-R_{203}\end{cases}$$

-continued

Formula 202

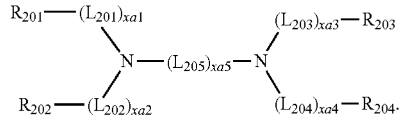

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may be optionally linked to each other via a single bond, a dimethyl-methylene group, or a diphenyl-methylene group, and $R_{203}$ and $R_{204}$ may be optionally linked to each other via a single bond, a dimethyl-methylene group, or a diphenyl-methylene group.

In an embodiment, in Formulae 201 and 202, $L_{201}$ to $L_{205}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosiloleylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosiloleylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, xa1 to xa4 may each independently be 0, 1, or 2.

In various embodiments, xa5 may be 1, 2, 3, or 4.

In various embodiments, $R_{201}$ to $R_{204}$ and $Q_{201}$ may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ may each independently be understood by referring to the descriptions thereof provided in the present specification.

In various embodiments, in Formula 201, at least one selected from $R_{201}$ to $R_{203}$ may be selected from the group consisting of:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

In various embodiments, in Formula 202, i) $R_{201}$ and $R_{202}$ may be linked to each other via a single bond, and/or ii) $R_{203}$ and $R_{204}$ may be linked to each other via a single bond.

In various embodiments, in Formula 202, at least one selected from $R_{201}$ to $R_{204}$ may be selected from the group consisting of:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

The compound represented by Formula 201 may be represented by Formula 201A:

Formula 201A

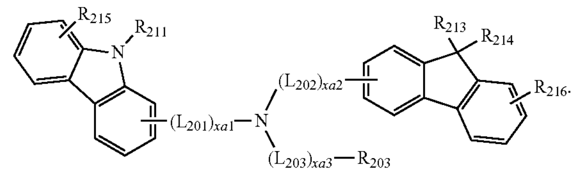

For example, the compound represented by Formula 201 may be represented by Formula 201A(1), but embodiments are not limited thereto:

Formula 201A(1)

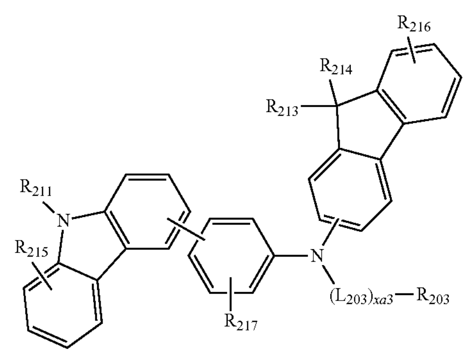

In various embodiments, the compound represented by Formula 201 may be represented by Formula 201A-1, but embodiments are not limited thereto:

Formula 201A-1

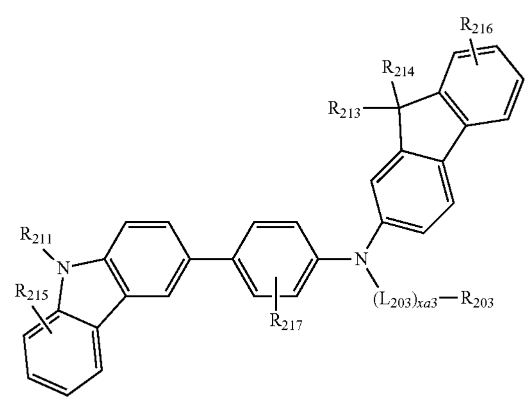

For example, the compound represented by Formula 202 may be represented by Formula 202A:

Formula 202A

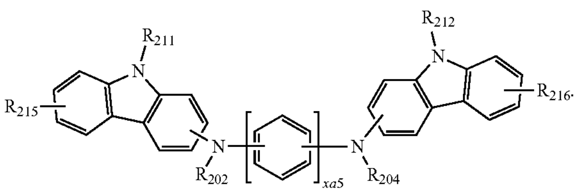

In various embodiments, the compound represented by Formula 202 may be represented by Formula 202A-1:

Formula 202A-1

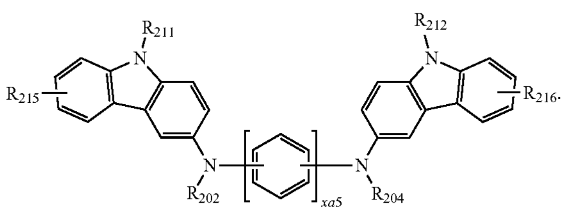

In Formulae 201A, 201A(1), 201A-1, 202A, and 202A-1, $L_{201}$ to $L_{203}$, xa1 to xa3, xa5, and $R_{202}$ to $R_{204}$ may each independently be understood by referring to descriptions thereof provided in the present specification, $R_{211}$ and $R_{212}$ may each independently be understood by referring to the description of $R_{203}$ provided herein, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In an embodiment, the hole transport region may include at least one compound selected from Compounds HT1 to HT39, but embodiments are not limited thereto:

HT1

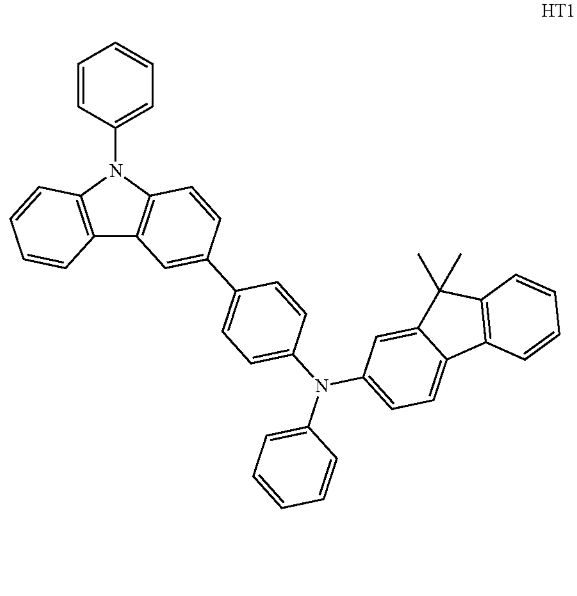

HT2

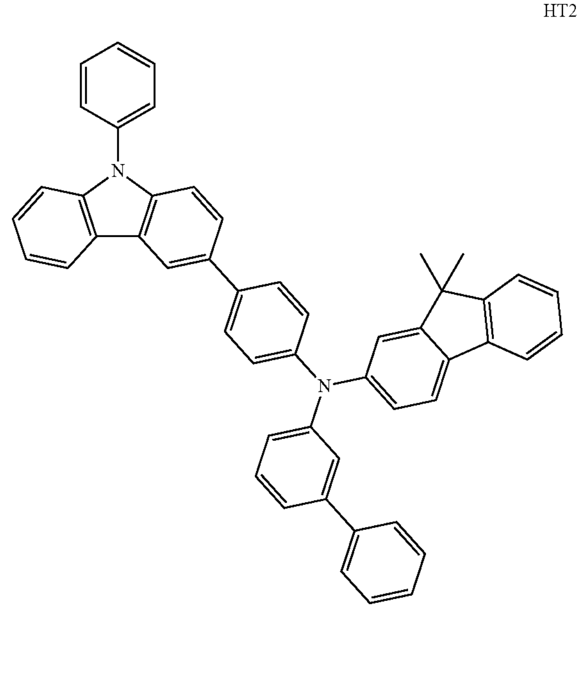

-continued
HT3
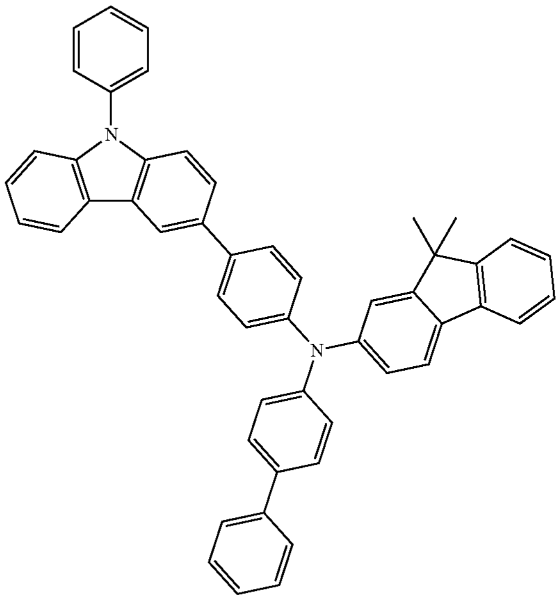
HT4
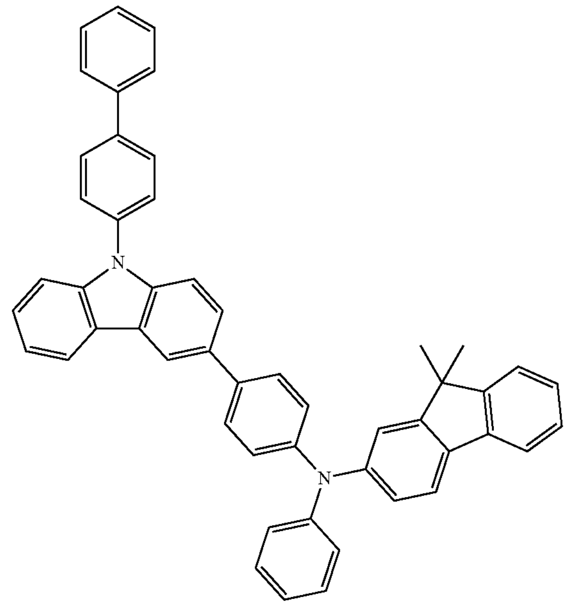
HT5
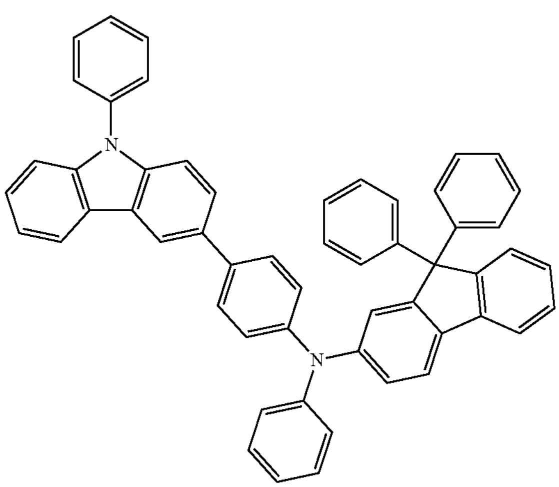
HT6
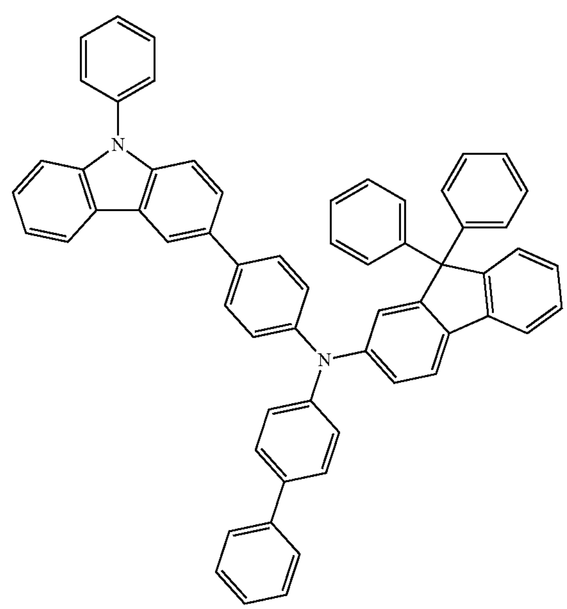

-continued
HT7
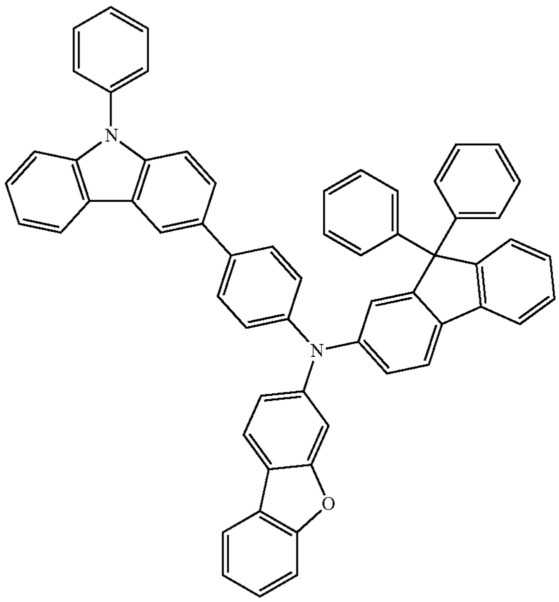
HT8
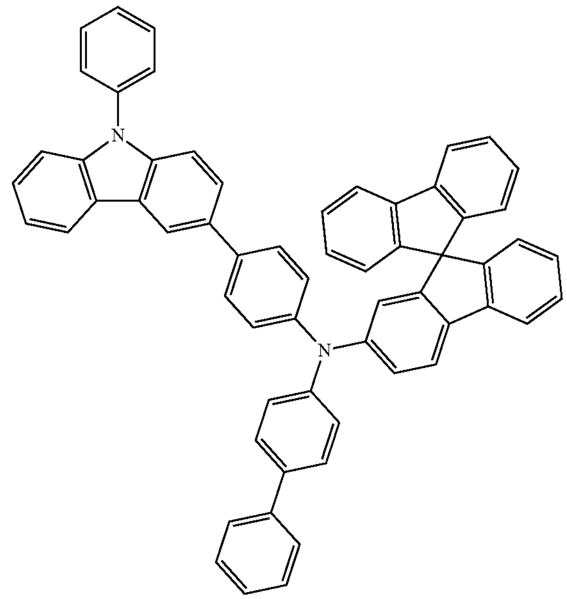
HT9
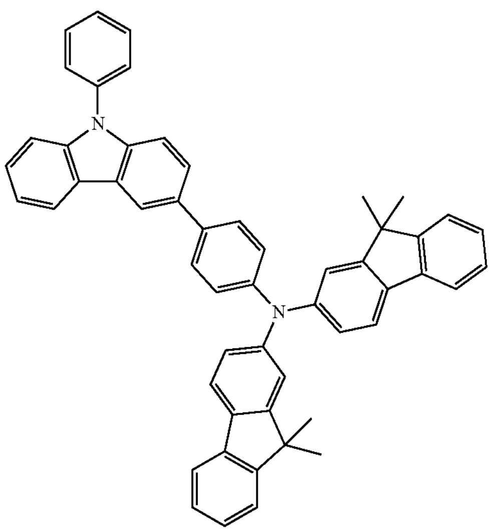
HT10
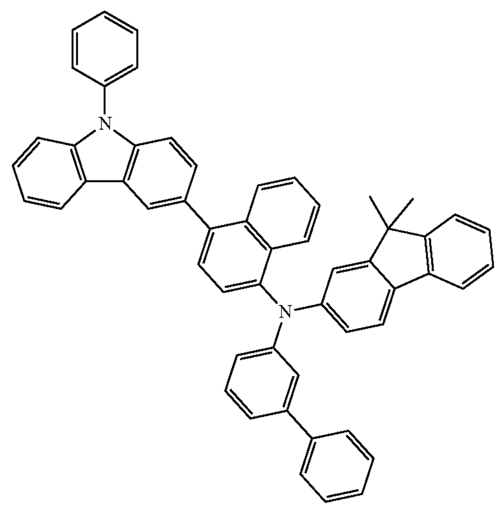
HT11
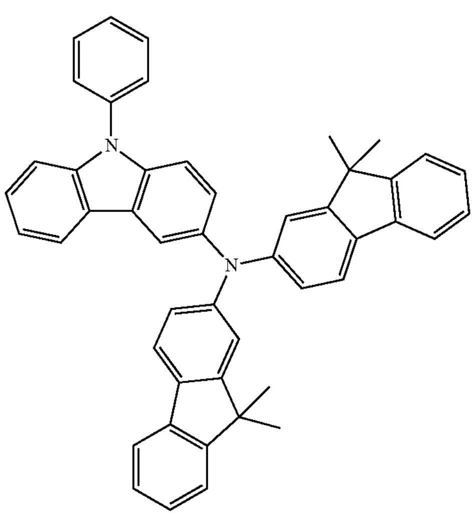
HT12
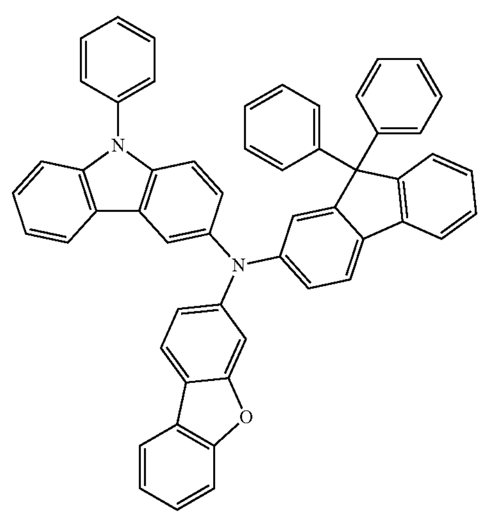

-continued
HT13
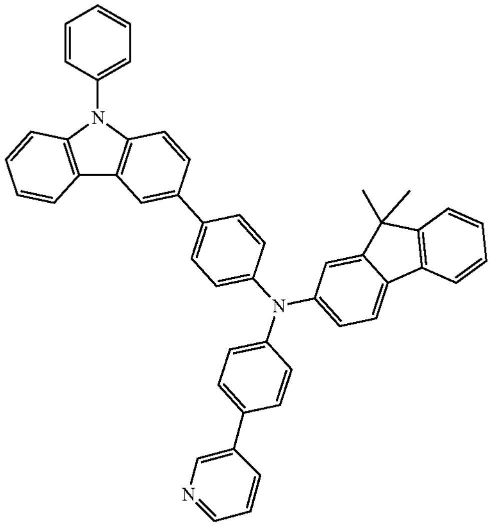
HT14
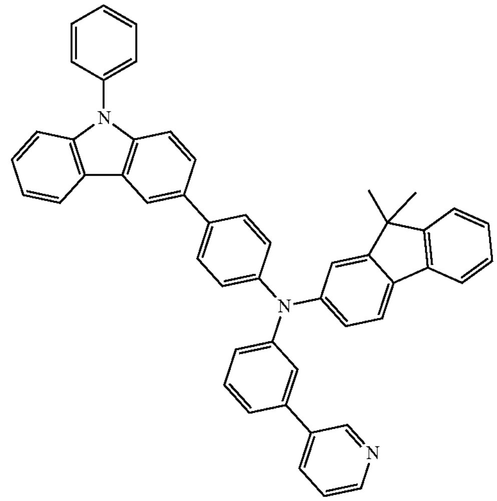
HT15
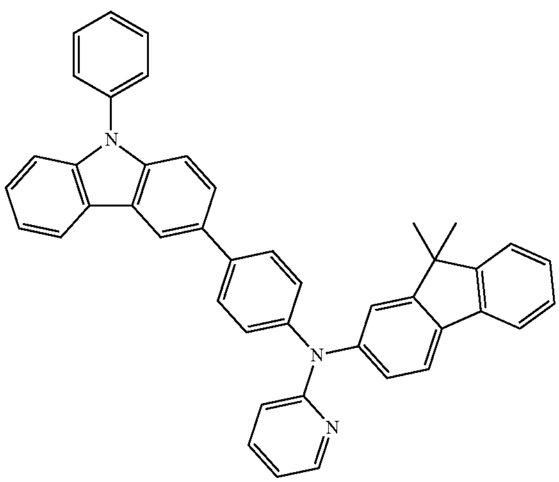
HT16
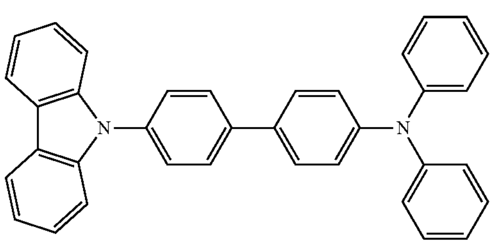
HT17
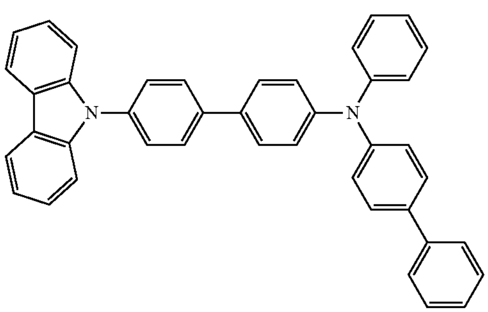
HT18
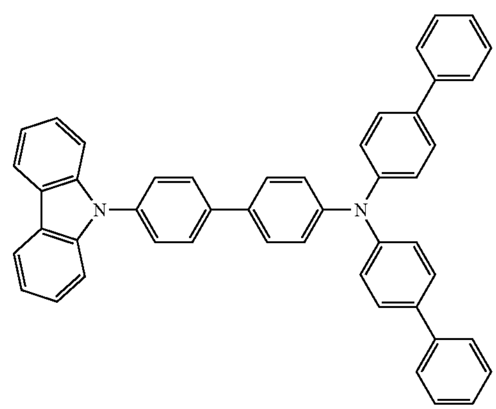

-continued
HT19
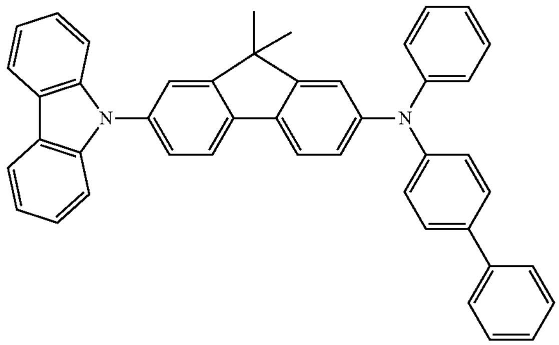
HT20
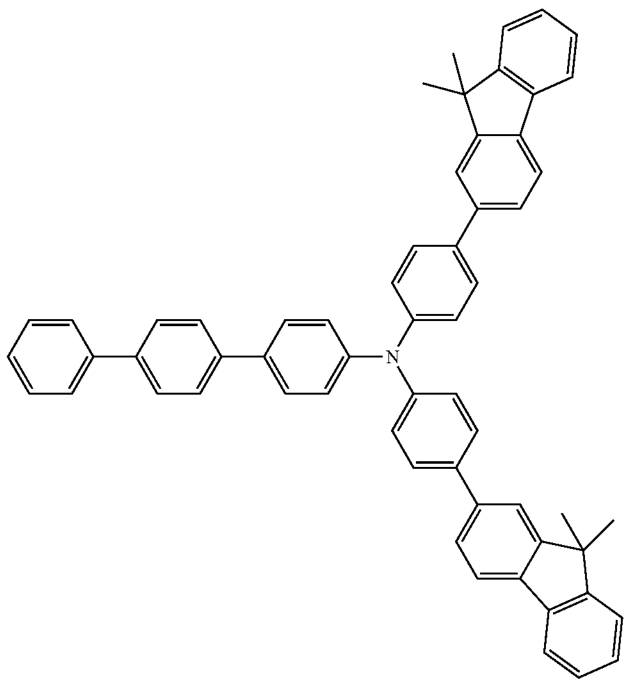
HT21
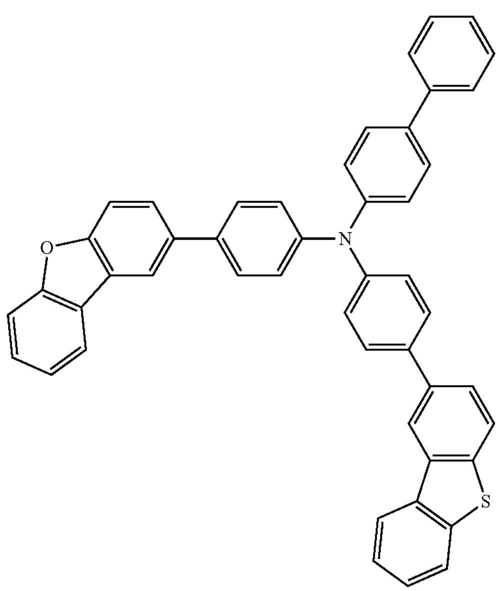

-continued
HT22
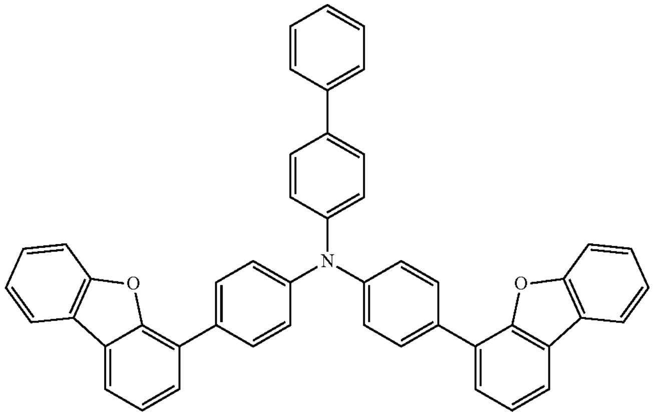
HT23
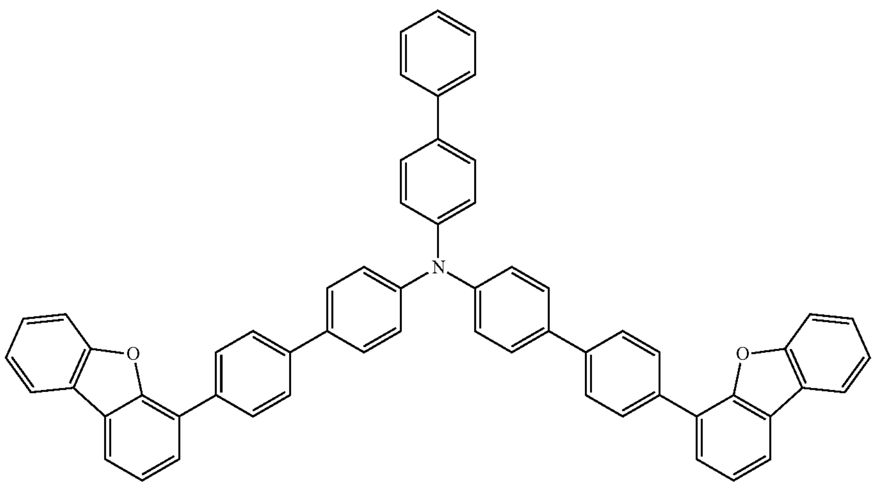
HT24
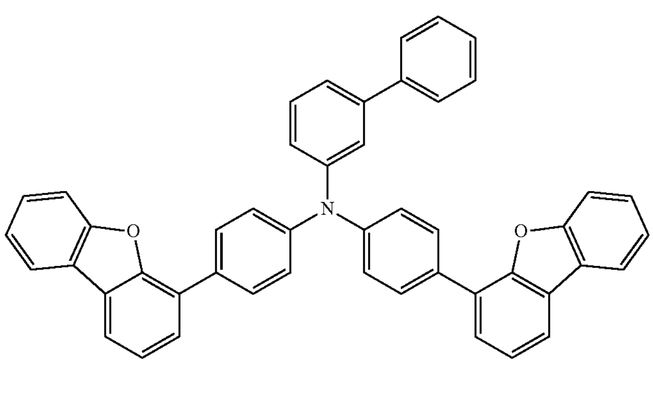

-continued
HT25
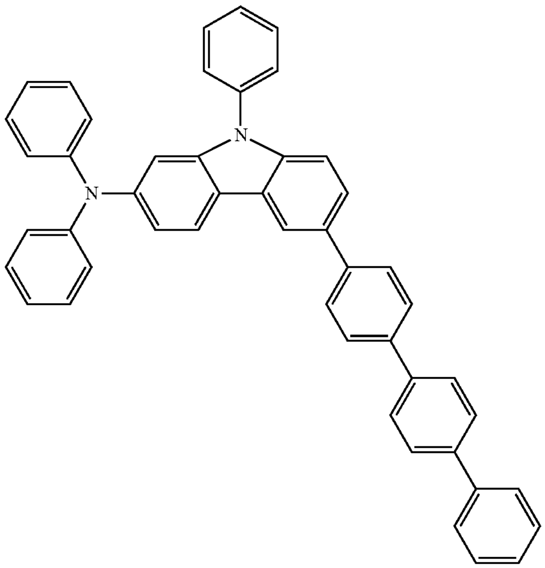
HT26
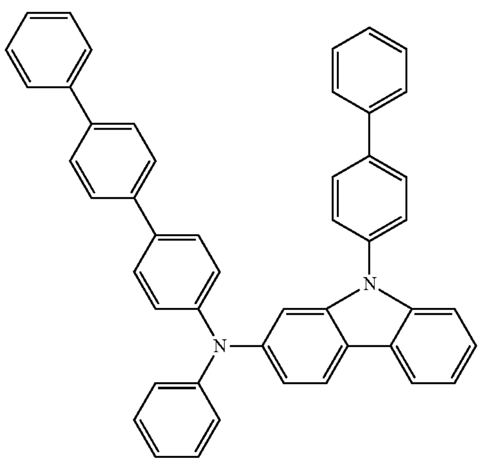
HT27
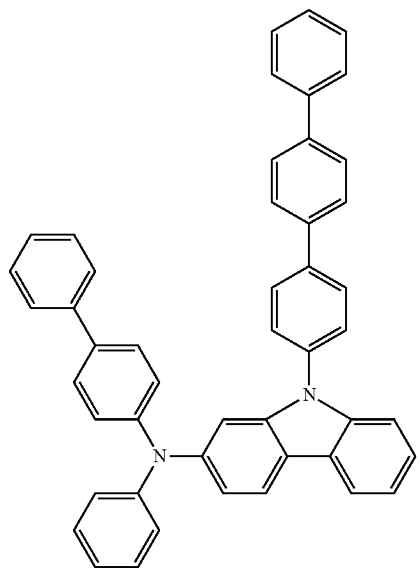
HT28
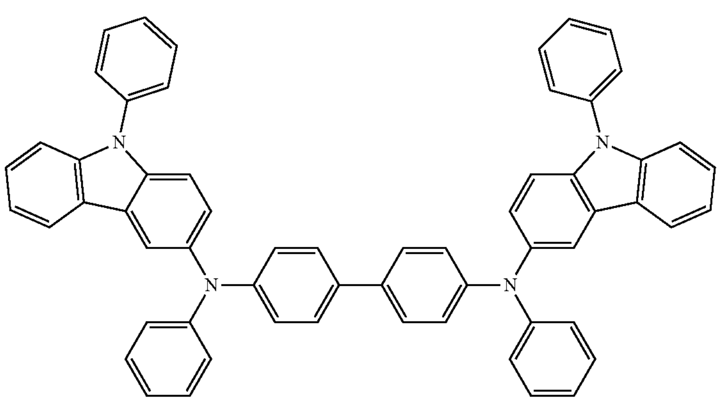

-continued
HT29
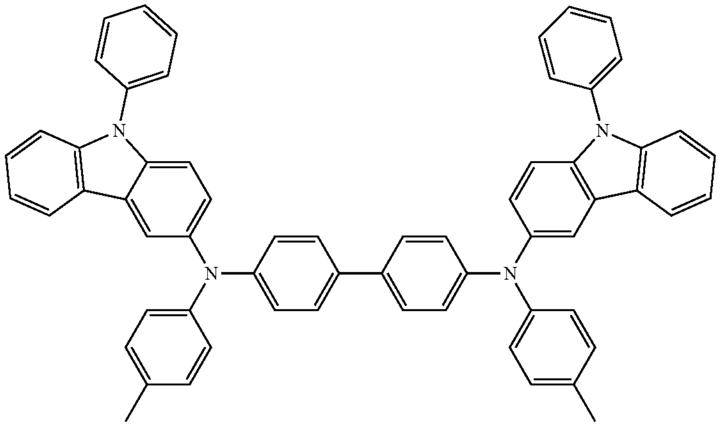
HT30
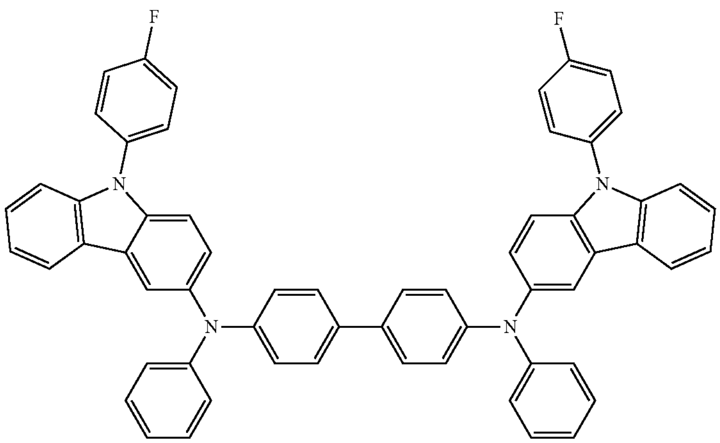
HT31
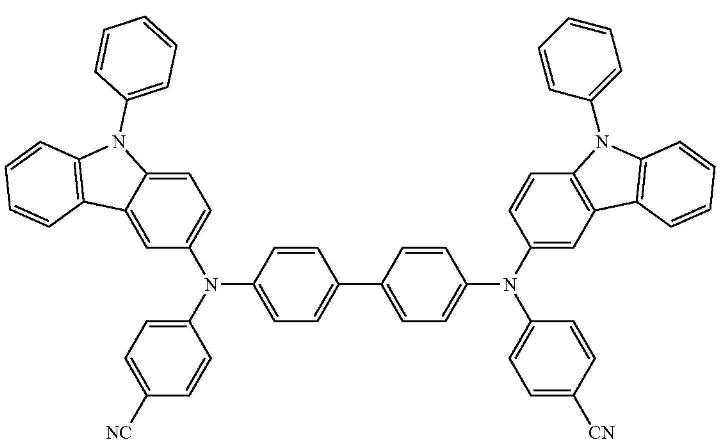

-continued
HT32
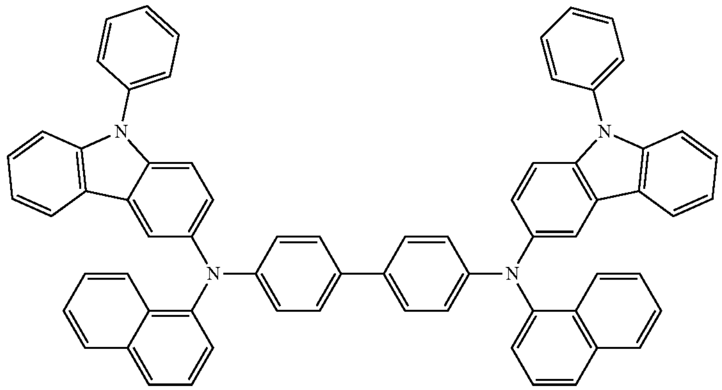
HT33
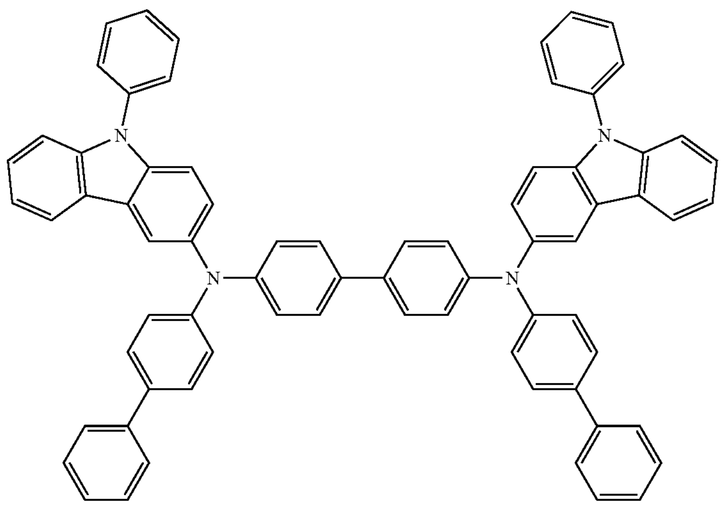
HT34
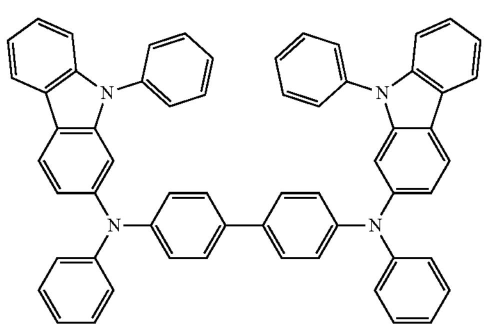
HT35
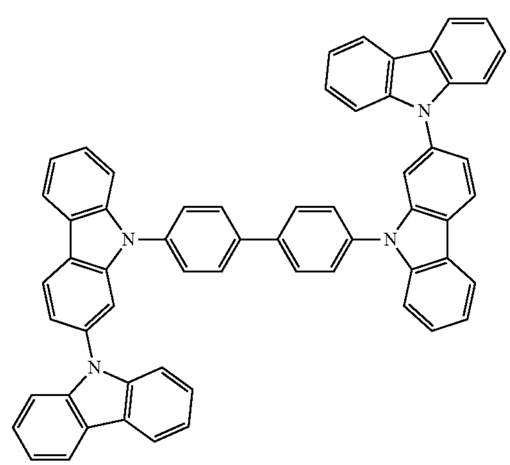

-continued

HT36

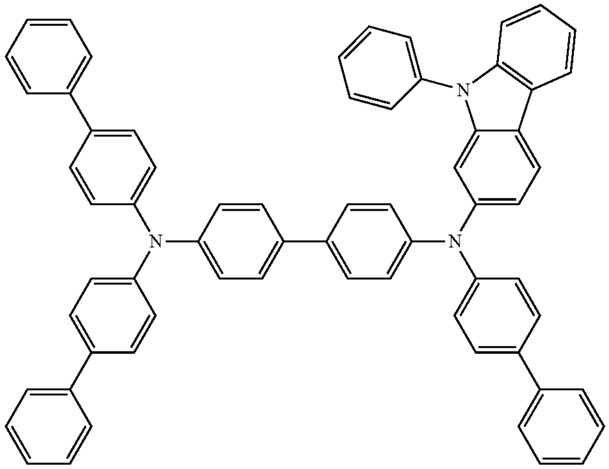

HT37

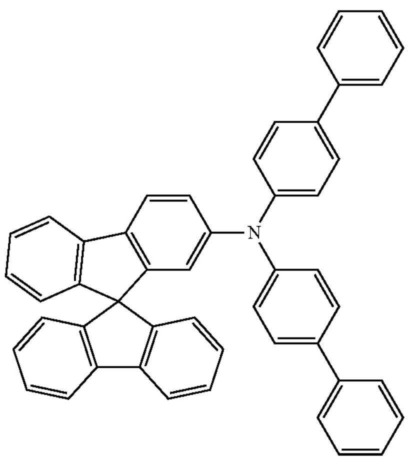

HT38

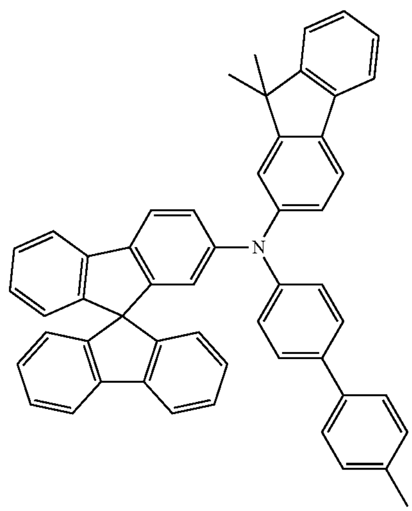

HT39

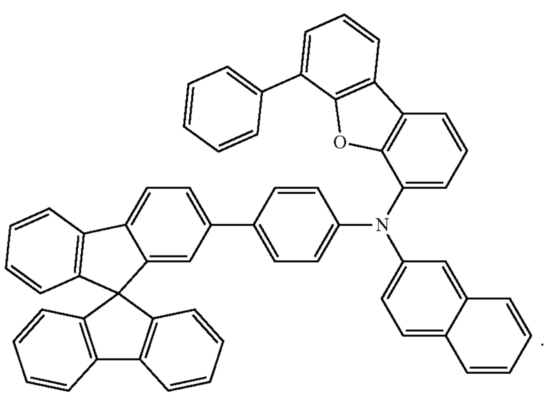

A thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted from the emission layer, and the electron blocking layer may block the flow of electrons from the electron transport region. The emission auxiliary layer and the electron blocking layer may include the materials as described above.

P-Dopant

The hole transport region may further include, in addition to the materials described above, a charge-generation material for the improvement of conductive properties. The charge-generation material may be homogeneously or non-homogeneously dispersed in the hole transport region.

The charge-generation material may be, for example, a p-dopant.

In an embodiment, a lowest unoccupied molecular orbital (LUMO) of the p-dopant may be about −3.5 eV or less.

The p-dopant may include at least one selected from a quinone derivative, a metal oxide, and a cyano group-containing compound, but embodiments are not limited thereto.

For example, the p-dopant may include at least one selected from the group consisting of:

quinone derivatives, such as tetracyanoquinodimethane (TCNQ) and/or 2,3,5,6-tetrafluoro-7,7,8,8-tetracyanoquinodimethane (F4-TCNQ);

metal oxides, such as a tungsten oxide and/or a molybdenum oxide;

1,4,5,8,9,11-hexaazatriphenylene-hexacarbonitrile (HAT-CN); and a compound represented by Formula 221, but embodiments are not limited thereto:

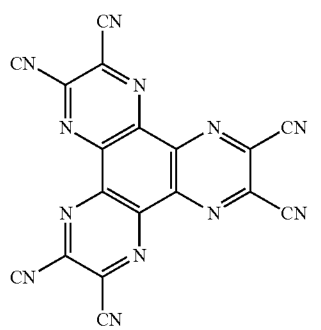

HAT-CN

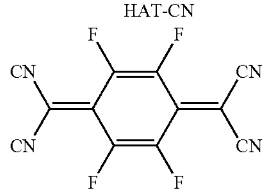

F4-TCNQ

Formula 221

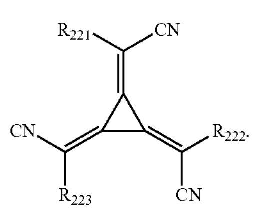

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full color organic light-emitting device, the emission layer may be patterned into a red emission layer, a green emission layer, or a blue emission layer, according to an individual sub-pixel. In various embodiments, the emission layer may have a stacked structure of two or more layers selected from a red emission layer, a green emission layer, and a blue emission layer, in which the two or more layers contact each other or are separated from each other. In various embodiments, the emission layer may include two or more materials selected from a red-light emission material, a green-light emission material, and a blue-light emission material, in which the two or more materials are mixed with each other in a single layer to emit white light.

The emission layer may include a host and a dopant. The dopant may include at least one selected from a phosphorescent dopant and a fluorescent dopant.

In the emission layer, an amount of the dopant may be, in general, in a range of about 0.01 to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Host in Emission Layer

The host may include the first compound represented by one selected from Formulae 1-1 and 1-2.

In various embodiments, the host may further include, in addition to the first compound represented by one selected from Formulae 1-1 and 1-2, a compound represented by Formula 301:

$$[Ar_{301}]_{xb11}\text{-}[(L_{301})_{xb1}\text{-}R_{301}]_{xb21}. \qquad \text{Formula 301}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer selected from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), xb21 may be an integer selected from 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

In an embodiment, in Formula 301, $Ar_{301}$ may be selected from the group consisting of:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

In Formula 301, when xb11 is two or more, two or more $Ar_{301}$(s) may be linked to each other via a single bond.

In various embodiments, the compound represented by Formula 301 may be represented by Formula 301-1 or 301-2:

Formula 301-1

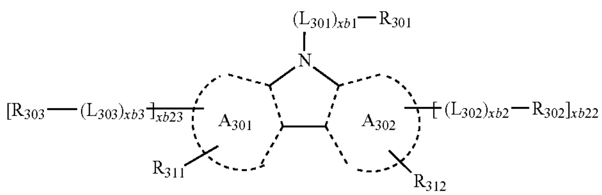

Formula 301-2

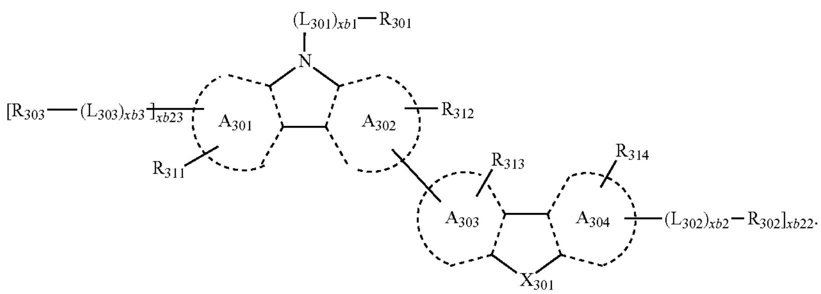

In Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be O, S, or N-[$(L_{304})_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ may each independently be understood by referring to the descriptions thereof provided in the present specification, $L_{302}$ to $L_{304}$ may each independently be the same as described in connection with $L_{301}$ in Formula 301, Xb2 to xb4 may each independently be the same as described in connection with xb1 in Formula 301, and $R_{302}$ to $R_{304}$ may each independently be the same as described in connection with $R_{301}$ in Formula 301.

For example, in Formulae 301, 301-1, and 301-2, $L_{301}$ to $L_{304}$ may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosiloleylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosiloleylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ may each independently be understood by referring to the descriptions thereof in the present specification.

In various embodiments, in Formulae 301, 301-1, and 301-2, $R_{301}$ to $R_{304}$ may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{31}$ to $Q_{33}$ may each independently be understood by referring to the descriptions thereof in the present specification.

In various embodiments, the host may include an alkaline earth-metal complex. For example, the host may be selected from a Be complex (for example, Compound H55), a Mg complex, and a Zn complex.

In various embodiments, the host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, however, embodiments are not limited thereto:

H1

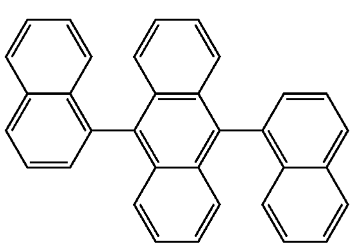

-continued

H2

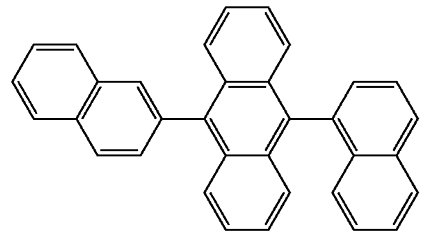

H3

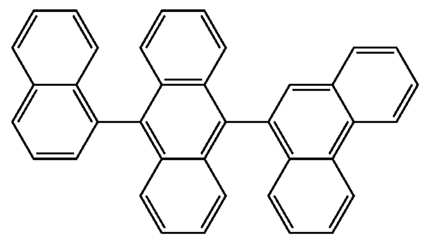

H4

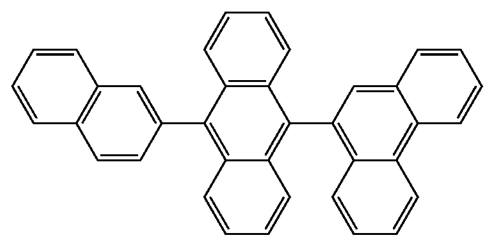

H5

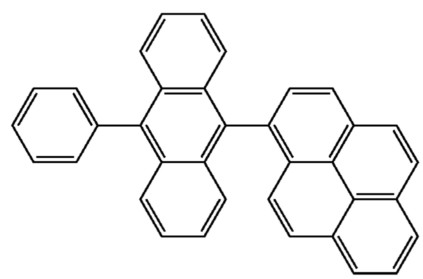

H6

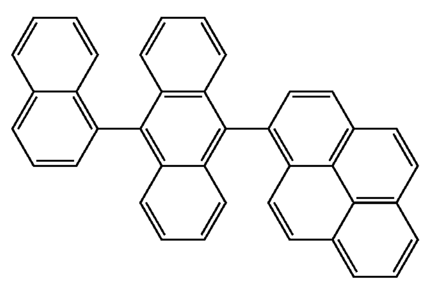

H7

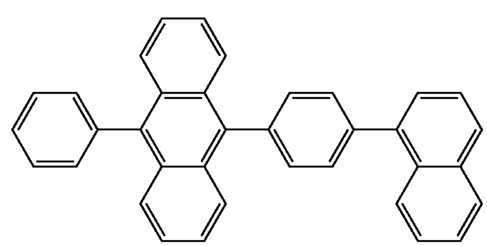

-continued
H8
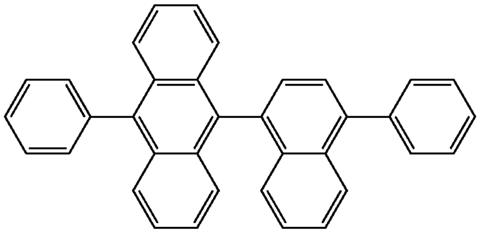
H9
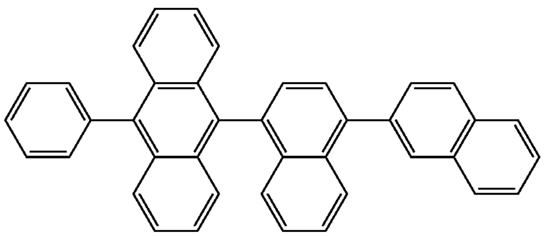
H10
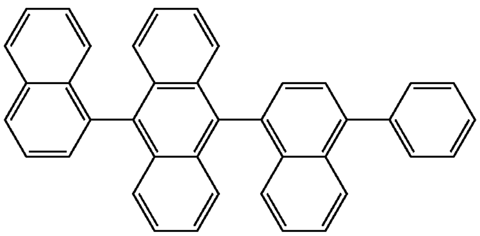
H11
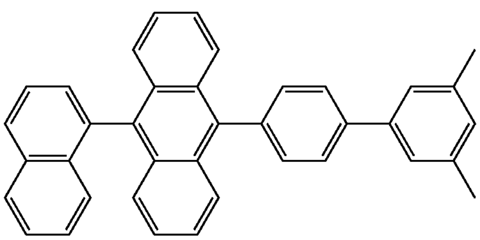
H12
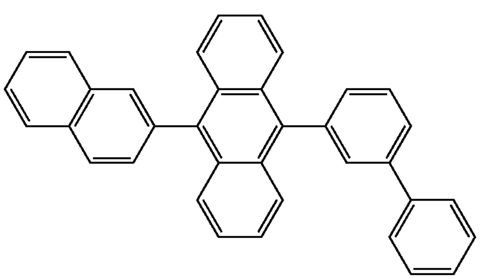
H13
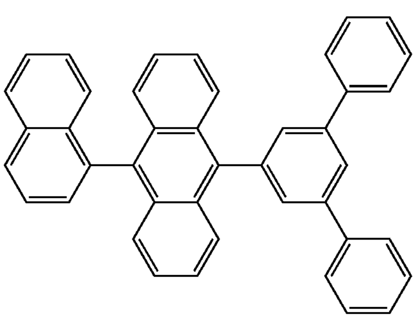
-continued
H14
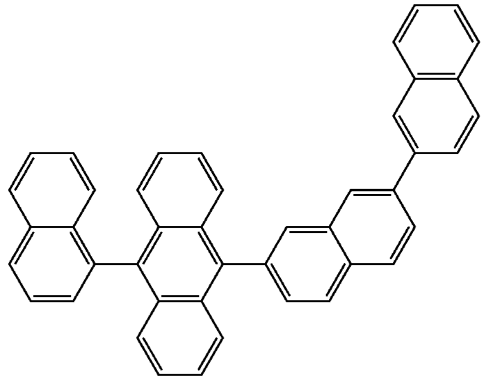
H15
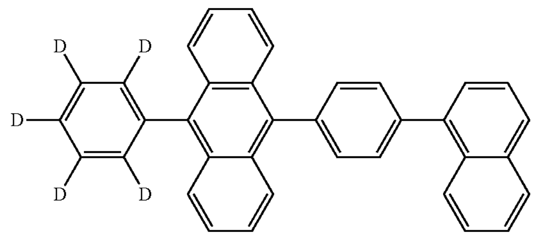
H16
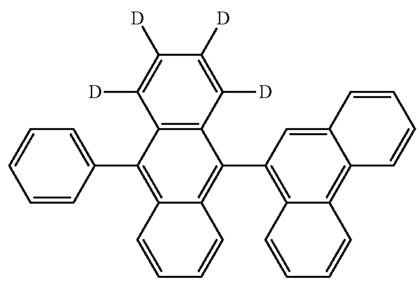
H17
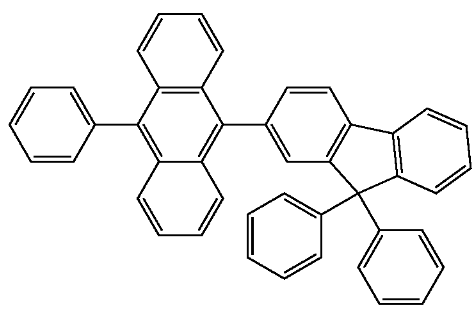
H18
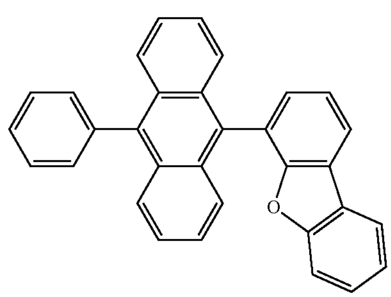

-continued
H19
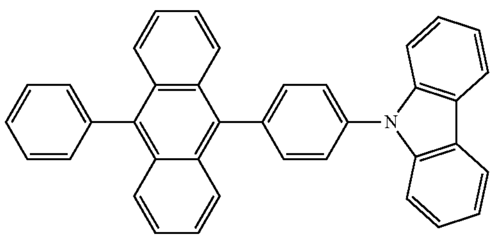
H20
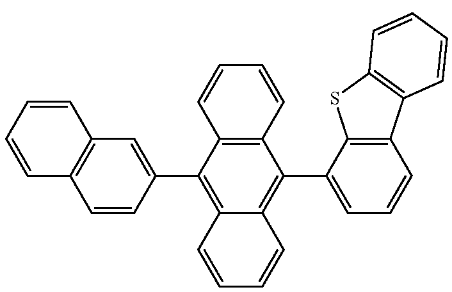
H21
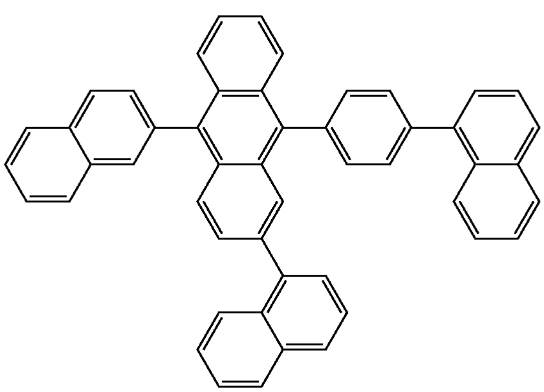
H22
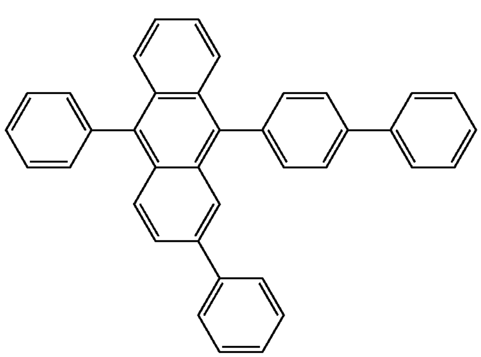
-continued
H23
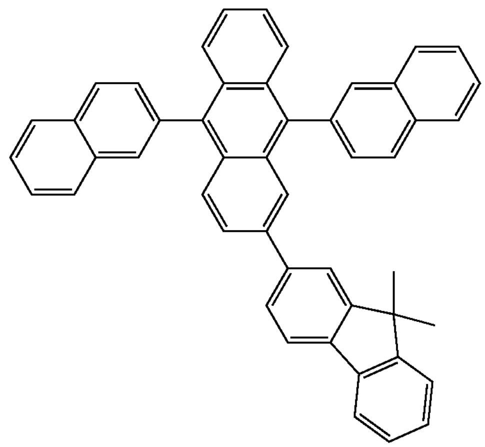
H24
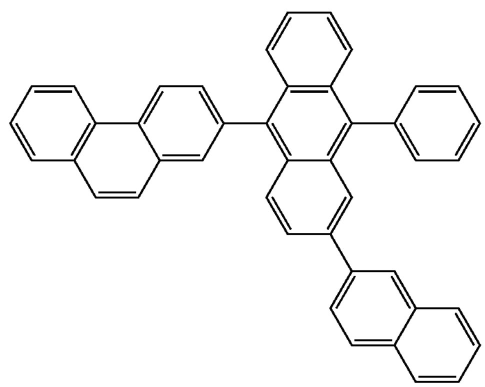
H25
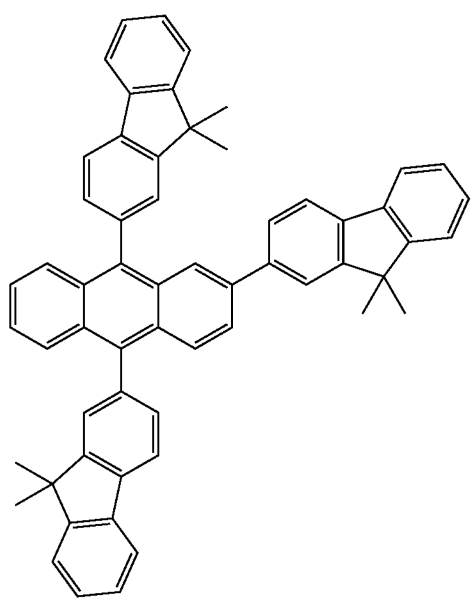

-continued
H26
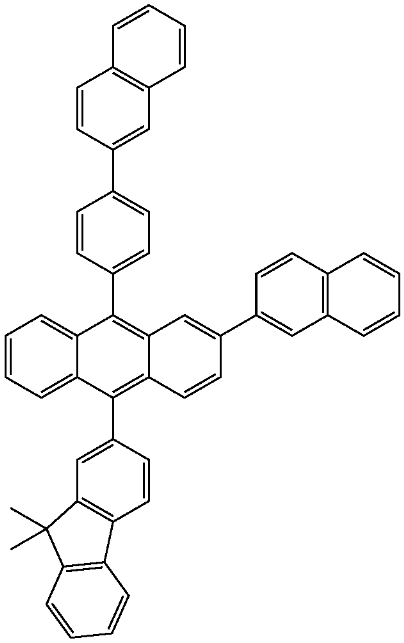
H27
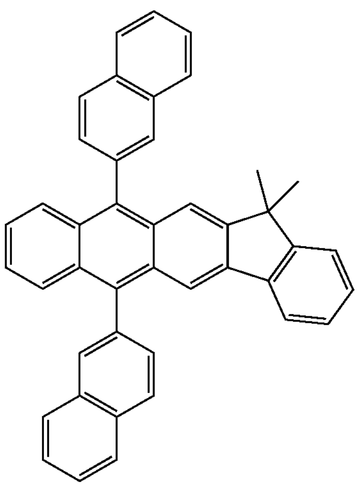
H28
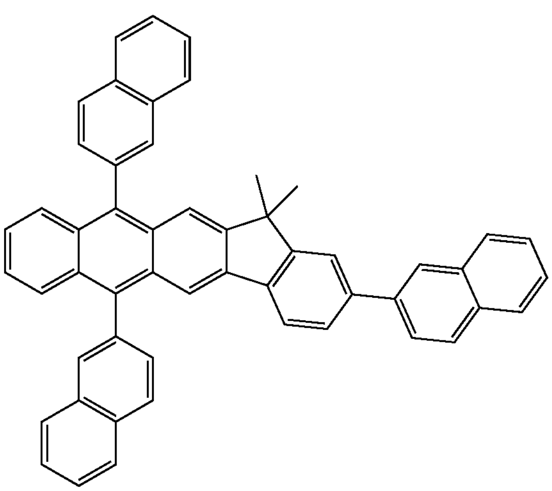
-continued
H29
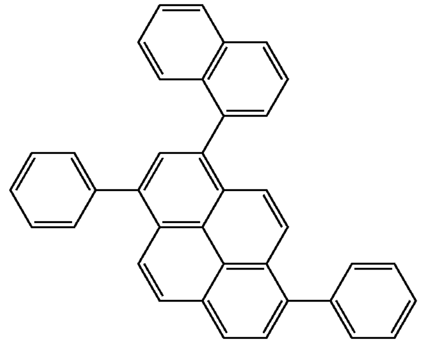
H30
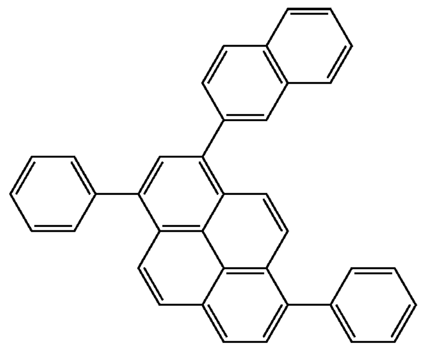
H31
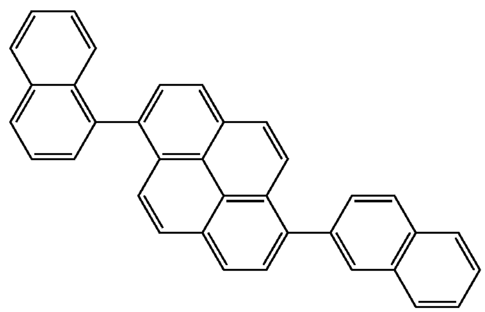
H32
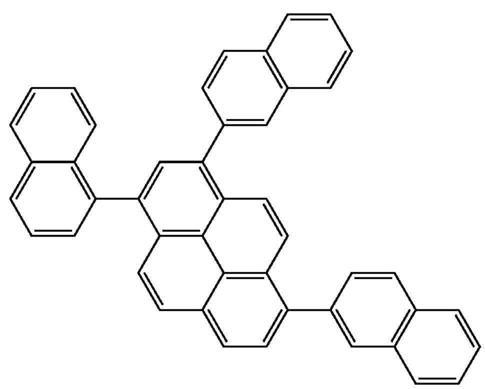
H33
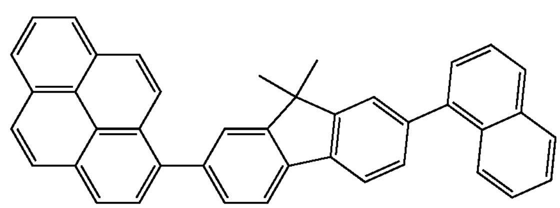

H34
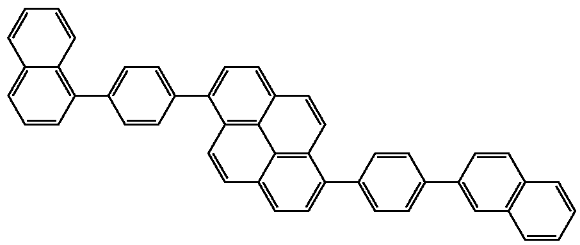
H35
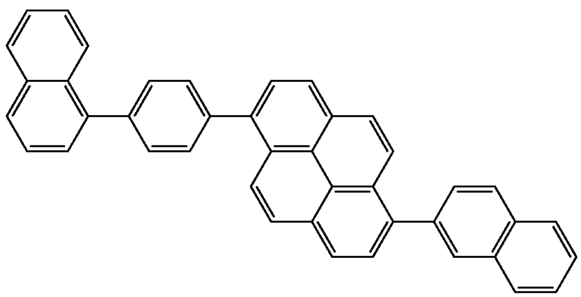
H36
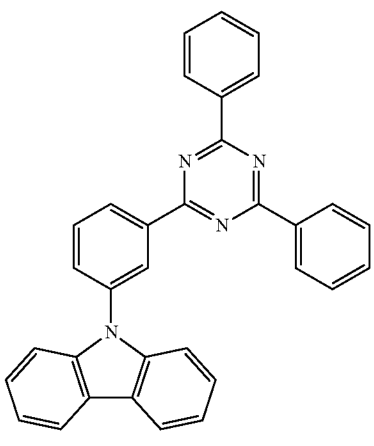
H37
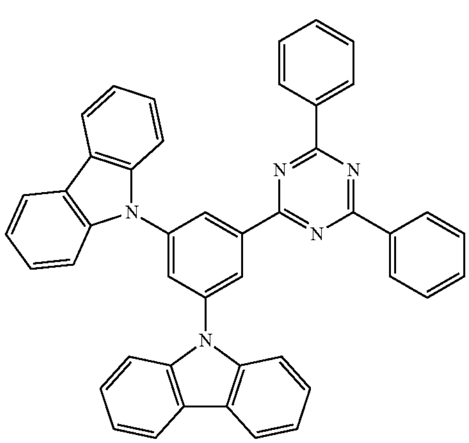
H38
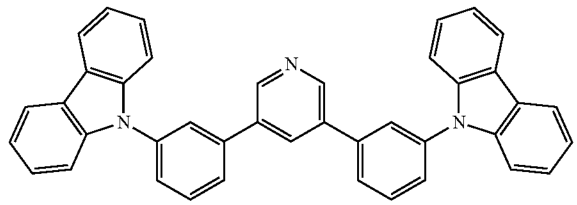
H39
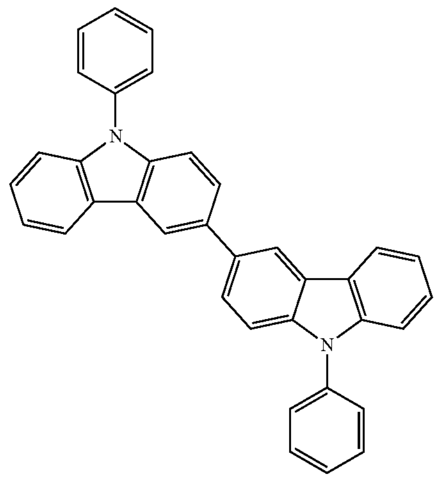
H40
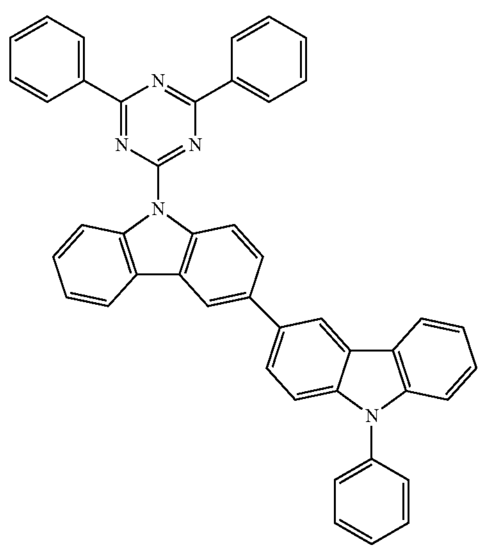

H41
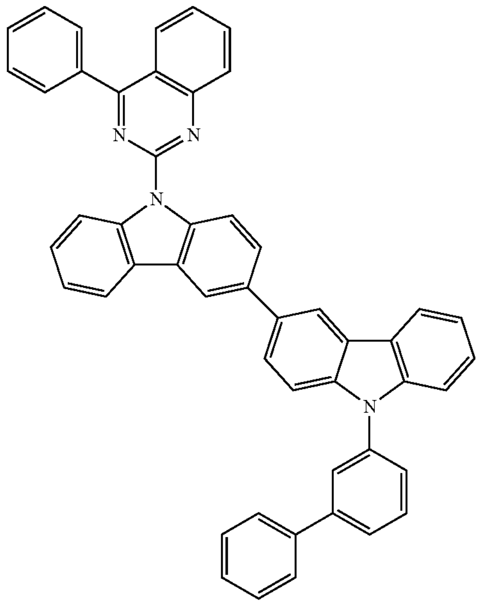
H42
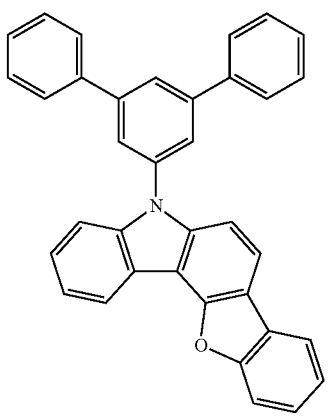
H43
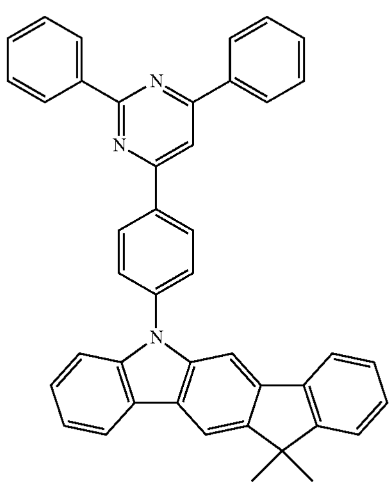
H44
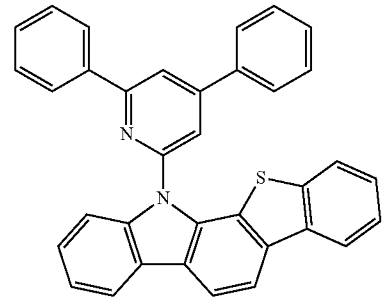
H45
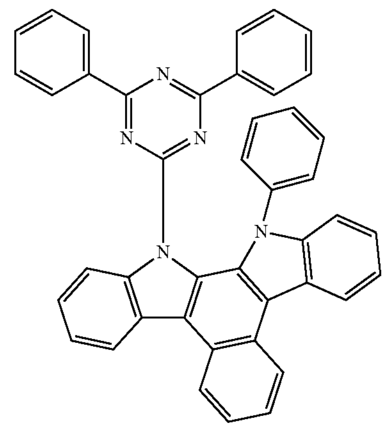
H46
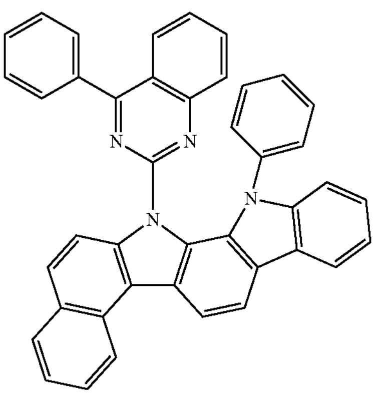
H47
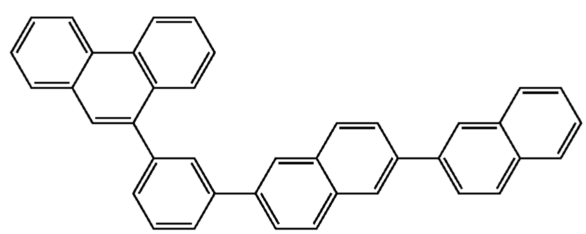
H48
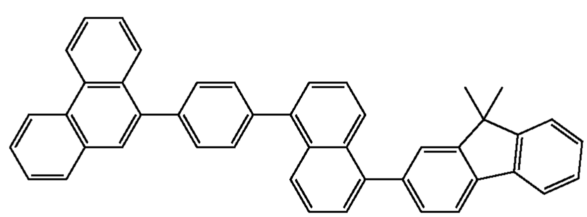

-continued

H49

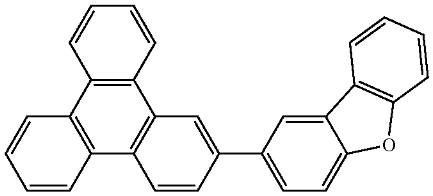

H50

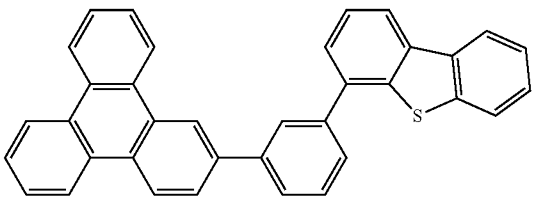

H51

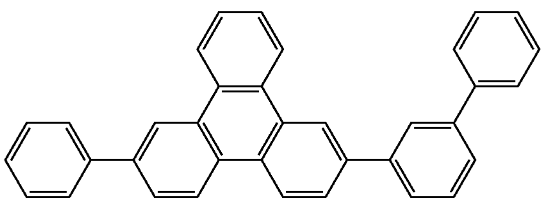

H52

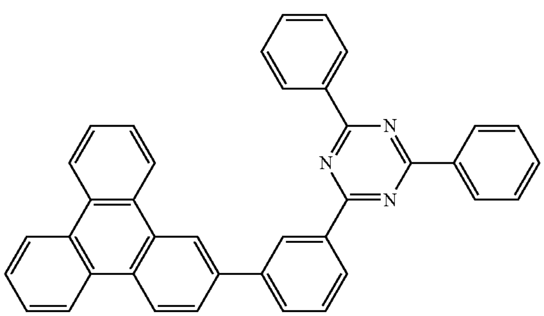

H53

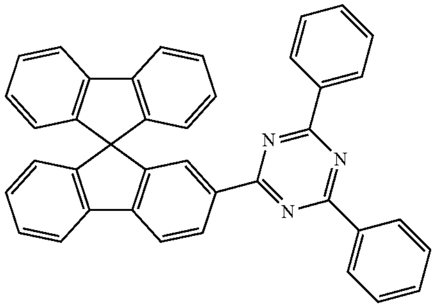

-continued

H54

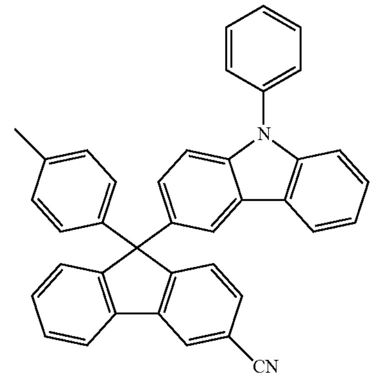

H55

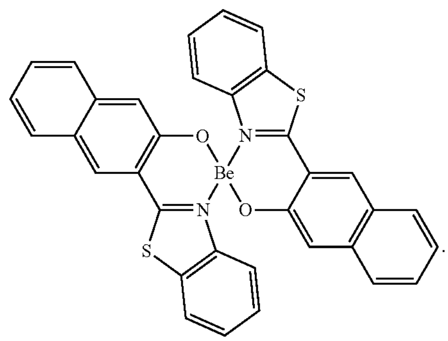

Phosphorescent Dopant Included in Emission Layer in Organic Layer 150

The phosphorescent dopant may include an organometallic complex represented by Formula 401:

$$M(L_{401})_{xc1}(L_{402})_{xc2}$$ Formula 401

Formula 402

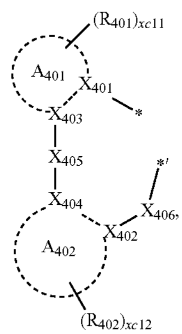

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be a ligand represented by Formula 402, xc1 may be 1, 2, or 3, wherein when xc1 is two or more, two or more $L_{401}$(s) may be identical to or different from each other, $L_{402}$ may be an organic ligand, and xc2 may be an integer selected from 0 to 4, wherein when xc2 is two or more, two or more $L_{402}$(s) may be identical to or different from each other, $X_{401}$ to $X_{404}$ may each independently be nitrogen or carbon, wherein $X_{401}$ and $X_{403}$ may be linked to each other via a single bond or a double bond, and $X_{402}$ and $X_{404}$ may be linked to each other via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *-($Q_{411}$)=*', or *=C($Q_{411}$)=*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer 0 to 10, and

* and *' in Formula 402 may each independently indicate a binding site to M of Formula 401.

In an embodiment, in Formula 402, $A_{401}$ and $A_{402}$ may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In various embodiments, in Formula 402, i) $X_{401}$ may be nitrogen, and $X_{402}$ may be carbon, or ii) $X_{401}$ and $X_{402}$ may both be nitrogen.

In various embodiments, in Formula 402, $R_{401}$ and $R_{402}$ may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments are not limited thereto.

In various embodiments, when xc1 in Formula 401 is two or more, two $A_{401}$(S) in two or more $L_{401}$(S) may be optionally linked to each other via $X_{407}$, which is a linking group, two $A_{402}$(S) in two or more $L_{401}$(s) may be optionally linked to each other via $X_{408}$, which is a linking group (see Compounds PD1 to PD4 and PD7). In various embodiments, $X_{407}$ and $X_{408}$ may each independently be a single bond, *—O—*', *—S—*', *—C(=O)—*', *—N($Q_{413}$)-*', *—C($Q_{413}$)($Q_{414}$)-*', or *—C($Q_{413}$)=C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments are not limited thereto.

In Formula 401, $L_{402}$ may be a monovalent, divalent, or trivalent organic ligand. For example, in Formula 401, $L_{402}$ may be selected from a halogen ligand, a diketone ligand (for example, acetylacetonate), a carboxylic acid ligand (for example, picolinate), —C(=O), an isontrile ligand, —CN, and a phosphorus ligand (for example, phosphine and/or phosphite), but embodiments of the present disclosure are not limited thereto.

In various embodiments, the phosphorescent dopant may be, for example, selected from Compounds PD1 to PD27, but embodiments of the present disclosure are not limited thereto:

-continued
PD1
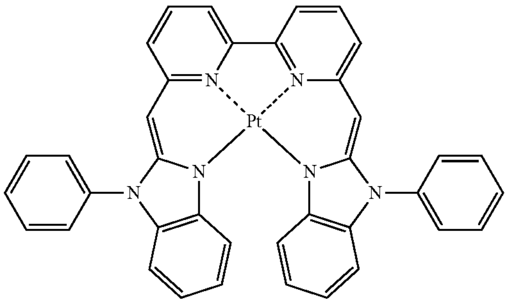
PD2
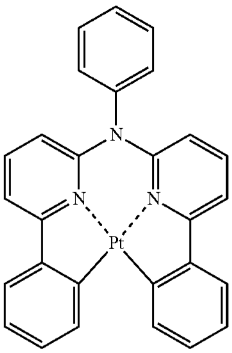
PD3
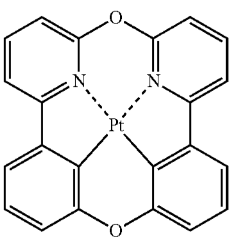
PD4
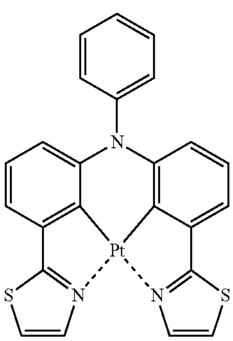
PD5
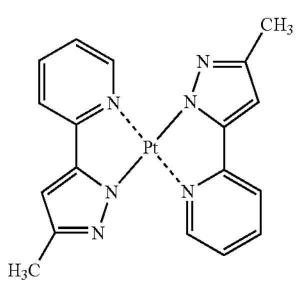
PD6
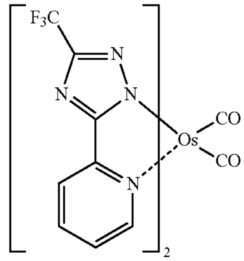
PD7
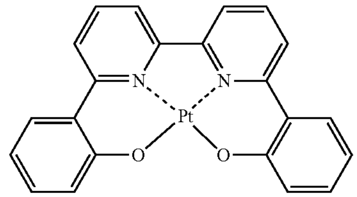
PD8
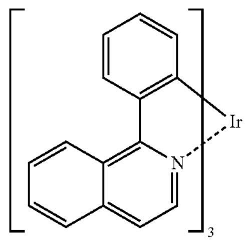
PD9
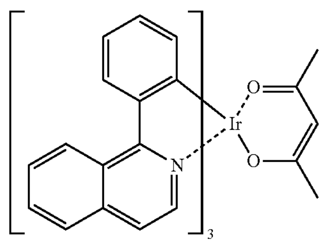
PD10
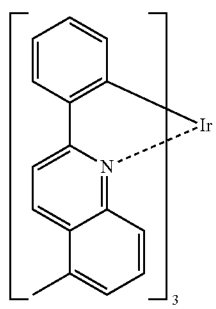
PD11
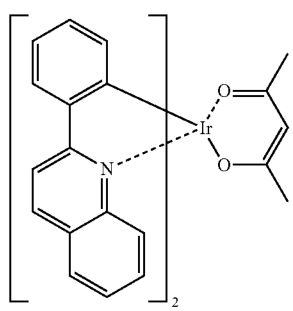

-continued
PD12
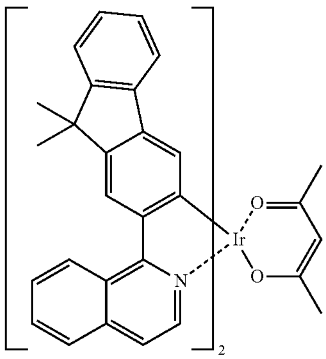
PD13
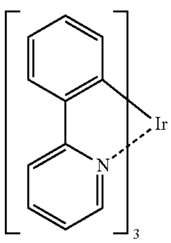
PD14
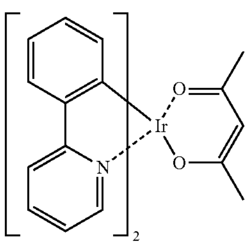
PD15
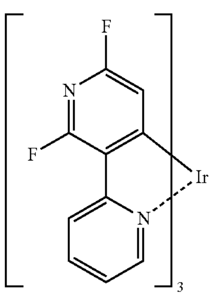
PD16
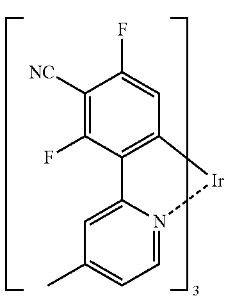
-continued
PD17
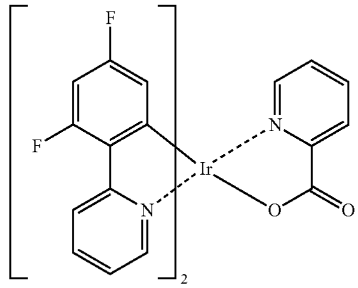
PD18
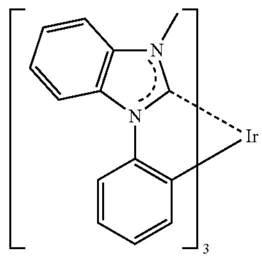
PD19
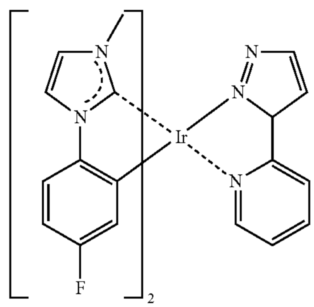
PD20
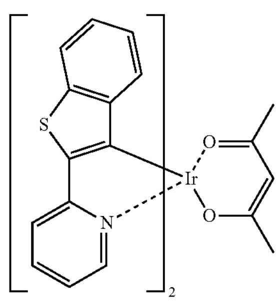
PD21
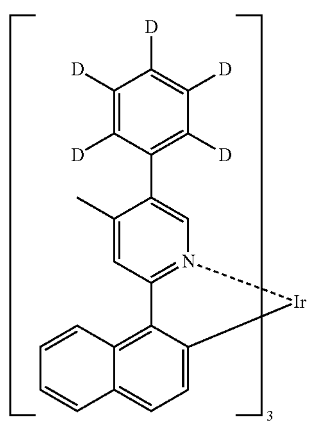

-continued

PD22

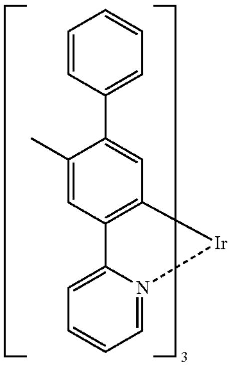

PD23

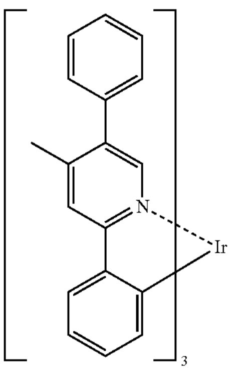

PD24

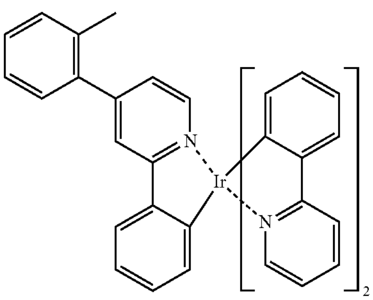

PD25

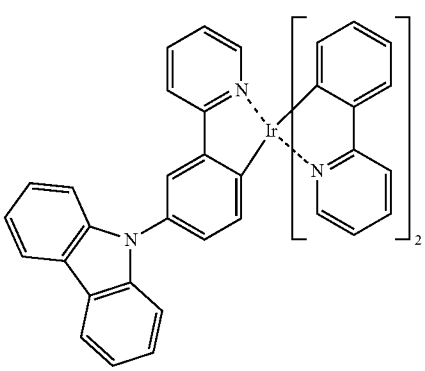

-continued

PD26

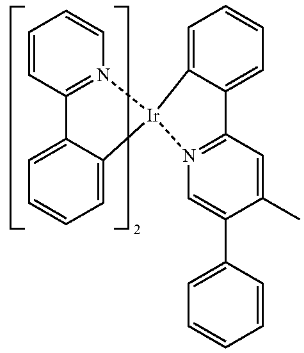

PD27

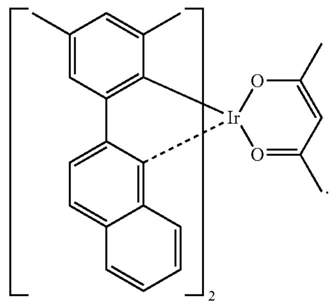

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have a structure of electron transport layer/electron injection layer, a structure of hole blocking layer/electron transport layer/electron injection layer, a structure of electron control layer/electron transport layer/electron injection layer, or a structure of buffer layer/electron transport layer/electron injection layer, wherein for each structure, constituting layers are sequentially stacked from the emission layer in each stated order, but the structure of the electron transport region is not limited thereto.

The electron transport region (for example, a buffer layer, a hole blocking layer, an electron control layer, and/or an electron transport layer in the electron transport region) may include a metal-free compound containing at least one π electron-depleted nitrogen-containing ring.

The "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered hetero monocyclic group having at least one *—N=*' moiety, ii) a hetero-polycyclic group in which two or more 5-membered to 7-membered hetero monocyclic groups each having at least one *—N=*' moiety are condensed with each other, or iii) a hetero-polycyclic group in which at least one of 5-membered to 7-membered hetero monocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazol, an imidazopyridine, an imidazopyrimidine, and an azacarbazole, but embodiments of the present disclosure are not limited thereto.

For example, the electron transport region may include a compound represented by Formula 601.

For example, the electron transport region (for example, a buffer layer, a hole blocking layer, an electron control layer, and/or an electron transport layer in the electron transport region) may include the second compound represented by Formula 2.

In an embodiment, the electron transport region may include a first layer, the first layer including the second compound represented by Formula 2, but embodiments are not limited thereto. Here, the first layer may be an electron transport layer.

In various embodiments, the electron transport region may include a first layer and a second layer, the first layer being disposed between the emission layer and the second layer. The first layer may include the second compound represented by Formula 2, but embodiments of the present disclosure are not limited thereto. Here, the first layer may be a buffer layer, and the second layer may be an electron transport layer.

The electron transport region may further include, in addition to the second compound represented by Formula 2, a compound represented by Formula 601:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer selected from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{601})(Q_{602})(Q_{603})$, $—C(=O)(Q_{601})$, $—S(=O)_2(Q_{601})$, and $—P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer selected from 1 to 5.

In an embodiment, at least one of $Ar_{601}$ in the number of xe11 and $R_{601}$(s) in the number of xe21 may include the π electron-depleted nitrogen-containing ring.

In an embodiment, in Formula 601, ring $Ar_{601}$ may be selected from the group consisting of:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazol group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazol group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, $—Si(Q_{31})(Q_{32})(Q_{33})$, $—S(=O)_2(Q_{31})$, and $—P(=O)(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In Formula 601, when xe11 is two or more, two or more $Ar_{601}$(s) may be linked to each other via a single bond.

In various embodiments, $Ar_{601}$ in Formula 601 may be an anthracene group.

In various embodiments, the compound represented by Formula 601 may be represented by Formula 601-1:

Formula 601-1

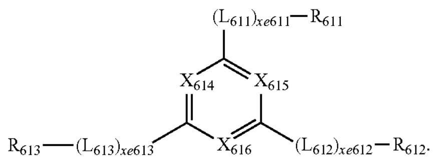

In Formula 601-1, $X_{614}$ may be N or $C(R_{614})$, $X_{615}$ may be N or $C(R_{615})$, and $X_{616}$ may be N or $C(R_{616})$, wherein at least one selected from $X_{614}$ to $X_{616}$ may be nitrogen, $L_{611}$ to $L_{613}$ may each independently be the same as described in connection with $L_{601}$ in Formula 601, xe611 to xe613 may each independently be the same as described in connection with xe1 in Formula 601, $R_{611}$ to $R_{613}$ may each independently be the same as described in connection with $R_{601}$ in Formula 601, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, in Formulae 601 and 601-1, $L_{601}$ and $L_{611}$ to $L_{613}$ may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosiloleylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosiloleylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In various embodiments, in Formulae 601 and 601-1, xe1 and xe611 to xe613 may each independently be 0, 1, or 2.

In various embodiments, in Formulae 601 and 601-1, $R_{601}$ and $R_{611}$ to $R_{613}$ may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$), and —P(=O)(Q$_{601}$)(Q$_{602}$), and Q$_{601}$ and Q$_{602}$ may each independently be understood by referring to the descriptions thereof provided herein.

The electron transport region may include at least one compound selected from Compounds ET1 to ET36, but embodiments are not limited thereto:

ET1

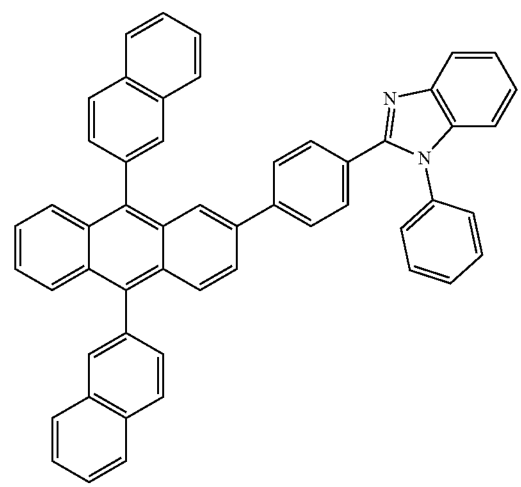

ET2

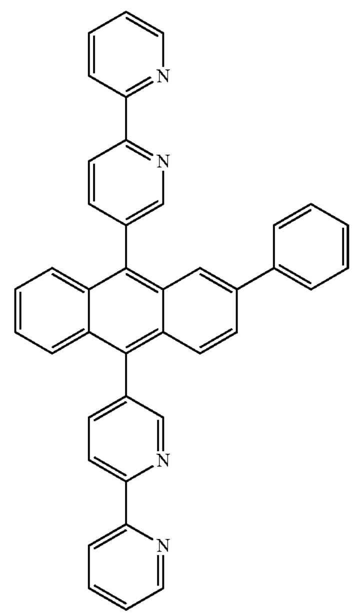

ET3

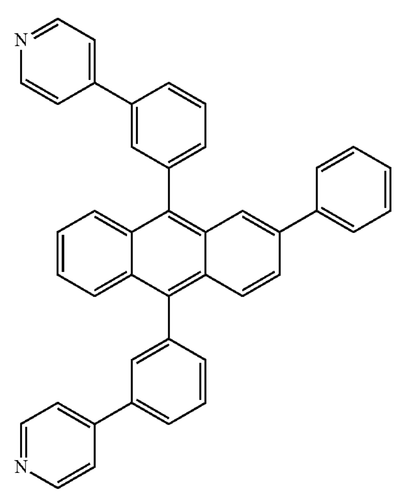

ET4
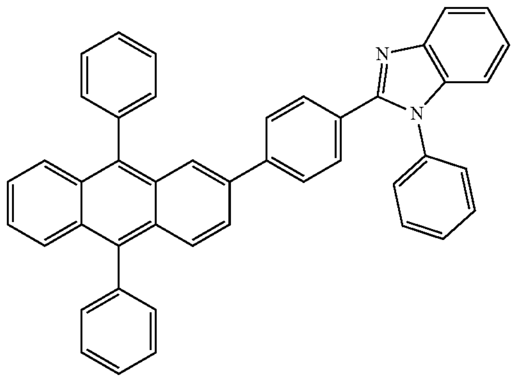
ET5
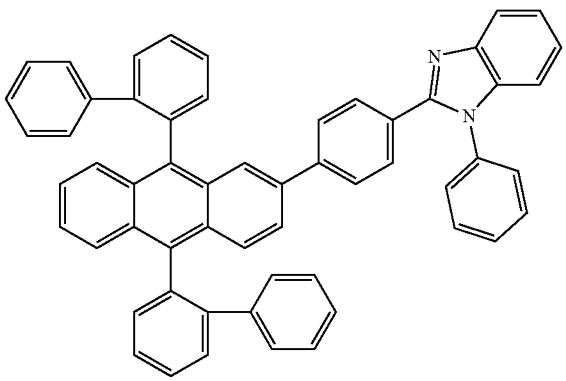
ET6
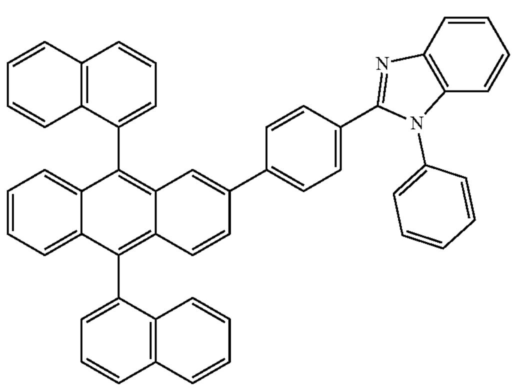
ET7
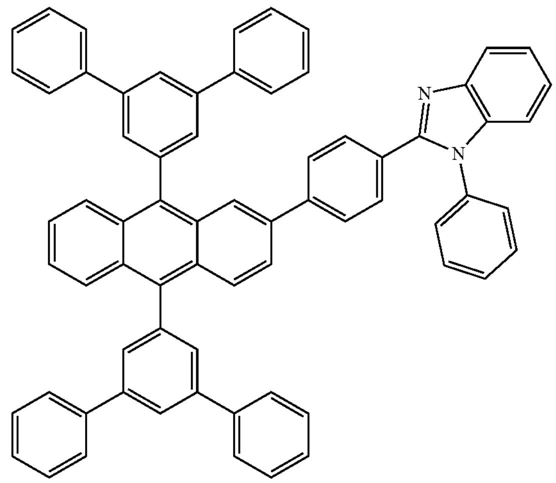
ET8
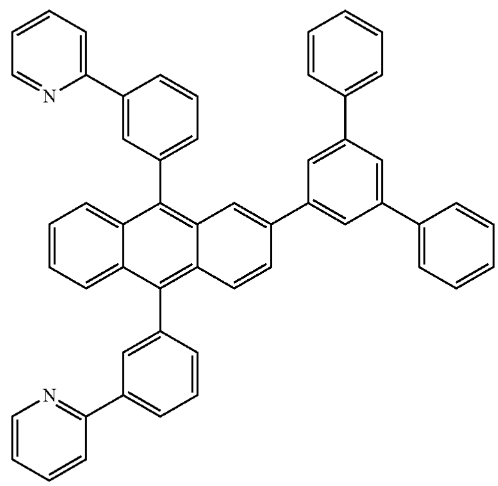
ET9
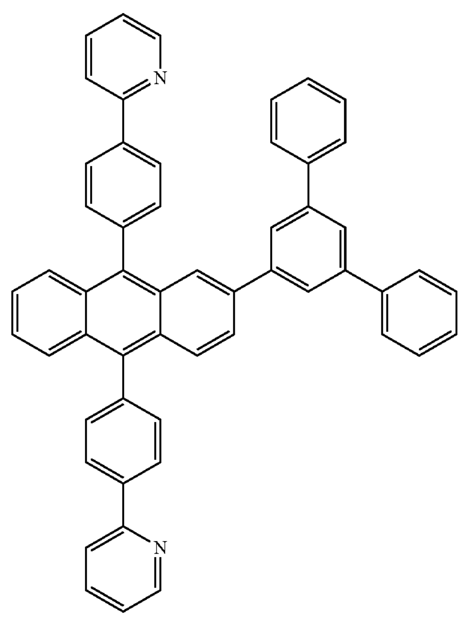

-continued
ET10
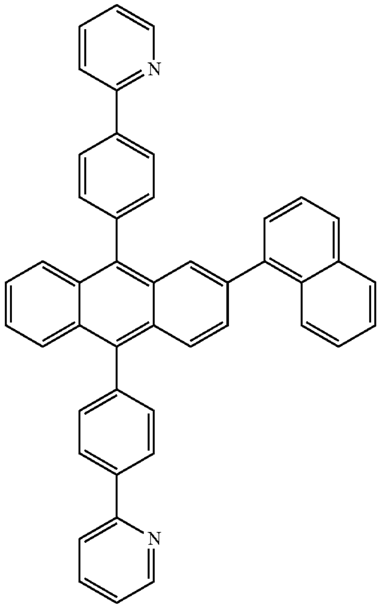
ET11
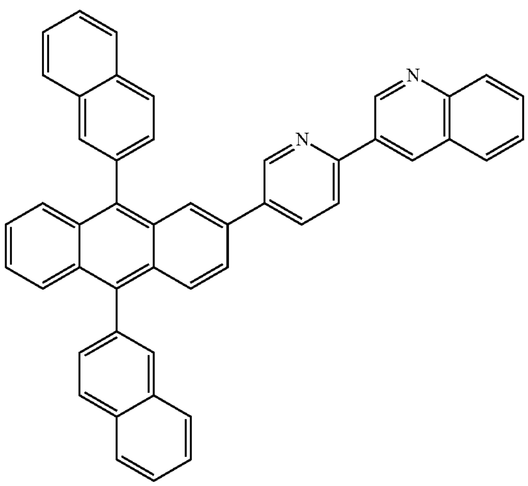
ET12
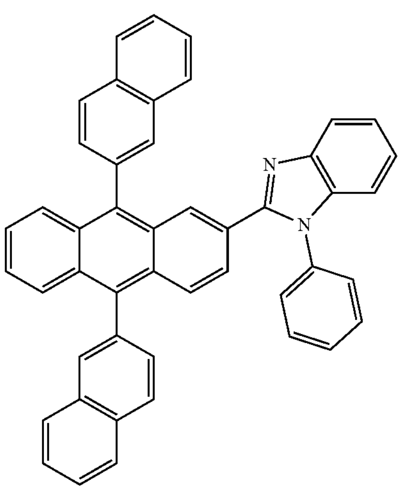
-continued
ET13
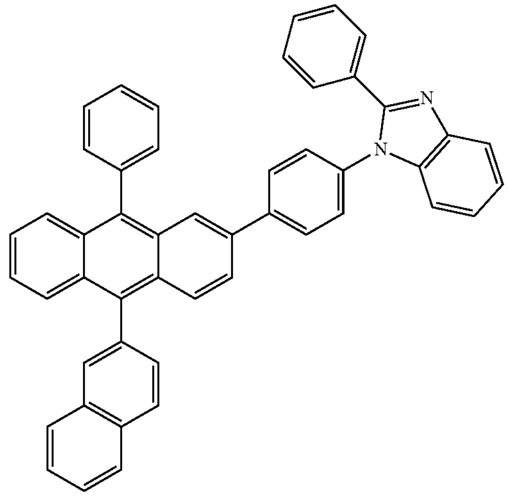
ET14
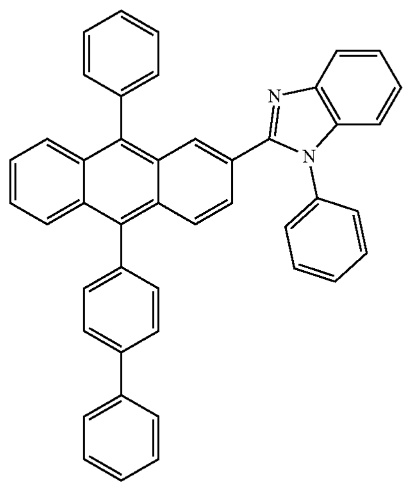
ET15
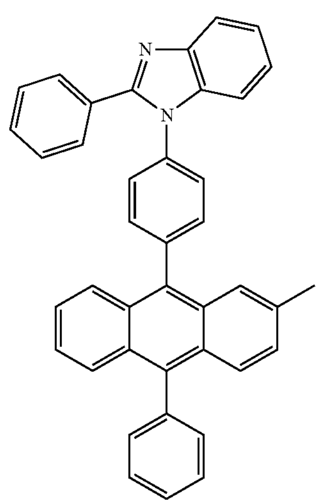

-continued
ET16
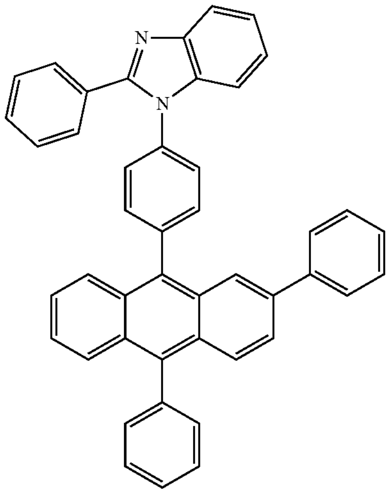
ET17
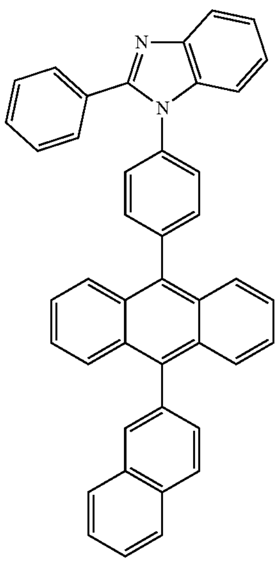
ET18
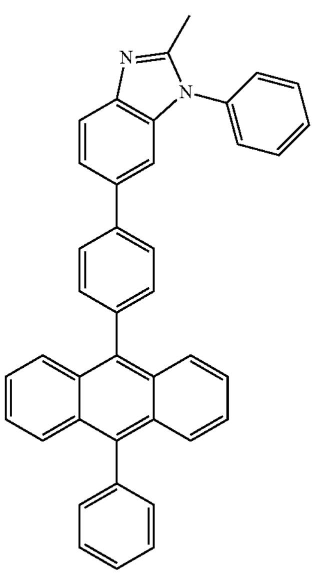
-continued
ET19
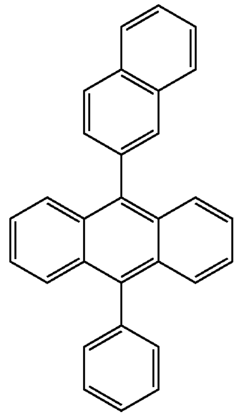
ET20
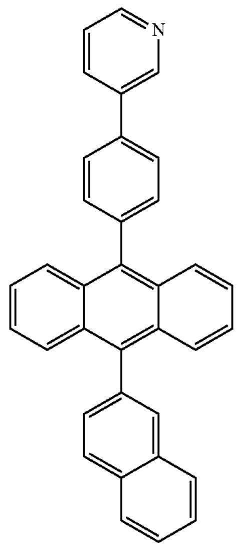
ET21
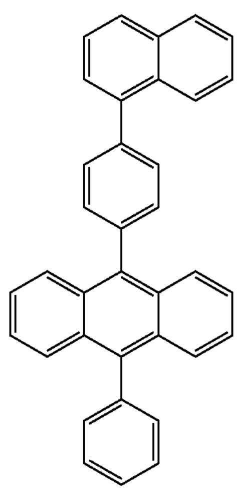

-continued
ET22
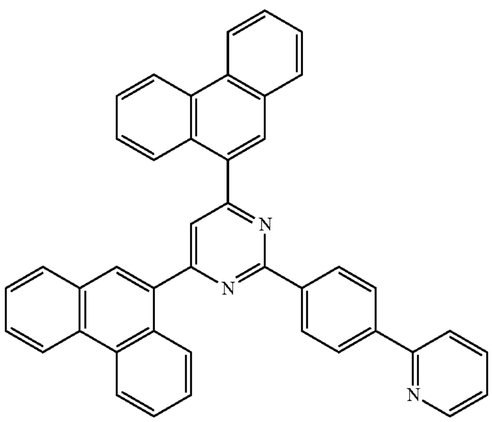
ET23
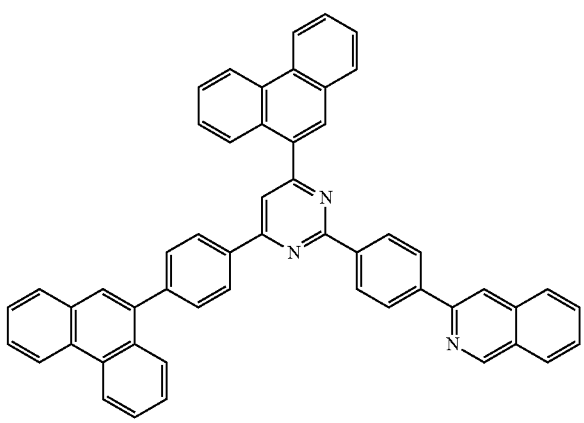
ET24
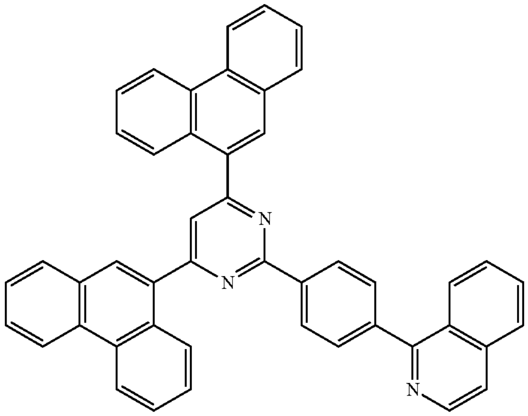
-continued
ET25
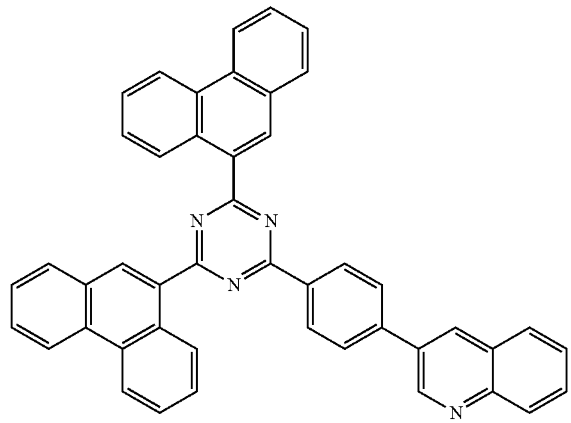
ET26
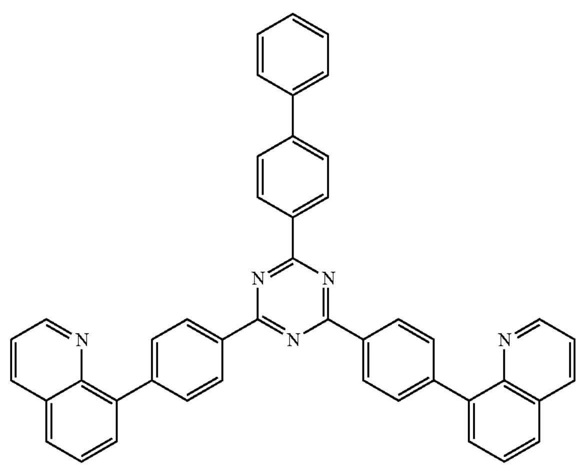
ET27
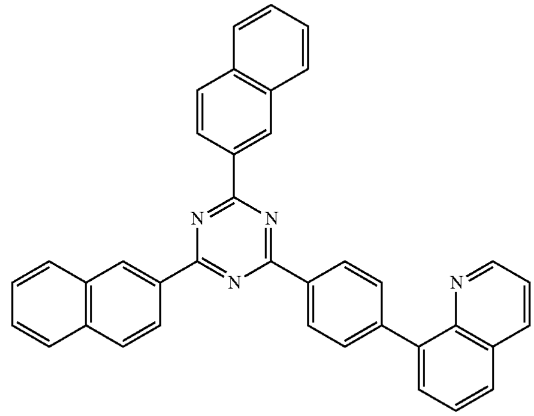

ET28
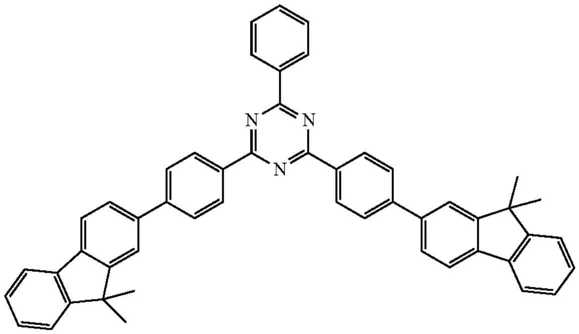
ET29
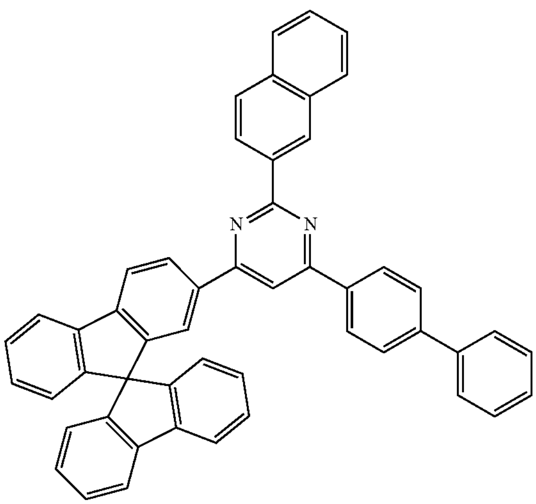
ET30
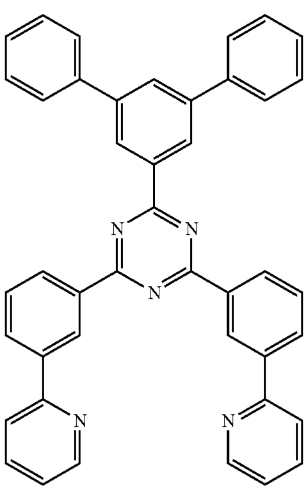
ET31
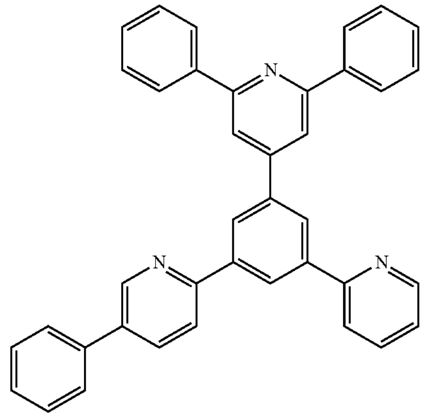
ET32
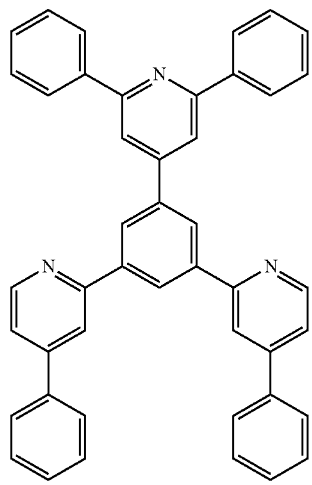
ET33
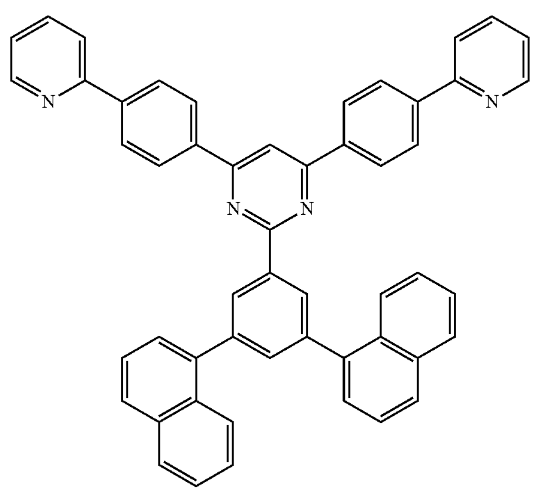

-continued

ET34

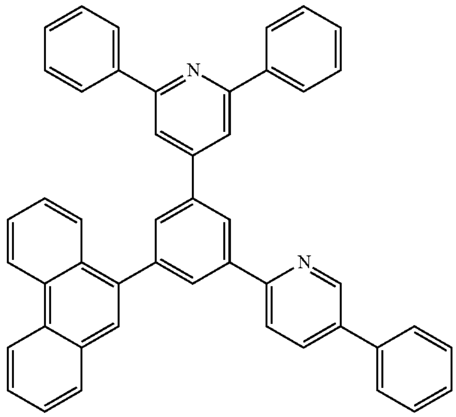

ET35

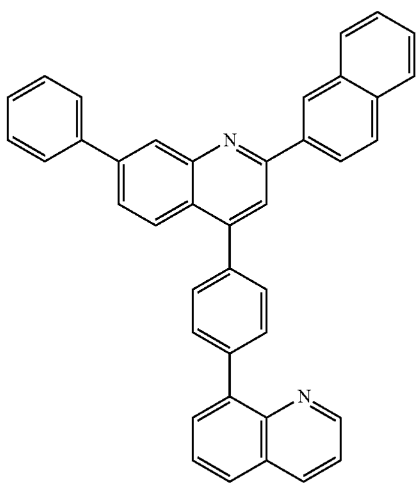

ET36

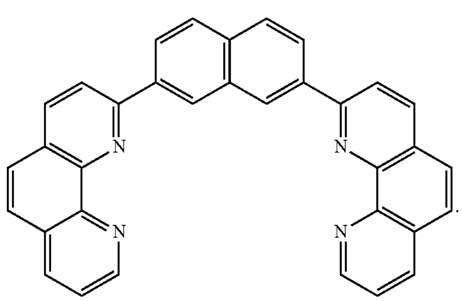

In various embodiments, the electron transport region may include at least one compound selected from 2,9-dimethyl-4,7-diphenyl-1,10-phenanthroline (BCP), 4,7-diphenyl-1, 10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:

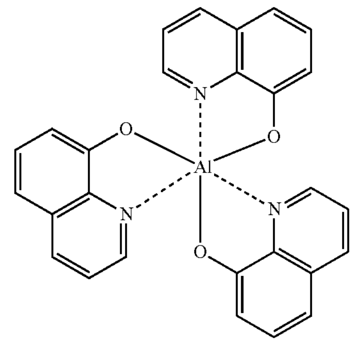

$Alq_3$

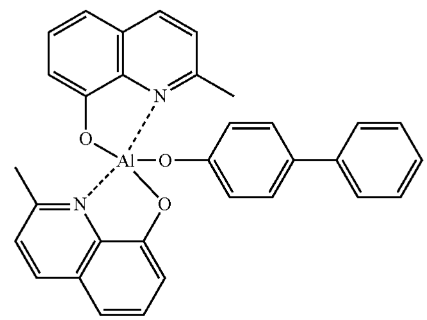

BAlq

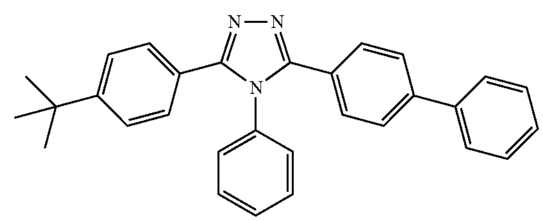

TAZ

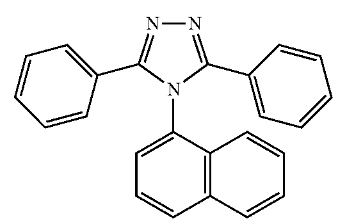

NTAZ

A thickness of the buffer layer, the hole blocking layer, and/or the electron control layer may each independently be in a range of about 20 Å to about 1,000 Å, for example, about 30 Å to about 300 Å. When the thicknesses of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the ranges described above, the electron transport layer may have satisfactory electron transporting characteristics without a substantial increase in driving voltage.

The electron transport region (for example, the electron transport layer in the electron transport region) may further include, in addition to the materials described above, a metal-containing material.

The metal-containing material may include at least one selected from an alkaline metal complex and an alkaline earth-metal complex. The alkaline metal complex may include a metal ion selected from an Li ion, a Na ion, a K ion, a Rb ion, and a Cs ion, and the alkaline earth-metal complex may include a metal ion selected from a Be ion, a Mg ion, a Ca ion, an Sr ion, and a Ba ion. A ligand coordinated with the metal ion of the alkaline metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy diphenylthiadiazol, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

ET-D1

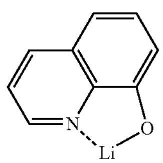

ET-D2

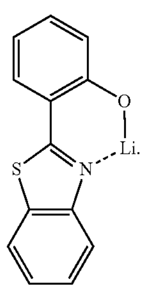

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkaline metal, an alkaline earth-metal, a rare-earth-metal, an alkaline metal compound, an alkaline earth-metal compound, a rare-earth-metal compound, an alkaline metal complex, an alkaline earth-metal complex, a rare-earth metal complex, or a combination thereof.

The alkaline metal may be selected from Li, Na, K, Rb, and Cs. In an embodiment, the alkaline metal may be Li, Na, and/or Cs. In various embodiments, the alkaline metal may be Li and/or Cs, but embodiments of the present disclosure are not limited thereto.

The alkaline earth metal may be selected from Mg, Ca, Sr, and Ba.

The rare-earth metal may be selected from Sc, Y, Ce, Tb, Yb, Gd, and Tb.

The alkaline metal compound, the alkaline earth-metal compound, and the rare-earth metal compound may be selected from oxides and halides (for example, fluorides, chlorides, bromides, and/or iodines) of the alkaline metal, the alkaline earth-metal, and the rare-earth metal.

The alkaline metal compound may be selected from alkaline metal oxides, such as $Li_2O$, $Cs_2O$, and/or $K_2O$, and alkaline metal halides, such as LiF, NaF, CsF, KF, LiI, NaI, CsI, and/or KI. In an embodiment, the alkaline metal compound may be selected from LiF, $Li_2O$, NaF, LiI, NaI, CsI, and KI, but embodiments of the present disclosure are not limited thereto.

The alkaline earth-metal compound may be selected from alkaline earth-metal compounds, such as BaO, SrO, CaO, $Ba_xSr_{1-x}O$ (where $0<x<1$), and/or $Ba_xCa_{1-x}O$ (where $0<x<1$). For example, the alkaline earth-metal compound may be selected from BaO, SrO, and CaO, but embodiments of the present disclosure are not limited thereto.

The rare-earth metal compound may be selected from $YbF_3$, $ScF_3$, $ScO_3$, $Y_2O_3$, $Ce_2O_3$, $GdF_3$, and $TbF_3$. For example, in an embodiment, the rare-earth metal compound may be selected from $YbF_3$, $ScF_3$, $TbF_3$, $YbI_3$, $ScI_3$, and $TbI_3$, but embodiments of the present disclosure are not limited thereto.

The alkaline metal complex, the alkaline earth-metal complex, and the rare-earth metal complex may include an ion of the alkaline metal, the alkaline earth-metal, and the rare-earth metal, and a ligand coordinated with a metal ion of the alkaline metal complex, the alkaline earth-metal complex, and the rare-earth metal complex may each independently be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazol, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

The electron injection layer may include (e.g., consist of) the alkaline metal, the alkaline earth metal, the rare-earth metal, the alkaline metal compound, the alkaline earth-metal compound, the rare-earth metal compound, the alkaline metal complex, the alkaline earth-metal complex, the rare-earth metal complex, or a combination thereof. In various embodiments, the electron injection layer may further include an organic material. When the electron injection layer further includes an organic material, the alkaline metal, the alkaline earth metal, the rare-earth metal, the alkaline metal compound, the alkaline earth-metal compound, the rare-earth metal compound, the alkaline metal complex, the alkaline earth-metal complex, the rare-earth metal complex, or the combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the ranges described above, the electron injection layer may have satisfactory electron injecting characteristics without a substantial increase in driving voltage.

Second Electrode 190

The second electrode 190 may be disposed on the organic layer 150 having such a structure described above. The second electrode 190 may be a cathode which is an electron injection electrode, and in this regard, a material for forming the second electrode 190 may be selected from a metal, an alloy, an electrically conductive compound, and combinations thereof, which have a relatively low work function.

The second electrode 190 may include at least one selected from Li, Ag, Mg, Al, Al-Li, Ca, Mg—In, Mg—Ag, ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
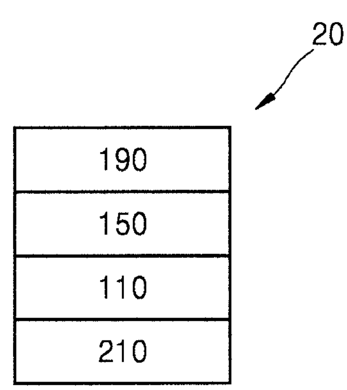
FIG. 2 is a schematic cross-sectional view of an organic light-emitting device according to another embodiment.
Figure 3:
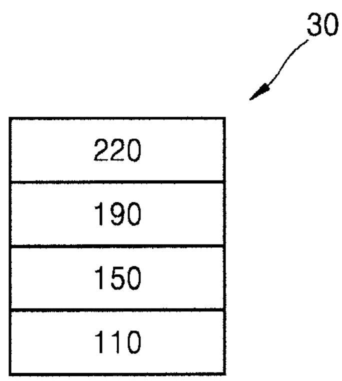
FIG. 3 is a schematic cross-sectional view of an organic light-emitting device according to another embodiment.
Figure 4:
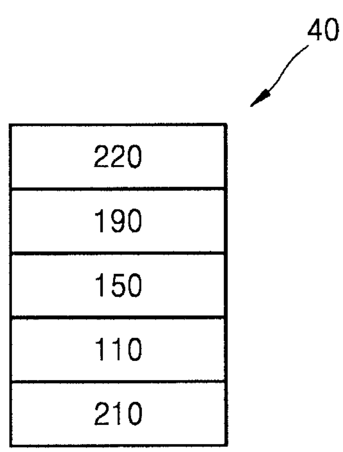
FIG. 4 is a schematic cross-sectional view of an organic light-emitting device according to another embodiment.

Descriptions of FIGS. 2 to 4

An organic light-emitting device 20 of FIG. 2 includes a first capping layer 210, a first electrode 110, an organic layer 150, and a second electrode 190, which are sequentially stacked in this stated order, an organic light-emitting device 30 of FIG. 3 includes a first electrode 110, an organic layer 150, a second electrode 190, and a second capping layer 220, which are sequentially stacked in this stated order, and an organic light-emitting device 40 of FIG. 4 includes a first capping layer 210, a first electrode 110, an organic layer 150, a second electrode 190, and a second capping layer 220, which are sequentially stacked in this stated order.

Regarding FIGS. 2 to 4, the first electrode 110, the organic layer 150, and the second electrode 190 may each independently be understood by referring to the descriptions thereof presented in connection with FIG. 1.

In the organic layer 150 of each of the organic light-emitting devices 20 and 40, light generated in the emission layer may pass through the first electrode 110, which is a semi-transmissive electrode or a transmissive electrode, and the first capping layer 210 toward the outside, and in the organic layer 150 of each of the organic light-emitting devices 30 and 40, light generated in the emission layer may pass through the second electrode 190, which is a semi-transmissive electrode or a transmissive electrode, and the second capping layer 220 toward the outside.

The first capping layer 210 and the second capping layer 220 may increase external luminescent efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may include at least one material selected from a carbocyclic compound, a heterocyclic compound, an amine-based compound, a porphine derivative, a phthalocyanine derivative, a naphthalocyanine derivative, an alkaline metal complex, and an alkaline earth-based complex. The carbocyclic compound, the heterocyclic compound, and the amine-based compound may be optionally substituted with a substituent containing at least one element selected from O, N, S, Se, Si, F, Cl, Br, and I.

In an embodiment, at least one selected from the first capping layer 210 and the second capping layer 220 may include an amine-based compound.

In various embodiments, at least one selected from the first capping layer 210 and the second capping layer 220 may include the compound represented by Formula 201 or the compound represented by Formula 202.

In various embodiments, at least one selected from the first capping layer 210 and the second capping layer 220 may include a compound selected from Compounds HT28 to HT33 and Compounds CP1 to CP5, but embodiments of the present disclosure are not limited thereto:

CP1

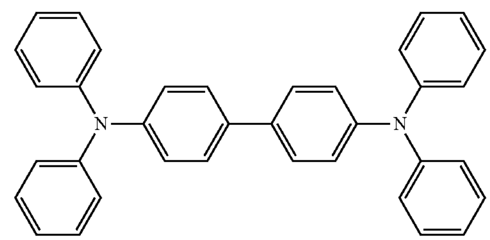

CP2

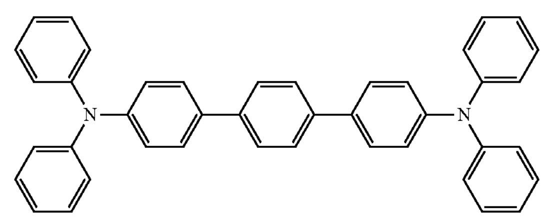

CP3

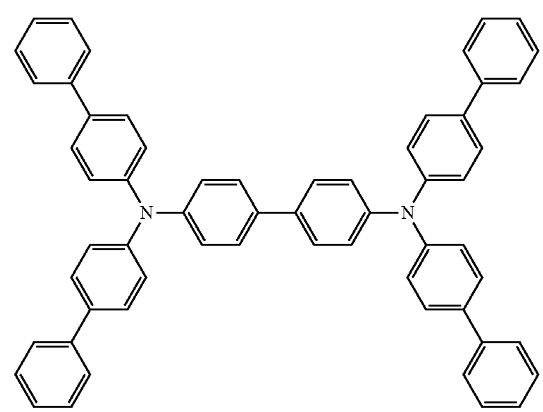

CP4

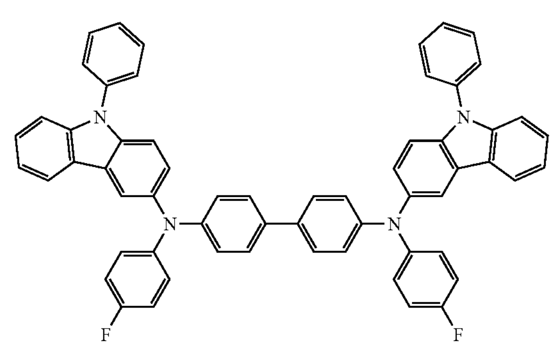

-continued

CP5

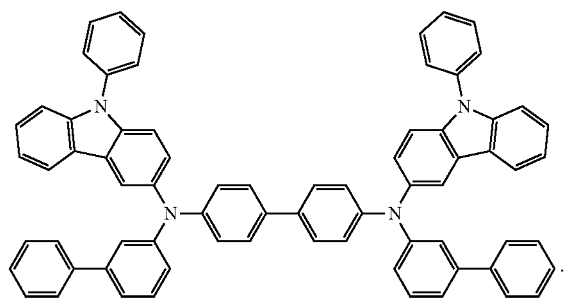

Hereinbefore, the organic light-emitting device according to an embodiment has been described in connection with FIGS. 1 to 4. However, embodiments are not limited thereto.

Layers constituting the hole transport region, the emission layer, and layers constituting the electron transport region may each independently be formed in a certain region by utilizing one or more suitable methods selected from vacuum deposition, spin coating, casting, langmuir-blodgett (LB) deposition, ink-jet printing, laser-printing, and laser-induced thermal imaging (LITI).

When layers constituting the hole transport region, the emission layer, and layers constituting the electron transport region are each independently formed by vacuum deposition, the vacuum deposition may be, for example, performed at a deposition temperature of about 100° C. to about 500° C., at a vacuum degree of about $10^{-8}$ to about $10^{-3}$ torr, and at a deposition rate of about 0.01 to about 100 Å/sec by taking into account a material to be included in a layer to be formed, and a structure of the layer to be formed.

When layers constituting the hole transport region, the emission layer, and layers constituting the electron transport region are each independently formed by spin coating, the spin coating may be, for example, performed at a coating speed of about 2,000 rpm to about 5,000 rpm and at a heat treatment temperature of about 80° C. to 200° C. by taking into account a material to be included in a layer to be formed, and a structure of the layer to be formed.

General Definition of Substituents

A "$C_1$-$C_{60}$ alkyl group," as used herein, refers to a linear or branched aliphatic saturated hydrocarbon monovalent group having 1 to 60 carbon atoms, and examples thereof include a methyl group, an ethyl group, a propyl group, an isobutyl group, a sec-butyl group, a ter-butyl group, a pentyl group, an iso-amyl group, and a hexyl group. A "$C_1$-$C_{60}$ alkylene group," as used herein, refers to a divalent group having substantially the same structure as the $C_1$-$C_{60}$ alkyl group.

A "$C_2$-$C_{60}$ alkenyl group," as used herein, refers to a hydrocarbon group having at least one carbon-carbon double bond at one or more positions along the hydrocarbon chain (e.g., in the in the middle or at either terminal end of the $C_2$-$C_{60}$ alkyl group), and examples thereof include an ethenyl group, a propenyl group, and a butenyl group. A "$C_2$-$C_{60}$ alkenylene group," as used herein, refers to a divalent group having substantially the same structure as the $C_2$-$C_{60}$ alkenyl group.

A "$C_2$-$C_{60}$ alkynyl group," as used herein, refers to a hydrocarbon group having at least one carbon-carbon triple bond at one or more positions along the hydrocarbon chain (e.g., in the in the middle or at either terminal end of the $C_2$-$C_{60}$ alkyl group), and examples thereof include an ethynyl group and a propynyl group. A "$C_2$-$C_{60}$ alkynylene group," as used herein, refers to a divalent group having substantially the same structure as the $C_2$-$C_{60}$ alkynyl group.

A "$C_1$-$C_{60}$ alkoxy group," as used herein, refers to a monovalent group represented by —$OA_{101}$ (where $A_{101}$ is the $C_1$-$C_{60}$ alkyl group), and examples thereof include a methoxy group, an ethoxy group, and an isopropyloxy group.

A "$C_3$-$C_{10}$ cycloalkyl group," as used herein, refers to a monovalent saturated hydrocarbon monocyclic saturated group having 3 to 10 carbon atoms, and examples thereof include a cyclopropyl group, a cyclobutyl group, a cyclopentyl group, a cyclohexyl group, and a cycloheptyl group. A "$C_3$-$C_{10}$ cycloalkylene group," as used herein, may refer to a divalent group having the same structure as the $C_3$-$C_{10}$ cycloalkyl group.

A "$C_1$-$C_{10}$ heterocycloalkyl group," as used herein, refers to a monovalent saturated monocyclic group having at least one heteroatom selected from N, O, P, Si and S as a ring-forming atom in addition to 1 to 10 carbon atoms, and examples thereof include a 1,2,3,4-oxatriazolidinyl group, a tetrahydrofuranyl group, and a tetrahydrothiophenyl group. A "$C_1$-$C_{10}$ heterocycloalkylene group," as used herein, refers to a divalent group having substantially the same structure as the $C_1$-$C_{10}$ heterocycloalkyl group.

A "$C_3$-$C_{10}$ cycloalkenyl group," as used herein, refers to a monovalent saturated monocyclic group that has 3 to 10 carbon atoms and at least one carbon-carbon double bond in the ring thereof and does not have aromaticity, and examples thereof include a cyclopentenyl group, a cyclohexenyl group, and a cycloheptenyl group. A "$C_3$-$C_{10}$ cycloalkenylene group," as used herein, refers to a divalent group having substantially the same structure as the $C_3$-$C_{10}$ cycloalkenyl group.

A "$C_1$-$C_{10}$ heterocycloalkenyl group," as used herein, refers to a monovalent monocyclic group that has at least one heteroatom selected from N, O, P, Si, and S as a ring-forming atom in addition to 1 to 10 carbon atoms, and at least one carbon-carbon double bond in the ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. A "$C_1$-$C_{10}$ heterocycloalkenylene group," as used herein, refers to a divalent group having substantially the same structure as the $C_1$-$C_{10}$ heterocycloalkenyl group.

A "$C_6$-$C_{60}$ aryl group," as used herein, refers to a monovalent group having a cyclic aromatic system having 6 to 60 carbon atoms, and a "$C_6$-$C_{60}$ arylene group," as used herein, refers to a divalent group having an aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused to each other or may be linked with each other via a single bond.

A "$C_1$-$C_{60}$ heteroaryl group," as used herein, refers to a monovalent group having a heterocyclic aromatic system that has at least one heteroatom selected from N, O, Si, P, and S as a ring-forming atom in addition to 1 to 60 carbon atoms. A "$C_1$-$C_{60}$ heteroarylene group," as used herein, refers to a divalent group having a heterocyclic aromatic system that has at least one heteroatom selected from N, O, Si, P, and S as a ring-forming atom in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused to each other or may be linked with each other via a single bond.

A "$C_6$-$C_{60}$ aryloxy group," as used herein, refers to a group represented by —$OA_{102}$ (where $A_{102}$ is the $C_6$-$C_{60}$ aryl group), and a "$C_6$-$C_{60}$ arylthio group," as used herein, refers to a group represented by —$SA_{103}$ (where $A_{103}$ is the $C_6$-$C_{60}$ aryl group).

A "monovalent non-aromatic condensed polycyclic group," as used herein, refers to a monovalent group that has two or more rings condensed to each other, has only carbon atoms as ring-forming atoms (for example, 8 to 60 carbon atoms), and has non-aromaticity in the entire molecular structure. An example of the monovalent non-aromatic condensed polycyclic group includes a fluorenyl group. A "divalent non-aromatic condensed polycyclic group," as used herein, refers to a divalent group having substantially the same structure as the monovalent non-aromatic condensed polycyclic group.

A "monovalent non-aromatic condensed heteropolycyclic group," as used herein, refers to a monovalent group that has two or more rings condensed to each other, has at least one heteroatom selected from N, O, Si, P, and S as a ring-forming atom, in addition to carbon atoms (for example, 1 to 60 carbon atoms), and has non-aromaticity in the entire molecular structure. An example of the monovalent non-aromatic condensed heteropolycyclic group includes a carbazolyl group. A "divalent non-aromatic condensed heteropolycyclic group," as used herein, refers to a divalent group having substantially the same structure as the monovalent non-aromatic condensed heteropolycyclic group.

A "$C_5$-$C_{60}$ carbocyclic group," as used herein, refers to a monocyclic or polycyclic group having 5 to 60 carbon atoms in which the ring-forming atoms include only carbon atoms. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In various embodiments, depending on the number of substituents connected to the $C_5$-$C_{60}$ carbocyclic group, the $C_5$-$C_{60}$ carbocyclic group may be a trivalent group or a quadrivalent group.

A "$C_1$-$C_{60}$ heterocyclic group," as used herein, refers to a group having substantially the same structure as the $C_5$-$C_{60}$ carbocyclic group, except that as a ring-forming atom, at least one heteroatom selected from N, O, Si, P, and S is used in addition to carbon atom (the number of carbon in the $C_1$-$C_{60}$ heterocyclic group may be in a range of 1 to 60).

A "$C_6$-$C_{60}$ arene group," as used herein, refers to an aliphatic monocyclic group or a polycyclic group, each having 6 to 60 carbon atoms in which a ring-forming atom is a carbon atom only. The $C_6$-$C_{60}$ arene group may be a ring, such as benzene, a monovalent group, such as a phenyl group, or a divalent group, such as a phenylene group. In various embodiments, depending on the number of substituents connected to the $C_6$-$C_{60}$ arene group, the $C_6$-$C_{60}$ arene group may be a trivalent group or a quadrivalent group.

A "$C_1$-$C_{60}$ heteroarene group," as used herein, refers to a group having substantially the same structure as the $C_6$-$C_{60}$ arene group, except that as a ring-forming atom, at least one heteroatom selected from N, O, Si, P, and S is used in addition to carbon (the number of carbon in the $C_1$-$C_{60}$ heteroarene group may be in a range of 1 to 60).

In the present specification, at least one substituent of the substituted substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{11}$ to $Q_{13}$, $Q_{21}$ to $Q_{23}$ and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph," as used herein, refers to a phenyl group, the term "Me," as used herein, refers to a methyl group, the term "Et," as used herein, refers to an ethyl group, the term "ter-Bu" or "$Bu^t$," as used herein, refers to a tert-butyl group, the term "D," as used herein, refers to deuterium, and the term "OMe," as used herein, refers to a methoxy group.

The term "biphenyl group," as used therein, refers to "a phenyl group substituted with a phenyl group". The "biphenyl group" belongs to "a substituted phenyl group" having a "$C_6$-$C_{60}$ aryl group" as a substituent.

The term "terphenyl group," as used herein, refers to "a phenyl group substituted with a biphenyl group". The "terphenyl group" belongs to "a substituted phenyl group" having "a $C_6$-$C_{60}$ aryl group substituted with a $C_6$-$C_{60}$ aryl group".

* and *', as used herein, unless defined otherwise, each indicate a binging site to a neighboring atom in a corresponding formula.

Hereinafter, a compound according to one or more embodiments and an organic light-emitting device according to one or more embodiments will be described in more detail with reference to Synthesis Examples and Examples. The phrase "B was utilized instead of A" used in describing Synthesis Examples refers to that an identical number of molar equivalents of B was utilized in place of molar equivalents of A.

EXAMPLES

Example 1-1

An anode was prepared by cutting a glass substrate, on which ITO/Ag/ITO having a thickness of 70 Å/1,000 Å/70 Å was formed, to a size of 50 mm×50 mm×0.4 mm, ultrasonically cleaning the glass substrate by utilizing isopropyl alcohol and pure water for 10 minutes each, and then irradiating UV light for 10 minutes thereto and exposing the glass substrate to ozone to clean the glass substrate. Then, the anode was loaded into a vacuum deposition apparatus.

Compound HT28 was vacuum-deposited on the ITO anode of the glass substrate to form a hole injection layer having a thickness of 700 Å, and then, Compound HT3 was vacuum-deposited on the hole injection layer to form a hole transport layer having a thickness of 1,200 Å.

Compound B-108 and PD27 (as a dopant) were co-deposited on the hole transport region at a weight ratio of 97:3 to form an emission layer having a thickness of 400 Å.

Subsequently, Compound E-36 and LiQ were deposited (e.g., co-deposited) on the emission layer at a ratio of 1:1 to form an electron transport layer having a thickness of 360 Å. Then, LIQ was deposited on the electron transport layer to form an electron injection layer having a thickness of 10 Å, thereby forming an electron transport region. Mg and Ag were vacuum-deposited on the electron transport layer at a weight ratio of 9:1 to form a cathode having a thickness of 120 Å, thereby completing the manufacturing of an organic light-emitting device.

Examples 1-2 to 1-16 and Comparative Examples 1-1 to 1-5

Organic light-emitting devices were manufactured in substantially the same manner as in Example 1-1, except that compounds shown in Table 1 were utilized instead of Compounds B-108 and E-36 in the formation of the emission layer and the electron transport layer.

TABLE 1

| Example | Host in emission layer | Electron transport layer |
|---|---|---|
| Example 1-1 | B-108 | E-36 |
| Example 1-2 | B-148 | E-36 |
| Example 1-3 | B-173 | E-36 |
| Example 1-4 | B-135 | E-36 |
| Example 1-5 | B-108 | E-173 |
| Example 1-6 | B-148 | E-173 |
| Example 1-7 | B-173 | E-173 |
| Example 1-8 | B-135 | E-173 |
| Example 1-9 | B-108 | E-100 |
| Example 1-10 | B-148 | E-100 |
| Example 1-11 | B-173 | E-100 |
| Example 1-12 | B-135 | E-100 |
| Example 1-13 | B-108 | E-273 |
| Example 1-14 | B-148 | E-273 |
| Example 1-15 | B-173 | E-273 |
| Example 1-16 | B-135 | E-273 |
| Comparative Example 1-1 | B-108 | ET1 |
| Comparative Example 1-2 | B-148 | ET1 |
| Comparative Example 1-3 | B-173 | ET1 |
| Comparative Example 1-4 | B-135 | ET1 |
| Comparative Example 1-5 | CBP | B |

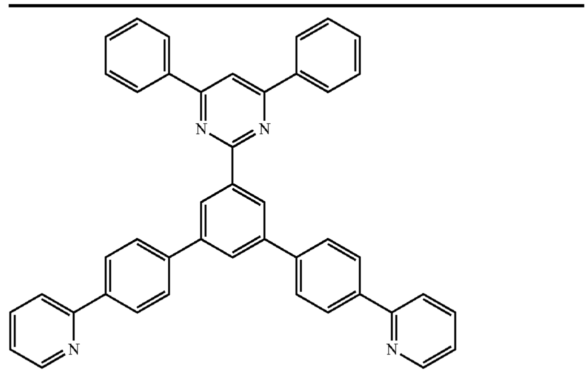

B

Examples 2-1 to 2-8 and Comparative Examples 2-1 to 2-2

Organic light-emitting devices were manufactured in substantially the same manner as in Example 1-1, except that compounds shown in Table 2 were utilized instead of Compounds B-108 and E-36 in the formation of the emission layer and the electron transport layer.

TABLE 2

| Example | Host in emission layer | electron transport layer |
|---|---|---|
| Example 2-1 | C-221 | E-36 |
| Example 2-2 | C-209 | E-36 |

TABLE 2-continued

| Example | Host in emission layer | electron transport layer |
|---|---|---|
| Example 2-3 | C-221 | E-173 |
| Example 2-4 | C-209 | E-173 |
| Example 2-5 | C-221 | E-100 |
| Example 2-6 | C-209 | E-100 |
| Example 2-7 | C-221 | E-273 |
| Example 2-8 | C-209 | E-273 |
| Comparative Example 2-1 | B-108 | ET1 |
| Comparative Example 2-2 | B-148 | ET1 |

Example 3-1

An anode was preparing by cutting a glass substrate, on which ITO/Ag/ITO having a thickness of 70 Å/1,000 Å/70 Å was deposited, to a size of 50 mm×50 mm×0.4 mm, ultrasonically cleaning the glass substrate by utilizing isopropyl alcohol and pure water for 10 minutes each, and then irradiating UV light for 10 minutes thereto and exposing the glass substrate to ozone to clean the glass substrate. Then, the anode was loaded into a vacuum deposition apparatus.

Compound HT28 was vacuum-deposited on the ITO anode of the glass substrate to form a hole injection layer having a thickness of 700 Å, and then, Compound HT3 was vacuum-deposited on the hole injection layer to form a hole transport layer having a thickness of 800 Å, thereby forming a hole transport region.

Compounds B-108 and PD26 (as a dopant) were co-deposited on the hole transport region at a weight ratio of 90:10 to form an emission layer having a thickness of 400 Å.

Subsequently, Compound E-129 and LiQ were deposited (e.g., co-deposited) on the emission layer at a ratio of 1:1 to form an electron transport layer having a thickness of 360 Å. Then, LiQ was deposited on the electron transport layer to form an electron injection layer having a thickness of 10 Å, thereby forming an electron transport region. Mg and Ag were vacuum-deposited on the electron transport layer at a weight ratio of 9:1 to form a cathode having a thickness of 120 Å, thereby completing the manufacturing of an organic light-emitting device.

Examples 3-2 to 3-20 and Comparative Examples 3-1 to 3-6

Organic light-emitting devices were manufactured in substantially the same manner as in Example 3-1, except that compounds shown in Table 3 were utilized instead of Compounds B-108 and E-129 in the formation of the emission layer and the electron transport layer.

TABLE 3

| Example | Host in emission layer | Electron transport layer |
|---|---|---|
| Example 3-1 | C-212 | E-36 |
| Example 3-2 | C-102 | E-36 |
| Example 3-3 | C-242 | E-36 |
| Example 3-4 | C-257 | E-36 |
| Example 3-5 | C-225 | E-36 |
| Example 3-6 | C-212 | E-173 |
| Example 3-7 | C-102 | E-173 |
| Example 3-8 | C-242 | E-173 |
| Example 3-9 | C-257 | E-173 |

TABLE 3-continued

| Example | Host in emission layer | Electron transport layer |
|---|---|---|
| Example 3-10 | C-225 | E-173 |
| Example 3-11 | C-212 | E-100 |
| Example 3-12 | C-102 | E-100 |
| Example 3-13 | C-242 | E-100 |
| Example 3-14 | C-257 | E-100 |
| Example 3-15 | C-225 | E-100 |
| Example 3-16 | C-212 | E-273 |
| Example 3-17 | C-102 | E-273 |
| Example 3-18 | C-242 | E-273 |
| Example 3-19 | C-257 | E-273 |
| Example 3-20 | C-225 | E-273 |
| Comparative Example 3-1 | C-212 | ET1 |
| Comparative Example 3-2 | C-102 | ET1 |
| Comparative Example 3-3 | C-242 | ET1 |
| Comparative Example 3-4 | C-257 | ET1 |
| Comparative Example 3-5 | C-225 | ET1 |
| Comparative Example 3-6 | CBP | B |

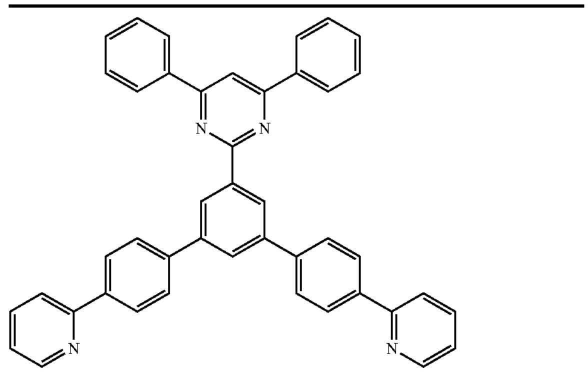

B

Evaluation Example

The driving voltage, current density, efficiency, and lifespan of the organic light-emitting devices manufactured in Examples 1-1 to 1-16, 2-1 to 2-8, 3-1 to 3-20, and Comparative Examples 1-1 to 1-5, 2-1, 2-2, and 3-1 to 3-6 were evaluated utilizing a Keithley 236 source-measure unit (SMU) and a PR650 luminance meter. Here, the lifespan results were obtained by measuring the time at which the luminance of an organic light-emitting device was 97% of the initial luminance. The results are shown in Tables 4 to 6.

TABLE 4

| Example | Host in mission layer | Electron transport layer | Driving voltage (V) | Current density ($mA/cm^2$) | Efficiency (cd/A) | Life-span (hours) |
|---|---|---|---|---|---|---|
| Example 1-1 | B-108 | E-36 | 3.8 | 10.0 | 32.9 | 567 |
| Example 1-2 | B-148 | E-36 | 3.9 | 10.0 | 31.8 | 585 |
| Example 1-3 | B-173 | E-36 | 3.8 | 10.0 | 33.2 | 555 |
| Example 1-4 | B-135 | E-36 | 3.8 | 10.0 | 32.5 | 541 |
| Example 1-5 | B-108 | E-173 | 4.0 | 10.0 | 32.2 | 572 |
| Example 1-6 | B-148 | E-173 | 4.1 | 10.0 | 31.8 | 590 |
| Example 1-7 | B-173 | E-173 | 4.1 | 10.0 | 33.2 | 581 |
| Example 1-8 | B-135 | E-173 | 4.0 | 10.0 | 31.6 | 558 |
| Example 1-9 | B-108 | E-100 | 3.9 | 10.0 | 33.3 | 577 |
| Example 1-10 | B-148 | E-100 | 3.9 | 10.0 | 33.4 | 601 |
| Example 1-11 | B-173 | E-100 | 3.8 | 10.0 | 32.7 | 568 |
| Example 1-12 | B-135 | E-100 | 3.9 | 10.0 | 32.1 | 575 |

TABLE 4-continued

| Example | Host in mission layer | Electron transport layer | Driving voltage (V) | Current density (mA/cm$^2$) | Efficiency (cd/A) | Lifespan (hours) |
|---|---|---|---|---|---|---|
| Example 1-13 | B-108 | E-273 | 3.8 | 10.0 | 32.4 | 582 |
| Example 1-14 | B-148 | E-273 | 3.8 | 10.0 | 33.0 | 593 |
| Example 1-15 | B-173 | E-273 | 3.7 | 10.0 | 32.1 | 560 |
| Example 1-16 | B-135 | E-273 | 3.8 | 10.0 | 32.8 | 570 |
| Comparative Example 1-1 | B-108 | ET1 | 4.3 | 10.0 | 29.1 | 452 |
| Comparative Example 1-2 | B-148 | ET1 | 4.5 | 10.0 | 29.3 | 481 |
| Comparative Example 1-3 | B-173 | ET1 | 4.4 | 10.0 | 28.2 | 463 |
| Comparative Example 1-4 | B-135 | ET1 | 4.3 | 10.0 | 27.5 | 449 |
| Comparative Example 1-5 | CBP | B | 4.9 | 10.0 | 24.4 | 288 |

TABLE 5

| Example | Host in emission layer | Electron transport layer | Driving voltage (V) | Current density (mA/cm$^2$) | Efficiency (cd/A) | Lifespan (@97, hours) |
|---|---|---|---|---|---|---|
| Example 2-1 | C-221 | E-36 | 3.7 | 10.0 | 31.8 | 585 |
| Example 2-2 | C-209 | E-36 | 3.8 | 10.0 | 32.2 | 621 |
| Example 2-3 | C-221 | E-173 | 3.9 | 10.0 | 32.4 | 577 |
| Example 2-4 | C-209 | E-173 | 4.0 | 10.0 | 32.8 | 602 |
| Example 2-5 | C-221 | E-100 | 3.8 | 10.0 | 32.2 | 605 |
| Example 2-6 | C-209 | E-100 | 3.9 | 10.0 | 33.4 | 641 |
| Example 2-7 | C-221 | E-273 | 3.8 | 10.0 | 31.9 | 621 |
| Example 2-8 | C-209 | E-273 | 3.8 | 10.0 | 32.5 | 628 |
| Comparative Example 2-1 | B-108 | ET1 | 4.3 | 10.0 | 28.7 | 471 |
| Comparative Example 2-2 | B-148 | ET1 | 4.5 | 10.0 | 29.5 | 458 |

TABLE 6

| Example | Host in emission layer | Electron transport layer | Driving voltage (V) | Current density (mA/cm$^2$) | Efficiency (cd/A) | Lifespan (@97, hours) |
|---|---|---|---|---|---|---|
| Example 3-1 | C-212 | E-36 | 3.7 | 10.0 | 80.2 | 78 |
| Example 3-2 | C-102 | E-36 | 3.7 | 10.0 | 81.4 | 75 |
| Example 3-3 | C-242 | E-36 | 3.8 | 10.0 | 80.5 | 85 |
| Example 3-4 | C-257 | E-36 | 3.8 | 10.0 | 79.7 | 69 |
| Example 3-5 | C-225 | E-36 | 3.7 | 10.0 | 79.5 | 76 |
| Example 3-6 | C-212 | E-173 | 3.9 | 10.0 | 80.5 | 81 |
| Example 3-7 | C-102 | E-173 | 3.9 | 10.0 | 81.3 | 75 |
| Example 3-8 | C-242 | E-173 | 4.0 | 10.0 | 80.3 | 88 |
| Example 3-9 | C-257 | E-173 | 4.0 | 10.0 | 81.1 | 74 |
| Example 3-10 | C-225 | E-173 | 4.0 | 10.0 | 81.2 | 83 |
| Example 3-11 | C-212 | E-100 | 3.8 | 10.0 | 82.3 | 79 |
| Example 3-12 | C-102 | E-100 | 3.8 | 10.0 | 80.2 | 84 |
| Example 3-13 | C-242 | E-100 | 4.9 | 10.0 | 80.9 | 90 |
| Example 3-14 | C-257 | E-100 | 4.9 | 10.0 | 81.4 | 77 |
| Example 3-15 | C-225 | E-100 | 3.8 | 10.0 | 79.7 | 81 |
| Example 3-16 | C-212 | E-273 | 3.7 | 10.0 | 80.9 | 78 |

TABLE 6-continued

| Example | Host in emission layer | Electron transport layer | Driving voltage (V) | Current density (mA/cm$^2$) | Efficiency (cd/A) | Lifespan (@97, hours) |
|---|---|---|---|---|---|---|
| Example 3-17 | C-102 | E-273 | 3.8 | 10.0 | 81.6 | 75 |
| Example 3-18 | C-242 | E-273 | 3.9 | 10.0 | 80.8 | 73 |
| Example 3-19 | C-257 | E-273 | 3.8 | 10.0 | 82.1 | 70 |
| Example 3-20 | C-225 | E-273 | 3.7 | 10.0 | 80.2 | 78 |
| Comparative Example 3-1 | C-212 | ET1 | 4.2 | 10.0 | 73.4 | 52 |
| Comparative Example 3-2 | C-102 | ET1 | 4.2 | 10.0 | 72.8 | 48 |
| Comparative Example 3-3 | C-242 | ET1 | 4.3 | 10.0 | 71.2 | 61 |
| Comparative Example 3-4 | C-257 | ET1 | 4.4 | 10.0 | 72.7 | 53 |
| Comparative Example 3-5 | C-225 | ET1 | 4.4 | 10.0 | 73.9 | 45 |
| Comparative Example 3-6 | CBP | B | 5.0 | 10.0 | 65.1 | 36 |

Referring to the results of Tables 4 to 6, it was confirmed that the organic light-emitting devices manufactured in Examples 1-1 to 1-16, 2-1 to 2-8, and 3-1 to 3-20 exhibited excellent efficiency and lifespan, as compared with the organic light-emitting devices manufactured in Comparative Examples 1-1 to 1-5, 2-1, 2-2, and 3-1 to 3-6.

As described above, an organic light-emitting device according to one or more embodiments may have high efficiency and long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An organic light-emitting device comprising:

a first electrode;

a second electrode facing the first electrode; and an organic layer between the first electrode and the second electrode, the organic layer comprising an emission layer, wherein the organic layer comprises a first compound represented by one selected from Formulae 1-11 to 1-15 and 1-21 to 1-23, and a second compound represented by Formula 2-1:

1-11

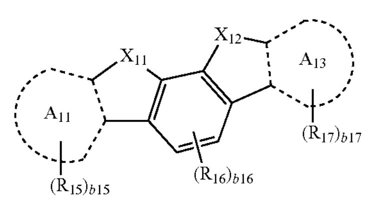

-continued 1-12

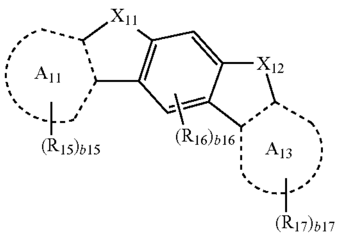

1-13

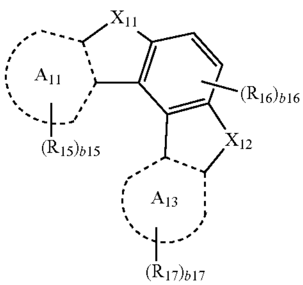

1-14

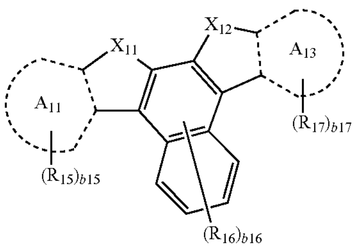

1-15

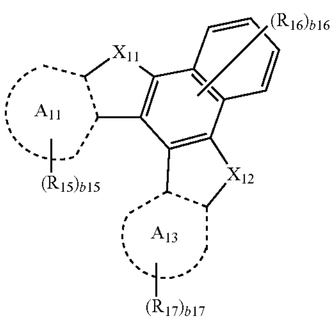

1-21

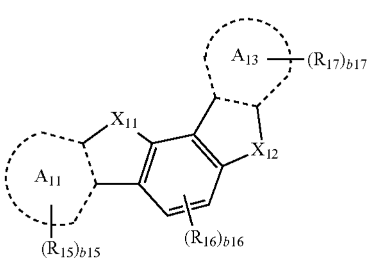

1-22

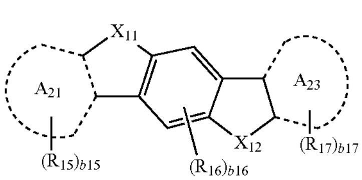

-continued 1-23

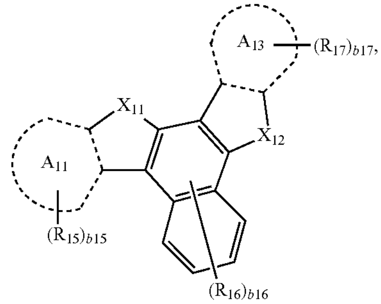

Formula 2-1

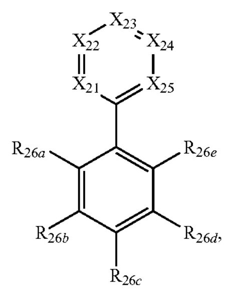

$*\text{-}(L_{81})_{a81}\text{-}R_{81}$ Formula 8

$*\text{-}(L_{91})_{a91}\text{-}R_{91},$ Formula 9 wherein, in Formulae 1-11 to 1-15, 1-21 to 1-23, 2-1, 8, and 9, $A_{11}$ and $A_{13}$ are each independently selected from a benzene group, a naphthalene group, a phenanthrene group, an anthracene group, a pyridine group, a pyrazine group, a pyrimidine group, a pyridazine group, a quinoline group, an isoquinoline group, a quinoxaline group, and a quinazoline group, $X_{11}$ is selected from $N(R_{11})$, $C(R_{11})(R_{12})$, O, and S, $X_{12}$ is selected from $N(R_{13})$, $C(R_{13})(R_{14})$, O, and S, $R_{11}$ to $R_{17}$ are each independently selected from a group represented by Formula 8, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, wherein at least one selected from $R_{11}$ to $R_{17}$ is the group represented by Formula 8, b15 to b17 are each independently selected from 1, 2, 3, 4, 5, 6, 7, and 8, $L_{81}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a81 is selected from 0, 1, and 2, $R_{81}$ is selected from groups represented by Formulae 5-30 to 5-86:

5-30

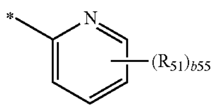

5-31

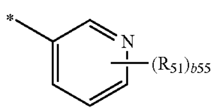

5-32

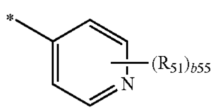

5-33

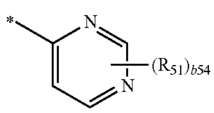

5-34

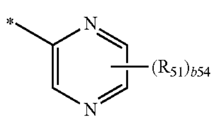

5-35

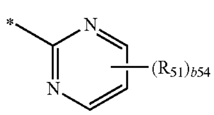

5-36

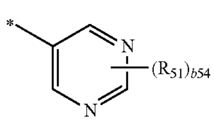

5-37

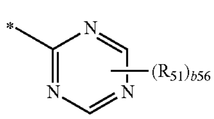

5-38

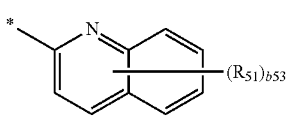

5-39

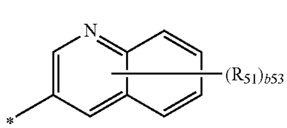

-continued 5-40

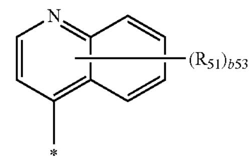

5-41

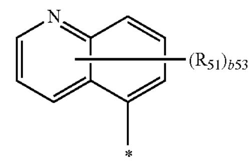

5-42

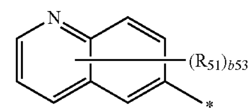

5-43

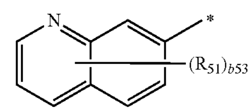

5-44

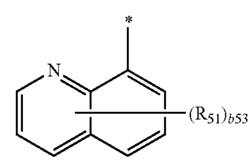

5-45

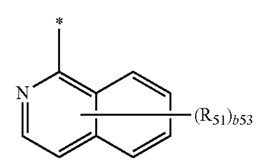

5-46

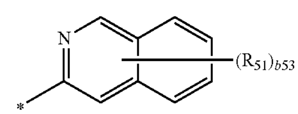

5-47

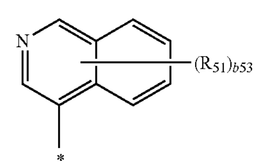

5-48

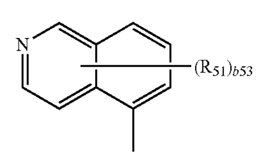

5-49

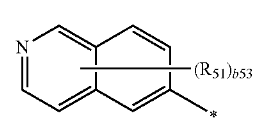

5-50
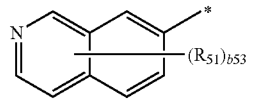
5-51
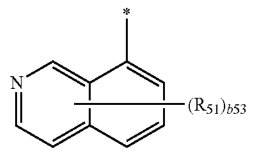
5-52
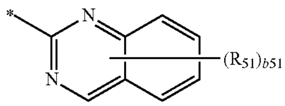
5-53
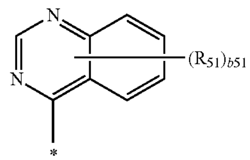
5-54
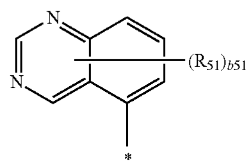
5-55
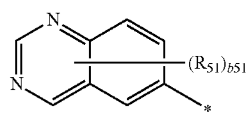
5-56
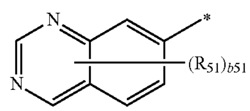
5-57
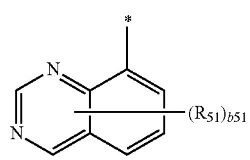
5-58
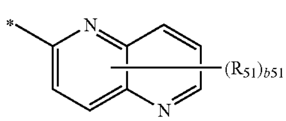
5-59
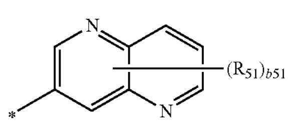
5-60
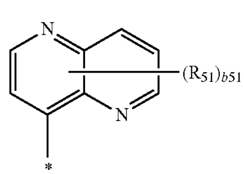
5-61
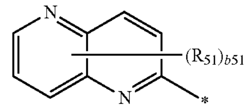
5-62
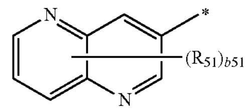
5-63
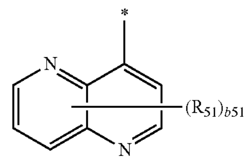
5-64
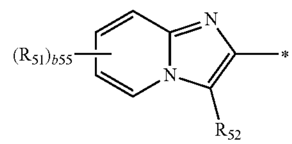
5-65
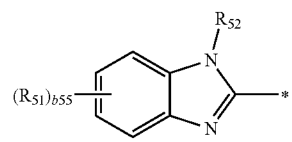
5-66
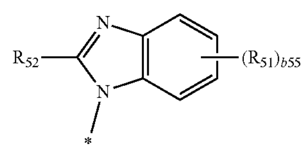
5-67
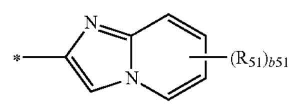
5-68
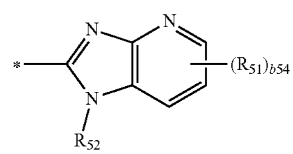
5-69
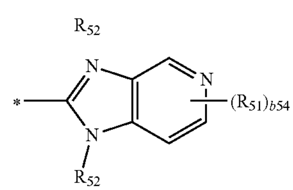
5-70
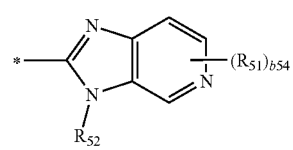

-continued 5-71

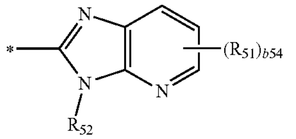

5-72

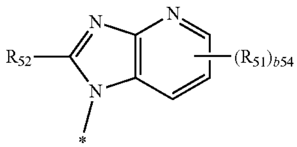

5-73

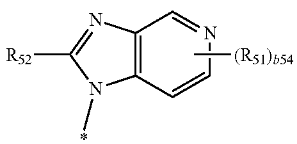

5-74

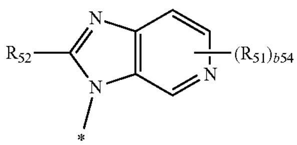

5-75

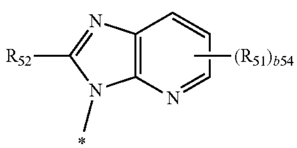

5-76

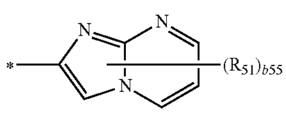

5-77

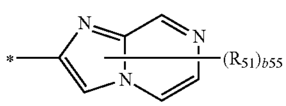

5-78

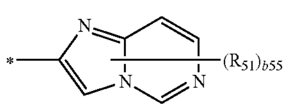

5-79

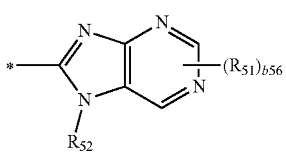

5-80

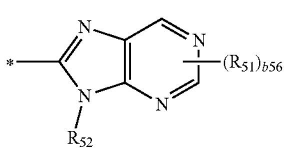

5-81

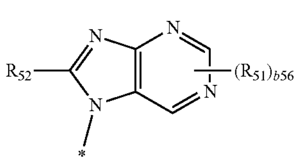

-continued 5-82

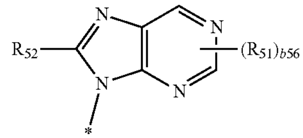

5-83

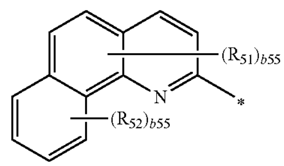

5-84

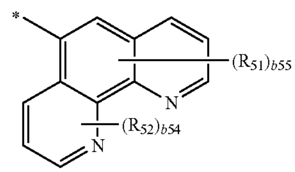

5-85

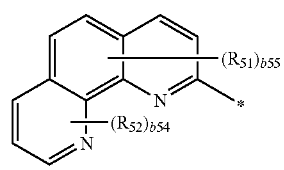

5-86

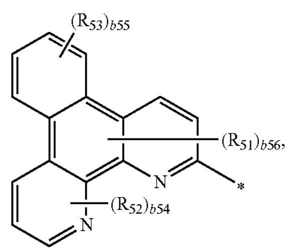

wherein, in Formulae 5-30 to 5-86, $R_{51}$ to $R_{53}$ are each independently selected from the group consisting of:

hydrogen, deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{31}$)($Q_{32}$), and —Si($Q_{31}$)($Q_{32}$)($Q_{33}$); and a phenyl group, a biphenyl group, a terphenyl group, a naphthyl group, a pyridinyl group, a pyrimidinyl group, a pyridazinyl group, and a triazinyl group, each substituted with at least one selected from deuterium, —F, —Cl, —Br, —I, a $C_1$-$C_{20}$ alkyl group, a $C_1$-$C_{20}$ alkoxy group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), and —Si($Q_{21}$)($Q_{22}$)($Q_{23}$), $Q_{21}$ to $Q_{23}$ and $Q_{31}$ to $Q_{33}$ are each independently selected from a methyl group, an ethyl group, a phenyl group, a biphenyl group, a terphenyl group, and a naphthyl group, b51 is selected from 1, 2, 3, 4, and 5, b53 is selected from 1, 2, 3, 4, 5, and 6, b54 is selected from 1, 2, and 3,
b55 is selected from 1, 2, 3, and 4,
b56 is selected from 1 and 2, and
* indicates a binding site to a neighboring atom,
$X_{21}$ is selected from N and $C(R_{21})$, $X_{22}$ is selected from N and $C(R_{22})$, $X_{23}$ is selected from N and $C(R_{23})$, $X_{24}$ is selected from N and $C(R_{24})$, and $X_{25}$ is selected from N and $C(R_{25})$, wherein at least one selected from $X_{21}$ to $X_{25}$ is N,
$R_{21}$ to $R_{25}$ and $R_{26a}$ to $R_{26e}$ are each independently selected from a group represented by Formula 9, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, wherein at least one selected from $R_{21}$ to $R_{25}$ and $R_{26a}$ to $R_{26e}$ is the group represented by Formula 9,
$L_{91}$ is selected from a substituted or unsubstituted $C_6$-$C_{60}$ arylene group and a substituted or unsubstituted $C_1$-$C_{60}$ heteroarylene group,
a91 is selected from 0, 1, and 2,
$R_{91}$ is selected from groups represented by Formulae 5-30 to 5-63, and 5-83 to 5-86,
$Q_1$ to $Q_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and
* indicates a binding site to a neighboring atom, wherein in Formula 2-1,
i) when four selected from $R_{26a}$ to $R_{26e}$ are each hydrogen, and a remaining one selected from $R_{26a}$ to $R_{26e}$ is represented by Formula 9, where a91 is zero:
  $R_{91}$ is selected from groups represented by Formula 5-30 to 5-32, where $R_{51}$ is as defined above with respect to Formula 5-30 to 5-86 except for not including a $C_6$-$C_{60}$ aryl group, or
  $R_{91}$ is selected from groups represented by Formula 5-33 to 5-63 and 5-83 to 5-86, where $R_{51}$ to $R_{53}$ are each independently as defined above with respect to Formula 5-30 to 5-86 except for not including a hydrogen atom and a $C_6$-$C_{60}$ aryl group;
ii) when $R_{26a}$, $R_{26c}$ and $R_{26e}$ are each hydrogen, and $R_{26b}$ and $R_{26d}$ are each independently represented by Formula 9:
  $R_{26b}$ and $R_{26d}$ are different from each other;
iii) when $R_{26a}$, $R_{26c}$ and $R_{26e}$ are each hydrogen, one selected from $R_{26b}$ and $R_{26d}$ is an unsubstituted $C_6$-$C_{60}$ aryl group, another one selected from $R_{26b}$ and $R_{26d}$ is represented by Formula 9, where a91 is 0 or 1 and $L_{91}$ is a phenyl group, and $R_{91}$ is selected from groups represented by Formulae 5-34 to 5-63 and 5-83 to 5-86:
  at least one of $R_{51}$ to $R_{53}$ is as defined above with respect to Formula 5-30 to 5-86 except for not including a hydrogen atom.

2. The organic light-emitting device of claim 1, wherein $X_{11}$ is $N(R_{11})$, and $X_{12}$ is selected from $N(R_{13})$, $C(R_{13})(R_{14})$, O, and S.

3. The organic light-emitting device of claim 1, wherein $R_{11}$ to $R_{17}$ are each independently selected from the group consisting of:
a group represented by Formula 8, hydrogen, deuterium, —F, —Cl, —Br, —I, a $C_1$-$C_{20}$ alkyl group, a $C_1$-$C_{20}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_1)(Q_2)$, and $—Si(Q_1)(Q_2)(Q_3)$;
a $C_1$-$C_{20}$ alkyl group and a $C_1$-$C_{20}$ alkoxy group, each substituted with at least one selected from deuterium, —F, —Cl, —Br, —I, a cyano group, and a nitro group; and
a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a cyano group, a nitro group, a methyl group, a methoxy group, a phenyl group, a naphthyl group, $—N(Q_{31})(Q_{32})$, and $—Si(Q_{31})(Q_{32})(Q_{33})$, and
$Q_1$ to $Q_3$ and $Q_{31}$ to $Q_{33}$ are each independently selected from a $C_1$-$C_{20}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

4. The organic light-emitting device of claim 1, wherein $L_{81}$ is selected from the group consisting of:
a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosiloleylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosiloleylene group, a benzocarbazolylene group, and a dibenzocarbazolylene group, each substituted with at least one selected from deuterium, —F, —Cl, —Br, —I, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —$Si(Q_{31})(Q_{32})(O_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ are each independently selected from hydrogen, a methyl group, an ethyl group, an n-propyl group, an iso-propyl group, a tert-butyl group, a phenyl group, a biphenyl group, and a terphenyl group.

5. The organic light-emitting device of claim 1, wherein $X_{21}$ is N, $X_{22}$ is $C(R_{22})$, $X_{23}$ is $C(R_{23})$, $X_{24}$ is $C(R_{24})$, and $X_{25}$ is $C(R_{25})$;

$X_{21}$ is $C(R_{21})$, $X_{22}$ is N, $X_{23}$ is $C(R_{23})$, $X_{24}$ is $C(R_{24})$, and $X_{25}$ is $C(R_{25})$;

$X_{21}$ is $C(R_{21})$, $X_{22}$ is $C(R_{22})$, $X_{23}$ is N, $X_{24}$ is $C(R_{24})$, and $X_{25}$ is $C(R_{25})$;

$X_{21}$ is $C(R_{21})$, $X_{22}$ is $C(R_{22})$, $X_{23}$ is $C(R_{23})$, $X_{24}$ is N, and $X_{25}$ is $C(R_{25})$;

$X_{21}$ is $C(R_{21})$, $X_{22}$ is $C(R_{22})$, $X_{23}$ is $C(R_{23})$, $X_{24}$ is $C(R_{24})$, and $X_{25}$ is N;

$X_{21}$ is N, $X_{22}$ is $C(R_{22})$, $X_{23}$ is $C(R_{23})$, $X_{24}$ is $C(R_{24})$, and $X_{25}$ is N;

$X_{21}$ is N, $X_{22}$ is $C(R_{22})$, $X_{23}$ is N, $X_{24}$ is $C(R_{24})$, and $X_{25}$ is $C(R_{25})$;

$X_{21}$ is $C(R_{21})$, $X_{22}$ is $C(R_{22})$, $X_{23}$ is N, $X_{24}$ is $C(R_{24})$, and $X_{25}$ is N; or $X_{21}$ is N, $X_{22}$ is $C(R_{22})$, $X_{23}$ is N, $X_{24}$ is $C(R_{24})$, and $X_{25}$ is N.

6. The organic light-emitting device of claim 1, wherein $R_{21}$ to $R_{25}$ and $R_{26a}$ to $R_{26e}$ are each independently selected from the group consisting of:

a group represented by Formula 9, hydrogen, a $C_1$-$C_{20}$ alkyl group, and a $C_3$-$C_{10}$ cycloalkyl group;

a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a $C_1$-$C_{20}$ alkyl group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —$N(Q_{31})(Q_{32})$, and —$Si(Q_{31})(Q_{32})(Q_{33})$; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one substituent selected from a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each of the at least one substituent is substituted with at least one selected from deuterium, —F, —Cl, —Br, —I, a $C_1$-$C_{20}$ alkyl group, a $C_3$-$C_{10}$ cycloalkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —$N(Q_{21})(Q_{22})$, and —$Si(Q_{21})(Q_{22})(Q_{23})$, and $Q_{21}$ to $Q_{23}$ and $Q_{31}$ to $Q_{33}$ are each independently selected from a $C_1$-$C_{60}$ alkyl group and a $C_6$-$C_{60}$ aryl group.

7. The organic light-emitting device of claim 1, wherein $L_{91}$ is selected from the group consisting of:

a phenylene group, a naphthylene group, a phenanthrenylene group, an anthracenylene group, a triphenylenylene group, a pyrenylene group, a chrysenylene group, a pyridinylene group, a pyrazinylene group, a pyrimidinylene group, a quinolinylene group, an isoquinolinylene group, a benzoquinolinylene group, a phthalazinylene group, a naphthyridinylene group, a quinoxalinylene group, a quinazolinylene group, a phenanthridinylene group, an acridinylene group, a phenanthrolinylene group, and a triazinylene group; and a phenylene group, a naphthylene group, a phenanthrenylene group, an anthracenylene group, a triphenylenylene group, a pyrenylene group, a chrysenylene group, a pyridinylene group, a pyrazinylene group, a pyrimidinylene group, a quinolinylene group, an isoquinolinylene group, a benzoquinolinylene group, a phthalazinylene group, a naphthyridinylene group, a quinoxalinylene group, a quinazolinylene group, a phenanthridinylene group, an acridinylene group, a phenanthrolinylene group, and a triazinylene group, each substituted with at least one selected from deuterium, —F, —Cl, —Br, —I, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ are each independently selected from hydrogen, a methyl group, an ethyl group, an n-propyl group, an iso-propyl group, a tert-butyl group, a phenyl group, a biphenyl group, and a terphenyl group.

8. The organic light-emitting device of claim 1, wherein the first compound is represented by one selected from Formulae 1-14a to 1-14g:

1-14a

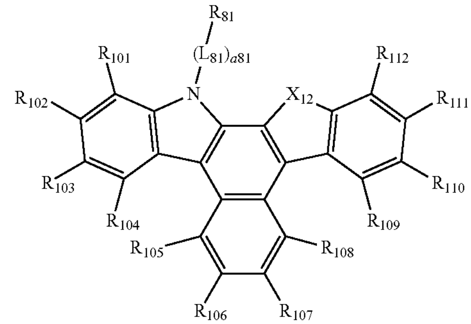

1-14b

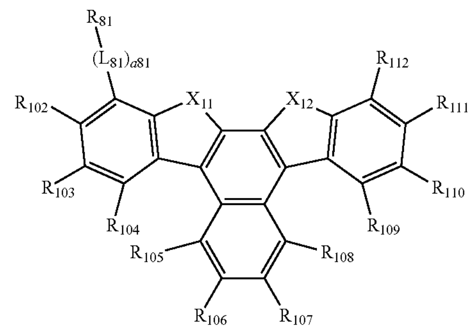

1-14c

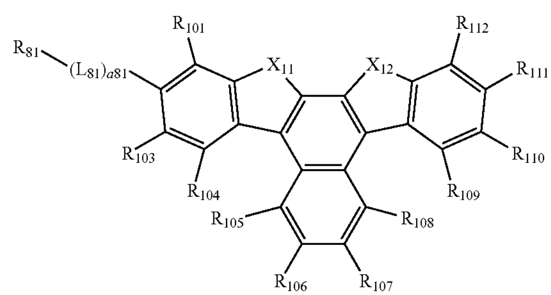

1-14d

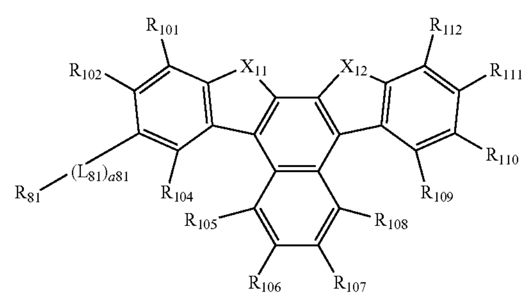

1-14e

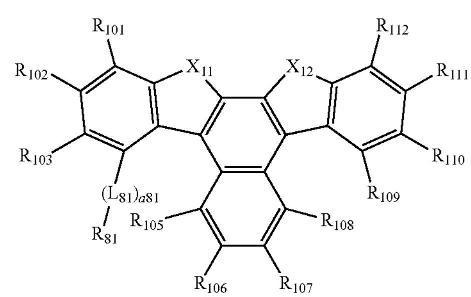

-continued 1-14f

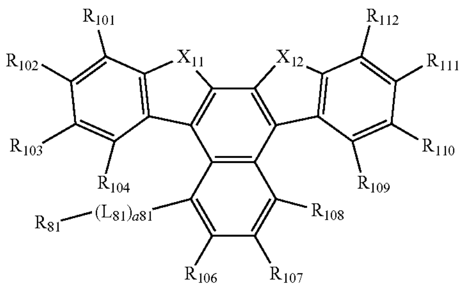

1-14g

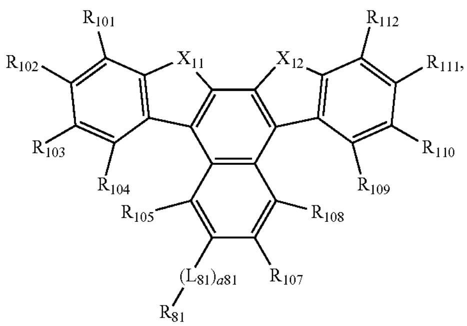

wherein, in Formulae 1-14a to 1-14g, $X_{11}$ and $X_{12}$ are the same as defined herein in connection with Formulae 1-11 to 1-15 and 1-21 to 1-23, $R_{101}$ to $R_{112}$ are the same as defined herein in connection with $R_{11}$ in Formulae 1-11 to 1-15 and 1-21 to 1-23, and $L_{81}$, a81, and $R_{81}$ are the same as defined herein in connection with Formula 8.

9. The organic light-emitting device of claim 1, wherein the first compound is selected from Compounds B-101 to B-205, C-101 to C-114, C116 to C-221, and C-224 to C-270, and the second compound is selected from Compounds E-1 to E-154, E-155 to E-165, E-170, E-172 to E-182, E-185 to E-190, E-206 to E-208, E-263 to E-270, and E-272 to E-273:

B-101

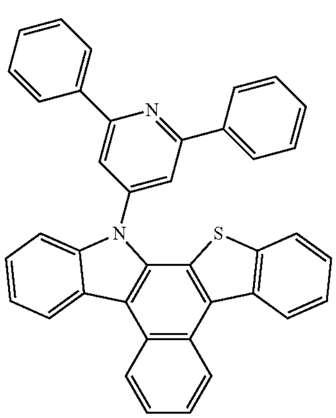

-continued

B-102

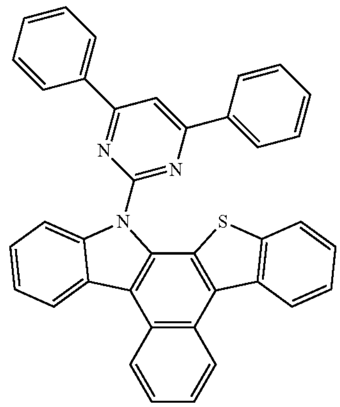

B-103

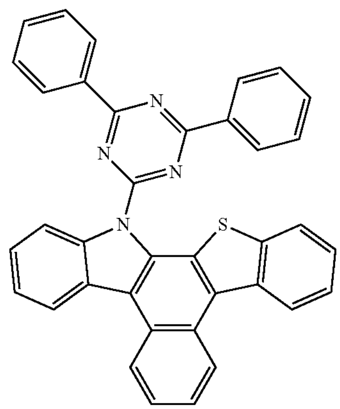

B-104

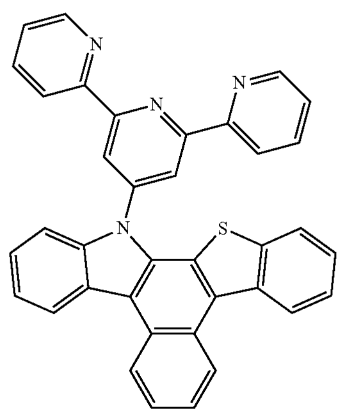

B-105

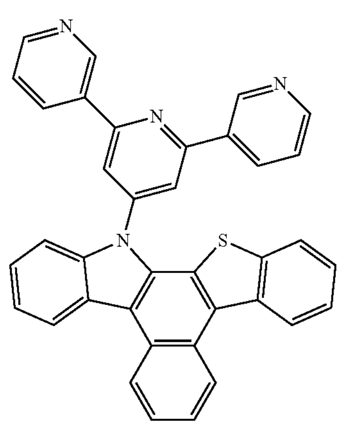

B-106
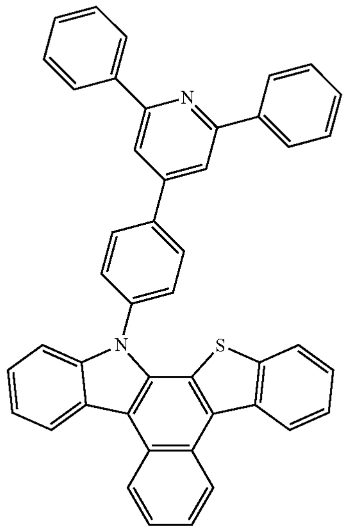
B-107
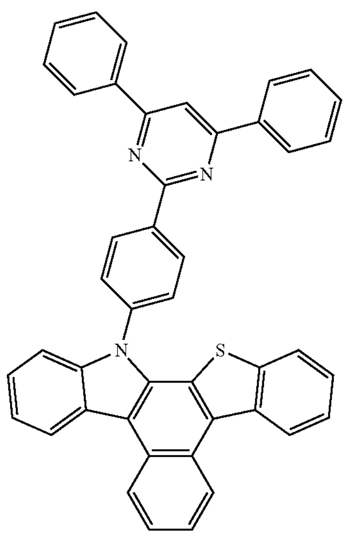
B-108
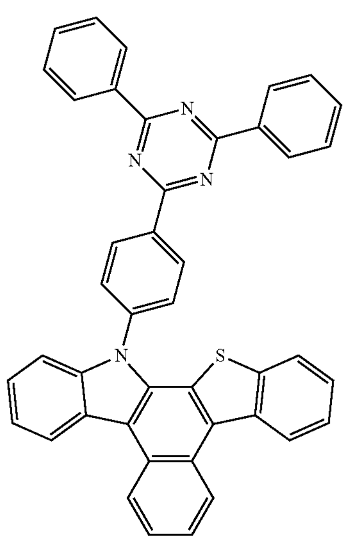
B-109
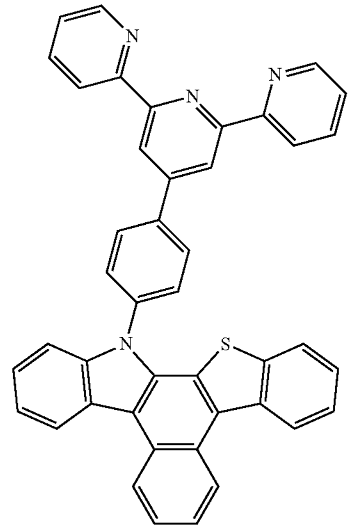
B-110
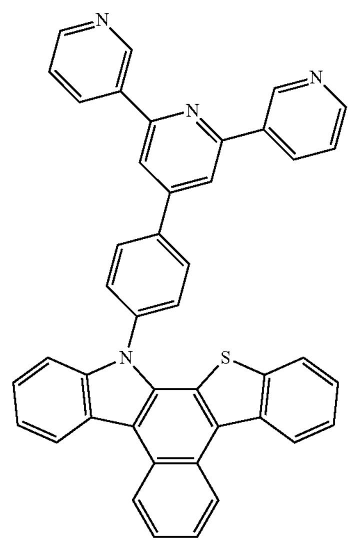
B-111
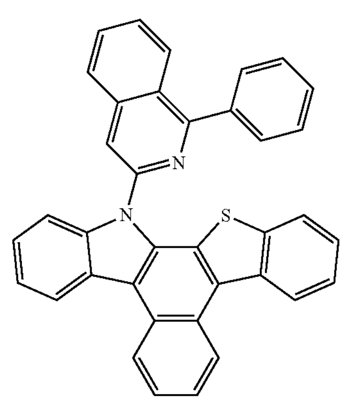

B-112
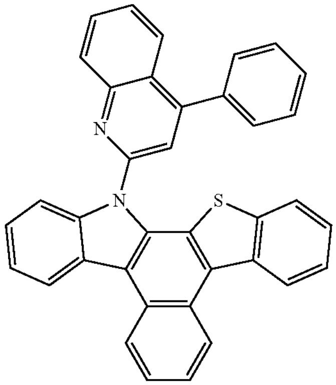
B-113
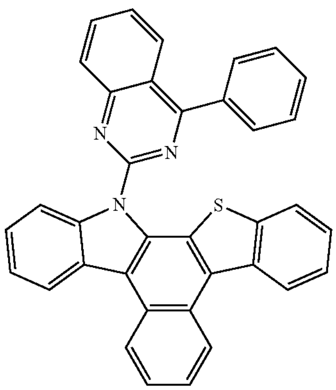
B-114
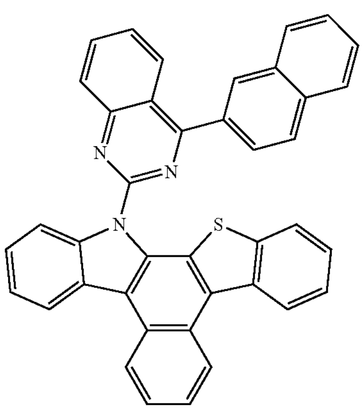
B-115
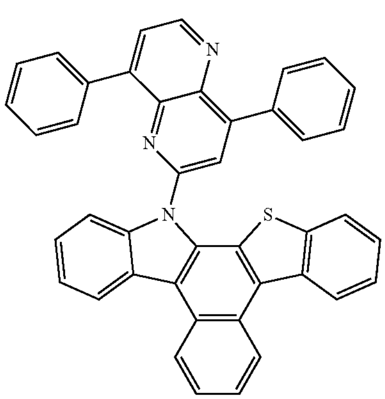
B-116
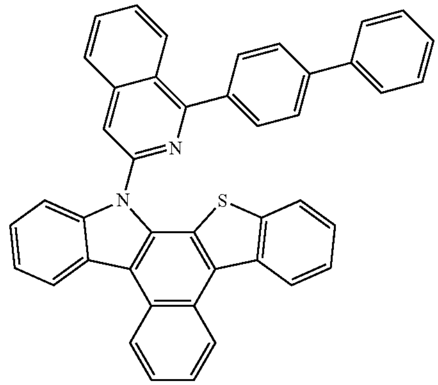
B-117
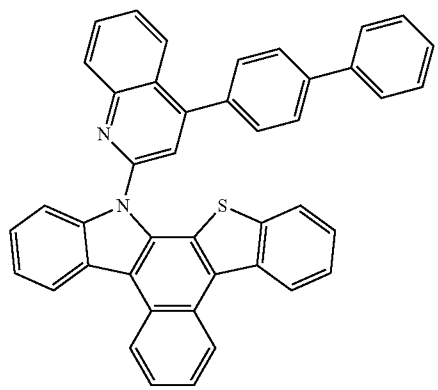
B-118
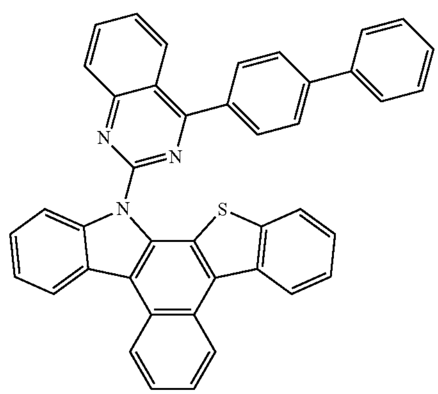
B-119
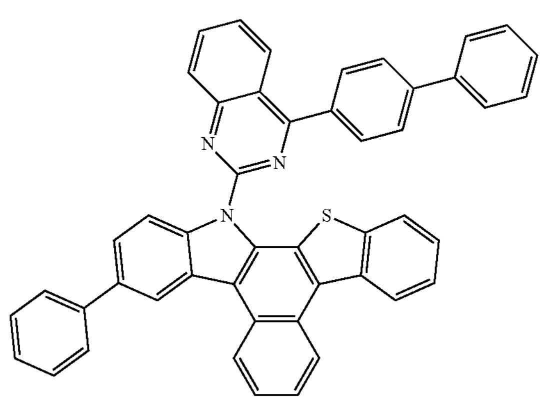

-continued
B-120
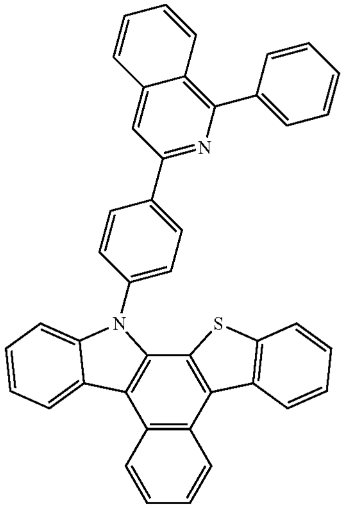
B-121
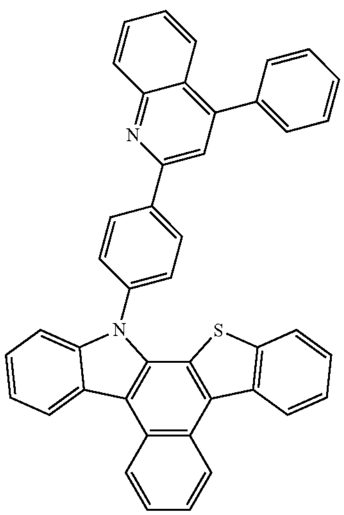
B-122
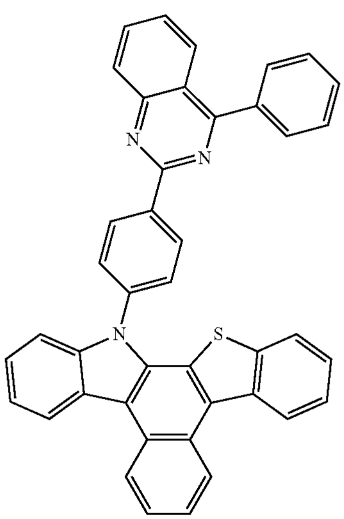
-continued
B-123
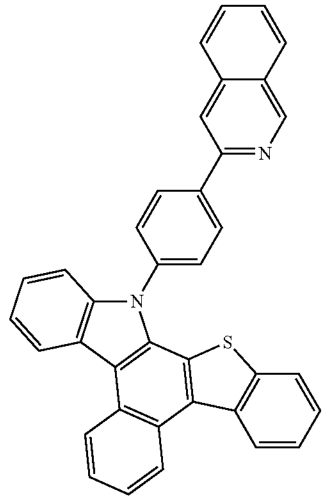
B-124
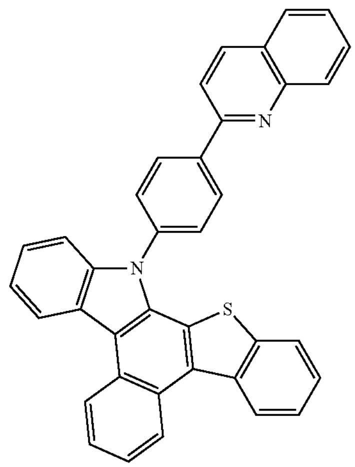
B-125
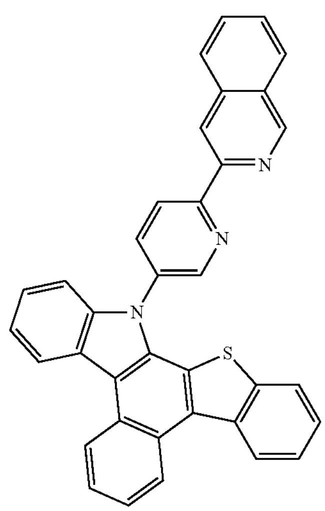

-continued
B-126
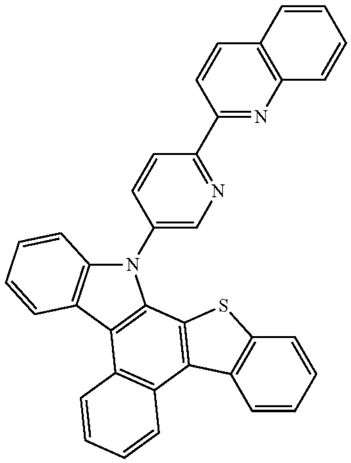
B-127
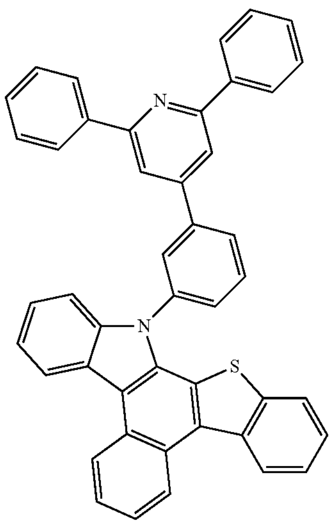
B-128
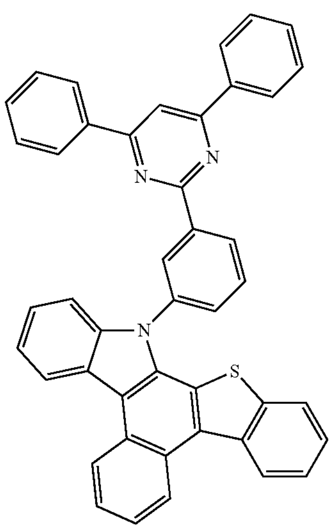
-continued
B-129
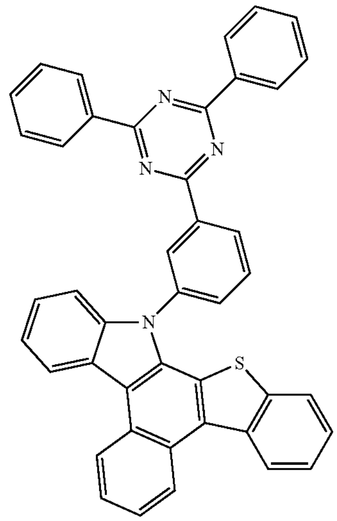
B-130
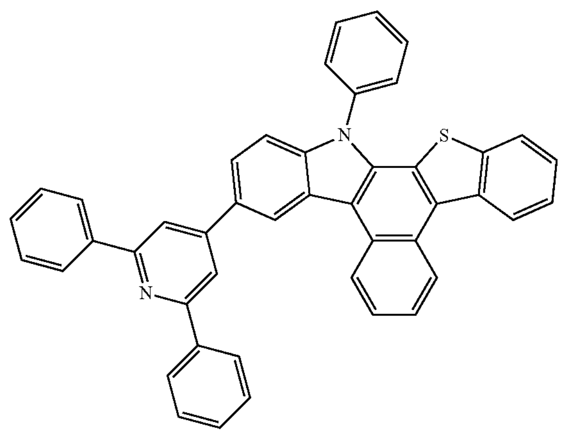
B-131
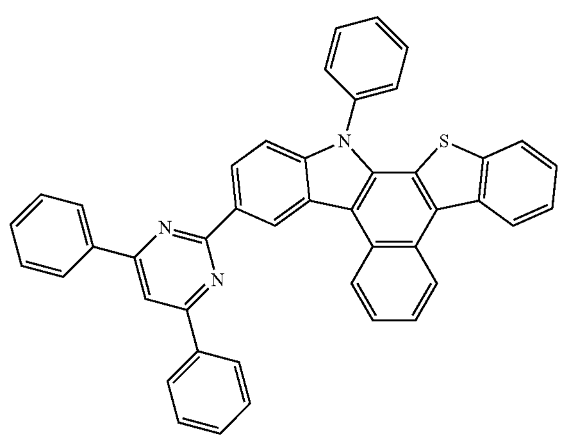

B-132
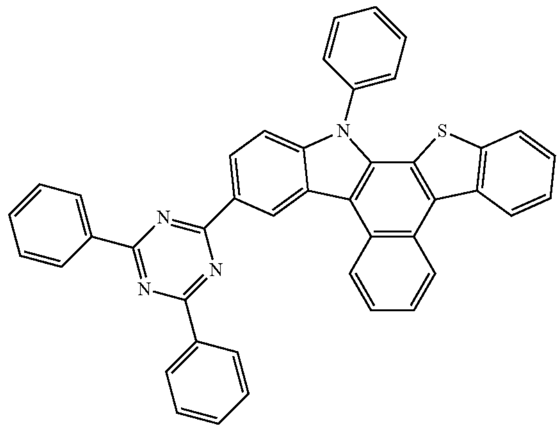
B-133
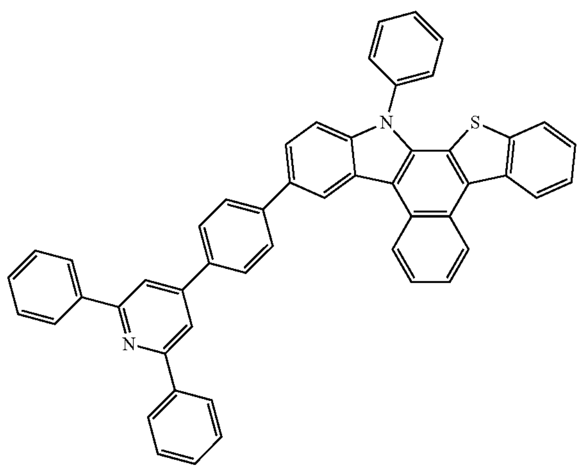
B-134
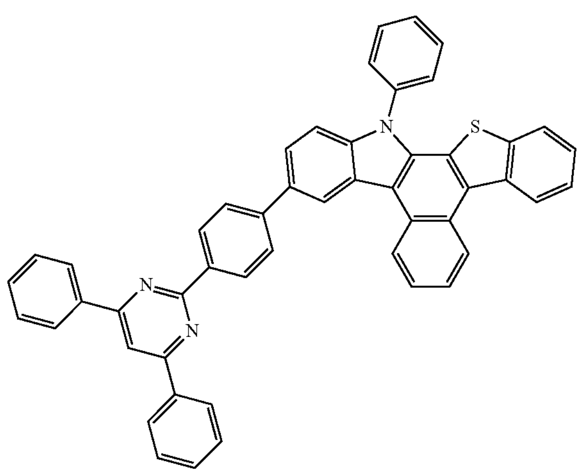
B-135
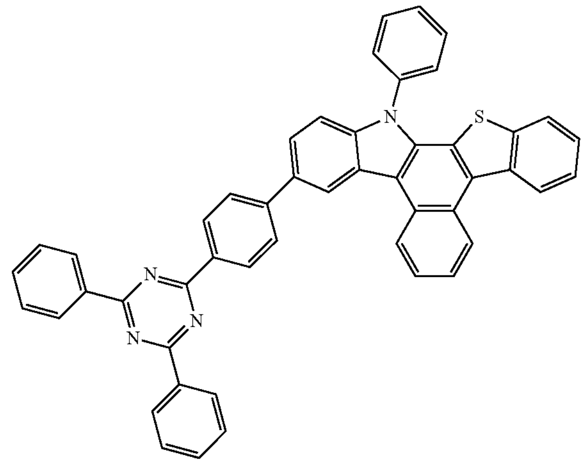
B-136
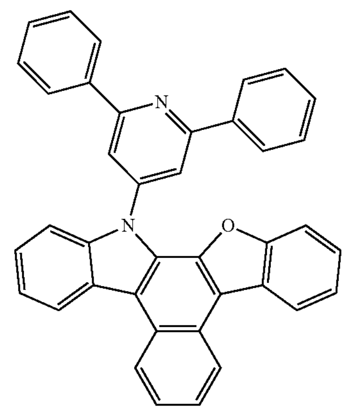
B-137
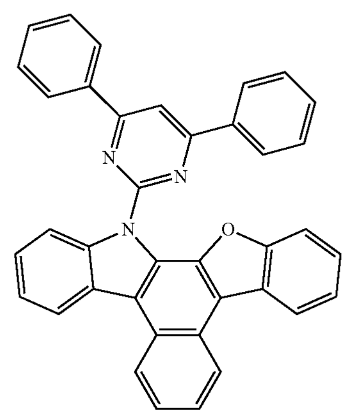

-continued
B-138
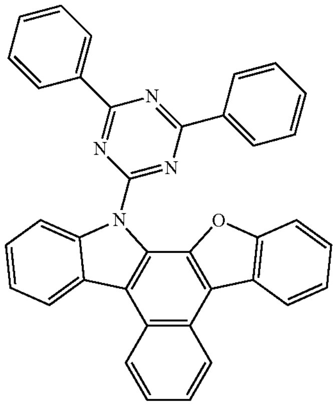
B-139
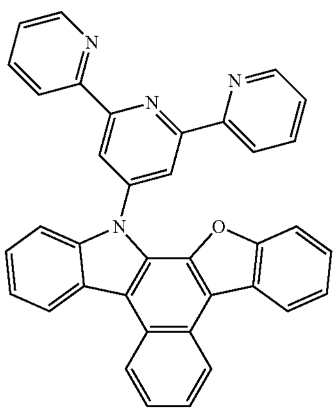
B-140
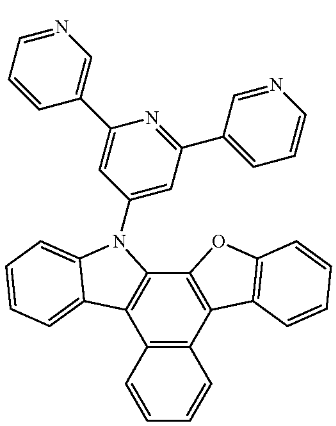
-continued
B-141
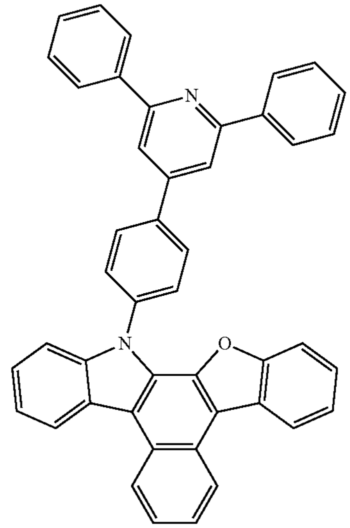
B-142
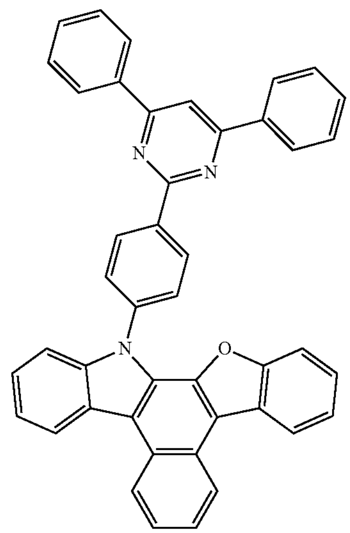
B-143
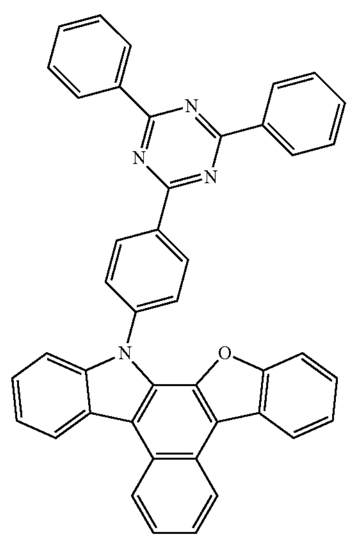

-continued
B-144
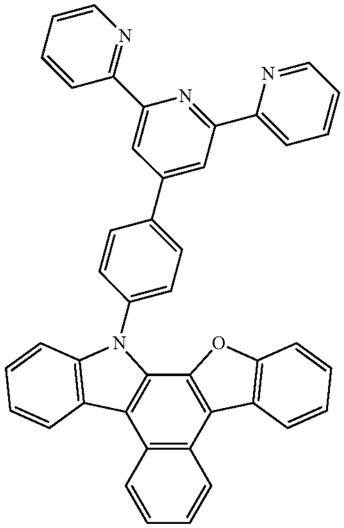
B-145
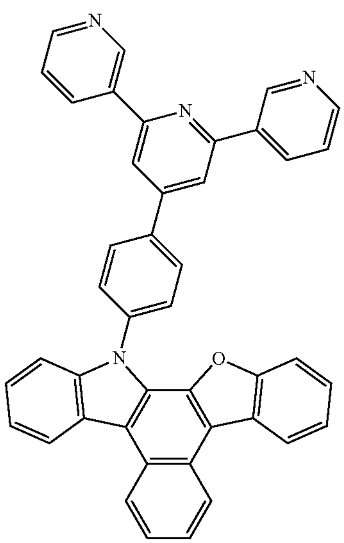
B-146
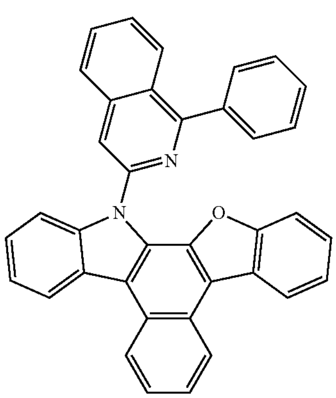
-continued
B-147
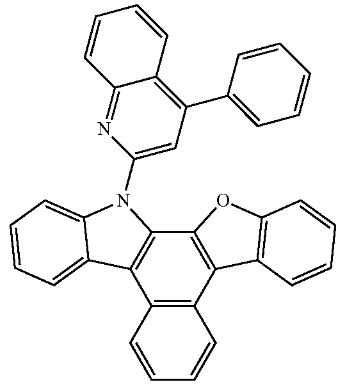
B-148
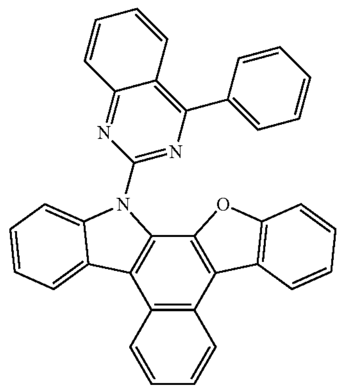
B-149
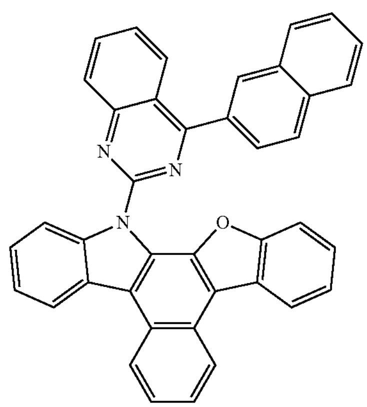
B-150
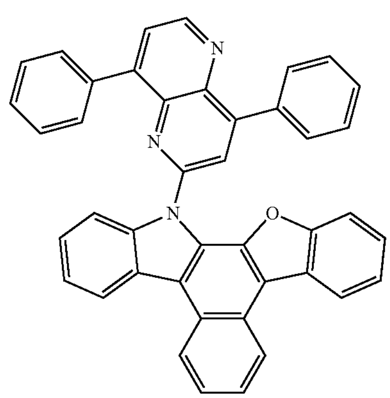

B-151
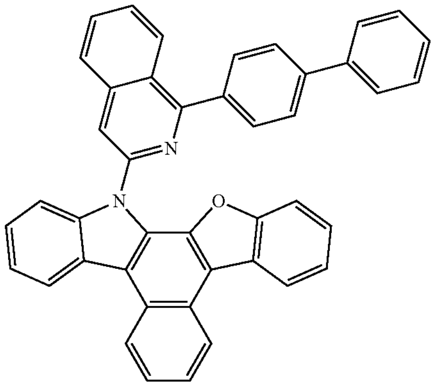
B-152
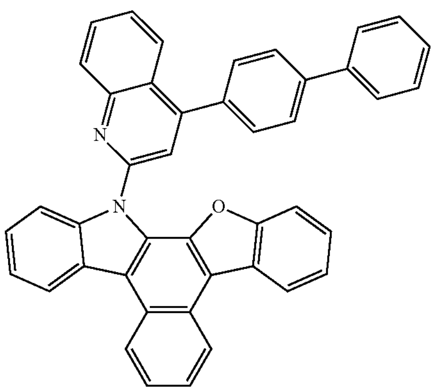
B-153
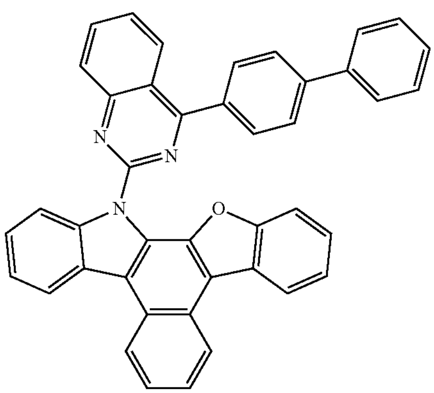
B-154
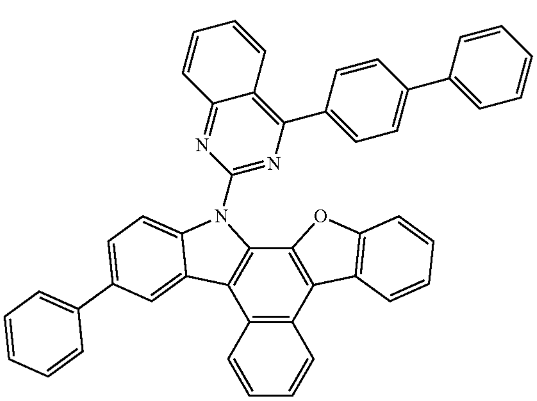
B-155
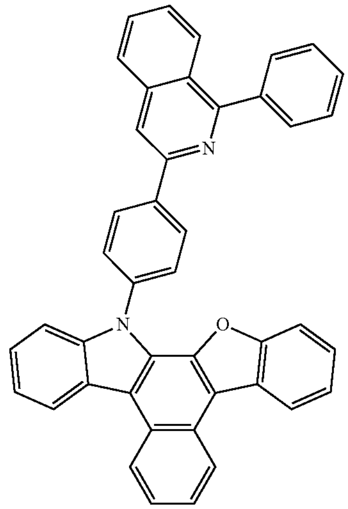
B-156
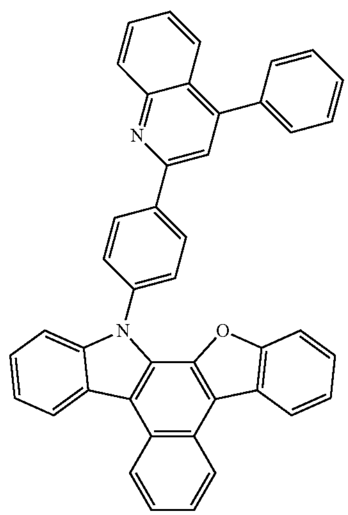
B-157
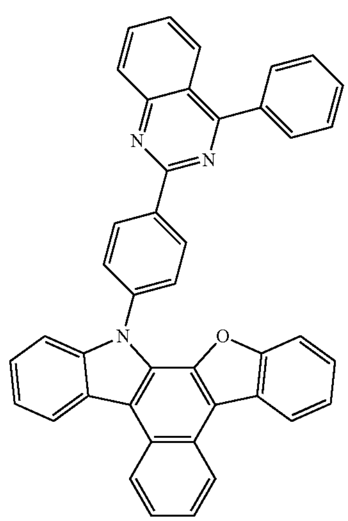

B-158
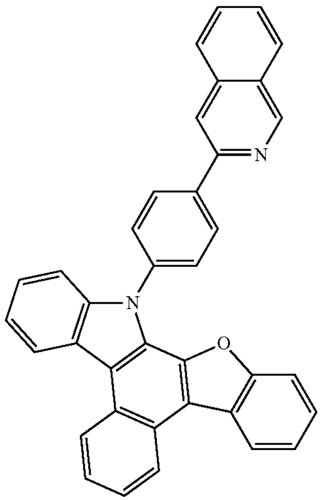
B-159
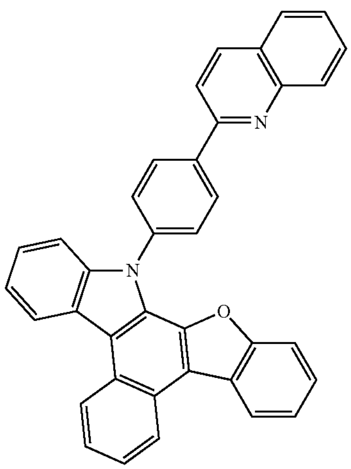
B-160
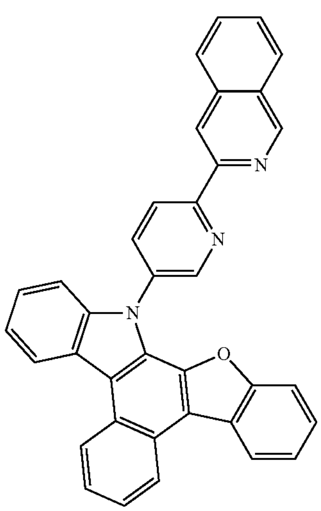
B-161
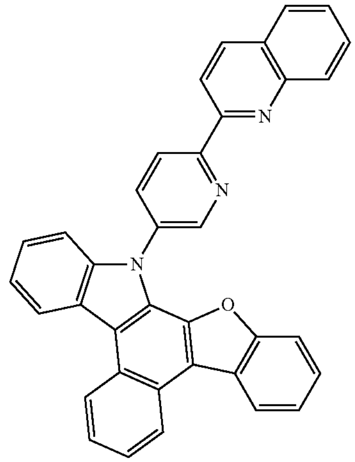
B-162
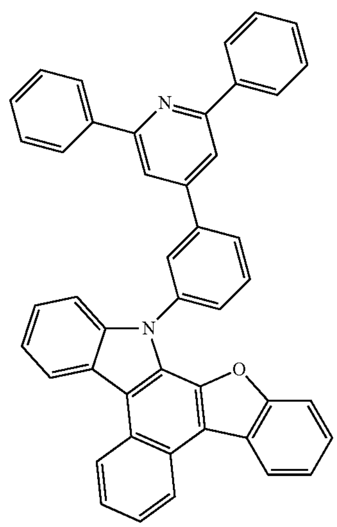
B-163
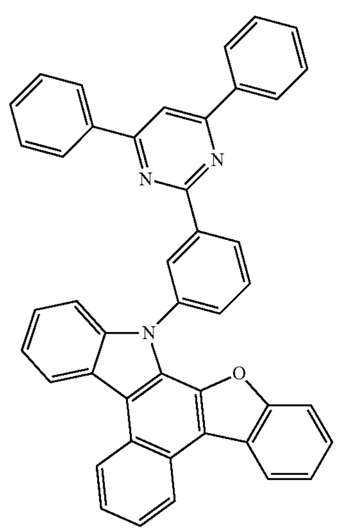

-continued
B-164
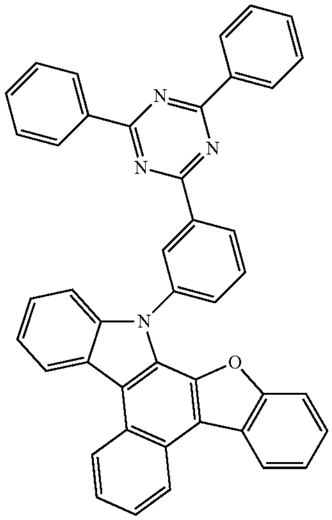
B-165
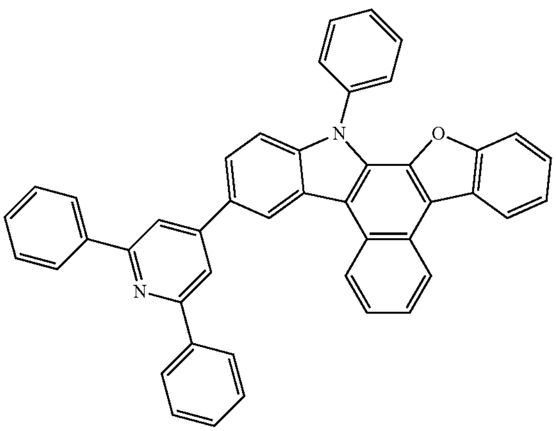
B-166
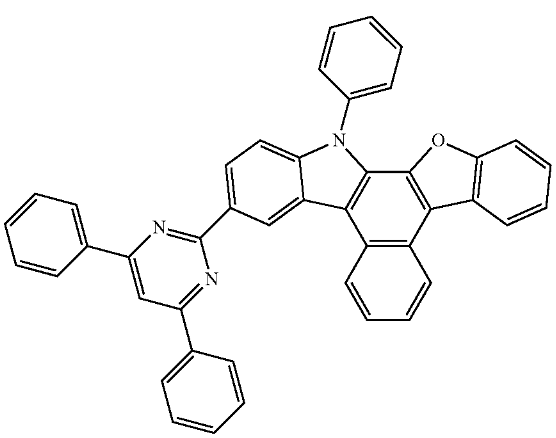
-continued
B-167
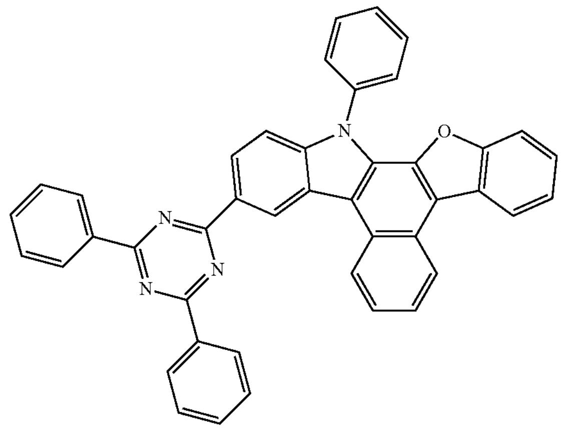
B-168
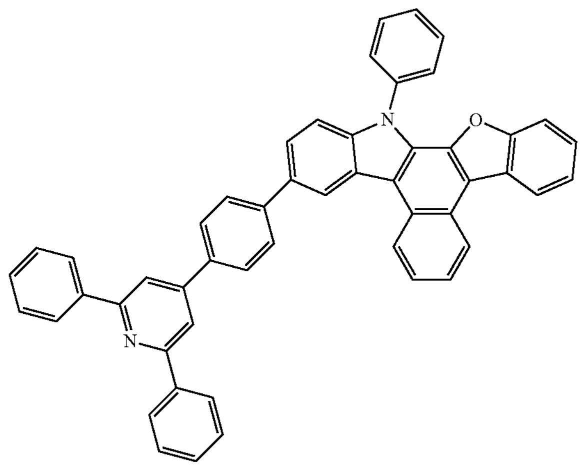
B-169
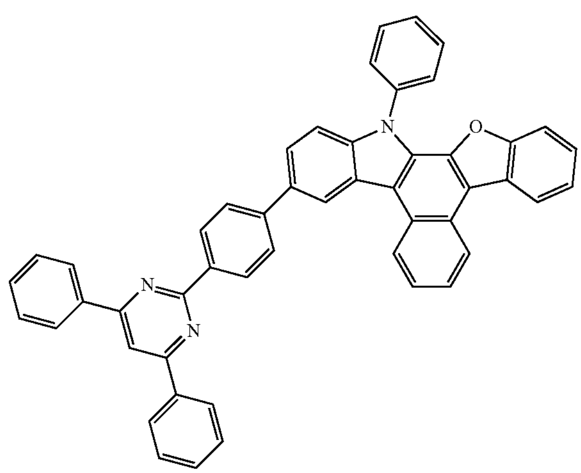

B-170
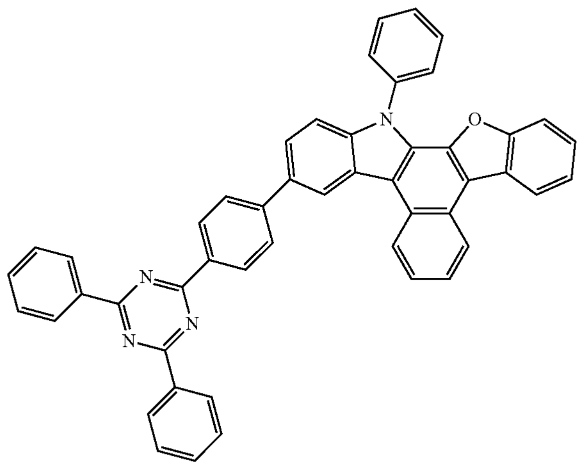
B-171
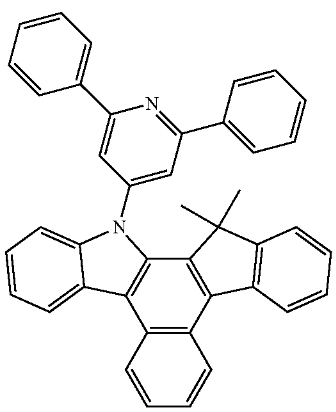
B-172
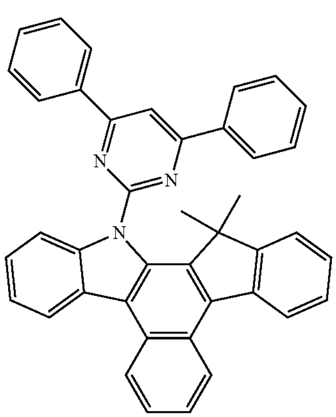
B-173
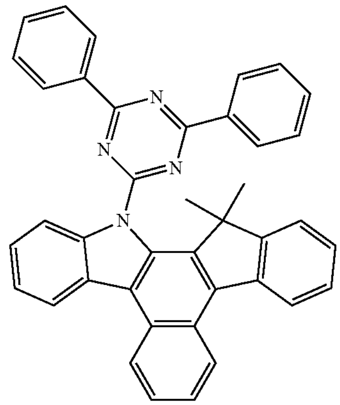
B-174
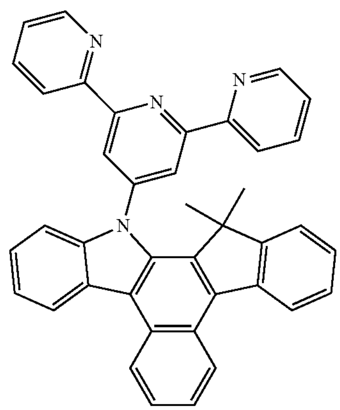
B-175
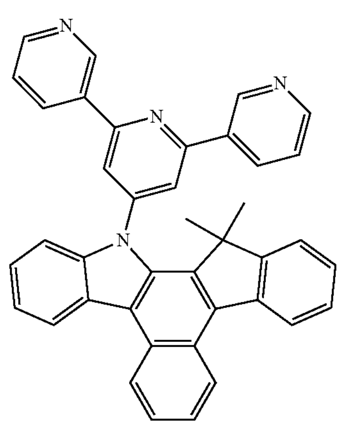

-continued
B-176
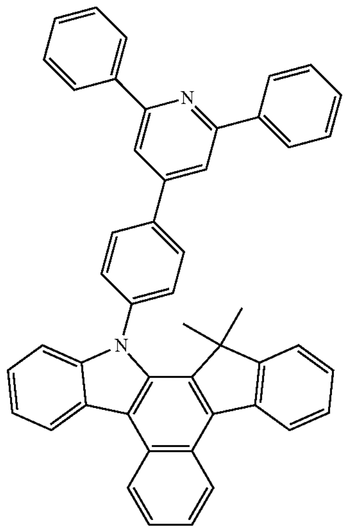
B-177
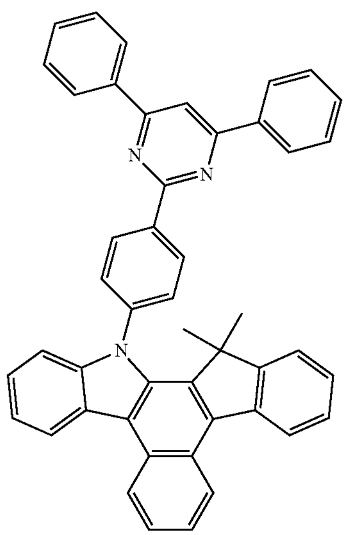
B-178
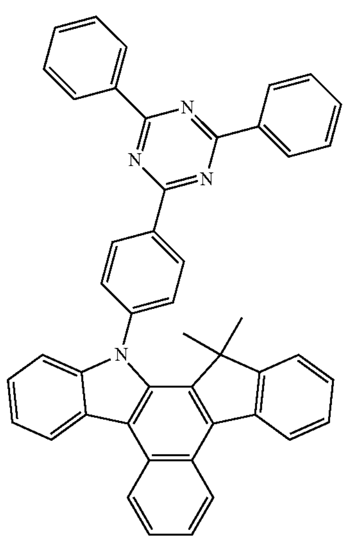
-continued
B-179
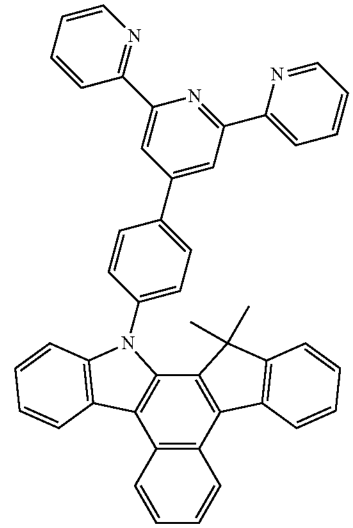
B-180
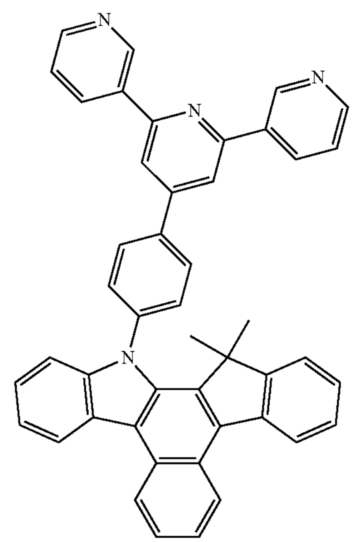
B-181
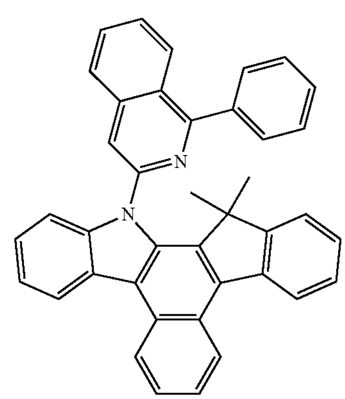

-continued
B-182
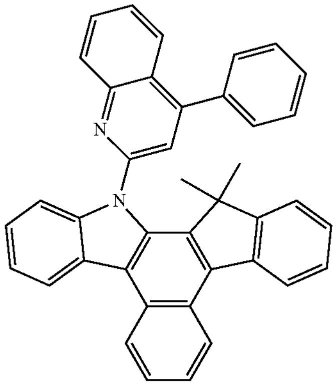
B-183
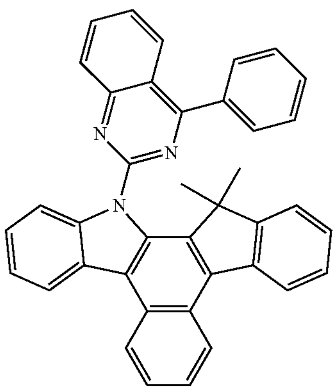
B-184
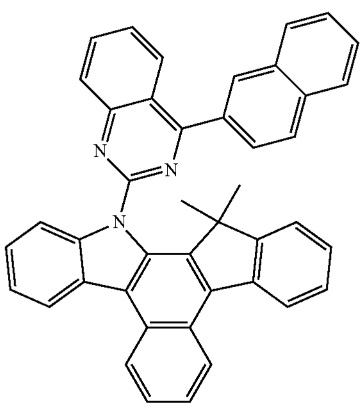
B-185
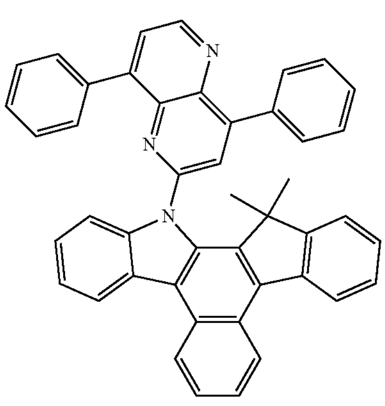
-continued
B-186
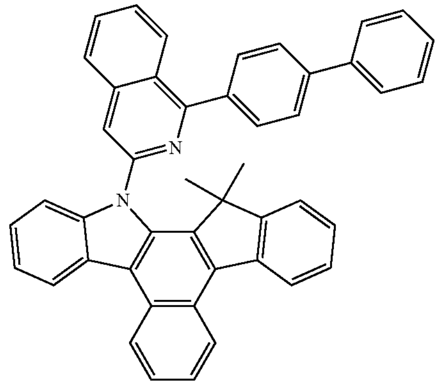
B-187
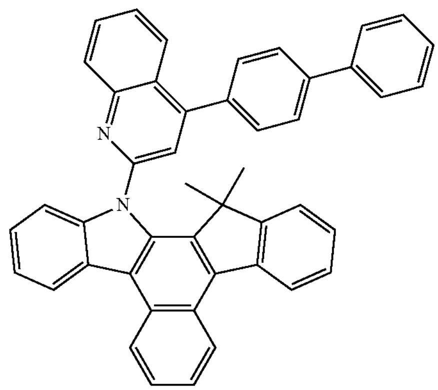
B-188
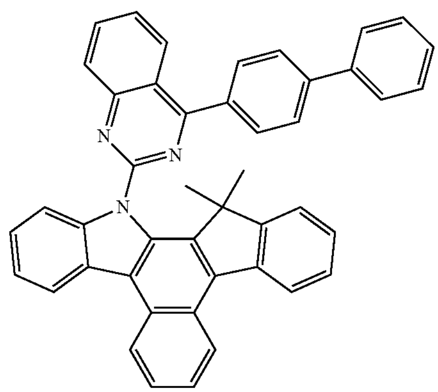
B-189
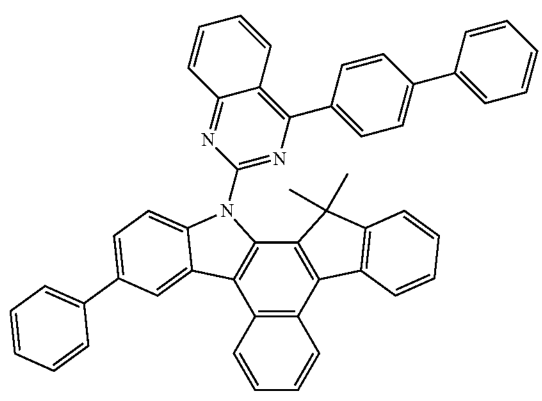

-continued
B-190
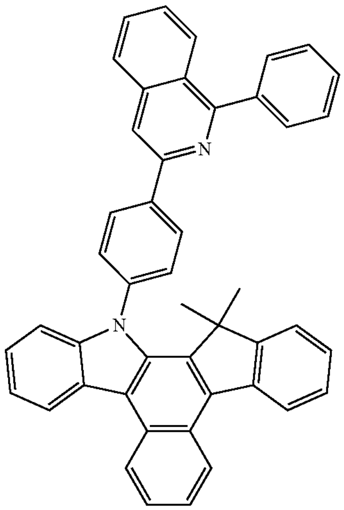
B-191
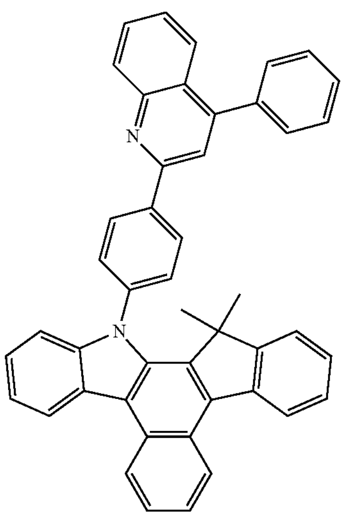
B-192
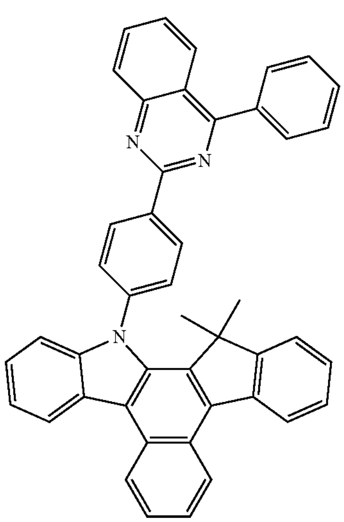
-continued
B-193
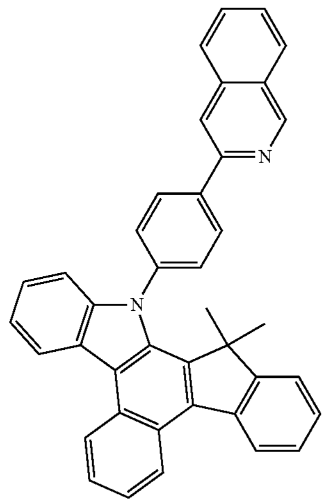
B-194
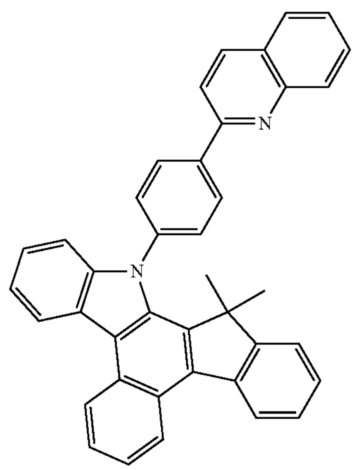
B-195
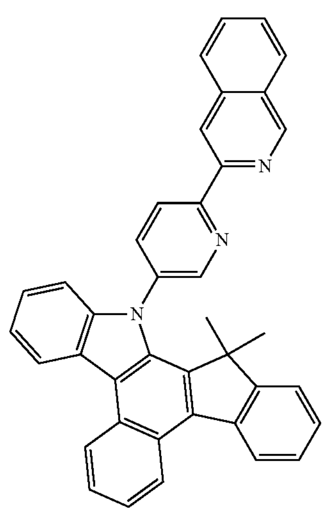

-continued
B-196
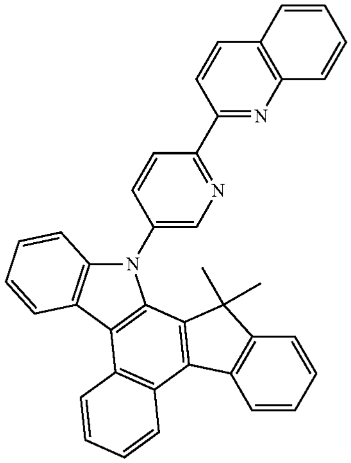
B-197
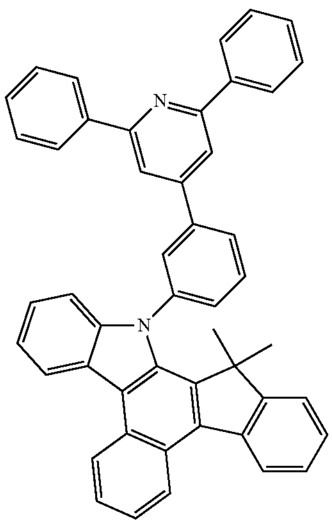
B-198
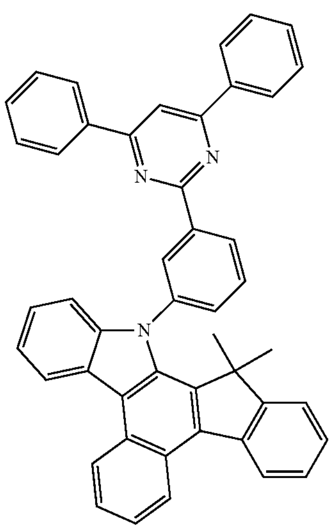
-continued
B-199
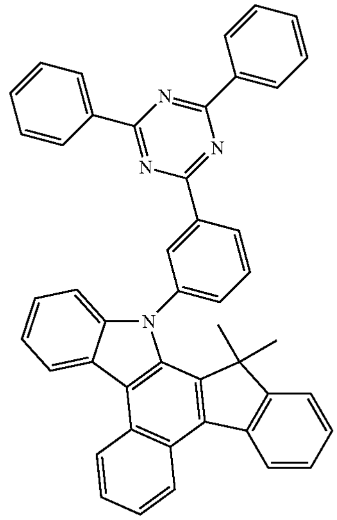
B-200
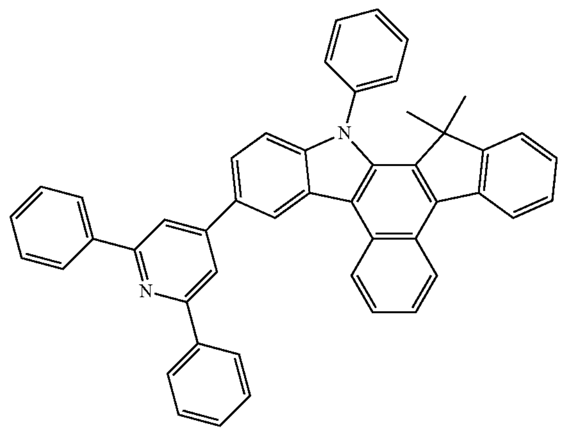
B-201
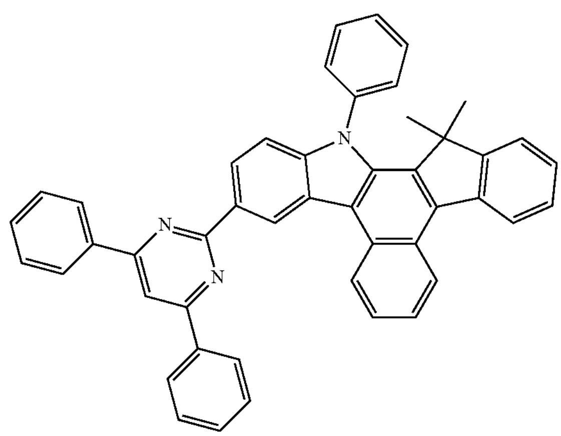

B-202
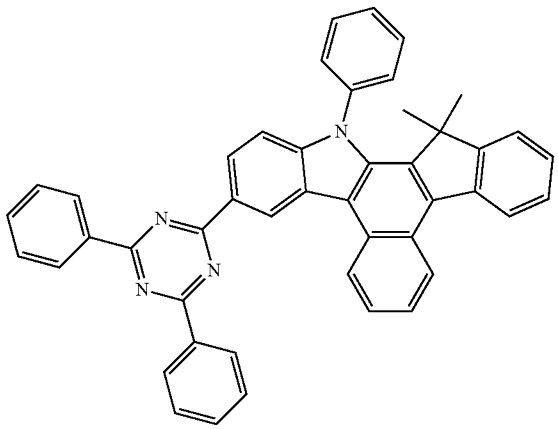
B-203
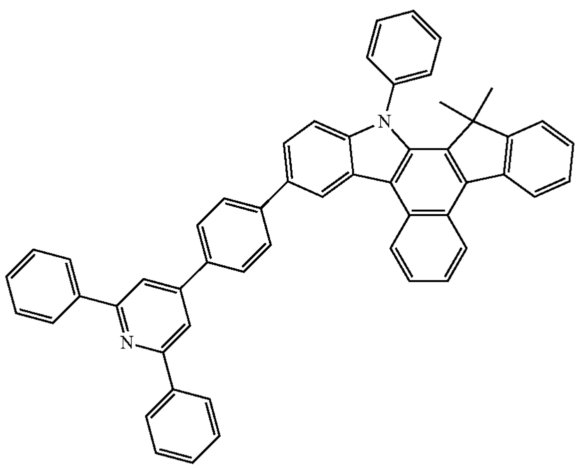
B-204
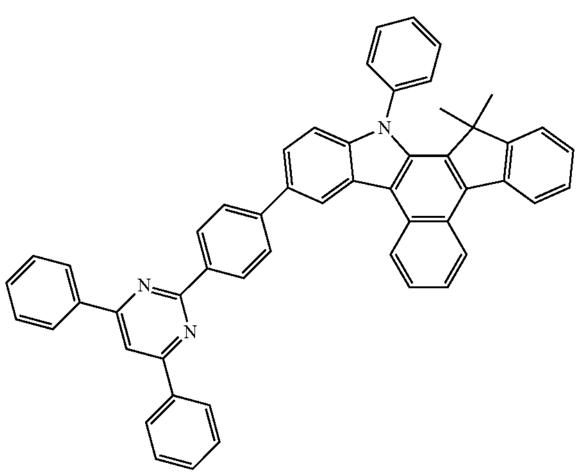
B-205
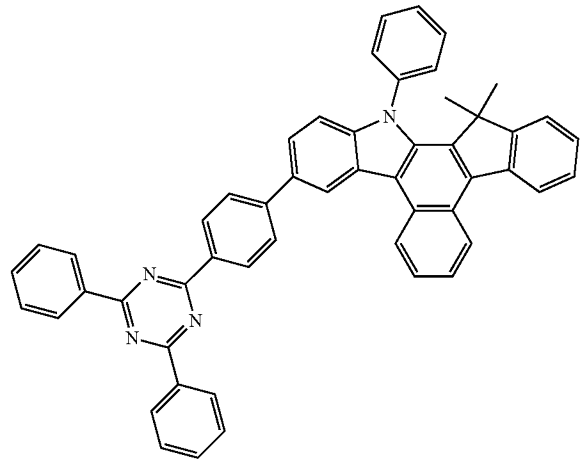
C-101
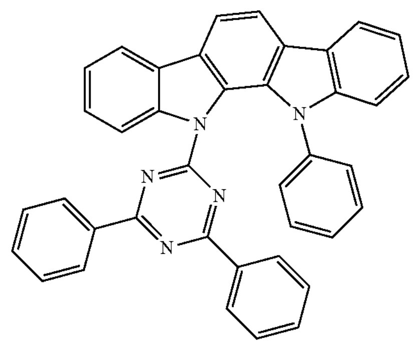
C-102
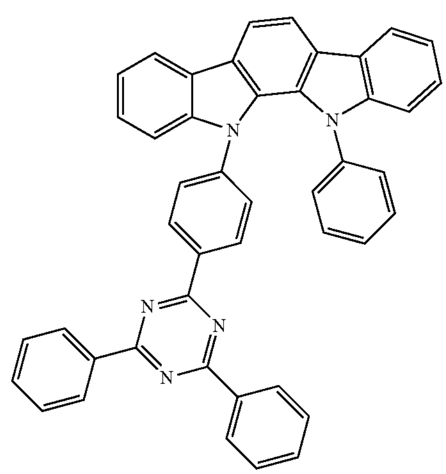

-continued
C-103
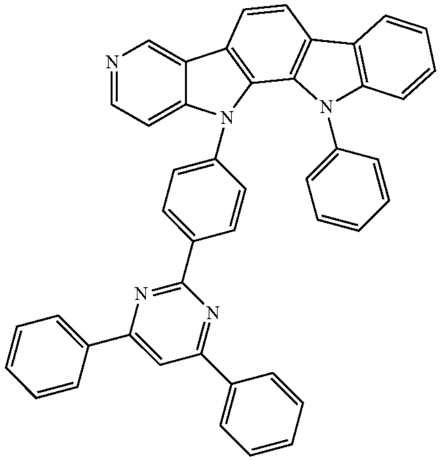
C-104
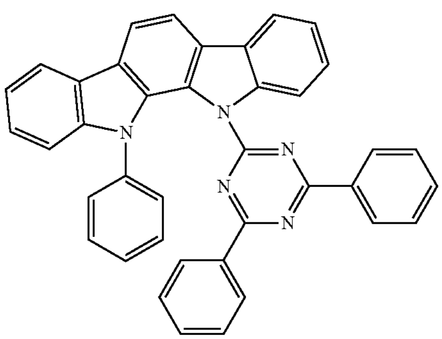
C-105
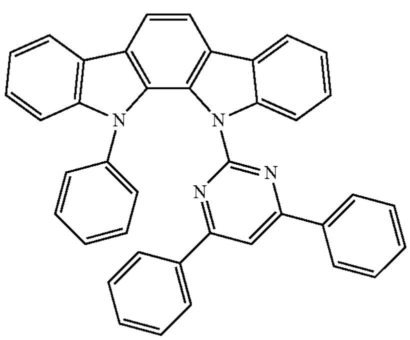
C-106
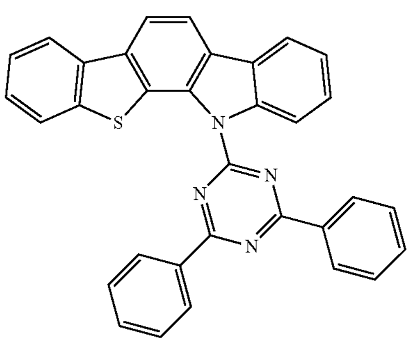
-continued
C-107
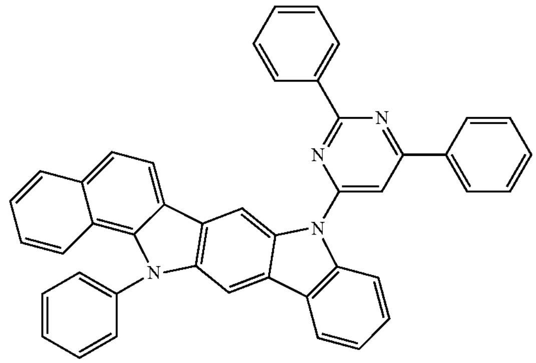
C-108
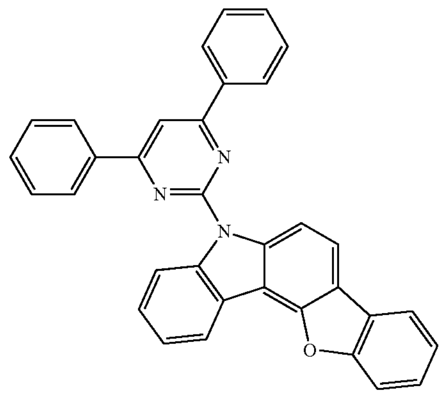
C-109
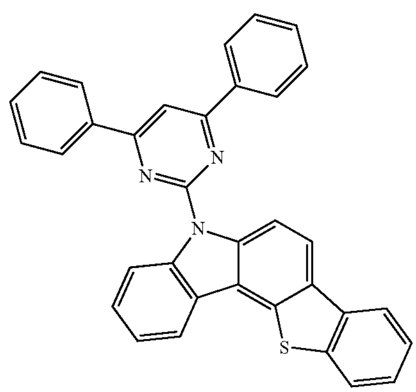
C-110
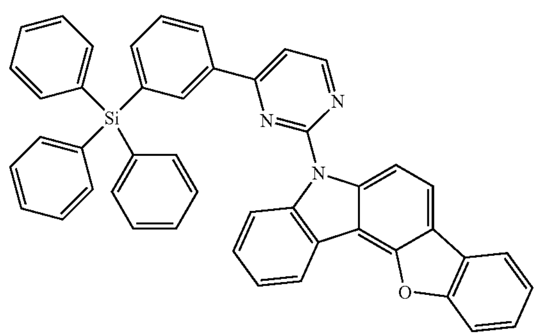

C-110
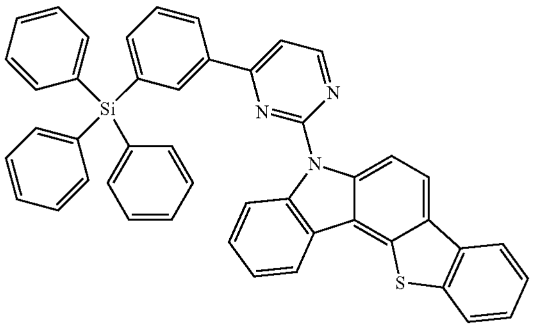
C-112
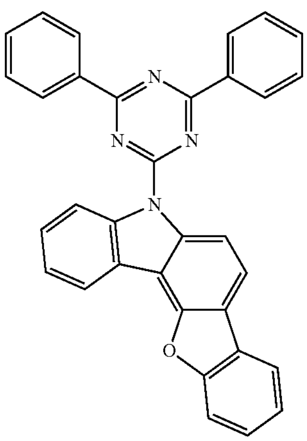
C-113
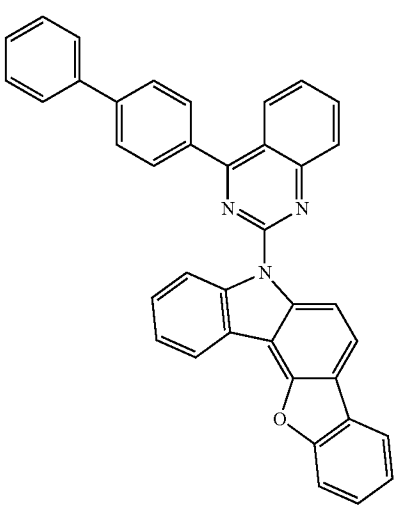
C-114
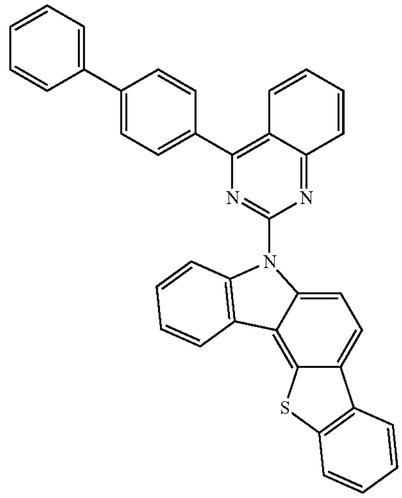
C-116
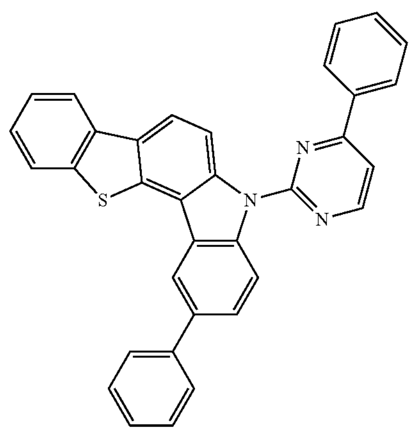
C-117
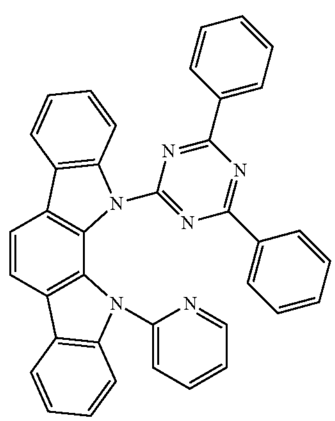

C-118
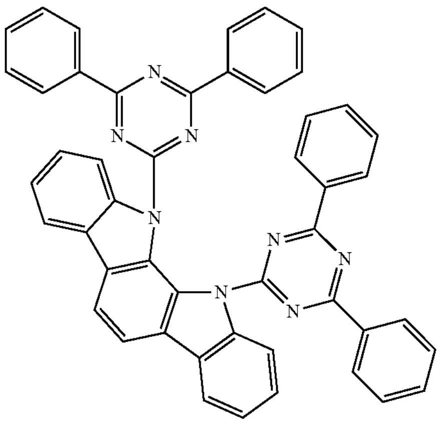
C-119
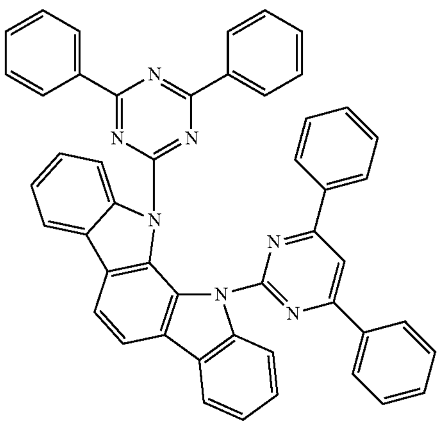
C-120
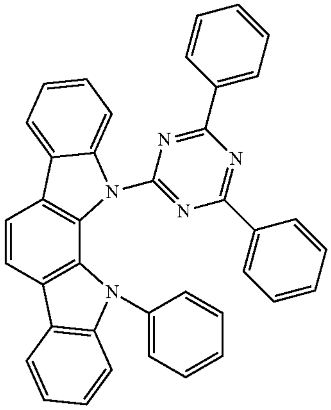
C-121
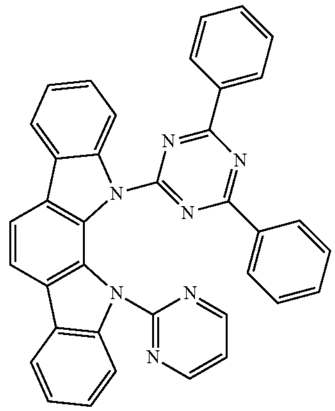
C-122
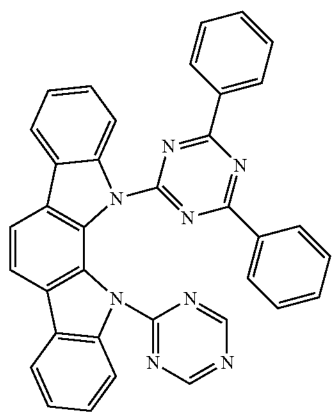
C-123
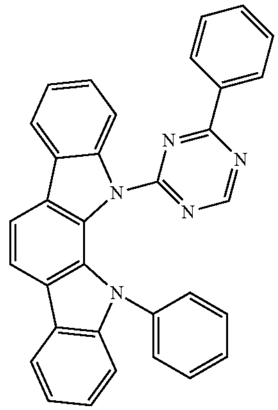

-continued
C-124
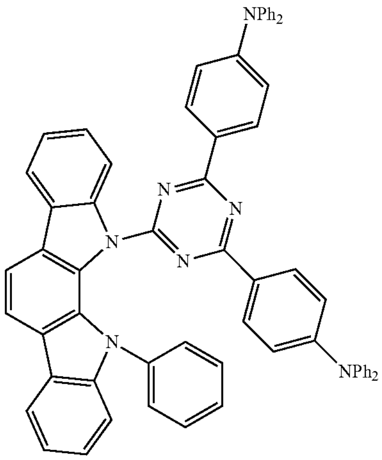
C-125
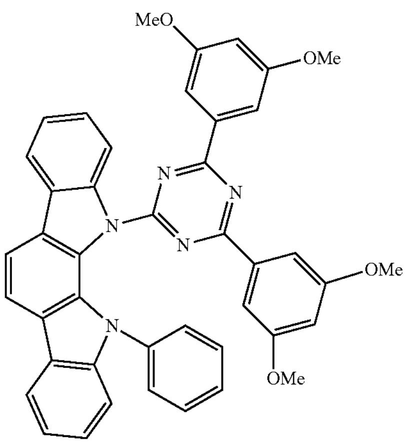
C-126
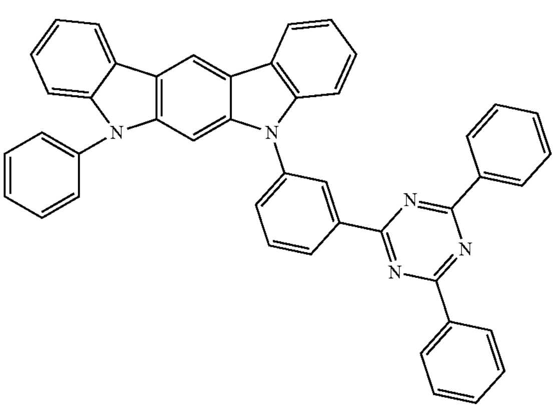
-continued
C-127
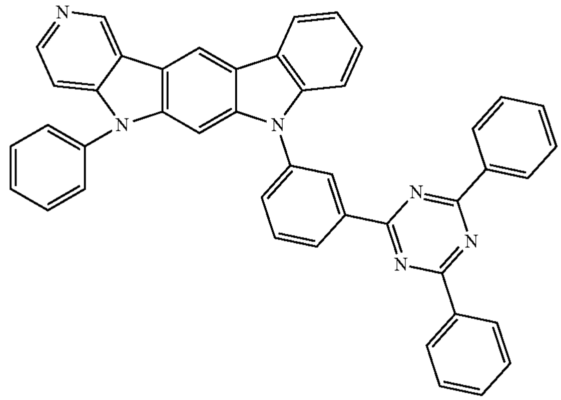
C-128
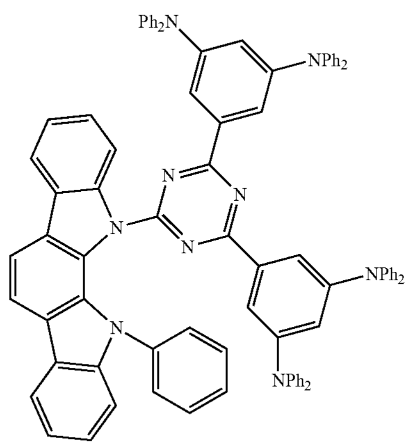
C-129
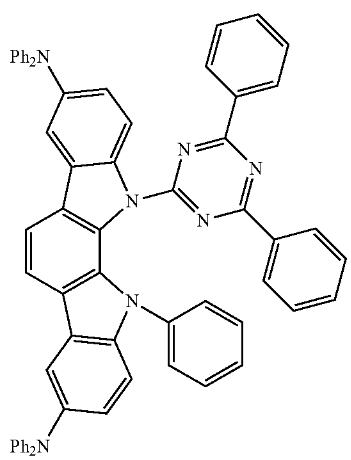

-continued
C-130
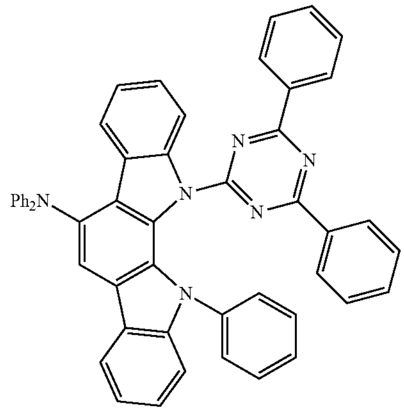
C-131
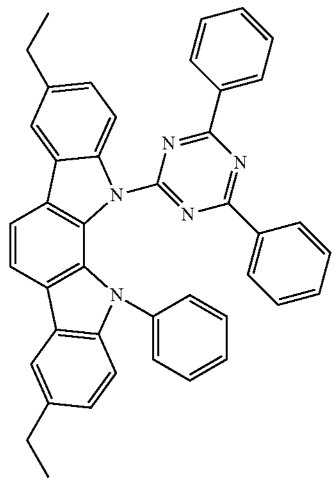
C-132
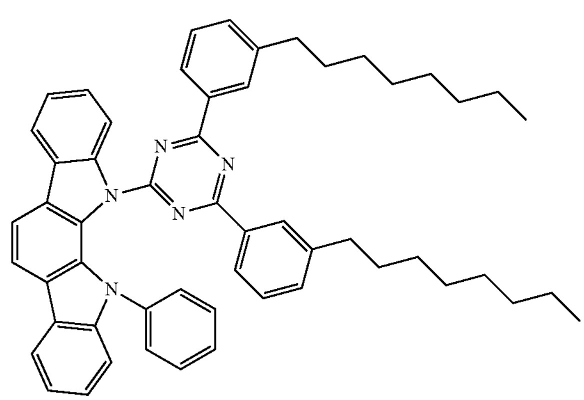
-continued
C-133
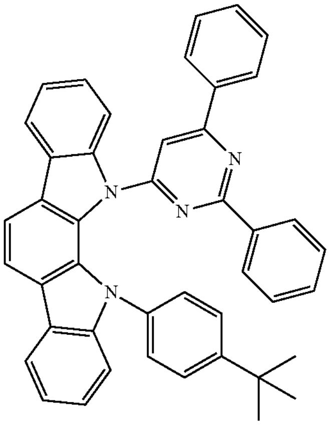
C-134
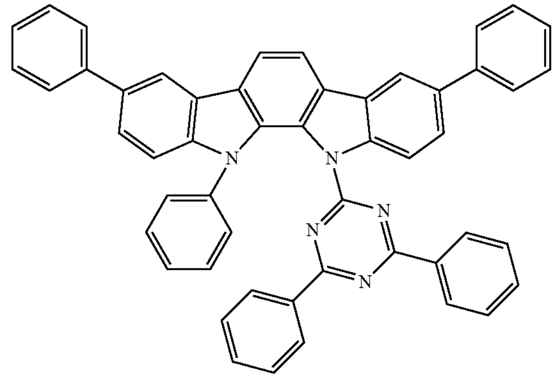
C-135
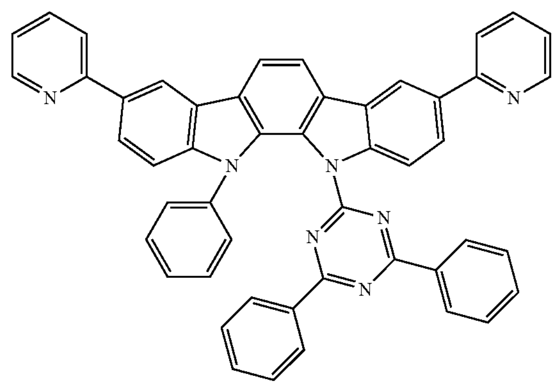
C-136
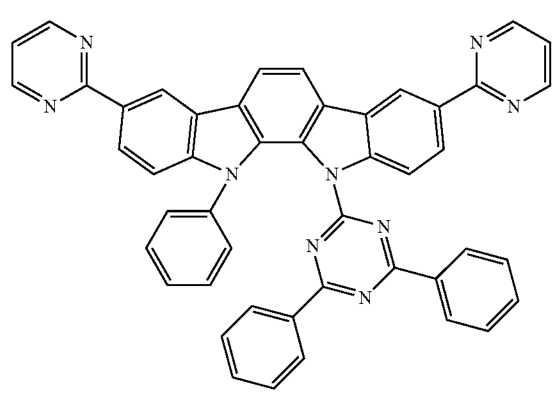

-continued
C-137
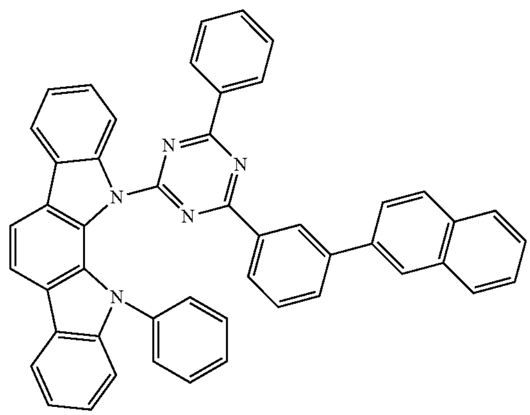
C-138
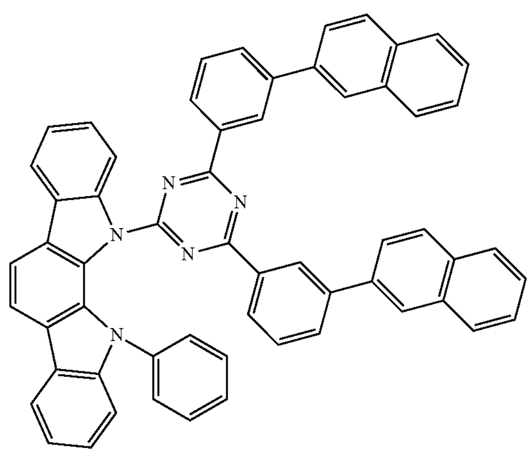
C-139
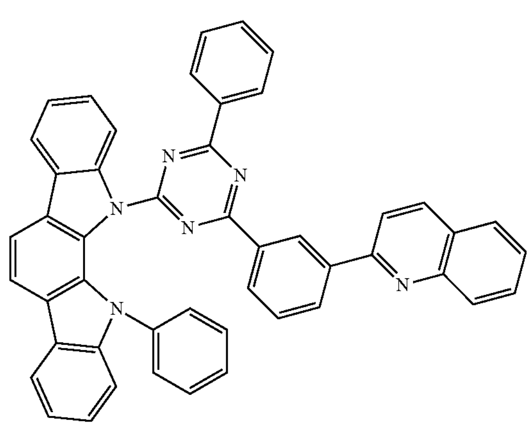
-continued
C-140
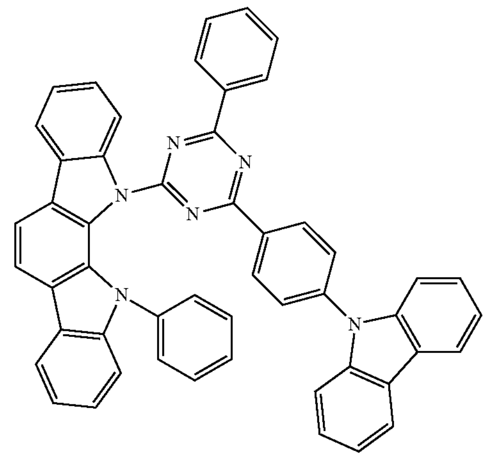
C-141
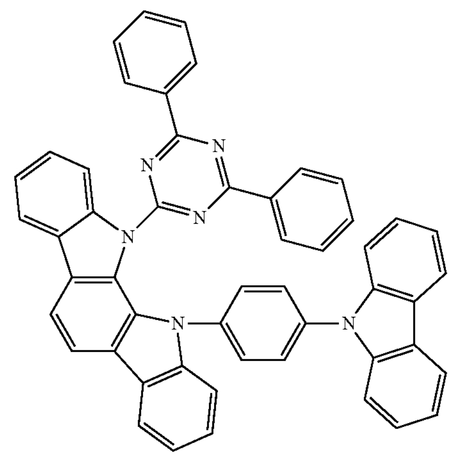
C-142
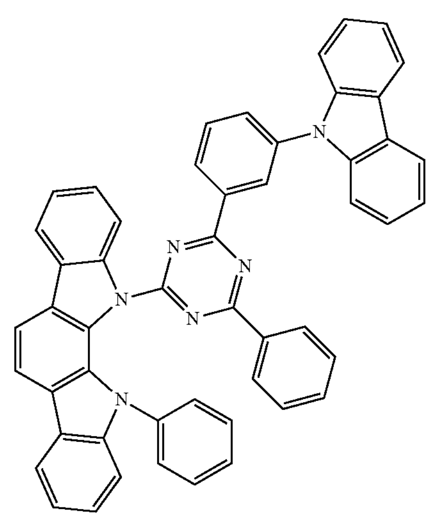

-continued
C-143
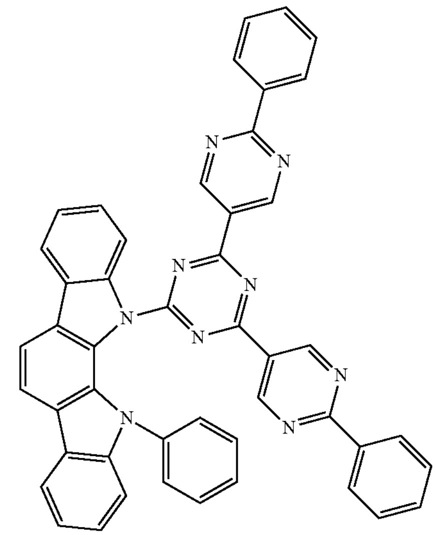
C-144
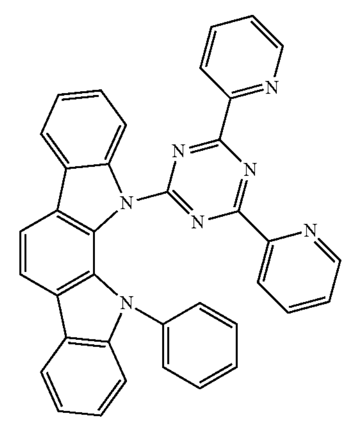
C-145
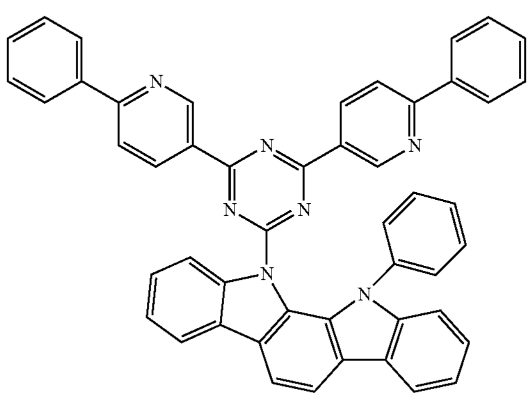
-continued
C-146
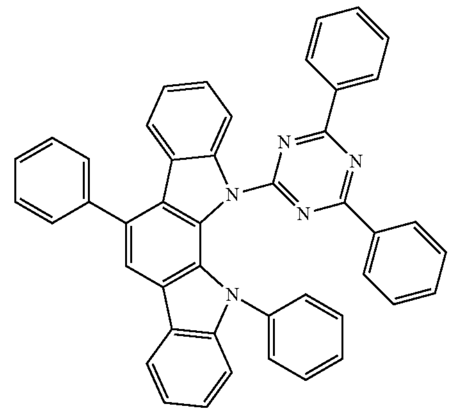
C-147
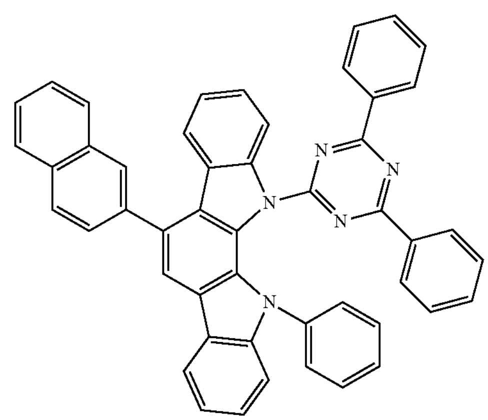
C-148
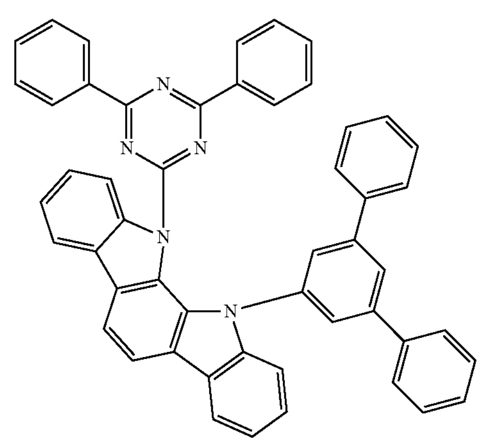

-continued
C-149
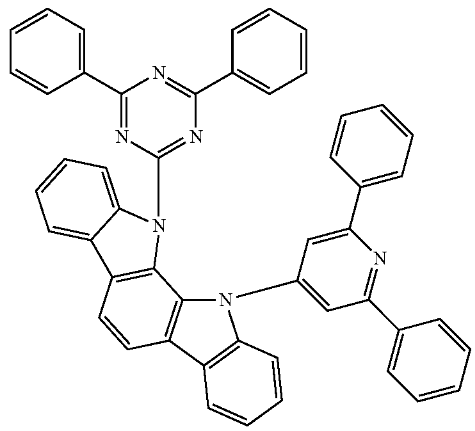
C-150
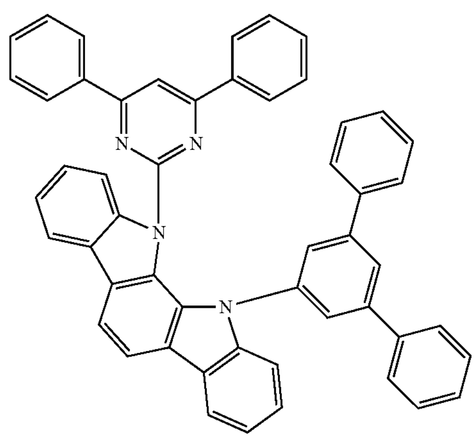
C-151
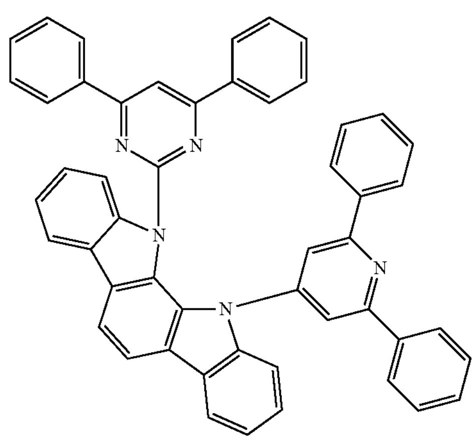
-continued
C-152
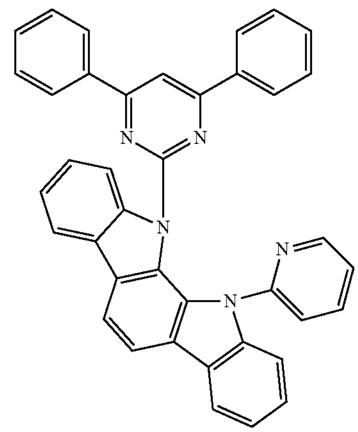
C-153
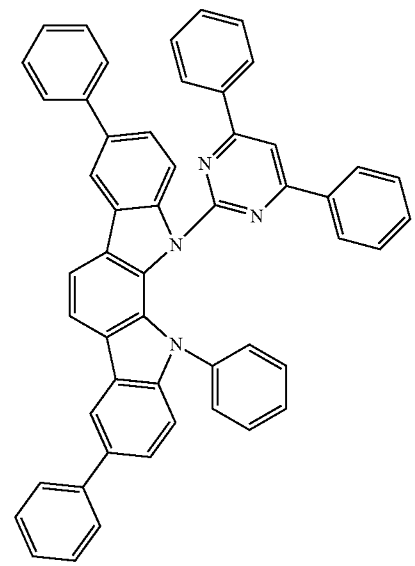
C-154
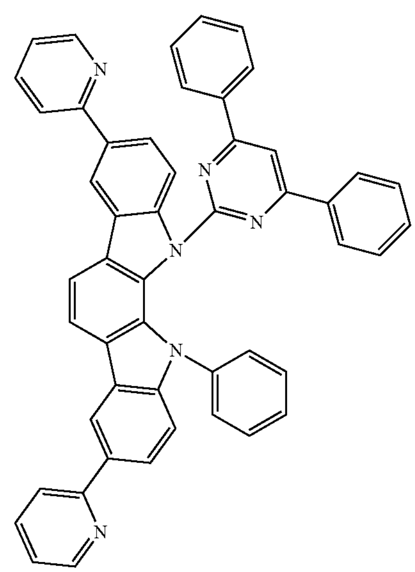

-continued
C-155
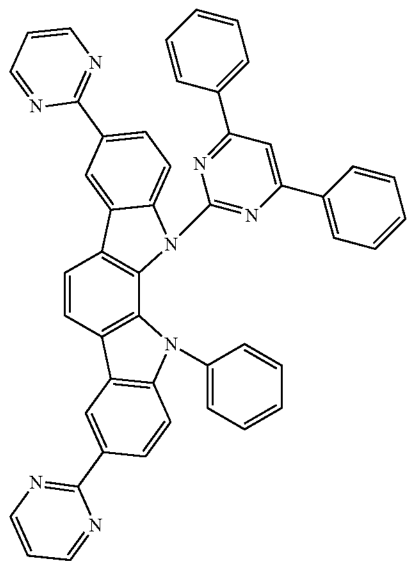
C-156
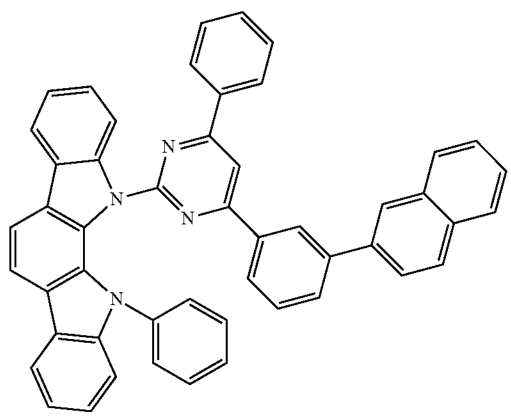
C-157
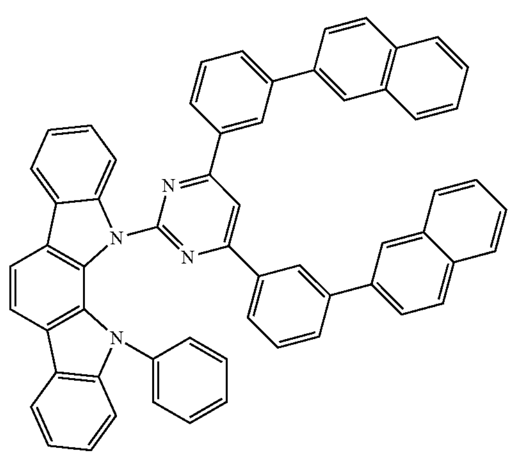
-continued
C-158
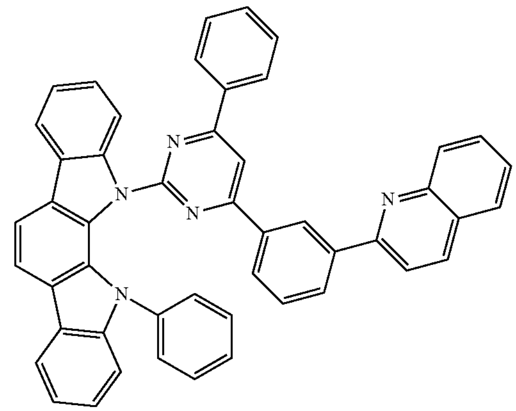
C-159
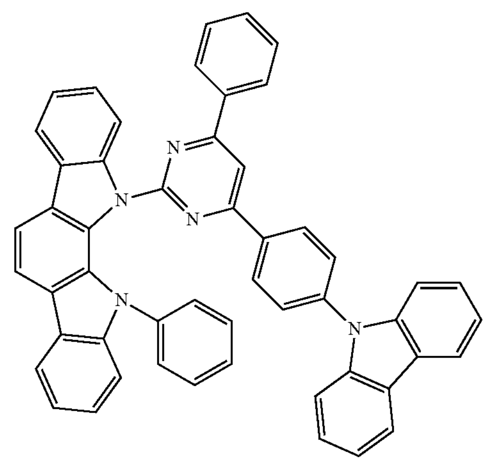
C-160
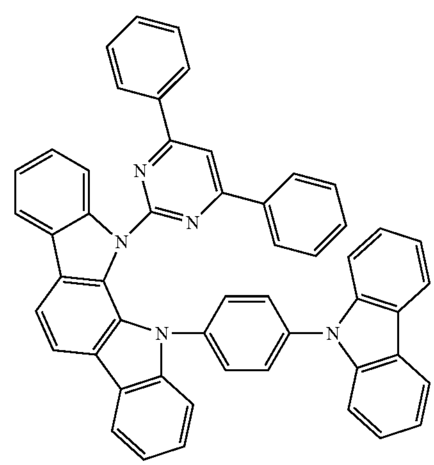

C-161
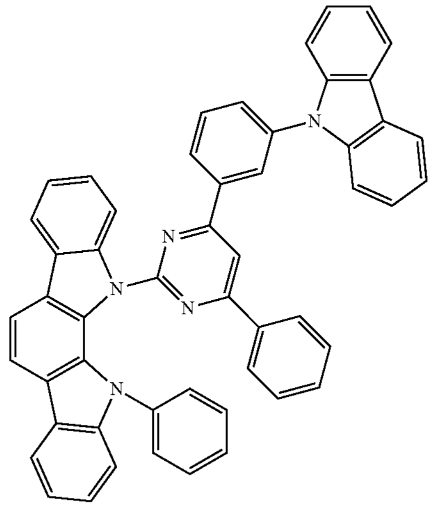
C-162
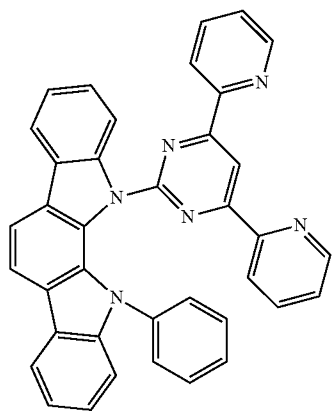
C-163
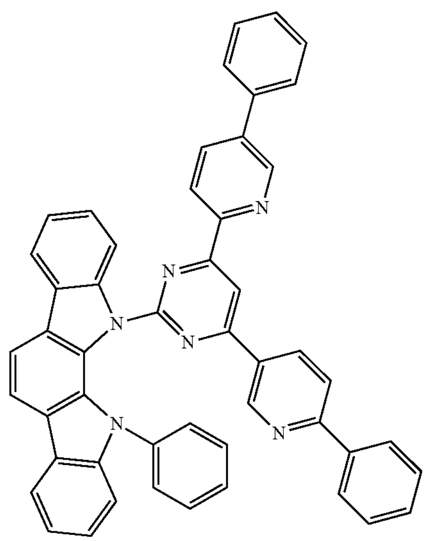
C-164
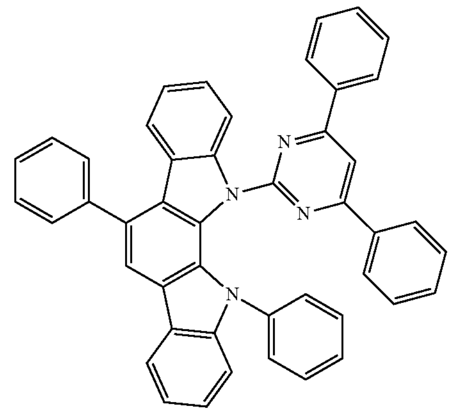
C-165
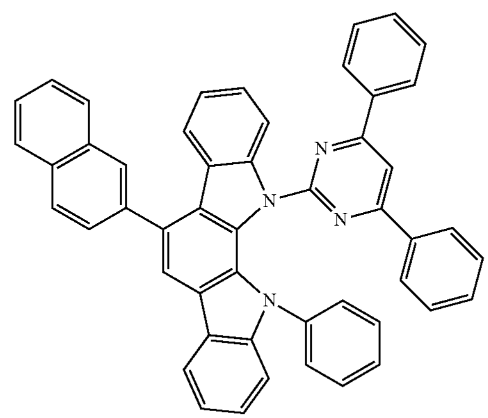
C-166
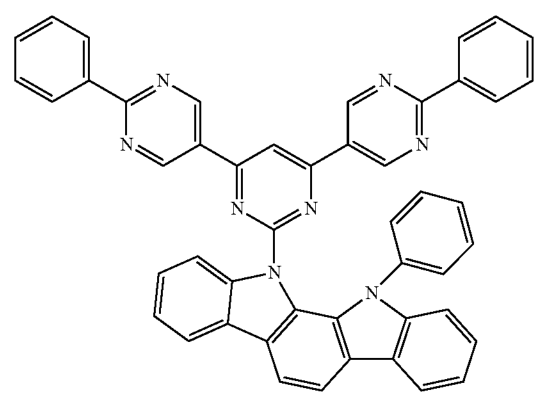
C-167
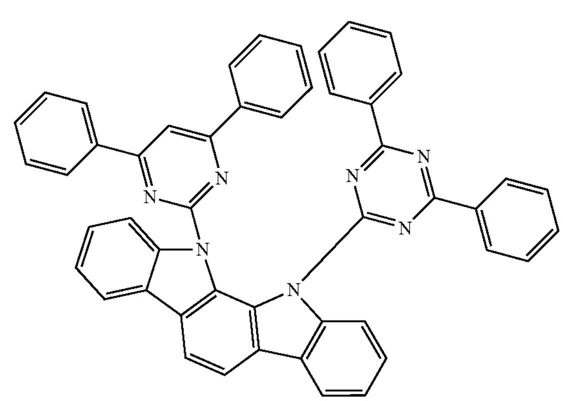

C-168
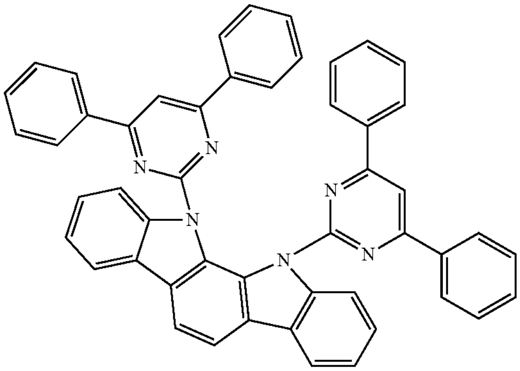
C-169
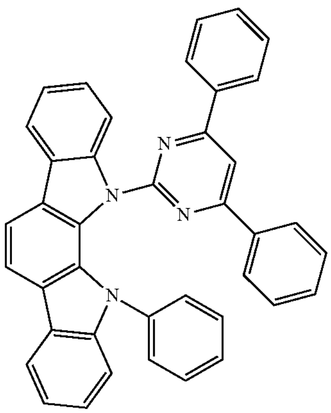
C-170
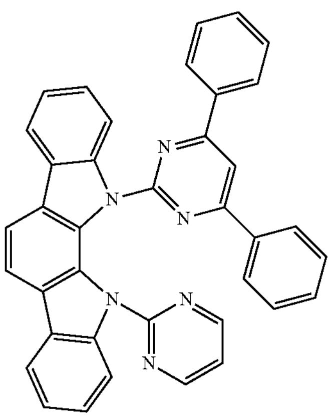
C-171
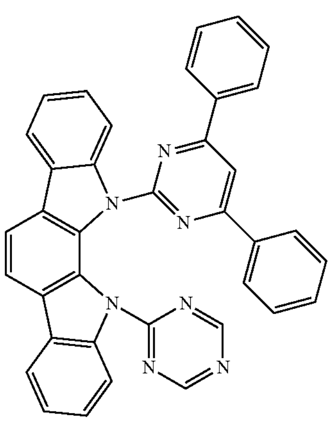
C-172
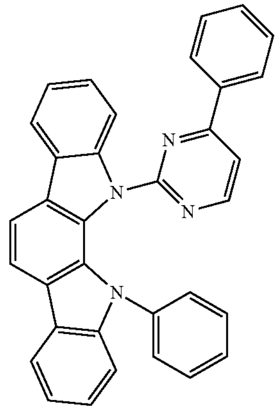
C-173
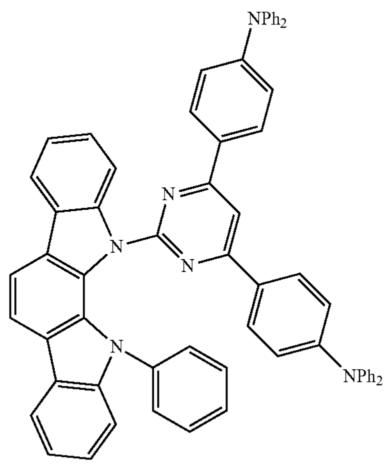
C-174
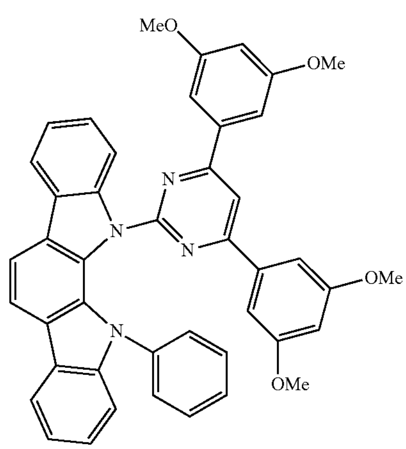

-continued
C-175
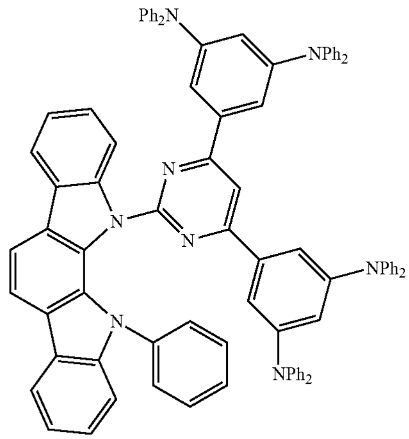
C-176
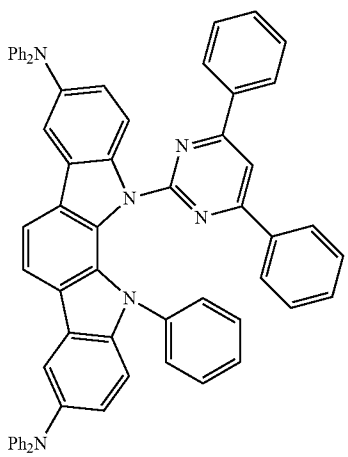
C-177
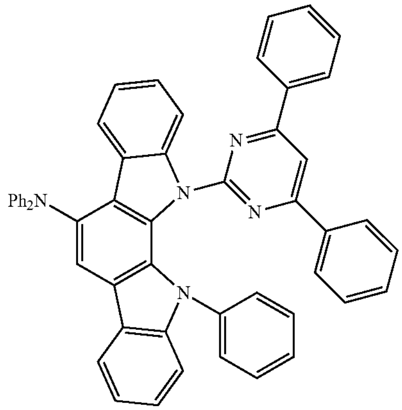
C-178
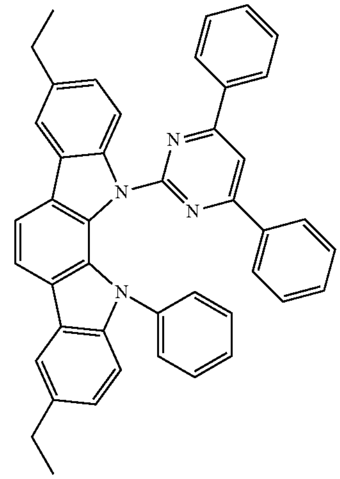
C-179
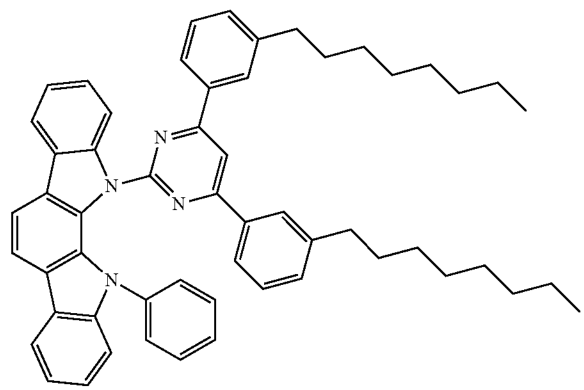
C-180
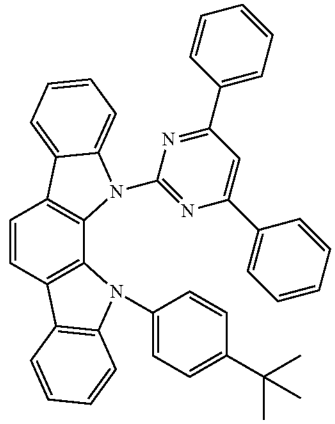

-continued
C-181
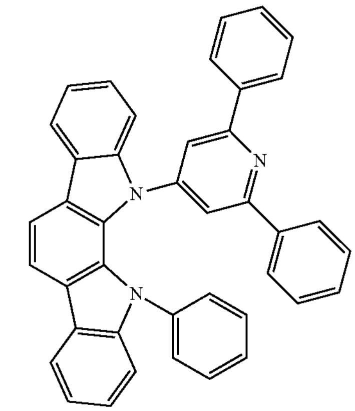
C-182
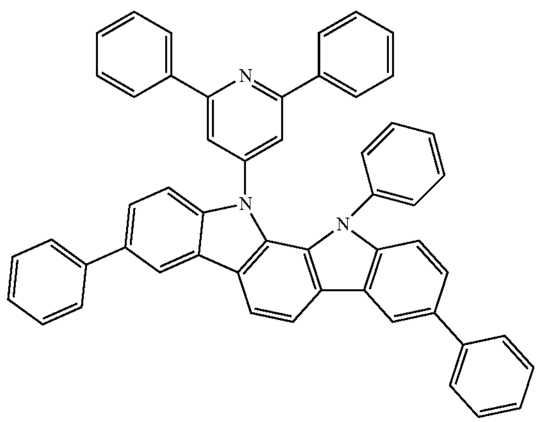
C-183
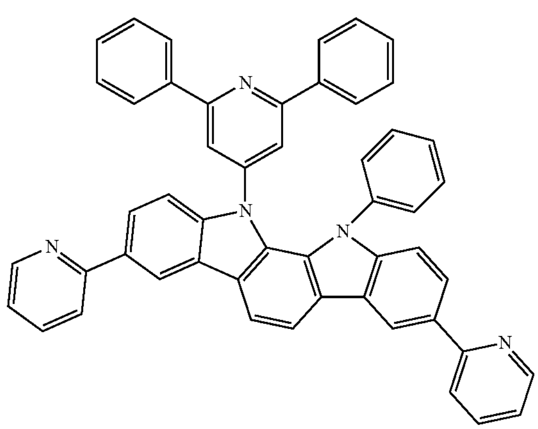
-continued
C-184
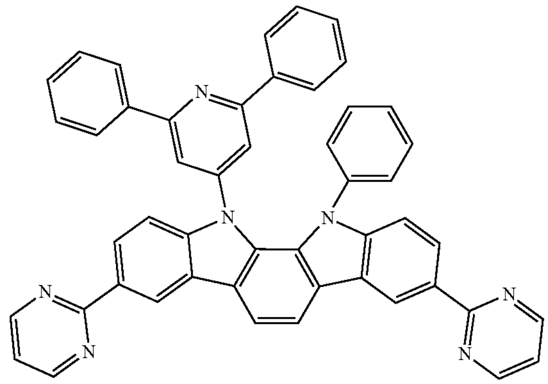
C-185
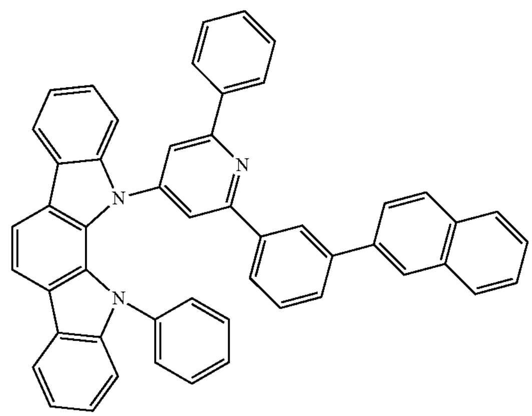
C-186
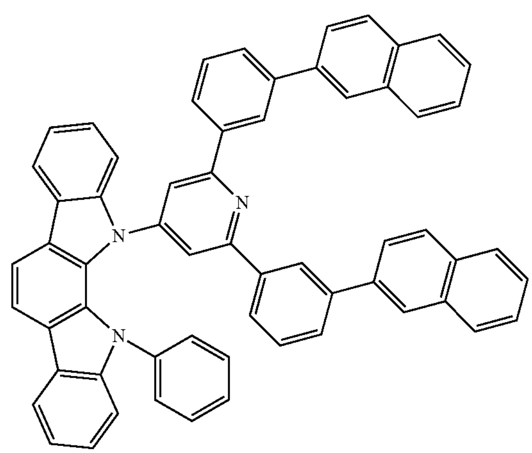

-continued
C-187
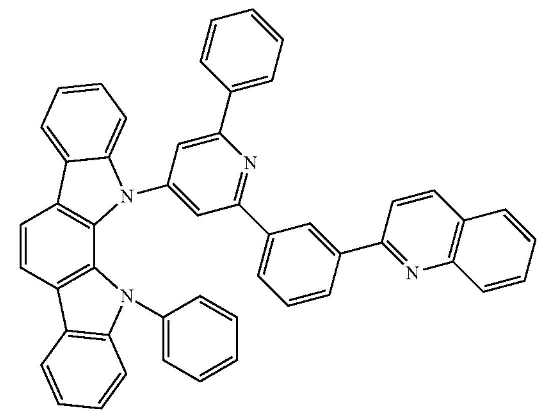
C-188
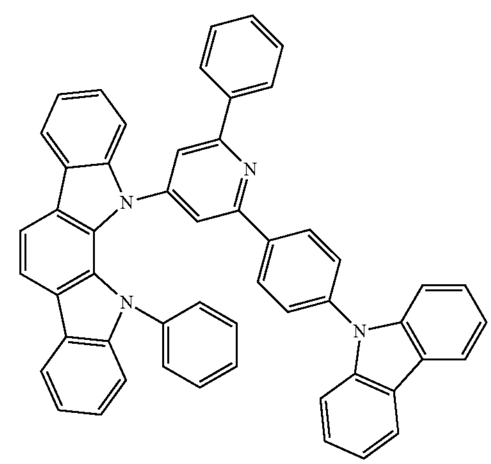
C-189
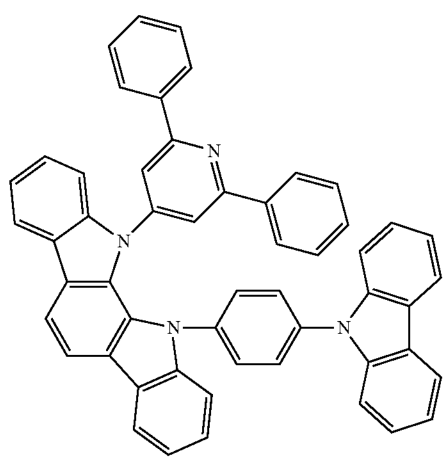
-continued
C-190
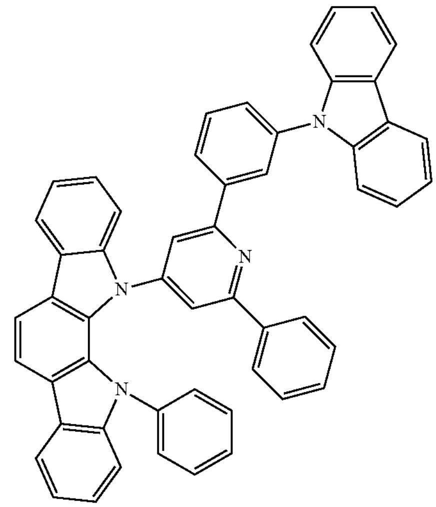
C-191
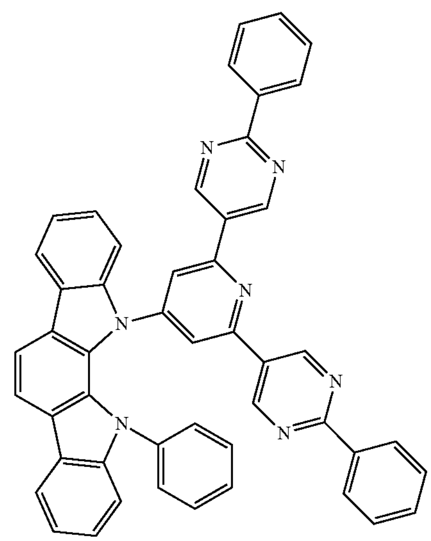
C-192
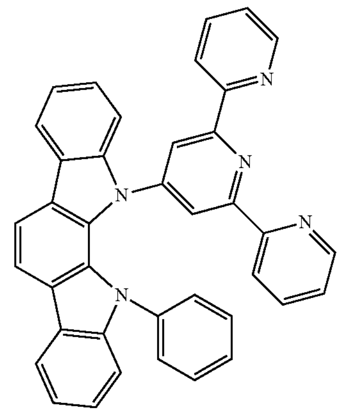

C-193
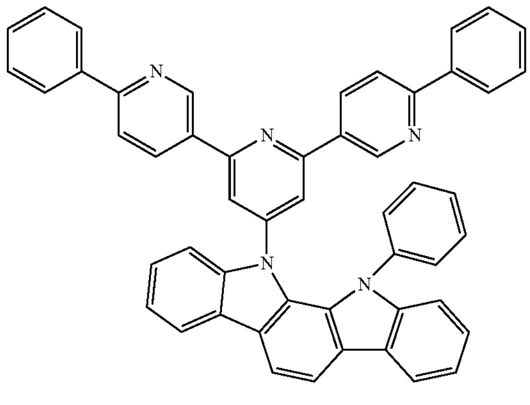
C-194
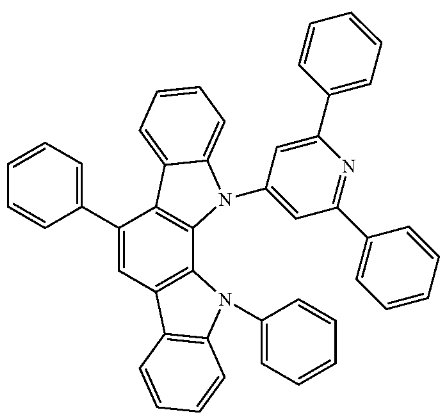
C-195
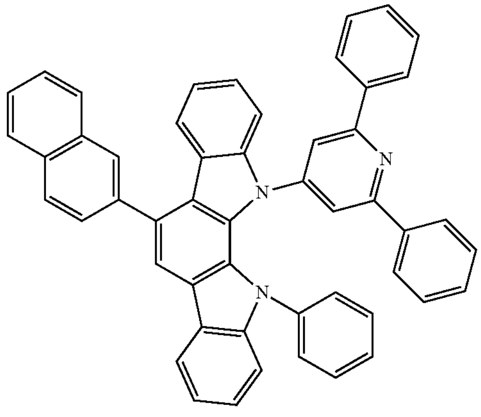
C-196
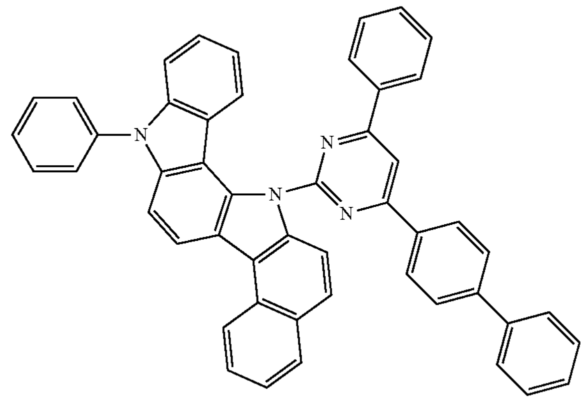
C-197
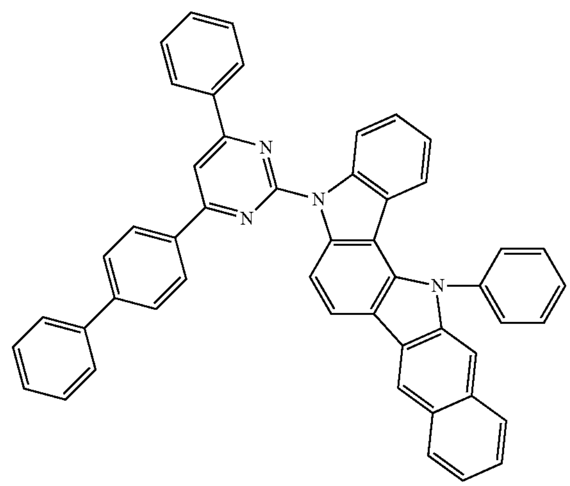
C-198
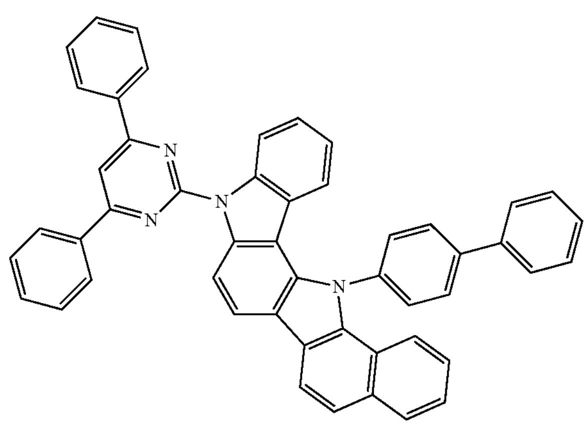

-continued
C-199
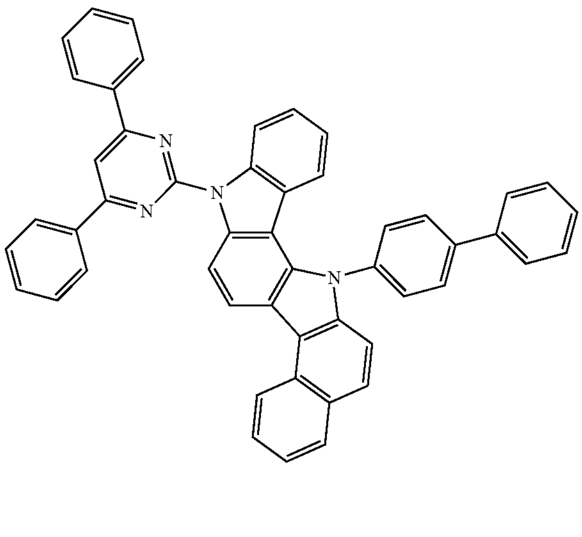
C-200
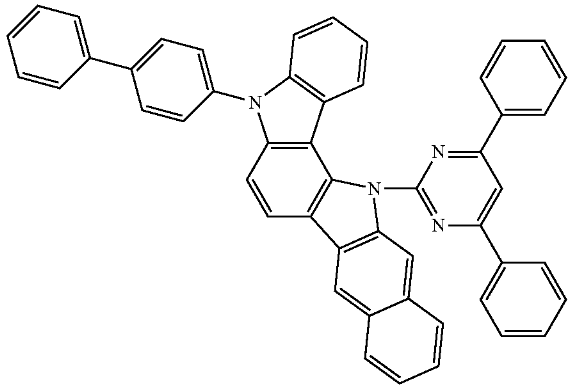
C-201
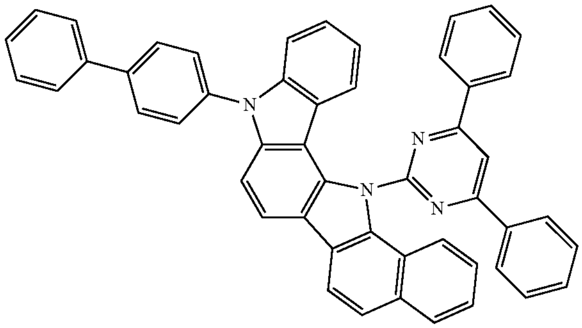
-continued
C-202
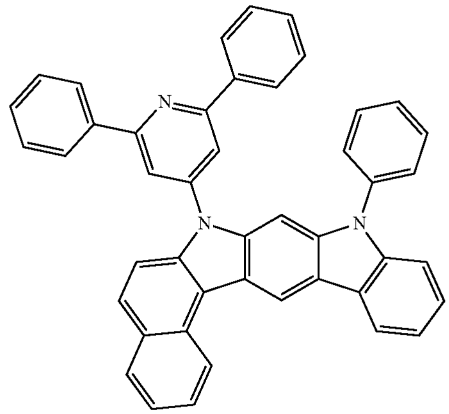
C-203
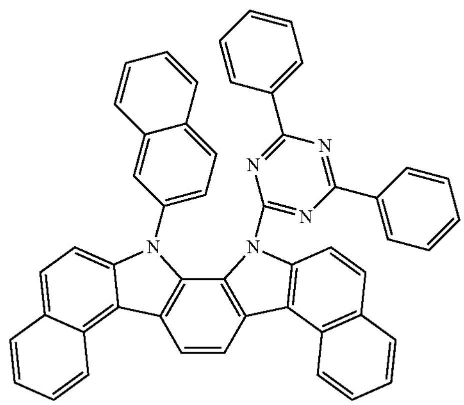
C-204
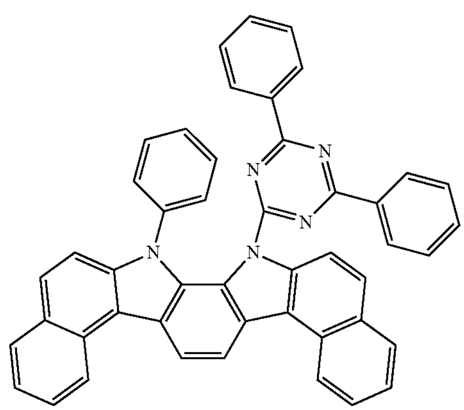
C-205
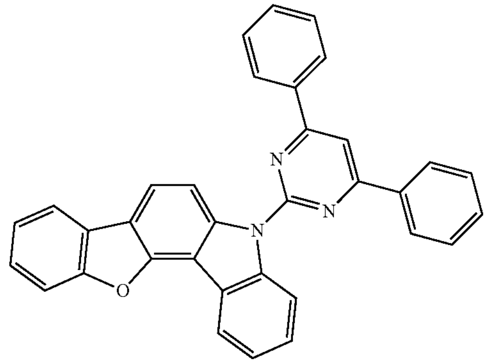

C-206
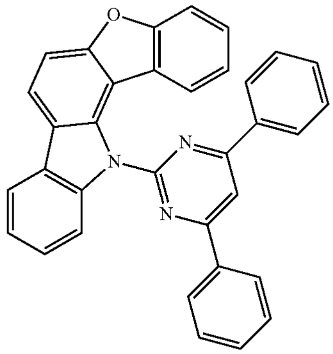
C-207
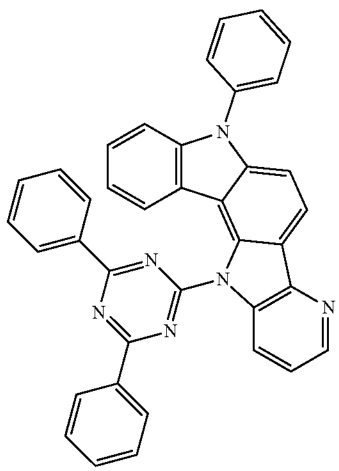
C-208
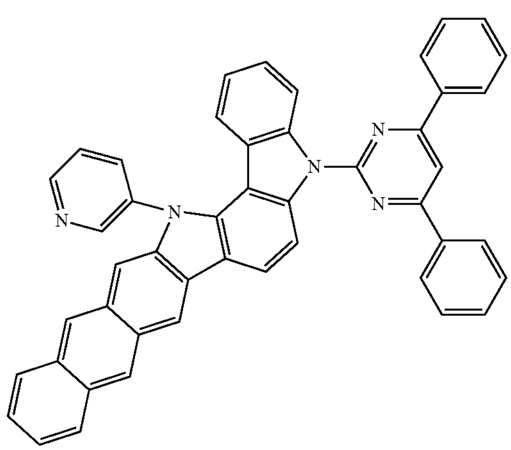
C-209
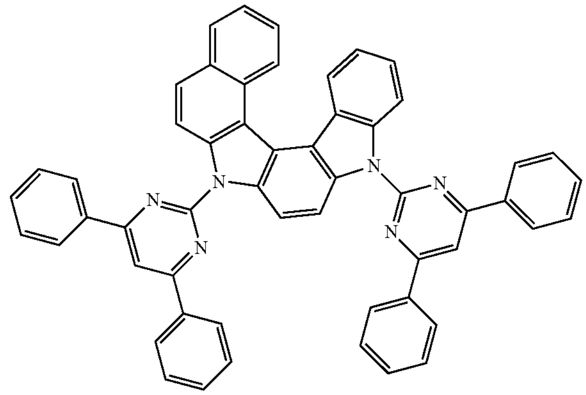
C-210
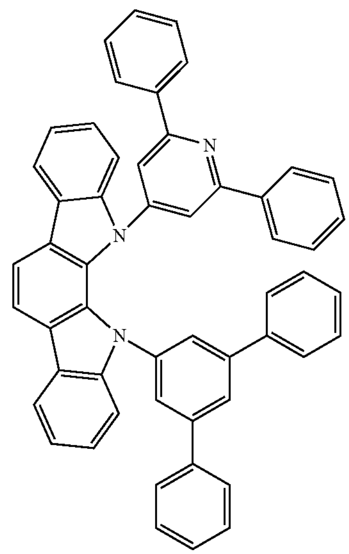
C-211
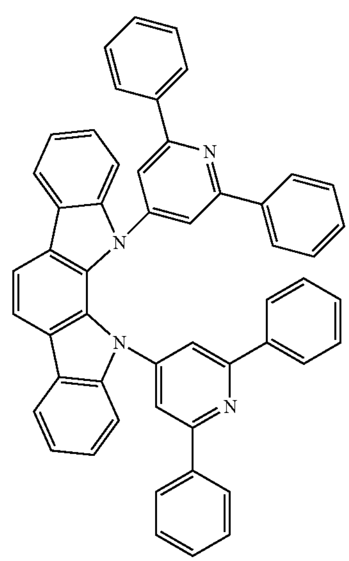

C-212
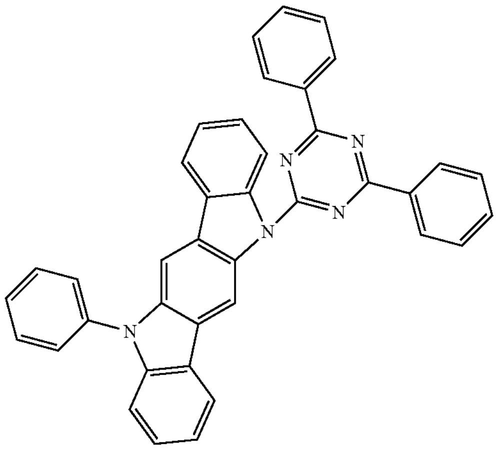
C-213
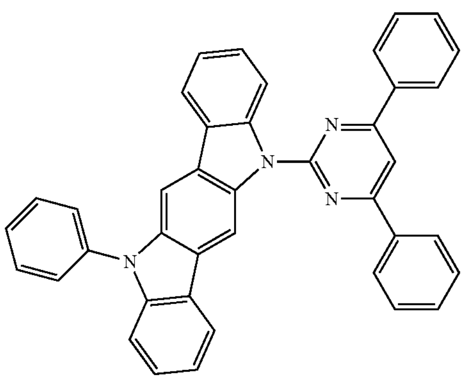
C-124
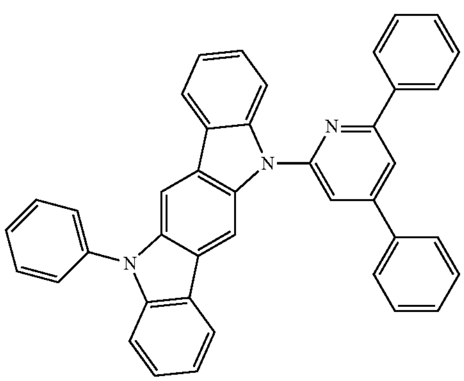
C-215
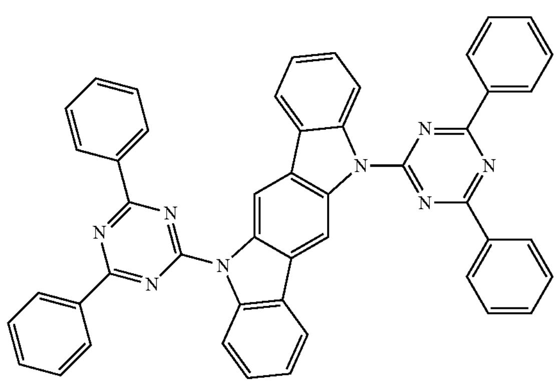
C-216
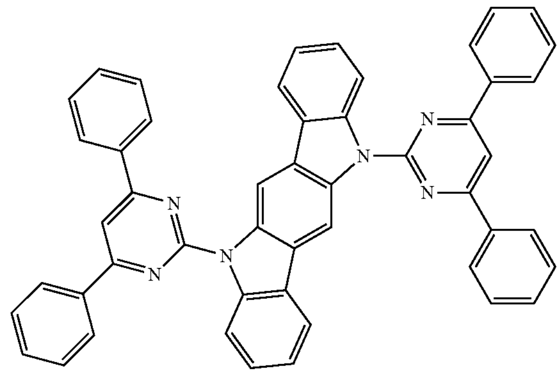
C-217
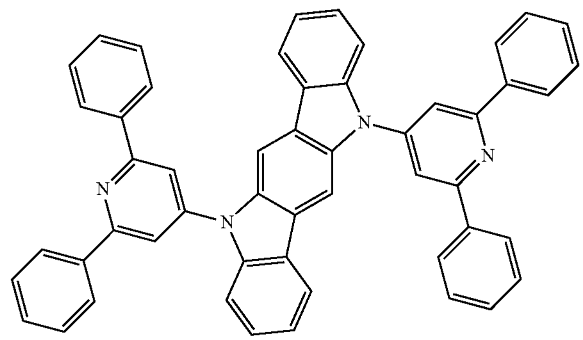
C-218
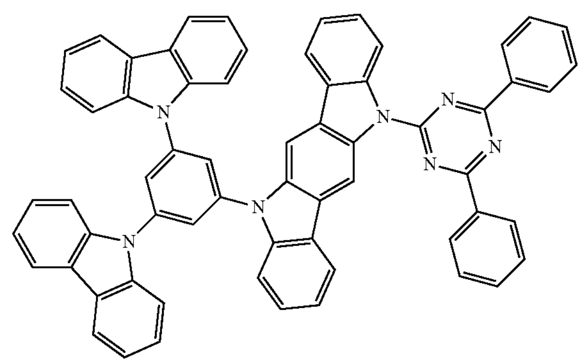
C-219
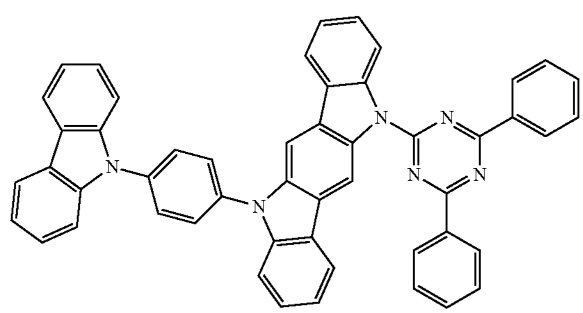

-continued
C-220
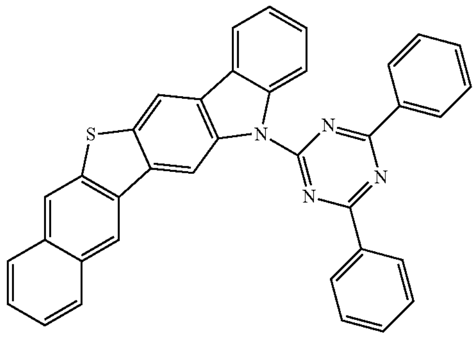
C-221
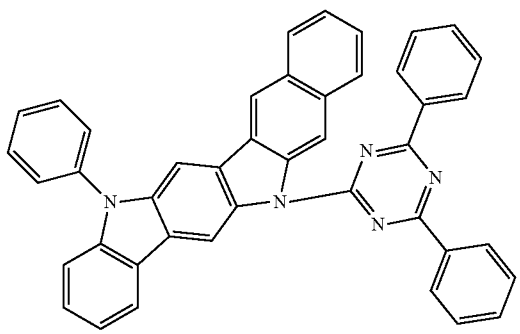
C-224
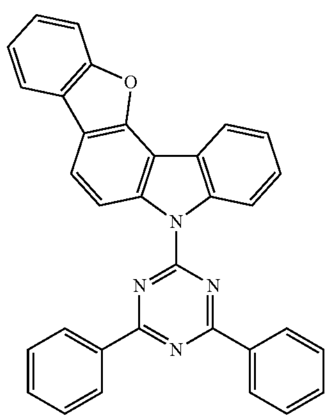
C-225
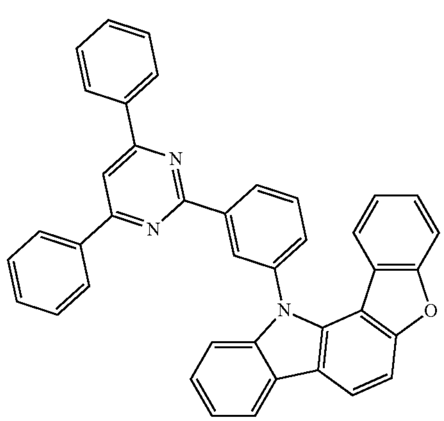
-continued
C-226
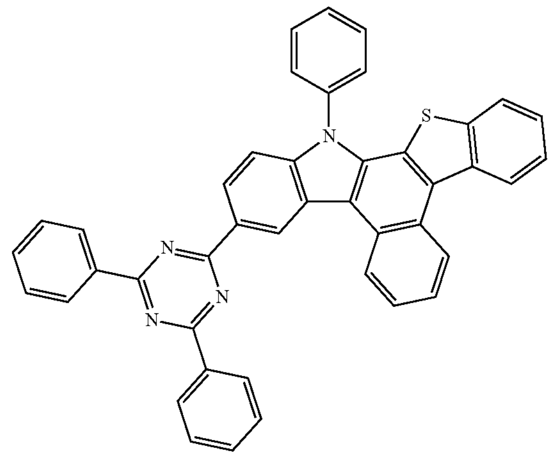
C-227
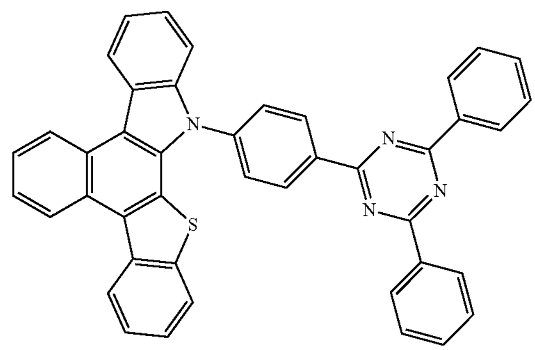
C-228
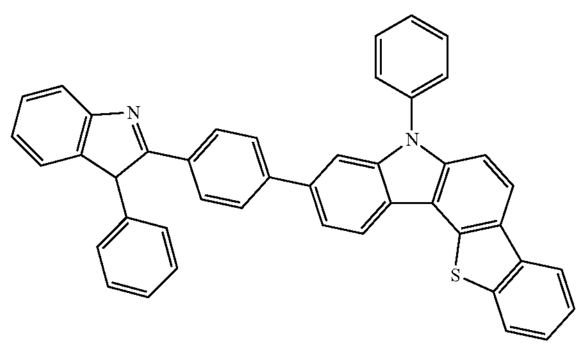
C-229
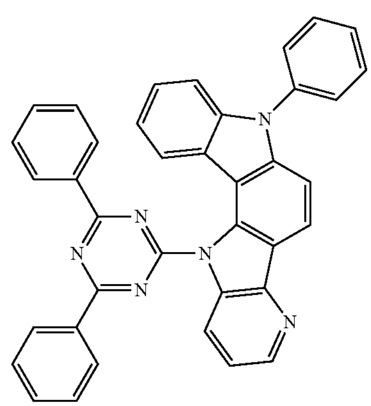

-continued
C-230
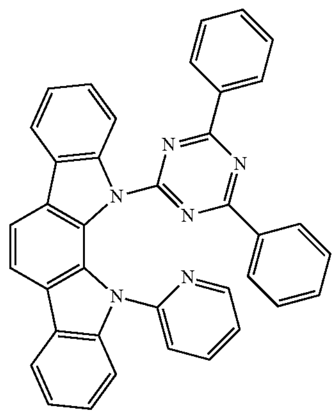
C-231
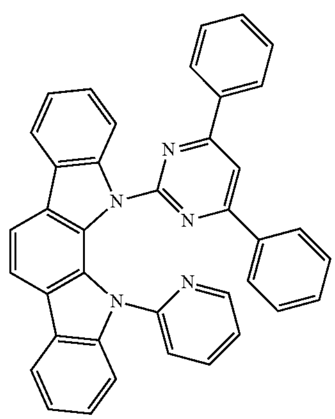
C-232
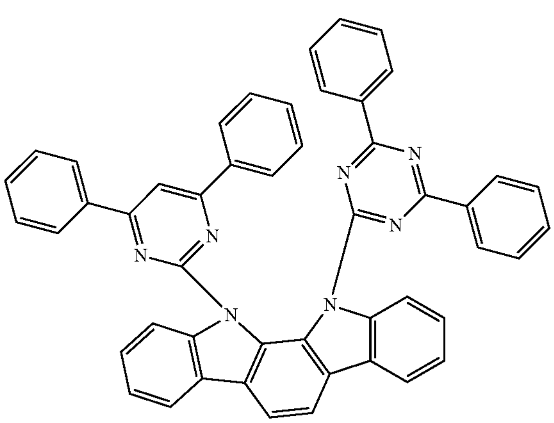
-continued
C-233
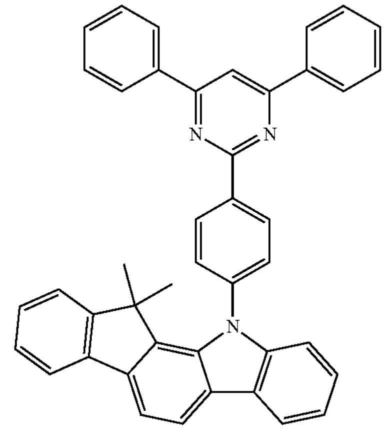
C-234
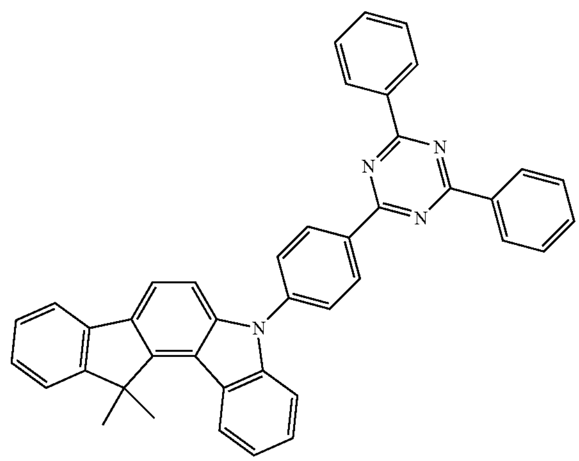
C-235
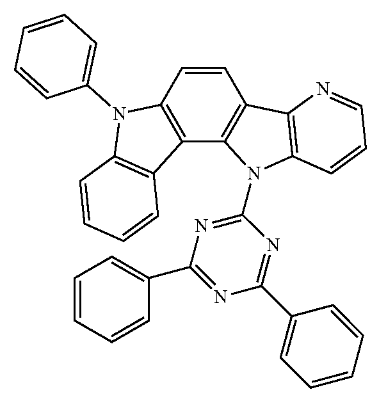

-continued
C-236
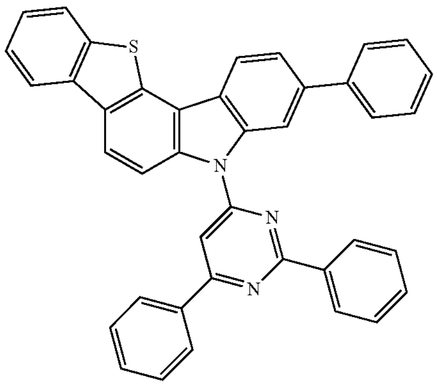
C-237
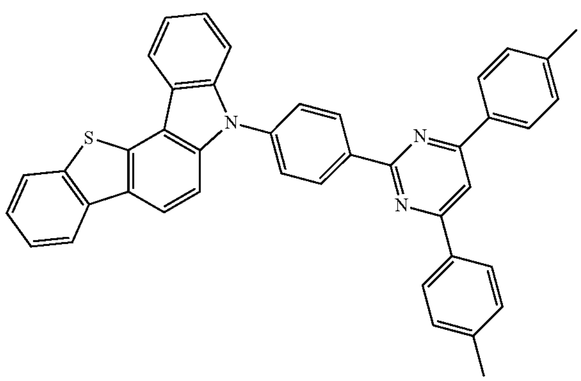
C-238
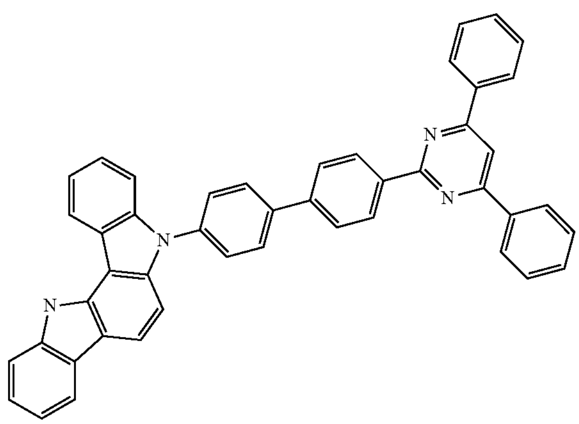
C-239
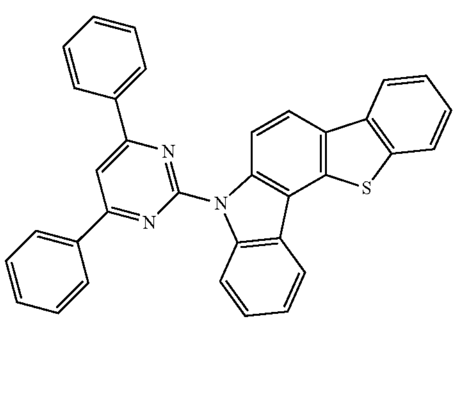
-continued
C-240
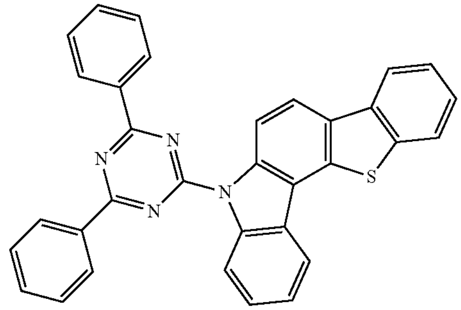
C-241
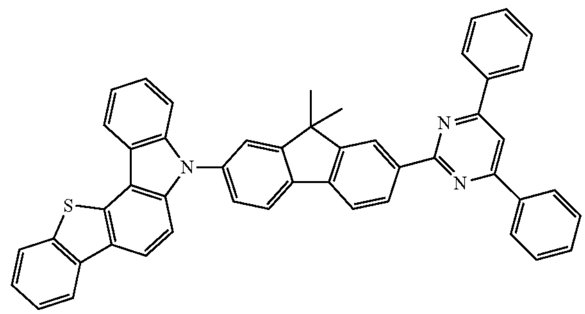
C-242
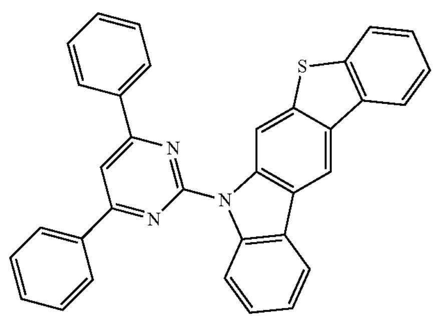
C-243
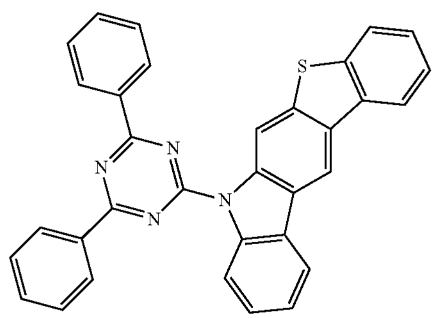
C-244
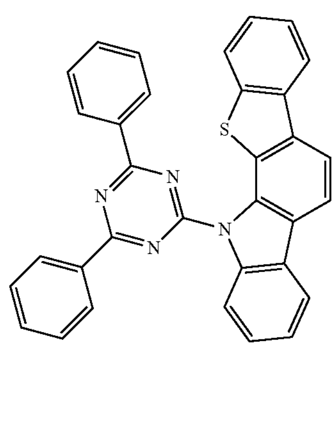

-continued
C-245
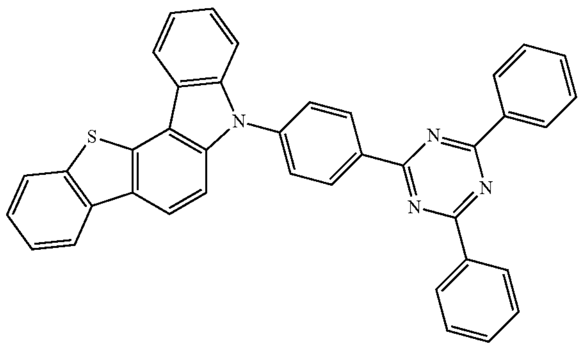
C-246
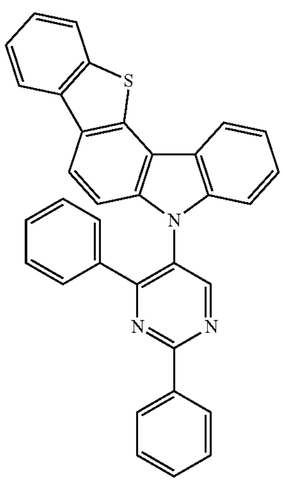
C-247
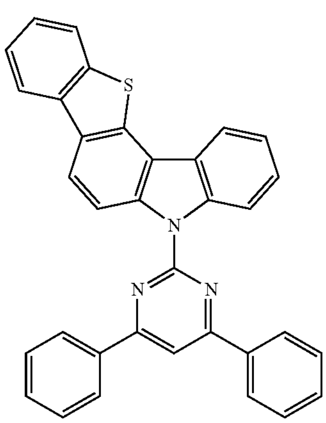
-continued
C-248
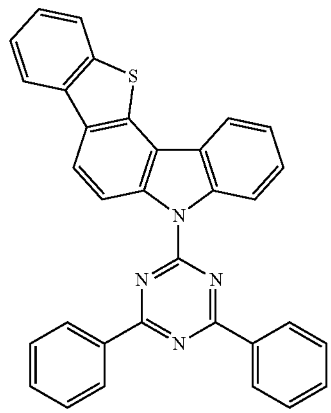
C-249
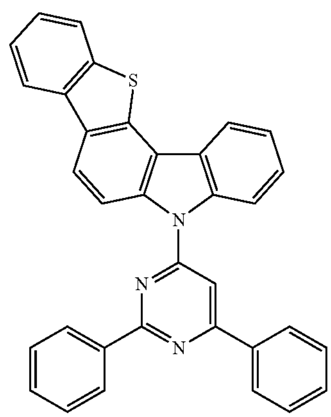
C-250
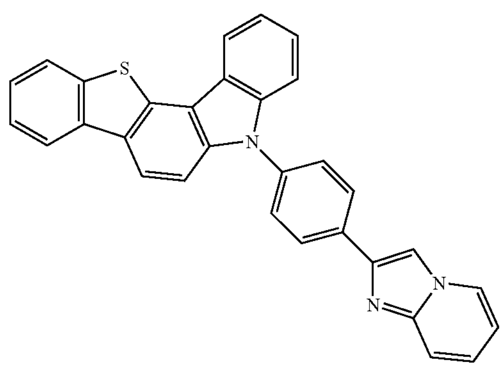
C-251
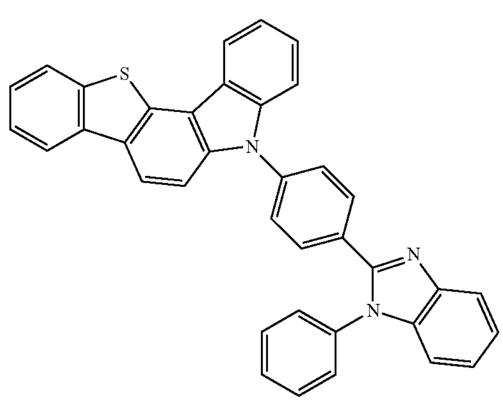

-continued
C-252
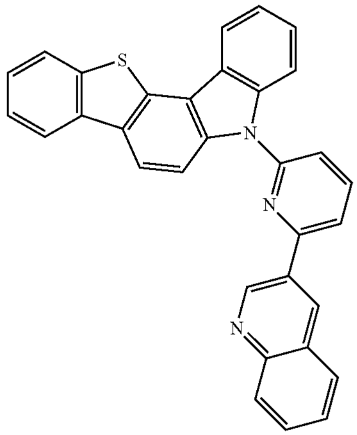
C-253
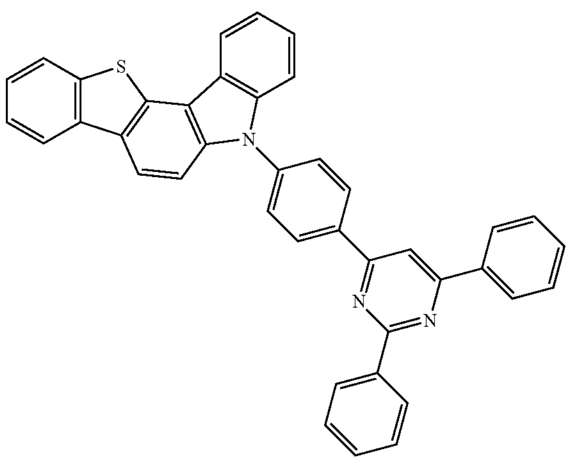
C-254
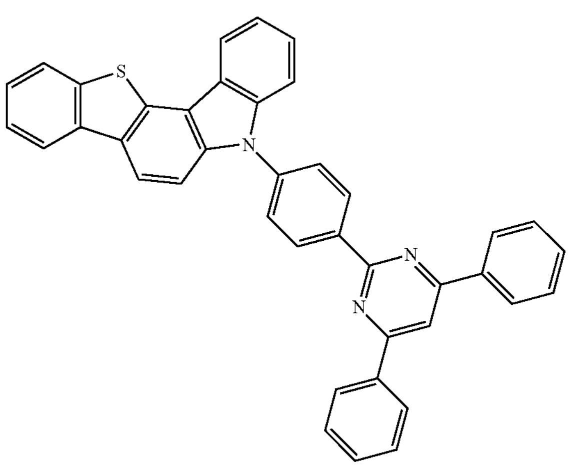
-continued
C-255
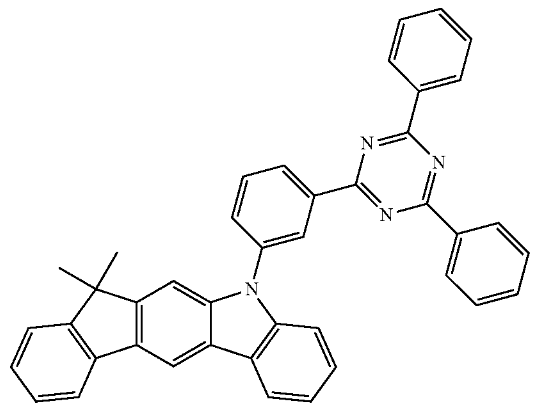
C-256
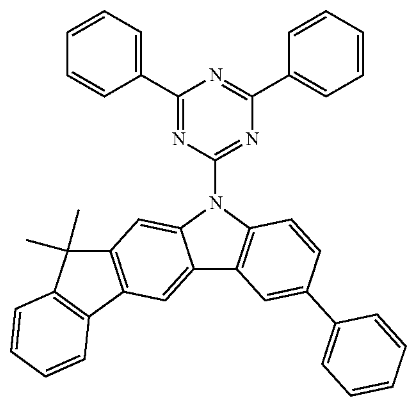
C-257
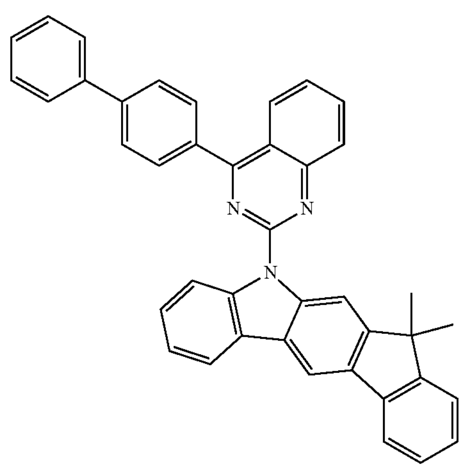

-continued
C-258
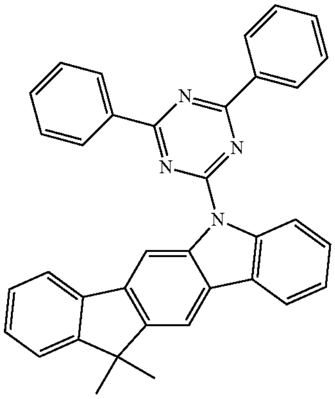
C-259
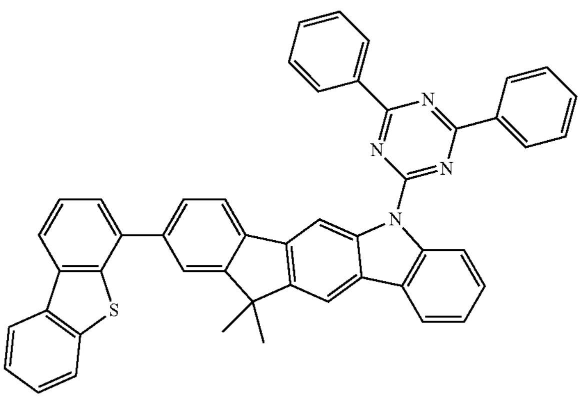
C-260
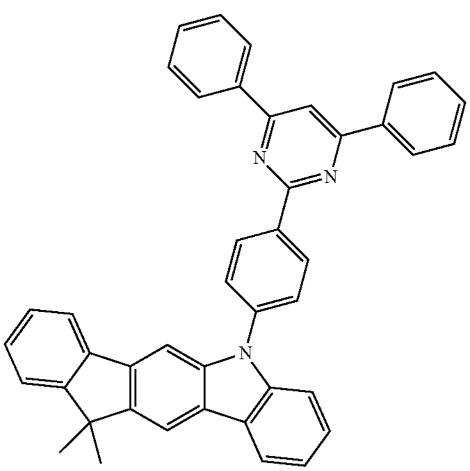
-continued
C-261
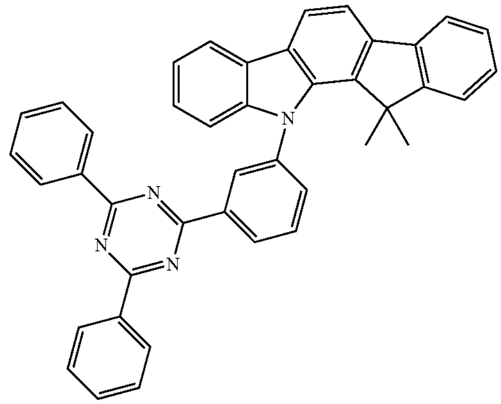
C-262
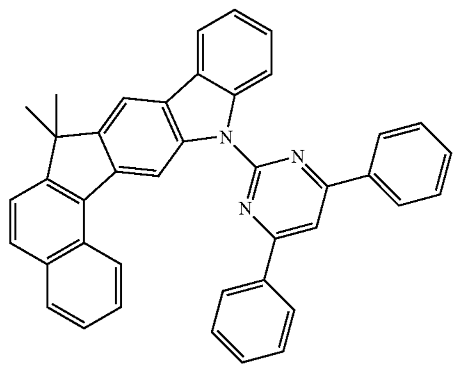
C-263
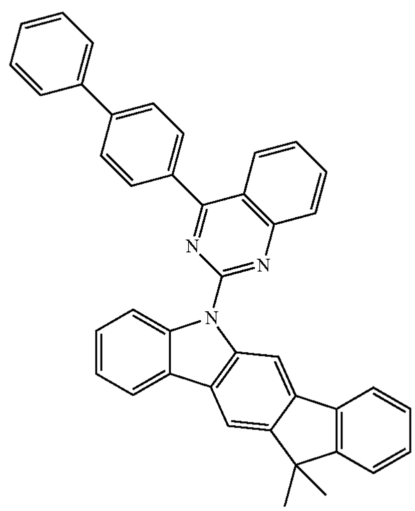

-continued
C-264
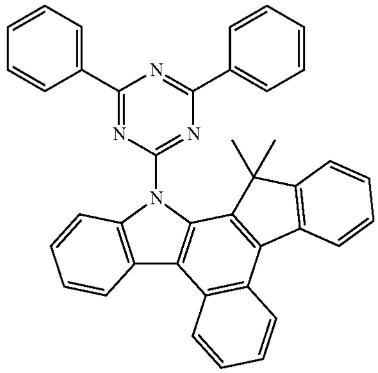
C-265
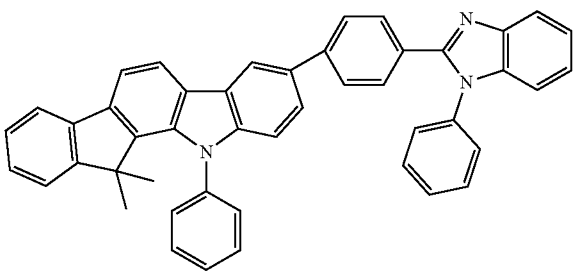
C-266
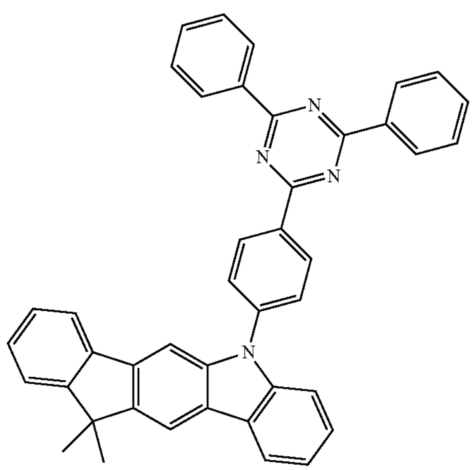
C-267
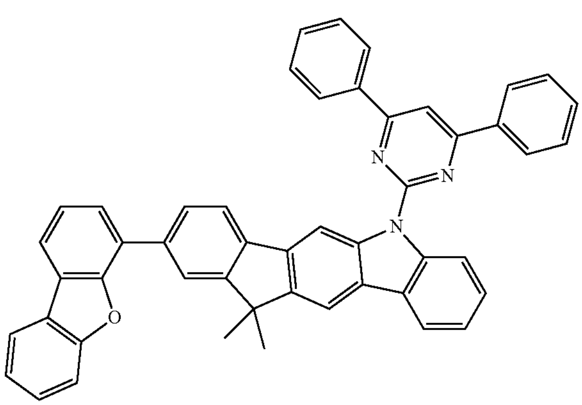
-continued
C-268
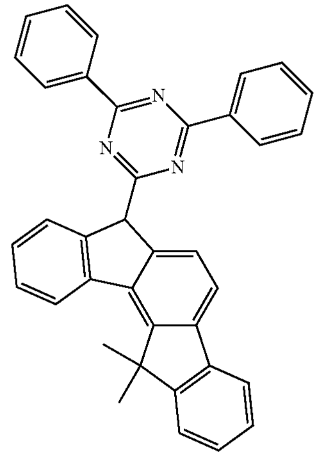
C-269
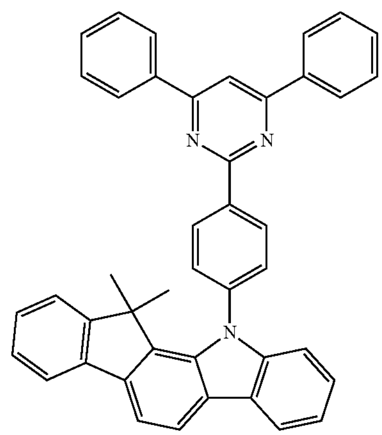
C-270
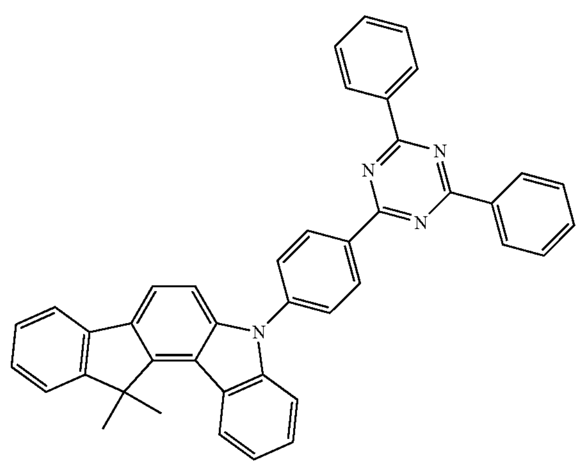

-continued
E-1
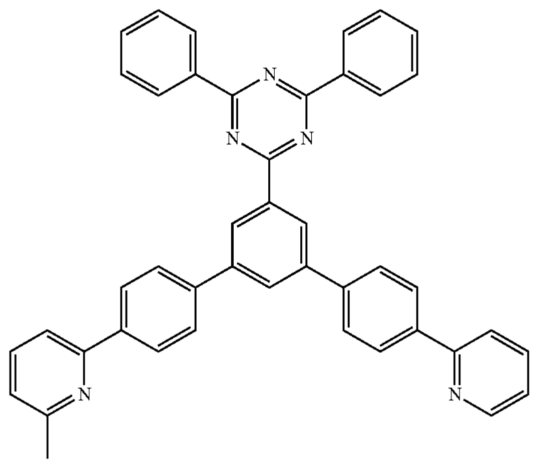
E-2
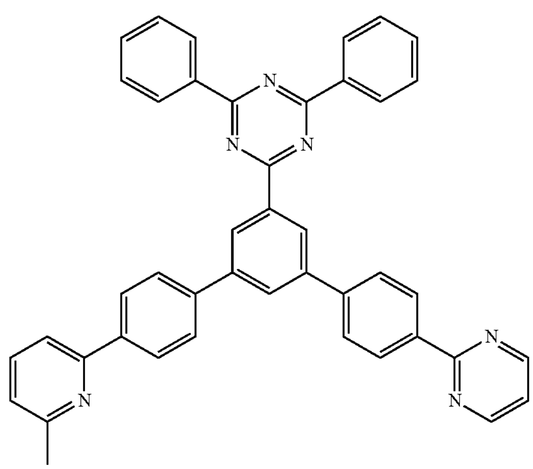
E-3
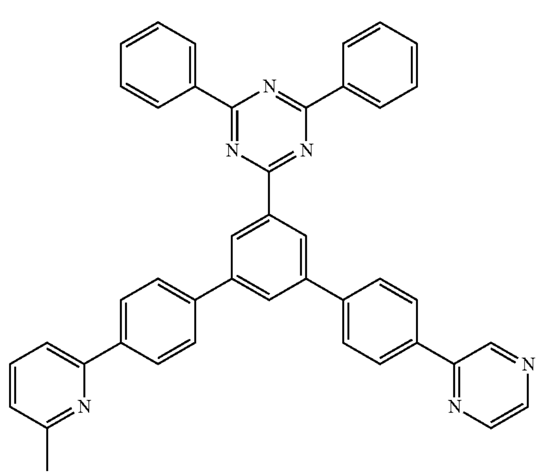
-continued
E-4
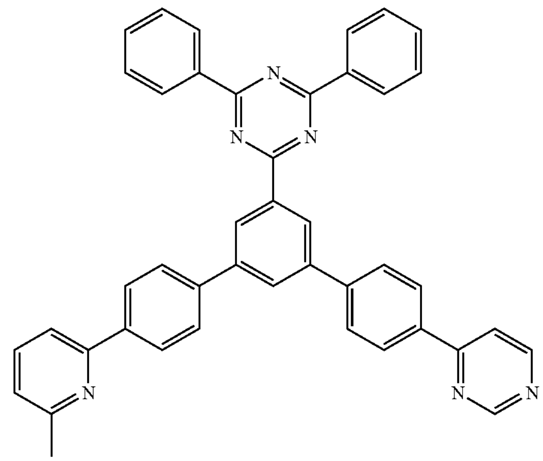
E-5
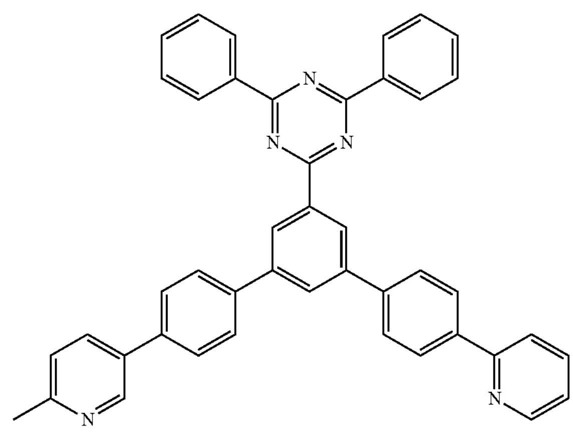
E-6
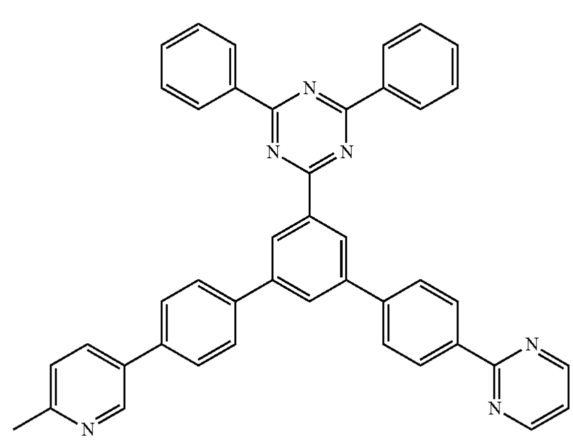

-continued
E-7
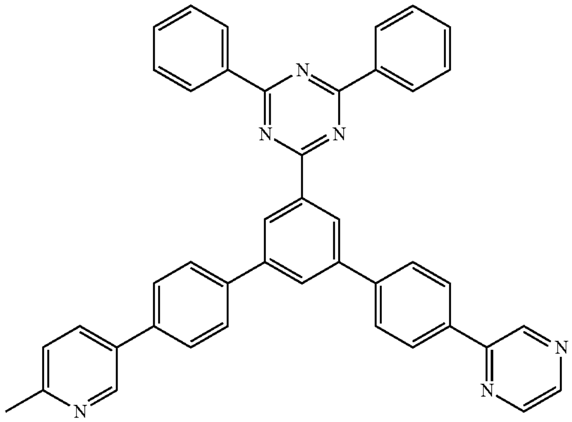
E-8
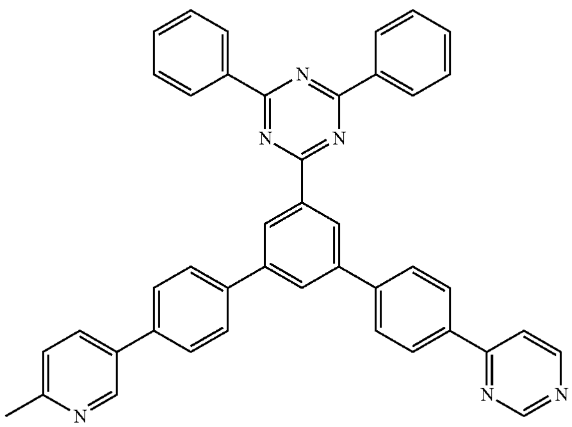
E-9
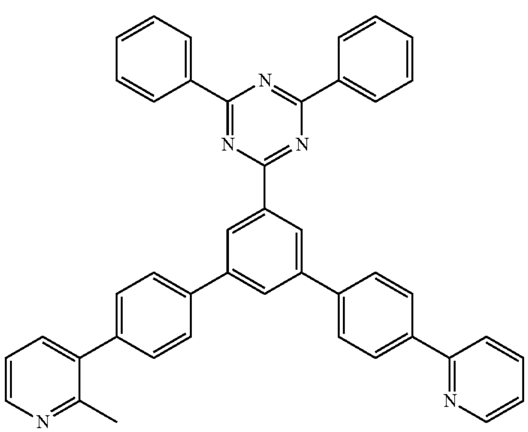
-continued
E-10
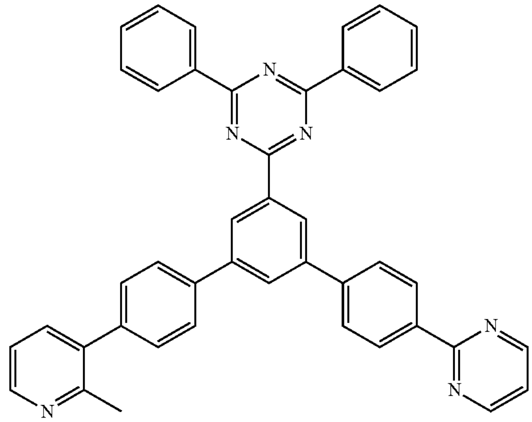
E-11
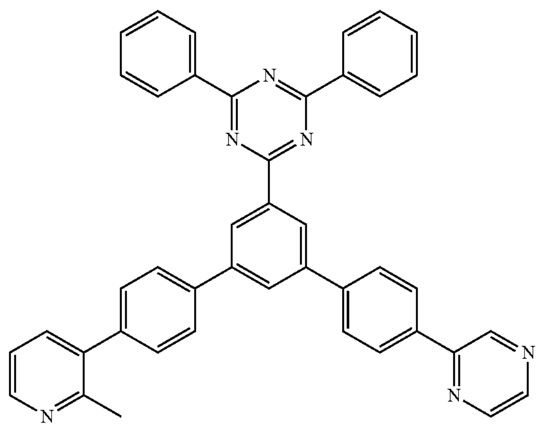
E-12
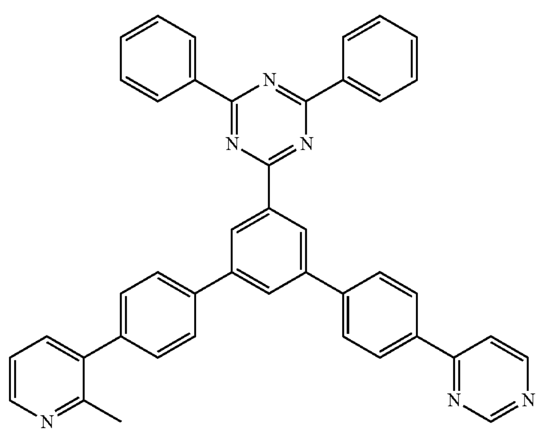

-continued
E-13
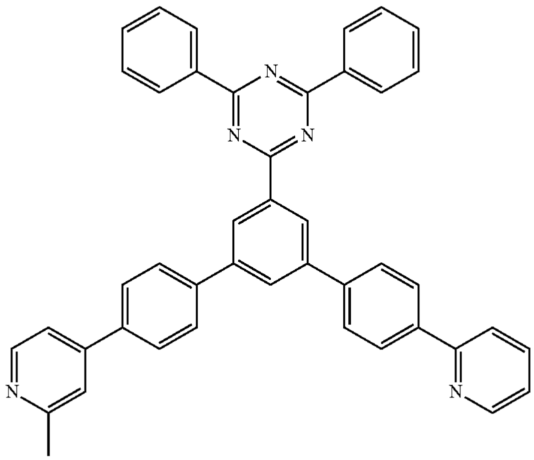
E-14
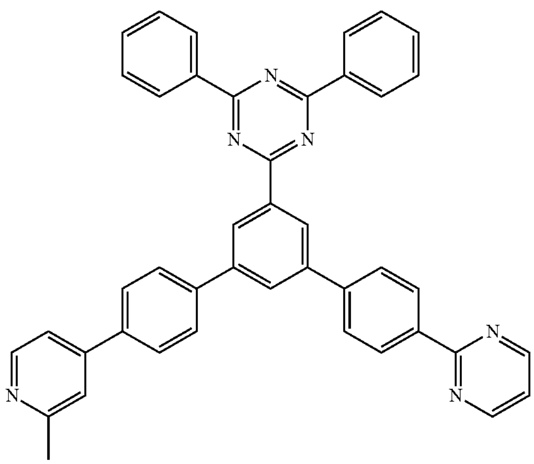
E-15
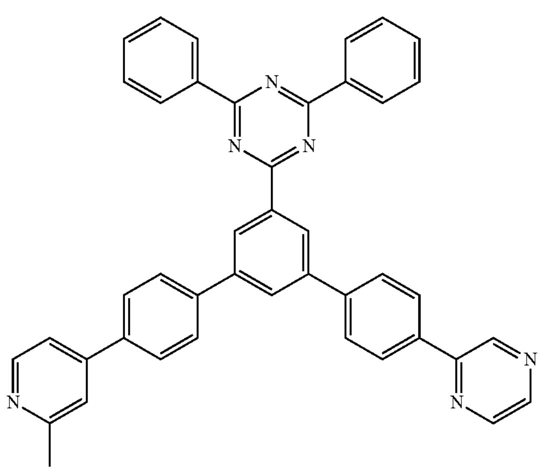
-continued
E-16
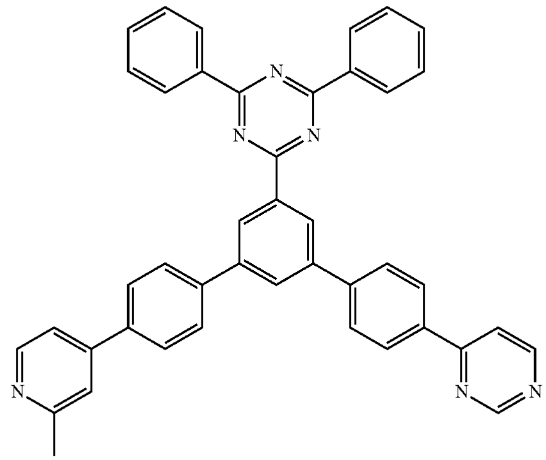
E-17
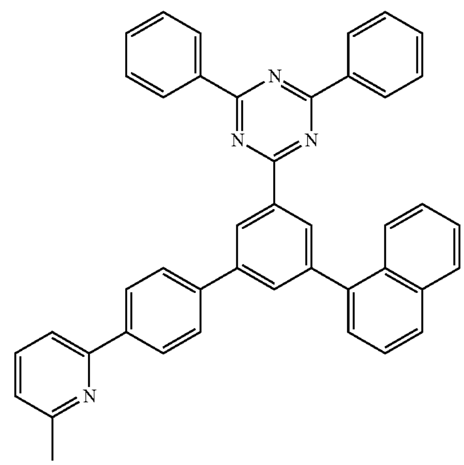
E-18
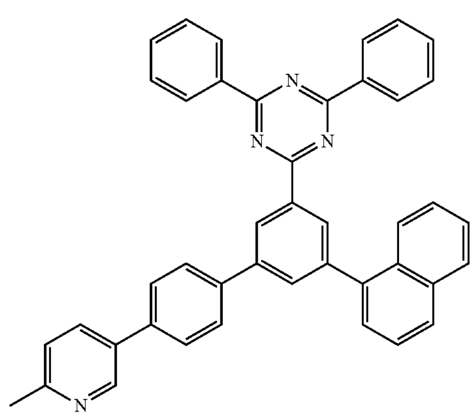

E-19
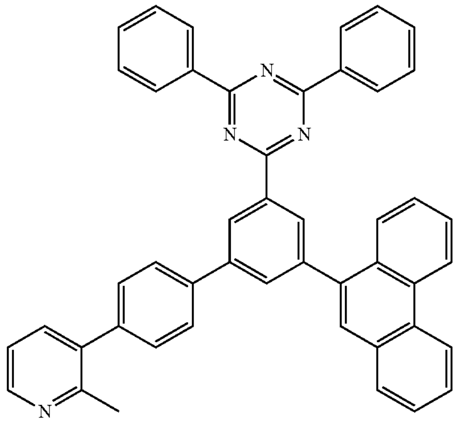
E-20
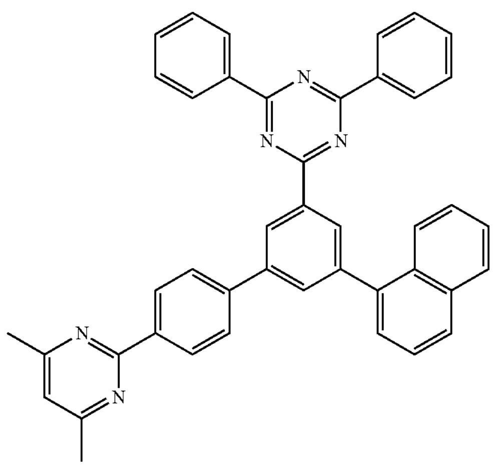
E-21
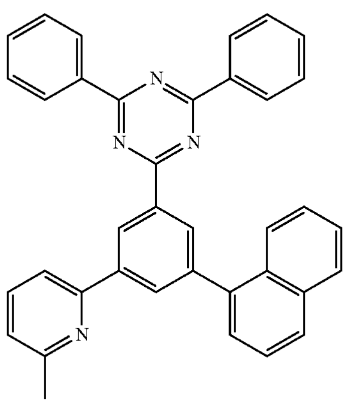
E-22
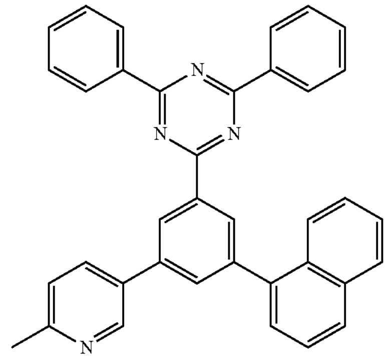
E-23
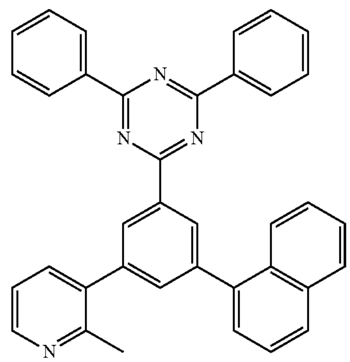
E-24
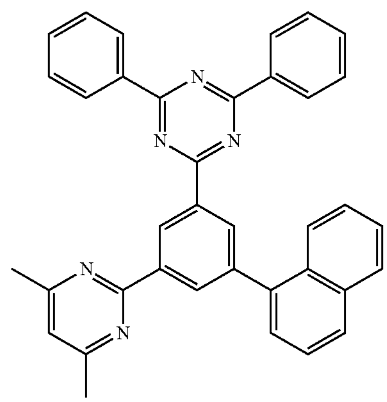
E-25
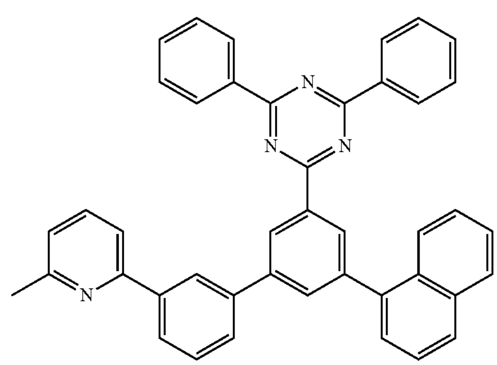

-continued
E-26
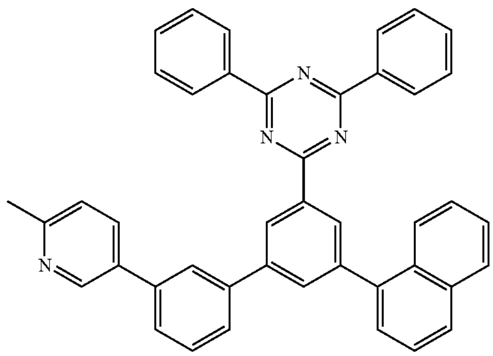
E-27
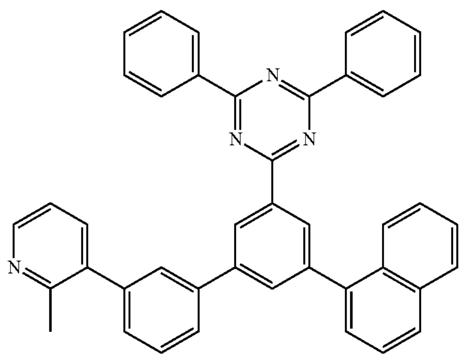
E-28
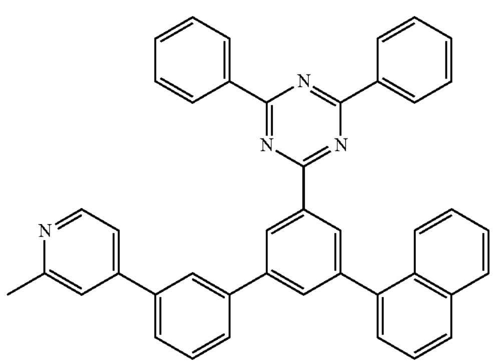
E-29
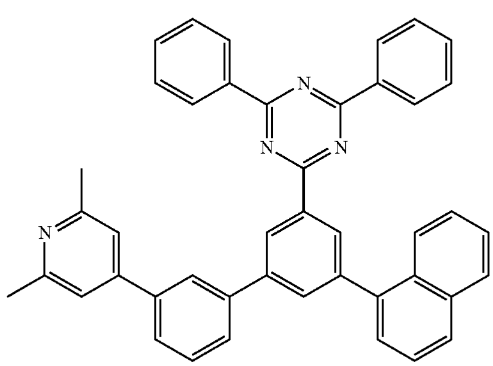
-continued
E-30
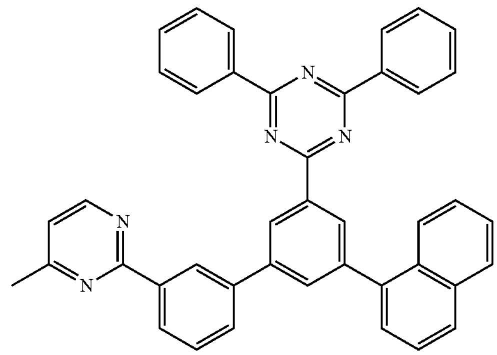
E-31
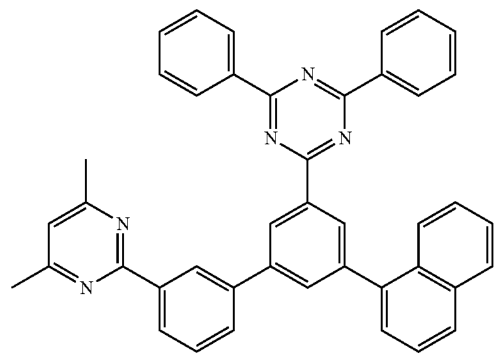
E-32
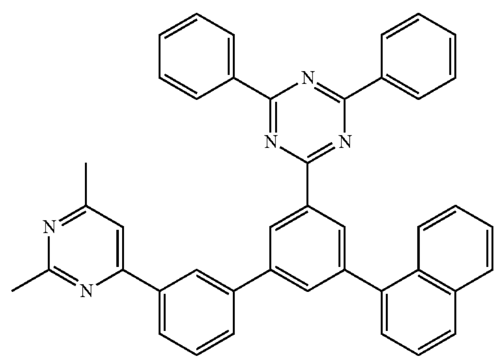
E-33
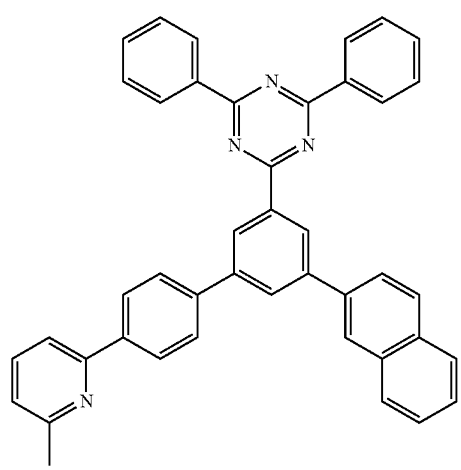

-continued
E-34
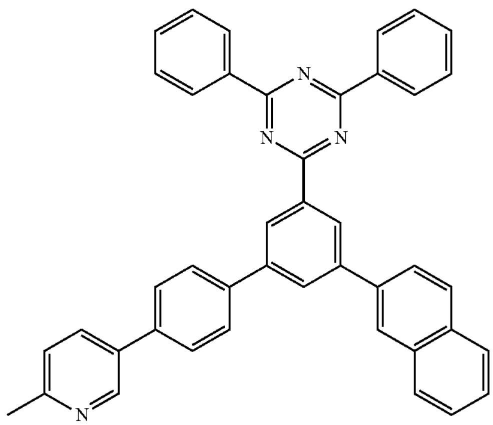
E-35
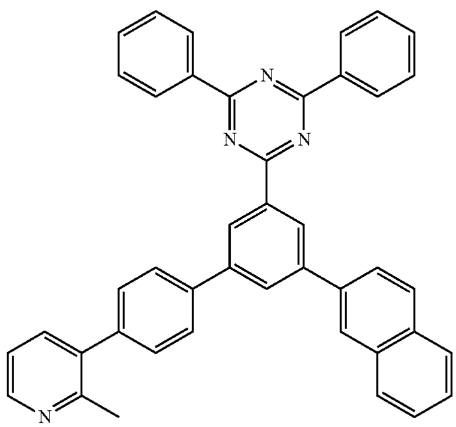
E-36
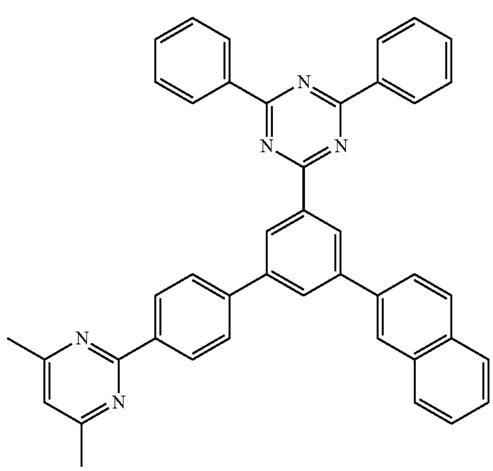
-continued
E-37
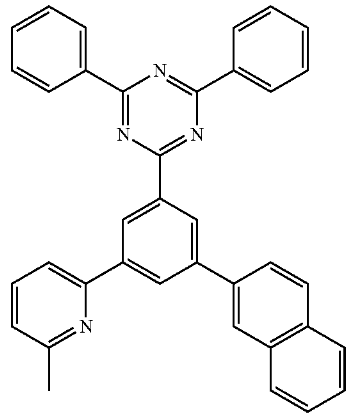
E-38
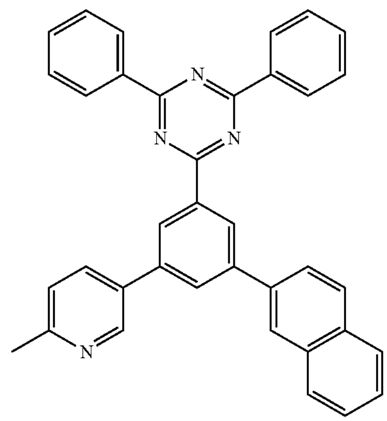
E-39
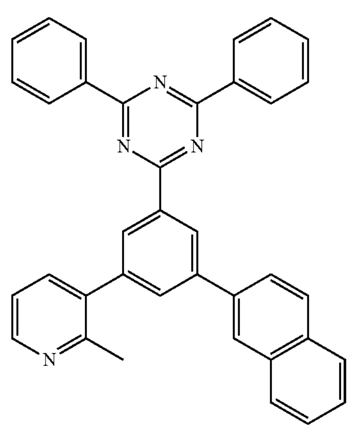

-continued
E-40
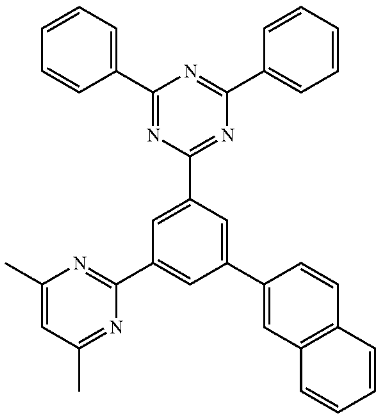
E-41
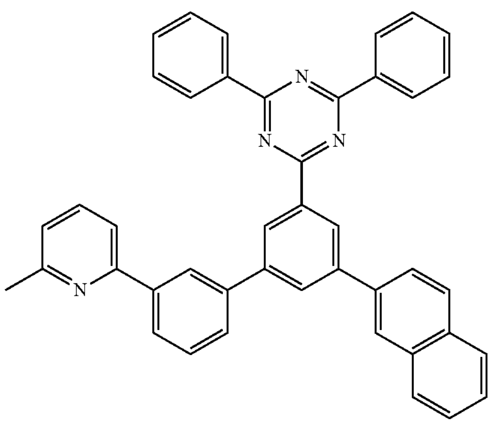
E-42
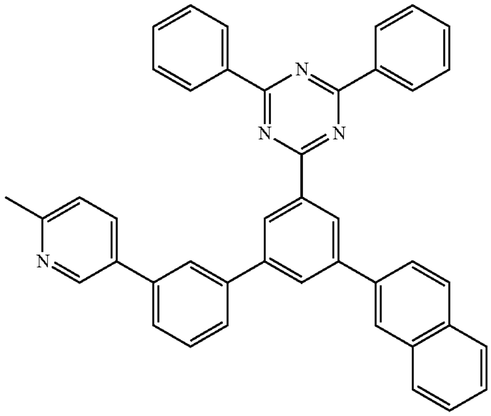
-continued
E-43
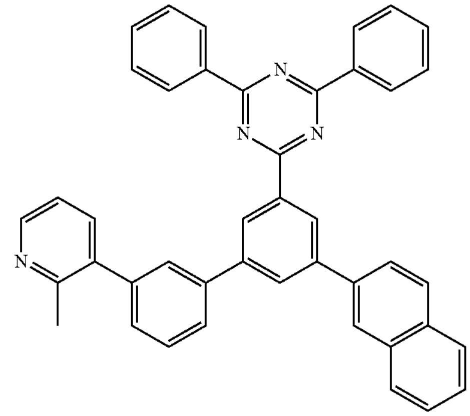
E-44
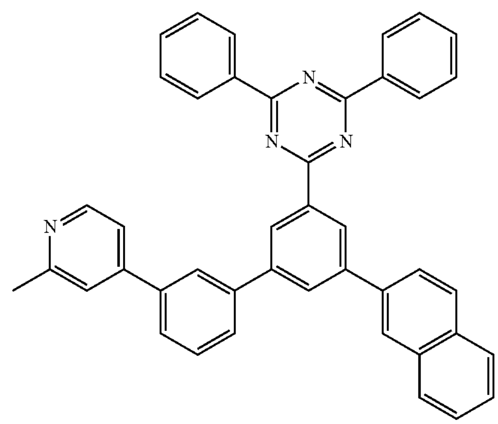
E-45
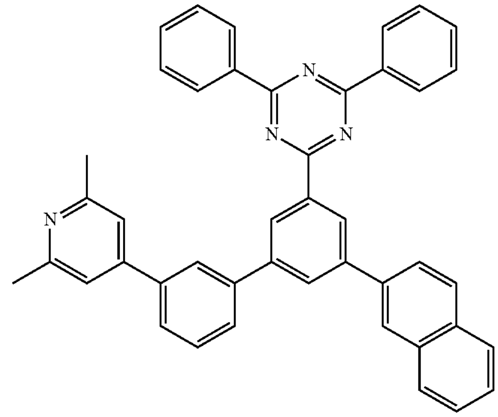

E-46
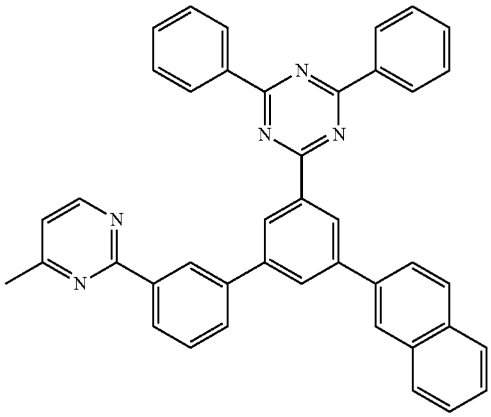
E-47
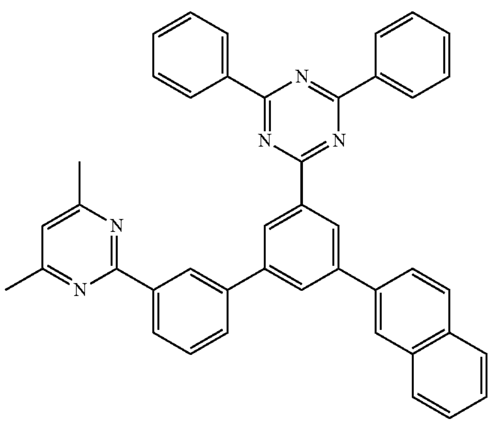
E-48
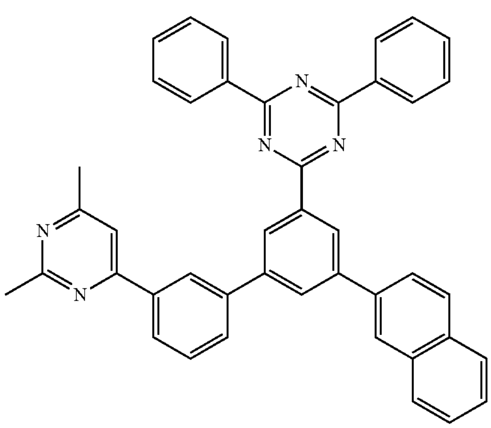
E-49
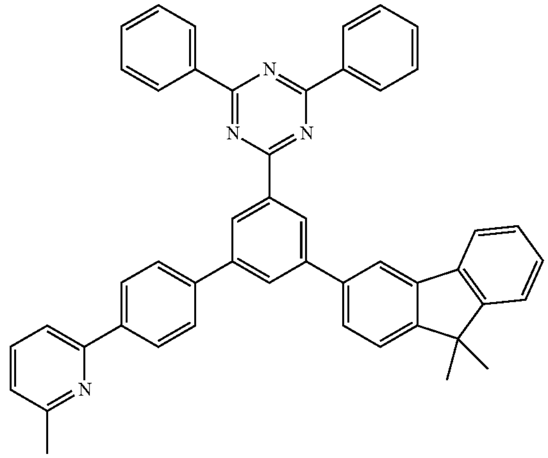
E-50
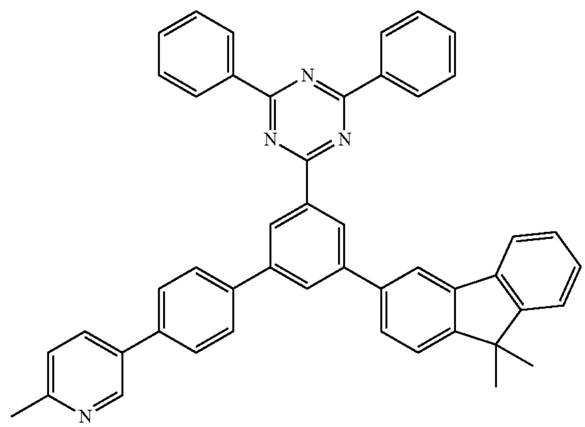
E-51
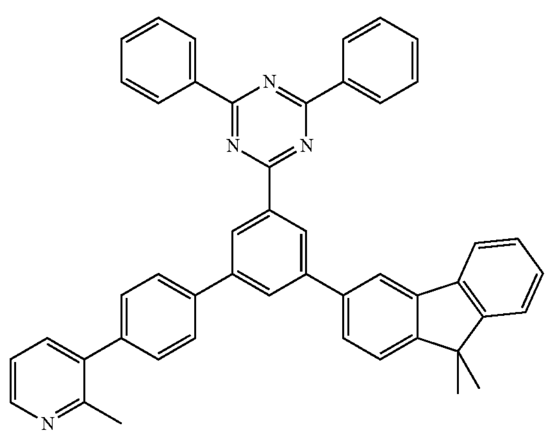

-continued
E-52
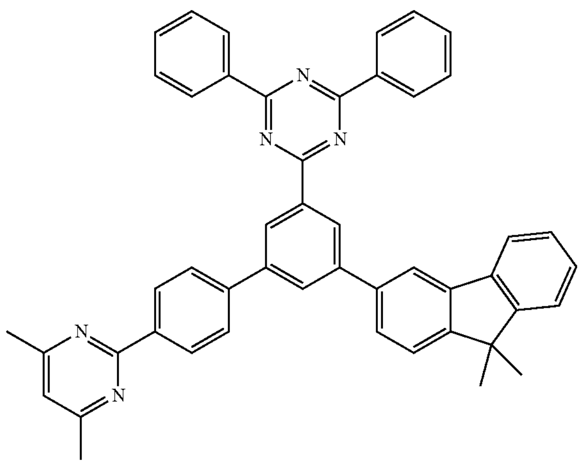
E-53
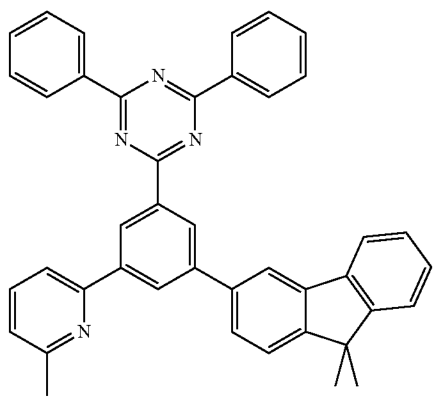
E-54
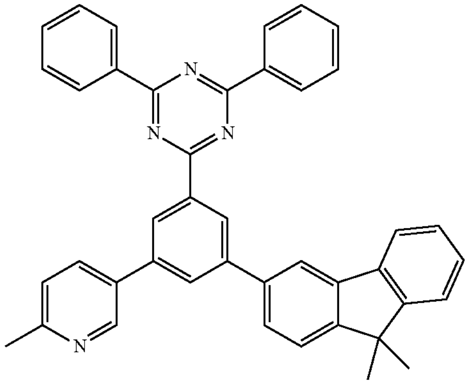
-continued
E-55
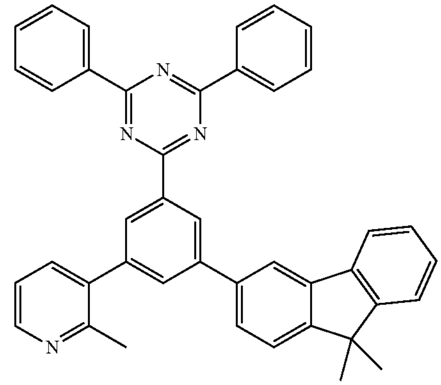
E-56
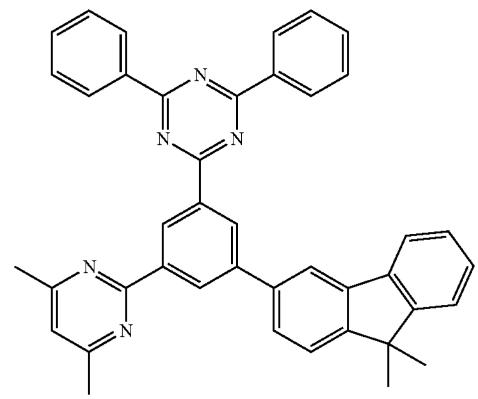
E-57
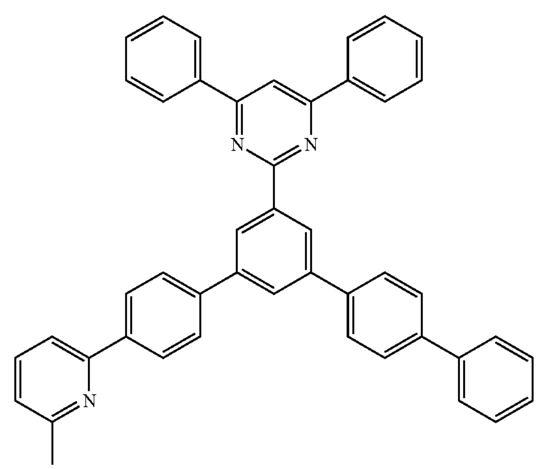

E-58
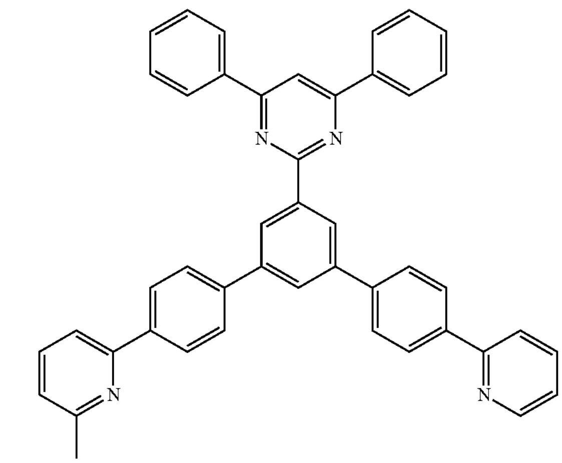
E-59
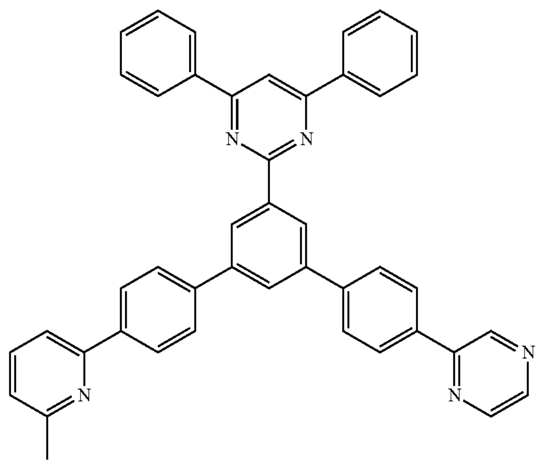
E-60
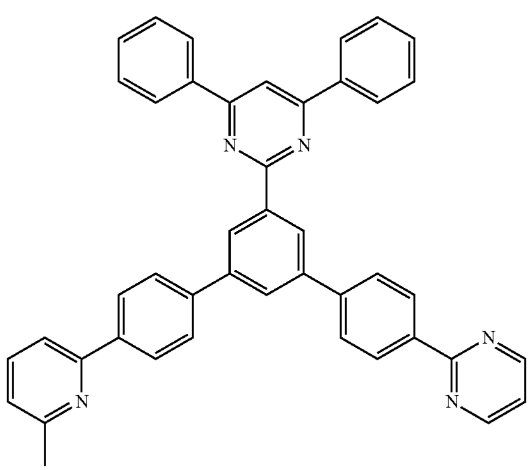
E-61
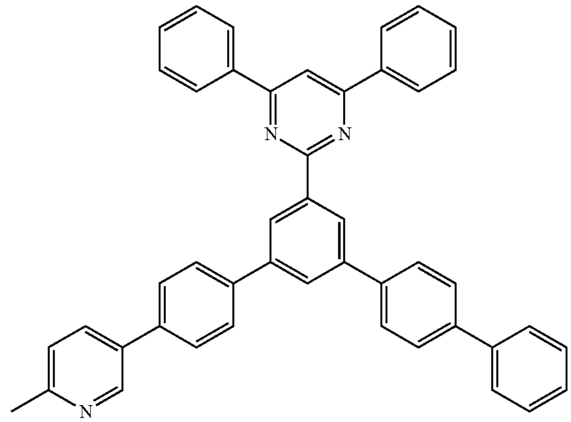
E-62
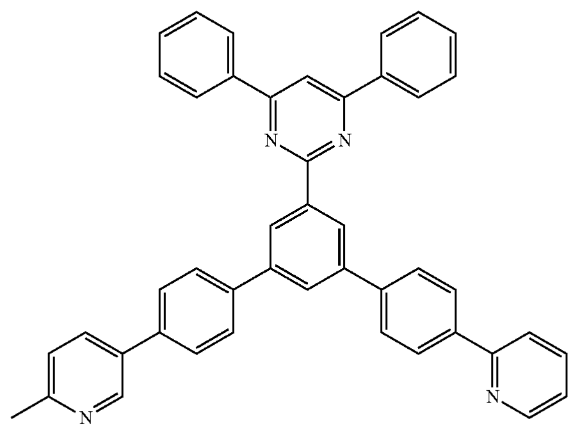
E-63
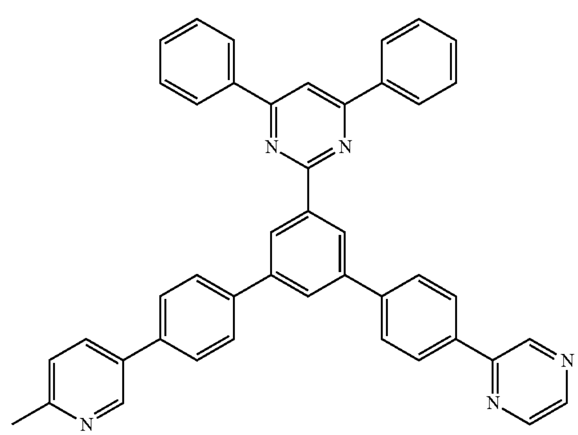

-continued
E-64
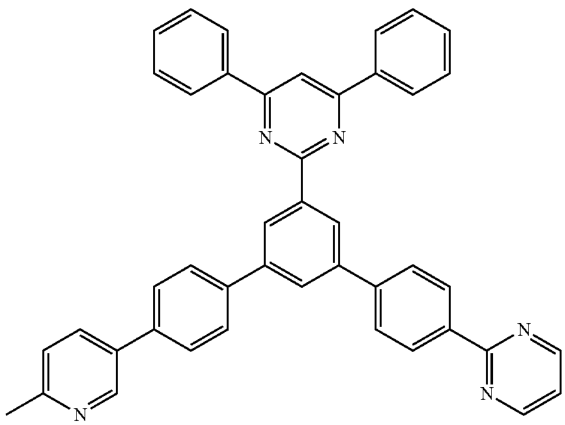
E-65
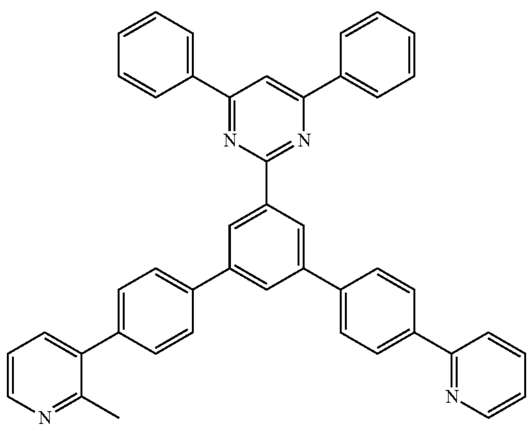
E-66
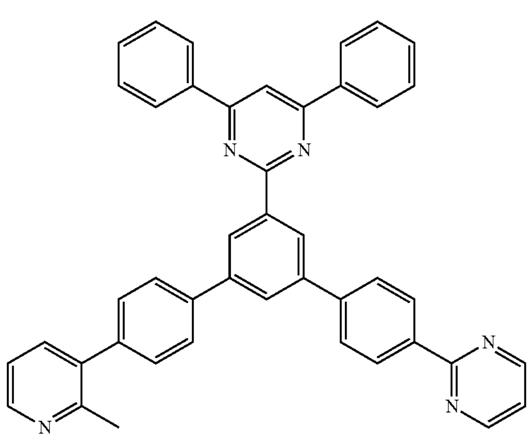
-continued
E-67
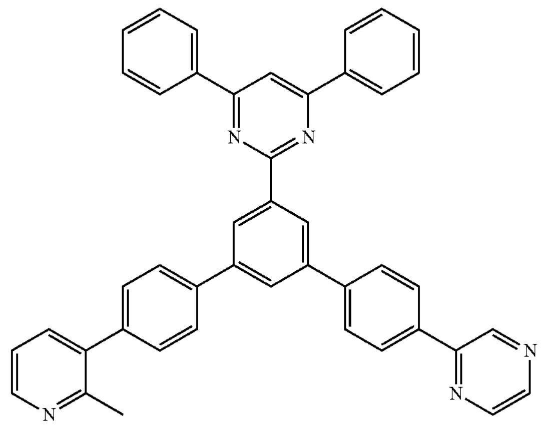
E-68
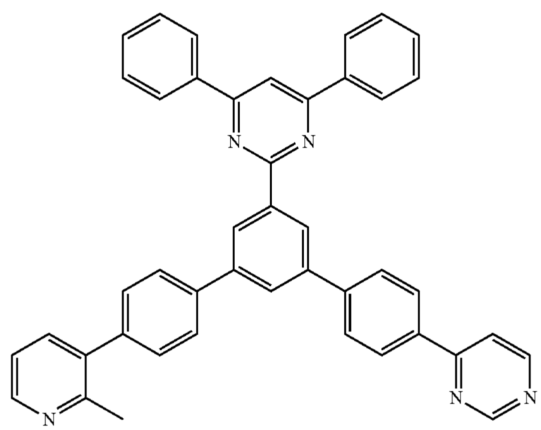
E-69
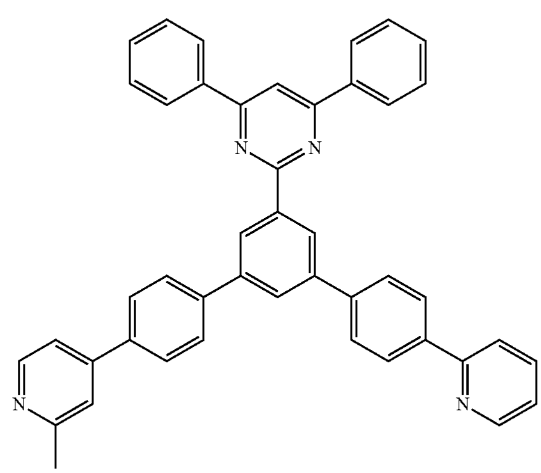

-continued
E-70
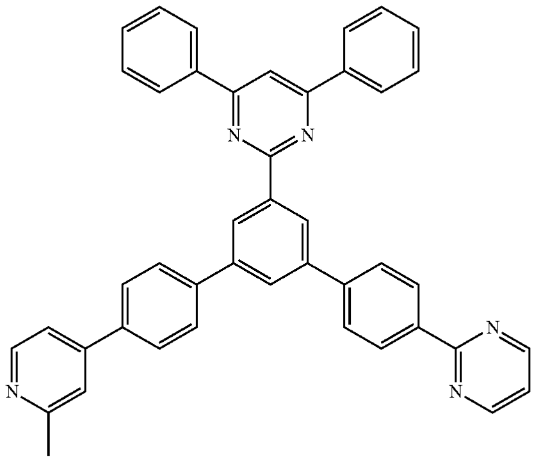
E-71
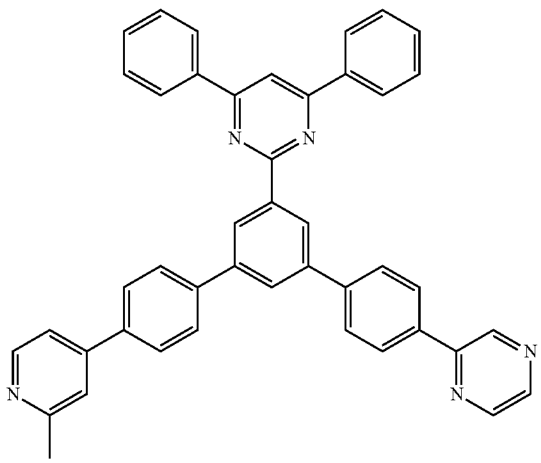
E-72
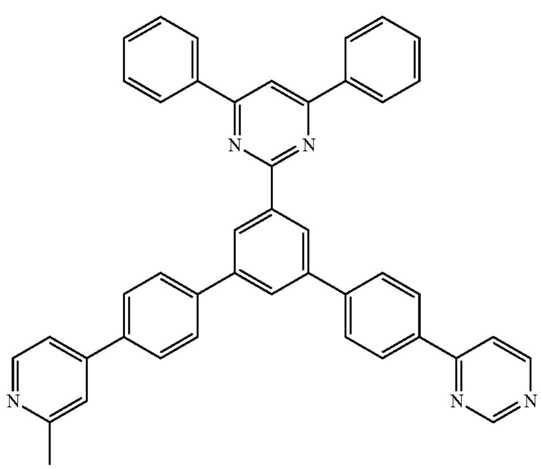
-continued
E-73
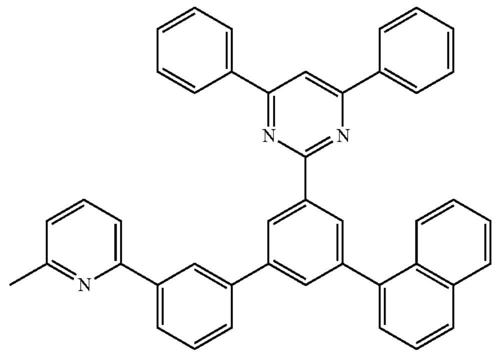
E-74
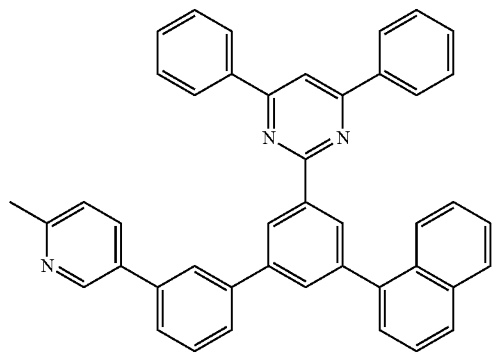
E-75
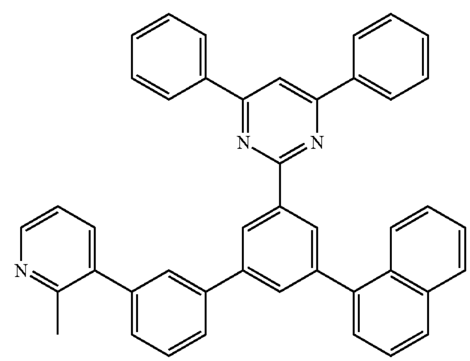
E-76
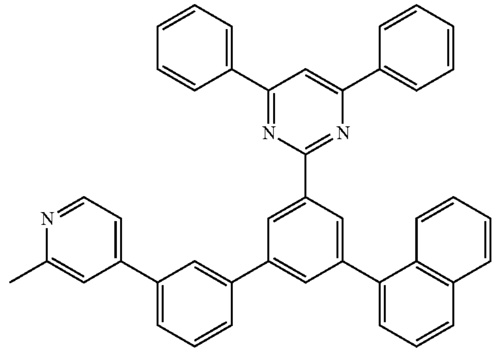

E-77
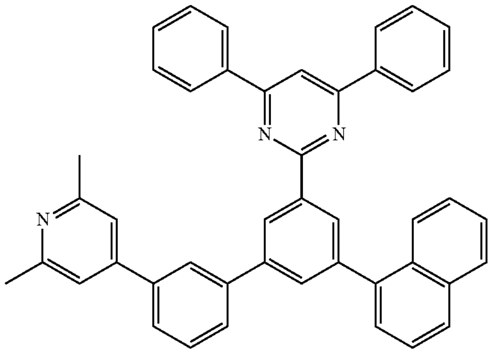
E-78
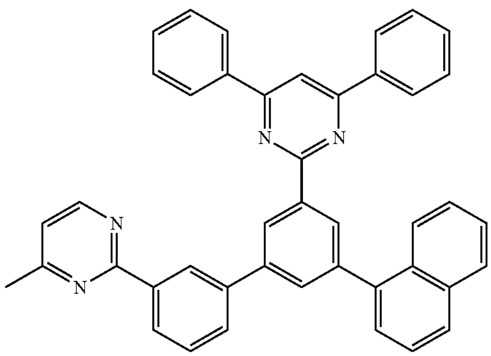
E-79
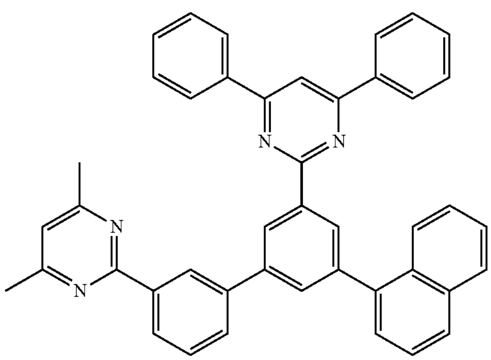
E-80
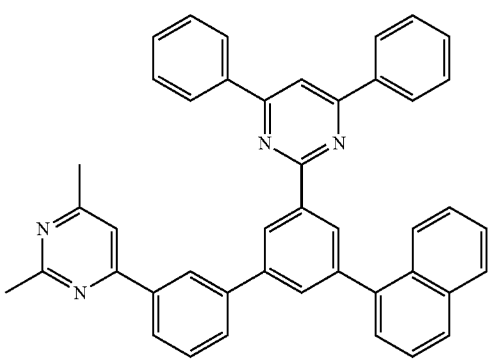
E-81
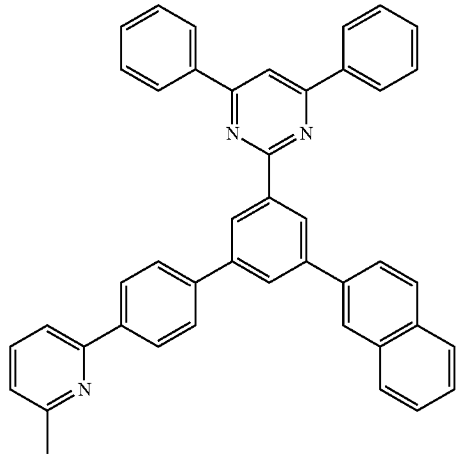
E-82
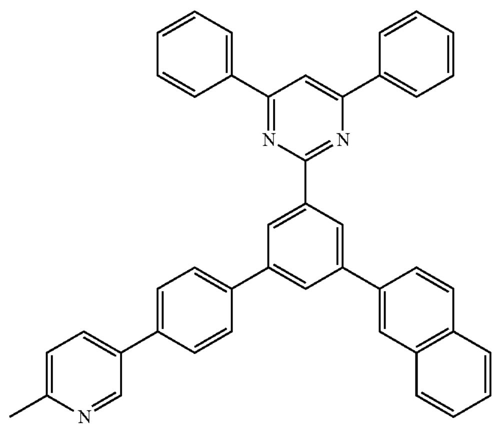
E-83
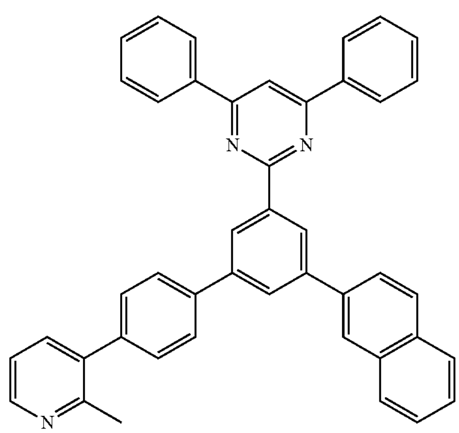

-continued
E-84
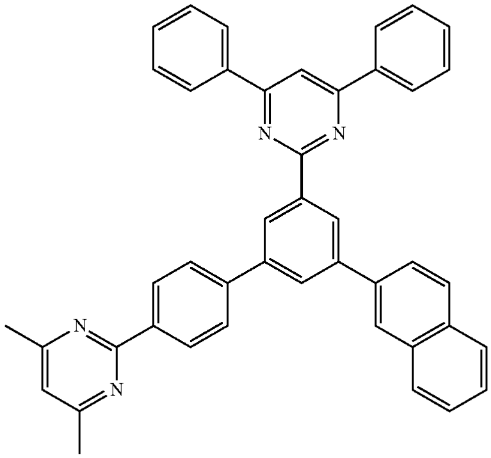
E-85
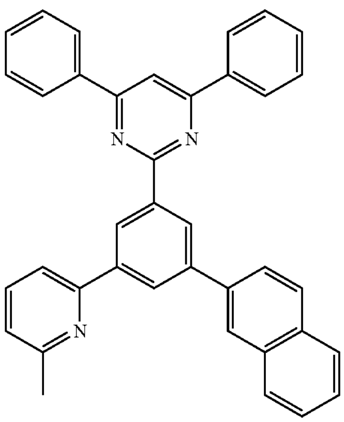
E-86
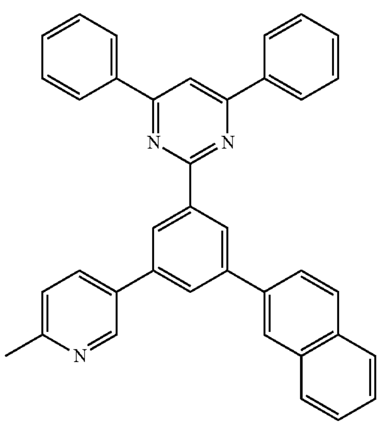
-continued
E-87
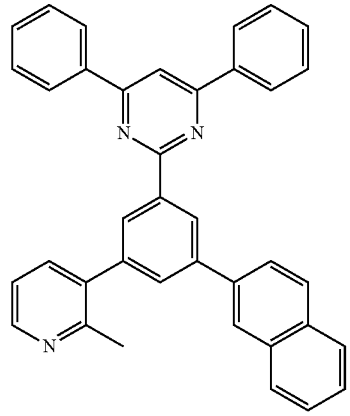
E-88
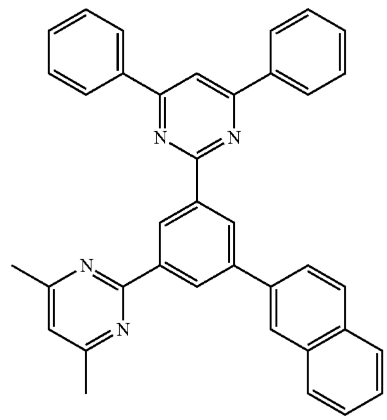
E-89
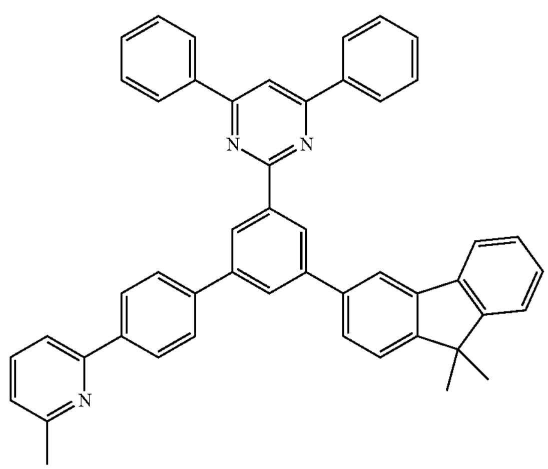

-continued
E-90
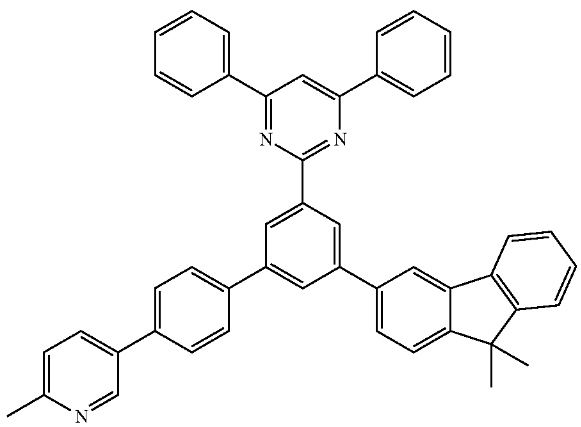
E-91
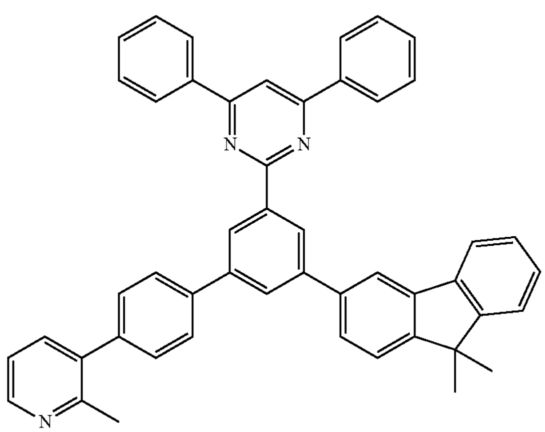
E-92
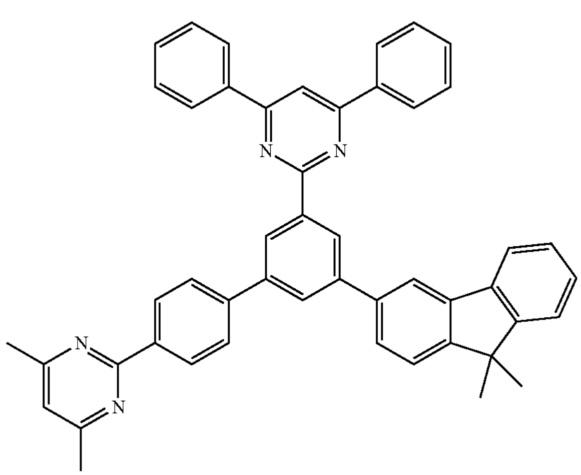
-continued
E-93
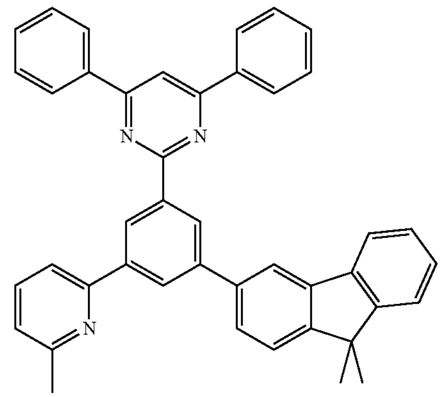
E-94
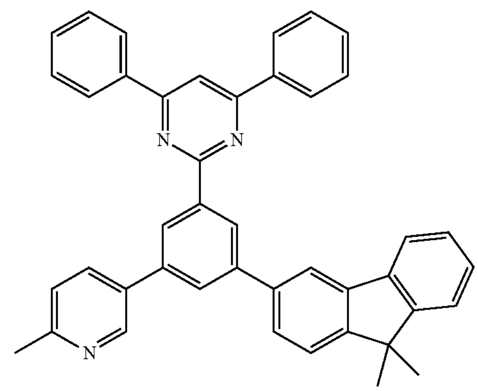
E-95
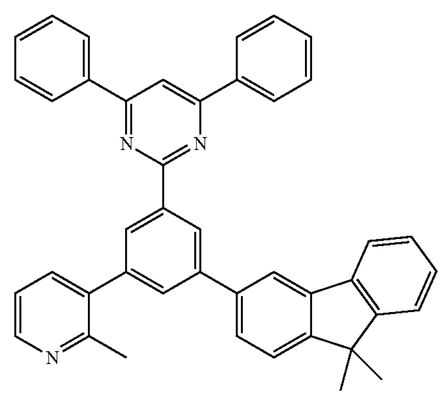
E-96
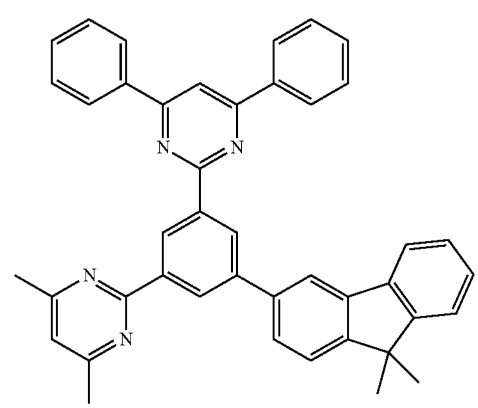

-continued
E-97
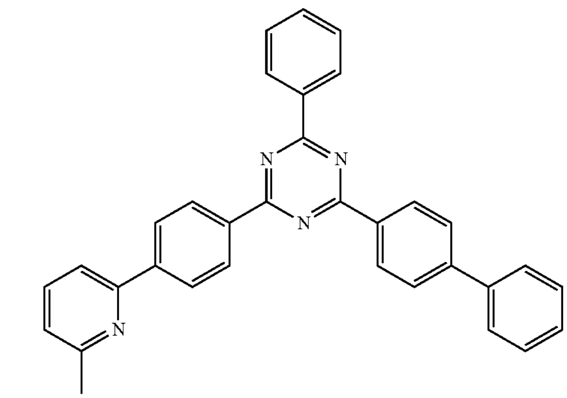
E-98
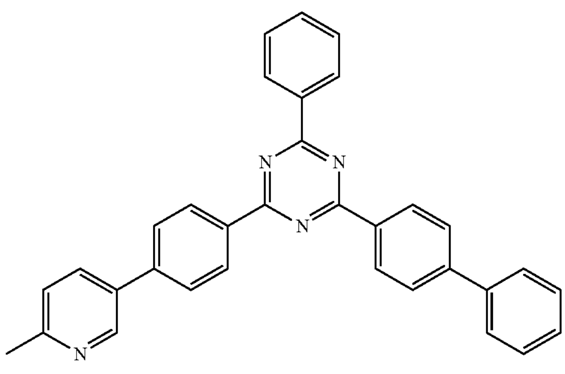
E-99
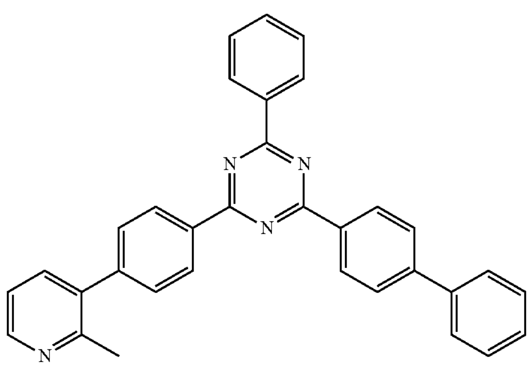
E-100
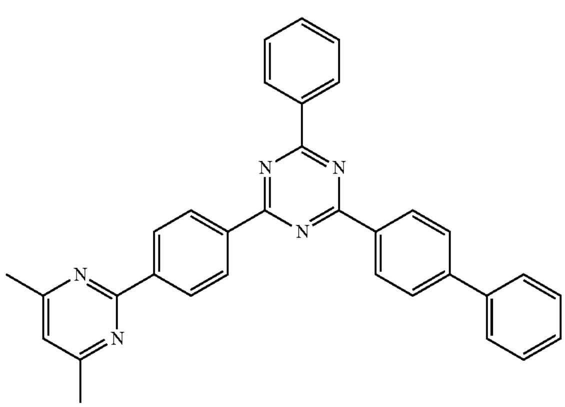
-continued
E-101
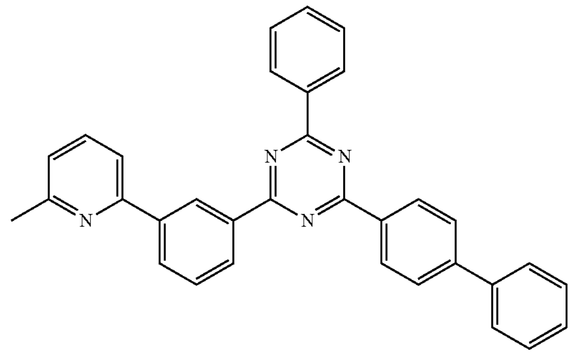
E-102
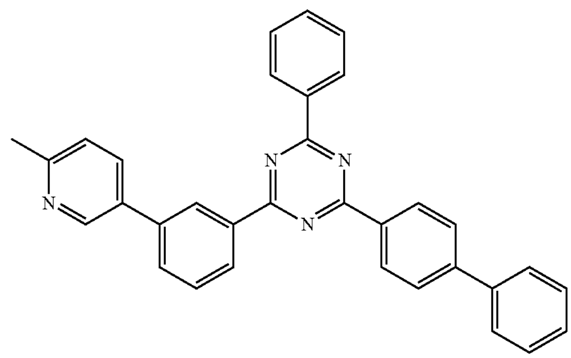
E-103
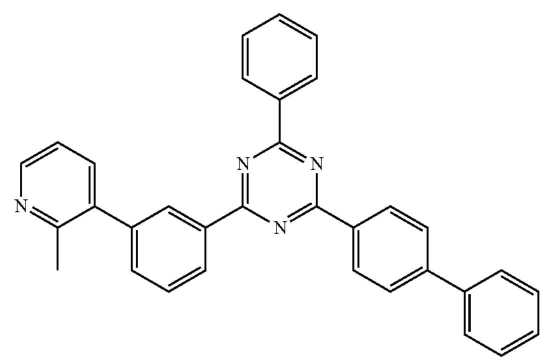
E-104
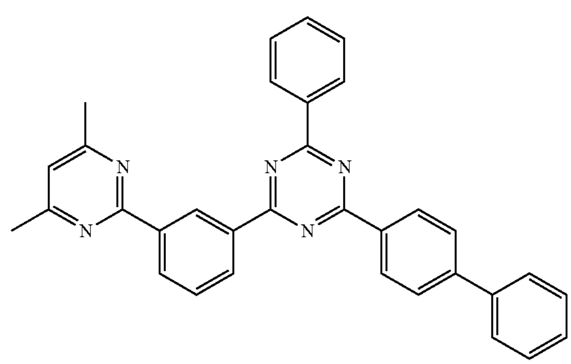

E-105
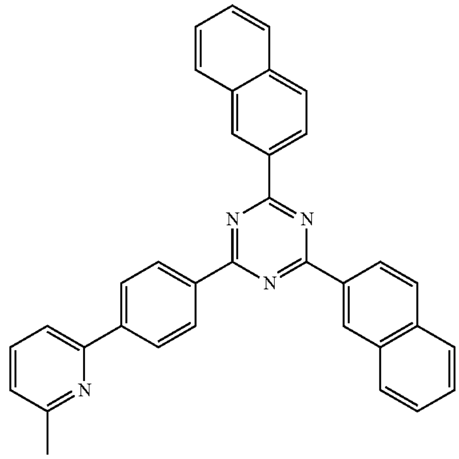
E-106
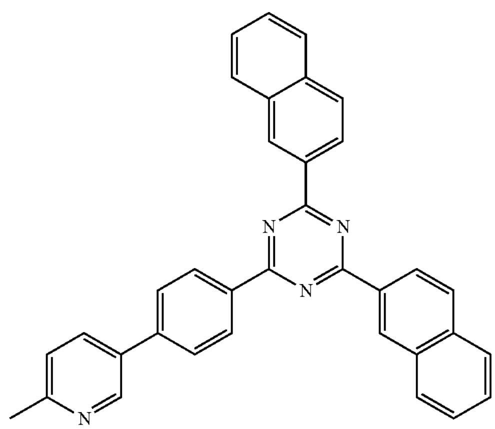
E-107
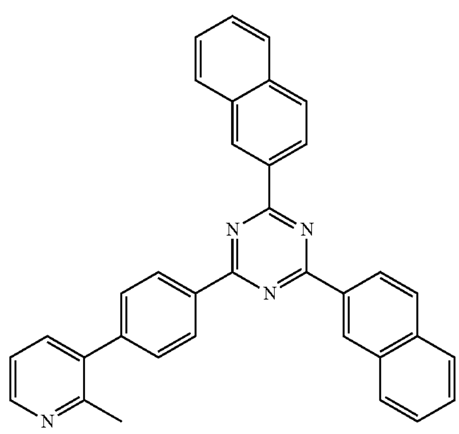
E-108
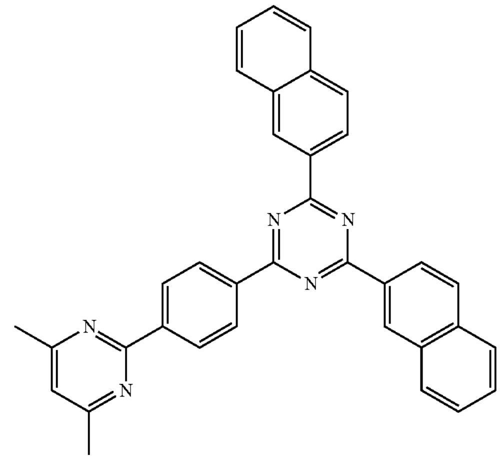
E-109
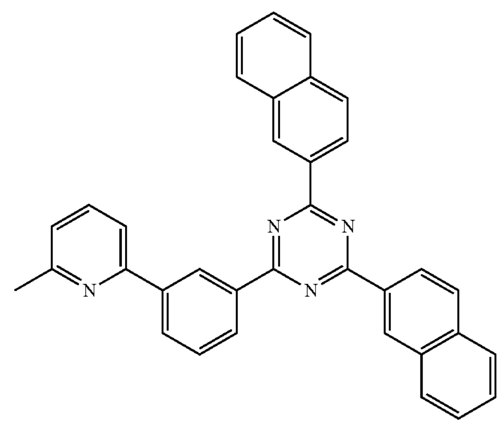
E-110
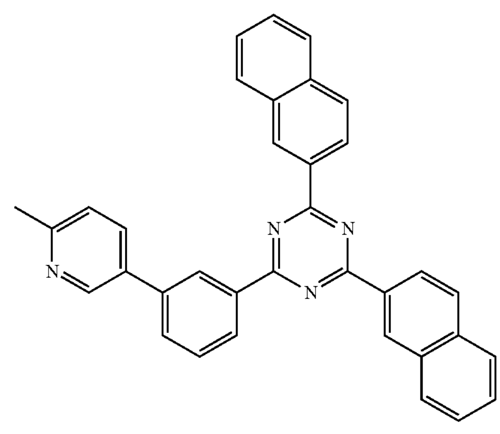

E-111
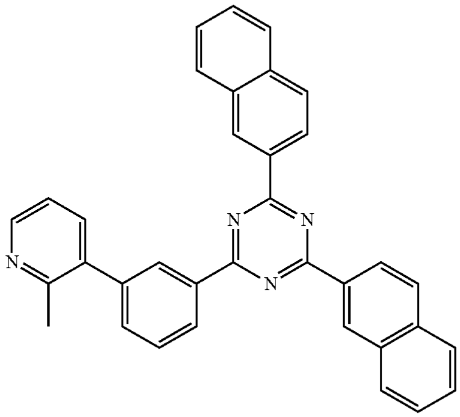
E-112
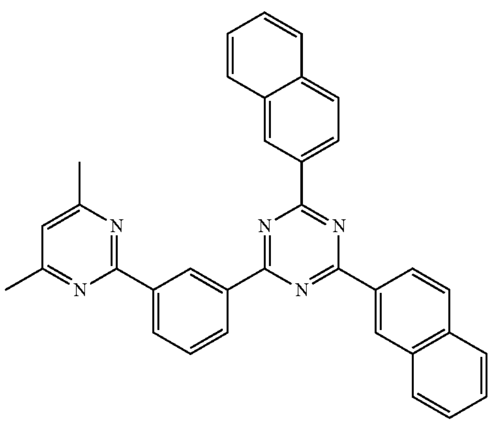
E-113
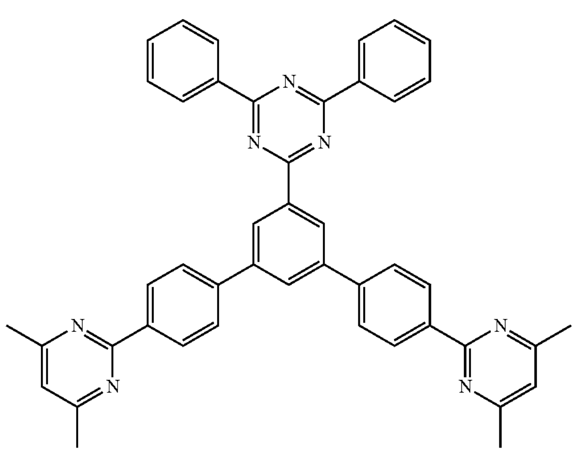
E-114
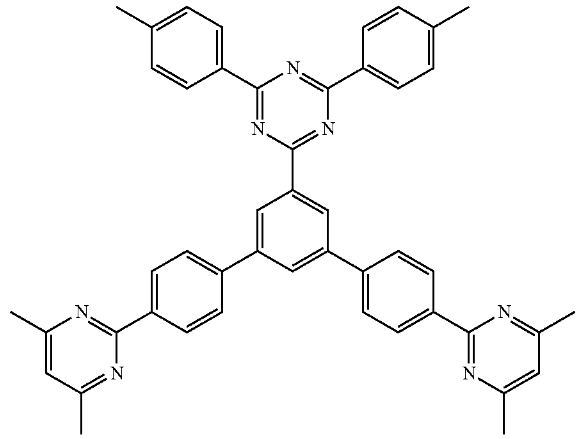
E-115
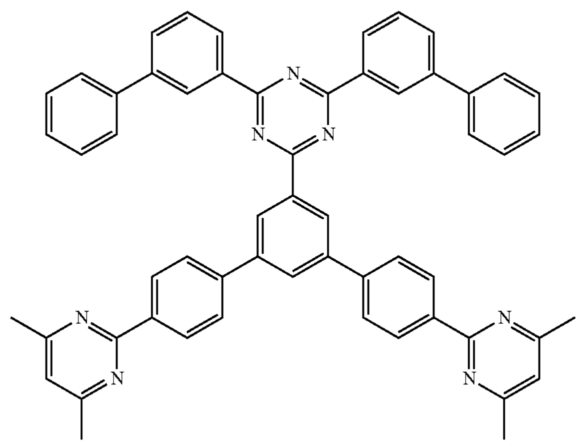
E-116
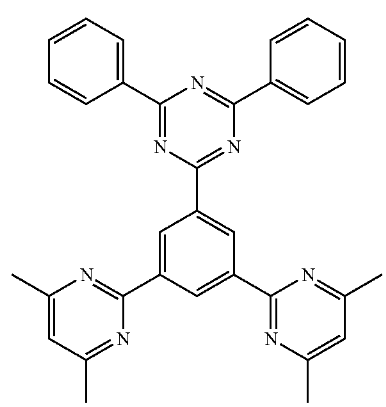

-continued
E-117
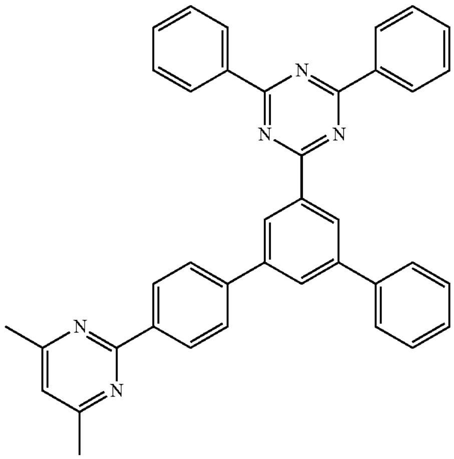
E-118
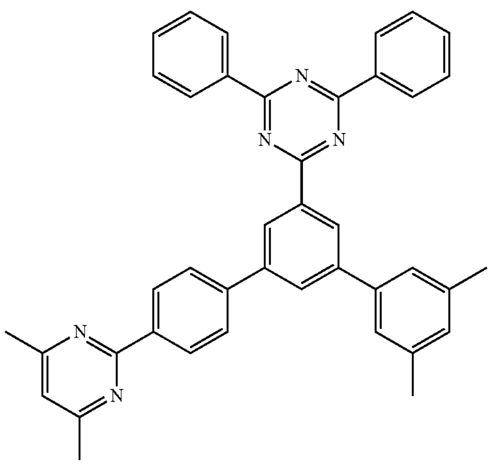
E-119
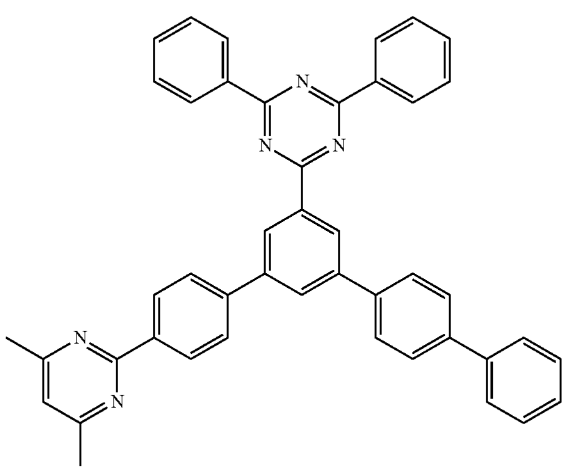
-continued
E-120
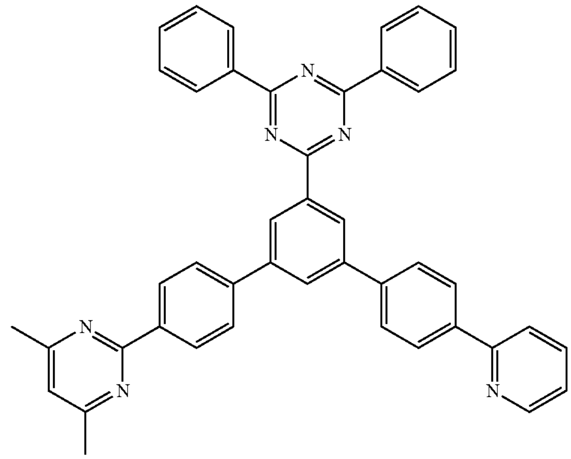
E-121
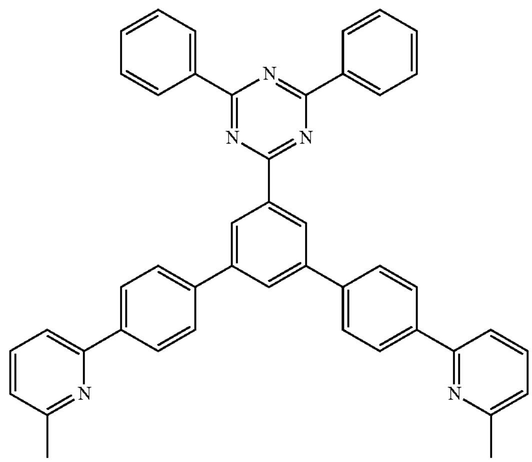
E-122
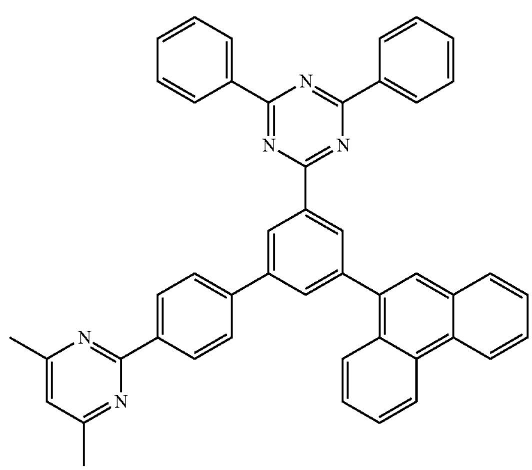

-continued
E-123
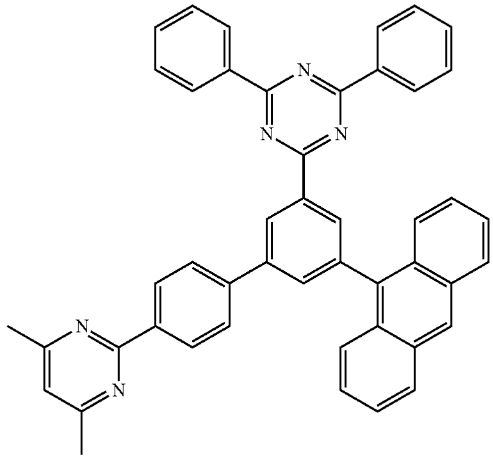
E-124
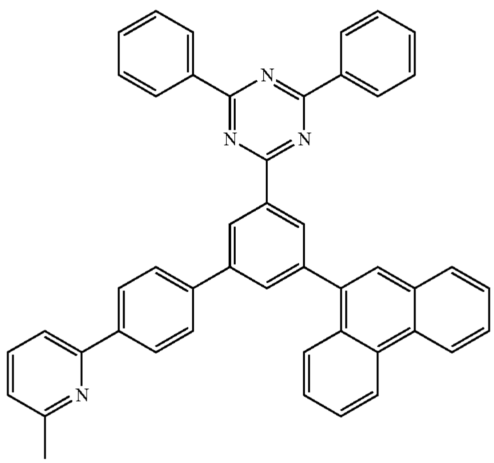
E-125
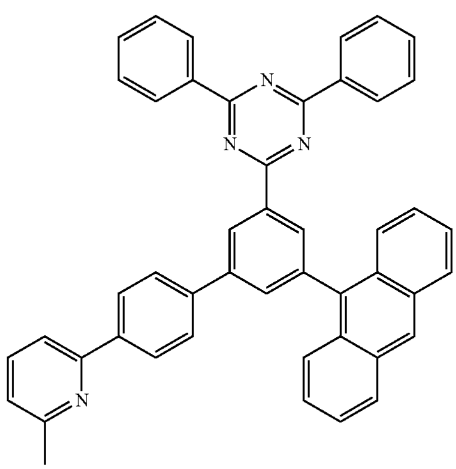
-continued
E-126
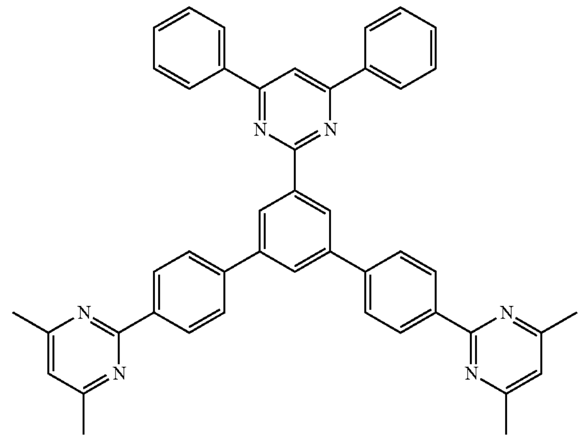
E-127
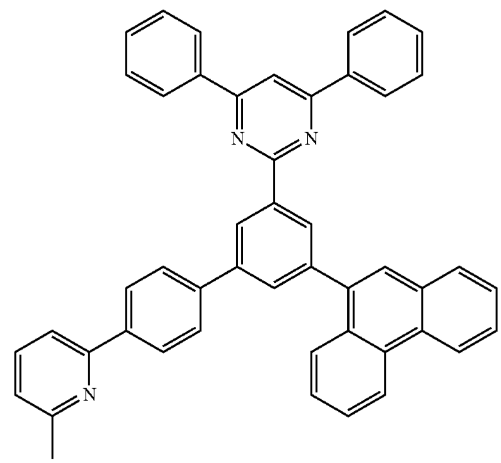
E-128
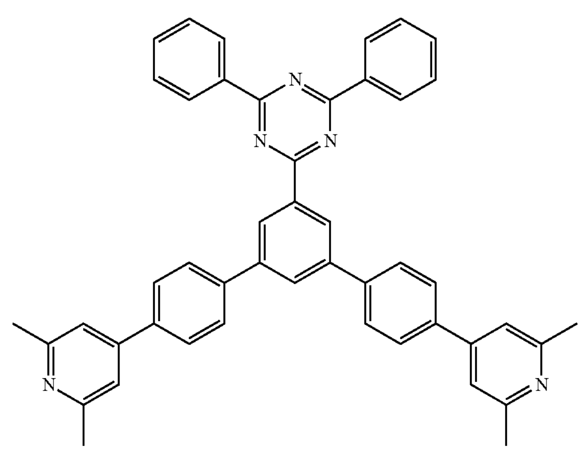

-continued
E-129
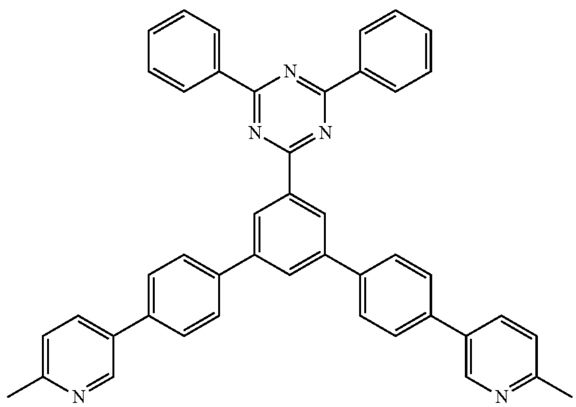
E-130
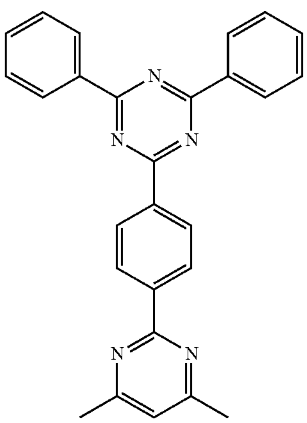
E-131
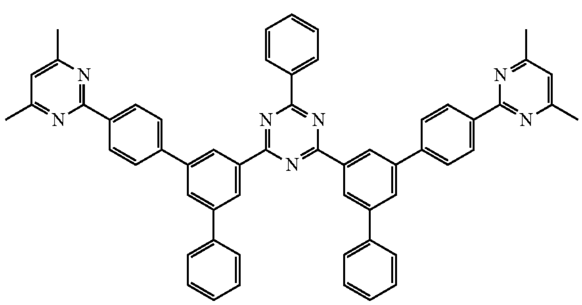
E-132
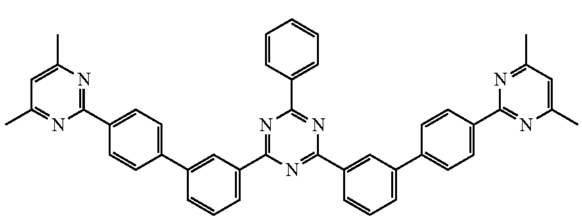
-continued
E-133
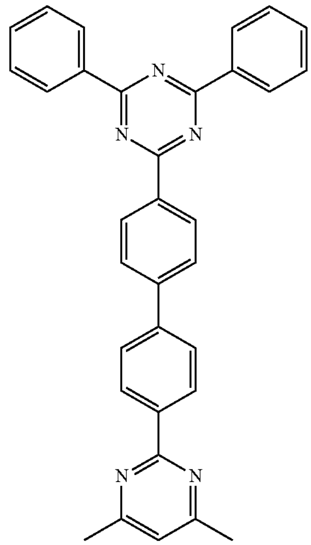
E-134
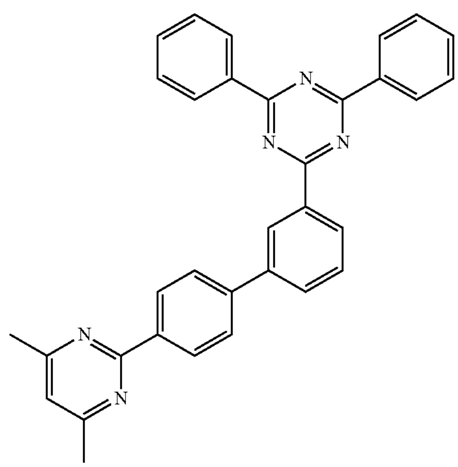
E-135
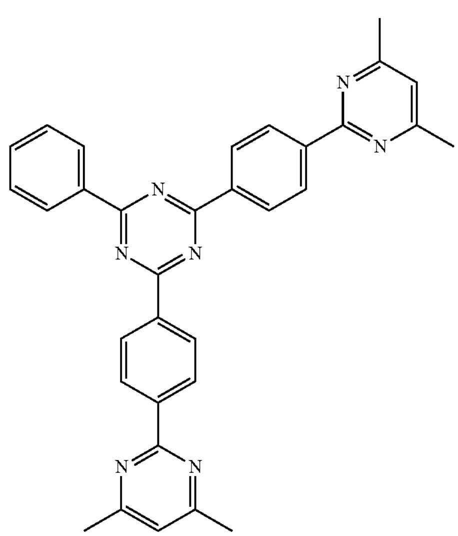

E-136
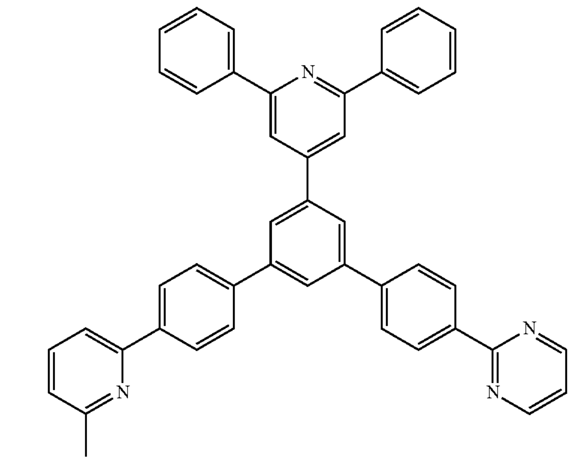
E-137
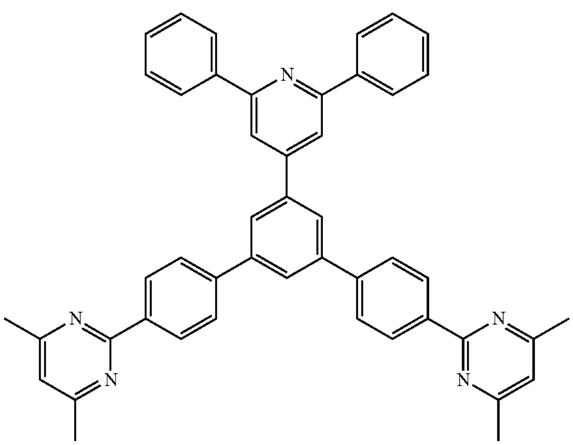
E-138
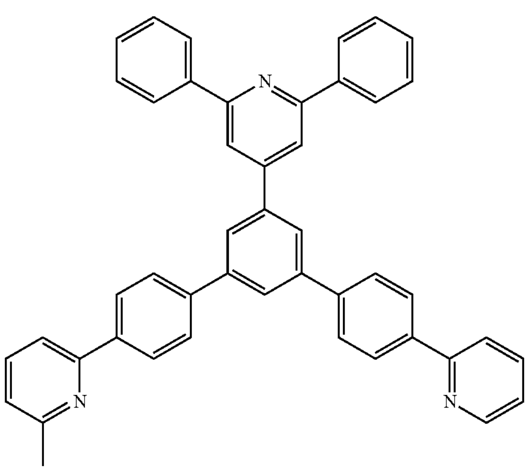
E-139
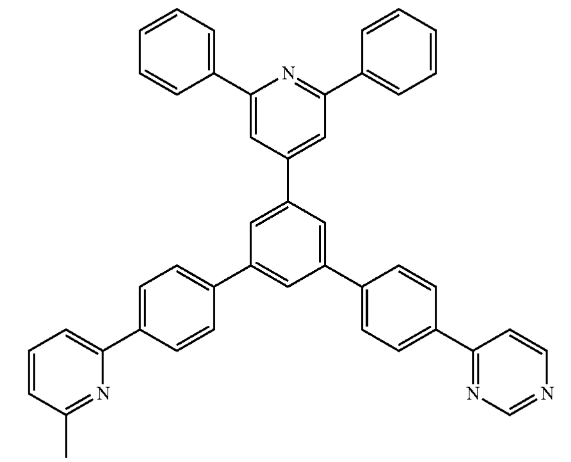
E-140
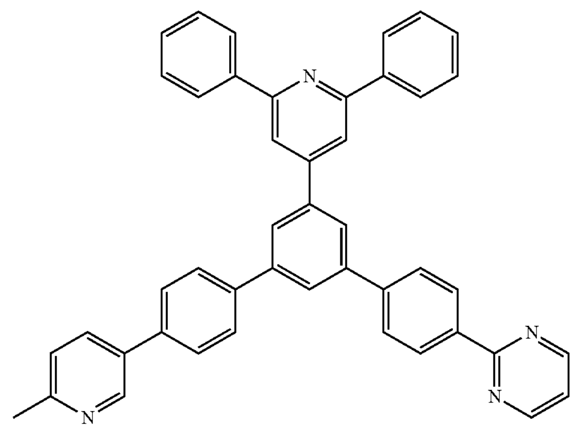
E-141
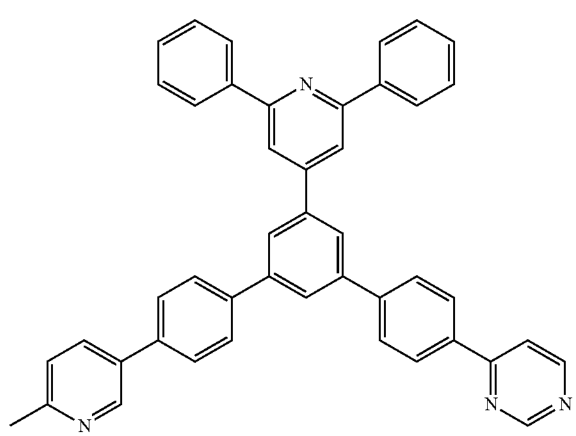

-continued
E-142
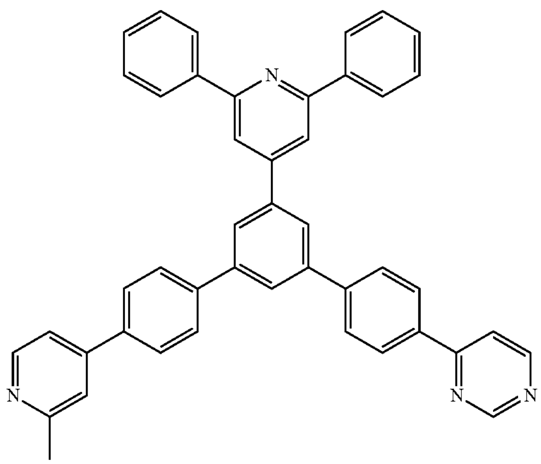
E-143
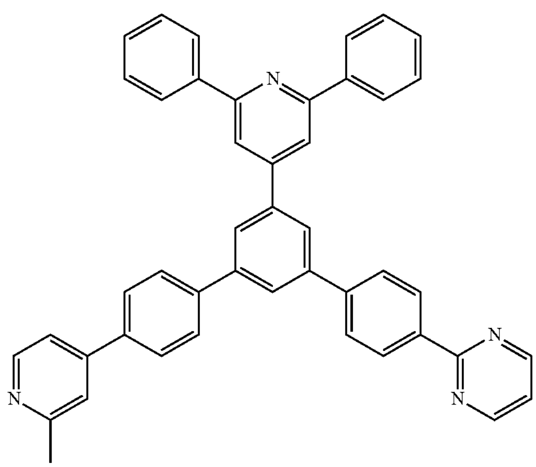
E-144
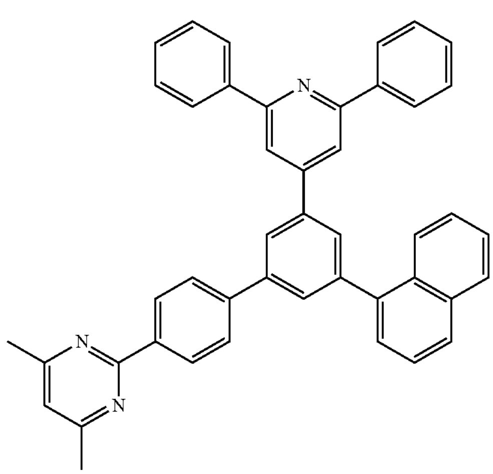
-continued
E-145
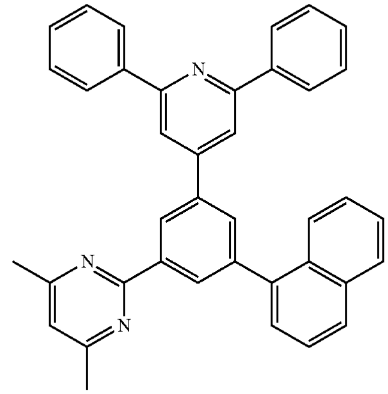
E-146
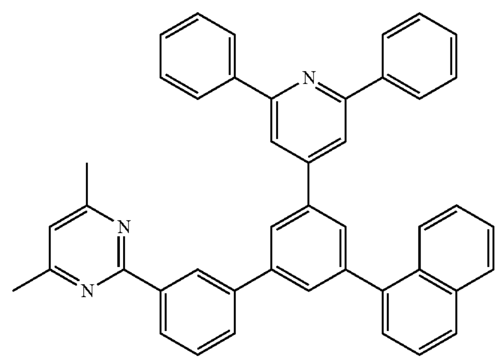
E-147
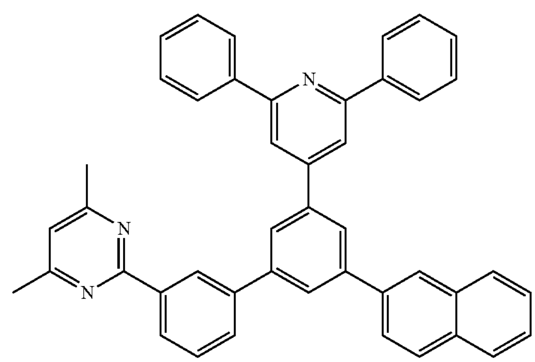
E-148
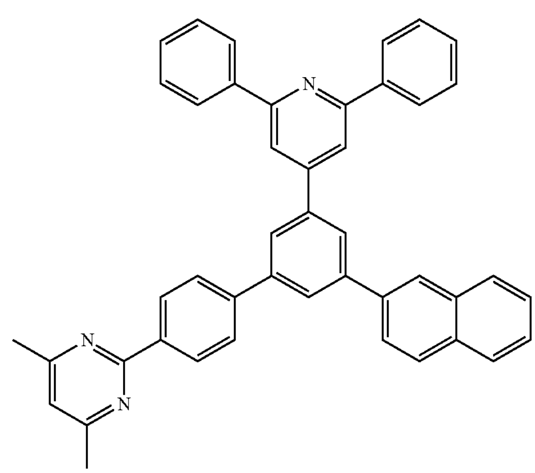

-continued
E-149
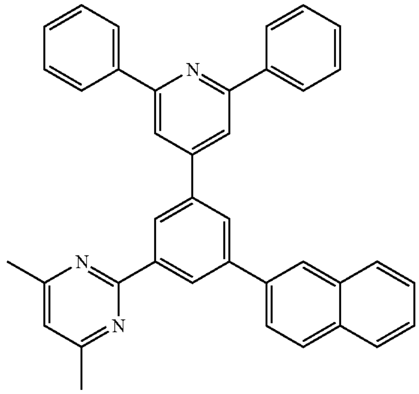
E-150
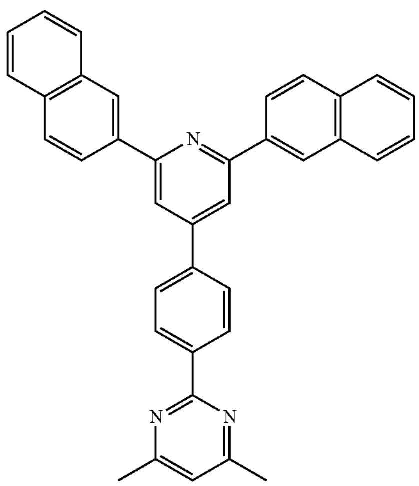
E-151
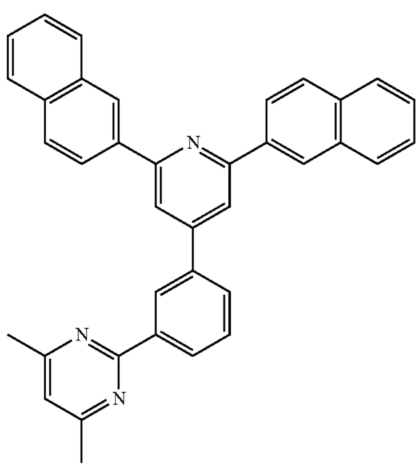
-continued
E-152
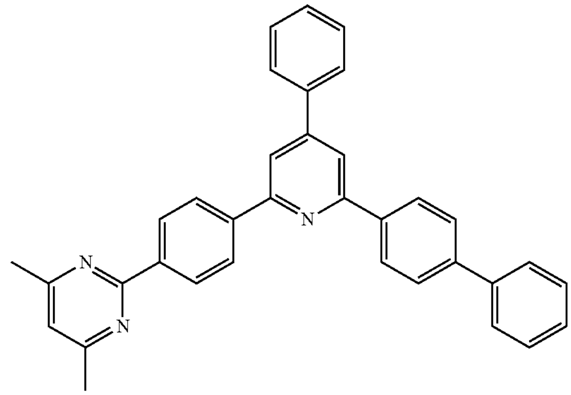
E-153
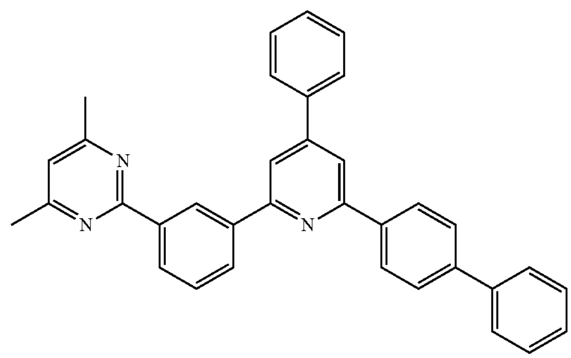
E-155
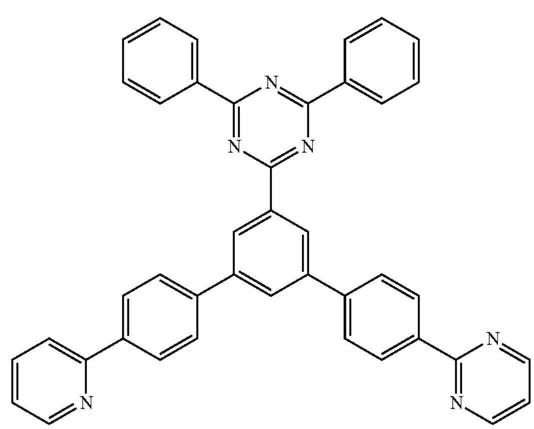

-continued
E-156
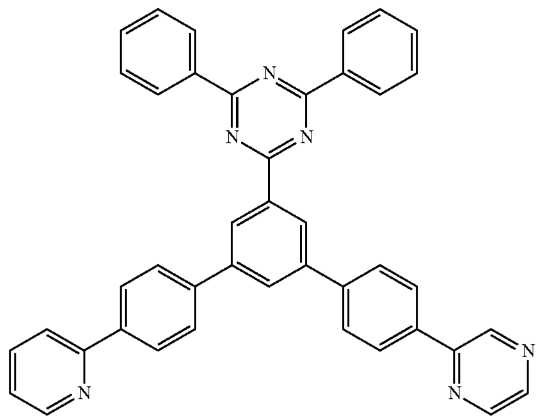
E-157
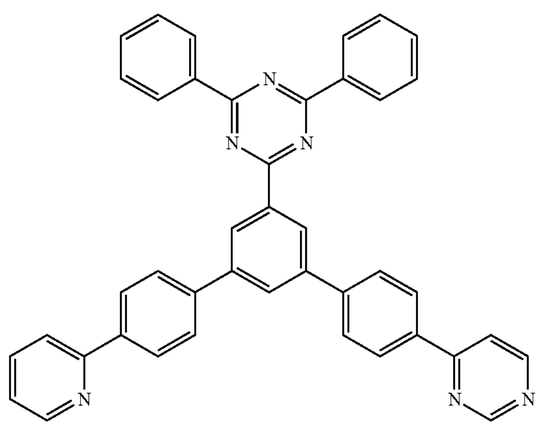
E-158
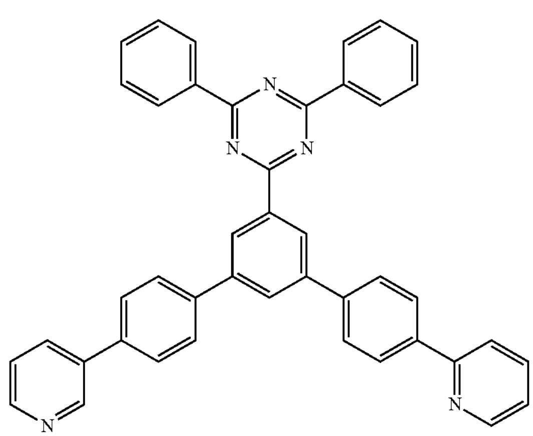
-continued
E-159
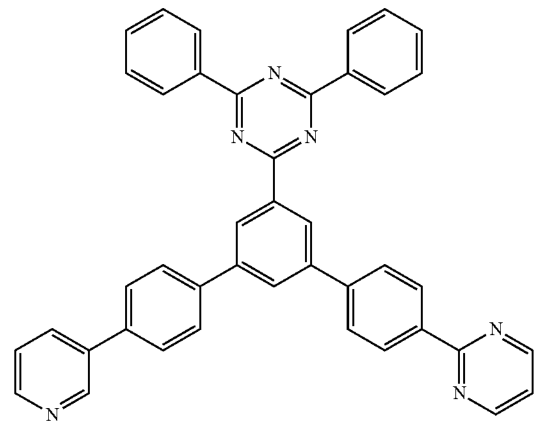
E-160
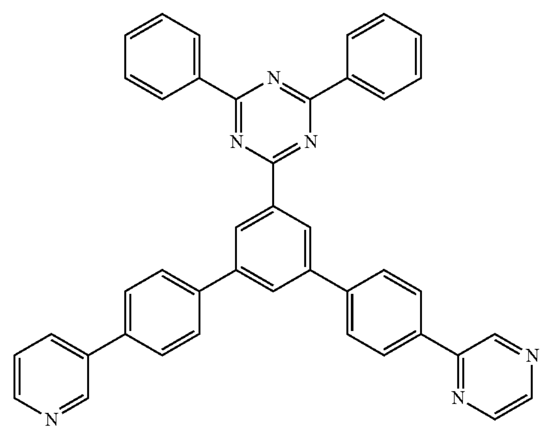
E-161
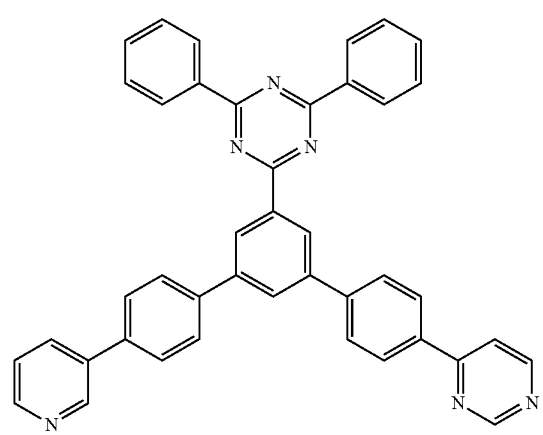

-continued
E-162
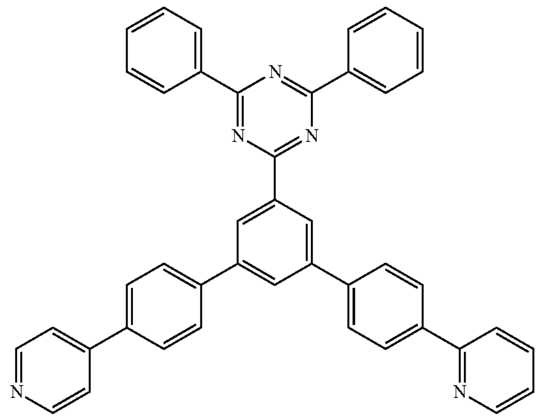
E-163
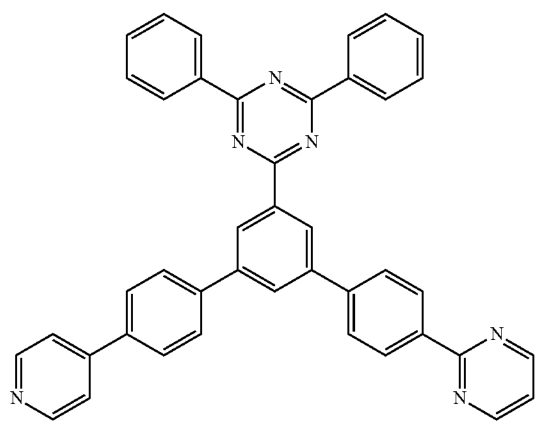
E-164
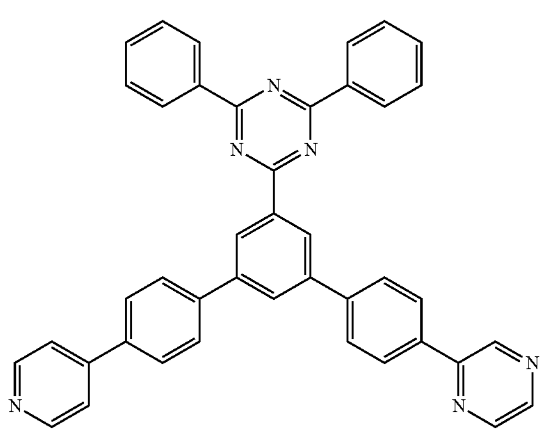
-continued
E-165
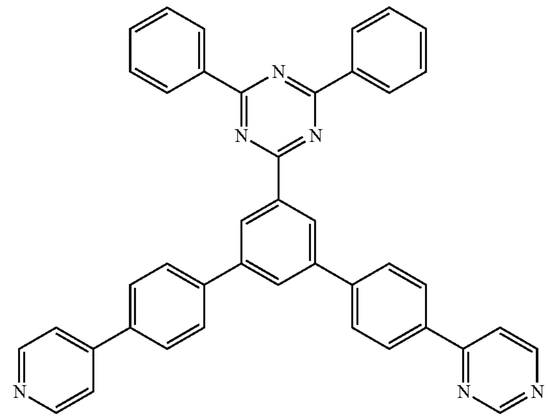
E-170
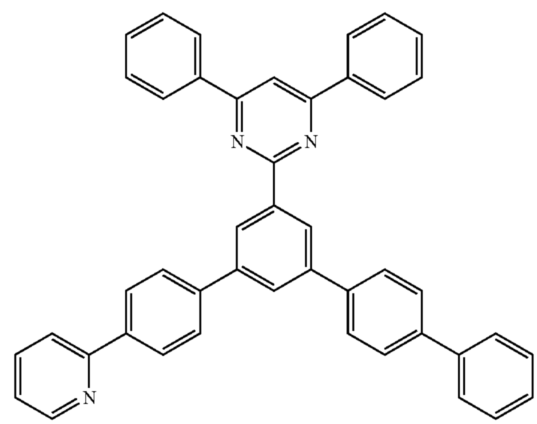
E-172
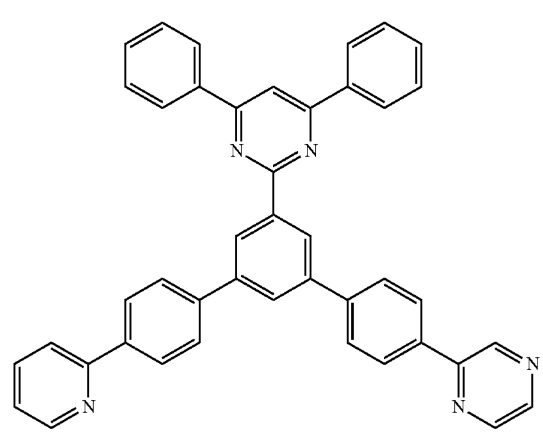

E-173
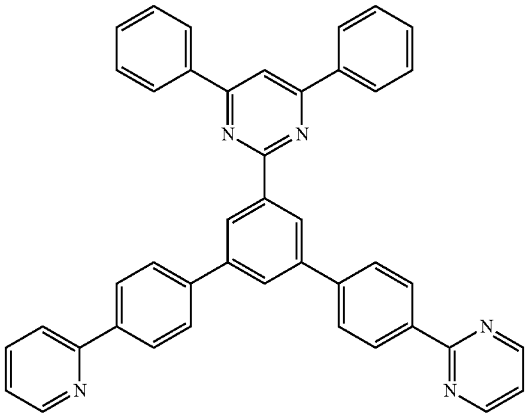
E-174
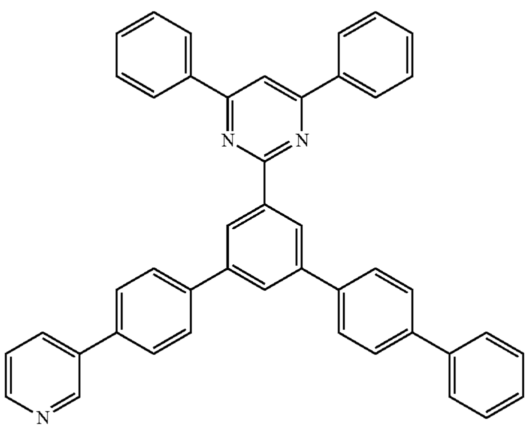
E-175
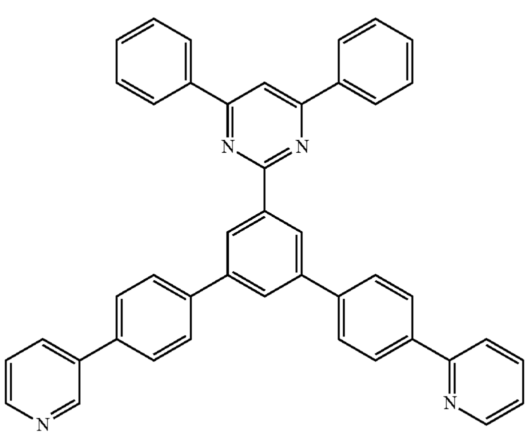
E-176
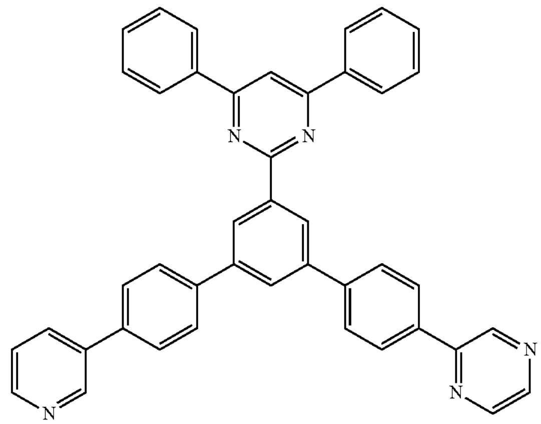
E-177
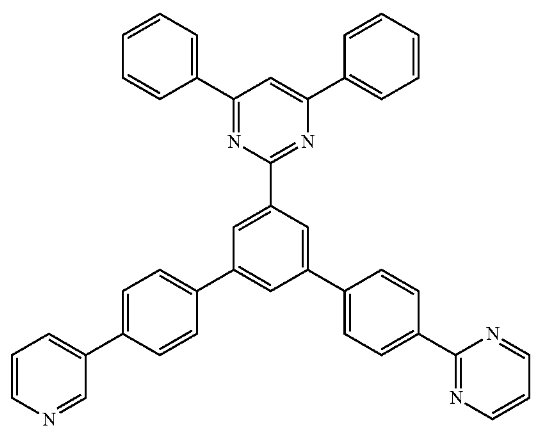
E-178
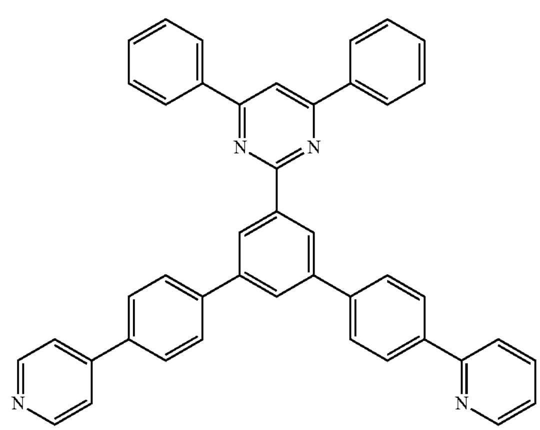

-continued
E-179
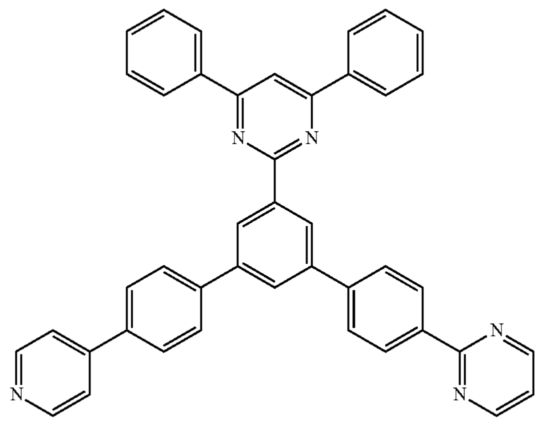
E-180
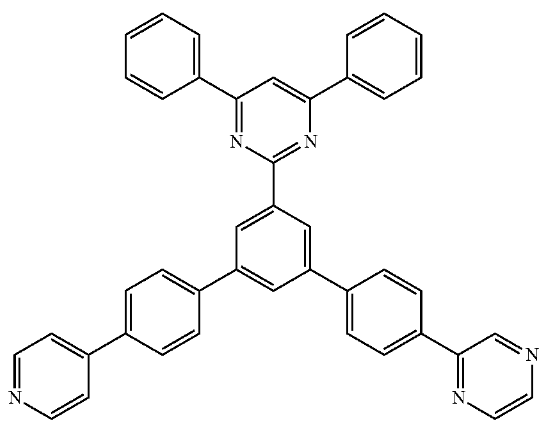
E-181
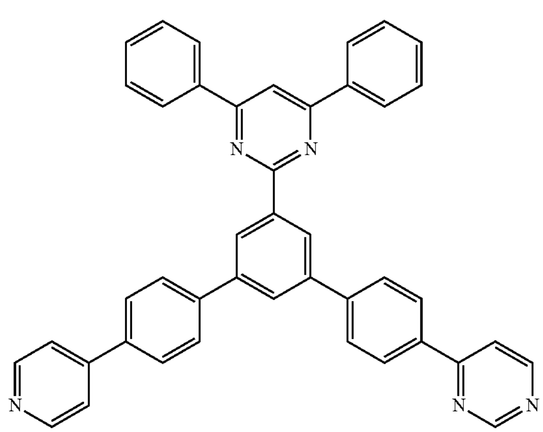
-continued
E-182
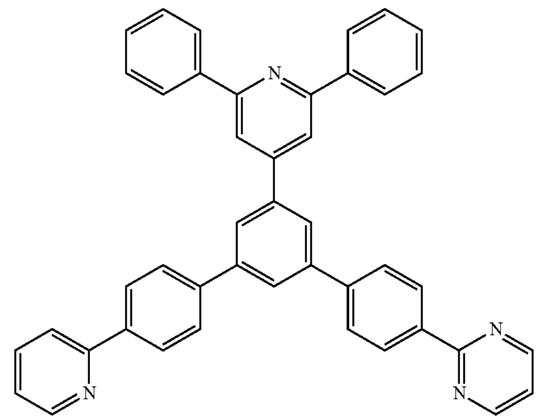
E-185
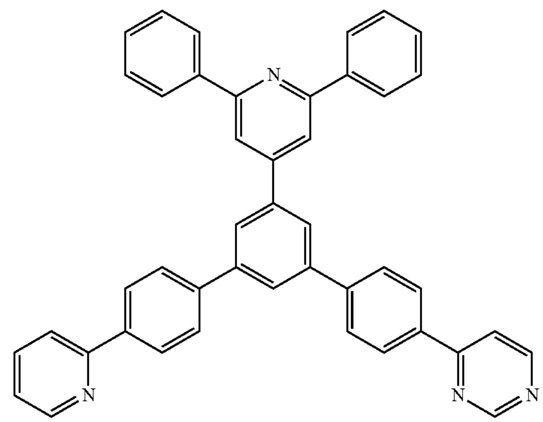
E-186
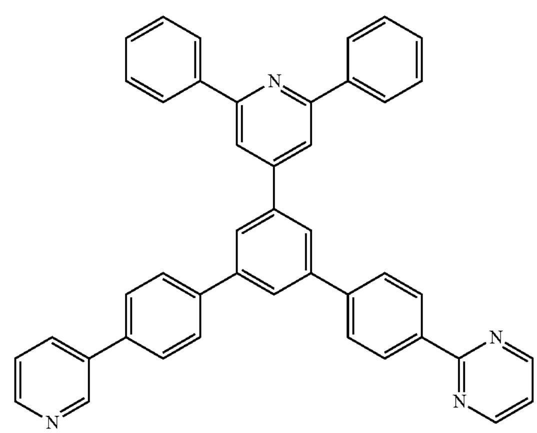

-continued
E-187
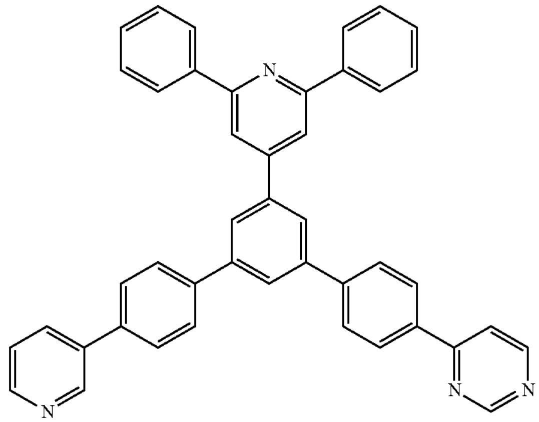
E-188
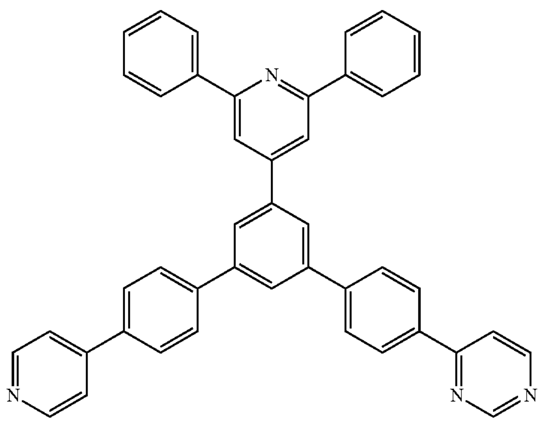
E-189
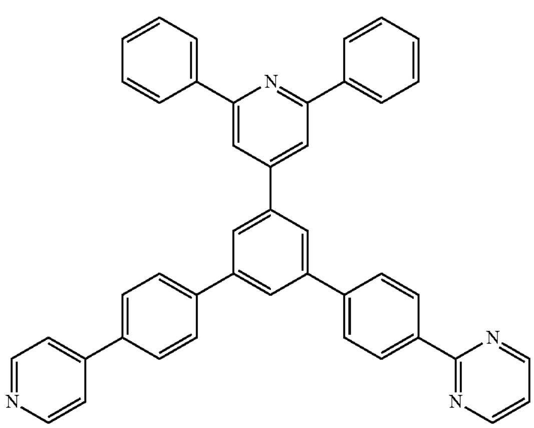
-continued
E-206
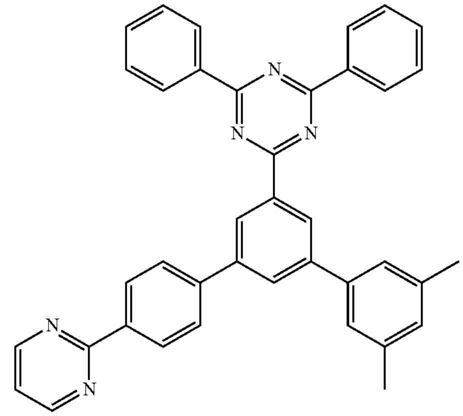
E-207
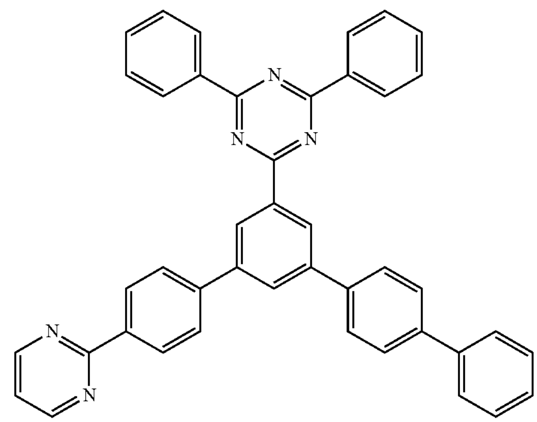
E-208
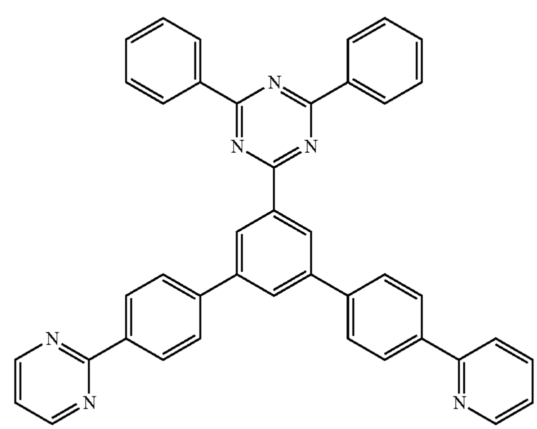

-continued
E-263
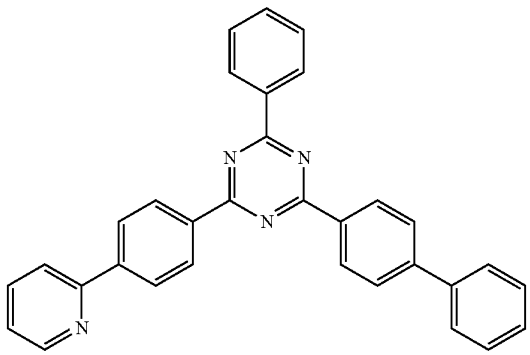
E-264
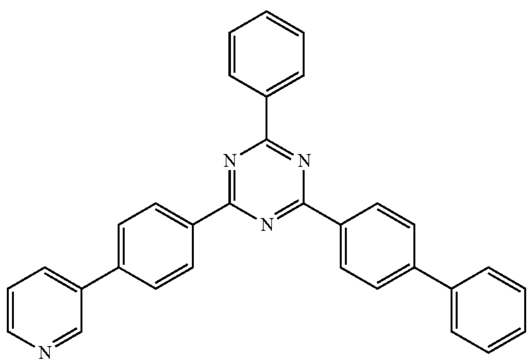
E-266
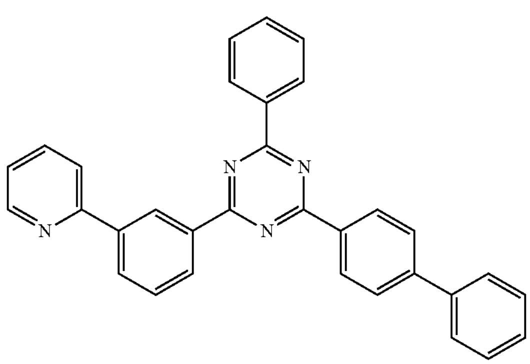
E-267
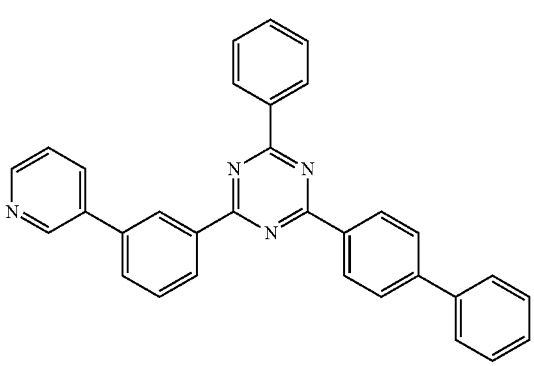
-continued
E-269
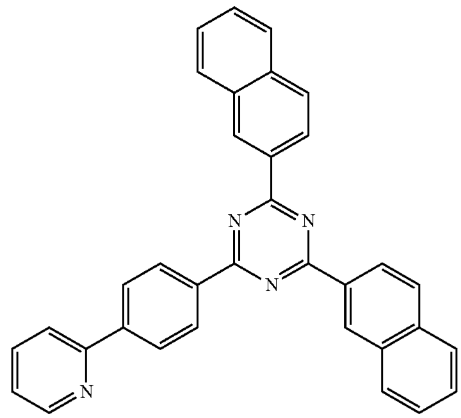
E-270
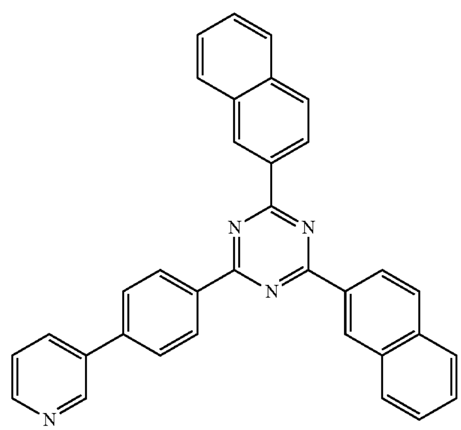
E-272
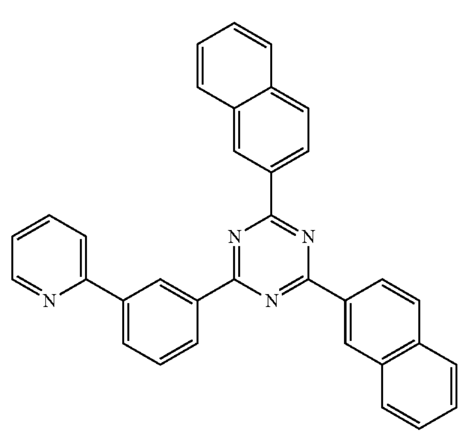

-continued

E-273

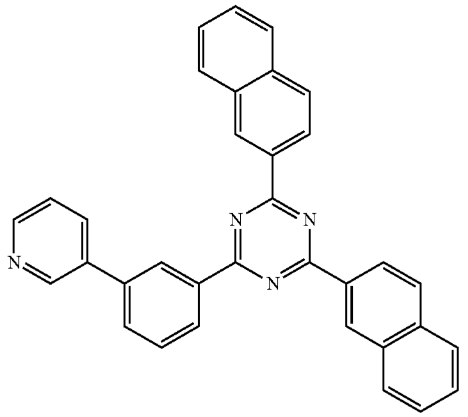

10. The organic light-emitting device of claim 1, wherein the organic layer comprises an emission layer and an electron transport region, the electron transport region is disposed between the emission layer and the second electrode, the emission layer comprises the first compound, and the electron transport region comprises the second compound.

11. The organic light-emitting device of claim 10, wherein the emission layer further comprises a dopant, and the dopant is an organometallic complex represented by Formula 401:

Formula 401

$$M(L_{401})_{xc1}(L_{402})_{xc2}$$

Formula 402

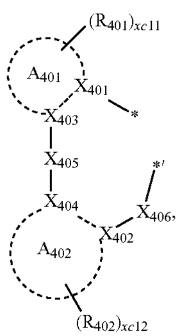

wherein, in Formulae 401 and 402,

M is selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ is a ligand represented by Formula 402, xc1 is 1, 2, or 3, wherein when xc1 is two or more, two or more $L_{401}$(S) are identical to or different from each other, $L_{402}$ is an organic ligand, xc2 is an integer selected from 0 to 4, wherein when xc2 is two or more, two or more $L_{402}$(s) are identical to or different from each other, $X_{401}$ to $X_{404}$ are each independently nitrogen or carbon, $X_{401}$ and $X_{403}$ are linked to each other via a single bond or a double bond, and $X_{402}$ and $X_{404}$ are linked to each other via a single bond or a double bond, $A_{401}$ and $A_{402}$ are each independently a $C_5$-$C_{60}$ carbocyclic group or a $C_1$-$C_{60}$ heterocyclic group, $X_{405}$ is a single bond, *—O—*', *—S—*', *—C(=O)—*', *—N($Q_{411}$)—*', *—C($Q_{411}$)($Q_{412}$)—*', *—C($Q_{411}$)=C($Q_{412}$)—*', *—C($Q_{411}$)=*', or *=C($Q_{411}$)=*', wherein $Q_{411}$ and $Q_{412}$ are each independently hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ is a single bond, O, or S, $R_{401}$ and $R_{402}$ are each independently selected from hydrogen, deuterium, —F, —Cl, —Br, —I, —$CD_3$, —$CF_3$, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ are each independently selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 are each independently an integer selected from 0 to 10, and

* and *' in Formula 402 are each independently a binding site to M in Formula 401.

12. An organic light-emitting device comprising:

a first electrode;

a second electrode facing the first electrode; and an organic layer between the first electrode and the second electrode, the organic layer comprising an emission layer, wherein the organic layer comprises a first compound represented by one selected from Formulae 1-1 and 1-2, and a second compound selected from Compounds E-36, E-100, E-173 and E-273:

Formula 1-1

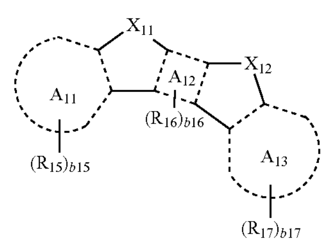

Formula 1-2

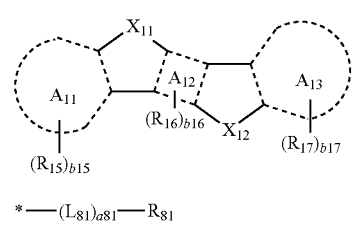

Formula 8

$$*-(L_{81})_{a81}-R_{81}$$

wherein, in Formulae 1-1, 1-2, and 8, $A_{11}$ to $A_{13}$ are each independently selected from a $C_5$-$C_{20}$ carbocyclic group and a $C_1$-$C_{20}$ heterocyclic group, $X_{11}$ is selected from $N(R_{11})$, $C(R_{11})(R_{12})$, O, and S, $X_{12}$ is selected from $N(R_{13})$, $C(R_{13})(R_{14})$, O, and S, $R_{11}$ to $R_{17}$ are each independently selected from a group represented by Formula 8, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(O_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, wherein at least one selected from $R_{11}$ to $R_{17}$ is the group represented by Formula 8, b15 to b17 are each independently selected from 1, 2, 3, 4, 5, 6, 7, and 8, $L_{81}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a81 is selected from 0, 1, and 2, $R_{81}$ is selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group,

E-36

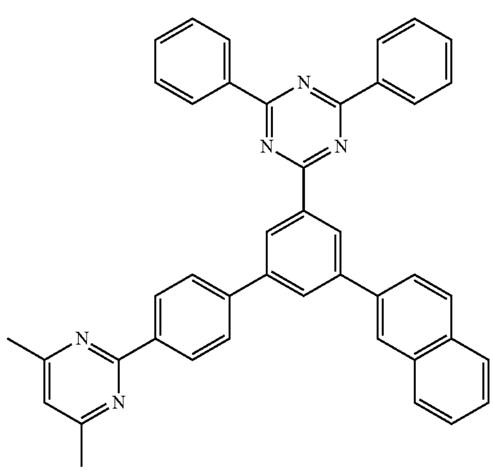

-continued

E-173

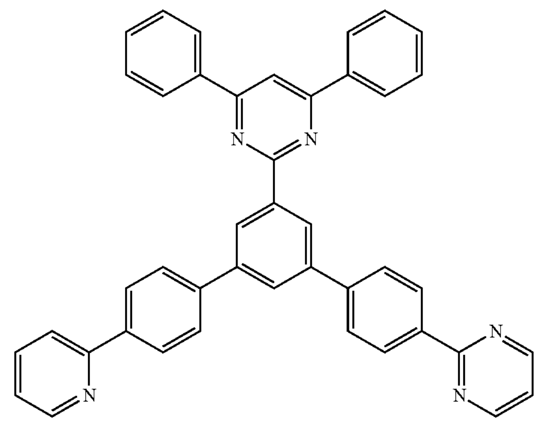

E-100

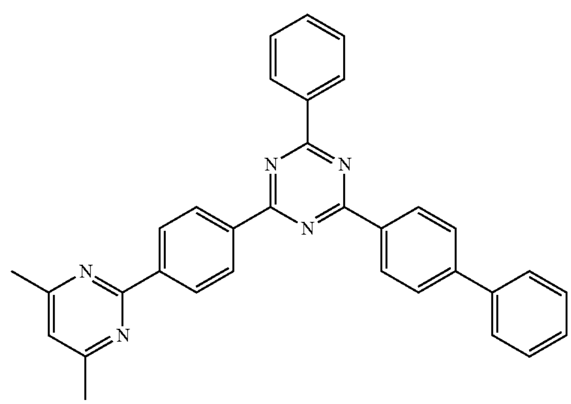

E-273

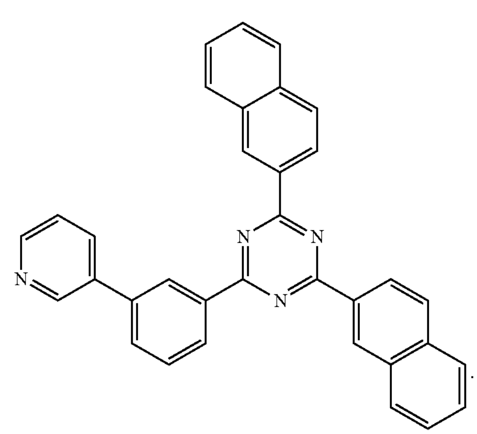

13. The organic light-emitting device of claim 12, wherein the first compound is selected from Compounds C-115, C-222, C-223 and D-101 to D-173:

-continued
C-115
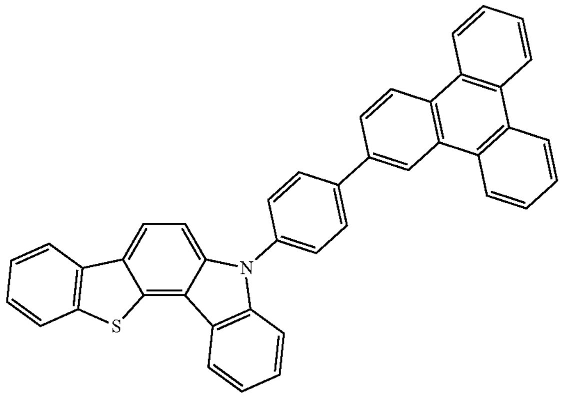
C-222
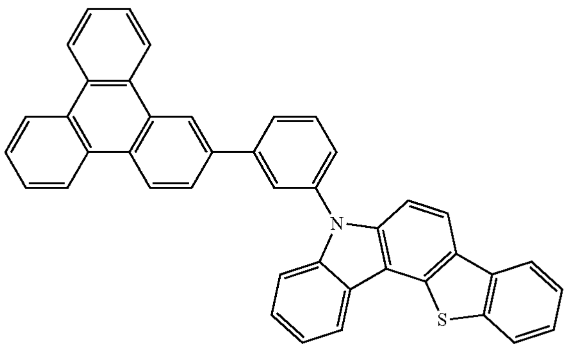
C-223
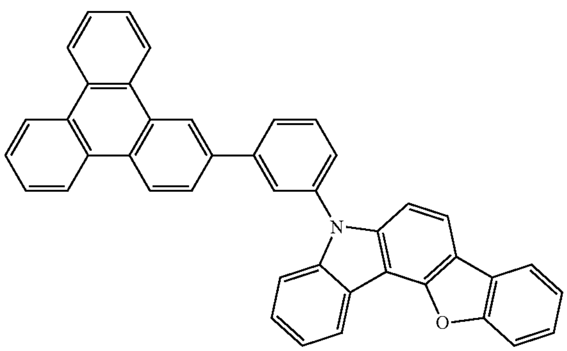
D-101
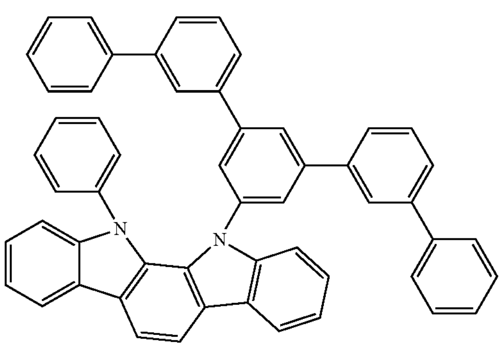
D-102
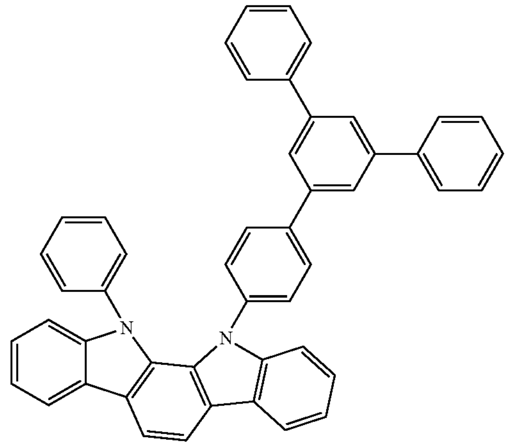
D-103
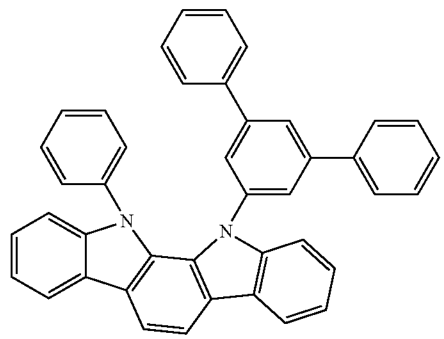
D-104
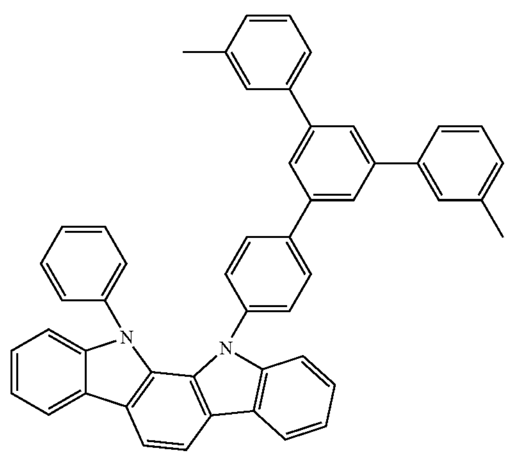

-continued
D-105
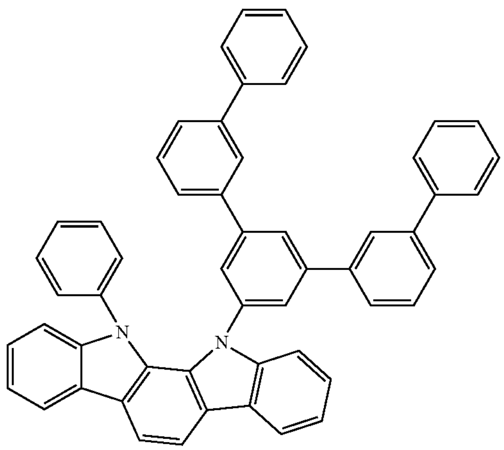
D-106
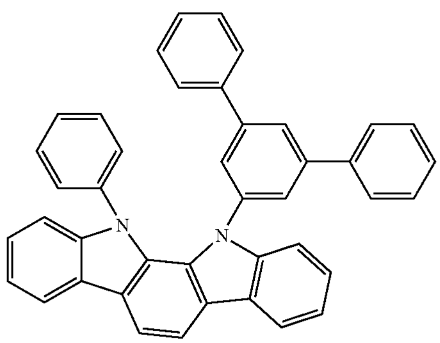
D-107
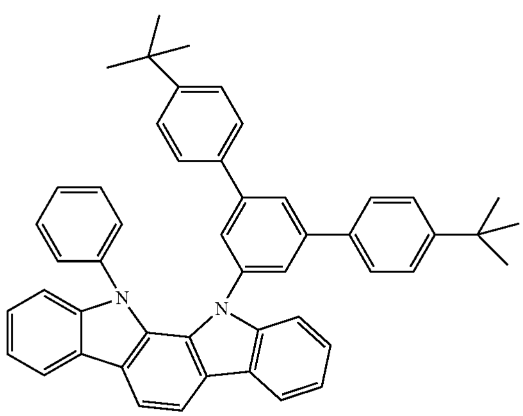
D-108
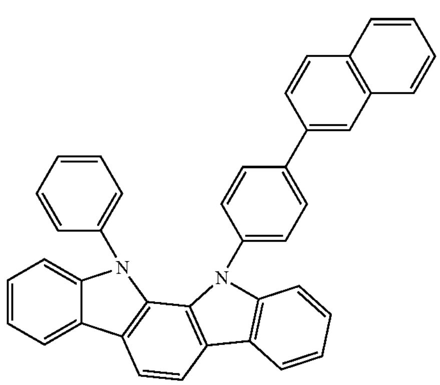
-continued
D-109
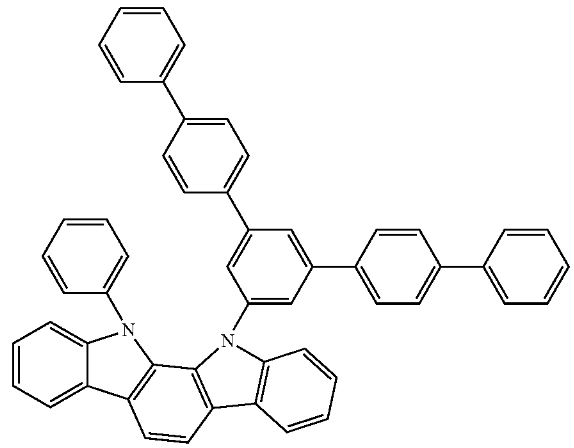
D-110
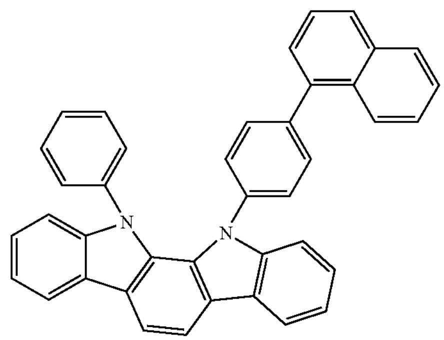
D-111
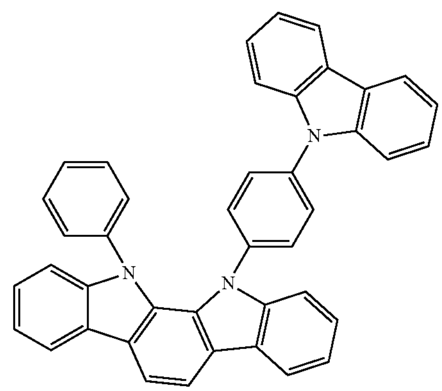
D-112
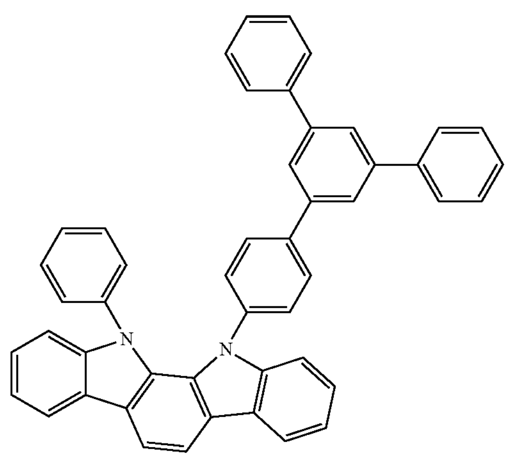

-continued
D-113
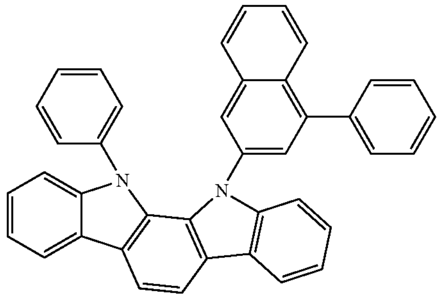
D-114
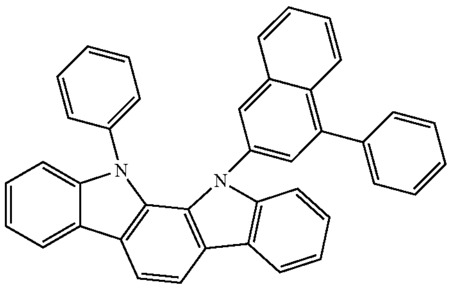
D-115
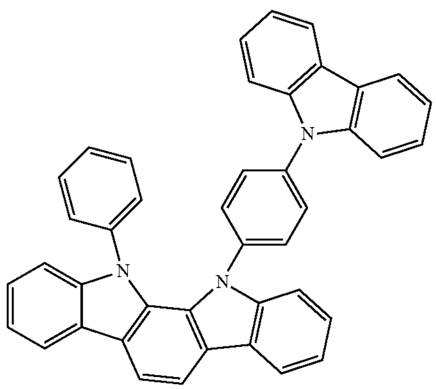
D-116
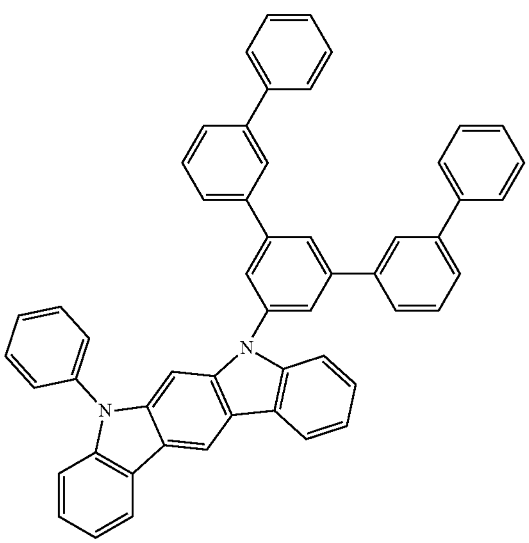
-continued
D-117
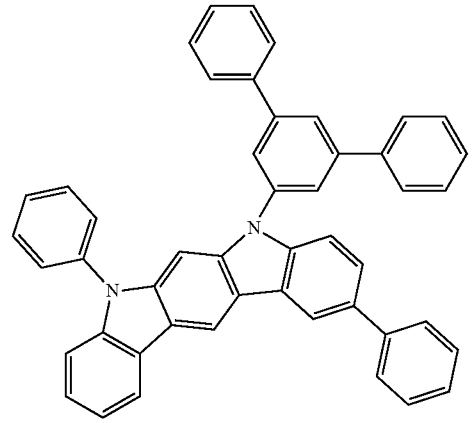
D-118
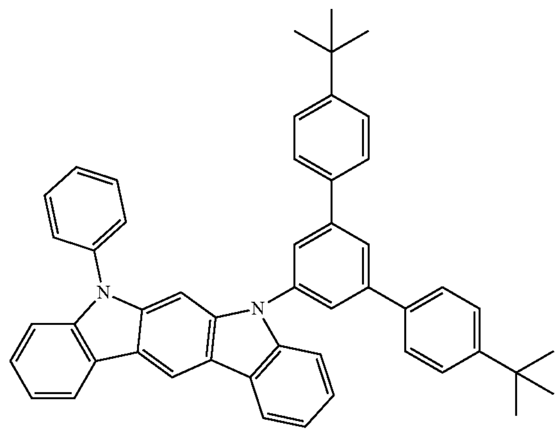
D-119
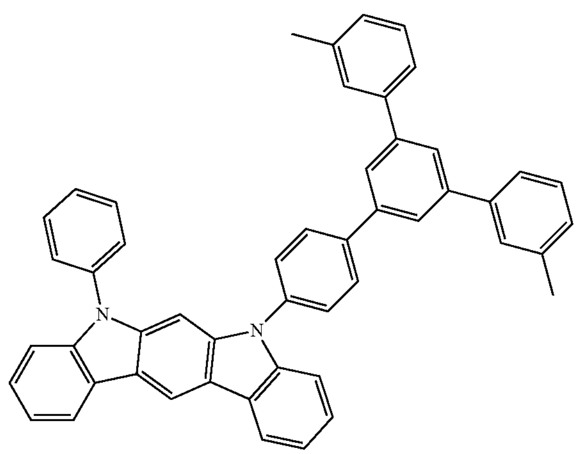

-continued
D-120
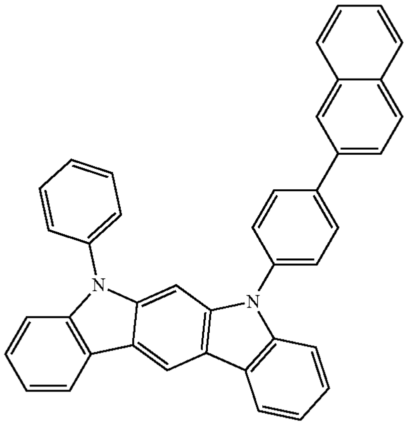
D-121
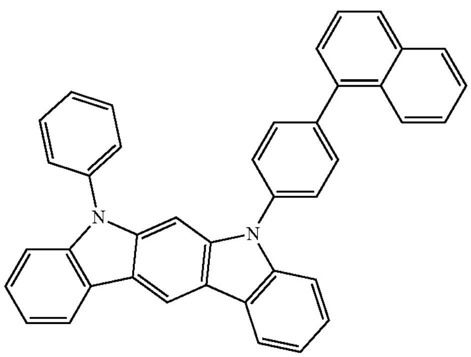
D-122
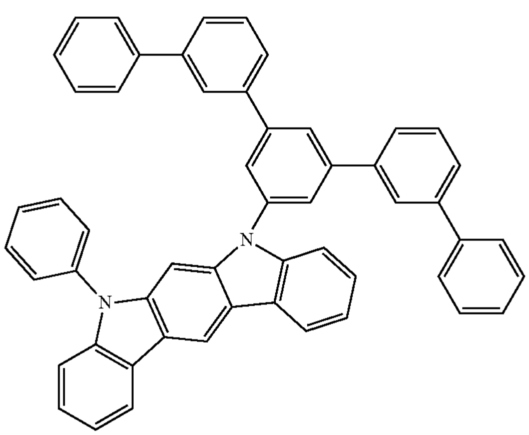
-continued
D-123
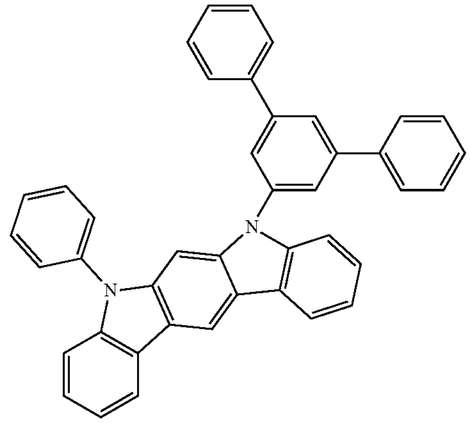
D-124
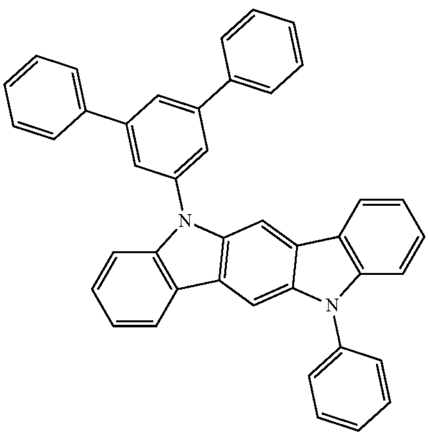
D-125
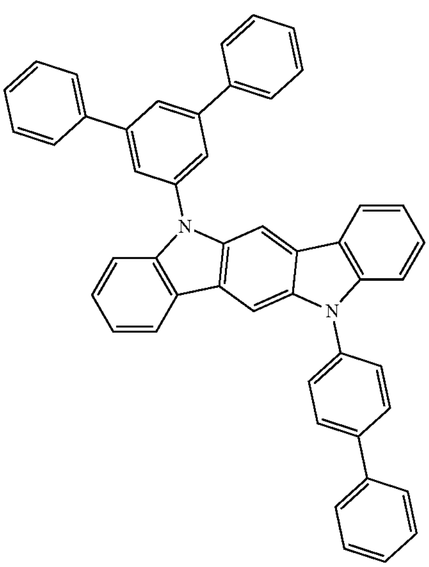

-continued
D-126
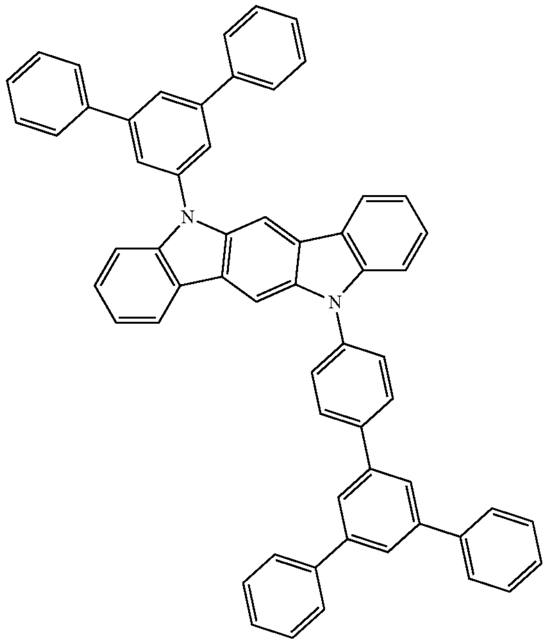
D-127
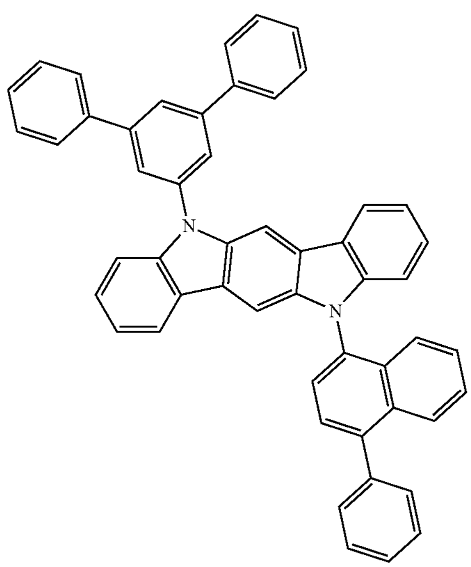
-continued
D-128
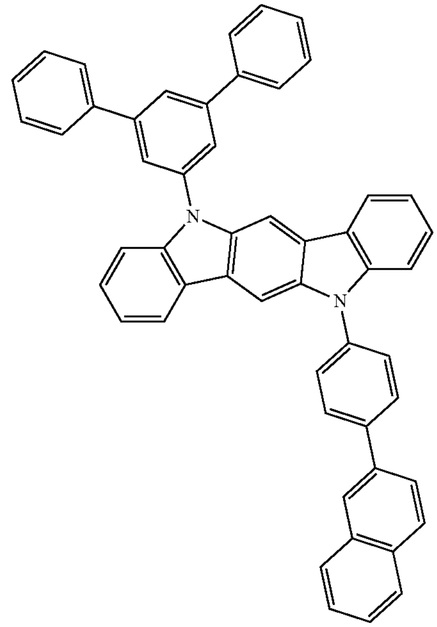
D-129
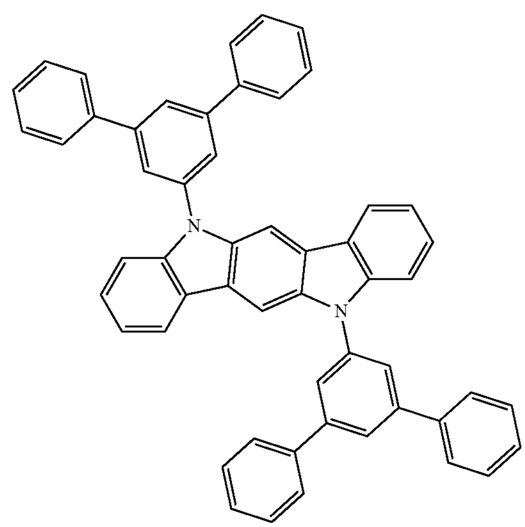

D-130
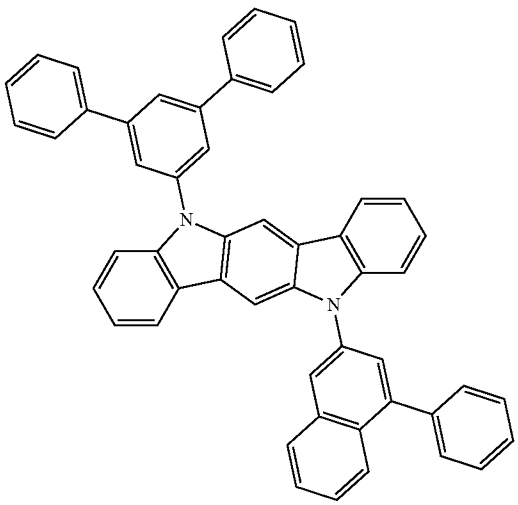
D-131
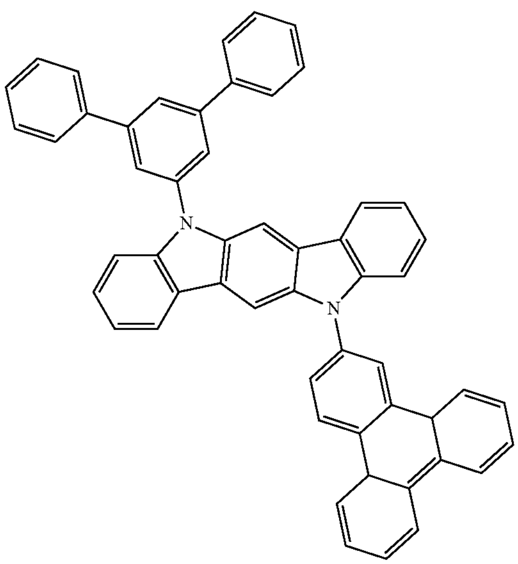
D-132
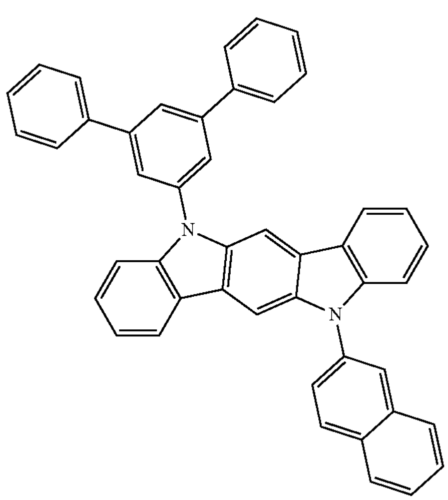
D-133
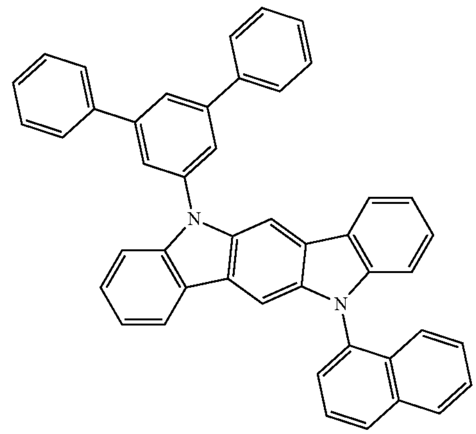
D-134
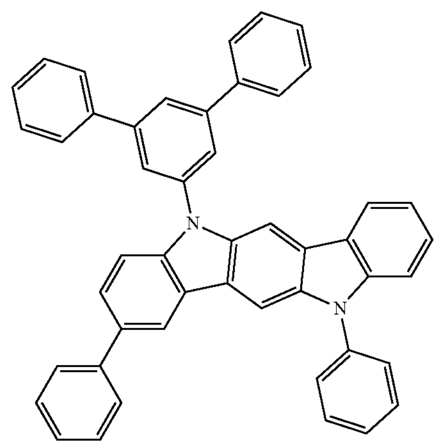
D-135
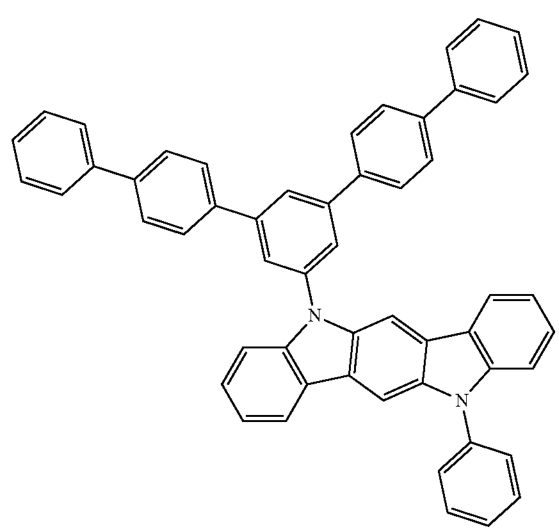

-continued
D-136
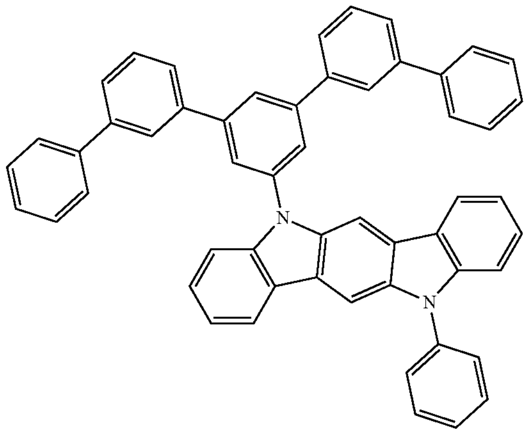
D-137
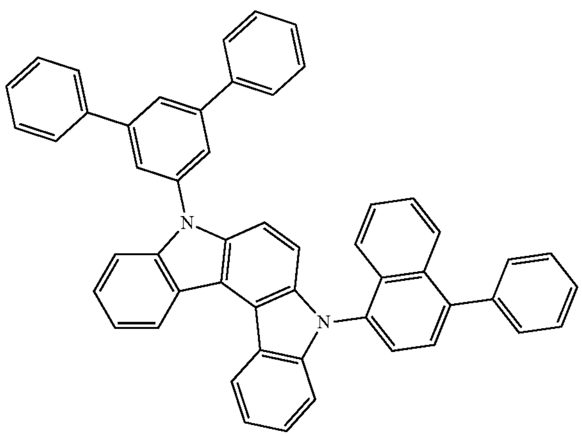
D-138
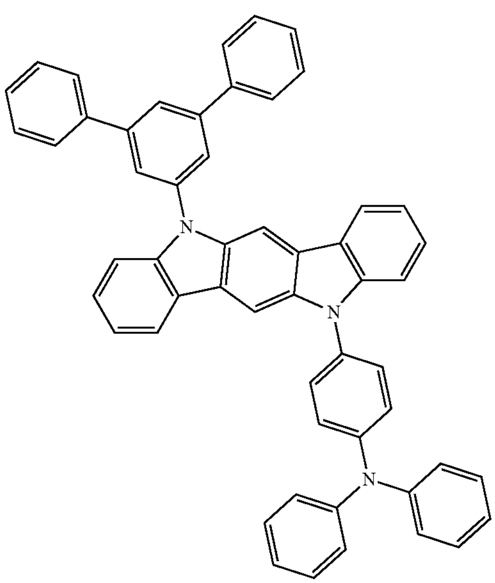
-continued
D-139
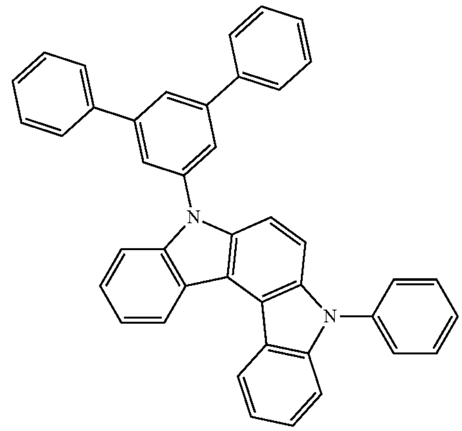
D-140
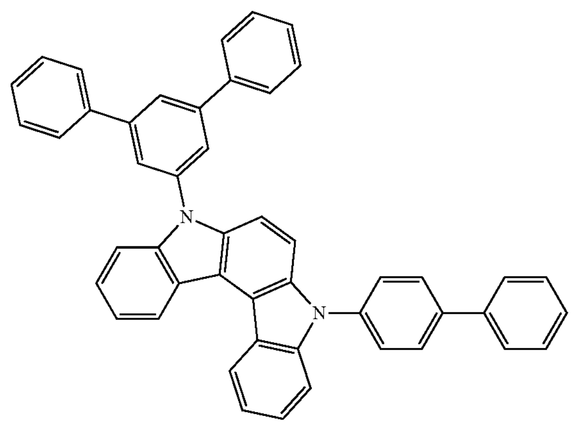
D-141
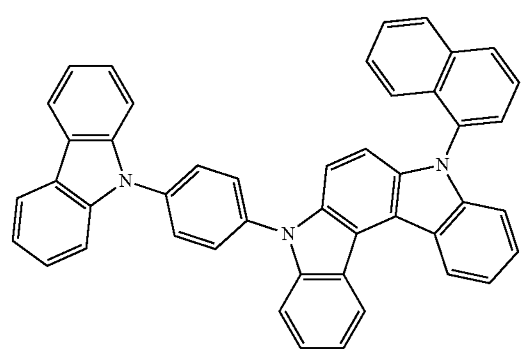

D-142
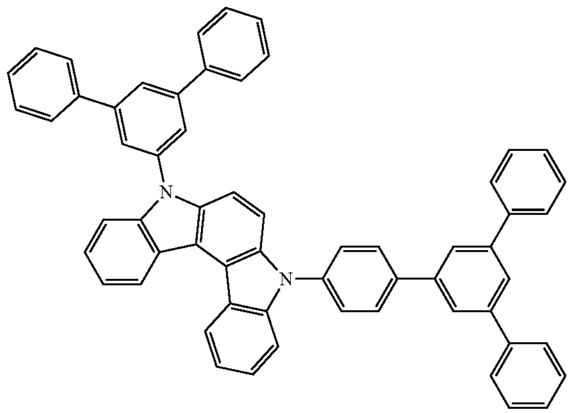
D-143
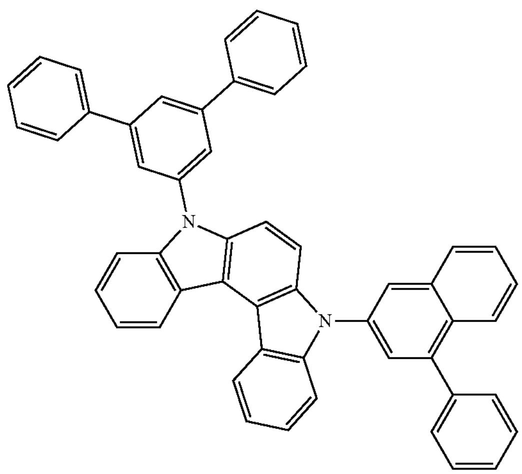
D-144
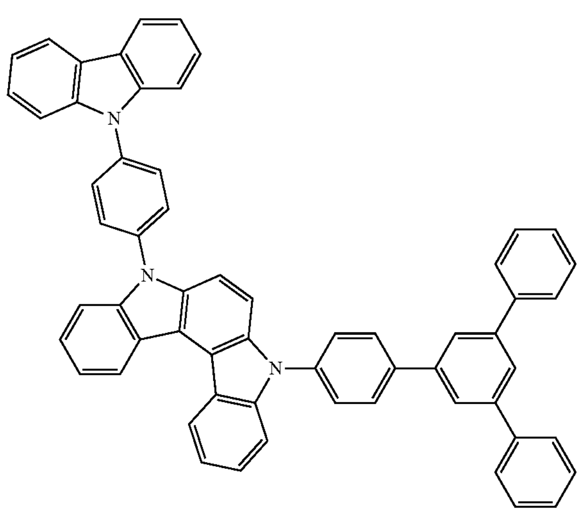
D-145
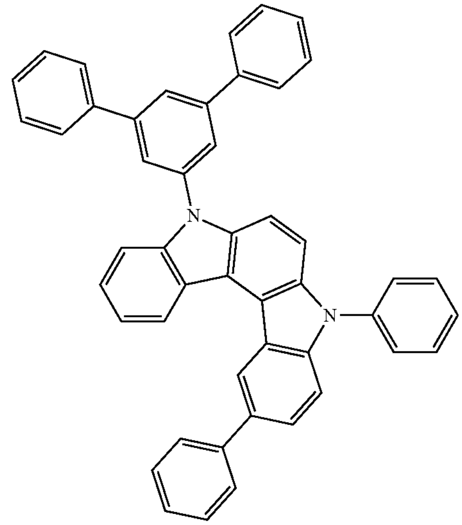
D-146
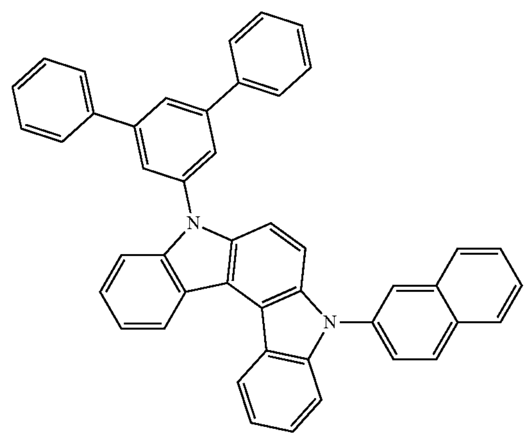
D-147
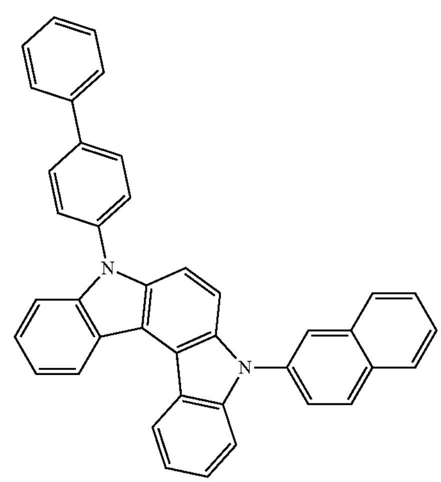

-continued
D-148
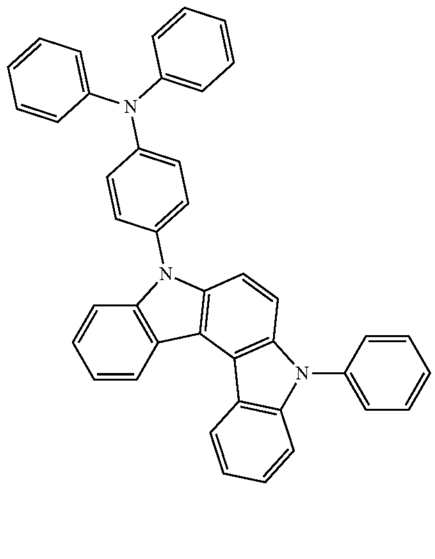
D-149
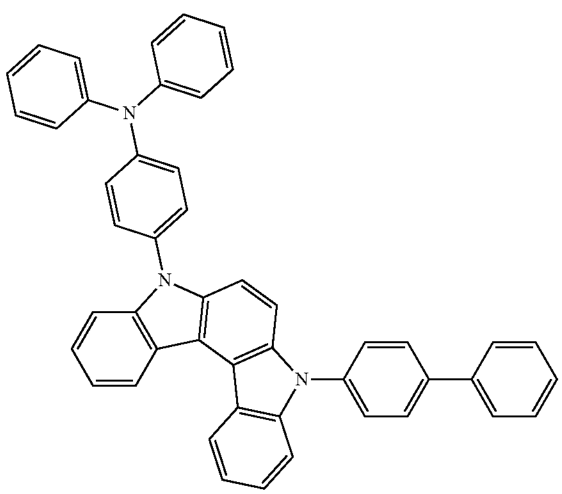
D-150
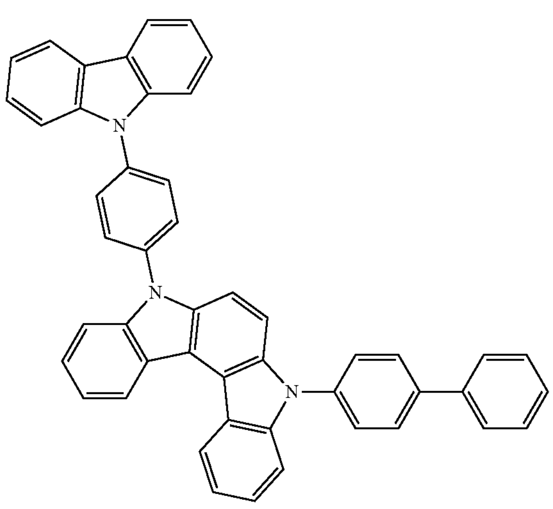
-continued
D-151
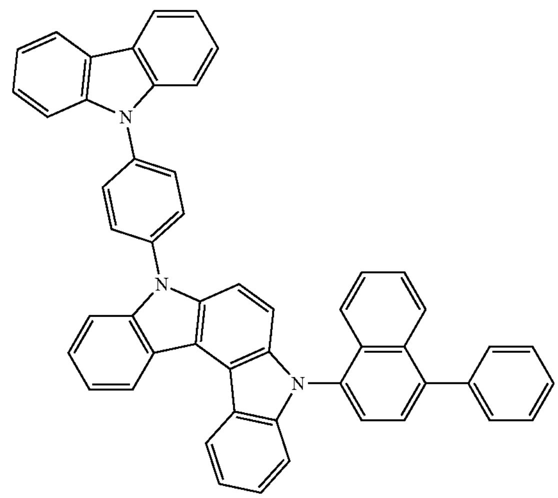
D-152
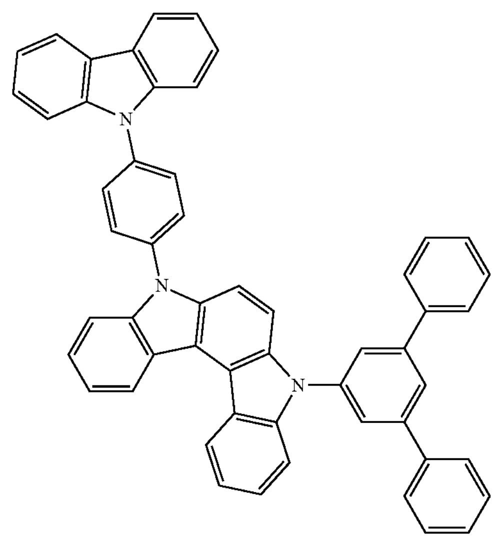
D-153
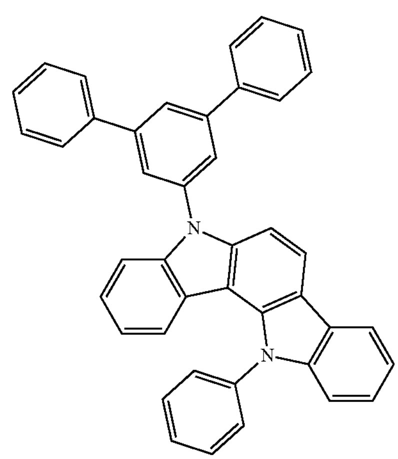

-continued
D-154
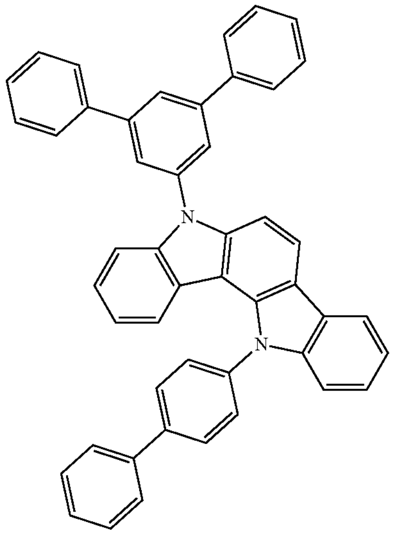
D-155
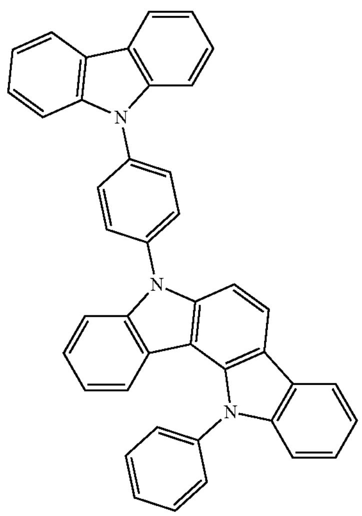
D-156
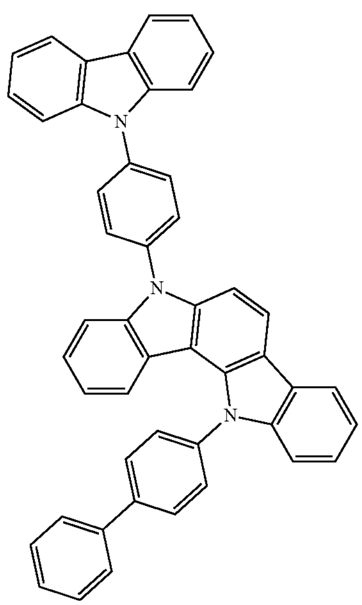
-continued
D-157
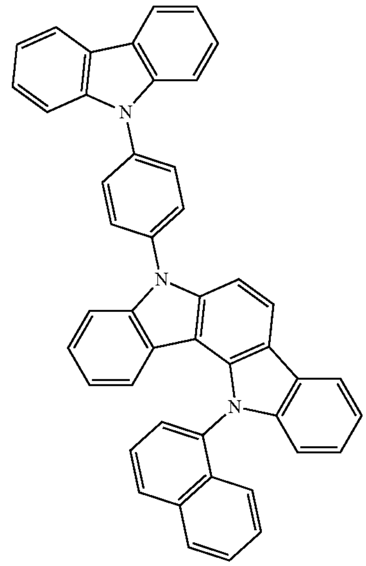
D-158
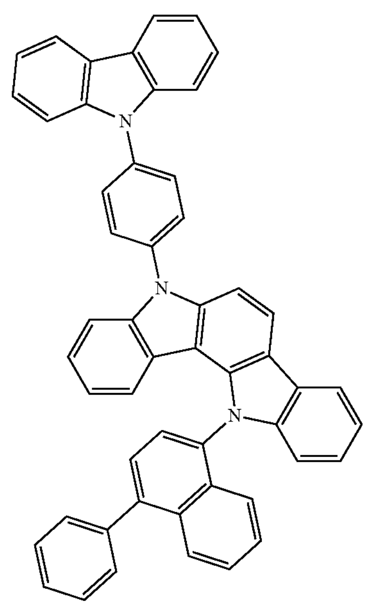

-continued
D-159
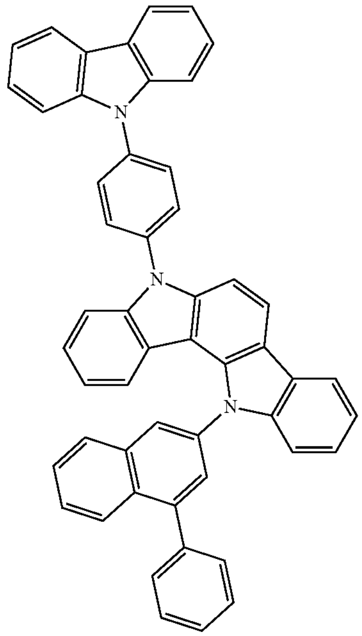
D-160
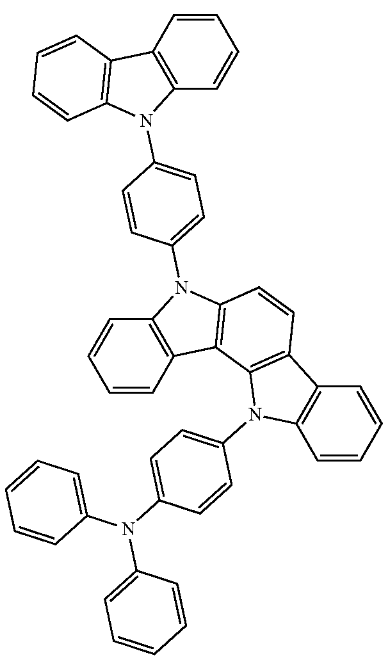
-continued
D-161
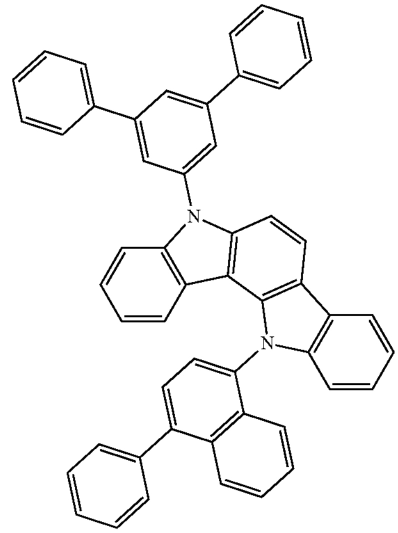
D-162
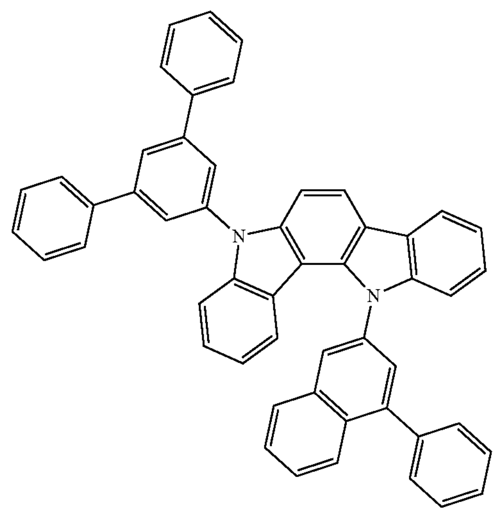
D-163
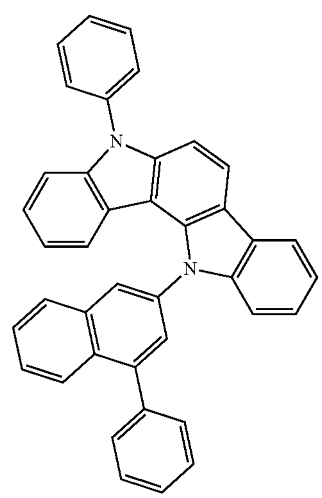

-continued
D-164
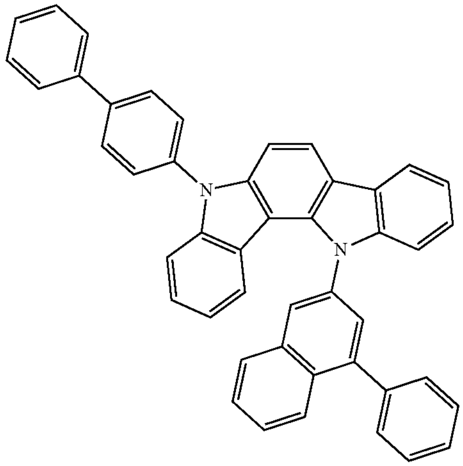
D-165
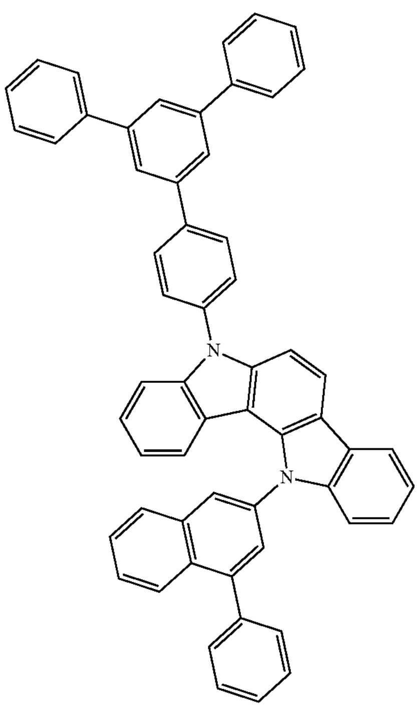
-continued
D-166
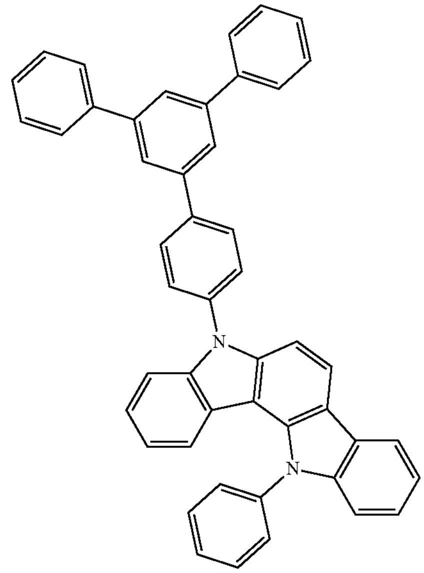
D-167
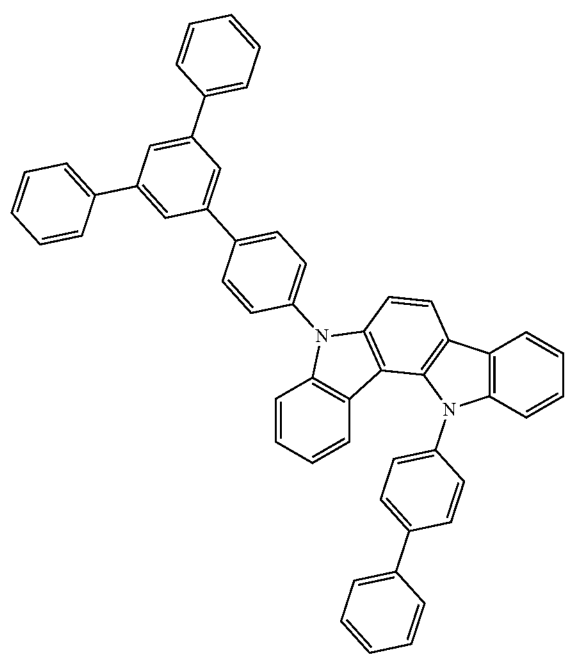

-continued
D-168
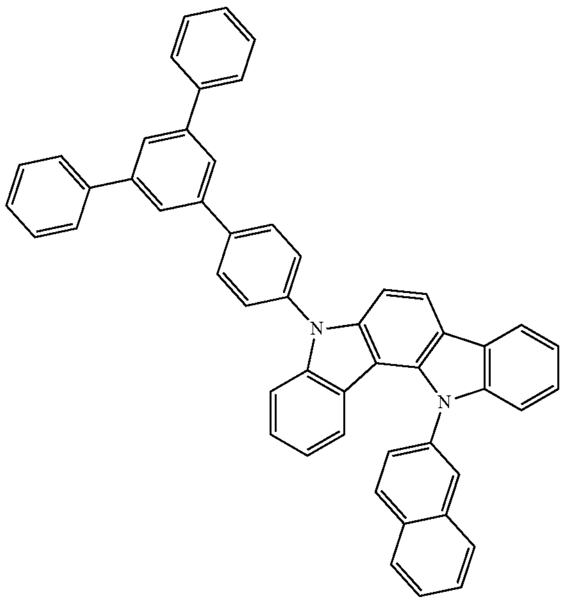
D-169
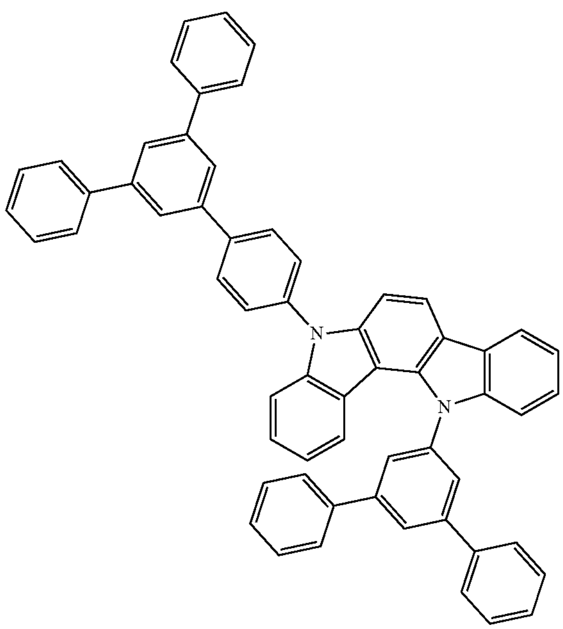
D-170
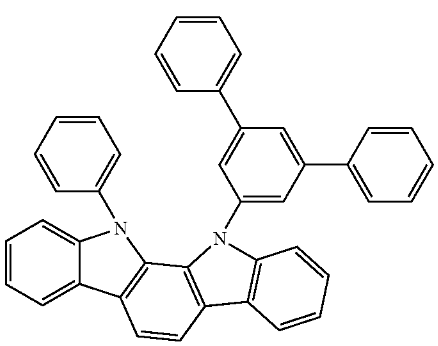
-continued
D-171
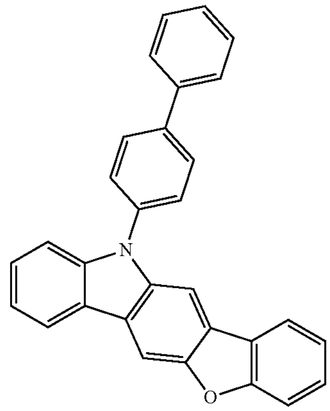
D-172
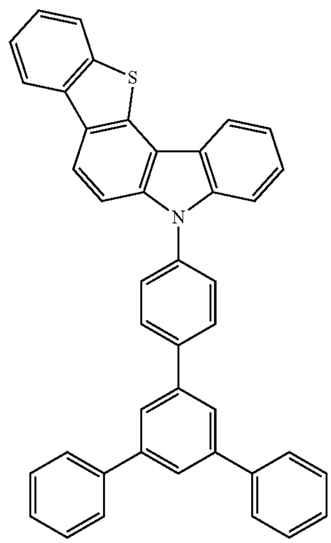
D-173
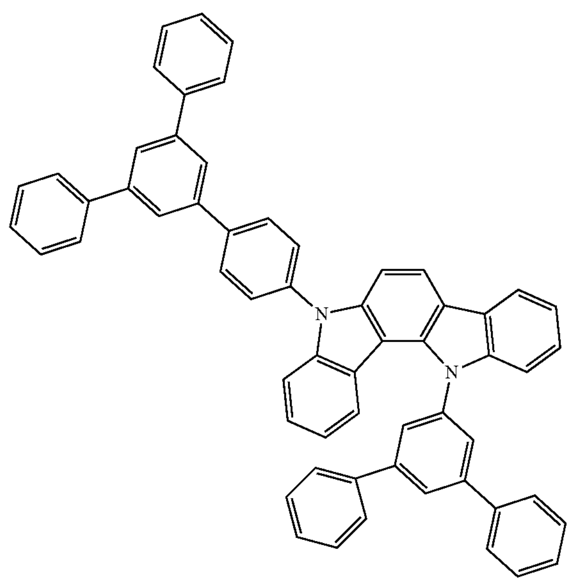
14. The organic light-emitting device of claim 12, wherein the first compound is selected from Compounds B-108, B-135, B-148, B-173, C-102, C-209, C-212, C-221, C-225, C-242 and C-257:

-continued
B-106
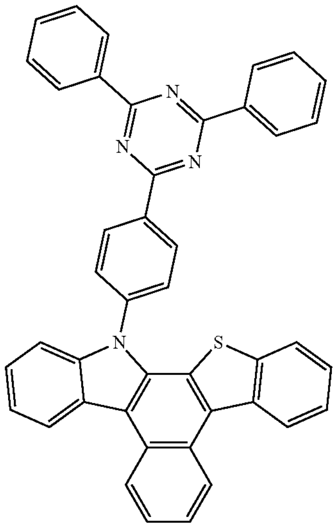
B-173
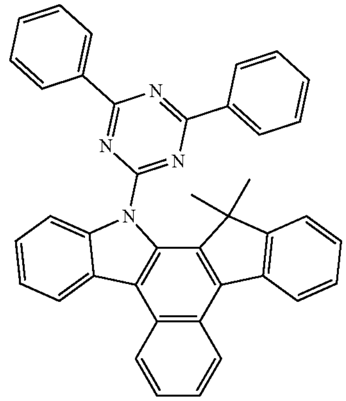
B-135
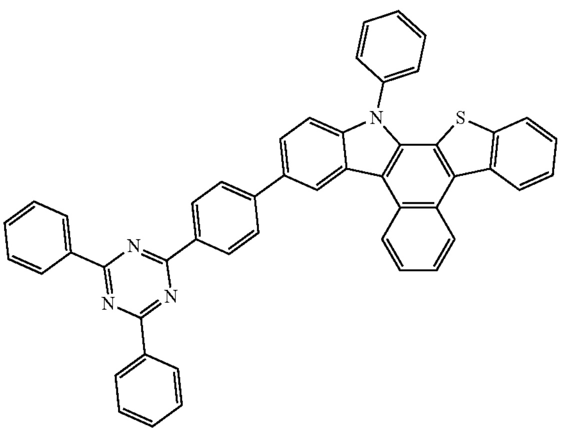
C-102
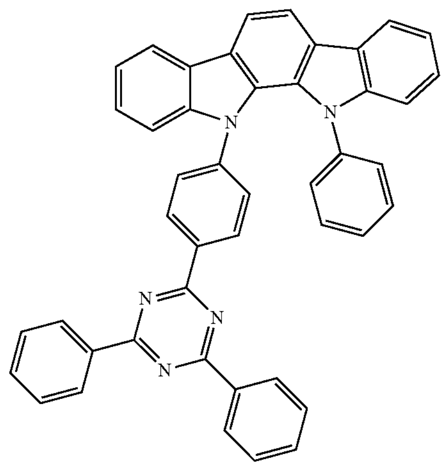
B-148
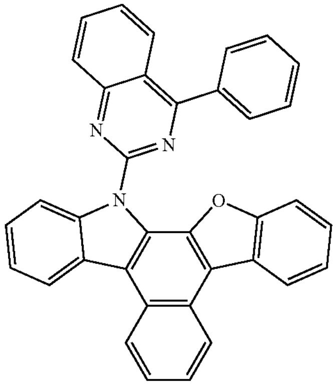
C-209
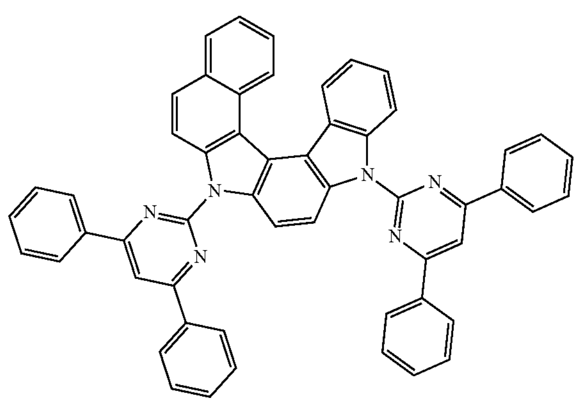

-continued
C-212
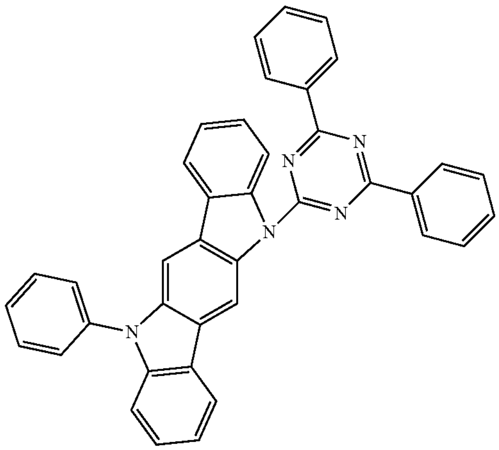
C-221
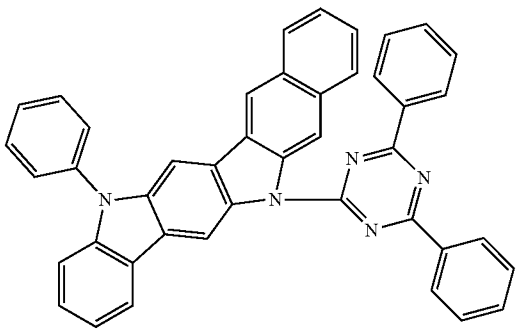
C-226
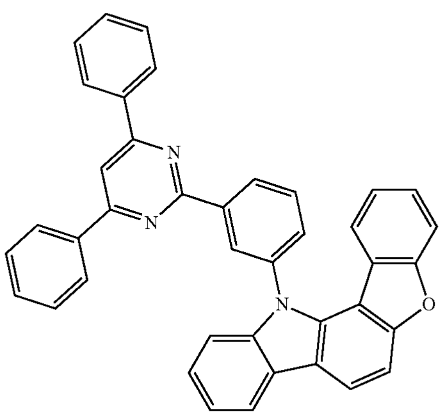
-continued
C-242
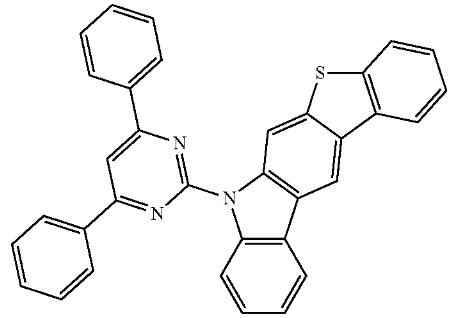
C-257
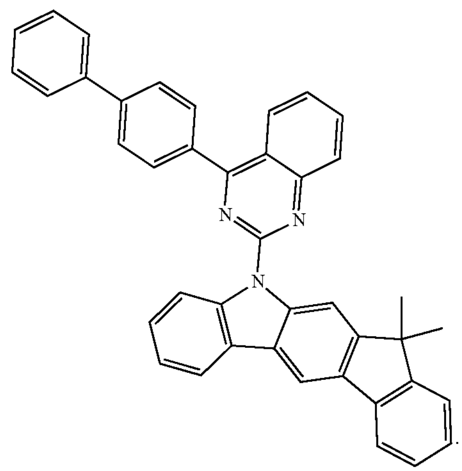
15. The organic light-emitting device of claim 1, wherein $R_{91}$ is selected from groups represented by Formulae 5-52 to 5-63, 5-83 and 5-86.
* * * * *